(12) United States Patent
Ko et al.

(10) Patent No.: US 9,520,835 B2
(45) Date of Patent: Dec. 13, 2016

(54) POWER AMPLIFIER MODULES INCLUDING BIPOLAR TRANSISTOR WITH GRADING AND RELATED SYSTEMS, DEVICES, AND METHODS

(71) Applicant: Skyworks Solutions, Inc., Woburn, MA (US)

(72) Inventors: Tin Myint Ko, Newbury Park, CA (US); Philip John Lehtola, Cedar Rapids, IA (US); Matthew Thomas Ozalas, Novato, CA (US); David Steven Ripley, Marion, IA (US); Hongxiao Shao, Thousand Oaks, CA (US); Peter J. Zampardi, Jr., Newbury Park, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/686,585

(22) Filed: Apr. 14, 2015

(65) Prior Publication Data
US 2015/0326182 A1 Nov. 12, 2015

Related U.S. Application Data

(62) Division of application No. 13/917,384, filed on Jun. 13, 2013, now Pat. No. 9,041,472.
(Continued)

(51) Int. Cl.
*H03F 3/195* (2006.01)
*H03F 1/02* (2006.01)
(Continued)

(52) U.S. Cl.
CPC ....... *H03F 1/0205* (2013.01); *H01L 23/49811* (2013.01); *H01L 23/49827* (2013.01);
(Continued)

(58) Field of Classification Search
CPC .. H03F 1/02025; H03F 2200/451; H03F 3/19; H03F 3/21; H03F 3/245; H01L 23/552; H01L 23/66; H01L 24/97; H01L 29/36; H01L 29/66242; H01L 29/7371; H01L 29/812; H01L 29/0821; H01L 29/205; H01L 27/0605; H01L 27/0623; H01L 24/49; H03L 29/66242; H03L 29/7371; H03L 29/0821
(Continued)

(56) References Cited

U.S. PATENT DOCUMENTS 3,816,911 A 6/1974 Knappenberger
4,151,637 A 5/1979 Zemek et al.
(Continued)

FOREIGN PATENT DOCUMENTS

CN 101840910 9/2010
CN 103907194 A 7/2014
(Continued)

OTHER PUBLICATIONS

US 8,489,048, 07/2013, Arkiszewski et al. (withdrawn)
(Continued)

*Primary Examiner* — Khanh V Nguyen
(74) *Attorney, Agent, or Firm* — Knobbe, Martens, Olson & Bear, LLP

(57) ABSTRACT

One aspect of this disclosure is a power amplifier module that includes a first die including a power amplifier and a passive component, the power amplifier including a bipolar transistor having a collector, a base abutting the collector, and an emitter, the collector having a doping concentration of at least about $3\times10^{16}$ cm$^{-3}$ at an interface with the base, the collector also having a grading in which doping concentration increases away from the base; and a second die including a bias circuit configured to generate a bias signal
(Continued)

based at least partly on an indication of an electrical property of the passive component of the first die and to provide the bias signal to the power amplifier. Other embodiments of the module are provided along with related methods and components thereof.

20 Claims, 99 Drawing Sheets

Related U.S. Application Data

(60) Provisional application No. 61/659,848, filed on Jun. 14, 2012.

(51) Int. Cl.

| | | |
|---|---|---|
| *H03F 3/19* | (2006.01) | |
| *H03F 3/21* | (2006.01) | |
| *H03F 3/24* | (2006.01) | |
| *H01L 23/552* | (2006.01) | |
| *H01L 23/66* | (2006.01) | |
| *H01L 23/00* | (2006.01) | |
| *H01L 29/36* | (2006.01) | |
| *H01L 29/66* | (2006.01) | |
| *H01L 29/737* | (2006.01) | |
| *H01L 29/812* | (2006.01) | |
| *H01L 29/08* | (2006.01) | |
| *H01L 29/205* | (2006.01) | |
| *H01L 27/06* | (2006.01) | |
| *H01L 23/498* | (2006.01) | |
| *H01L 23/50* | (2006.01) | |
| *H03F 3/60* | (2006.01) | |
| *H03F 3/213* | (2006.01) | |
| *H03F 3/187* | (2006.01) | |
| *H03F 3/347* | (2006.01) | |
| *H03F 3/45* | (2006.01) | |
| *H01L 29/8605* | (2006.01) | |
| *H01L 21/8252* | (2006.01) | |
| *H01L 27/092* | (2006.01) | |

(52) U.S. Cl.
CPC ............ *H01L 23/50* (2013.01); *H01L 23/552* (2013.01); *H01L 23/66* (2013.01); *H01L 24/49* (2013.01); *H01L 24/85* (2013.01); *H01L 24/97* (2013.01); *H01L 27/0605* (2013.01); *H01L 27/0623* (2013.01); *H01L 29/0821* (2013.01); *H01L 29/205* (2013.01); *H01L 29/36* (2013.01); *H01L 29/66242* (2013.01); *H01L 29/7371* (2013.01); *H01L 29/812* (2013.01); *H03F 3/19* (2013.01); *H03F 3/21* (2013.01); *H03F 3/245* (2013.01); *H03F 3/60* (2013.01); *H01L 21/8252* (2013.01); *H01L 23/49838* (2013.01); *H01L 23/49894* (2013.01); *H01L 24/45* (2013.01); *H01L 24/48* (2013.01); *H01L 27/092* (2013.01); *H01L 29/66863* (2013.01); *H01L 29/8605* (2013.01); *H01L 2223/665* (2013.01); *H01L 2223/6611* (2013.01); *H01L 2223/6644* (2013.01); *H01L 2223/6655* (2013.01); *H01L 2224/45015* (2013.01); *H01L 2224/45139* (2013.01); *H01L 2224/45144* (2013.01); *H01L 2224/45147* (2013.01); *H01L 2224/48227* (2013.01); *H01L 2224/48465* (2013.01); *H01L 2224/48611* (2013.01); *H01L 2224/48644* (2013.01); *H01L 2224/48647* (2013.01); *H01L 2224/48811* (2013.01); *H01L 2224/48816* (2013.01); *H01L 2224/48844* (2013.01); *H01L 2224/48847* (2013.01); *H01L 2224/48855* (2013.01); *H01L 2224/48864* (2013.01); *H01L 2224/4903* (2013.01); *H01L 2224/49111* (2013.01); *H01L 2224/85205* (2013.01); *H01L 2224/85207* (2013.01); *H01L 2224/85411* (2013.01); *H01L 2224/85416* (2013.01); *H01L 2224/85444* (2013.01); *H01L 2224/85455* (2013.01); *H01L 2224/85464* (2013.01); *H01L 2924/10253* (2013.01); *H01L 2924/10329* (2013.01); *H01L 2924/12033* (2013.01); *H01L 2924/12042* (2013.01); *H01L 2924/1305* (2013.01); *H01L 2924/1306* (2013.01); *H01L 2924/13051* (2013.01); *H01L 2924/1421* (2013.01); *H01L 2924/181* (2013.01); *H01L 2924/19105* (2013.01); *H01L 2924/19107* (2013.01); *H01L 2924/3011* (2013.01); *H01L 2924/30111* (2013.01); *H03F 3/187* (2013.01); *H03F 3/195* (2013.01); *H03F 3/213* (2013.01); *H03F 3/347* (2013.01); *H03F 2003/45013* (2013.01); *H03F 2200/451* (2013.01)

(58) Field of Classification Search
USPC .................. 330/69, 277, 285, 296, 302, 307
See application file for complete search history.

(56) References Cited

U.S. PATENT DOCUMENTS

| | | |
|---|---|---|
| 4,241,497 A | 12/1980 | Du Bois |
| 4,245,385 A | 1/1981 | Zemek et al. |
| 4,447,945 A | 5/1984 | Priscsak |
| 4,724,613 A | 2/1988 | Dale |
| 4,839,612 A | 6/1989 | Akagi |
| 4,839,615 A | 6/1989 | Sato |
| 4,857,483 A | 8/1989 | Steffen et al. |
| 5,049,979 A | 9/1991 | Hashemi et al. |
| 5,151,770 A | 9/1992 | Inoue |
| 5,166,772 A | 11/1992 | Soldner et al. |
| 5,166,864 A | 11/1992 | Chitwood |
| 5,266,819 A | 11/1993 | Chang et al. |
| 5,300,895 A | 4/1994 | Jones |
| 5,347,229 A | 9/1994 | Suckling et al. |
| 5,355,016 A | 10/1994 | Swirbel |
| 5,378,922 A | 1/1995 | Sovero |
| 5,428,508 A | 6/1995 | Pronto |
| 5,445,976 A | 8/1995 | Henderson et al. |
| 5,521,406 A | 5/1996 | Tserng et al. |
| 5,878,335 A | 3/1999 | Kushner |
| 5,940,964 A | 8/1999 | Mugiya |
| 6,075,995 A | 6/2000 | Jensen |
| 6,137,693 A | 10/2000 | Schwiebert et al. |
| 6,192,577 B1 | 2/2001 | Larsson |
| 6,194,968 B1 | 2/2001 | Winslow |
| 6,201,454 B1 | 3/2001 | Kinayman et al. |
| 6,202,294 B1 | 3/2001 | Bogannam |
| 6,233,440 B1 | 5/2001 | Taylor |
| 6,236,071 B1 | 5/2001 | Finlay |
| 6,236,274 B1 | 5/2001 | Liu |
| 6,275,687 B1 | 8/2001 | Lloyd |
| 6,350,951 B1 | 2/2002 | Askew |
| 6,384,688 B1 | 5/2002 | Fujioka et al. |
| 6,426,881 B1 | 7/2002 | Kurz |
| 6,449,828 B2 | 9/2002 | Pahl et al. |
| 6,459,104 B1 | 10/2002 | Schuegraf |
| 6,462,436 B1 | 10/2002 | Kay et al. |
| 6,472,724 B1 | 10/2002 | Matsuzawa et al. |
| 6,486,549 B1 | 11/2002 | Chiang |
| 6,559,517 B2 | 5/2003 | Zhu |
| 6,563,145 B1 * | 5/2003 | Chang .................. H01L 29/0821 |
| | | 257/197 |
| 6,566,596 B1 | 5/2003 | Askew |
| 6,573,599 B1 | 6/2003 | Burton et al. |
| 6,577,199 B2 | 6/2003 | Dent |
| 6,586,782 B1 | 7/2003 | Finlay |

(56) References Cited

U.S. PATENT DOCUMENTS

| | | |
|---|---|---|
| 6,601,293 B1 | 8/2003 | Glenn |
| 6,627,925 B1 | 9/2003 | Finlay |
| 6,650,009 B2 | 11/2003 | Her |
| 6,656,809 B2 | 12/2003 | Greenberg et al. |
| 6,678,513 B2 | 1/2004 | Glasbrener et al. |
| 6,724,263 B2 | 4/2004 | Sugiura |
| 6,759,597 B1 | 7/2004 | Cutting et al. |
| 6,777,268 B2 | 8/2004 | Jiang |
| 6,787,427 B2 | 9/2004 | Greenberg et al. |
| 6,797,995 B2 | 9/2004 | Pierson, Jr. et al. |
| 6,797,996 B1 * | 9/2004 | Hikita .................. H01L 29/0821 257/197 |
| 6,798,050 B1 | 9/2004 | Homma et al. |
| 6,800,531 B2 | 10/2004 | Pierson, Jr. et al. |
| 6,850,746 B1 | 2/2005 | Lloyd et al. |
| 6,855,893 B2 | 2/2005 | Kumakura et al. |
| 6,855,992 B2 | 2/2005 | Emrick et al. |
| 6,858,522 B1 | 2/2005 | Burton et al. |
| 6,858,887 B1 | 2/2005 | Li et al. |
| 6,865,084 B2 | 3/2005 | Lin et al. |
| 6,906,359 B2 * | 6/2005 | Zampardi ............ H01L 27/0605 257/192 |
| 6,930,334 B2 | 8/2005 | Suzuki et al. |
| 6,947,295 B2 | 9/2005 | Hsieh |
| 6,949,776 B2 | 9/2005 | Pierson, Jr. et al. |
| 6,956,283 B1 | 10/2005 | Peterson |
| 6,958,491 B1 | 10/2005 | Brar et al. |
| 6,974,724 B2 | 12/2005 | Hyvonen et al. |
| 6,994,901 B1 | 2/2006 | Chen et al. |
| 7,030,469 B2 | 4/2006 | Mahadevan et al. |
| 7,038,250 B2 | 5/2006 | Sugiyama et al. |
| 7,061,119 B1 | 6/2006 | Jiang |
| 7,088,009 B2 | 8/2006 | Hagen |
| 7,116,175 B2 | 10/2006 | Shimizu et al. |
| 7,198,987 B1 | 4/2007 | Warren et al. |
| 7,333,778 B2 | 2/2008 | Pehlke et al. |
| 7,372,334 B2 | 5/2008 | Blair et al. |
| 7,409,200 B2 | 8/2008 | Derbyshire et al. |
| 7,439,098 B2 | 10/2008 | Yang et al. |
| 7,514,727 B2 * | 4/2009 | Asano .................. H01L 27/0605 257/197 |
| 7,563,713 B2 | 7/2009 | Rowell et al. |
| 7,687,886 B2 | 3/2010 | Pan et al. |
| 7,723,824 B2 | 5/2010 | Guarin et al. |
| 7,728,357 B2 | 6/2010 | Murayama et al. |
| 7,728,696 B2 | 6/2010 | Stuebing et al. |
| 7,729,674 B2 | 6/2010 | Shie et al. |
| 7,755,107 B2 | 7/2010 | Zampardi et al. |
| 7,791,132 B2 | 9/2010 | Banerjee et al. |
| 7,880,275 B2 | 2/2011 | Pagaila et al. |
| 7,898,066 B1 | 3/2011 | Scanlan et al. |
| 7,911,271 B1 | 3/2011 | Jia |
| 7,948,317 B2 | 5/2011 | Wan |
| 7,958,629 B2 | 6/2011 | Thompson et al. |
| 8,026,555 B2 | 9/2011 | Zampardi et al. |
| 8,071,431 B2 | 12/2011 | Hoang et al. |
| 8,129,824 B1 | 3/2012 | Amand et al. |
| 8,134,228 B2 | 3/2012 | Komatsu et al. |
| 8,154,345 B2 | 4/2012 | Andrys et al. |
| 8,159,048 B2 | 4/2012 | Apel et al. |
| 8,164,387 B1 | 4/2012 | Apel et al. |
| 8,188,575 B2 | 5/2012 | Riege et al. |
| 8,227,892 B2 | 7/2012 | Chang |
| 8,357,263 B2 | 1/2013 | Berkoh et al. |
| 8,373,264 B2 | 2/2013 | Welch et al. |
| 8,399,972 B2 | 3/2013 | Hoang et al. |
| 8,415,770 B2 | 4/2013 | Riege et al. |
| 8,415,805 B2 | 4/2013 | Shen |
| 8,521,101 B1 | 8/2013 | Kadam et al. |
| 8,542,061 B2 | 9/2013 | Levesque et al. |
| 8,559,898 B2 | 10/2013 | Jones et al. |
| 8,565,694 B2 | 10/2013 | Jones et al. |
| 8,571,492 B2 | 10/2013 | Berchtold et al. |
| 8,686,537 B2 | 4/2014 | Sun et al. |
| 8,719,459 B2 | 5/2014 | Ripley |
| 8,791,719 B2 | 7/2014 | Ripley |
| 8,797,103 B2 | 8/2014 | Kaczman et al. |
| 8,889,995 B2 | 11/2014 | Sun et al. |
| 8,896,091 B2 | 11/2014 | Sun et al. |
| 8,948,712 B2 | 2/2015 | Chen et al. |
| 8,983,406 B2 | 3/2015 | Zhang et al. |
| 9,041,472 B2 | 5/2015 | Chen et al. |
| 2001/0013165 A1 | 8/2001 | Hansen et al. |
| 2002/0083570 A1 | 7/2002 | Inoue et al. |
| 2002/0155738 A1 | 10/2002 | Ohsawa et al. |
| 2003/0002271 A1 | 1/2003 | Nurminen |
| 2003/0116782 A1 | 6/2003 | Mizutani |
| 2003/0160307 A1 | 8/2003 | Gibson et al. |
| 2003/0222278 A1 | 12/2003 | Liu et al. |
| 2004/0012099 A1 | 1/2004 | Nakayama |
| 2004/0051588 A1 | 3/2004 | Krvavac |
| 2004/0125568 A1 | 7/2004 | Tao |
| 2004/0180474 A1 | 9/2004 | Oman |
| 2004/0188712 A1 | 9/2004 | Lee et al. |
| 2004/0231872 A1 | 11/2004 | Arnold et al. |
| 2004/0238934 A1 | 12/2004 | Warner |
| 2005/0017702 A1 | 1/2005 | Kernahan et al. |
| 2005/0077964 A1 | 4/2005 | Maeda |
| 2005/0104207 A1 | 5/2005 | Dean et al. |
| 2005/0139921 A1 | 6/2005 | Kang et al. |
| 2005/0167047 A1 | 8/2005 | Huff et al. |
| 2005/0270052 A1 | 12/2005 | Chase |
| 2005/0280471 A1 | 12/2005 | Matsushita et al. |
| 2006/0138650 A1 | 6/2006 | Hidalgo et al. |
| 2006/0145361 A1 | 7/2006 | Yang |
| 2006/0153495 A1 | 7/2006 | Wynne et al. |
| 2006/0226911 A1 | 10/2006 | Kao et al. |
| 2006/0249752 A1 * | 11/2006 | Asano .................. H01L 27/0605 257/197 |
| 2006/0255102 A1 | 11/2006 | Snyder et al. |
| 2006/0272857 A1 | 12/2006 | Arnold |
| 2007/0024374 A1 | 2/2007 | Blair et al. |
| 2007/0057731 A1 | 3/2007 | Le |
| 2007/0071886 A1 | 3/2007 | Babb et al. |
| 2007/0138639 A1 | 6/2007 | Shin |
| 2007/0241440 A1 | 10/2007 | Hoang et al. |
| 2008/0001281 A1 | 1/2008 | Nishimura |
| 2008/0014678 A1 | 1/2008 | Howard et al. |
| 2008/0116489 A1 | 5/2008 | Niwa et al. |
| 2008/0206927 A1 | 8/2008 | Graydon et al. |
| 2008/0218270 A1 | 9/2008 | Hau et al. |
| 2008/0296624 A1 | 12/2008 | Murayama et al. |
| 2008/0315356 A1 | 12/2008 | Reisner |
| 2009/0011922 A1 | 1/2009 | De Rochemont |
| 2009/0045877 A1 | 2/2009 | Wang et al. |
| 2009/0051036 A1 | 2/2009 | Abbott |
| 2009/0209064 A1 | 8/2009 | Nonahasitthichai et al. |
| 2009/0289279 A1 | 11/2009 | Khare |
| 2009/0294158 A1 | 12/2009 | Matsushima et al. |
| 2010/0001319 A1 | 1/2010 | Pélouard et al. |
| 2010/0078779 A1 | 4/2010 | Barth et al. |
| 2010/0089529 A1 | 4/2010 | Fowlkes et al. |
| 2010/0178879 A1 | 7/2010 | Sato et al. |
| 2010/0230789 A1 | 9/2010 | Yorita et al. |
| 2010/0253435 A1 | 10/2010 | Ichitsubo et al. |
| 2011/0006415 A1 | 1/2011 | Bachman et al. |
| 2011/0095827 A1 | 4/2011 | Tanaka et al. |
| 2011/0305265 A1 | 12/2011 | Rofougaran et al. |
| 2012/0001307 A1 | 1/2012 | Cho et al. |
| 2012/0018742 A1 | 1/2012 | Nishi |
| 2012/0119346 A1 | 5/2012 | Im et al. |
| 2012/0139006 A1 | 6/2012 | Zampardi et al. |
| 2012/0146178 A1 | 6/2012 | Hoang et al. |
| 2012/0222892 A1 | 9/2012 | Sun et al. |
| 2012/0223422 A1 | 9/2012 | Sun et al. |
| 2012/0326211 A1 | 12/2012 | Stevens et al. |
| 2013/0029619 A1 | 1/2013 | Zhang et al. |
| 2013/0057451 A1 | 3/2013 | Petty-Weeks et al. |
| 2013/0100993 A1 | 4/2013 | Ripley |
| 2013/0135025 A1 | 5/2013 | Ripley |
| 2013/0285120 A1 | 10/2013 | Zampardi, Jr. |
| 2013/0324069 A1 | 12/2013 | Chen et al. |
| 2013/0344825 A1 | 12/2013 | Ripley et al. |
| 2014/0002188 A1 | 1/2014 | Chen et al. |

(56) References Cited

U.S. PATENT DOCUMENTS

| | | |
|---|---|---|
| 2014/0325150 A1 | 10/2014 | Hashimoto et al. |
| 2014/0349589 A1 | 11/2014 | Ripley |
| 2015/0044863 A1 | 2/2015 | Sun et al. |
| 2015/0061092 A1 | 3/2015 | Sun et al. |
| 2015/0236141 A1 | 8/2015 | Zampardi, Jr. |

FOREIGN PATENT DOCUMENTS

| | | |
|---|---|---|
| CN | 10412000 A | 8/2014 |
| CN | 104508975 A | 4/2015 |
| EP | 1087648 | 3/2001 |
| EP | 1274126 A2 | 1/2003 |
| EP | 2681765 | 1/2014 |
| JP | 04-058596 | 2/1992 |
| JP | 08222885 | 8/1996 |
| JP | H08-213474 | 8/1996 |
| JP | 2000-124358 A | 4/2000 |
| JP | 2006-180151 A | 7/2006 |
| JP | 2007-031826 | 2/2007 |
| JP | 2007-221080 | 8/2007 |
| JP | 2007-221490 | 8/2007 |
| JP | 2008-130586 | 6/2008 |
| JP | 2012-028615 | 2/2012 |
| KR | 10-2004-0084500 A | 10/2004 |
| KR | 10 2006-0058727 | 5/2006 |
| KR | 10-2006-0064688 A | 6/2006 |
| KR | 10 2006-0129314 | 12/2006 |
| KR | 10 2009-0013803 | 2/2009 |
| KR | 10-2012-0053332 | 5/2012 |
| TW | 445704 | 7/2001 |
| TW | 2007-46615 | 12/2007 |
| TW | 200807589 | 2/2008 |
| TW | 200828127 | 7/2008 |
| TW | 2012-12228 | 3/2012 |
| TW | 201232715 | 8/2012 |
| TW | I373844 | 10/2012 |
| TW | 2013-18492 | 5/2013 |
| TW | 201414191 | 4/2014 |
| TW | 201415790 | 4/2014 |
| WO | WO 98-11696 A1 | 4/1998 |
| WO | WO 99/62119 | 12/1999 |
| WO | WO 00/13233 | 3/2000 |
| WO | WO 02/17394 | 2/2002 |
| WO | WO 2005/050699 | 6/2005 |
| WO | WO 2005-064788 A1 | 7/2005 |
| WO | WO 2005/093833 | 10/2005 |
| WO | WO 2008/018959 | 2/2008 |
| WO | WO 2008/103232 | 8/2008 |
| WO | WO 2009-040509 | 4/2009 |
| WO | WO 2010/014103 | 2/2010 |
| WO | WO 2010-134858 | 11/2010 |
| WO | WO 2012/061632 | 5/2012 |
| WO | WO 2012/118896 | 12/2013 |
| WO | WO 2013/188694 | 12/2013 |
| WO | WO 2013/188712 | 12/2013 |

OTHER PUBLICATIONS

Han, K. et al., "A 900 MHz, 21 dBm CMOS linear power amplifier with 35% PAE for RFID readers", J. Semicond., 31, 125005 (2010).

Kang, Jongchan, et al. 'A Highly Linear and Efficient Differential CMOS Power Amplifier With Harmonic Control', In: IEEE Journal of Solid-State Circuits, Vol. 41, No. 6, Jun. 2006, pp. 1314 1322.

Kim, Bumman, et al. 'Envelope Tracking Technique for Multimode PA Operation', In: Proceedings of the 39th European Microwave Conference, Sep. 29-Oct. 1, 2009, pp. 429-432.

Woo, Young Yun, et al. 'Analysis and Experiments for High-Efficiency Class-F and Inverse Class-F Power Amplifiers', In: IEEE Transactions on Microwave Theory and Techniques, vol. 54, No. 5, May 2006, pp. 1969-1974.

Yang, Y. et al., "DC boosting effect of active bias circuits and its optimization for class-AB InGaP-GaAs HBT power amplifiers", IEEE Transactions on Microwave Theory and Techniques, 52,1455-1463 (2004).

International Preliminary Report on Patentability issued Dec. 18, 2014, for International Application No. PCT/US2013/045742 filed Jun. 13, 2013, 7 pages.

International Search Report and Written Opinion of Nov. 20, 2013 for International Application No. PCT/US2013/045742 filed Jun. 13, 2013, 11 pages.

Chang, ChinAn, "Interactions between Au and Cu across a Ni barrier layer", J. Appl. Phys. vol. 60, No. 3, Aug. 1, 1986, pp. 1220-1222.

Chen, Xiaoming, "EM Modeling of Microstrip Conductor Losses Including Surface Roughness Effect", IEEE Microwave and Wireless Components Letters, vol. 17, No. 2, pp. 94-96, Feb. 2007.

Cismaru, et al., "High Volume Test Methodology for HBT Device Ruggedness Characterization", CS MANTECH Conference, May 17th-20th, 2010, Portland, Oregon, USA. 4 Pages.

Collinson, Glenn, et al., "Effects of Harmonic Terminations on Power and Efficiency of GAAS HBG Power Amplifiers at 900MHZ", IEE Colloquium on Solid-State Power Amplifiers, Dec. 16, 1991, pp. 12/1-12/5.

Cullen et al., "Effects of Surface Finish on High Frequency Signal Loss Using Various Substrate Materials", Jun. 1, 2001. 10 Pages.

Hartmann, Q.J., et al., "Effect of Collector Design on the d.c. Characteristics of In0.49 GA0.51P/GaAs Heterojunction Bipolar Transistors," Solid State Electronics vol. 38, No. 12, pp. 2017-2021, 1995.

Humphreys et al., "Control of avalanche injection in bipolar transistors through the use of graded collector impurity profiles", IEE Proceedings, vol. 134, Pt. I. No. 5, Oct. 1987, pp. 141-147.

Ishibashi, et al., "A Possible Near-Ballistic Collection in an AIGaAs/GaAs HBT with a Modified Collector Structure", IEEE Transactions on Electron Devices, pp. 401-404, vol. 35, No. 4, Apr. 1988.

Ishibashi, et al., "Ultra-High Speed AIGaAs/GaAs Heterojunction Bipolar Transistors", IEEE IEDM . 1988. 4 Pages.

Iwai et al., "63.2% High Efficiency and High Linearity Two-stage InGaP/GaAs HBT Power Amplifier for Personal Digital Cellular Phone System", IEEE MTT-S Digest, pp. 435-438. 1998.

Kayali, et al., JPL Publication 96-25 GaAs MMIC Reliability Assurance Guideline for Space Applications, Dec. 15, 1996, National Aeronautics and Space Administration. 221 Pages.

Lee, et al., "The Safe Operating Area of GaAs-Based Heterojunction Bipolar Transistors", IEEE Transactions on Electron Devices, pp. 2681-2688. vol. 53, No. 11, Nov. 2006.

Liu et al., "A Proposed Collector Design of Double Heterojunction Bipolar Transistors for Power Applications", IEEE Electron Device Letters, pp. 309-311, vol. 16, No. 7, Jul. 1995.

Malm et al., "Implanted collector profile optimization in a SiGe HBT process", Solid State Electronics 45 (2001) pp. 399-404.

Mathews, et al., "RF System in Package: Considerations, Technologies and Solutions," Amkor Technology. 8 Pages. Jul. 2003.

van Noort, et al., "Reduction of UHF Power Transistor Distortion With a Nonuniform Collector Doping Profile", IEEE Journal of Solid-State Circuits, pp. 1399-1406, vol. 36, No. 9, Sep. 2001.

Ohara, S., et al., "InGaP/GaAs Power HBTs with a Low Bias Voltage," International Electronic Devices Meeting (IEDM), pp. 791-794, 1995.

Sandor et al., "The Effects of Lead-Free Solder Finishes on Microwave Printed Circuit Board Performance", Presented at the Antenna Systems and Short Range Wireless 2005 Conference, Santa Clara, CA, Sep. 22, 2005. 37 Pages.

Spirito, M., et al., "Experimental Procedure to Optimize Out-of-Band Terminations for Highly Linear and Power Efficient Bipolar Class-AB RF Amplifiers", IEEE BCTM 7.3, 2005, pp. 112-115.

Staiculescu et al., "Ni-Au Surface Finish Effects on RF Performance", 1999 IEEE MTT-S Digest, pp. 1909-1912.

Tu, Min-Chang et al., Performance of High-Reliability and High-Linearity InGaP/GaAs HBT PAs for Wireless Communication, IEEE Transactions on Electron Devices, vol. 57, No. 1, pp. 188-194, Jan. 2010.

(56) References Cited

OTHER PUBLICATIONS

Wang, Che-Ming et al., "Improved InGaP/GaAs HBTs AC Performance and Linearity with Collector Design," Department of Electrical Engineering, National Central University, 4 pages, 2004.
Wu et al., "Surface Finish Effects on High-Speed Signal Degradation", IEEE Transactions on Advanced Packaging, vol. 31, No. 1, pp. 182-189, Feb. 2008.
Zanoni et al., "Measurements and Simulation of Avalanche Breakdown in Advanced Si Bipolar Transistors", IEEE IEDM 92-927. 1992, pp. 36.4.1-36.4.4.

* cited by examiner

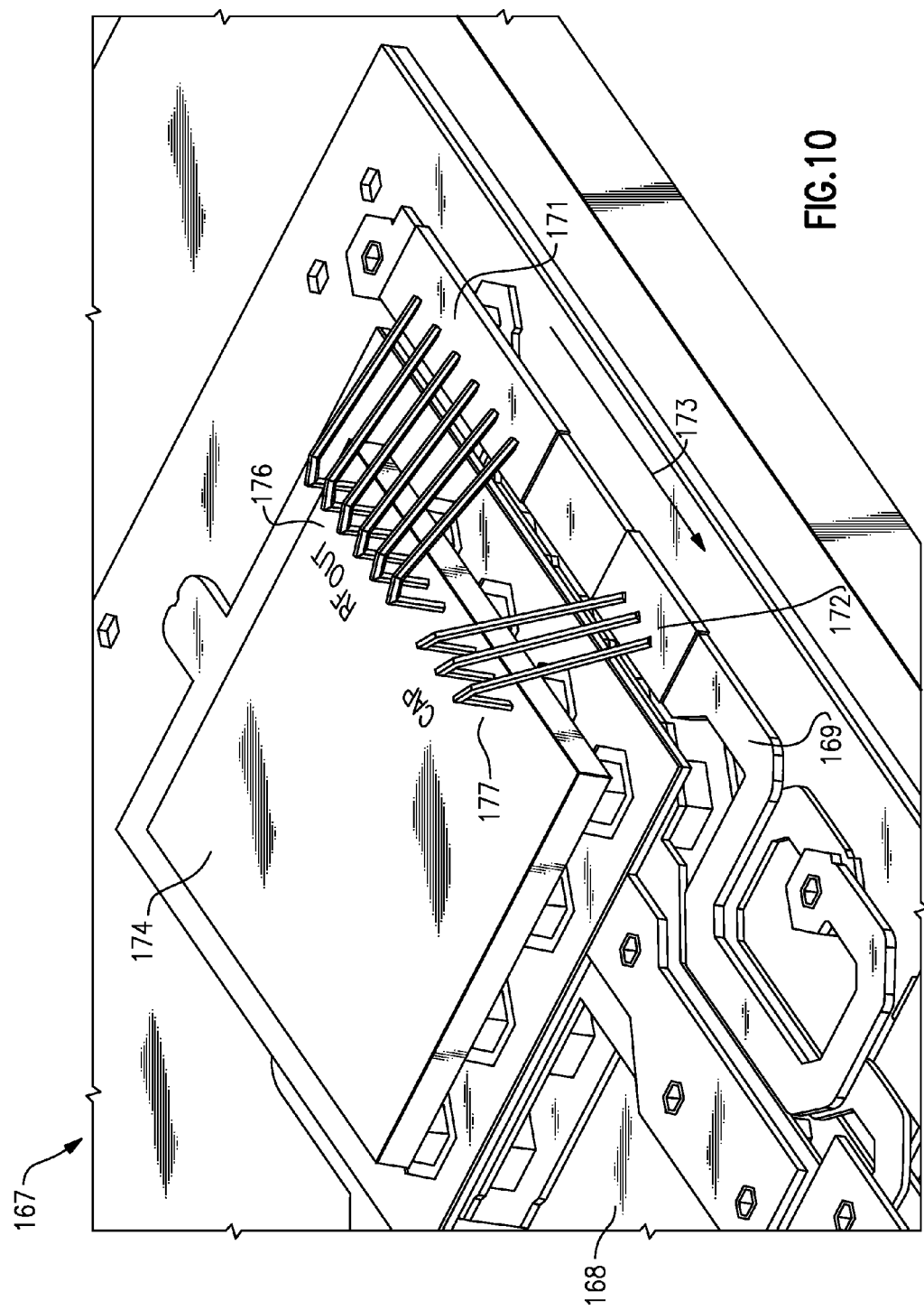

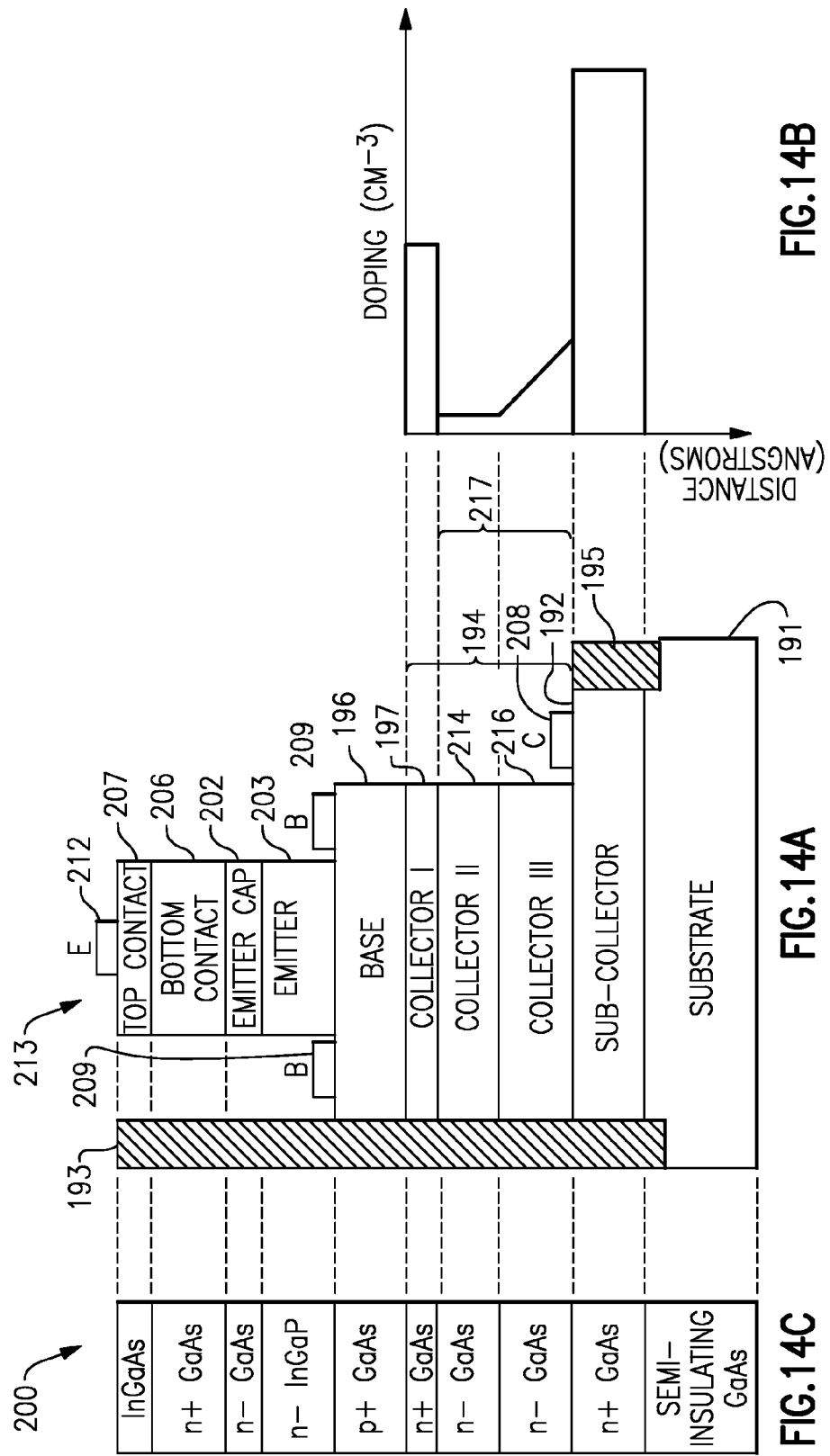

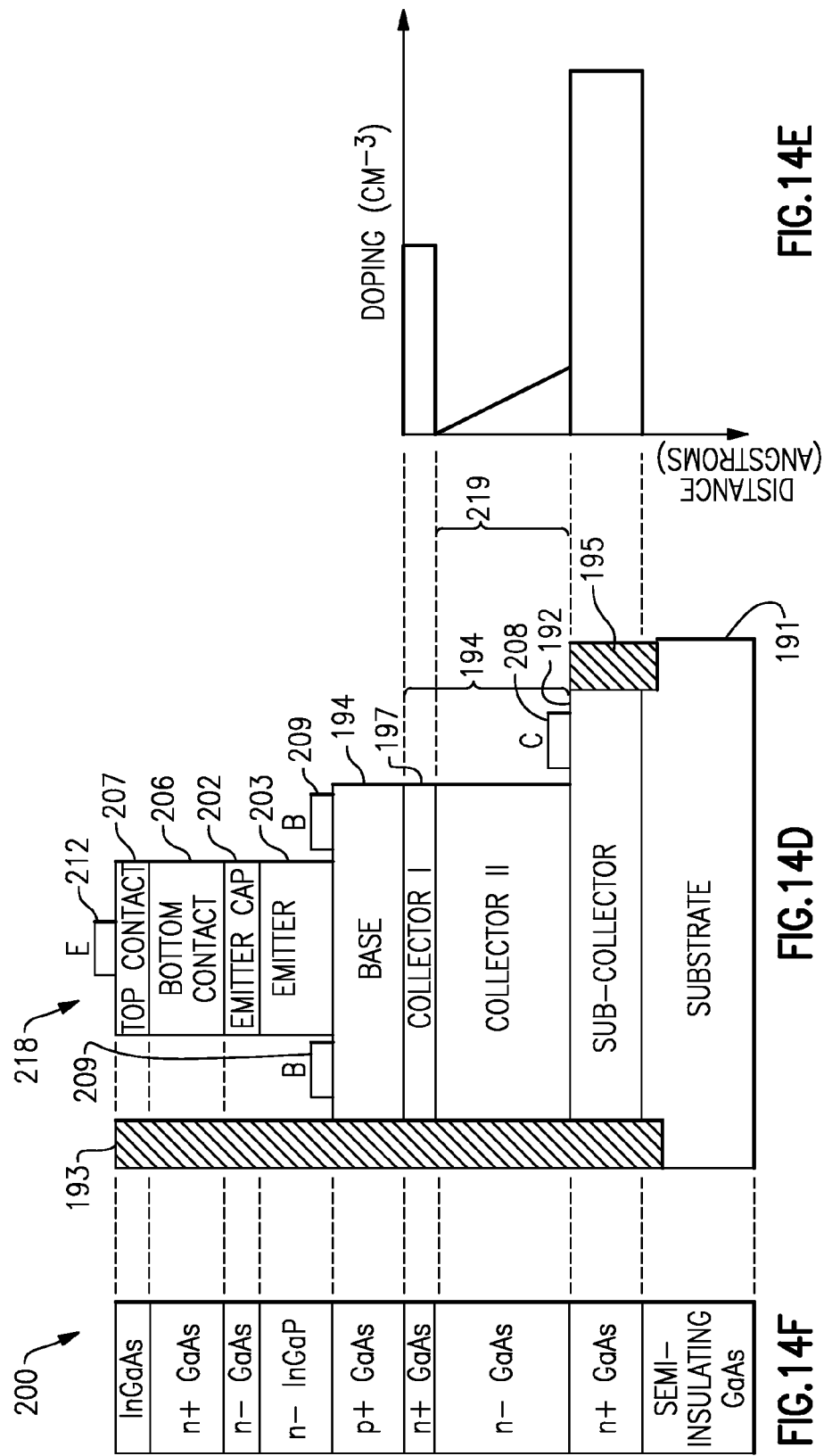

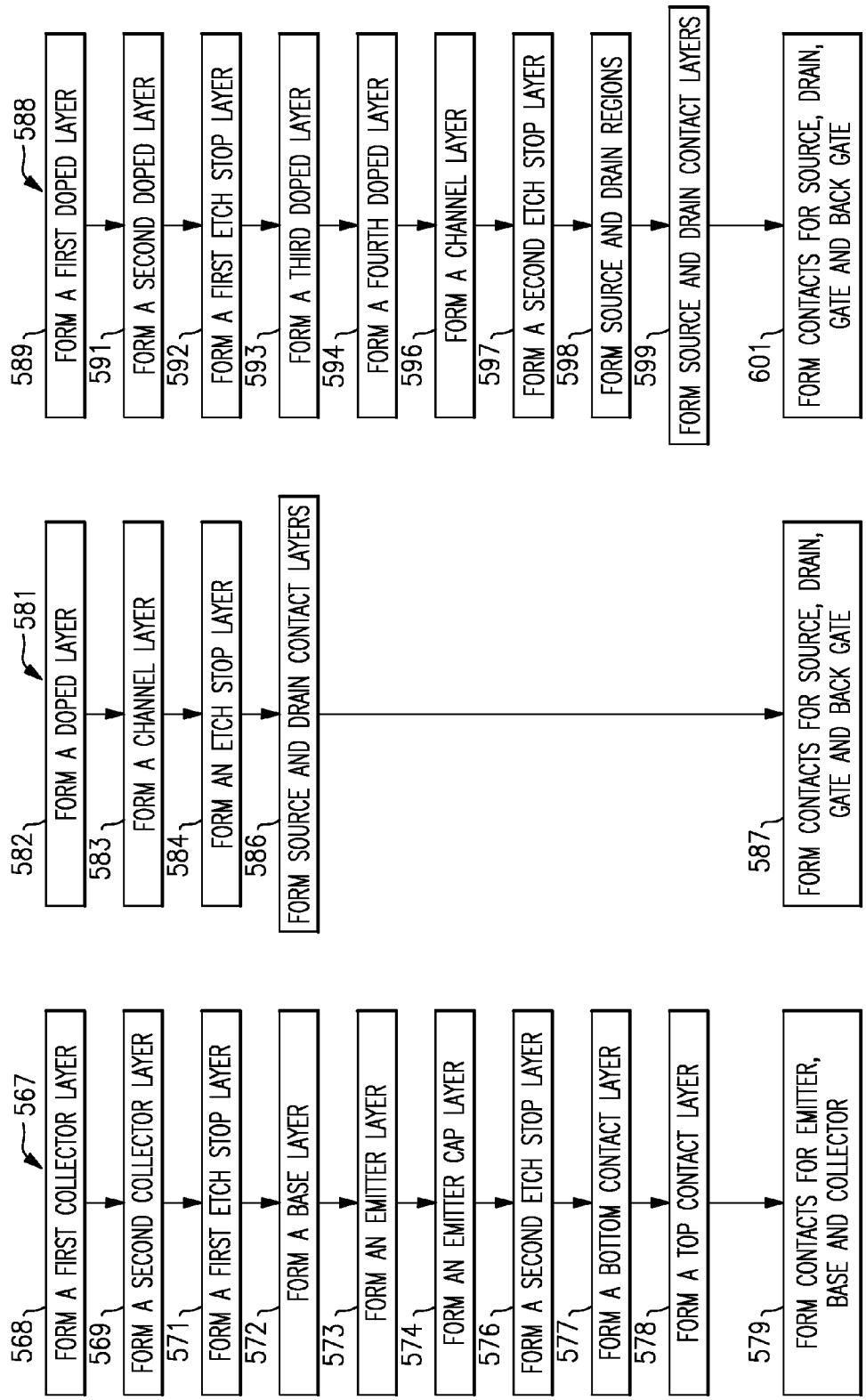

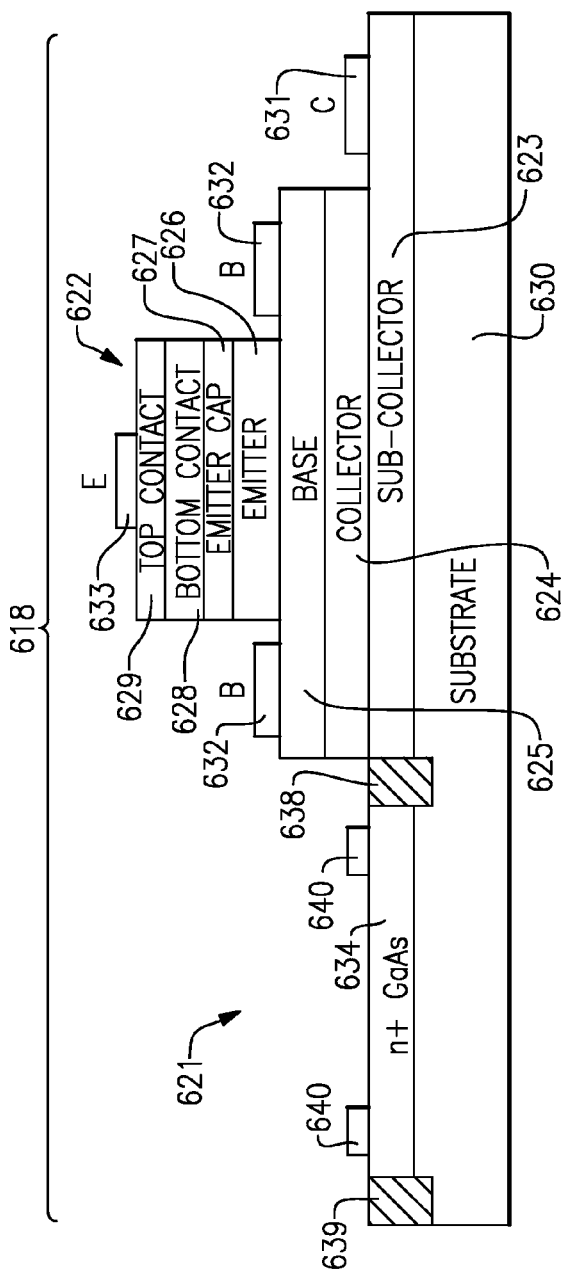

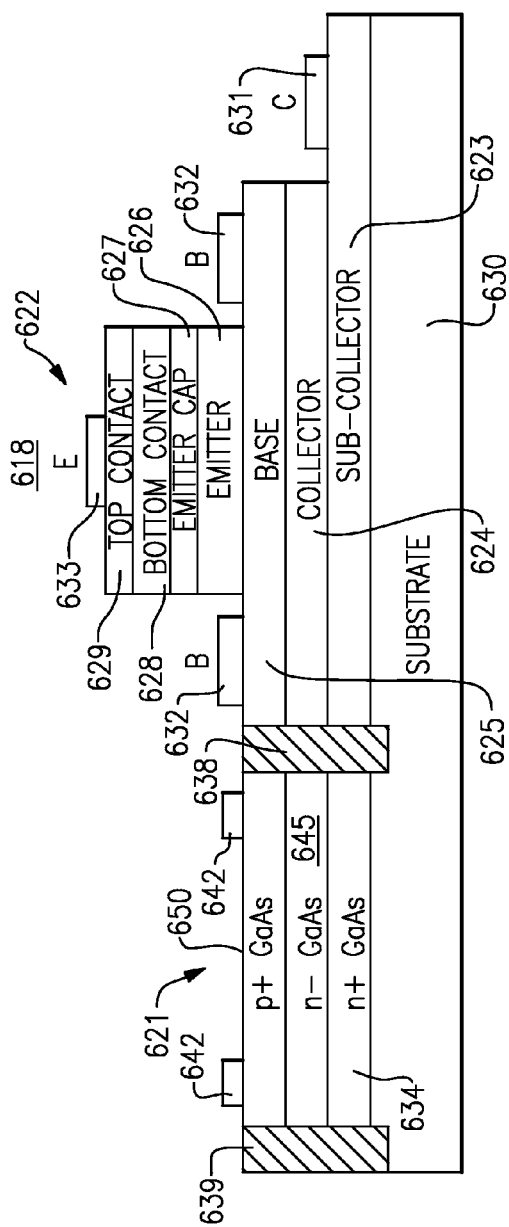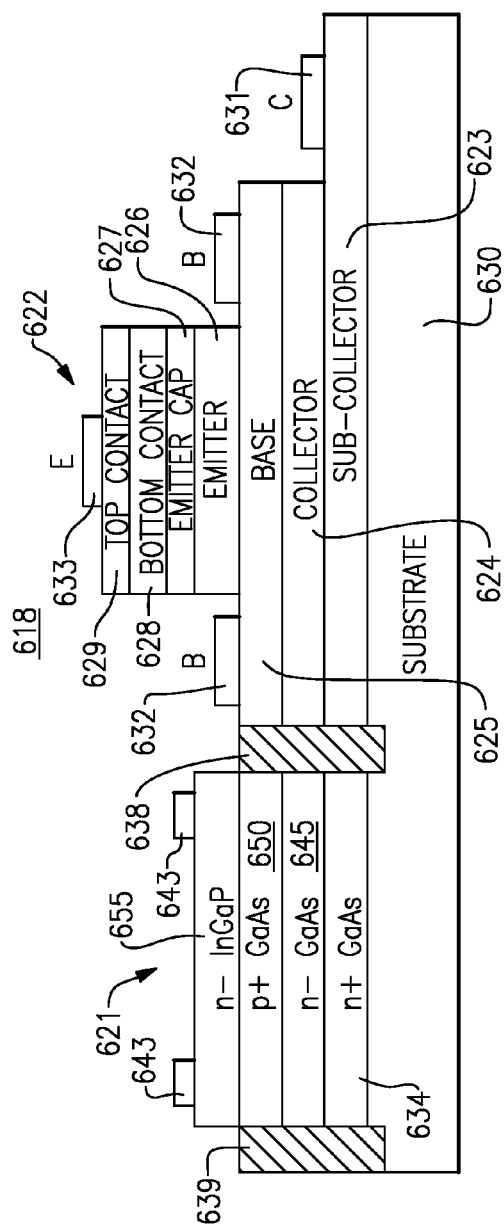

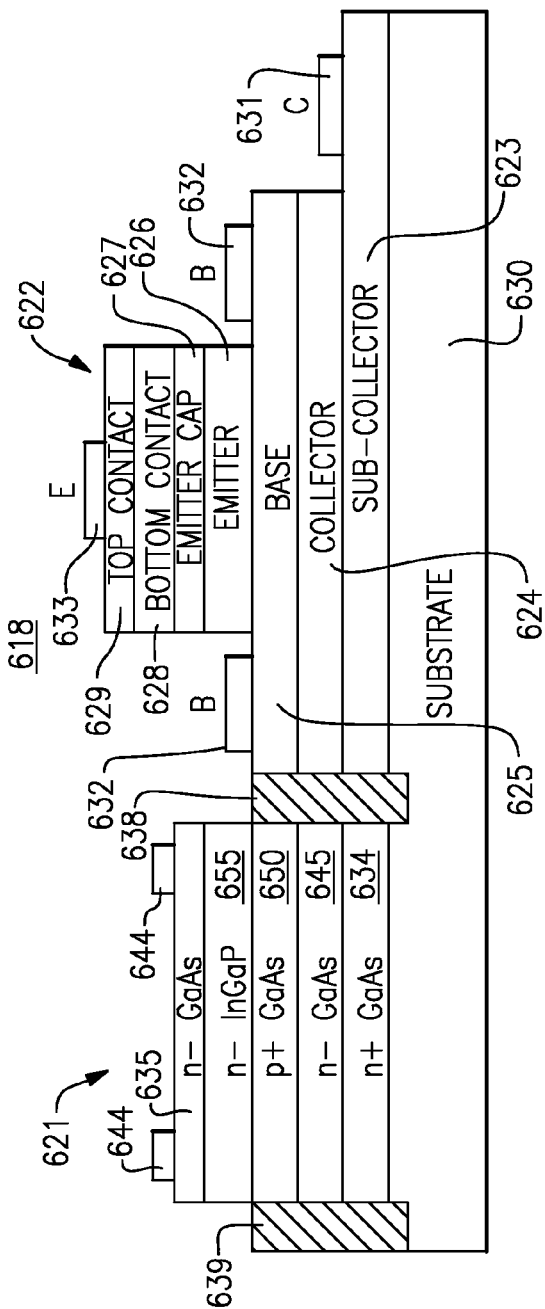
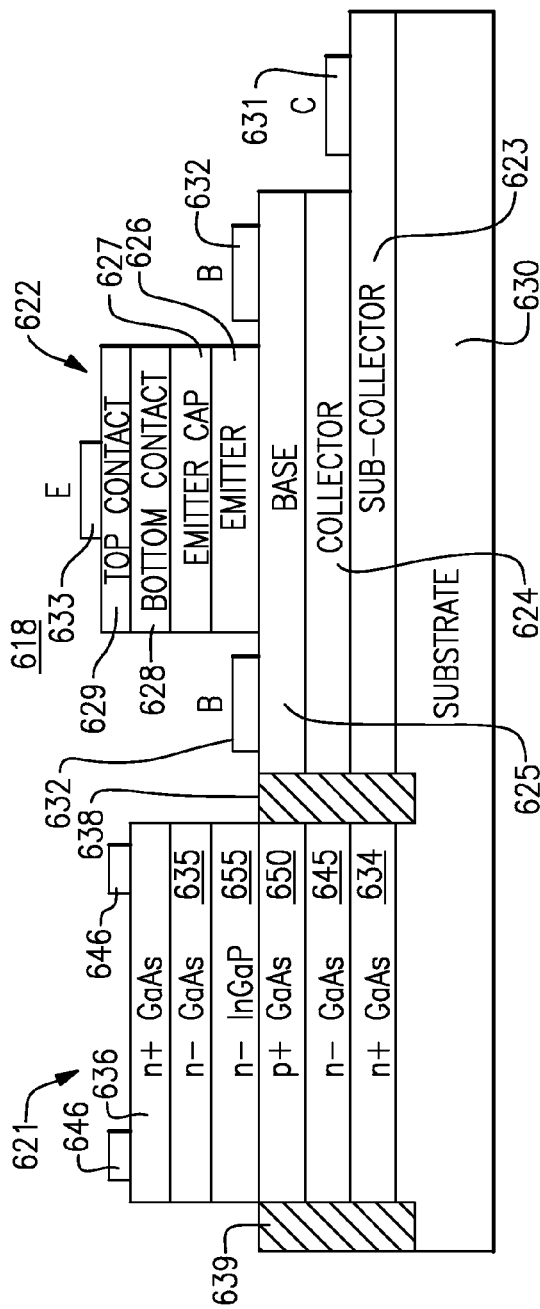

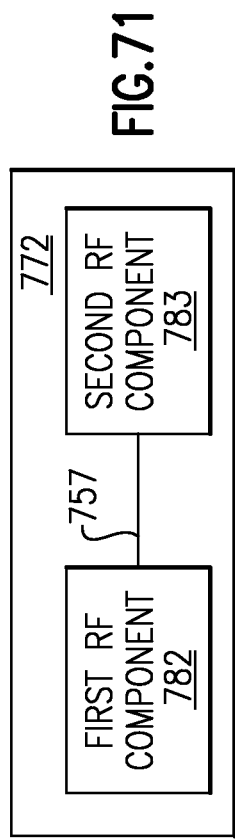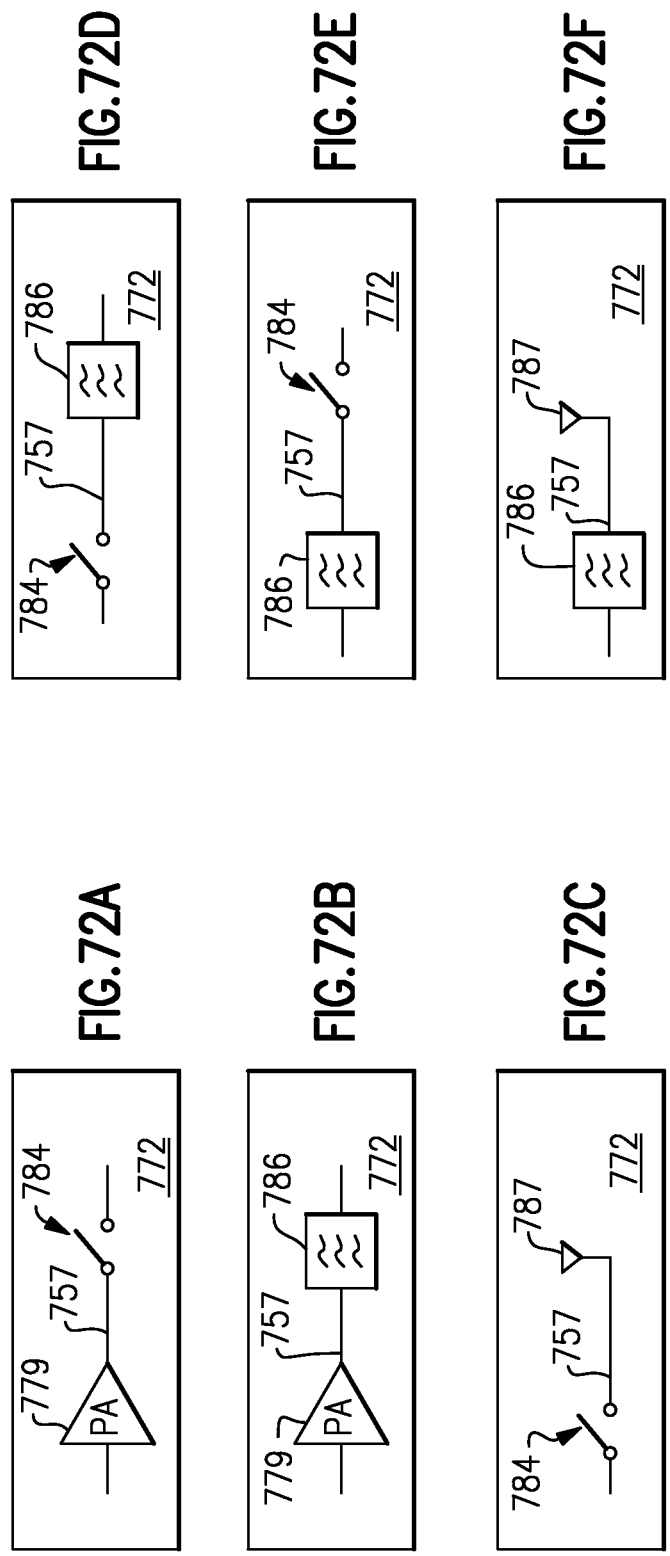

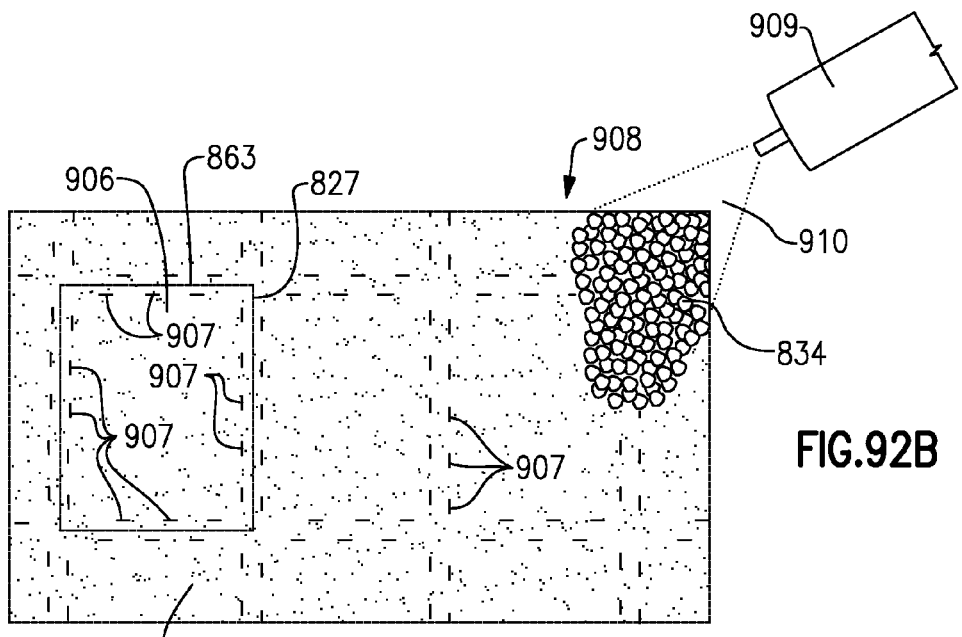
FIG.92B
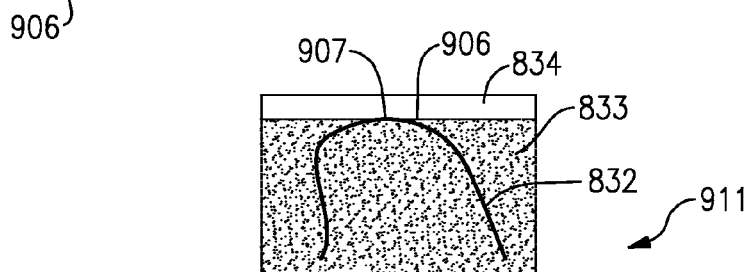
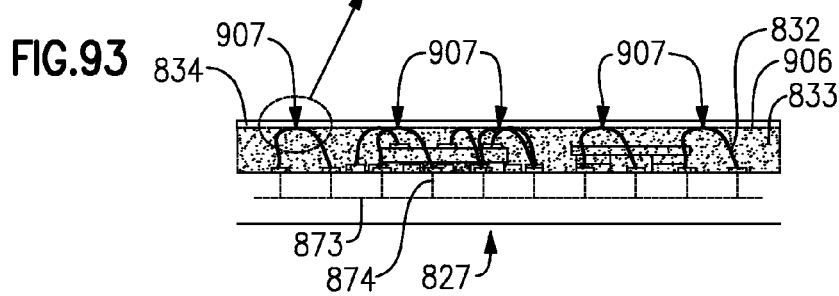
FIG.93
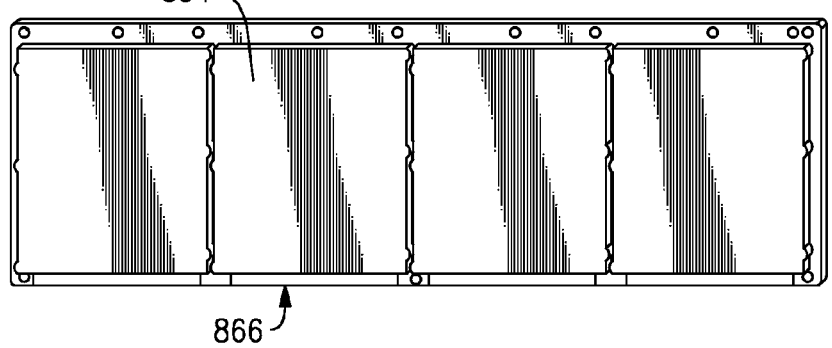
FIG.94

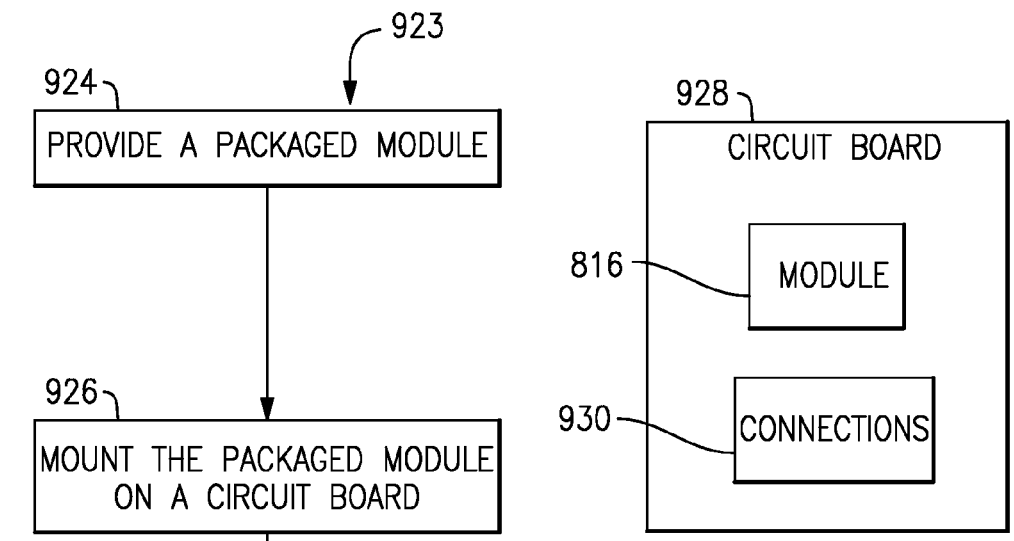
FIG.98B
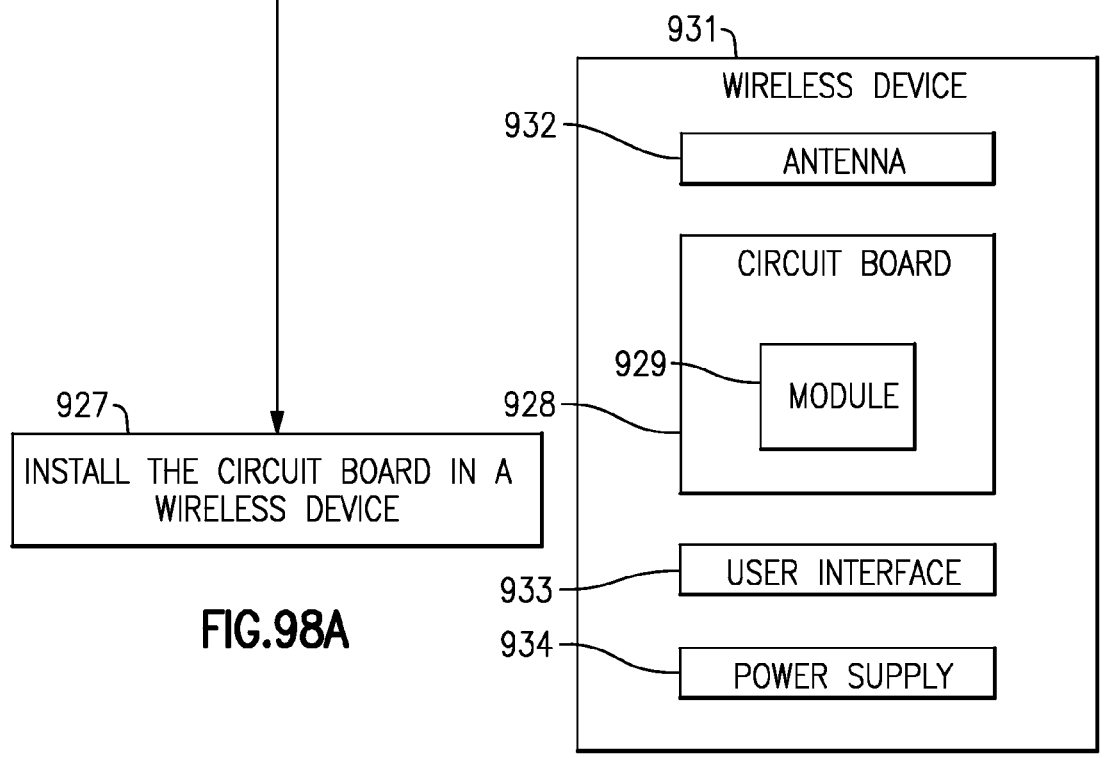
FIG.98A
FIG.98C

EMI SCAN

EMI SCAN FOR UPDATED VIA PLACEMENT
WITH ADDITIONAL VIAS AT HB OUTPUT

LEGEND
EMI (dBm)

POWER AMPLIFIER MODULES INCLUDING BIPOLAR TRANSISTOR WITH GRADING AND RELATED SYSTEMS, DEVICES, AND METHODS

CROSS REFERENCE TO RELATED APPLICATIONS

This application is a divisional of U.S. patent application Ser. No. 13/917,384, filed Jun. 13, 2013, titled "POWER AMPLIFIER MODULES INCLUDING RELATED SYSTEMS, DEVICES, AND METHODS," which is a non-provisional of and claims the benefit of priority from U.S. Provisional Patent Application 61/659,848, filed Jun. 14, 2012, titled "POWER AMPLIFIER MODULE," the disclosures of each of which are hereby incorporated by reference in their entireties herein.

BACKGROUND

1. Field of the Invention

This invention relates in general to power amplifiers and, in particular, to power amplifier modules. More specifically, but without restriction to the particular embodiments hereinafter described in accordance with the best mode of practice, this invention relates to power amplifier modules for use in wireless communications and includes related systems, devices, and methods.

2. Description of Related Technology

Power amplifiers can be included in mobile devices to amplify a RF signal for transmission via an antenna. For example, in mobile devices having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal having a relatively low power. It can be important to manage the amplification of a RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

The power consumption of a power amplifier and power added efficiency (PAE) associated therewith can be an important consideration. In view of the ever increasing demands associated with providing wireless communication for voice, data, and system control, there is a need for improved power amplifiers, power amplifiers modules, and devices, systems, and methods relating thereto. Furthermore, there is a need for power amplifiers having improved power efficiency.

Certain specific aspects of the present invention relate to the field of integrated circuit packaging, and more particularly to systems and methods of forming wire bond pads for packaging radio frequency (RF) integrated circuits (ICs).

Silicon or other semiconductor wafers are fabricated into integrated circuits as is known to one of ordinary skill in the art of IC fabrication. An IC is bonded and electrically connected to a carrier or substrate, which has layers of dielectric and metal traces, and packaged for use. A surface plating material is plated onto the top layer of copper traces to provide electrical connection points between the IC and the substrate, permitting the IC to interface with the outside world. Traditionally, nickel/gold (Ni/Au) has been a standard surface plating material for RFIC products and in certain situations, the RFIC is wire-bonded to the Ni/Au wire-bond pads plated on the surface of the substrate to form the electrical connections of the RFIC with its package. However, increases in gold prices have increased packaging costs associated with the Ni/Au surface plating.

Other particular aspects of the present invention relate to the field of integrated circuit layout and packaging, and more particularly to systems and methods of layout and packaging of radio frequency (RF) integrated circuits (ICs).

Still other aspects of this invention more particularly to bipolar transistors and products that include bipolar transistors. Bipolar transistors, such as heterojunction bipolar transistors (HBTs), are implemented in a wide variety of applications. Such bipolar transistors can be formed on semiconductor substrates, such as gallium arsenide (GaAs) substrates. One illustrative application for a bipolar transistor is in a power amplifier system. As technology evolves, specifications for power amplifier systems have become more demanding to meet.

As indicated above, one aspect of power amplifier performance is linearity. Measures of linearity performance can include channel power ratios, such as the adjacent channel power ratio (ACPR1) and the alternative channel power ratio (ACPR2), and/or channel leakage power ratios, such as an adjacent channel leakage power ratio (ACLR1) and an alternative channel leakage power ratio (ACLR2). ACPR2 and ACLR2 can be referred to as second channel linearity measures. ACPR2 and ACLR2 values can correspond at measurements at an offset of about 1.98 MHz from a frequency of interest.

Conventionally, most publications in the literature have focused on ACPR1 and ACLR1 linearity measures and little has been published about ACRP2 or ACLR2. Recent ACPR2 and ACLR2 system specifications from industry have been particularly difficult to meet, especially while meeting other system specifications related to RF gain. Accordingly, a need exists for improved linearity in systems that include bipolar transistors, such as power amplifier systems.

Yet still further aspects of the present disclosure relate to a dual mode digital control interface for power amplifiers.

A number of electronic devices, including wireless devices, may have one or more components that are controlled or set by a front-end component. For example, a power amplifier may be set or configured by a power amplifier controller. In some cases, the power amplifier controller may itself be controlled or configured by another interface component based on the state of the device.

Often, various components within a device will be created by different organizations. To facilitate interoperability between components, which may be designed by different organizations, standards are often adopted for different types of devices and components. As technology advances, standards may change or new standards may be adopted. In some cases, the newer standards are not compatible with the older standards.

And still yet other aspects of the present invention relate to heterojunction bipolar transistor (HBT) power amplifier bias circuits. Power amplifiers are typically active elements that can magnify an input signal to yield an output signal that is significantly larger than the input signal. Many types of power amplifiers exist and there are many ways to create power amplifiers. For example, some power amplifiers can be created using heterojunction bipolar transistors (HBT). Many HBT power amplifiers use a diode stack bias configuration. In some such configurations, the diode stack bias configuration exhibits sensitivity to the device beta, which can result in substantial quiescent current variation of the amplifier. Further, the variation of quiescent current may impact performance parameters and may degrade product yield.

Further aspects hereof relate to the understanding that in some semiconductor material systems it is possible to combine different device technologies on a single semiconductor die to form hybrid structures. For example, in certain material systems, it is possible to integrate a heterojunction bipolar transistor (HBT) with a field effect transistors (FET) on a single substrate, to fabricate what is referred to as a BiFET. Devices, such as RF power amplifiers, can be fabricated using BiFET technology to have increased design flexibility. As a result, a BiFET power amplifier including an HBT and a FET can be advantageously designed to operate at a lower reference voltage than a bipolar transistor power amplifier. Of particular interest to device manufacturers are high power BiFET amplifiers, which can be formed by integrating a FET into a gallium arsenide (GaAs) HBT process. However, previous attempts to integrate a FET into a GaAs HBT process have resulted only in an n-type FET device.

Therefore, it would be desirable to have a BiFET device structure that includes a p-type FET device, and that may include complementary n-type and p-type FET devices.

And yet still other aspects of the improved technology disclosed herein relate to terminating a harmonic component of a signal. In relatively high frequency applications, such as radio frequency (RF) applications, unwanted signal reflection and/or noise can occur. Such unwanted signal reflection and/or noise can occur at a fundamental frequency of the signal and/or other frequencies, such as harmonics of the fundamental frequency of the signal. To reduce the impact of signal reflection and/or noise, impedance matching can be implemented. One illustrative application in which it is advantageous to minimize unwanted signal reflection and/or noise is a power amplifier system.

Power added efficiency (PAE) is one metric for rating power amplifiers. In addition, linearity is another metric for rating power amplifiers. PAE and/or linearity can be metrics by which customers, such as original equipment manufacturers (OEMs), determine which power amplifiers to purchase. For instance, power amplifiers with a PAE below a certain level may not be purchased by a customer due to the impact of PAE on the customer's product. A lower PAE can, for example, reduce the battery life of an electronic device, such as a mobile phone. However, enhancing PAE can come at the cost of adversely impacting linearity. Similarly, improving linearity can cause a decrease in PAE. At the same time, customers want power amplifiers with high linearity and high PAE.

A load line at an output of a power amplifier can impact both PAE and linearity. Some conventional power amplifier systems have included a load line to match an impedance of the power amplifier output at a fundamental frequency of the power amplifier output signal and also to perform harmonic termination. However, it has proved difficult to match an impedance of the fundamental frequency of the power amplifier output while including harmonic termination in a way that optimizes both PAE and linearity. Accordingly, a need exists to improve both linearity and PAE of a power amplifier.

Now still further aspects of the present invention relate to transmission lines for high performance radio frequency applications.

Transmission lines can be implemented in a variety of contexts, such as on a packaging substrate or printed circuit board (PCB). Multi-layer laminate PCBs or package substrates are extensively used in radio frequency (RF) applications.

RF circuits, such as power amplifiers, low noise amplifiers (LNAs), mixers, voltage controlled oscillators (VCOs), filters, switches and whole transceivers have been implemented using semiconductor technologies. However, in RF modules (for example, an RF front-end module including power amplifiers, switches, and/or filters), single chip integration may not be practical due to different blocks being implemented in different semiconductor technologies. For instance, a power amplifier may be formed by a GaAs process, while related control and/or bias circuitry may be formed by a CMOS process.

Long transmission lines and/or other on chip passives can consume large chip area. Consequently, multi-chip module (MCM) and/or system in package (SiP) assembly technology can be used to achieve low cost, small size and/or high performance in RF modules. Laminate technology can be used for MCM assembly, in which transmission lines are implemented on a laminate substrate. Conductor loss in such transmission lines can have a significant impact on the performance of any of the elements in the MCM. Accordingly, laminate plating technology can impact RF performance significantly.

The cost of laminate technology can be driven by the choice materials for performance and/or assembly needs. RF SiPs that use gold (Au) wire bonding to connect RF circuit elements to transmission lines can use a variety of different finish platings such as lower loss, more expensive NiAu (for example, due to thicker Au) or higher loss, less expensive NiPdAu. Accordingly, a need exists for cost effective, high performance technology for RF transmission lines.

And yet further aspects related to apparatus and methods for tantalum nitride terminated through-wafer vias. In certain implementations, a tantalum nitride (TaN) termination layer is formed on a first or front side of a gallium arsenide (GaAs) wafer, and a gold conductive layer is formed over the TaN termination layer. Thereafter, a through-wafer via is etched into a second or back side of the GaAs wafer so as to extend through the GaAs wafer and a first or inner portion of the TaN termination layer to reach the gold conductive layer. In certain implementations, the through wafer via is plated with a nickel vanadium (NiV) barrier layer, a gold seed layer, and a copper layer. During through-wafer via formation, a second or outer portion of the TaN termination layer is maintained and configured to surround an interface between the gold conductive layer and the copper layer so as to inhibit diffusion of copper into the GaAs wafer.

TaN terminated through-wafer vias can provide improved metal adhesion and reduced copper migration relative to schemes employing silicon nitride termination and a sputtered barrier layer. Furthermore, in certain implementations using a TaN termination layer to terminate a through-wafer via can permit the location or position of the through wafer via to be moved without changing fabrication or lithographical masks associated with transistor structures formed on the front side of the GaAs wafer. Configuring the through-wafer vias to be movable without changing lithographical mask associated with transistors can increase design flexibility and/or reduce time and cost associated with incremental fixes or tape-outs of integrated circuits designs that include the through-wafer vias.

In addition to the above, still further aspects of the present disclosure relate to packaged semiconductor structures and, more particularly, to structures that provide radio frequency (RF) isolation and/or electromagnetic radiation.

Packaged semiconductor components can include integrated shielding technology within a package. To form a shield, which can be referred to as a "Faraday cage," a top layer conductive layer can be electrically connected to a bottom conductive layer by vias. For instance, the bottom conductive layer can be a ground plane and the vias can connect the top conductive layer to ground. The vias can provide an electrical connection between the top and the bottom conductive layers and also function as part of the shield itself. However, the vias can consume a significant amount of area in the package. At the same time, the vias can affect a strength of the ground connection of the shield.

Further to the above, additional aspects of this invention are directed to semiconductor device packages and, more particularly, to electromagnetic and/or radio frequency interference shielding for semiconductor devices.

There exists a general need in radio frequency (RF) communication systems for RF devices to be isolated from electromagnetic (radio frequency) interference (EMI) generated by other RF devices in order to maintain proper device performance. Similarly, the RF devices generally need to be isolated from the electromagnetic interference received from, or transmitted to, the environment.

The traditional method of isolating RF devices from such electromagnetic interference is to cover the RF device with a grounded metal enclosure typically called a "can." However, this solution is costly and lacks design flexibility. In addition, the metal can adds significant size to the device footprint on a printed circuit board, and also adds weight to the printed circuit board.

Implementing one or more of the features, attributes, or characteristics described in further detail in the various following sections hereof can achieve desirable linearity and PAE in a power amplifier system. Moreover, implementing in a power amplifier system one or more features described in the following disclosure can achieve desirable FOM and/or other metrics by which power amplifiers are rated. Although some features hereof are described in connection with a power amplifier module for illustrative purposes, it will be understood by those of skill in the art that the principles and advantages described herein can be applied to other portions of a power amplifier system, such as in a power amplifier die, a substrate for use with a power amplifier die, and a wireless communications device that includes a power amplifier, and in any and all other applications that would be apparent to those skilled in any analogous art.

SUMMARY

I. Introduction

Power amplifiers can boost the power of a radio frequency (RF) signal having a relatively low power. Thereafter, the boosted RF signal can be used for a variety of purposes, such as driving the antenna of a transmitter.

Power amplifiers can be used in a variety of RF wireless communications devices. As one example, power amplifiers can be included in mobile phones to amplify an RF signal for transmission. For instance, in mobile phones having a time division multiple access (TDMA) architecture, such as those found in Global System for Mobile Communications (GSM), code division multiple access (CDMA), and wideband code division multiple access (W-CDMA) systems, a power amplifier can be used to amplify an RF signal.

Power Added Efficiency (PAE) is one metric for rating power amplifiers. Linearity is another metric for rating power amplifiers. PAE and/or linearity can be metrics by which customers determine which power amplifiers to purchase. For instance, power amplifiers with a PAE below a certain level may not be purchased by a customer due to the impact of PAE on a customer product. A lower PAE can, for example, reduce the battery life of a mobile device, such as a mobile phone. Linearity can be measured, for example, by an Adjacent-Channel Power Ratio (ACPR) and/or an Alternative Channel Power Ratio (ACPR2). It can be difficult to achieve high PAE and high linearity at the same time. Yet customers typically desire high PAE and high linearity. Figure of Merit (FOM) is one metric that can reflect both PAE and linearity.

II. Wire Bond Pad Systems and Related Methods

Systems and methods are disclosed to reduce the cost of RFIC packaging by using a Nickel/Palladium/Gold (Ni/Pd/Au) surface plating material for RFIC products. To decrease the costs, the gold layer in the Ni/Pd/Au surface plating is thinner than the gold layer in Ni/Au surface plating. However, Ni/Pd/Au has a much higher radio frequency sheet resistance than Ni/Au due to thin palladium and gold layers and the ferromagnetic nature of nickel. This contributes to reduced effective current sheet thickness and increased current crowding on the RF signals, and can, in some embodiments, lead to greater RF losses for RF signals traveling through the Ni/Pd/Au plated surfaces than are found on RF signals traveling through the Ni/Au plated surfaces. These losses can impact product performance and yield.

Further systems and methods are disclosed to reduce the RF losses associated with the lower cost Ni/Pd/Au surface plating for RFICs. In some embodiments of design layouts, the RF line/trace surface, edge, and sidewalls in the wire-bonding area are open to the plating process and are therefore plated with the Ni/Pd/Au surface finish. Due to the skin effect and eddy current effect on the RF current traveling through the plated wire-bonding areas, a majority of the RF current is running on the trace edges and side walls of the plated wire-bonding areas. Because a majority of the RF current is running on the trace edges and side walls, plating the trace edges and sidewalls contributes more to RF losses. To reduce the RF losses, some embodiments reconfigure the solder mask to cover the trace edges and sidewalls in the wire-bonding area such that the trace edges and sidewalls are not plated with the Ni/Pd/Au surface finish. The copper trace edges and sidewalls free from the Ni/Pd/Au plating around the wire-bonding areas provide a low resistive path for the RF current around the Ni/Pd/Au wire bond pad and thus, reduce the RF signal loss associated with the Ni/Pd/Au surface plating of the RFIC substrate.

Certain embodiments relate to a method of fabricating a radio frequency integrated circuit (RFIC) module including providing a substrate having at least one copper trace, the copper trace having a wire bonding surface. The method further includes forming a solder mask opening for a wire bonding pad directly over the bonding surface of the copper trace, the wire bonding pad having at least one edge and at least one sidewall. The method further includes forming solder mask directly over the at least one edge and the at least one sidewall of the wire bonding pad, plating the copper trace with a nickel layer, plating the nickel layer with a palladium layer and plating the palladium layer with a gold layer to form a nickel/palladium/gold wire bonding pad. The nickel/palladium/gold wire bonding pad has the at least one edge and the at least one sidewall free from the nickel, palladium, and gold layers.

According to a number of embodiments, the disclosure relates to a wire bonding pad for a radio frequency integrated circuit (RFIC) module. The wire bonding pad includes a nickel layer plated over a wire bonding surface of a copper trace, the copper trace formed on an upper surface of a substrate of an RFIC module. The wire bonding pad further includes a palladium layer plated over the nickel layer and a gold layer plated over the palladium layer. The wire bonding pad having a wire bond area, at least one edge adjacent to the wire bond area, and at least one sidewall adjacent to the at least one edge, the at least one edge and the at least one sidewall free from the nickel layer, the palladium layer, and the gold layer.

In accordance with various embodiments, an apparatus for fabricating a radio frequency integrated circuit (RFIC) module includes means for providing a substrate having at least one copper trace, the copper trace having a wire bonding surface, and means for forming a solder mask opening for a wire bonding pad directly over the bonding surface of the copper trace, the wire bonding pad having at least one edge and at least one sidewall. The apparatus further includes means for forming solder mask directly over the at least one edge and the at least one sidewall of the wire bonding pad, means for plating the copper trace with a nickel layer, means for plating the nickel layer with a palladium layer, and means for plating the palladium layer with a gold layer to form a nickel/palladium/gold wire bonding pad. The nickel/palladium/gold wire bonding pad has the at least one edge and the at least one sidewall free from the nickel, palladium, and gold layers.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

III. Apparatus and Methods for Reducing Impact of High RF Loss Plating

Systems and methods are disclosed to reduce the cost of RFIC packaging by using a Nickel/Palladium/Gold (Ni/Pd/Au) surface plating material for RFIC products. To decrease the costs, the gold layer in the Ni/Pd/Au surface plating is thinner than the gold layer in Ni/Au surface plating. However, Ni/Pd/Au has a much higher radio frequency sheet resistance than Ni/Au due to thin palladium and gold layers and the ferromagnetic nature of nickel. This contributes to reduced effective current sheet thickness and increased current crowding on the RF signals, and can, in some embodiments, lead to greater RF losses for RF signals traveling through the Ni/Pd/Au plated surfaces than are found on RF signals traveling through the Ni/Au plated surfaces. These losses can impact product performance and yield.

Further systems and methods are disclosed to reduce the RF losses associated with the lower cost Ni/Pd/Au surface plating for RFICs. In some embodiments of design layouts, the RF line/trace surface, edge, and sidewalls in the wire-bonding area are open to the plating process and are therefore plated with the Ni/Pd/Au surface finish. Due to the skin effect and eddy current effect on the RF current traveling through the plated wire-bonding areas, a majority of the RF current is running on the trace edges and side walls of the plated wire-bonding areas. Because a majority of the RF current is running on the trace edges and side walls, plating the trace edges and sidewalls contributes more to RF losses. To reduce the RF losses, some embodiments reconfigure the solder mask to cover the trace edges and sidewalls in the wire-bonding area such that the trace edges and sidewalls are not plated with the Ni/Pd/Au surface finish. The copper trace edges and sidewalls free from the Ni/Pd/Au plating around the wire-bonding areas provide a low resistive path for the RF current around the Ni/Pd/Au wire bond pad and thus, reduce the RF signal loss associated with the Ni/Pd/Au surface plating of the RFIC substrate.

In addition, systems and methods are disclosed to reduce the RF losses associated with the high RF loss bonding pad of an on-die capacitor, resistor, inductor, or other passive device of the RFIC. In some embodiments, RFICs include an on-die capacitor, resistor, inductor, or other passive device. The capacitor or passive device is bonded to the copper trace carrying the RF current. When a high RF loss bonding pad, such as a Ni/Pd/Au bonding pad, for example, is used to connect the passive device to the circuit traces of the RFIC module, the high RF loss bonding pad creates RF signal losses when the RF current flows through it. Placing the on-die capacitor, resistor, inductor, or other passive device in an RF upper trace with respect to the RF signal output of the RFIC reduces the RF losses associated with the on-die passive device bonding pad.

In certain embodiments, an electronic circuit module configured to reduce signal losses is disclosed. The module includes an electronic circuit device having an output signal and a current associated therewith. The electronic circuit device includes a first lead, a second lead, and an integrated circuit die having an on-die passive component. The electronic circuit module further includes a substrate including a trace for conducting the current. The trace has a first bonding pad on an upper signal path electrically connected to the first lead and a second bonding pad on a down signal path electrically connected to the second lead. The electronic circuit device is configured such that the on-die passive component electrically connects to the first lead and the output signal electrically connects to the second lead. The current thereby being directed away from the first bonding pad. In an embodiment, the electronic circuit module is a radio frequency integrated circuit module and the signal losses are radio frequency signal losses. In another embodiment the electronic circuit device is a radio frequency electronic circuit device, the output signal is a radio frequency output signal, and the current is a radio frequency current.

According to a number of embodiments, an electronic circuit device is configured to reduce signal losses. The device includes an integrated circuit die having an on-die passive component, an output signal having an associated current, a first lead electrically connected to a first bonding pad located on an upper signal path of a trace on a substrate, and a second lead electrically connected to a second bonding pad located on a down signal path on the trace. The electronic circuit device is configured such that the on-die passive component electrically connects to the first lead and the output signal electrically connects to the second lead. The current thereby being directed away from the first bonding pad.

In accordance with various embodiments, a method for reducing signal losses in an electronic circuit module is disclosed. The method includes fabricating an electronic circuit device including an integrated circuit die having an on-die passive component, and generating an output signal from the electronic circuit device. The output signal has an associated current. The method further includes forming a first lead and a second lead on the electronic circuit device, forming a first bonding pad and a second bonding pad on a substrate, and forming a trace on the substrate to provide a conductive path to conduct the current between the first and the second bonding pads. The trace has an upper signal path associated with the first bonding pad and a down signal path associated with the second bonding pad. The method further includes electrically connecting the first lead to the first bonding pad, electrically connecting the second lead to the second bonding pad, and configuring the electronic circuit device so that the on-die passive component electrically connects to the first lead and the output signal electrically connects to the second lead. The current thereby being directed away from the first bonding pad.

In an embodiment, an apparatus for reducing signal losses in an electronic circuit module is disclosed. The apparatus includes means for fabricating an electronic circuit device including an integrated circuit die having an on-die passive component, and means for generating an output signal from the electronic circuit device. The output signal has an associated current. The apparatus further includes means for forming a first lead and a second lead on the electronic circuit device, means for forming a first bonding pad and a second bonding pad on a substrate, and means for forming a trace on the substrate to provide a conductive path to conduct the current between the first and the second bonding pads. The trace has an upper signal path associated with the first bonding pad and a lower signal path associated with the second bonding pad. The apparatus further includes means for electrically connecting the first lead to the first bonding pad, means for electrically connecting the second lead to the second bonding pad, and means for configuring the electronic circuit device such that the on-die passive component electrically connects to the first lead and the output signal electrically connects to the second lead. The current thereby being directed away from the first bonding pad.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

IV. Bipolar Transistors Having Collector with Grading

The innovations described in the claims each have several aspects, no single one of which is solely responsible for its desirable attributes. Without limiting the scope of this invention, some prominent features will now be briefly discussed.

One aspect of this disclosure is a bipolar transistor that includes a collector, a base disposed over the collector, and an emitter. The collector has a doping concentration of at least about $3 \times 10^{16}$ cm$^{-3}$ in a first collector region abutting the base. The collector also has another collector region under the first collector region. The other collector region includes at least one grading in which doping concentration increases away from the first collector region.

In certain embodiments, the other collector region includes a first grading and a second grading in which doping concentration increases away from the base at a different rate than in the first grading. According to some of these embodiments, the bipolar transistor of can have a gain of at least about 29 dBm at a frequency within a frequency band centered around about 833 MHz. In accordance with a number of embodiments, the second grading of the bipolar transistor can be configured to increase BvCEX of the bipolar transistor compared to the same transistor without the second grading at the same current density. In various embodiments, a doping concentration in the first grading grades from about an order of magnitude less than the doping concentration of the first collector region to less than the doping concentration of the first collector region. According to some of these embodiments, a doping concentration in the second grading grades from about a maximum doping concentration in the first grading to a doping concentration that is at least about one order of magnitude less than the doping concentration of a sub-collector below the second grading. In some embodiments, the first grading spans a second collector region proximate the first collector region and having a thickness that is more than approximately twice the thickness of the first collector region. According to certain embodiments, the second grading spans a third collector region having a thickness that is greater than the thickness of the first collector region and less than the thickness of the second collector region. In various embodiments, the collector consists essentially of the first collector region, the second collector region, and the third collector region. According to some embodiments, the bipolar transistor also includes a sub-collector under the collector. In accordance with certain embodiments, the first grading borders the second grading and doping concentration is approximately the same on both sides of the border of the first grading and the second grading.

In certain embodiments, a thickness of the first collector region is selected from a range of about 1000 Å to 2000 Å. According to some of these embodiments, the doping concentration of the first collector region is selected from a range of about $3 \times 10^{16}$ cm$^{-3}$ to $9 \times 10^{16}$ cm$^{-3}$.

According to a number of embodiments, the doping concentration in the first collector region is at least about $6 \times 10^{16}$ cm$^{-3}$.

In accordance with some embodiments, the base has a thickness of less than about 1400 Å. In some of these embodiments, the base has a doping concentration selected from a range of about $3.5 \times 10^{19}$ cm$^{-3}$ to $7 \times 10^{19}$ cm$^{-3}$.

In a number of embodiments, the bipolar transistor is a heterojunction bipolar transistor (HBT).

According to some embodiments, the bipolar transistor is a GaAs transistor.

Another aspect of this disclosure is a power amplifier module that includes a bipolar transistor. The bipolar transistor has a collector, a base, and an emitter. The collector has a doping concentration at a junction with the base such that the power amplifier has an alternative channel power ratio (ACPR2) of no greater than about 65 dBc. The collector also has at least a first grading in which doping concentration increases away from the base.

According to certain embodiments, the ACPR2 is no greater than about 65 dBc when the power amplifier operates within a frequency band centered around approximately 833 MHz.

In a number of embodiments, the collector also includes a second grading farther from the base than the first grading. The second grading is configured to increase BvCEX of the bipolar transistor compared to the same transistor without the second grading at the same current density, according to some embodiments.

According to a number of embodiments, the doping concentration in the collector at the junction with the base is at least about $3 \times 10^{16}$ cm$^{-3}$.

In certain embodiments, the collector includes a first region abutting the base having a substantially flat doping concentration of at least about $3 \times 10^{16}$ cm$^{-3}$ and a thickness selected from a range of about 1000 Å to 2000 Å. According to some of these embodiments, the doping concentration in the first region of the collector is selected in the range from about $3 \times 10^{16}$ cm$^{-3}$ to $9 \times 10^{16}$ cm$^{-3}$.

A further aspect of this disclosure is a power amplifier die that includes a bipolar transistor having a collector, a base abutting the collector, and an emitter. The collector has a doping concentration of at least about $3 \times 10^{16}$ cm$^{-3}$ at a junction with the base. The collector also has at least a first grading in which doping concentration increases away from the base.

Another aspect of this disclosure is a mobile device that includes an antenna, a battery, and a power amplifier. The power amplifier includes a heterojunction bipolar transistor having a collector, a base, and an emitter. The collector includes a first collector region abutting the base and having a first doping concentration of at least about $3 \times 10^{16}$ cm$^{-3}$. The collector also includes a second collector region proximate the first collector region and having a first grading in which doping concentration increases away from the base. The collector also includes a third collector region proximate the second collector region and having a second grading in which doping concentration increases away from the base at a different rate than the first grading. The first doping concentration, the first grading, and the second grading are configured to improve linearity of the power amplifier.

Yet another aspect of this disclosure is a method of forming a bipolar transistor. The method includes forming a sub-collector; forming a collector region with at least one grading having a doping concentration that decreases away from the sub-collector; and forming a different collector region adjacent abutting a base of the bipolar transistor and having a doping concentration of at least about $3 \times 10^{16}$ cm$^{-3}$ at an interface with the base.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

V. Dual Mode Power Amplifier Control with Three-Mode Input/Output Interface

In accordance with some embodiments of this invention, this aspect of the present disclosure relates to a dual mode control interface that can be used to provide both a radio frequency front end (RFFE) serial interface and a general purpose input/output (GPIO) interface within a single digital control interface die. In certain embodiments, the dual mode control interface, or digital control interface, can communicate with a power amplifier. Further, the dual mode control interface can be used to set the mode of the power amplifier.

According to certain embodiments, the dual mode control interface includes a RFFE core configured to provide a RFFE serial interface. Further, the dual mode control interface includes a voltage input/output (VIO) pin configured to receive a VIO signal. This VIO signal determines whether an operating mode of the RFFE core is set to one of an active state and an inactive state. When the RFFE core is set to the inactive state, the dual mode control interface is configured to provide a general purpose input/output (GPIO) interface In addition, the dual mode control interface includes a combinational logic block configured to provide an enable signal and a mode signal to an enable level shifter and a mode level shifter, respectively. Moreover, the dual mode control interface includes a power on reset configured to select the enable signal and the mode signal to provide to the enable level shifter and the mode level shifter, respectively, based on the VIO signal.

For some implementations, the dual mode interface includes a clock/mode pin configured to provide a clock signal to the RFFE core when the RFFE core is set to an active state and a mode signal to the combinational logic block when the RFFE core is set to an inactive state. In addition, the dual mode interface includes a data/enable pin configured to provide a data signal to the RFFE core when the RFFE core is set to an active state and an enable signal to the combinational logic block when the RFFE core is set to an inactive state.

In some variations, the data/enable pin is further configured to provide an address signal to the RFFE core, the address signal associated with a register of the RFFE core.

According to some other related embodiments hereof, the dual mode interface includes a plurality of level shifters. Each level shifter of the plurality of level shifters may be configured to receive a register signal from the RFFE core. The register signal can be associated with a value stored in one of a plurality of registers associated with the RFFE core.

VI. Process-Compensated HBT Power Amplifier Bias Circuits and Related Methods In some implementations relating to this aspect of the present invention, the present disclosure relates to a power amplifier (PA) configuration that takes advantage of a passive device on the amplifier die to effectively sense die-dependent parameter such as beta and compensate for the associated effects such as quiescent-current variation to improve performance and/or reduce the part-to-part variation of the product. In some embodiments thereof, such a PA configuration can include a silicon bias die and an HBT amplifier die. Traditionally, the silicon die would generate a reference current for the PA die which is substantially constant with respect to temperature of the PA die and essentially only varies by the tolerance of a discrete resistor.

In some implementation of the present invention, such a discrete reference resistor can be replaced by an integrated resistor on the HBT die. In some embodiments thereof, this integrated resistor can be formed with the HBT device base material, and can exhibit a sheet resistance characteristic which tracks with the process beta. Based on such resistance, a reference current can be configured to track with beta and cancel or reduce the "diode-stack" sensitivity to beta.

In other embodiments relating hereto, the foregoing base resistor (Rb) type can be configured to yield a high temperature coefficient which can be compensated by the bias generation circuitry within the silicon control die such that the voltage applied across the reference resistor increases with the ambient temperature. The resulting reference current sourced to the amplifier can be substantially constant over a selected range of ambient temperature and substantially track the HBT process beta.

VII. Devices and Methods for Structures Having HBTs and FETs

Embodiments of a semiconductor structure include a heterojunction bipolar transistor (HBT) including a collector layer located over a substrate, the collector layer including a semiconductor material, and a field effect transistor (FET) located over the substrate, the FET including a channel formed in the semiconductor material that forms the collector layer of the HBT.

In some embodiments of this aspect of the present invention, the semiconductor material that forms the collector layer of the HBT and the channel of the FET can include p-type gallium arsenide. In some embodiments, the semiconductor structure can further include an etch stop layer segment located over the collector layer of the HBT and the channel of the FET. In some embodiments, such an etch stop layer can include indium gallium arsenide (InGaAs) or indium gallium phosphide (InGaP), and can have a thickness range between 10 nanometers (nm) and 15 nm. Other thickness ranges can also be implemented. In some embodiments, such an etch stop layer can include any material with etch selectivity to, for example, the channel layer of the FET. Such a material can be implemented in an appropriate thickness or within an appropriate range of thicknesses so as to achieve similar results as the foregoing example materials InGaAs or InGaP.

In accordance with other embodiments hereof, the present disclosure relates to a semiconductor structure having a heterojunction bipolar transistor (HBT) that includes a collector layer located over a substrate and an emitter layer located over the substrate. The collector layer includes a first semiconductor material of a first conductivity type (P), and the emitter layer includes a second semiconductor material of a second conductivity type (N). The semiconductor structure further includes a first field effect transistor (FET) located over the substrate. The first FET includes a channel formed in the first semiconductor material that forms the collector layer of the HBT. The semiconductor structure further includes a second field effect transistor (FET) located over the substrate. The second FET includes a channel formed in the second semiconductor material that forms the emitter layer of the HBT.

In some embodiments hereof, the first semiconductor material that forms the collector layer of the HBT and the channel of the first FET can include p-type gallium arsenide, and the second semiconductor material that forms the emitter layer of the HBT and the channel of the second FET can include n-type gallium arsenide. In some embodiments, semiconductor structure can further include a first etch stop layer segment located over the collector layer of the HBT and the channel of the first FET, and a second etch stop layer segment located over the emitter layer of the HBT and the channel of the second FET. The first etch stop layer segment and the second etch stop layer segment can include indium gallium arsenide (InGaAs) or indium gallium phosphide (InGaP), and can have a thickness range between 10 nanometers (nm) and 15 nm. Other thickness ranges can also be implemented. In some embodiments, such etch stop layers can include any material with etch selectivity to, for example, the channel layers of the first and second FETs. Such a material can be implemented in an appropriate thickness or within an appropriate range of thicknesses so as to achieve similar results as the foregoing example materials InGaAs or InGaP.

In a number of implementations, the present disclosure relates to a method that includes forming a heterojunction bipolar transistor (HBT) including a collector layer located over a substrate and an emitter layer located over the substrate. The collector layer includes a first semiconductor material of a first conductivity type (P), and the emitter layer includes a second semiconductor material of a second conductivity type (N). The method further includes forming a first field effect transistor (FET) over the substrate. The first FET includes a channel formed in the first semiconductor material that forms the collector layer of the HBT. The method further includes forming a second field effect transistor (FET) over the substrate. The second FET includes a channel formed in the second semiconductor material that forms the emitter layer of the HBT.

In some implementations, the first semiconductor material that forms the collector layer of the HBT and the channel of the first FET can include p-type gallium arsenide, and the second semiconductor material that forms the emitter layer of the HBT and the channel of the second FET can include n-type gallium arsenide. In some implementations, the method can further include forming a first etch stop layer segment over the collector layer of the HBT and the channel of the first FET, and forming a second etch stop layer segment over the emitter layer of the HBT and the channel of the second FET. The first etch stop layer segment and the second etch stop layer segment can include indium gallium arsenide (InGaAs) or indium gallium phosphide (InGaP), and can have a thickness range between 10 nanometers (nm) and 15 nm.

According to some implementations, the present disclosure relates to a method that includes forming a heterojunction bipolar transistor (HBT) including a collector layer located over a substrate. The collector layer includes a semiconductor material. The method further includes forming a field effect transistor (FET) located over the substrate. The FET includes a channel formed in the semiconductor material that forms the collector layer of the HBT.

In some implementations, the semiconductor material that forms the collector layer of the HBT and the channel of the FET can include p-type gallium arsenide. In some implementations, the method can further include forming an etch stop layer segment located over the collector layer of the HBT and the channel of the FET. The etch stop layer can include indium gallium arsenide (InGaAs) or indium gallium phosphide (InGaP), and can have a thickness range between 10 nanometers (nm) and 15 nm.

According to some embodiments, the present disclosure relates to a die having an integrated circuit (IC). The die includes a circuit configured to process radiofrequency (RF) signal. The die further includes an assembly of a heterojunction bipolar transistor (HBT) and a field effect transistor (FET) configured to facilitate operation of the circuit. The HBT includes a collector layer including a semiconductor material located over a substrate. The FET includes a channel located over the substrate and formed in the semiconductor material that forms the collector layer of the HBT.

In some embodiments, the circuit configured to process RF signal can include a power amplifier circuit, a controller circuit for the power amplifier circuit, or a controller for a switching circuit. In some embodiments, the assembly can further include a second FET having a channel located over the substrate and formed in same semiconductor material as an emitter of the HBT. The first FET can include a pFET, and the second FET can include an nFET. In some embodiments, the substrate can include gallium arsenide (GaAs).

In a number of embodiments, the present disclosure relates to a packaged module for a radiofrequency (RF) device. The module includes a packaging substrate and an integrated circuit (IC) formed on a die and mounted on the packaging substrate. The IC includes an assembly of a heterojunction bipolar transistor (HBT) and a field effect transistor (FET) configured to facilitate operation of the IC. The HBT includes a collector layer including a semiconductor material located over a die substrate. The FET includes a channel located over the die substrate and formed in the semiconductor material that forms the collector layer of the HBT. The module further includes one or more connections configured to facilitate transfer of power to the IC and RF signals to and from the IC.

According to other related embodiments hereof, the assembly can further include a second FET having a channel located over the die substrate and formed in same semiconductor material as an emitter of the HBT. The first FET can include a pFET and the second FET can include an nFET.

In accordance with some other embodiments relating hereto, the present disclosure relates to a wireless device having an antenna and a radiofrequency integrated circuit (RFIC) configured to process RF signals received from the antenna and for transmission through the antenna. The wireless device further includes a power amplifier (PA) circuit configured to amplify the RF signals. The PA circuit includes an assembly of a heterojunction bipolar transistor (HBT) and a field effect transistor (FET). The HBT includes a collector layer including a semiconductor material located over a substrate. The FET includes a channel located over the substrate and formed in the semiconductor material that forms the collector layer of the HBT.

In still some other related embodiments hereof, the PA can be configured to operate as a high power BiFET amplifier capable of operating at a lower reference voltage than that of a bipolar transistor PA. In some embodiments, the substrate can include gallium arsenide (GaAs).

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

VIII. RF Power Amplifiers Having Semiconductor Resistors

In many situations, it is desirable to reduce the cost of radio-frequency (RF) devices such as power amplifiers (PAs). Removing process steps and/or using "free" devices that do not involve extra processing steps are examples of how such cost-reduction can be achieved. As described herein-below in further detail, semiconductor resistors can provide such advantageous cost reductions. As also described herein, other advantages can also be realized with semiconductor resistors. For example, depending on resistance values available, smaller resistor footprints can be provided, which in turn can help shrink die sizes. Such a reduction in die size can further reduce cost. In another example, some semiconductor resistors can be sensitive to conditions of the same semiconductor materials that also form the resistors.

In some implementations of this aspect of the present invention, some or all of thin-film (e.g., TaN) resistors associated with a semiconductor die and an IC thereon can be replaced with semiconductor resistors. In some implementations, such semiconductor resistors can be fabricated from one or more of the actual layers that form layer-stack devices such as heterojunction bipolar transistors (HBTs). Such resistors can be fabricated with no extra processing steps when the HBTs are made. Because a number of such resistors can be fabricated from different layers of a stack (e.g., emitter layer, base layer, and ion-implanted base layer of an HBT), flexibility in resistance values and die size reduction are possible.

In other implementations hereof, fabrication of a semiconductor resistor having one or more features as described herein can be achieved with no additional processing steps or very little modifications of process steps, when compared to fabrication of stack structure(s) on a given die. Although the various examples are described herein in the context of HBTs, it will be understood that similar resistor structures and fabrication methods can apply to other configurations. For example, additional layers can be formed for fabricating devices that include an HBT and one or more other transistor structures. Examples of such devices include, but are not limited to, U.S. Pat. No. 6,906,359 titled BIFET INCLUDING A FET HAVING INCREASED LINEARITY AND MANUFACTURABILITY and PCT Publication No. WO 2012/061632 titled DEVICES AND METHODOLOGIES RELATED TO STRUCTURES HAVING HBT AND FET.

According to other embodiments, one or more features of the present disclosure can be implemented in III-V semiconductor dies. In some embodiments, such III-V semiconductor dies can include GaAs-based dies. Transistors and/or other stack structures formed on such GaAs-based dies may or may not include an HBT.

As described herein, a number of advantageous features can be provided by semiconductor resistors. Other advantages can include, for example, a desirable feature where different temperature coefficient of resistance (TCR) values is provided by selecting a material associated with the resistor layer. In another example, size of the resistor can be optimized or configured in a desirable manner because of such a range of possible resistance values (e.g., sheet resistance of about 8 ohms/sq (e.g., sub-collector) to about 1,000 Ohms/sq (e.g., implanted base layer)). In yet another example, RF roll-off of resistor can be selected and/or tuned, depending on which resistor is selected (e.g., by modifying how the 3rd terminal on the device is biased).

IX. Signal Path Termination

One aspect of this disclosure is a power amplifier module including a power amplifier die, a load line, and a harmonic termination circuit. The power amplifier die includes one or more power amplifiers configured to amplify an input signal at a power amplifier input and to generate an amplified output signal at a power amplifier output. The power amplifier die also has a plurality of output pins. The load line is configured to match an impedance at the power amplifier output at a fundamental frequency of the amplified output signal. The load line is electrically coupled to a first group of one or more of the plurality of output pins of the power amplifier die external to the power amplifier die. The harmonic termination circuit is separate from the load line. The harmonic termination circuit is configured to terminate at a phase corresponding to a harmonic frequency of the amplified output signal. The harmonic termination circuit is electrically coupled to a second group of one or more other pins of the plurality of output pins of the power amplifier die external to the power amplifier die.

In certain implementations hereof, the harmonic termination circuit can include one or more interconnects coupled to the second group of one or more other pins of the power amplifier die external to the power amplifier die. According to some of these implementations, the one or more interconnects can include a wirebond. Alternatively or additionally, the load line can include one or more other interconnects coupled to the first group of one or more pins of the power amplifier die external to the power amplifier die. In accordance with various implementations, a different number of interconnects can be coupled to the first group of one or more pins of the power amplifier die than to the second group of one or more other pins of the power amplifier die.

According to a number of implementations, the first group of one or more pins of the power amplifier die can be electrically coupled to a first conductive trace on a substrate and the second group of one or more pins of the power amplifier die is electrically coupled to a second conductive trace on the substrate, in which the first conductive trace is included in a different signal path than the second conductive trace external to the power amplifier die. In some of these implementations, the harmonic termination circuit can include a wirebond having a first end and a second end, the first end coupled to the second first group of one or more pins of the power amplifier die; the second conductive trace on the substrate, the second conductive trace coupled to the second end of the wirebond; and a capacitor having a first end and a second end, the first end coupled to the second conductive trace and the second end coupled to a reference voltage.

The harmonic frequency of the amplified output signal can be, for example, a second harmonic frequency of the amplified output signal or a third harmonic frequency of the amplified output signal.

According to various implementations, the power amplifier module can also include another harmonic termination circuit separate from both the load line and the harmonic termination circuit, the other harmonic termination circuit configured terminate at a phase corresponding to another harmonic frequency of the amplified output signal. The harmonic termination circuit can be in parallel with the other harmonic termination circuit, according to certain implementations.

The power amplifier module can also include an input matching network configured to match an impedance at the power amplifier input and a separate harmonic termination circuit configured to terminate at a phase of a harmonic frequency of the input signal, according to certain implementations.

In some implementations, a portion of the harmonic termination circuit can be implemented within the power amplifier die.

Another aspect of this disclosure is a mobile device that includes a battery configured to power the mobile device, a power amplifier die, a load line, a harmonic termination circuit, and an antenna electrically coupled to the load line, the antenna configured to transmit an amplified RF signal. The power amplifier die includes a power amplifier configured to amplify a radio frequency (RF) input signal received at a power amplifier input node and to generate the amplified RF signal at a power amplifier output node. The load line is configured to match an impedance at the power amplifier output node at a fundamental frequency of the amplified RF signal. The harmonic termination circuit is separate from the load line. The harmonic termination circuit is configured to terminate at a phase corresponding to a harmonic frequency of the amplified RF signal. The harmonic termination circuit and the load line have different electrical connections to the power amplifier output node external to the power amplifier die.

Another aspect of this disclosure is an apparatus that includes a die and a substrate configured to receive the die. The die includes at least one active circuit element configured to drive an output signal to an output node. The substrate includes a first conductive trace and a second conductive trace. The first conductive trace and the second conductive trace are part of different signal paths on the substrate. The first conductive trace is included in a load line configured to match an impedance at output node of the die at a fundamental frequency of the output signal. The second conductive trace is included in a harmonic termination circuit separate from the load line. The harmonic termination circuit is configured to terminate at a phase corresponding to a harmonic frequency of the output signal.

In certain implementations, the substrate can include a third conductive trace, which is included in another harmonic termination circuit configured to terminate at a phase corresponding to a different harmonic frequency of the output signal.

According to some implementations, the apparatus can also include a wirebond configured to electrically couple the output node of the die to the second conductive trace, and the wirebond can be included in the harmonic termination circuit.

In accordance with a number of implementations, the apparatus can also include a capacitor mounted to the substrate, in which the capacitor is electrically coupled to the second conductive trace and the capacitor is included in the harmonic termination circuit.

Yet another aspect of this disclosure is a method of manufacturing a module. The method includes coupling power amplifier die to a packaging substrate, the power amplifier die including a power amplifier configured to receive an input signal and generate an amplified output signal; forming a first interconnect between the power amplifier die and a first conductive trace on the packaging substrate, the first interconnect being included in a first termination circuit configured to match an impedance of a fundamental frequency of the amplified output signal; and forming a second interconnect between the power amplifier die and a second conductive trace on the packaging substrate, the second interconnect being separate from the first interconnect, the first conductive trace being separate from the second conductive trace, and the second interconnect being included in a second termination circuit configured to terminate at a phase corresponding to a harmonic of the amplified output signal.

In some implementations, forming the first interconnect can include wirebonding a pad of the power amplifier die to the first conductive trace on the packaging substrate.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

X. Transmission Line for High Performance Radio Frequency Applications

One aspect of the disclosure is a radio frequency (RF) transmission line configured for use in a radio frequency (RF) circuit. The RF transmission line includes a bonding layer, a barrier layer, and diffusion barrier layer, and a conductive layer. The bonding layer has a bonding surface and is configured to receive an RF signal. The barrier layer is configured to prevent a contaminant from entering the bonding layer. The barrier layer is proximate the bonding layer. The diffusion barrier layer is configured to prevent contaminant from entering the bonding layer. The diffusion barrier layer is proximate the barrier layer. The diffusion barrier layer has a thickness that allows the received RF signal to penetrate the diffusion barrier layer to a conductive layer that is proximate to the diffusion barrier layer.

In some implementations, the bonding layer, the barrier layer, and the diffusion barrier layer can be embodied in a finish plating. The bonding layer can include gold according to certain implementations. In various implementations, the bonding surface can be configured for wire bonding. According to a number of implementations, the barrier layer can include palladium.

The diffusion barrier layer can include nickel according to certain implementations. In some implementations, the thickness of the diffusion barrier layer can be in the range from about 0.04 um to about 0.7 um. The thickness of the diffusion barrier layer can be no more than about 0.5 um according to a number of implementations. The thickness of the diffusion barrier layer can be no more than about 0.35 um according to various implementations. The thickness of the diffusion barrier layer can be no more than about 0.75 um according to a certain implementations. In some implementations, the thickness of the diffusion barrier layer can be less than the skin depth of nickel at a frequency of about 0.45 GHz.

In accordance with some implementations hereof, the thickness of the diffusion barrier can be less than the skin depth of the diffusion barrier layer at a frequency of about 0.45 GHz.

According to a number of implementations relating hereto, the conductive layer can include one or more of copper, aluminum, or silver. For instance, the conductive layer can include copper in certain implementations. In various implementations, substantially all of the received RF signal can propagate in the conductive layer.

The bonding layer can be gold, the barrier layer can be palladium, and the diffusion barrier layer can be nickel according to certain implementations. In some of these implementations, the thickness of the diffusion barrier layer is can be the range from about 0.04 um to about 0.7 um. According to a number of implementations, the thickness of the diffusion barrier layer can be no more than about 0.5 um. According to certain implementations, the thickness of the diffusion barrier layer can be no more than about 0.35 um. According to some implementations, the thickness of the diffusion barrier layer can be no more than about 0.75 um.

Another aspect of this disclosure is a diffusion barrier layer configured for use in an RF transmission line. The diffusion barrier layer includes a material and has a thickness. The thickness of the diffusion barrier layer is sufficiently small such that an RF signal is allowed to penetrate the diffusion barrier layer.

In certain implementations of this aspect of the present invention, the material includes nickel. According to some of these implementations, the thickness of the diffusion barrier layer can be in the range from about 0.04 um to about 0.7 um. According to a number of implementations, the thickness of the diffusion barrier layer can be no more than about 0.5 um. According to some implementations, the thickness of the diffusion barrier layer can be no more than about 0.35 um. According to certain implementations, the thickness of the diffusion barrier layer can be no more than about 0.75 um. In various implementations, the thickness of the diffusion barrier layer can be less than the skin depth of nickel at a frequency of about 0.45 GHz.

In accordance with a number of implementations relating hereto, the thickness of the diffusion barrier layer can be less than about the skin depth of the material at a frequency of about 0.45 GHz.

According to some implementations, substantially all of the RF signal that penetrates the diffusion barrier layer can travel in a conductive layer proximate the diffusion barrier layer.

In various implementations, the material and/or the thickness of the diffusion barrier layer can prevent contaminants from passing through the diffusion barrier layer.

Another aspect of this disclosure is a mobile device that includes a transmission line, an antenna, and a battery. The transmission line includes a bonding layer, a barrier layer, a diffusion barrier layer, and a conductive layer. The bonding layer has a bonding surface. The barrier layer is proximate the bonding layer. The diffusion barrier is layer proximate to the barrier layer. The conductive layer is proximate to the diffusion barrier layer. The barrier layer and the diffusion barrier layer are configured to prevent conductive material from the conductive layer from entering the bonding layer. The diffusion barrier layer has a thickness that is sufficiently small such that an RF signal is allowed to penetrate the diffusion barrier layer and propagate in the conductive layer. The antenna is coupled to the transmission line and configured to transmit an RF output signal. The transmission line is configured to extend an amount of time for the battery to discharge.

According to certain implementations, the mobile device can include a power amplifier having an output coupled to the transmission line. In some of these implementations, an output of the power amplifier can be coupled to the transmission line via a wire bond. In accordance with various implementations, the transmission line can be configured to transmit the RF signal from the power amplifier to an RF switch. The transmission line can be configured to transmit the RF signal from the power amplifier to a filter according to some implementations.

According to a number of implementations, the mobile device can include a filter having an output coupled to the transmission line. In some implementations, the transmission line can be configured to transmit the RF signal from the filter to an RF switch. In accordance with various implementations, the transmission line can be configured to transmit the RF signal from the filter to the antenna.

In accordance with some implementations, the mobile device can include an RF switch having an output coupled to the transmission line. In certain implementations, the transmission line is configured to transmit the RF signal from the RF switch to the antenna. In accordance with various implementations, the transmission line is configured to transmit the RF signal from the RF switch to a filter.

According to certain specific implementations hereof, the diffusion barrier layer can include nickel. In some of these implementations, the thickness of the diffusion barrier layer can be in the range from about 0.04 um to about 0.7 um. In a number of implementations, the thickness of the diffusion barrier layer can be no more than about 0.5 um. In some implementations, the thickness of the diffusion barrier layer can be no more than about 0.35 um. In certain implementations, the thickness of the diffusion barrier layer can be no more than about 0.75 um. In various implementations, the thickness of the diffusion barrier layer can be less than the skin depth of nickel at a frequency of about 0.45 GHz.

In a number of implementations, the thickness of the diffusion barrier layer can be less than the skin depth of the material at a frequency of about 0.45 GHz. In accordance with certain particular implementations, substantially all of the RF signal can travel in the conductive layer of the transmission line. According to some implementations, the bonding layer, the barrier layer, and the diffusion barrier layer can be embodied in a finish plating.

Another aspect of this disclosure is a laminate panel including a substrate. The substrate includes a transmission line configured for transmitting an RF signal. The transmission line has a bonding layer, a barrier layer, a diffusion barrier layer, and a conductive layer. The bonding layer has a bonding surface configured for bonding with a conductor separate from the conductive layer. The barrier layer is configured to prevent a contaminant from entering the bonding layer. The diffusion barrier layer includes a material and has a thickness such that contaminants are prevented from passing through the diffusion barrier layer and diffusing between the conductive layer and the bonding layer. The thickness of the diffusion barrier layer is sufficiently small such that the RF signal from the conductor is allowed to penetrate to the conductive layer.

According to certain implementations, the diffusion barrier layer can be nickel. In some of these implementations, the diffusion barrier layer can have a thickness that is less than the skin depth of nickel at a frequency of about 0.45 GHz.

In a number of implementations, the bonding layer can include gold, the barrier layer can include palladium, and the diffusion barrier layer can include nickel. In some of these implementations, the thickness of the diffusion barrier layer can be less than about 0.75 um.

Another aspect of this disclosure is a module that includes a substrate, a first RF component, and a second RF component. The substrate includes a conductor and a transmission line. The transmission line has a bonding layer, a barrier layer, a diffusion barrier layer, and a conductive layer. The bonding layer has a bonding surface configured for bonding with the conductor. The barrier layer and the diffusion barrier layer are configured to prevent a contaminant from entering the bonding layer. The thickness of the diffusion barrier layer is sufficiently small such that an RF signal from the conductor is allowed to penetrate to the conductive layer. The first RF component is coupled to the substrate and configured to generate the RF signal. The second RF component is coupled to the substrate and configured to receive the RF signal from the first component via the transmission line.

In certain implementations, the substrate is a laminate substrate. According to some of these implementations, the substrate can include a finish plating that includes the bonding layer, the barrier layer, and the diffusion barrier layer.

According to a number of implementations, the diffusion barrier layer can include nickel. In a number of implementations, the thickness of the diffusion barrier layer can be no more than about 0.7 um. In some implementations, the thickness can be no more than about 0.35 um. In certain implementations, the thickness of the diffusion barrier layer can be no more than about 0.75 um. In various implementations, the thickness of the diffusion barrier layer can be less than the skin depth of nickel at a frequency of about 0.45 GHz. In accordance with certain implementations, the conductive layer can include copper. In some implementations, the thickness of the diffusion barrier layer can be less than the skin depth of the material at a frequency of about 0.45 GHz.

In accordance with various implementations, the bonding layer can be configured for wire bonding and the conductor can be electrically coupled to the bonding layer via a wire bond.

According to certain implementations, substantially all of the RF signal can propagate from the first RF component to the second RF component in the conductive layer.

In various implementations, the first RF component can include a power amplifier. According to some of these implementations, the second RF component can include a filter and/or an RF switch.

According to some implementations, the first RF component can include an RF switch. According to some of these implementations, the second RF component can include a power amplifier and/or a filter.

In certain other implementations, the first RF component can include a filter. According to some of these implementations, the second RF component includes a power amplifier and/or an RF switch.

In accordance with a number of implementations, the barrier layer can be positioned between the bonding layer and the diffusion barrier layer.

Yet another aspect of this disclosure is an RF transmission line that includes a conductive layer and finish plating on the conductive layer. The finish plating includes a gold layer, a palladium layer proximate the gold layer, and a nickel layer proximate the palladium layer. The nickel layer has a thickness that allows an RF signal received at the gold layer to penetrate the nickel layer and propagate in the conductive layer. Still in other implementations, the gold layer can be configured for wire bonding.

In some further implementations, the thickness of the nickel layer can be in the range from about 0.04 um to about 0.7 um. According to a number of implementations, the thickness of the nickel layer can be no more than about 0.5 um. According to certain implementations, the thickness of the nickel layer can be no more than about 0.35 um. According to some implementations, the thickness of the nickel layer can be no more than about 0.75 um.

In accordance with certain additional implementations, the thickness of the nickel layer can be less than the skin depth of nickel at a frequency of about 0.45 GHz. The conductive layer can include one or more of copper, aluminum, or silver according to some implementations. For instance, the conductive layer can include copper.

According to a number of implementations, substantially all of the RF signal can propagate in the conductive layer.

For purposes of summarizing the disclosure, certain aspects, advantages and novel features of the inventions have been described herein. It is to be understood that not necessarily all such advantages may be achieved in accordance with any particular embodiment of these aspects of the present the invention. Thus, the invention may be embodied or carried out in a manner that achieves or optimizes one advantage or group of advantages as taught herein-throughout without necessarily achieving other advantages as may be taught or suggested in the entirety of this disclosure.

XI. Tantalum Nitride Terminated Through-Wafer Vias

Apparatus and methods for tantalum nitride terminated through-wafer vias are described herein and taken in combination with one or more of the other aspects, features, or characteristics of the present disclosure. In certain implementations thereof, a tantalum nitride (TaN) termination layer is formed on a first or front side of a gallium arsenide (GaAs) wafer, and a gold conductive layer is formed over the TaN termination layer. Thereafter, a through-wafer via is etched into a second or back side of the GaAs wafer so as to extend through the GaAs wafer and a first or inner portion of the TaN termination layer to reach the gold conductive layer. In certain implementations taken in combination herewith, the through wafer via is plated with a nickel vanadium (NiV) barrier layer, a gold seed layer, and a copper layer. During through-wafer via formation, a second or outer portion of the TaN termination layer is maintained and configured to surround an interface between the gold conductive layer and the copper layer so as to inhibit diffusion of copper into the GaAs wafer.

TaN terminated through-wafer vias can provide improved metal adhesion and reduced copper migration relative to schemes employing silicon nitride termination and a sputtered barrier layer. Furthermore, in certain implementations using a TaN termination layer to terminate a through-wafer via can permit the location or position of the through wafer via to be moved without changing fabrication or lithographical masks associated with transistor structures formed on the front side of the GaAs wafer. Configuring the through-wafer vias to be movable without changing lithographical mask associated with transistors can increase design flexibility and/or reduce time and cost associated with incremental fixes or tape-outs of integrated circuits designs that include the through-wafer vias.

XII. Via Density and Placement in Radio Frequency Shielding Applications

One aspect of this disclosure is a method of determining a via placement. The method includes obtaining electromagnetic interference data for an initial placement of vias around a radio frequency (RF) component. The RF component is positioned between a first conductive layer and a second conductive layer. The vias are included in a connection between the first conductive layer and the second conductive layer. The vias and the first and second conductive layers form at least a portion of an RF isolation structure around the RF component. The method also includes determining an updated placement of vias based at least in part on the electromagnetic interference data for the initial placement.

In some embodiments hereof, determining the updated placement of vias can include identifying, based on the electromagnetic interference data for the initial placement, a selected defined area around the perimeter of the RF component associated with higher electromagnetic interference than other defined areas around the perimeter of the RF component in the initial placement; and increasing density of the vias in the updated placement in the selected defined area compared to the density of the vias in the selected defined area in the initial placement. Alternatively or additionally, the method can include identifying, based on the electromagnetic interference data for the initial placement, a defined area around the perimeter of the RF component associated with a permissible level of electromagnetic interference in the initial placement; and decreasing density of the vias in the updated placement in the defined area compared to the density of the vias in the initial placement. According to certain embodiments, the electromagnetic interference data for the initial placement of vias corresponds to an unshielded RF component.

The method hereof can be iterated any suitable number of times. For instance, the method can include obtaining electromagnetic interference data for the updated placement of vias around the RF component; and determining another updated placement of vias based at least in part on the electromagnetic interference data for the updated placement.

In accordance with some embodiments, electromagnetic interference data can be obtained for at least two different modes of operation of the RF component in the initial placement of vias.

Another aspect of the invention of this disclosure is a packaged module. The packaged module includes a substrate configured to receive at least one component. The packaged module also includes a radio frequency (RF) component coupled to a major surface of the substrate. The packaged module includes a first conductive layer disposed below the RF component, in which the first conductive layer configured at a ground potential. The packaged module includes a plurality of vias in the substrate that are disposed around the RF component. The plurality of vias have a higher density in a first region of the packaged module than a second region of the packaged module, in which the first region is associated with a higher electromagnetic interference than the second region. The packaged module includes a second conductive layer disposed above the RF component. The second conductive layer is electrically coupled to the plurality of vias such that the first conductive layer, the plurality of vias, and the second conductive layer form at least a portion of an RF isolation structure around the RF component.

In certain embodiments hereof, the first region is disposed along a periphery of the packaged module and the second region is disposed along the periphery of the packaged module. According to some of these embodiments, the first region and the second region have approximately the same width in a dimension substantially parallel to an outer edge of the packaged module. The plurality of vias can be aligned along the periphery of the packaged module. The first region can have the highest via density of any region along the periphery of the packaged module that has an area at least as great as the first region, according to certain embodiments. The first region can have approximately the same area as the second region in some embodiments.

According to a number of embodiments of this aspect of the present invention, the RF component can be configured to emit more radiation to the first region than to the second region. Alternatively or additionally, the packaged module is configured such that the first region is exposed to more radiation than to the second region. In certain embodiments, the first region can correspond to a hot spot of the packaged module and the second region can correspond to a low radiating area of the packaged module. Alternatively or additionally, the first region can be more sensitive to external electromagnetic interference than the second region.

In certain embodiments relating hereto, the packaged module can also include conductive features forming at least a portion of an electrical connection between the plurality of vias and the second conductive layer, the RF isolation structure including the conductive features. For example, the conductive features can include wirebonds or a metal can. According to some embodiments, the RF component can include a power amplifier.

Another aspect of this invention is a packaged module that includes a substrate, an RF device, first and second conductive layers, and a plurality of vias. The substrate is configured to receive at least one component. The RF device is coupled to a major surface of the substrate. The first conductive layer is disposed below the RF component and configured at a ground potential. The plurality of vias are disposed around the RF component. The plurality of vias have a higher density in a first region around the RF component than a second region around the RF component having approximately the same area as the first region. The first region is more sensitive to external radiation than the second region. The second conductive layer is disposed above the RF component. The second conductive layer is electrically coupled to plurality of vias such that the first conductive layer, the plurality of vias, and the second conductive layer form at least a portion of an RF isolation structure around the RF component.

Yet another aspect of this disclosure is a wireless device that includes an antenna, a packaged module and another module. The antenna is configured to facilitate transmitting and/or receiving a radio frequency (RF) signal. The packaged module is in communication with the antenna. The packaged module includes a substrate having a ground plane and a plurality of vias in the substrate disposed along a periphery of the packaged module. Vias of the plurality of vias are spaced closer together along the periphery of the packaged module in a hot spot than in a low radiating area. The packaged module includes an RF circuit coupled to a major surface of the substrate. The packaged module also includes a second conductive layer disposed over the RF circuit. The second conductive layer is electrically coupled to plurality of vias such that the ground plane, the plurality of vias, and the second conductive layer form at least a portion of an RF isolation structure around the RF circuit. The other module is in communication with the packaged module.

In some embodiments hereof, the hot spot can be associated with electromagnetic interference generated by the packaged module and the plurality of vias can be configured to isolate the other module from the electromagnetic interference associated with the hot spot. According to certain embodiments, the hot spot can be associated with electromagnetic interference generated by the other module and the plurality of vias can be configured to shield the packaged module from electromagnetic interference associated with the hot spot.

In accordance with a number of embodiments, the packaged module further includes conductive features forming at least a portion of an electrical connection between the plurality of vias and the second conductive layer, in which the RF isolation structure includes the conductive features. The conductive features can include wirebonds, for example.

For purposes of summarizing the disclosure, certain aspects, advantages and novel features of the inventions have been summarized herein. It is to be understood that not necessarily all such advantages may be achieved in accordance with any particular embodiment of the invention. Thus, these aspects of the present the invention may be embodied or carried out in a manner that achieves or optimizes one advantage or group of advantages as taught herein-throughout without necessarily achieving other advantages as may be taught or suggested herein above or below.

XIII. Semiconductor Packages with Integrated Interference Shielding

Features and embodiments of this aspect of the present invention are directed to a semiconductor device package, and methods of making the same, that uses wirebond process technologies to integrate an electromagnetic interference shield into the device package. In one embodiment, wirebond processes are used to form wirebond springs that are positioned around the device and coupled to conductive layers above and below the device, thereby forming an electromagnetic interference shield around the device. As discussed further below, the shape of and spring effect created by the wirebond springs enable a robust manufacturing process to create reliable electrical connections between a conductive layer at the top of the molded package and a ground plane in the substrate of the package. The use of these wirebond springs provides a flexible solution for integrated electromagnetic interference shielding that may be applied to any over-molded device.

One aspect hereof is directed to a packaged semiconductor module having an integrated electromagnetic interference shield. In one embodiment, the packaged semiconductor module includes a substrate having a ground plane, an electronic device mounted on a surface of the substrate, a plurality of wirebond springs disposed about the electronic device and electrically coupled to the ground plane, a mold compound covering the electronic device and at least partially covering the plurality of wirebond springs, and a conductive layer disposed on a top surface of the mold compound and electrically coupled to at least some of the plurality of wirebond springs, wherein the plurality of wirebond springs, the conductive layer and the ground plane together include the integrated electromagnetic interference shield.

In one example, the conductive layer includes silver-filled epoxy. The wirebond springs can be made from various conductive materials, such as gold wire or copper wire. Each of the plurality of wirebond springs may include a continuous loop of wire shaped to provide a spring effect that permits contact between the conductive layer and the wirebond spring to provide the electrical coupling between the conductive layer and the wirebond spring. In one example, the electronic device is an RF device.

According to another embodiment hereof, a wirebond spring formed of a continuous loop of wire includes a ball bond, a zone of inflection, a crest, a convex region extending between the zone of inflection and the crest, a sloping tail region, and a substantially flat region extending between the crest and the sloping tail region, wherein the zone of inflection is between the convex region and the ball bond. In one example, the crest is substantially vertically above the zone of inflection. As discussed above, the wirebond spring may be formed from a variety of conductive materials, including gold wire or copper wire. In one example, wirebond springs having this structure are used in the semiconductor module discussed above.

Another aspect hereof is directed to a semiconductor module package having an integrated electromagnetic interference shield. In one embodiment, the semiconductor module package includes a substrate, first and second metallized connection points disposed on a first surface of the substrate, and a wirebond spring including a continuous wire extending between the first metallized connection point and the second metallized connection point. The wirebond spring includes a ball bond electrically connected to the first metallized connection point, a zone of inflection, a crest, a convex region extending between the zone of inflection and the crest, a substantially flat region proximate the crest, and a sloping tail region extending between the substantially flat region and the second metallized connection point. In one example, the semiconductor module package further includes a ground plane disposed on the substrate and electrically coupled to at least one of the first and second metallized connection points. In another example, the semiconductor module package further includes an electronic device, and a plurality of additional wirebond springs substantially identical to the wirebond spring, wherein the plurality of wirebond springs are positioned on the substrate about a perimeter of the electronic device. In another example, the semiconductor module package further includes a mold compound covering the electronic device and at least partially covering the plurality of wirebond springs, and a conductive layer disposed on a surface of the mold compound and electrically connected to at least some of the plurality of wirebond springs, wherein the ground plane, the conductive layer and the at least some of the plurality of wirebond springs together form the integrated electromagnetic interference shield.

Another aspect of these features of the present invention is directed to a method of manufacturing a module having an integrated electromagnetic interference shield. According to one embodiment, the method includes connecting an electronic device to a substrate, providing metallizations on the substrate, forming a plurality of wirebond springs connected to the metallizations, performing a transfer molding process to encapsulate the electronic device in mold compound and to at least partially cover the plurality of wirebond springs with the mold compound, and disposing a conductive layer on a surface of the mold compound, the conductive layer electrically connected to at least some of the plurality of wirebond springs. In one example, the method further includes ablating the surface of the mold compound, prior to disposing the conductive layer on the surface of the mold compound, to expose regions of at least some of the plurality of wirebond springs. In another example, providing metallizations includes providing a ground plane and at least one wirebond contact area electrically connected to the ground plane. In another example, forming the plurality of wirebond springs includes depositing a wire ball on the metallizations, forming a wire loop by drawing wire from the wire ball to form the wire loop having a first end connected to the wire ball and a second end, and connecting the second end to the metallizations. In another example, disposing the conductive layer on the surface of the mold compound includes painting a layer of silver-filled epoxy on the surface of the mold compound.

According to another embodiment hereof, an electronic module includes a substrate, an electronic device disposed on the substrate, and integrated electromagnetic interference shield formed from a plurality of discrete structures disposed substantially about the electronic device, the structures having a minimum spacing defined by a fraction of the wavelength of a signal to be shielded by the integrated electromagnetic interference shield. In one example, the fraction of the wavelength is $1/20$. In another example, the plurality of discrete structures includes a plurality of wirebond springs, as discussed below.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Any embodiment disclosed herein may be combined with any other embodiment in any manner consistent with the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawing figures are included to provide illustration and a further understanding of the various aspects, features, and characteristics of the various embodiments, and are incorporated in and constitute a part of this specification. The drawing figures, together with the remainder of the specification, serve to explain principles and operations of the various described and claimed aspects and embodiments.

The various aspects, characteristics, and features of the improved power amplifiers, power amplifier modules, and related systems, devices, and methods described herein are attained in accordance with the present invention wherein for one particular embodiment thereof, there is provided a power amplifier module including a power amplifier having a GaAs bipolar transistor with a collector, a base abutting the collector, and an emitter, the collector having a doping concentration of at least about $3 \times 10^{16}$ cm$^{-3}$ at a junction with the base, the collector also having at least a first grading in which doping concentration increases away from the base. In this embodiment the module would further include an RF transmission line driven by the power amplifier, the RF transmission line including a conductive layer and finish plating on the conductive layer, the finish plating including a gold layer, a palladium layer proximate the gold layer, and a diffusion barrier layer proximate the palladium layer, the diffusion barrier layer including nickel and having a thickness that is less than about the skin depth of nickel at 0.9 GHz.

In the above embodiment, the power amplifier module may advantageously include further an output matching network with a first termination circuit configured to match a fundamental frequency of an output of the power amplifier and a second termination circuit configured to terminate at a phase of a harmonic of the output of the power amplifier in which the first termination circuit includes at least a portion of the RF transmission line.

According to one particular aspect hereof, the power amplifier may be included on a power amplifier die having a tantalum nitride terminated through wafer via. In this embodiment, the power amplifier die may further advantageously include a gallium arsenide (GaAs) substrate, a gold layer disposed on a first side of the GaAs substrate, and a copper layer disposed on a second side of the GaAs substrate that is opposite the first side with the tantalum nitride terminated through wafer via configured to electrically connect the gold layer to the copper layer. For additional embodiments thereof, the power amplifier die may further include a tantalum nitride termination region configured to surround at least a portion of an interface between the copper layer and the gold layer so as to inhibit a diffusion of copper from the copper layer into the GaAs substrate.

In any of the above embodiments, the GaAs bipolar transistor may be advantageously implemented as a heterojunction bipolar transistor (HBT) included on a power amplifier die and the power amplifier die may further include a resistor formed from at least one HBT layer.

Any of the above embodiments may alternatively further include a wirebond in contact with the gold layer of the RF transmission line, at least one edge adjacent the wirebond and at least one sidewall adjacent the at least one edge being free from the nickel layer of the RF transmission line, the palladium layer of the RF transmission line, and the gold layer of the RF transmission line.

In certain preferred embodiments of the above, the power amplifier module may further advantageously further include in combination (1) a dual mode control interface having a front end core configured to provide a serial interface, (2) a voltage input/output (VIO) pin configured to receive a VIO signal, this VIO signal determining whether an operating mode of the front end core is set to one of an active state and an inactive state, the dual mode control interface configured to provide a general purpose input/output (GPIO) interface when the front end core is set to the inactive state, (4) a combinational logic block configured to provide an enable signal and a mode signal to an enable level shifter and a mode level shifter, respectively, and (5) a power on reset configured to select the enable signal and the mode signal to provide to the enable level shifter and the mode level shifter, respectively, based on the VIO signal.

To achieve further advantages associated with the above embodiments, the power amplifier module may further include an RF isolation structure that includes wirebonds disposed along a periphery of the power amplifier module.

In accordance with another principal aspect of this invention, there is also provided a power amplifier module that includes a power amplifier configured to receive an RF input signal and to generate an amplified RF output signal, the power amplifier including a GaAs bipolar transistor having a collector, a base abutting the collector, and an emitter, the collector having a doping concentration of at least about $3\times10^{16}$ cm$^{-3}$ at a junction with the base, the collector also having at least a first grading in which doping concentration increases away from the base; and that further include in combination therewith an output matching network including a first termination circuit configured to match an impedance of a fundamental frequency of the amplified RF output signal, and a second termination circuit separate from the first termination circuit, the second termination circuit configured to terminate at a phase corresponding to a harmonic frequency of the amplified RF output signal. In this embodiment, the power amplifier may drives an RF transmission line having a diffusion barrier layer, the diffusion barrier layer including nickel and having a thickness of less than about 0.5 µm. And therein, there may be provided a wirebond electrically connecting an output of the power amplifier to the RF transmission line where the wirebond is included in the first termination circuit. Alternatively, this embodiment may advantageously include further a dual mode control interface configured to provide both a radio frequency front end (RFFE) serial interface and a three-mode general purpose input/output (GPIO) interface on a single die. And in combination therewith when desired, the power amplifier module may further include an RF isolation structure that has wirebonds disposed along the periphery of the power amplifier module.

According to yet another principal aspect of this invention there is alternatively provided a power amplifier module having (1) a power amplifier configured to receive an RF input signal and to generate an amplified RF signal, (2) an RF transmission line configured to propagate the amplified RF signal, the RF transmission line including a gold layer configured to receive the amplified RF signal, a palladium layer proximate the gold layer, and a diffusion barrier layer proximate the palladium layer, and a conductive layer proximate the diffusion barrier layer, the diffusion barrier layer including nickel and having a thickness of less than about the skin depth of nickel at 0.45 GHz, (3) a first termination circuit configured to match an impedance of a fundamental frequency of the amplified RF signal, the first termination circuit including at least a portion of the RF transmission line, and (4) a second termination circuit separate from the first termination circuit, the second termination circuit configured to terminate at a phase corresponding to a harmonic frequency of the amplified RF signal, the power amplifier electrically coupled to first termination circuit by way of at least one wirebond and the power amplifier electrically coupled to the second termination circuit by way of a different number of wirebonds than the first termination circuit. In this alternate embodiment, the power amplifier may advantageously include a GaAs bipolar transistor having a collector, a base abutting the collector, and an emitter, the collector having a doping concentration of at least about $3\times10^{16}$ cm$^{-3}$ at a junction with the base, the collector also having at least a first grading in which doping concentration increases away from the base. Any version of the power amplifier module of this specific embodiment may advantageously further include a dual mode control interface configured to provide both a radio frequency front end (RFFE) serial interface and a general purpose input/output (GPIO) interface on a single die, and in combination therewith or alternative thereto, an RF isolation structure that includes wirebonds disposed along a periphery of the power amplifier module.

In still another preferred embodiment of the present invention as directed to RF modules, there is provided a power amplifier module including (1) a substrate configured to receive a plurality of components, the substrate having an RF transmission line thereon, the RF transmission line having a conductive layer and finish plating on the conductive layer, the finish plating having a gold layer, a palladium layer proximate the gold layer, and a diffusion barrier layer proximate the palladium layer, the diffusion barrier layer having nickel and having a thickness that is less than the skin depth of nickel at a frequency of about 0.45 GHz, (2) a first die coupled to the substrate, the first die having a power amplifier with an output electrically connected to the gold layer of the RF transmission line, the first die further having a passive component having a property that depends on one or more conditions of the first die, and the present module further including (3) a second die coupled to the substrate, the second die having a bias generating circuit configured to generate a bias signal based at least in part on an indicator of the property of the passive component of the first die.

According to another aspect of this invention, the particular embodiment of the module described in the paragraph above may further include an output matching network with a first termination circuit configured to match a fundamental frequency of the output of the power amplifier and a second termination circuit configured to terminate at a phase of a harmonic of the output of the power amplifier, the first termination circuit including at least a portion of the RF transmission line. And in combination therewith or in the alternative thereto, the module may be configured so that the first die has a tantalum nitride terminated through wafer via and/or includes an HBT device and a resistor formed from at least one HBT layer. As an additional aspect of this embodiment, the power amplifier module hereof may further include when desired an RF isolation structure that has a plurality of vias in the substrate disposed around the power amplifier, and a desired number of wirebonds disposed along a periphery of the power amplifier module, the plurality of vias having a higher density in a first region of the power amplifier module than a second region of the power amplifier module where the first region being associated with a higher electromagnetic interference than the second region.

In accordance with yet still another preferred embodiment of this invention, there is advantageously provided for certain applications a power amplifier module that includes a substrate configured to receive a plurality of components and further configured according to the following. The substrate has a finish plating that includes a gold layer, a palladium layer proximate the gold layer, and a diffusion barrier layer proximate the palladium layer. The diffusion barrier layer advantageously includes nickel and has a thickness that is less than about the skin depth of nickel at 0.45 GHz. This embodiment would also include in combination with the above, a power amplifier die having a power amplifier and at least one tantalum nitride terminated through wafer via. Here the power amplifier is configured to receive an RF input signal and also configured to generate an amplified RF signal. Finally as a principal element hereof, this embodiment would further advantageously include in combination with all the prior elements hereof a termination circuit configured to terminate at a phase of a harmonic of the amplified RF signal where such termination circuit is provided with at least one wirebond configured to electrically couple an output of the power amplifier to the gold layer of the finish plating.

In the embodiment described in the paragraph just above this paragraph, the power amplifier die thereof may advantageously include an on-die passive component, a first lead electrically connected to the on-die passive component, and a second lead configured to receive the amplified RF signal. In that specific implementation, a first portion of the finish plating may be electrically connected to the first lead and a second portion of the finish plating may be electrically connected to the second lead to thereby direct current from the first portion of the finish plating when such is so desired. In any of these embodiments, the power amplifier die may include a heterojunction bipolar transistor and resistor that includes a heterojunction bipolar material layer when desired. And in the alternative or in combination therewith, the power amplifier may include a GaAs bipolar transistor having a collector, a base abutting the collector, and an emitter where the collector has a doping concentration of at least about $3 \times 10^{16}$ cm$^{-3}$ at a junction with the base and the collector also has at least a first grading in which doping concentration increases away from the base. In one particular embodiment of the above, the power amplifier module may further advantageously include when so desired (1) a dual mode control interface that has a front end core configured to provide a serial interface, (2) a voltage input/output (VIO) pin configured to receive a VIO signal where the VIO signal determines whether an operating mode of the front end core is set to an active state or an inactive state where therein the dual mode control interface is configured to provide a general purpose input/output (GPIO) interface when the front end core is set to the inactive state, (3) a combinational logic block configured to provide an enable signal and a mode signal to an enable level shifter and a mode level shifter, respectively, and (4) a power on reset configured to select the enable signal and the mode signal to provide to the enable level shifter and the mode level shifter, respectively, based on the VIO signal.

The present application hereby incorporates by reference the entire disclosures of U.S. Provisional Patent Application Nos. 61/659,848 entitled POWER AMPLIFIER MODULE filed Jun. 14, 2012; 61/659,701 entitled PROCESS-COMPENSATED HBT POWER AMPLIFIER BIAS CIRCUITS AND METHODS filed Jun. 14, 2012; and 61/659,834 entitled RF POWER AMPLIFIERS HAVING SEMICONDUCTOR RESISTORS filed Jun. 14, 2012.

The present application also hereby incorporates by reference the entire disclosures of U.S. patent application Ser. No. 13/040,127 entitled WIRE BOND PAD SYSTEM AND METHOD filed Mar. 3, 2011; Ser. No. 13/040,137 entitled APPARATUS AND METHODS FOR REDUCING IMPACT OF HIGH RF LOSS PLATING filed Mar. 3, 2011; Ser. No. 13/460,521 entitled BIPOLAR TRANSISTOR HAVING COLLECTOR WITH GRADING filed Apr. 30, 2012; Ser. No. 13/658,488 entitled DUAL MODE POWER AMPLIFIER CONTROL INTERFACE WITH A TWO-MODE GENERAL PURPOSE INPUT/OUTPUT INTERFACE filed Oct. 23, 2012; Ser. No. 13/658,522 entitled DUAL MODE POWER AMPLIFIER CONTROL INTERFACE WITH A THREE-MODE GENERAL PURPOSE INPUT/OUTPUT INTERFACE filed Oct. 23, 2012; Ser. No. 13/543,472 entitled SIGNAL PATH TERMINATION filed Jul. 8, 2011; Ser. No. 12/939,474 entitled BIPOLAR AND FET DEVICE STRUCTURE filed Nov. 4, 2010; Ser. No. 13/288,427 entitled DEVICES AND METHODOLOGIES RELATED TO STRUCTURES HAVING HBT AND FET filed Nov. 3, 2011; Ser. No. 13/464,775 entitled TRANSMISSION LINE FOR HIGH PERFORMANCE RADIO FREQUENCY APPLICATIONS filed May 4, 2012; Ser. No. 13/485,572 entitled VIA DENSITY AND PLACEMENT IN RADIO FREQUENCY SHIELDING APPLICATIONS filed May 31, 2012; Ser. No. 13/893,605 entitled SYSTEMS AND METHODS FOR PROVIDING ELECTROMAGNETIC INTERFERENCE SHIELDING FOR INTEGRATED CIRCUIT MODULES filed May 14, 2013; Ser. No. 13/893,614 entitled SYSTEMS AND METHODS FOR CONTROLLING ELECTROMAGNETIC INTERFERENCE FOR INTEGRATED CIRCUIT MODULES filed May 14, 2013; and Ser. No. 13/904,566 entitled SEMICONDUCTOR PACKAGE HAVING A METAL PAINT LAYER filed May 29, 2013.

In addition, the present application hereby incorporates by reference the entire disclosures of International Application Nos. PCT/US2008/071832 entitled WIREBOUND SPRING CONNECTORS AND METHOD OF MANUFACTURING FOR INTEGRATED EMI SHIELDING filed Jul. 31, 2008 and PCT/US2011/059208 entitled DEVICES AND METHODOLOGIES RELATED TO STRUCTURES HAVING HBT AND FET filed Nov. 3, 2011.

BRIEF DESCRIPTION OF THE DRAWING FIGURES

Further aspects and characteristics of the present invention together with additional features contributing thereto and advantages accruing therefrom will be apparent from the following description of the preferred embodiments of the invention which are shown in the accompanying drawing, wherein.

Figure 5:
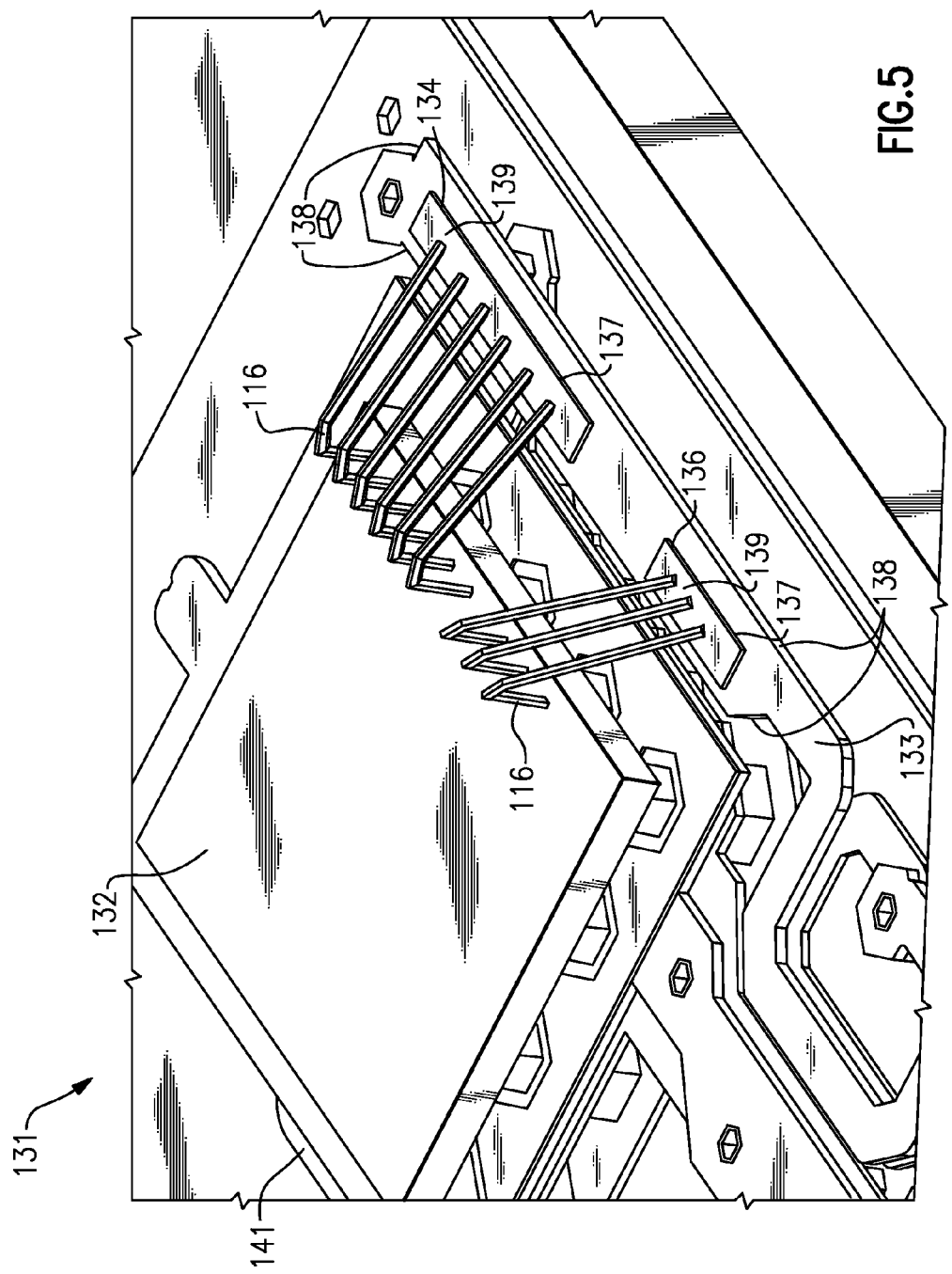
FIG. 5 depicts an enlarged portion of an exemplary RFIC module including a wire bond pad according to certain embodiments.
Figure 6:
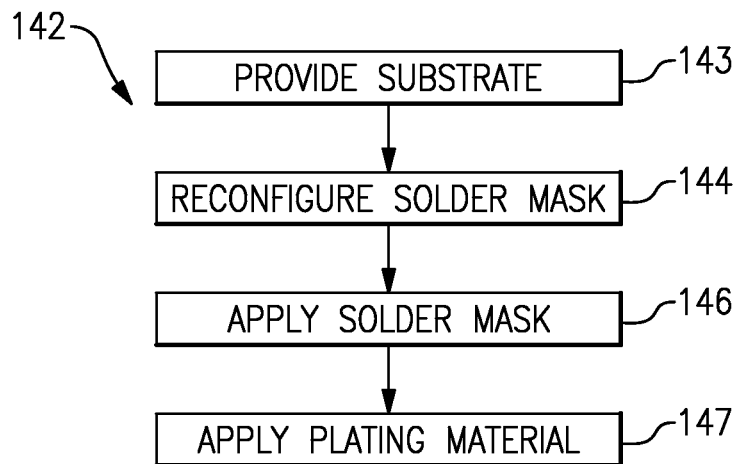
Figure 7:
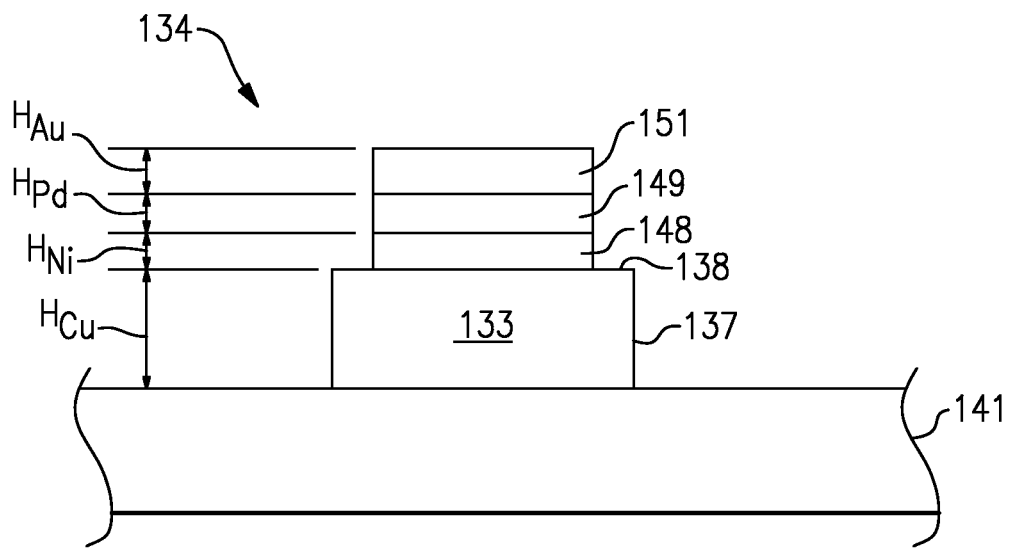
Figure 8:
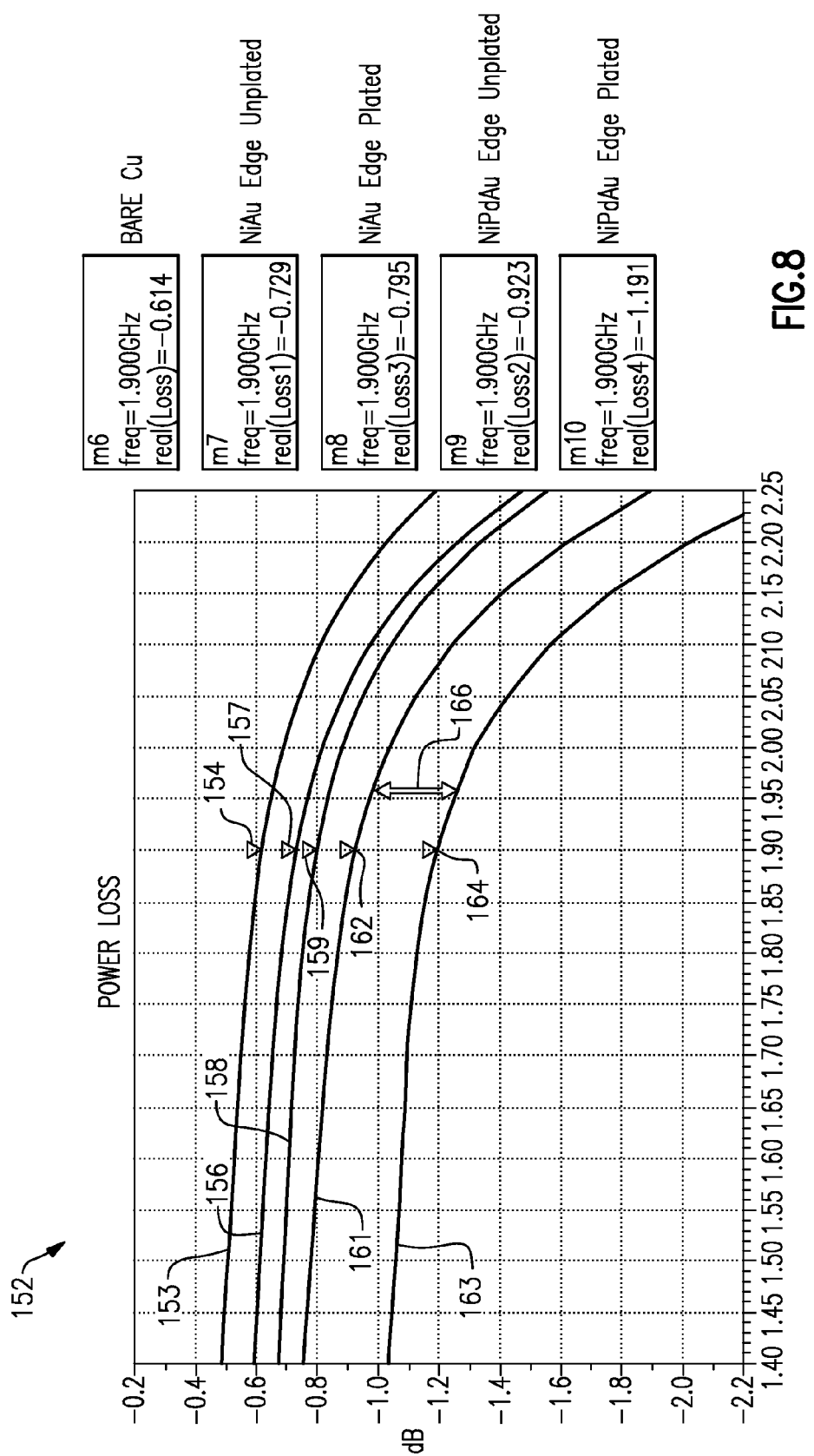
Figure 11:
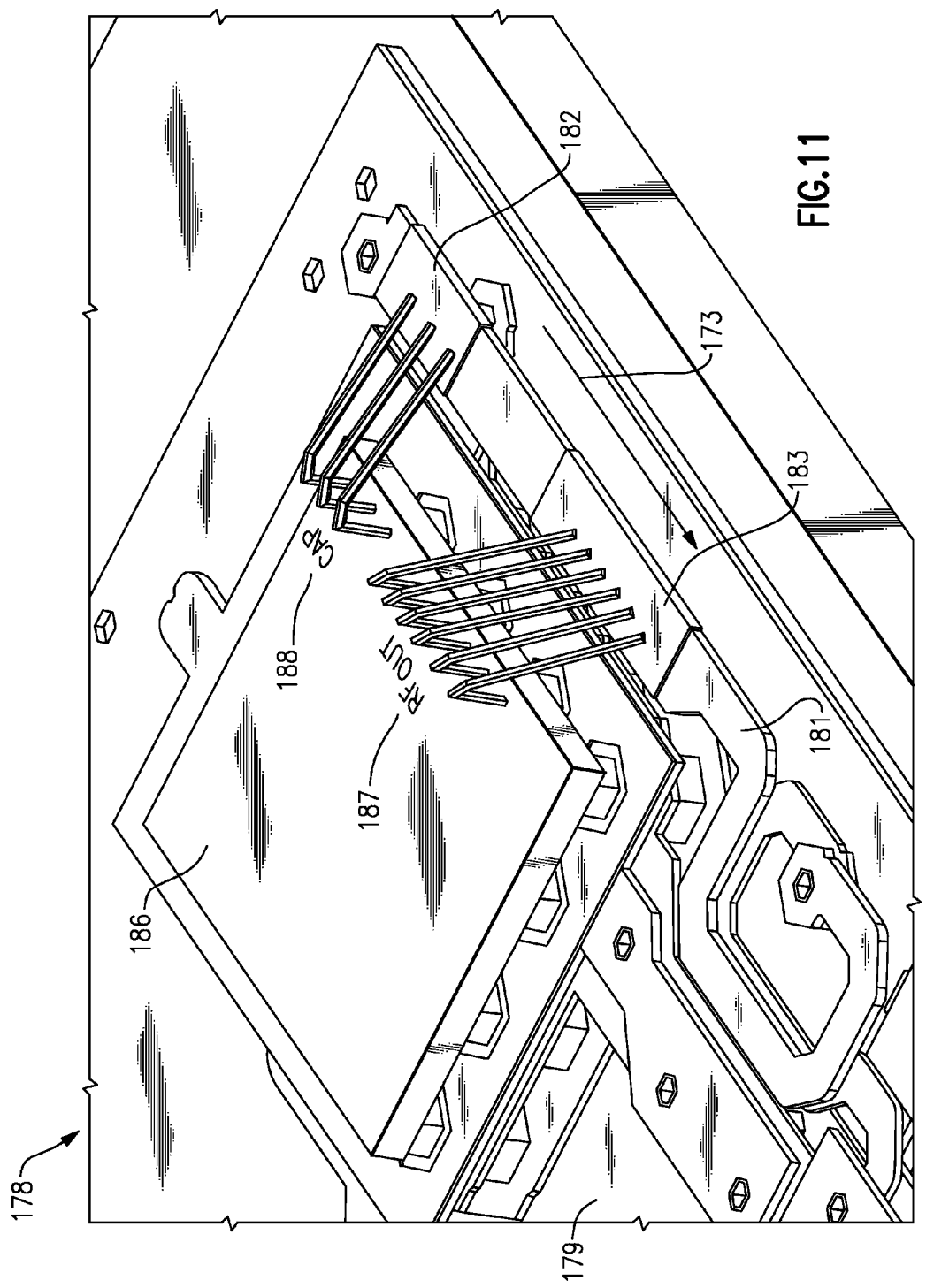
Figure 12:
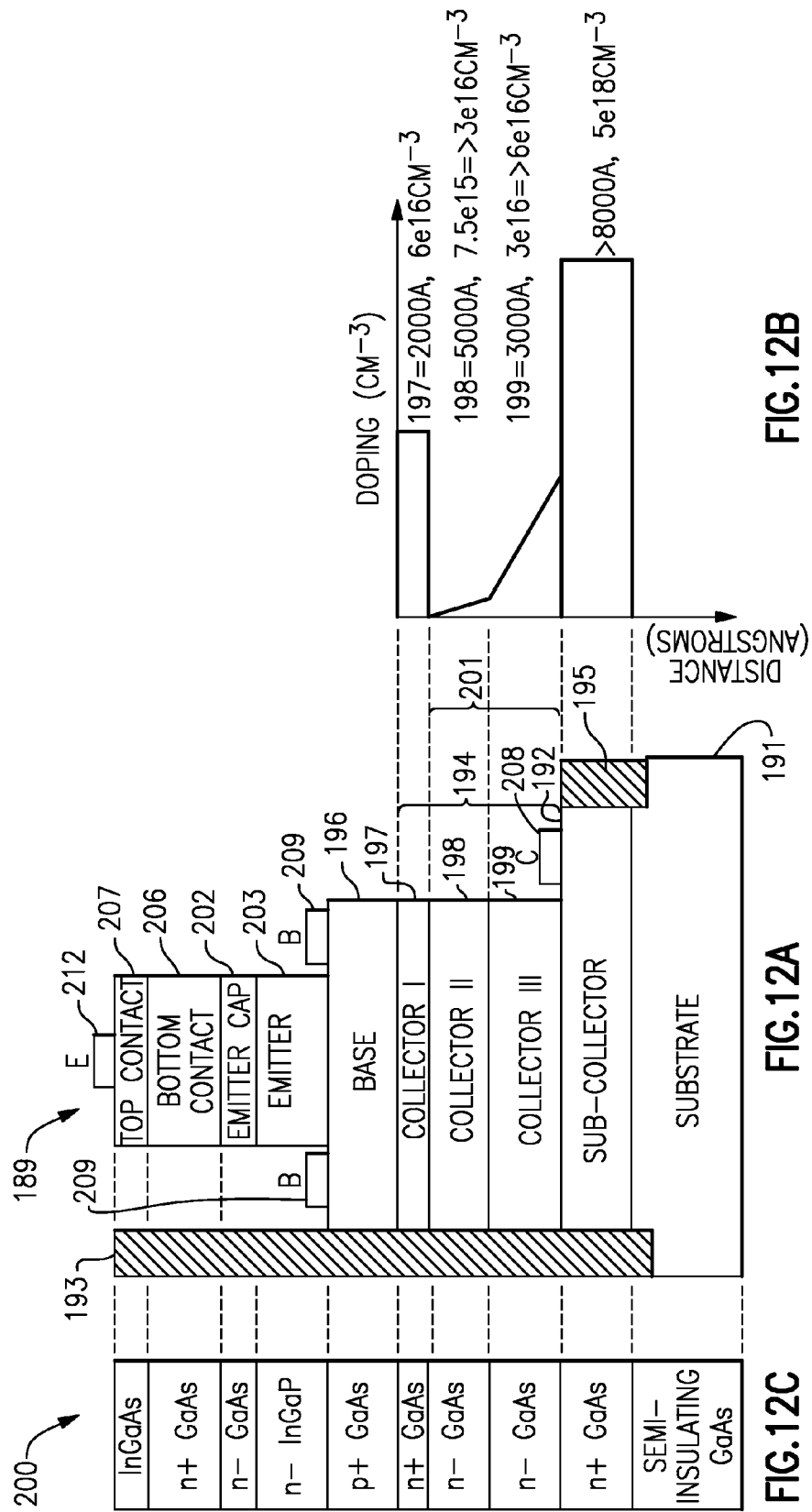
Figure 13:
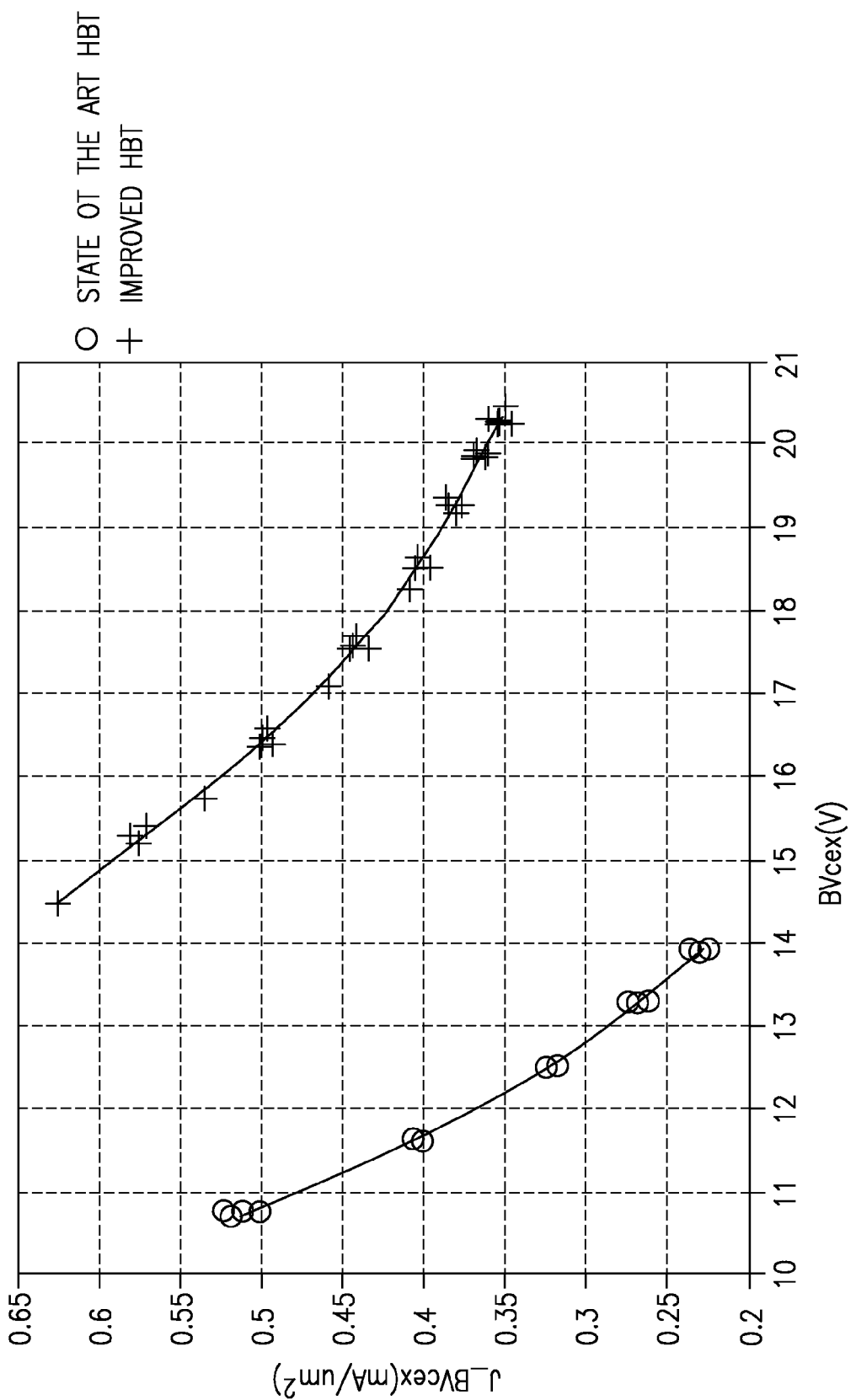
Figure 15:
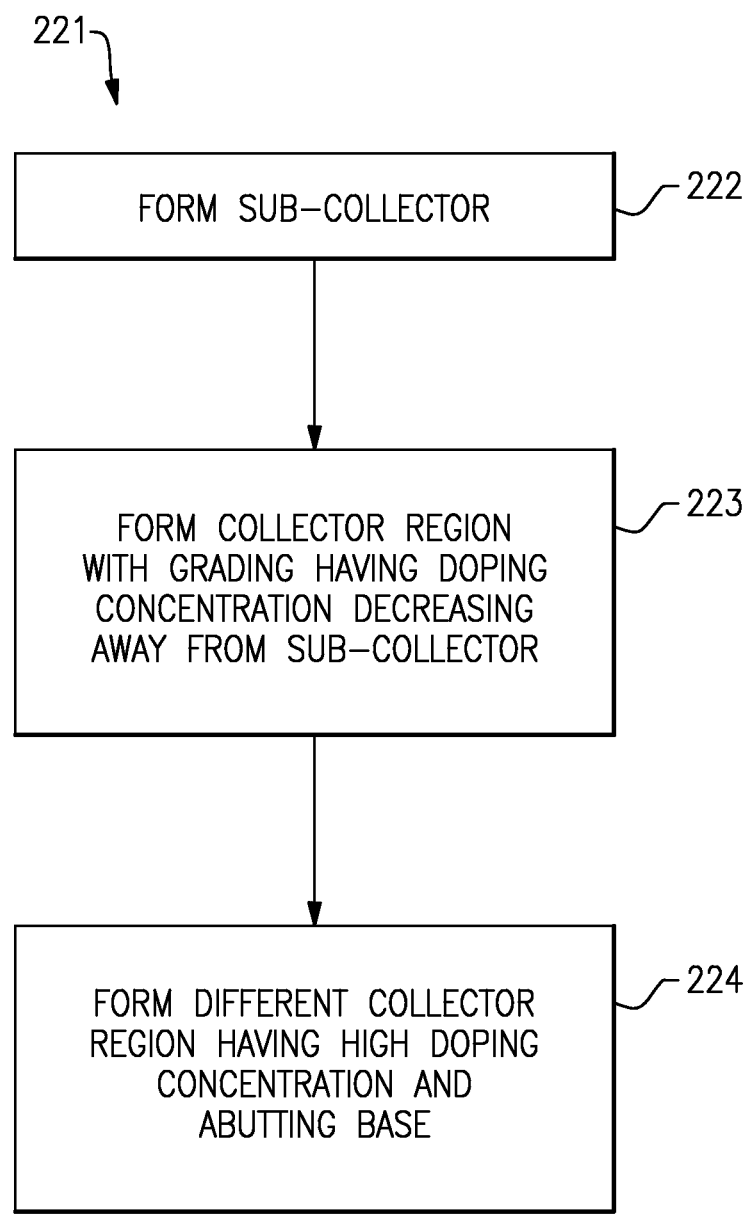
Figure 16:
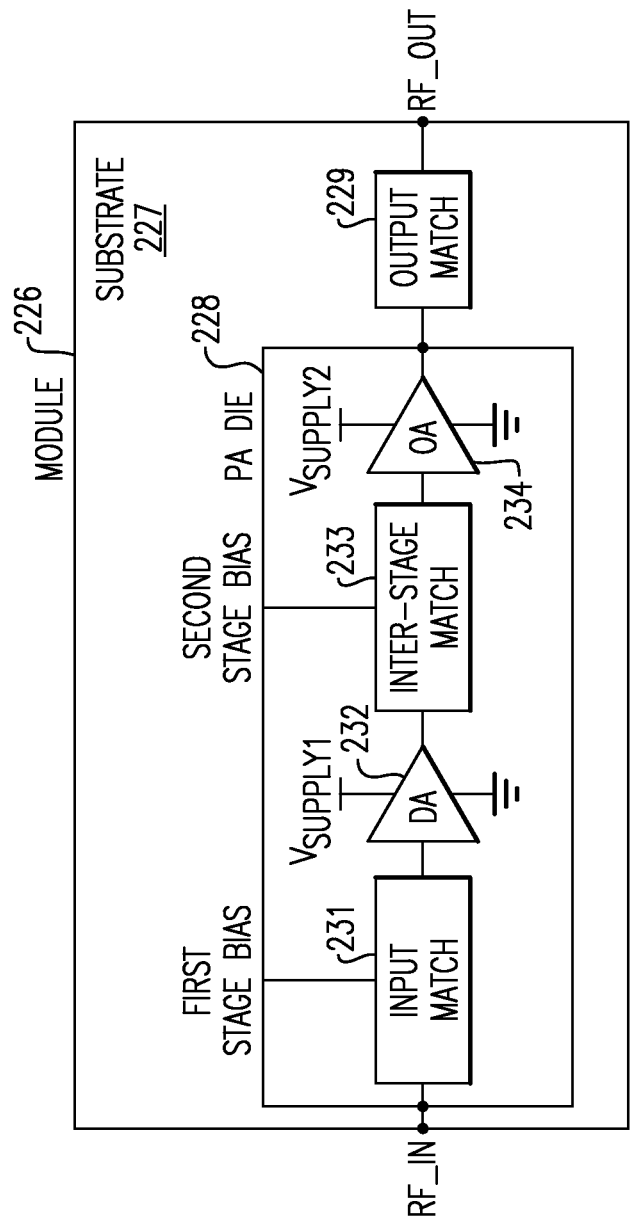
Figure 17:
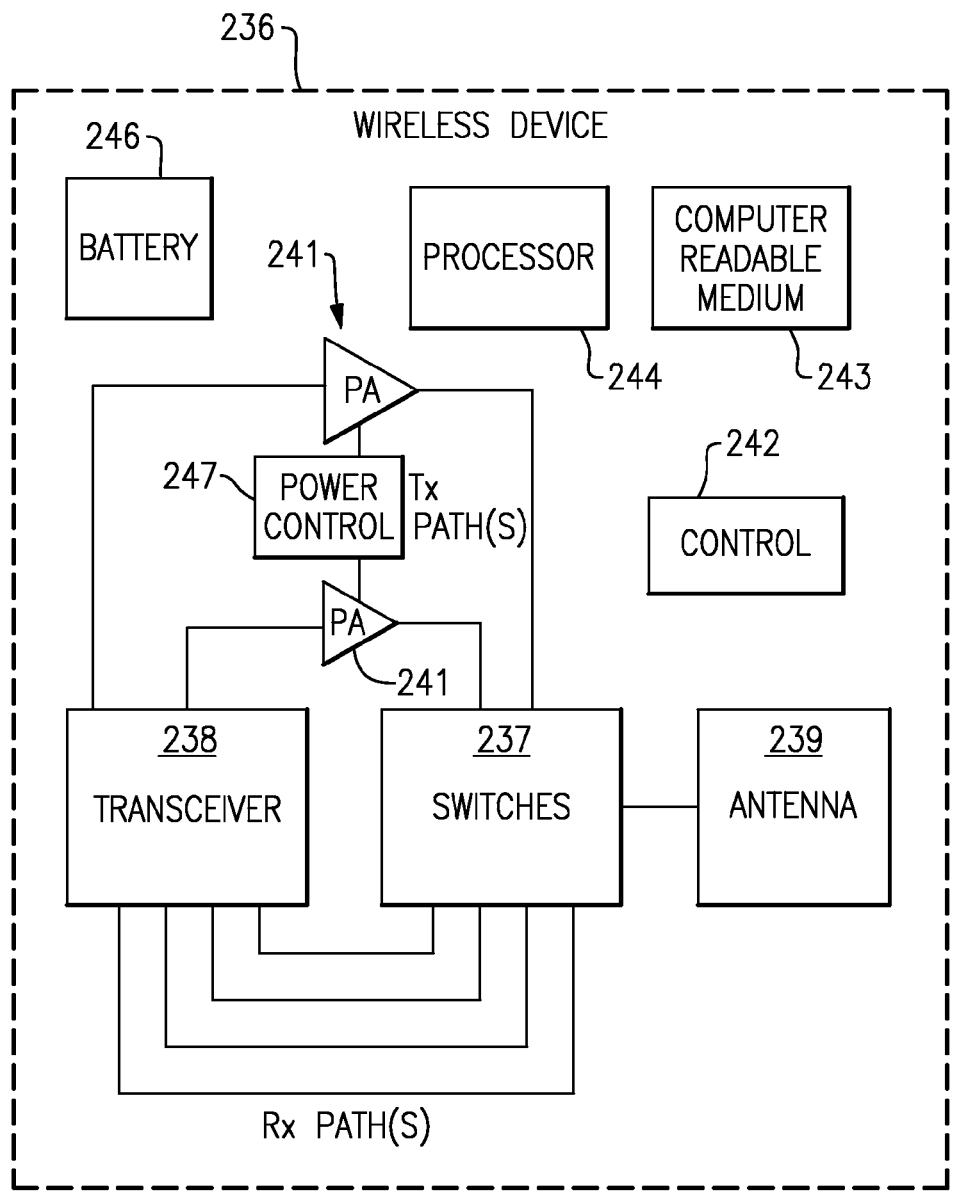
Figure 18:
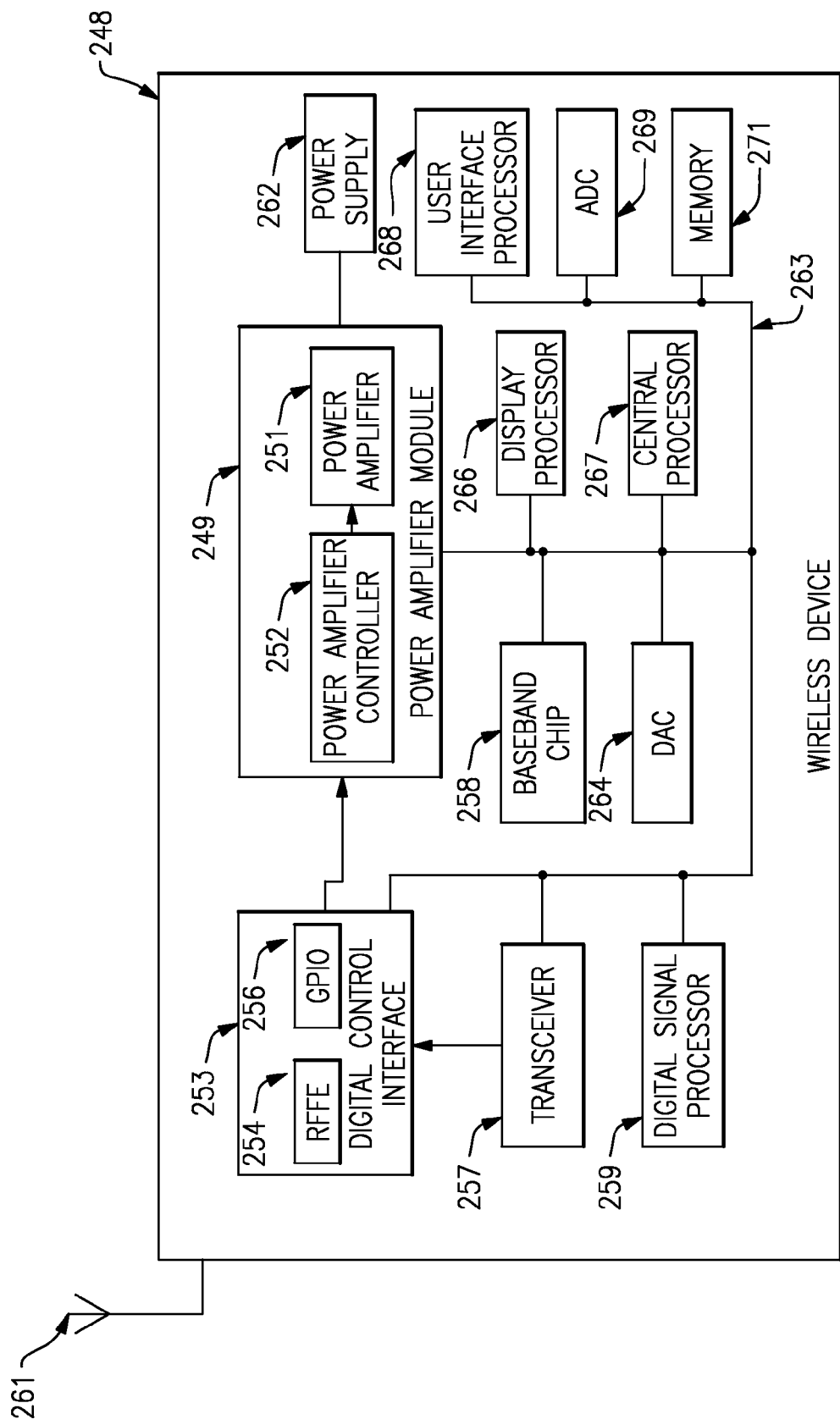
Figure 19:
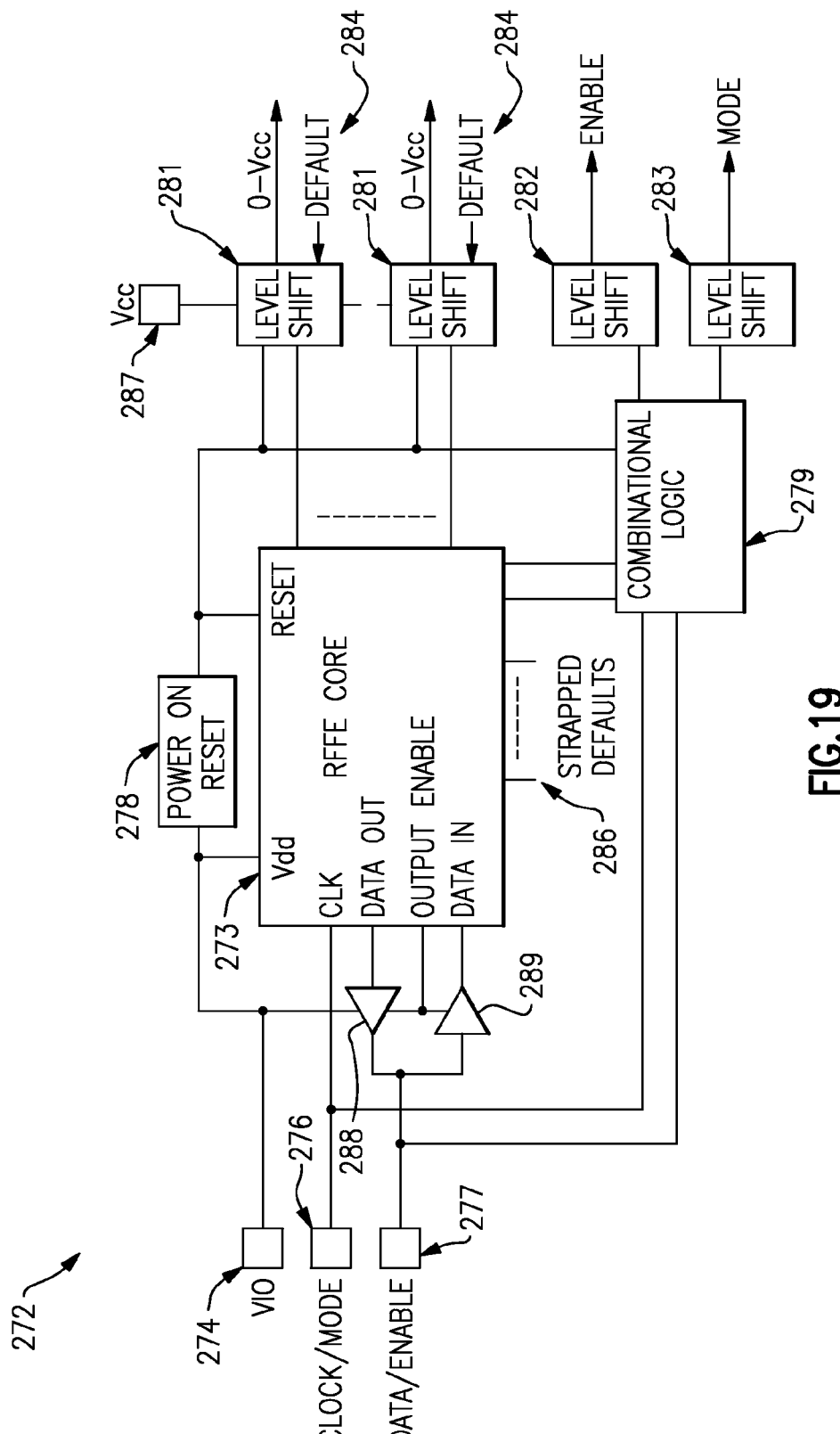
Figure 20:
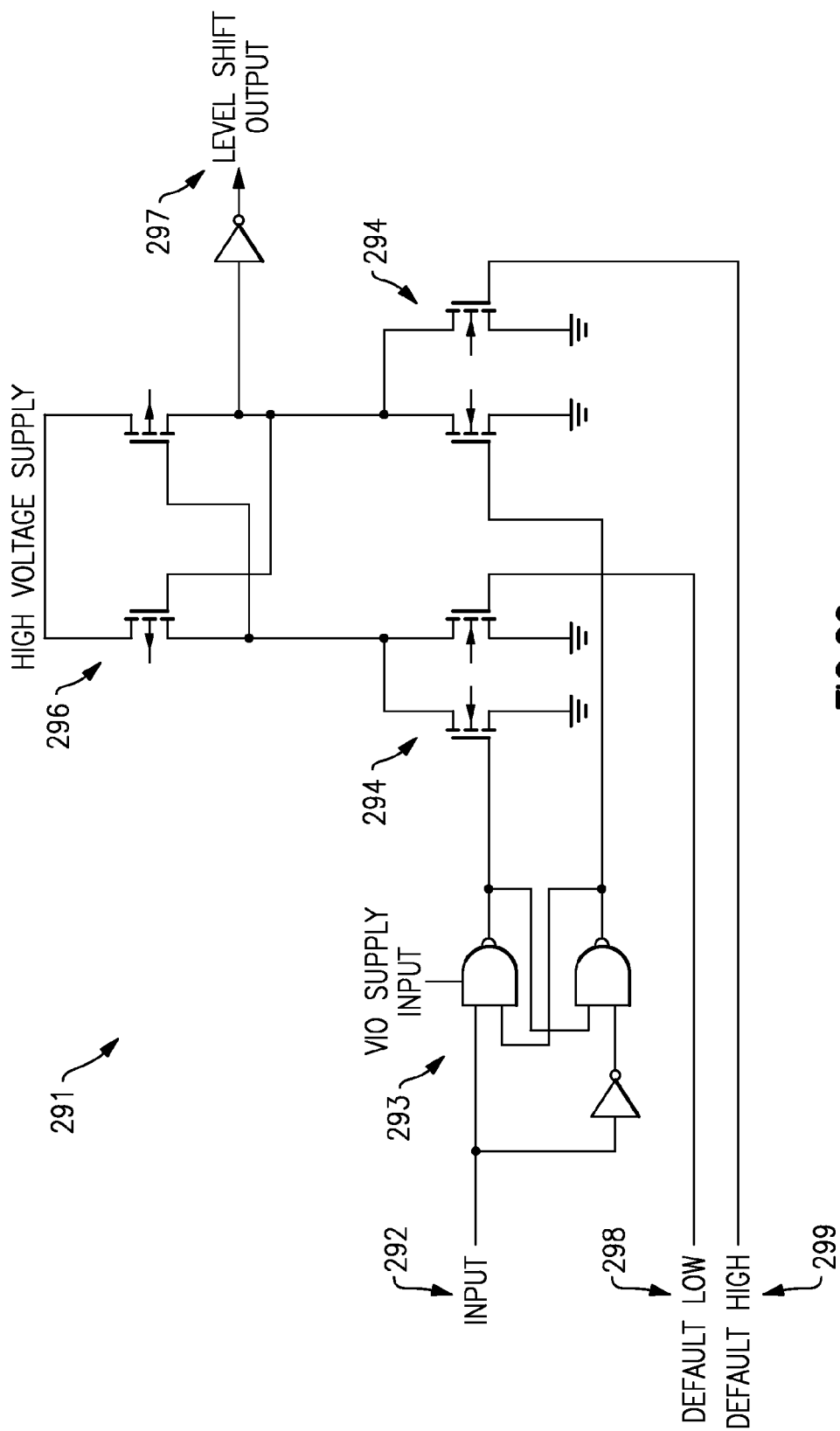
Figure 21:
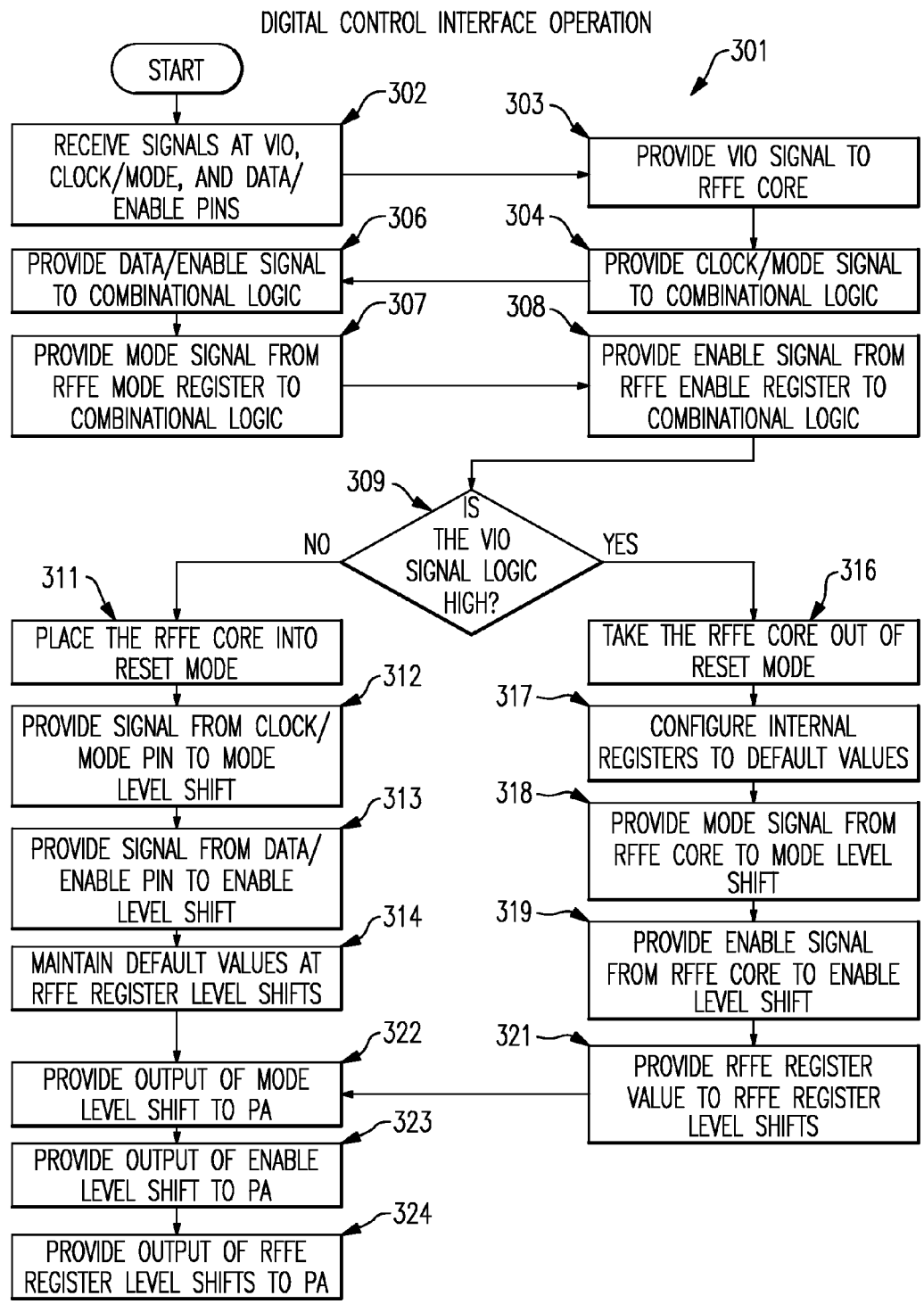
Figure 22:
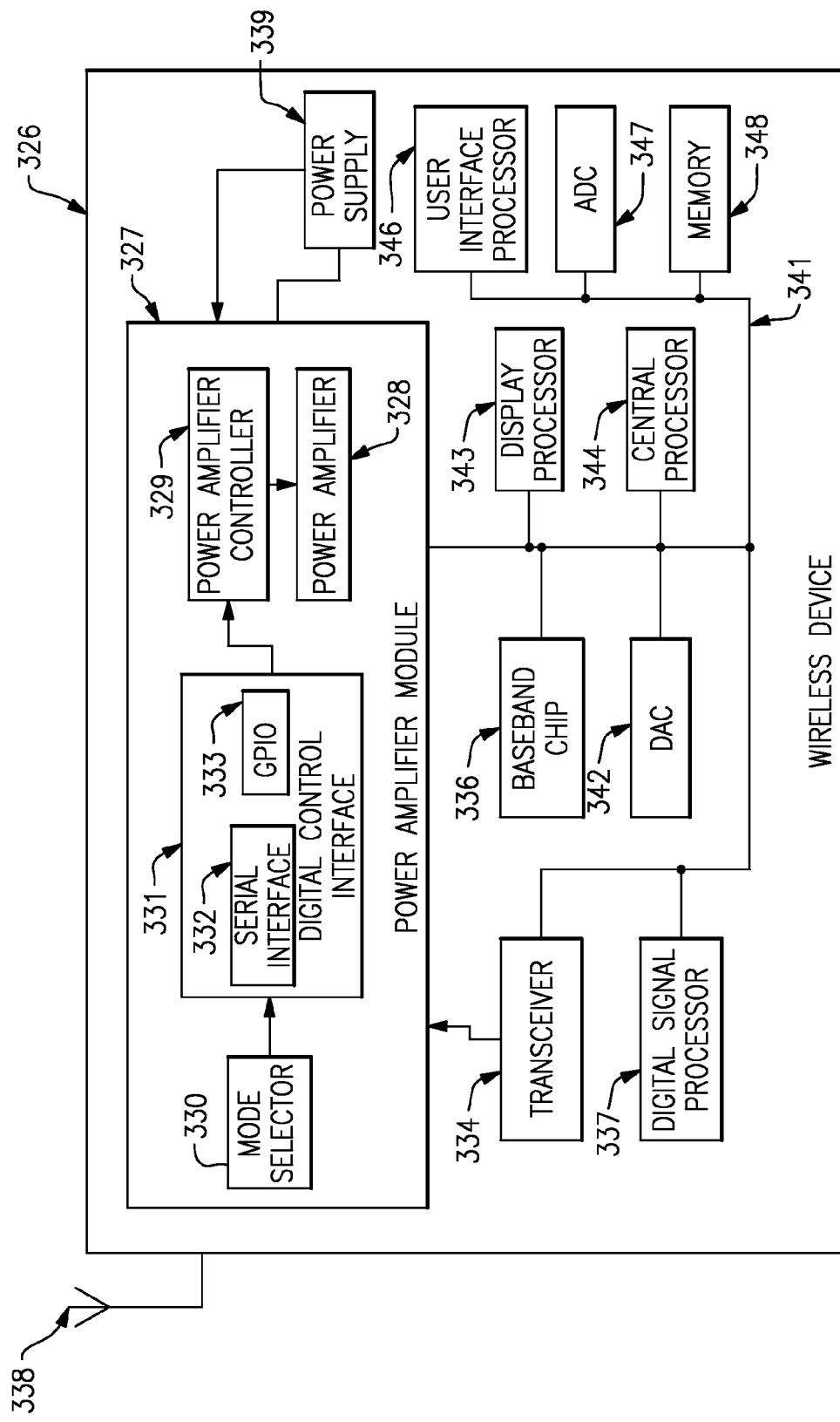
Figure 23:
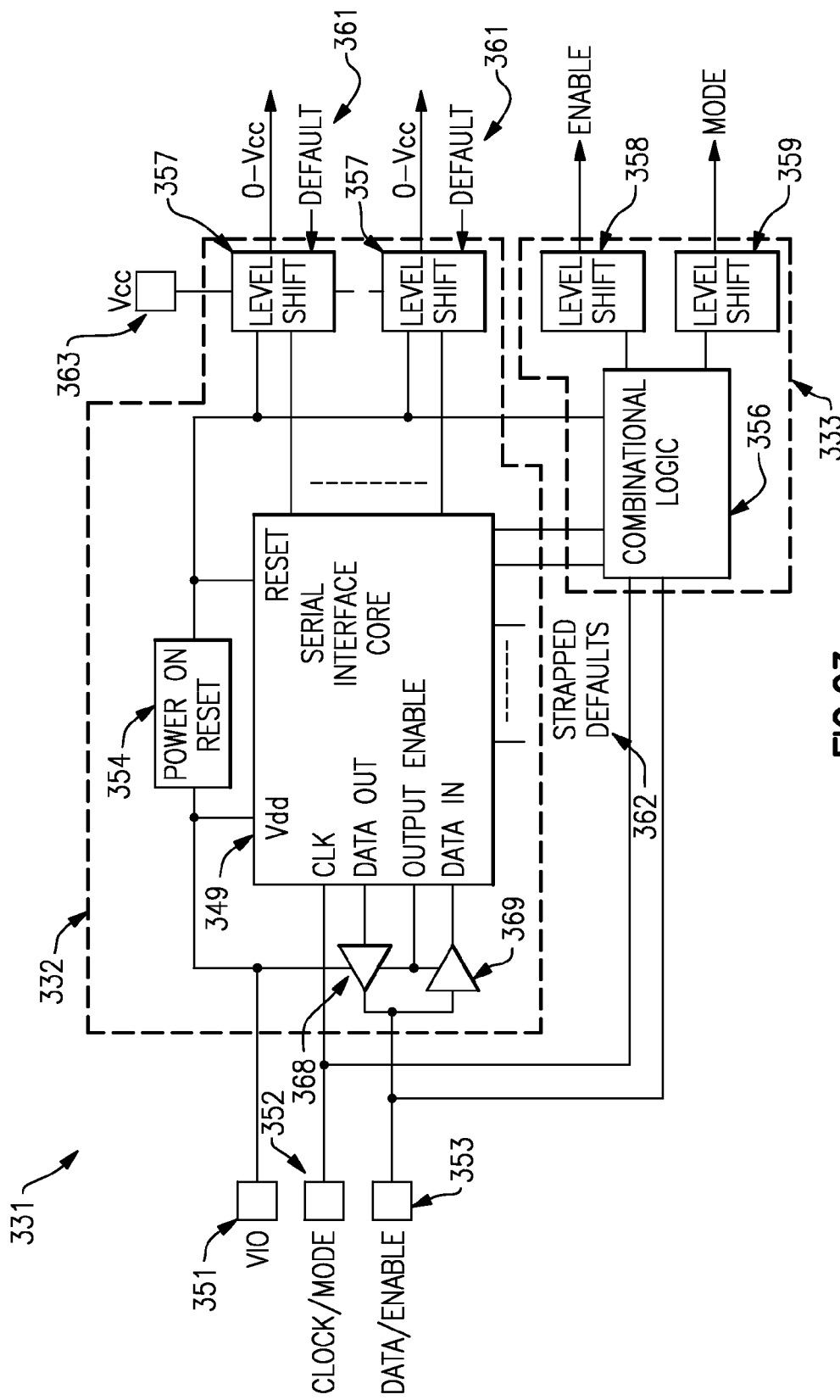
Figure 24:
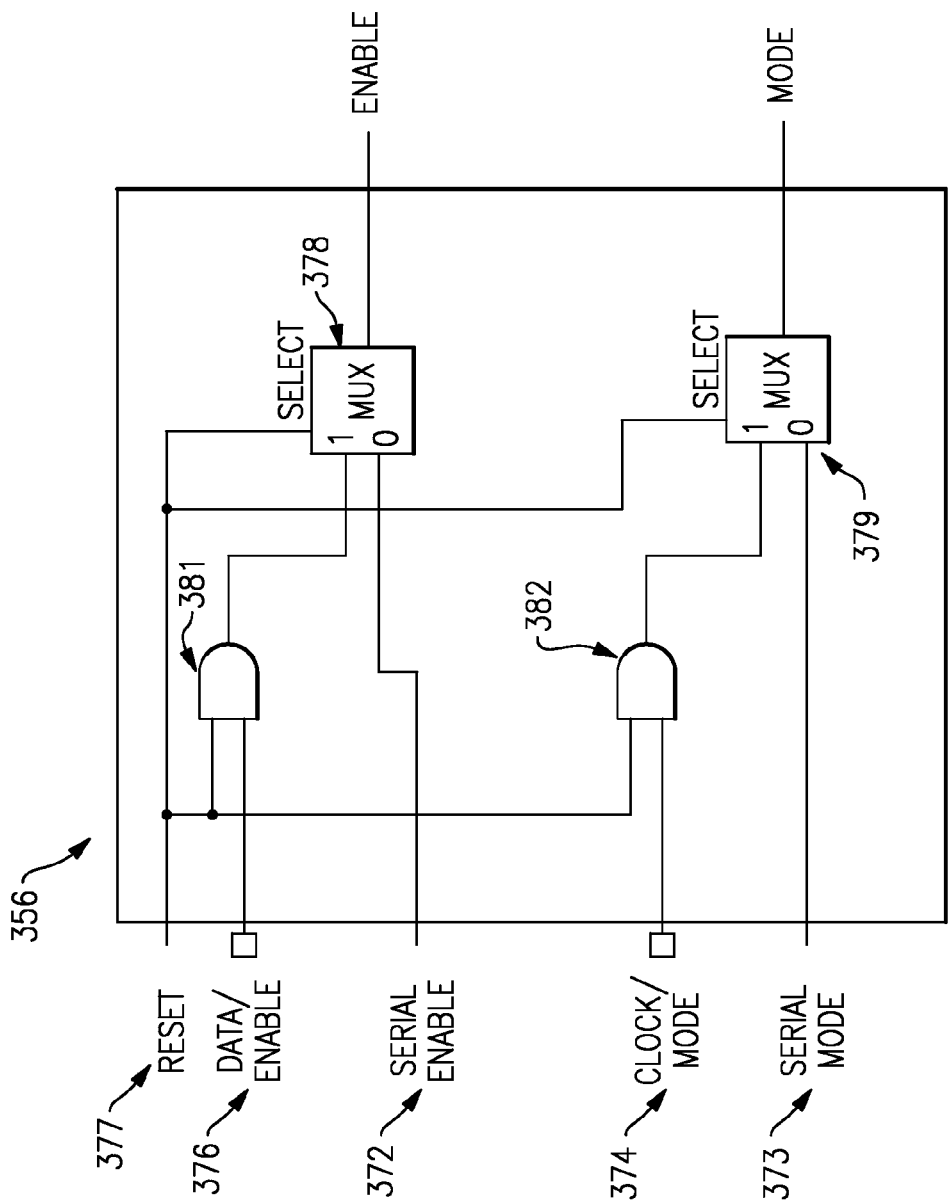
Figure 25:
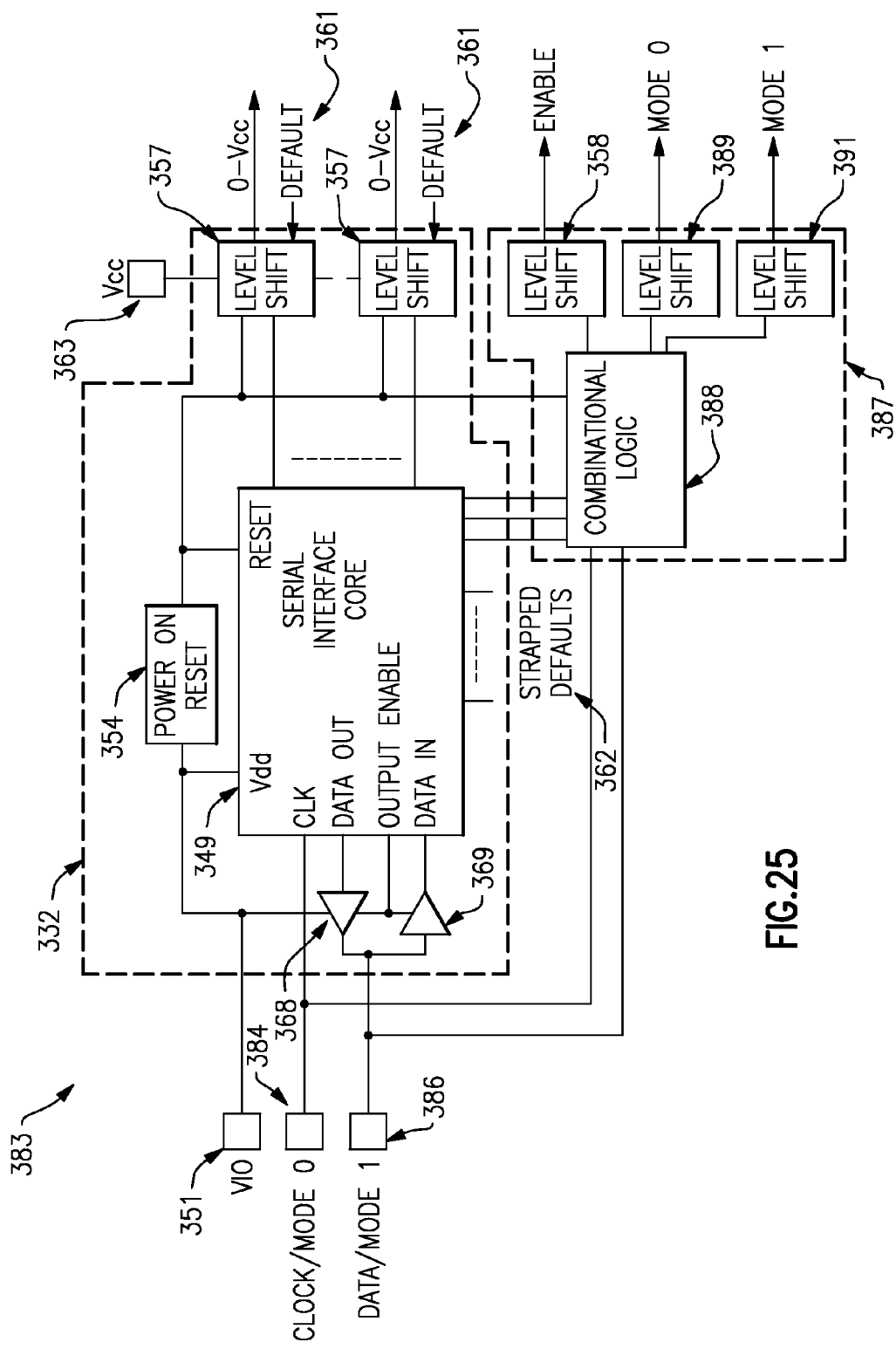
Figure 26:
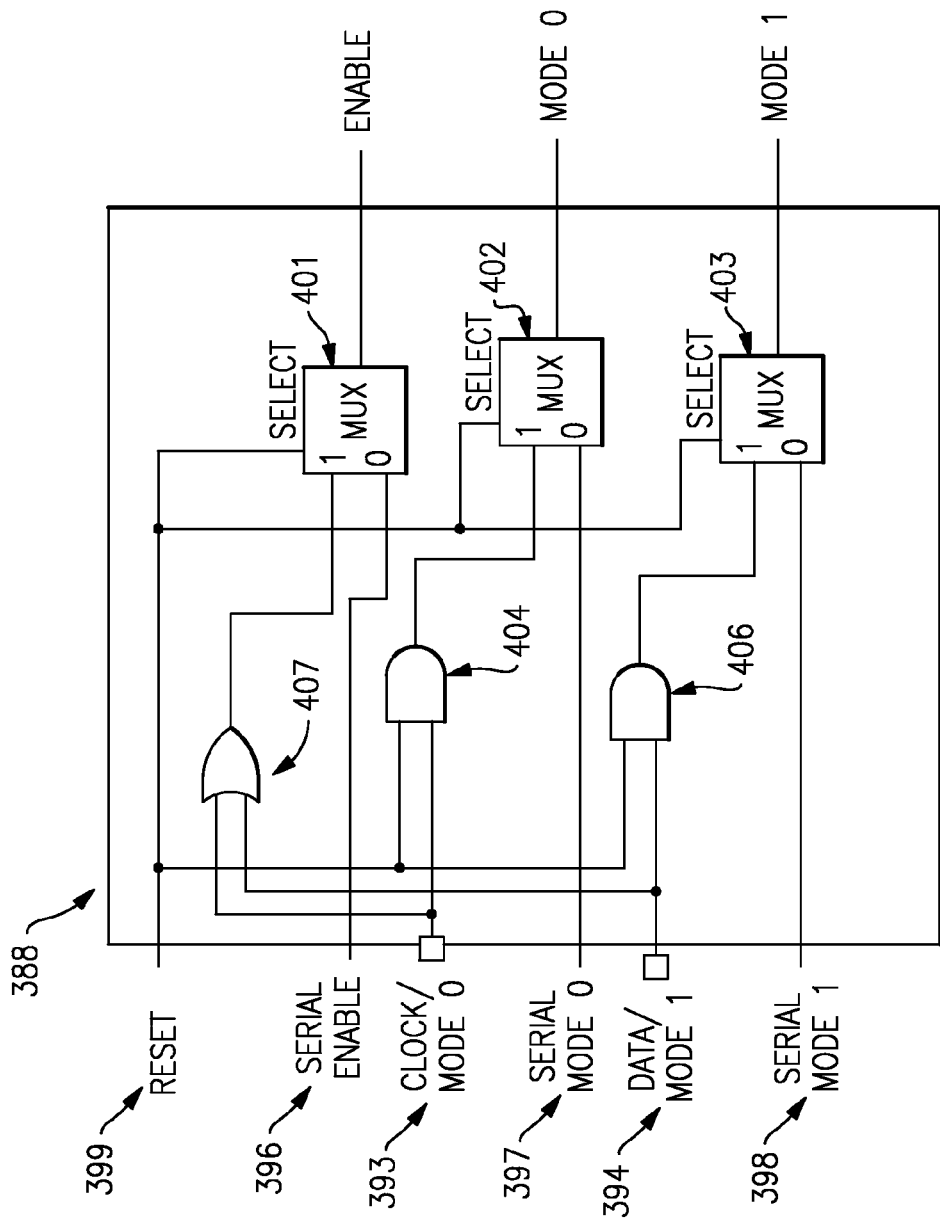
Figure 27:
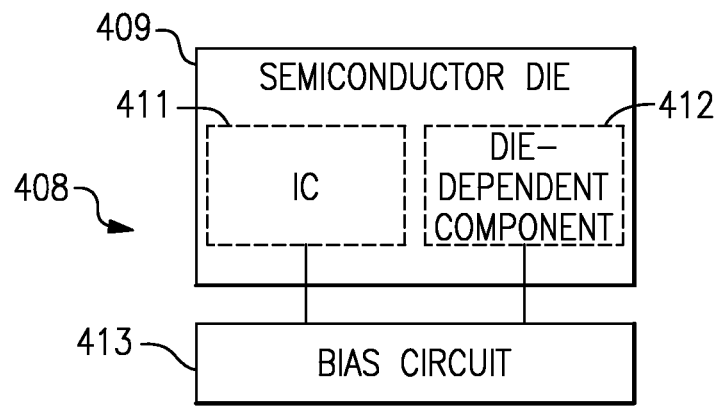
Figure 28:
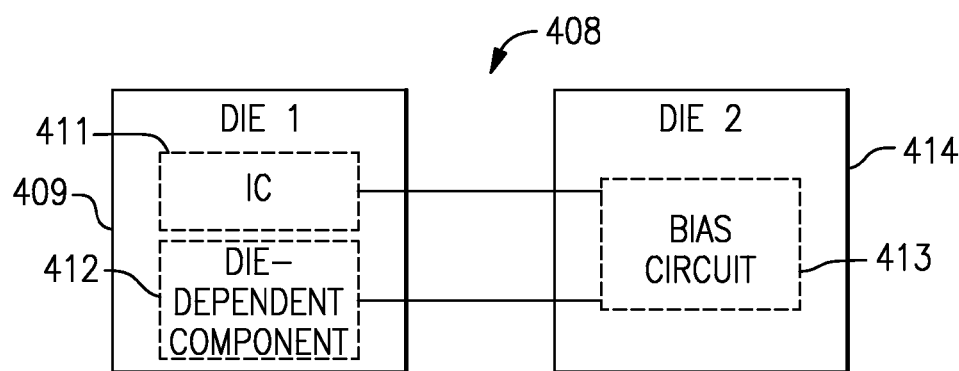
Figure 29:
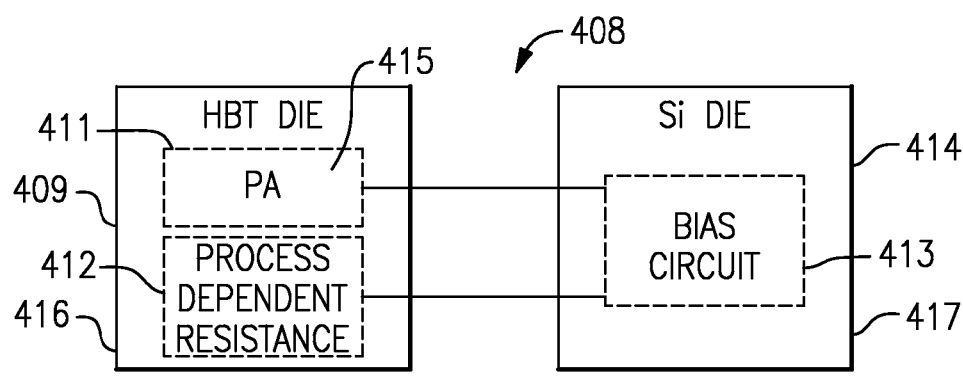
Figure 30:
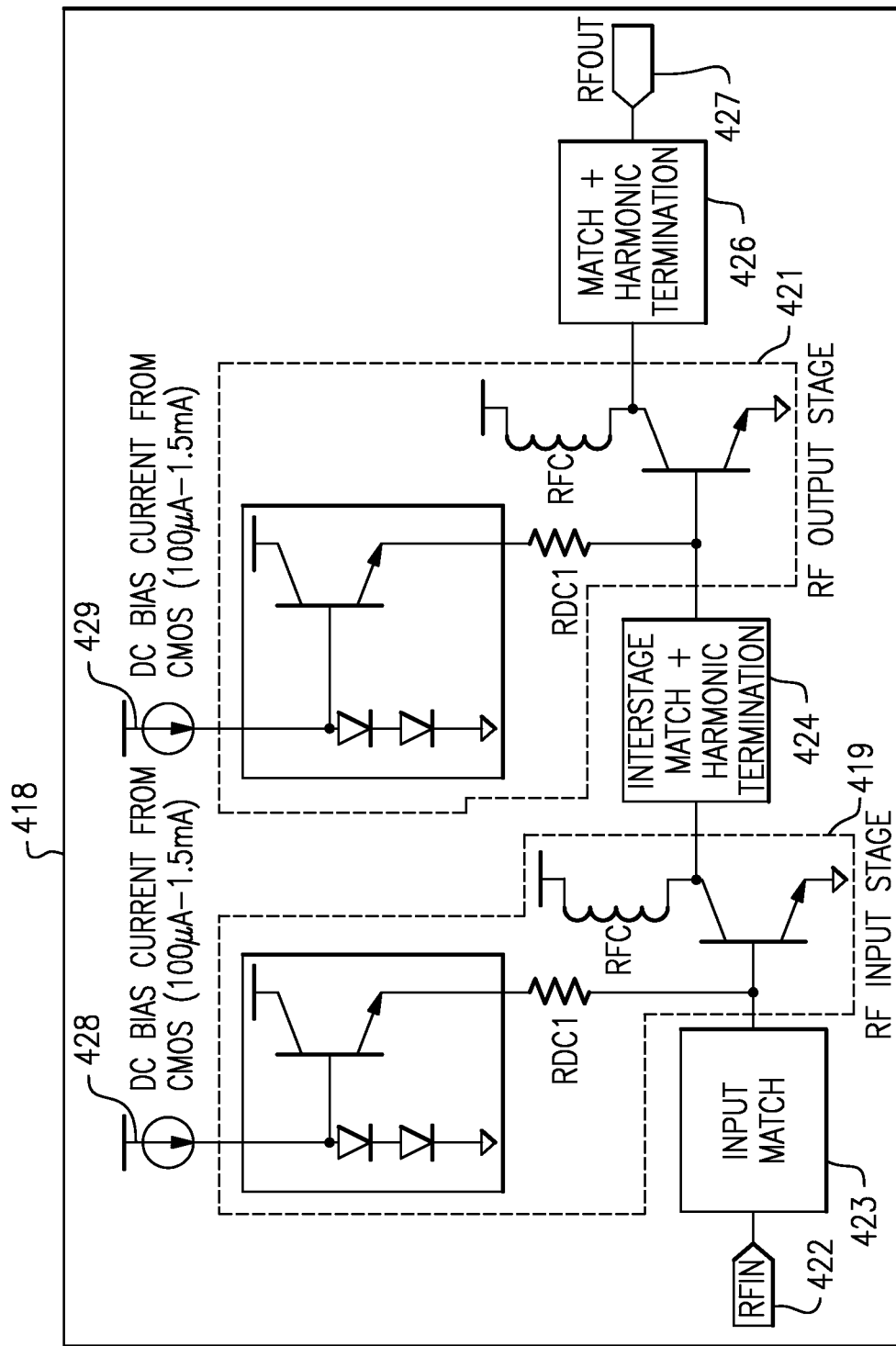
Figure 31:
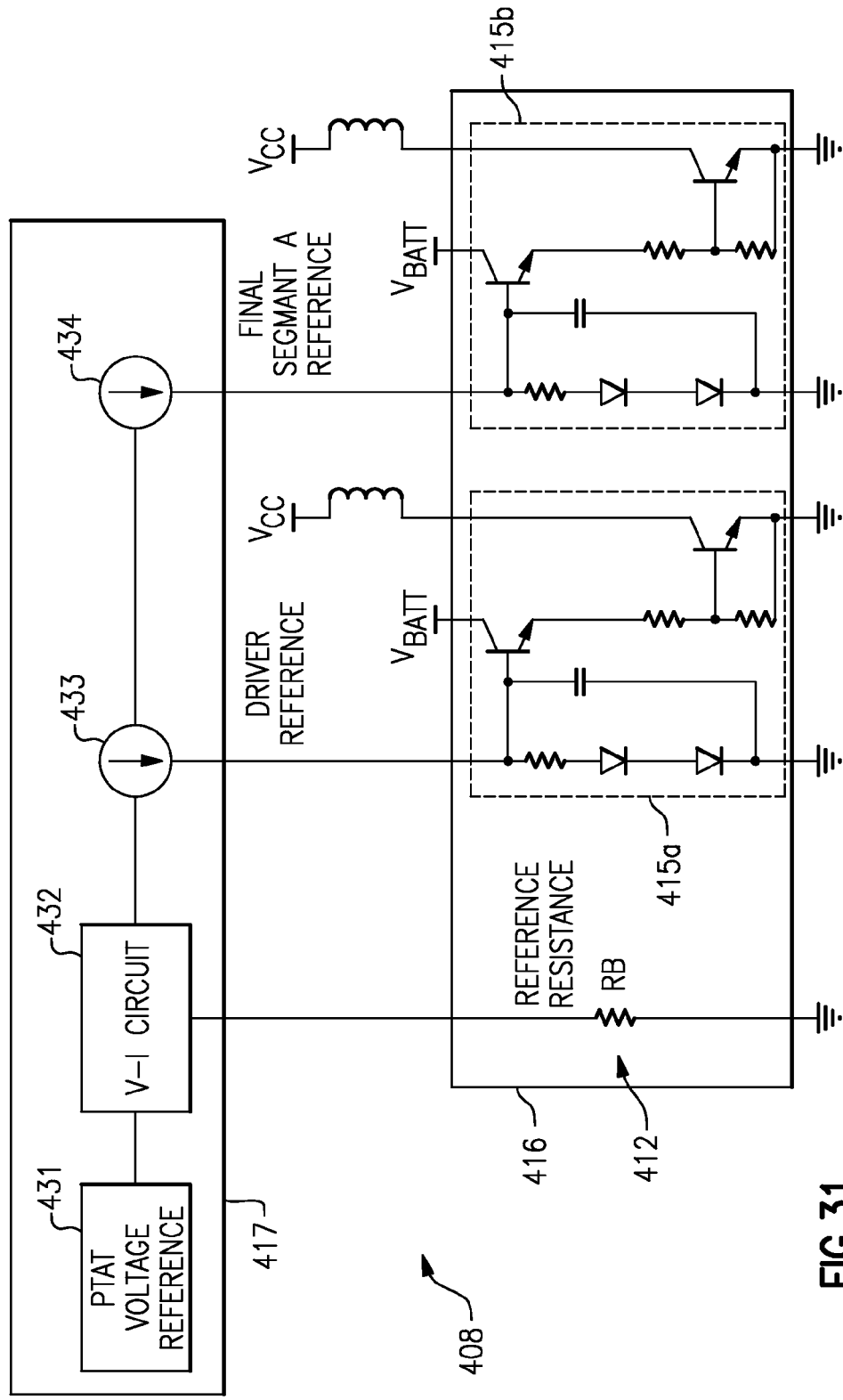
Figure 32:
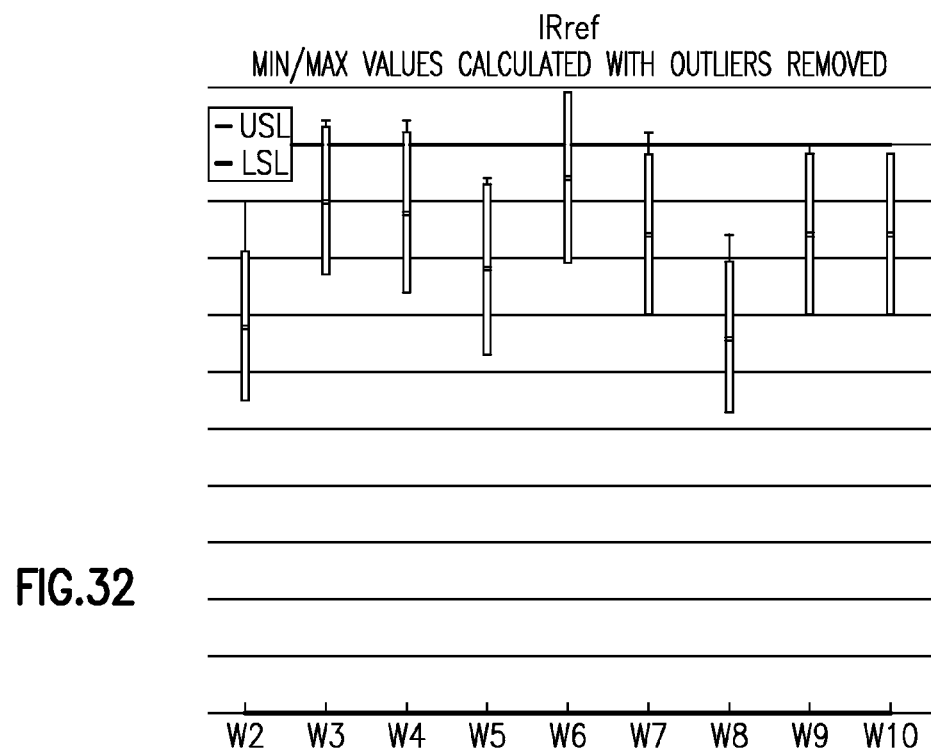
Figure 33:
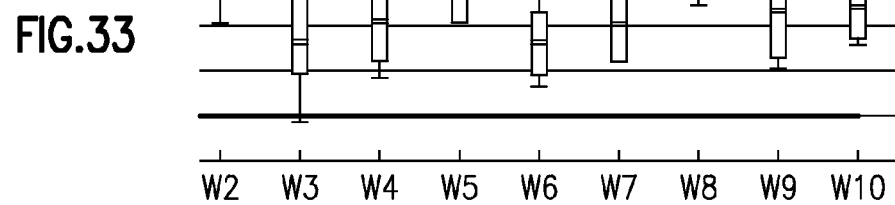
Figure 34:
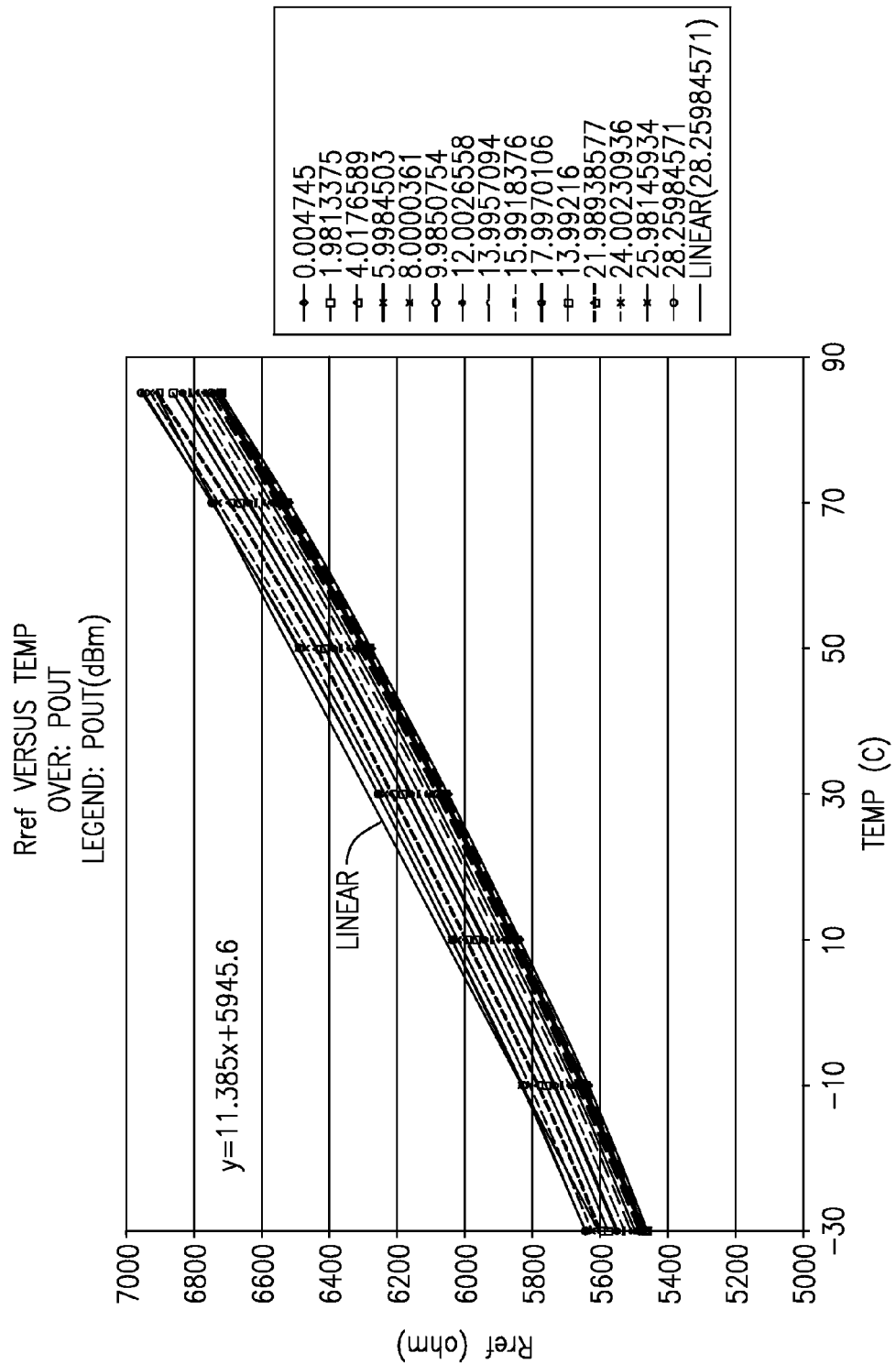
Figure 35:
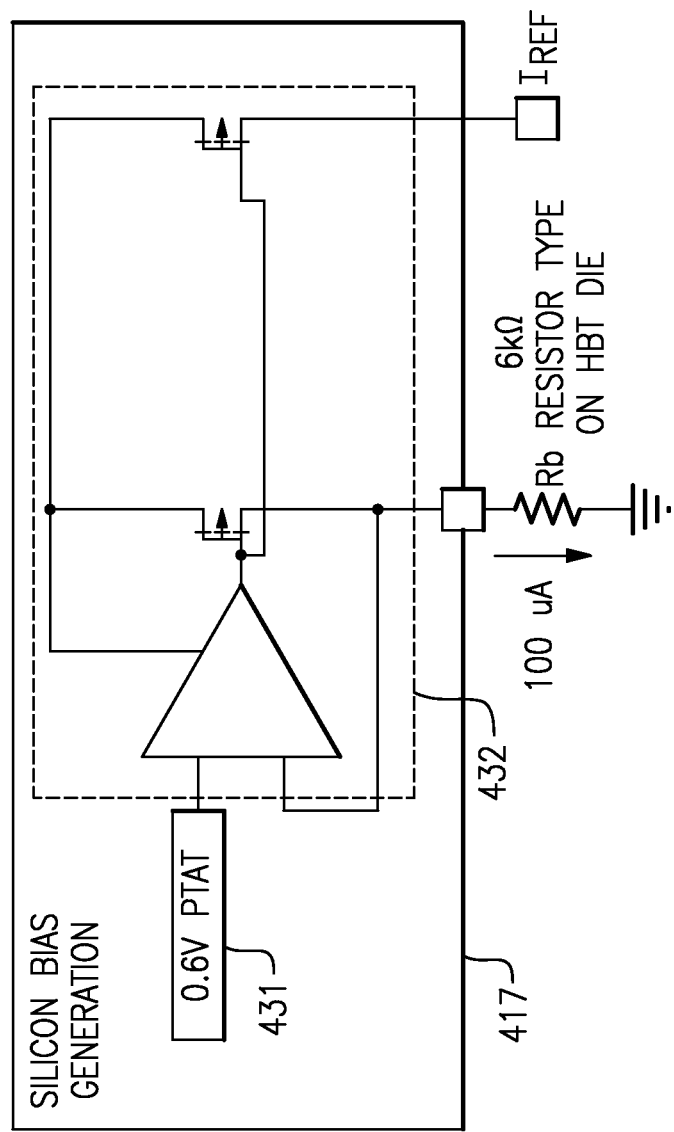
Figure 36:
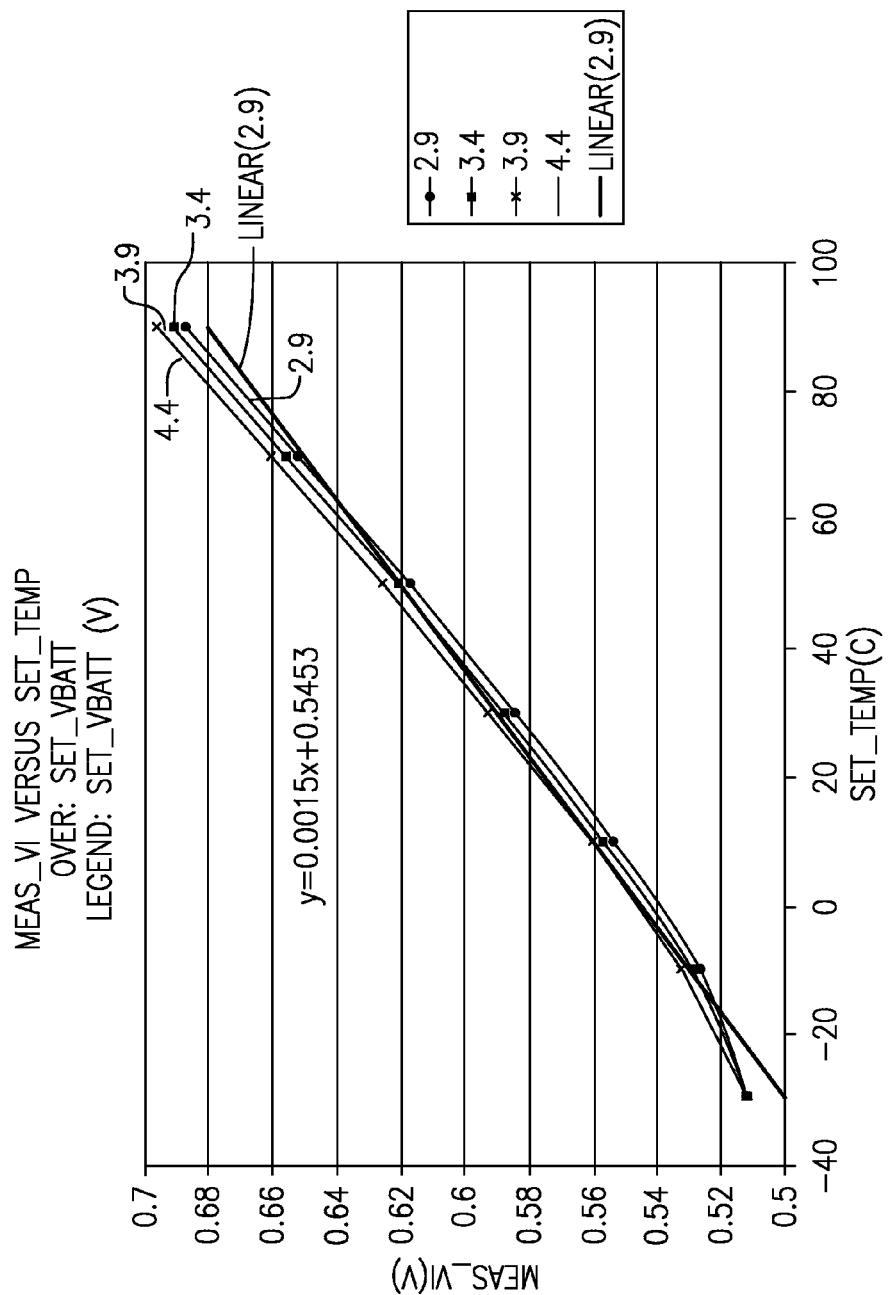
Figure 37A:
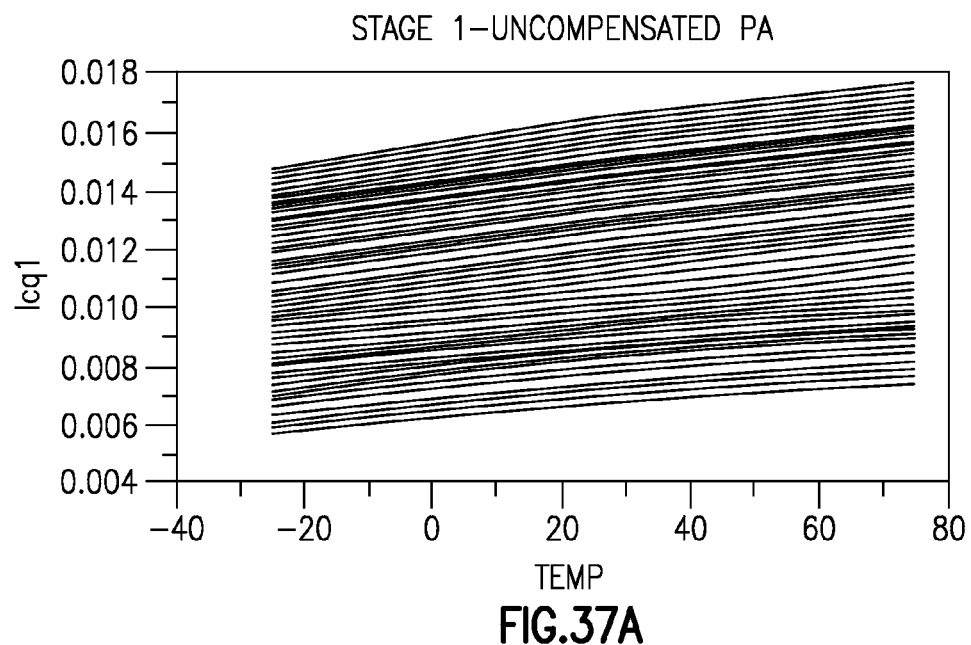
Figure 38A:
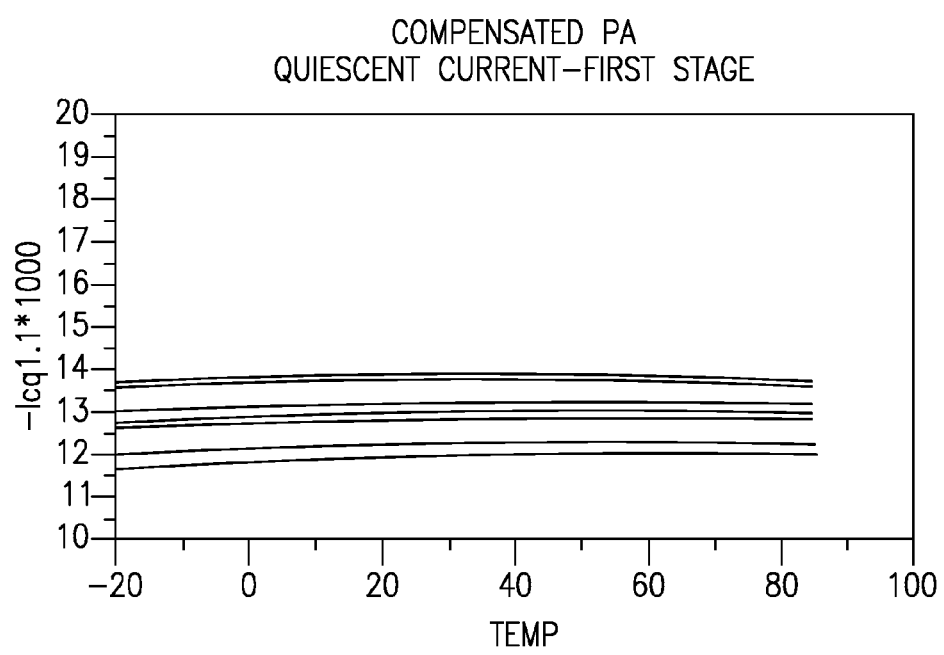
Figure 37B:
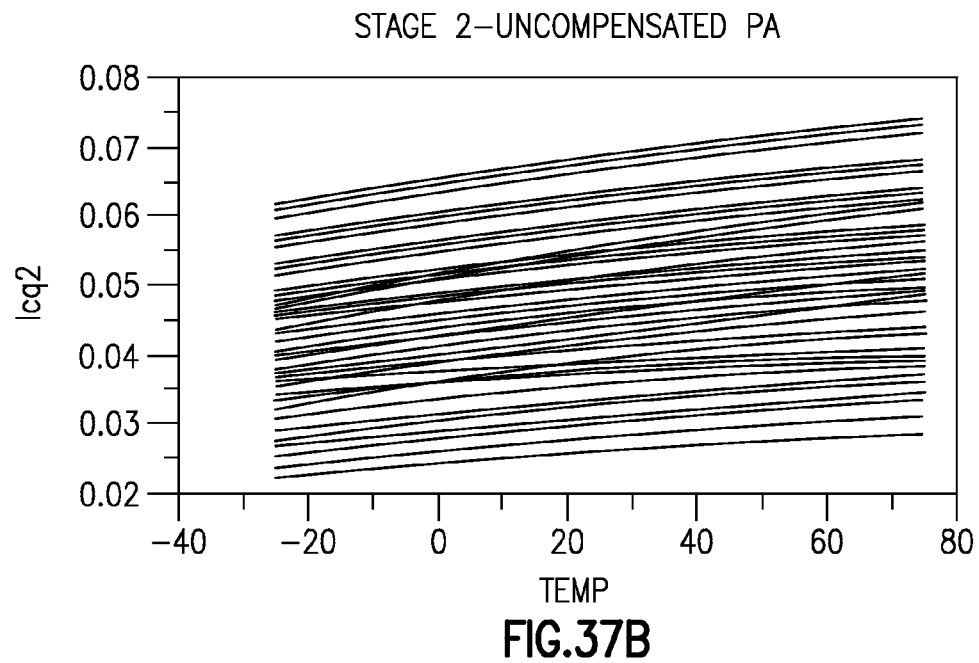
Figure 38B:
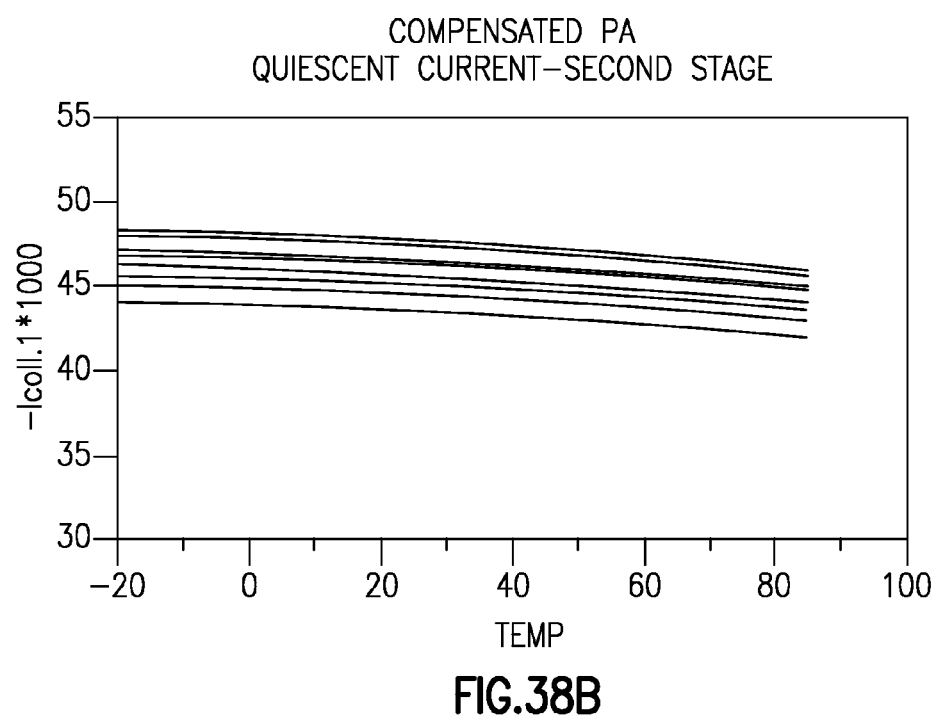
Figure 39:
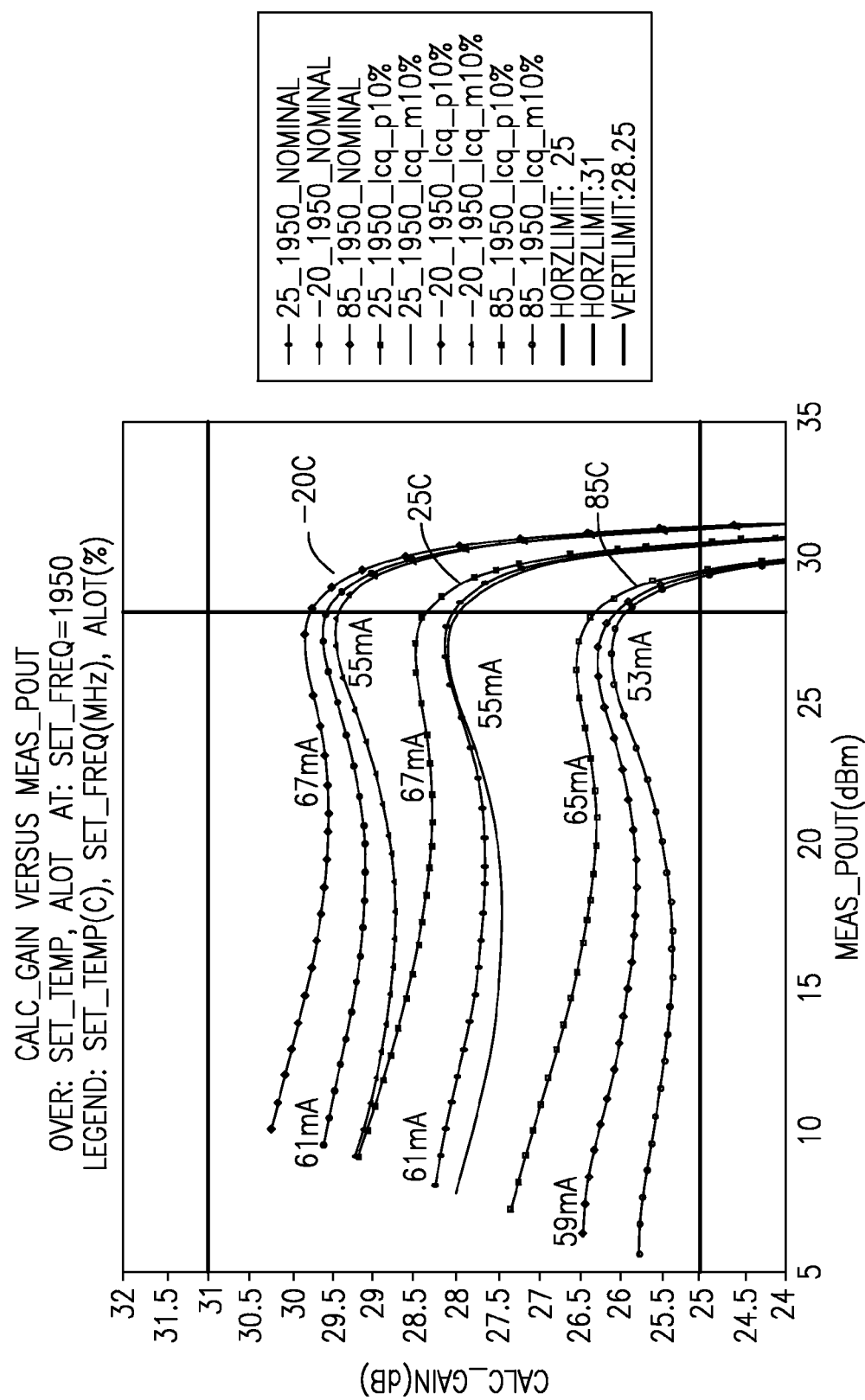
Figure 40:
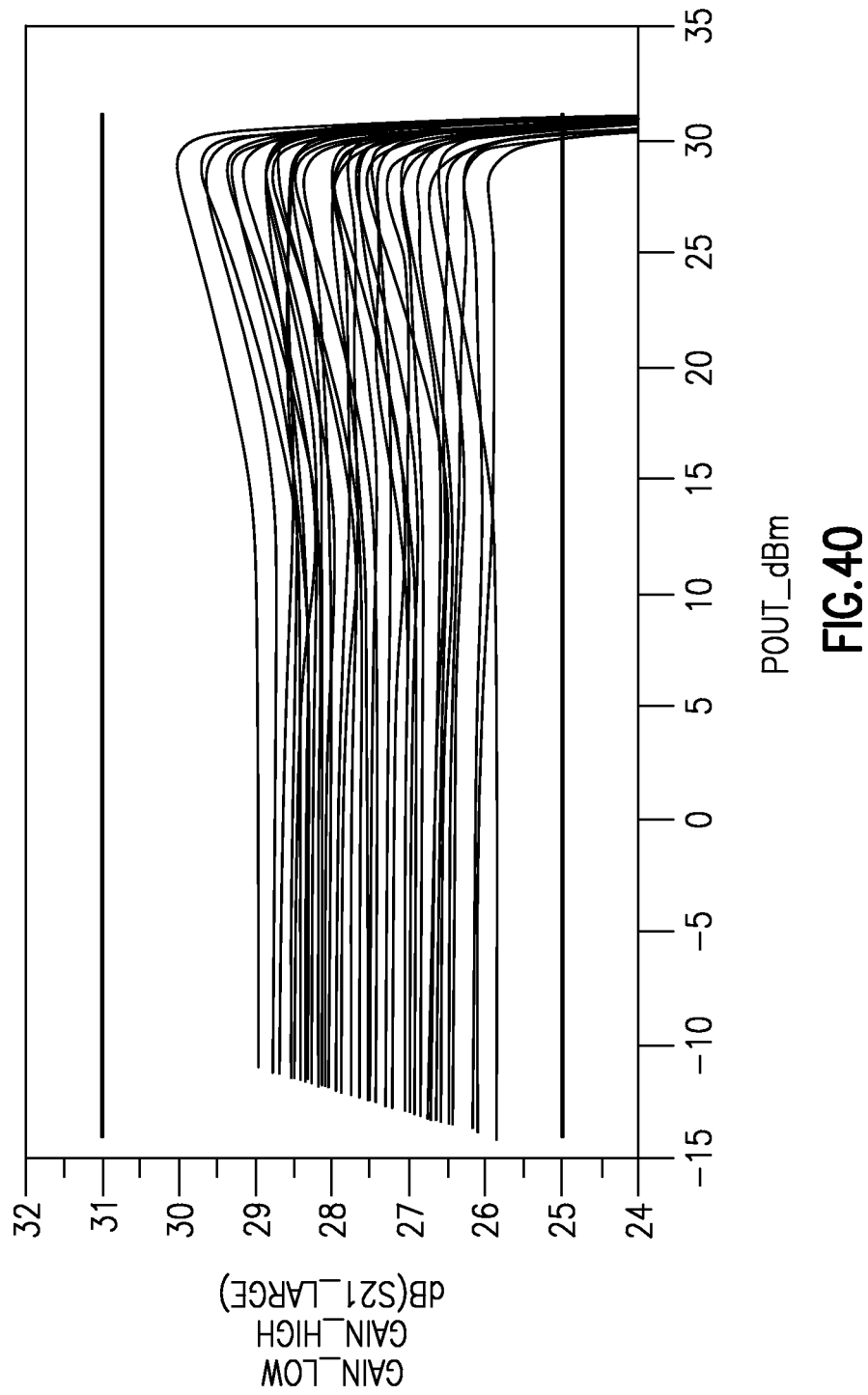
Figure 41A:
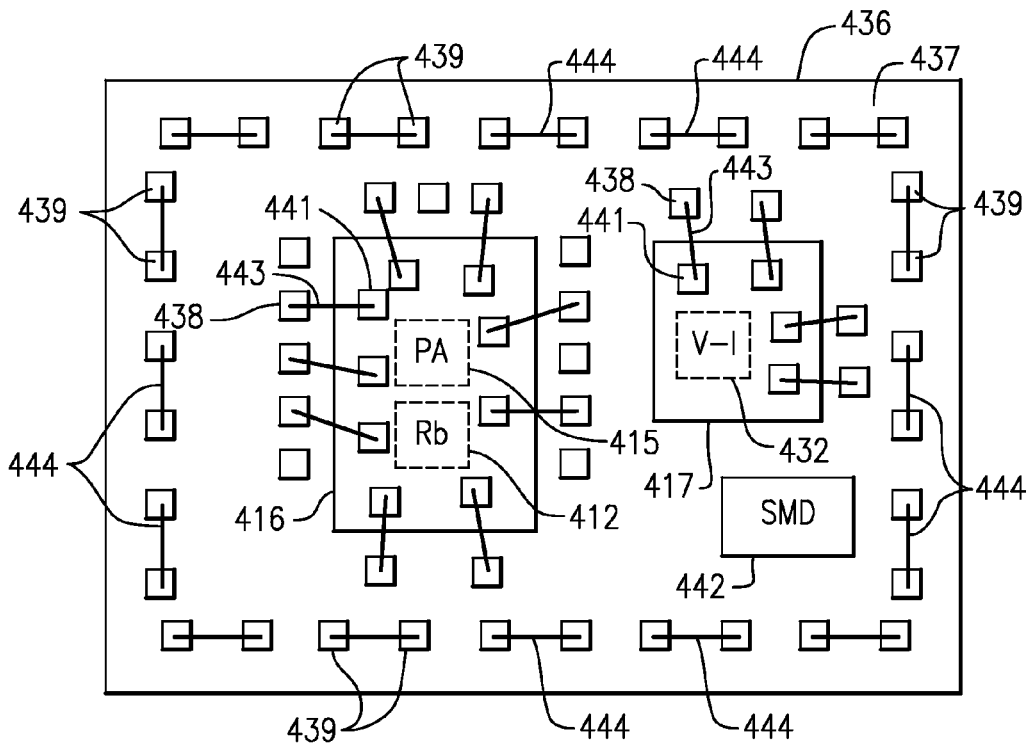
Figure 41B:
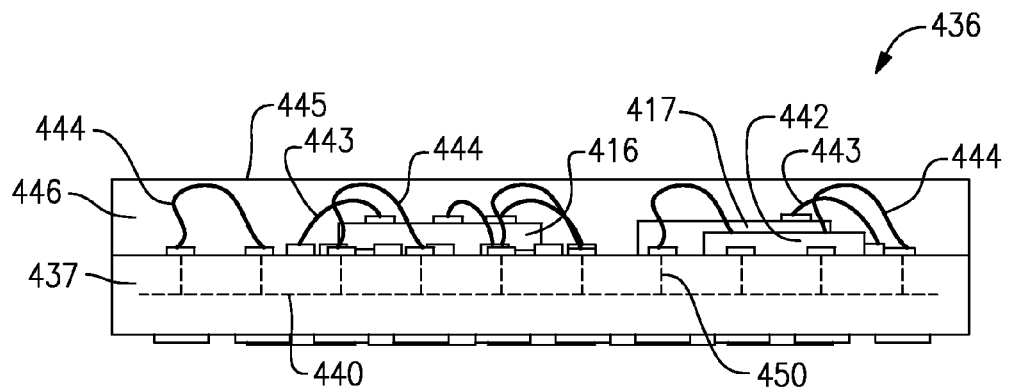
Figure 42:
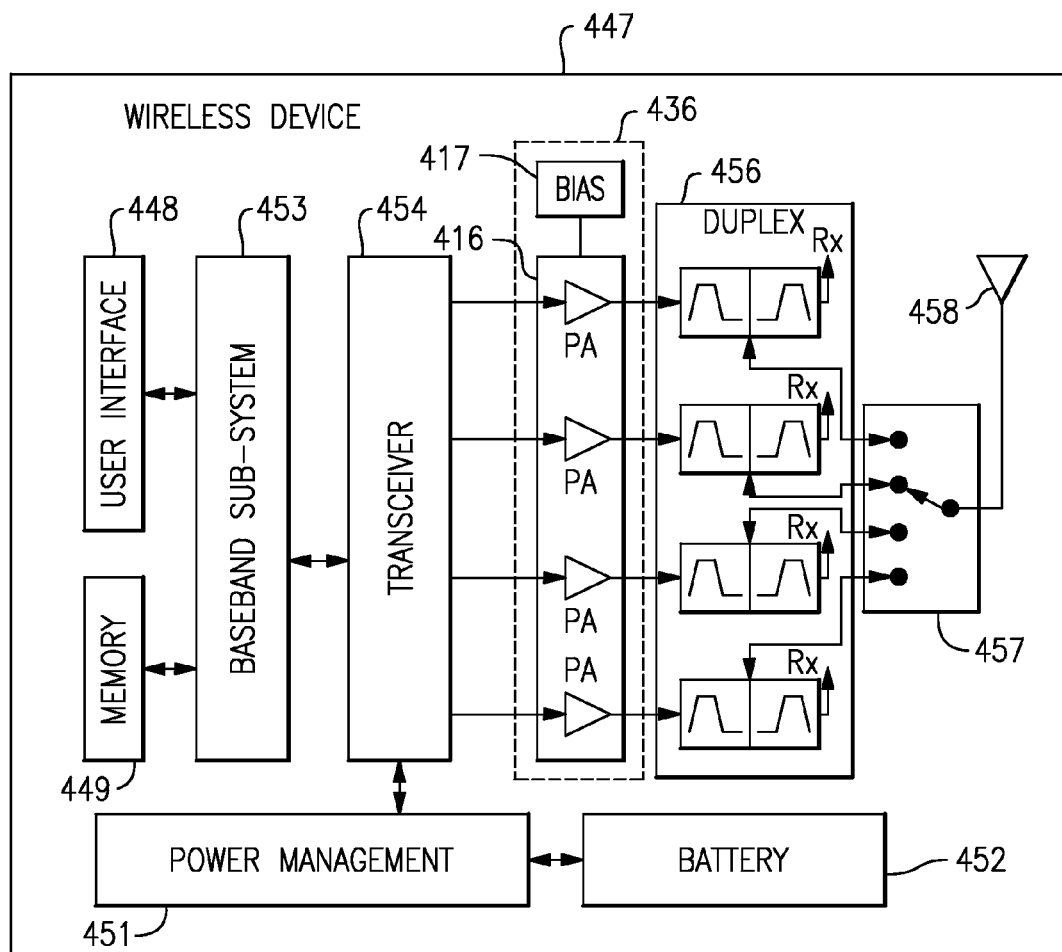
Figure 43:
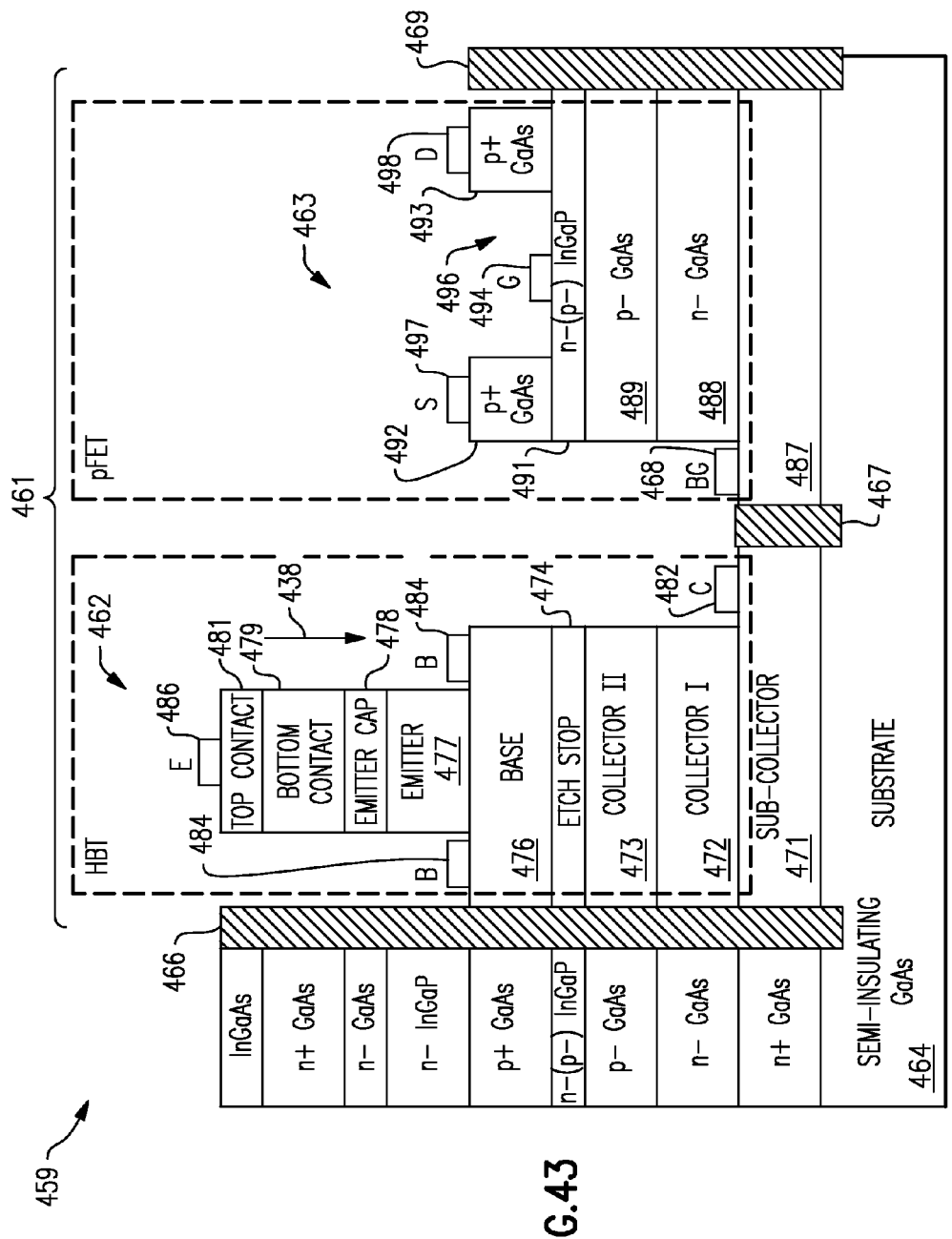
Figure 44:
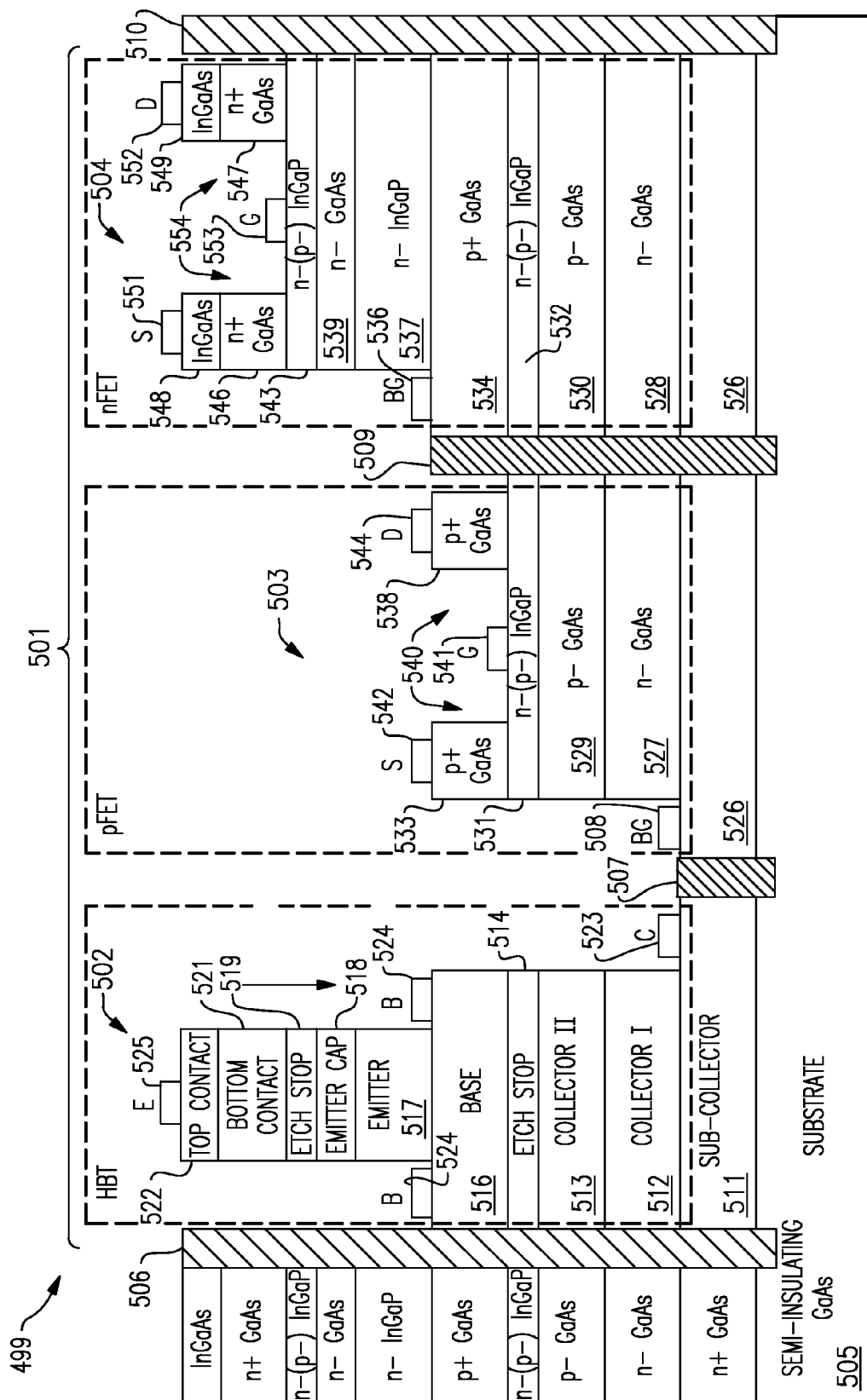
Figure 45:
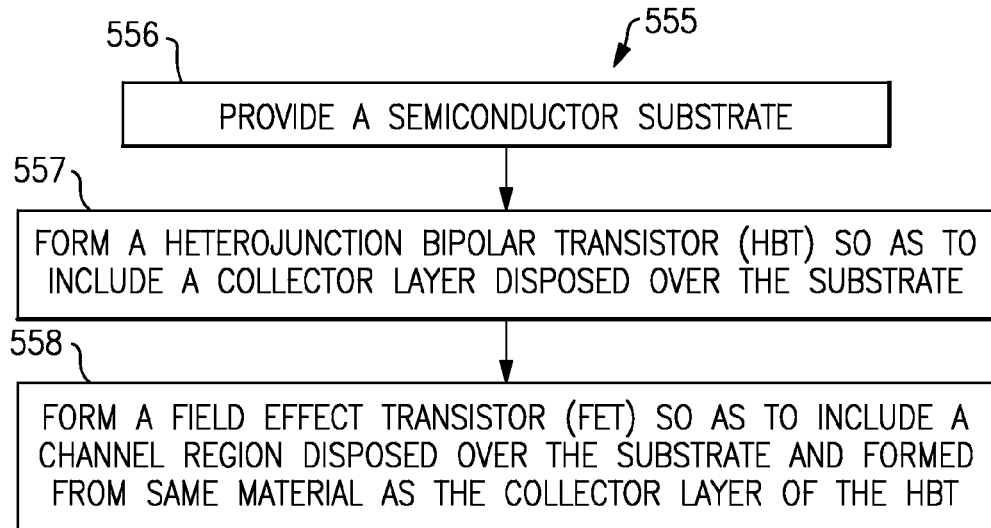
Figure 46:
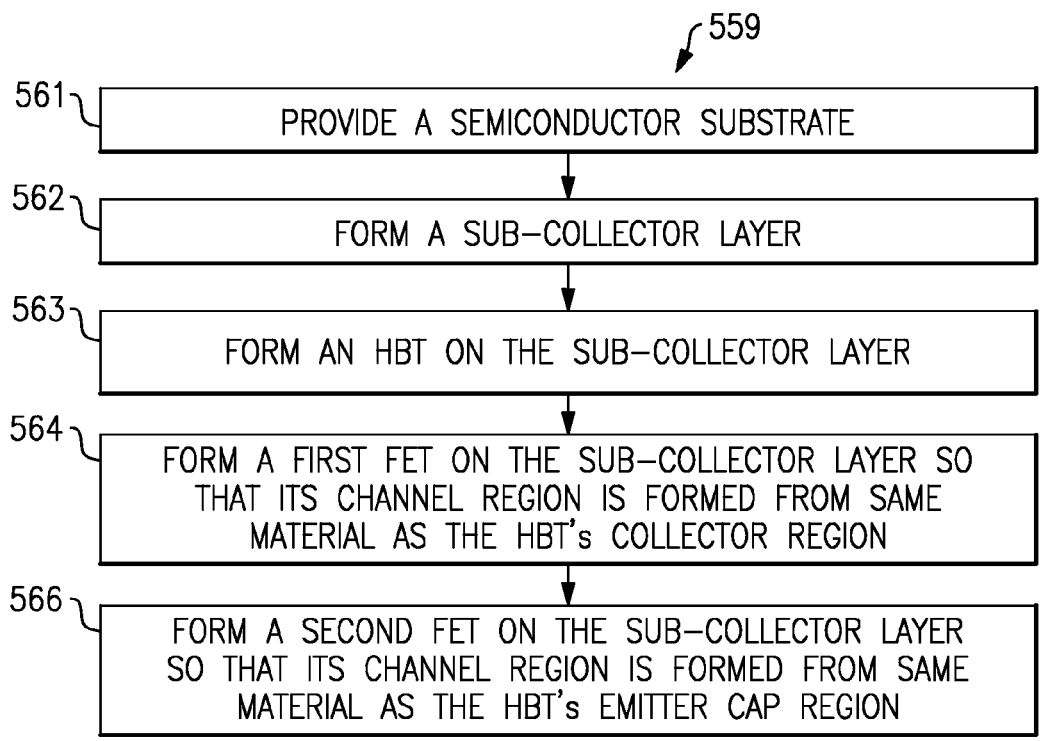
Figure 50:
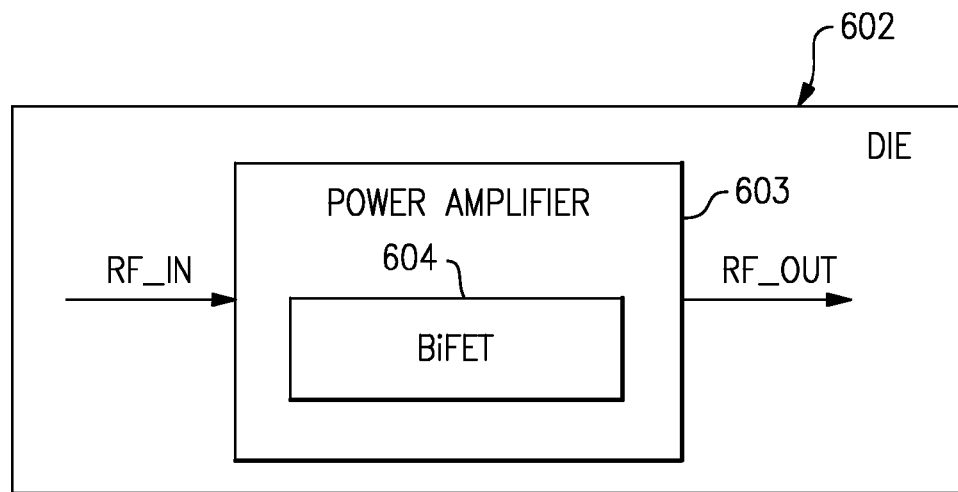
Figure 51:
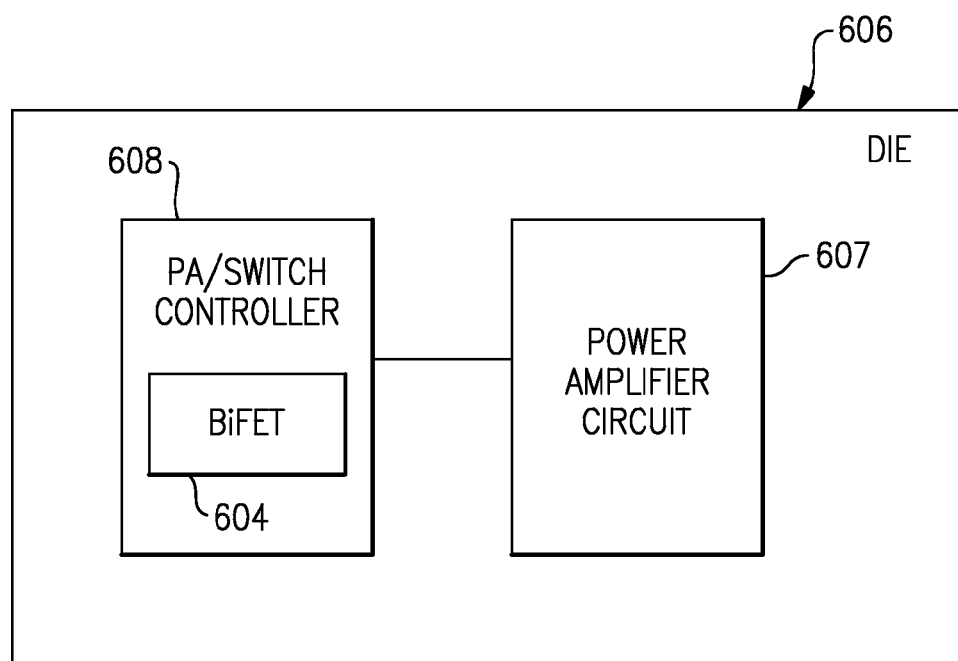
Figure 52:
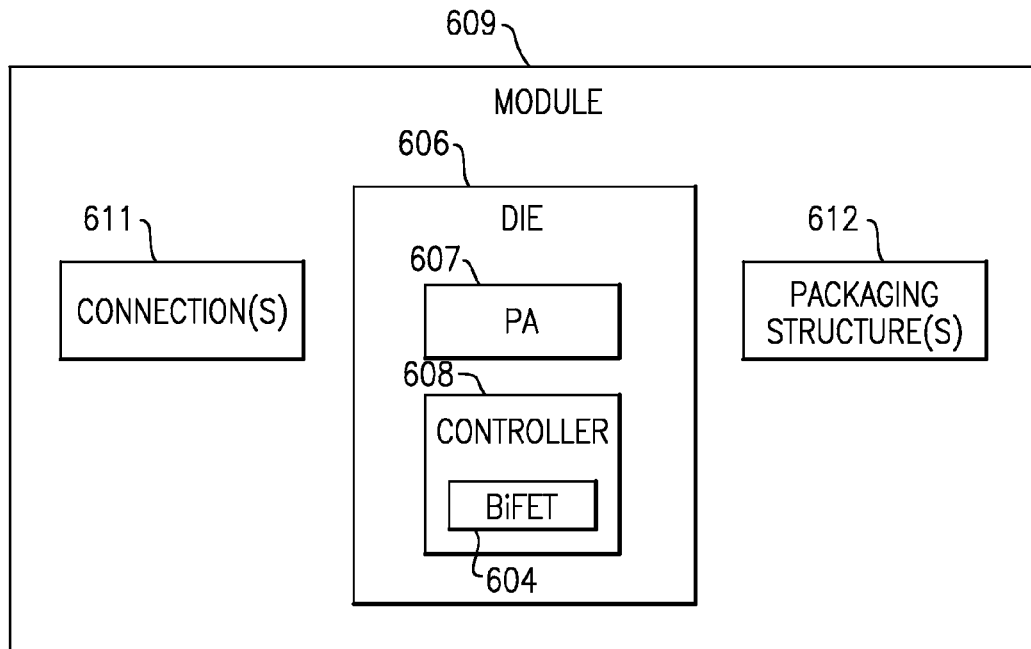
Figure 53:
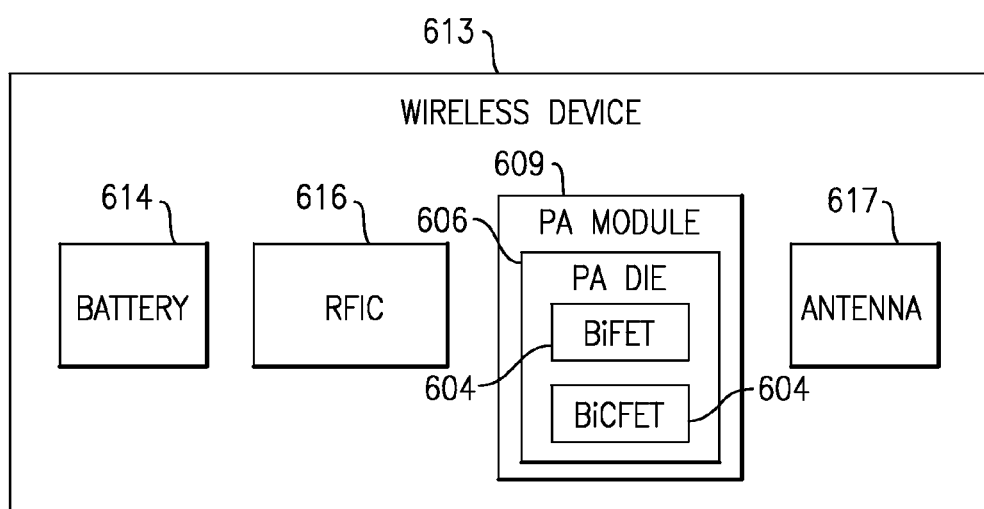
Figure 54:
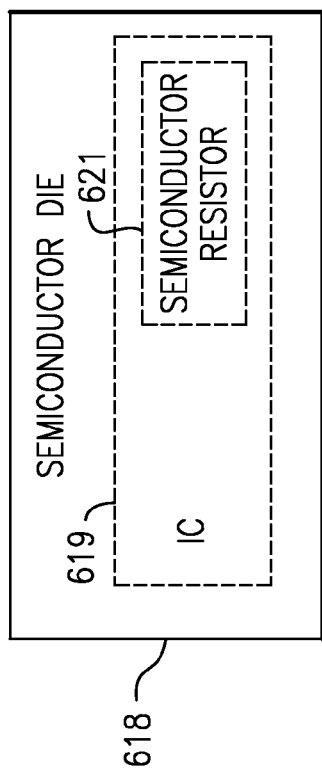
Figure 55:
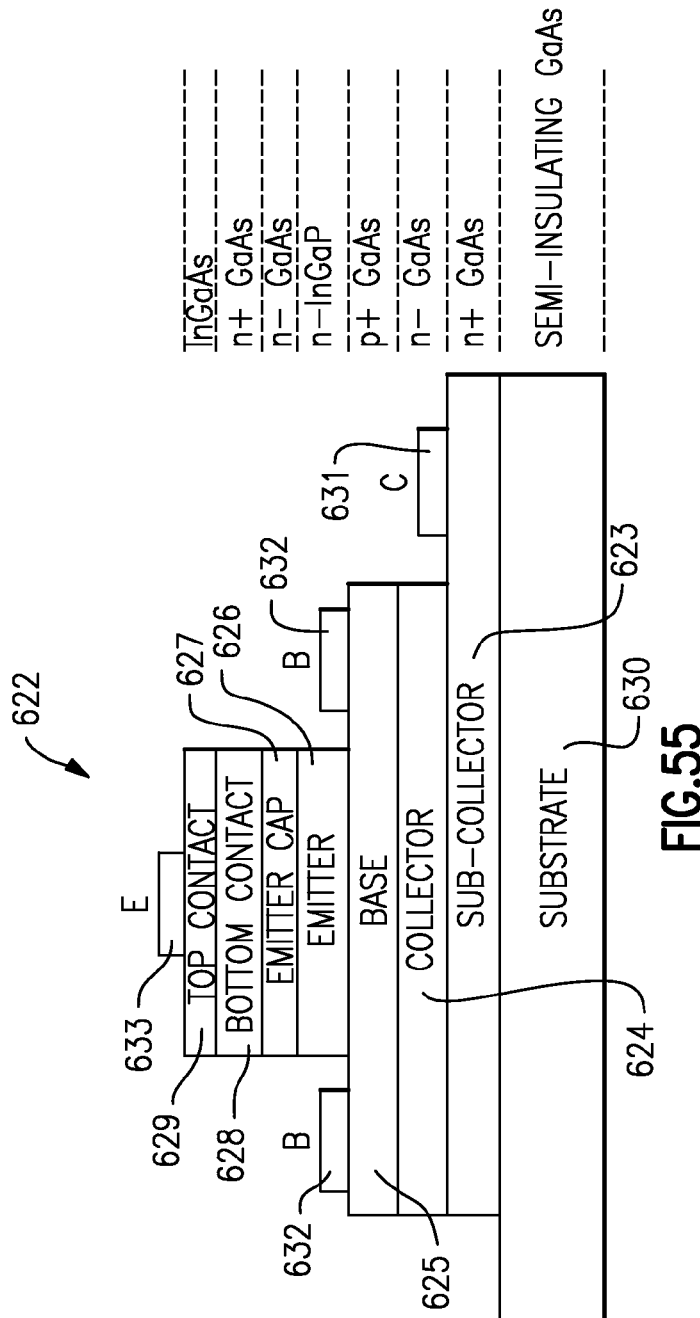
Figure 57A:
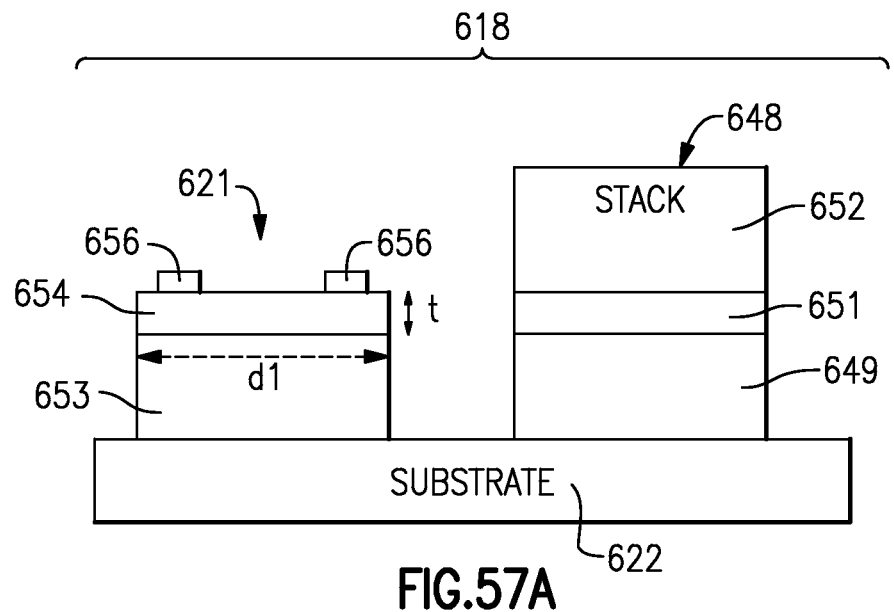
Figure 57B:
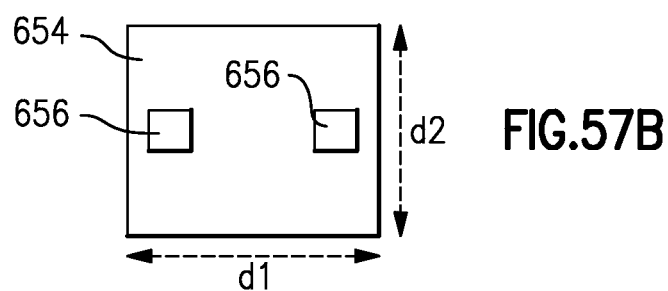
Figure 57C:
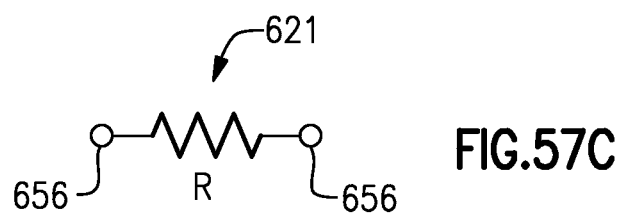
Figure 58:
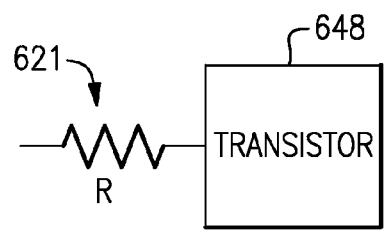
Figure 59A:
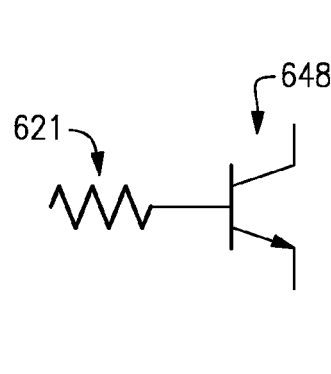
Figure 59B:
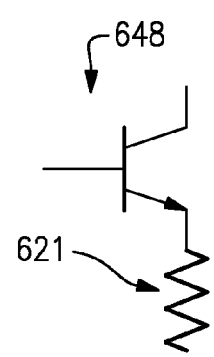
Figure 59C:
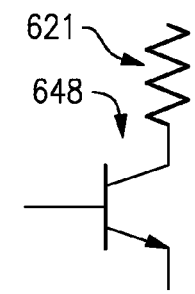
Figure 60:
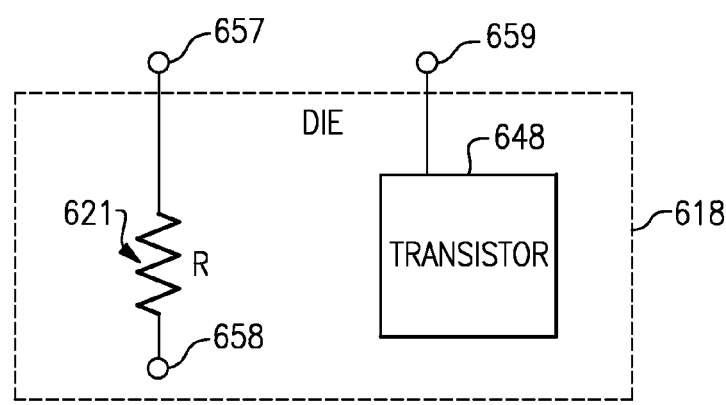
Figure 61A:
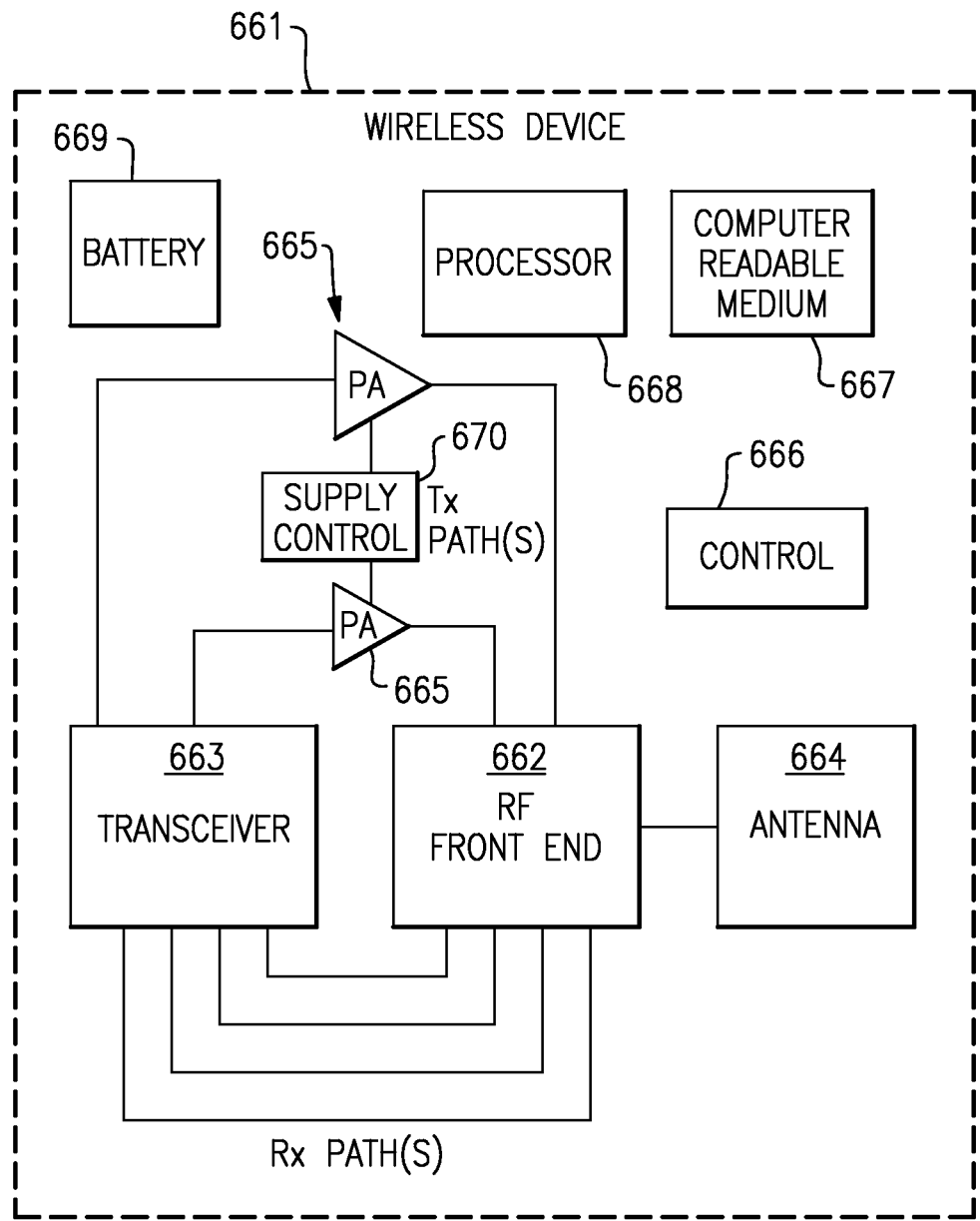
Figure 61B:
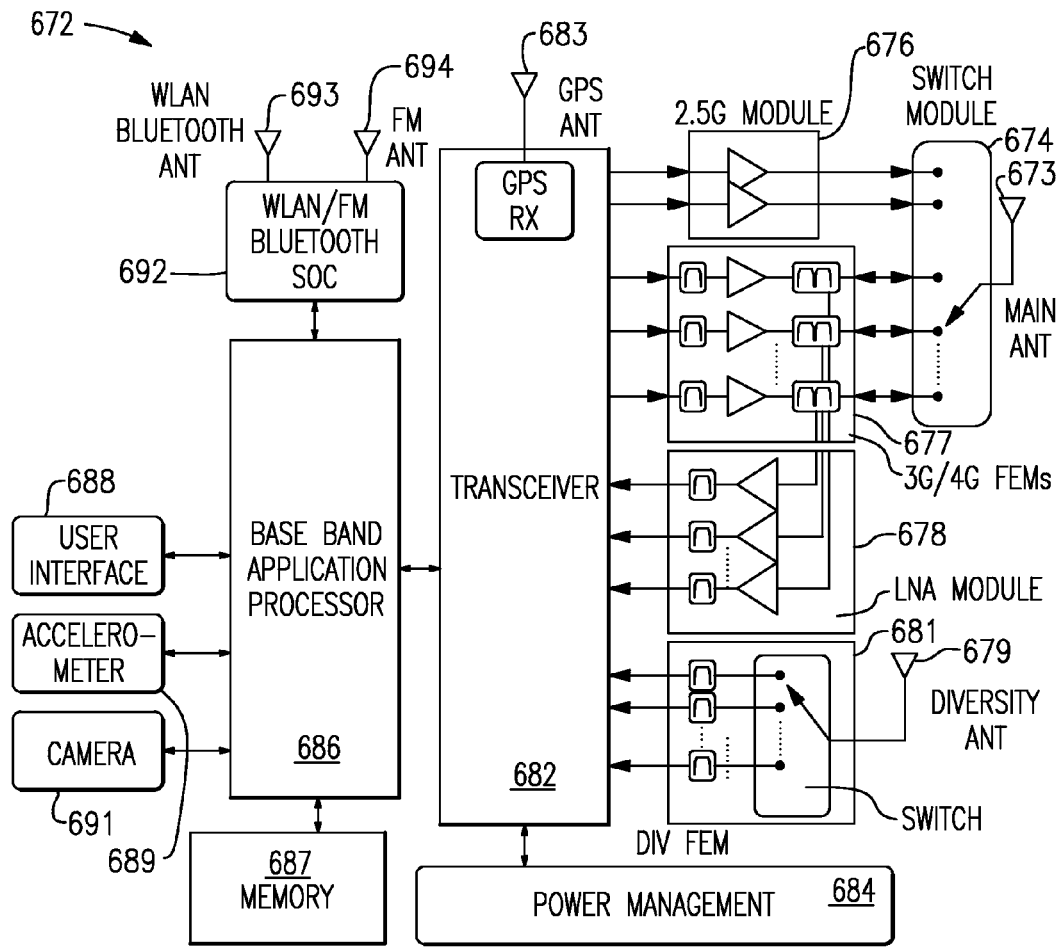
Figure 61C:
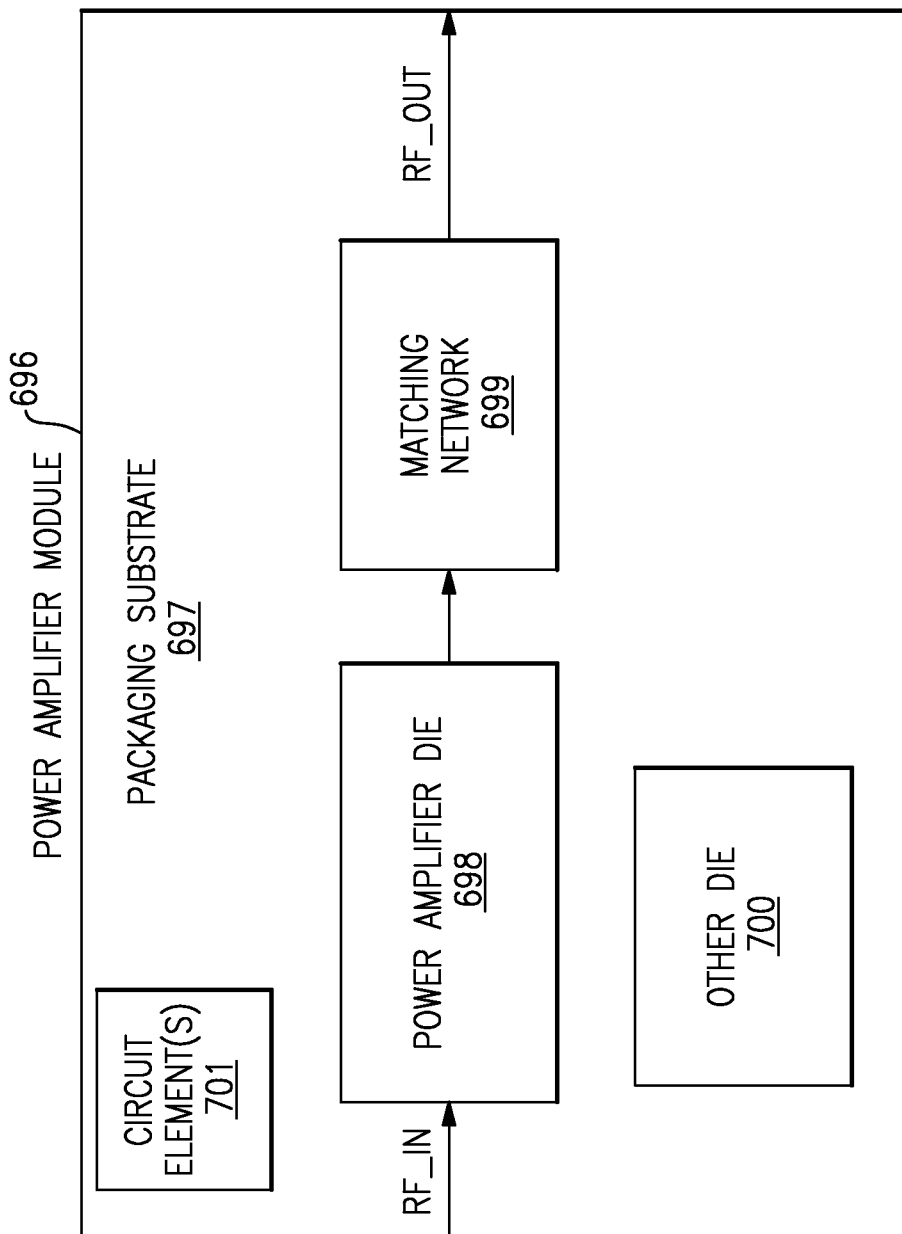
Figure 62:
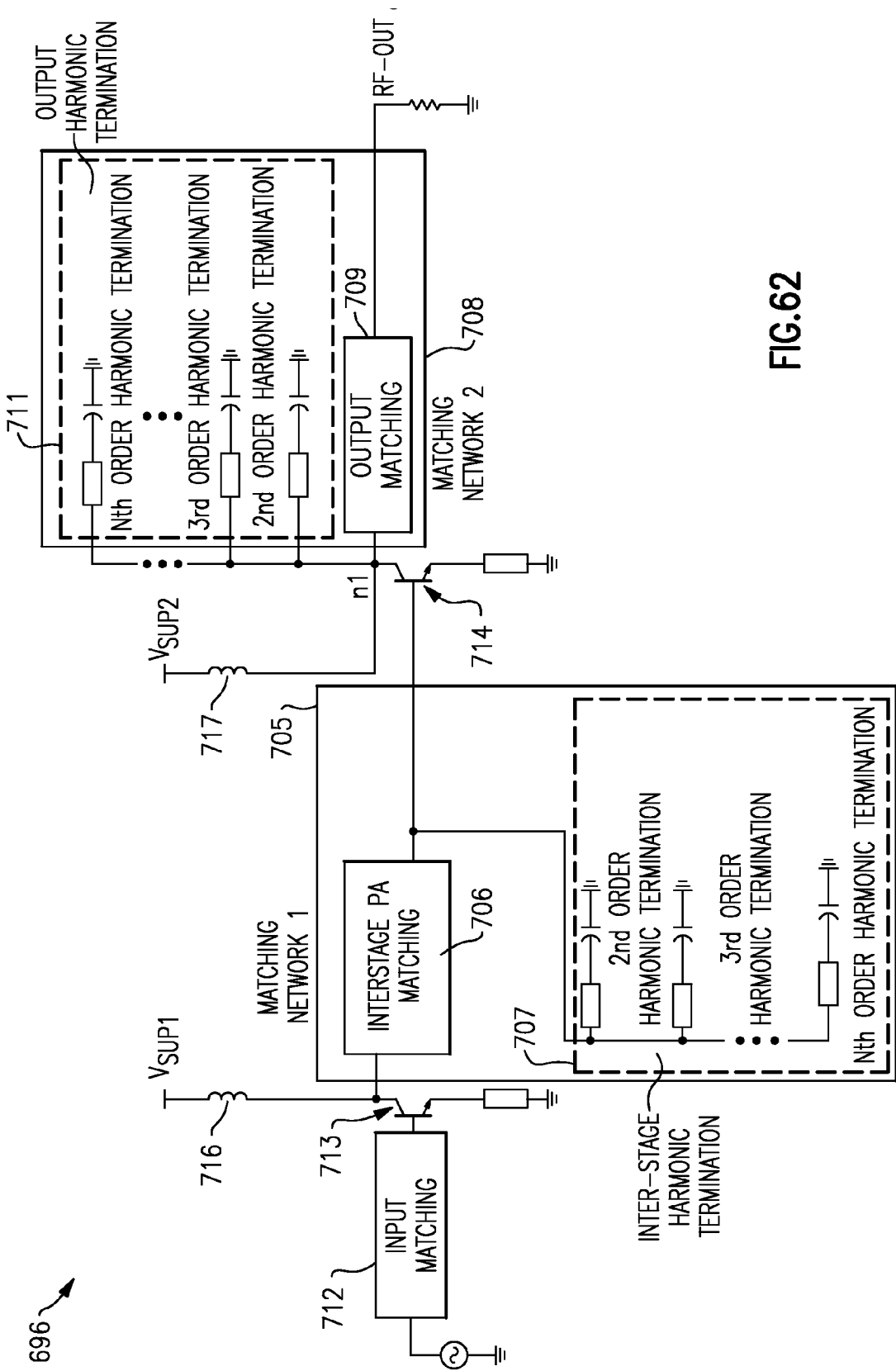
Figure 63A:
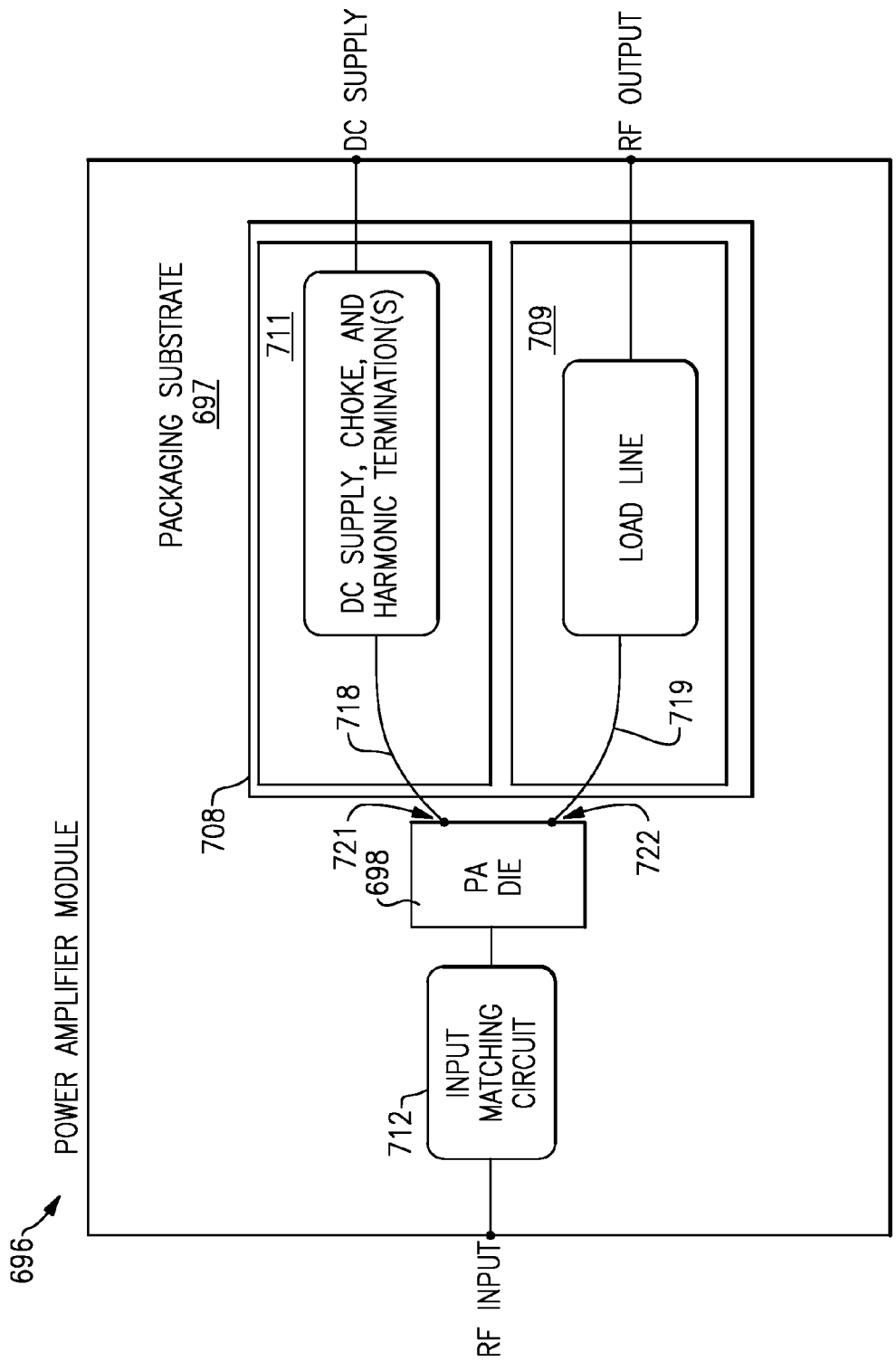
Figure 63B:
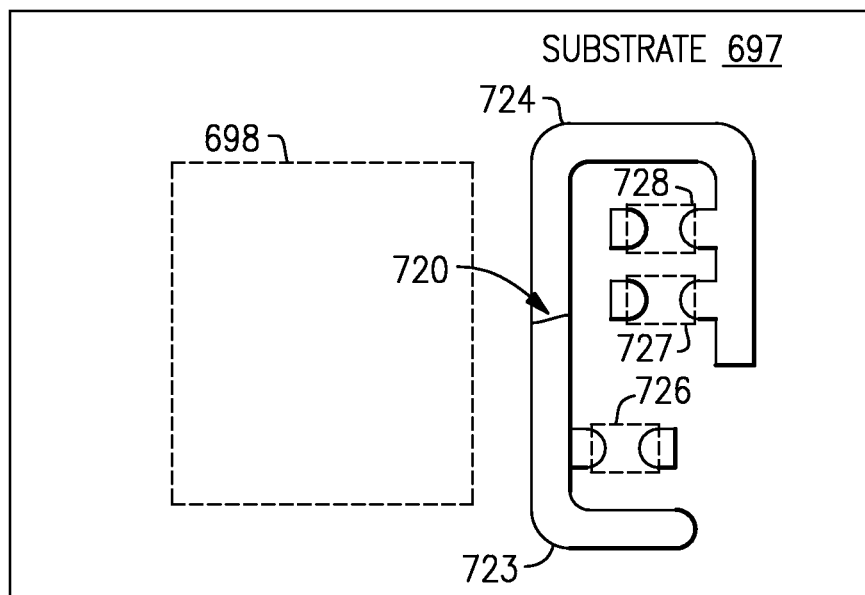
Figure 64A:
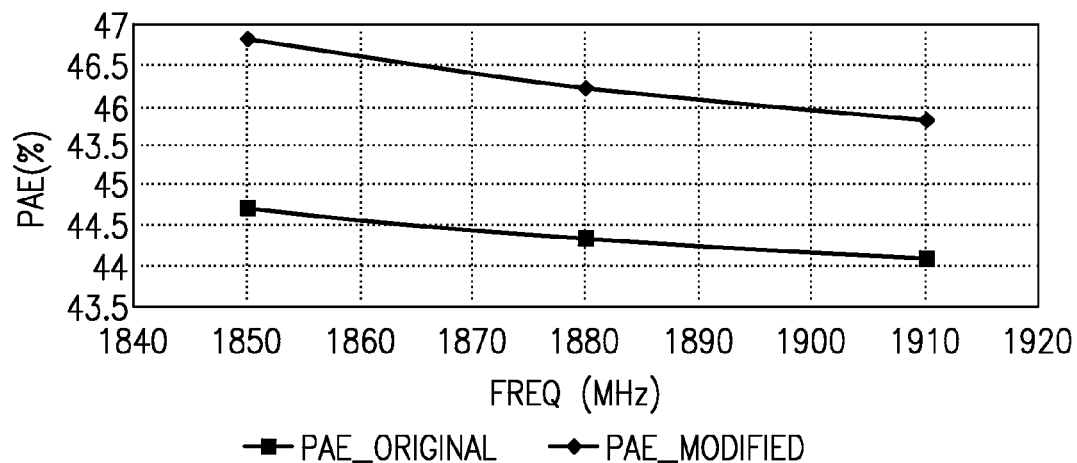
Figure 64B:
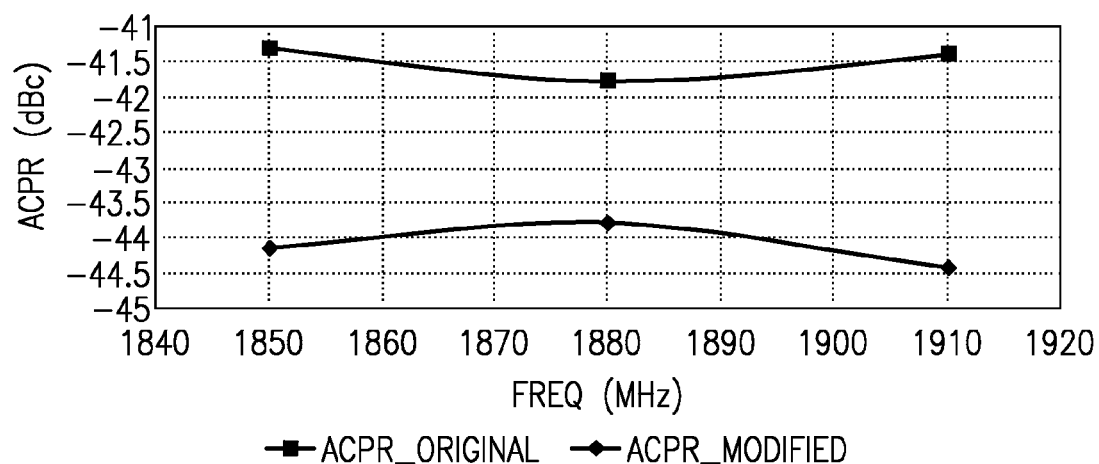
Figure 64C:
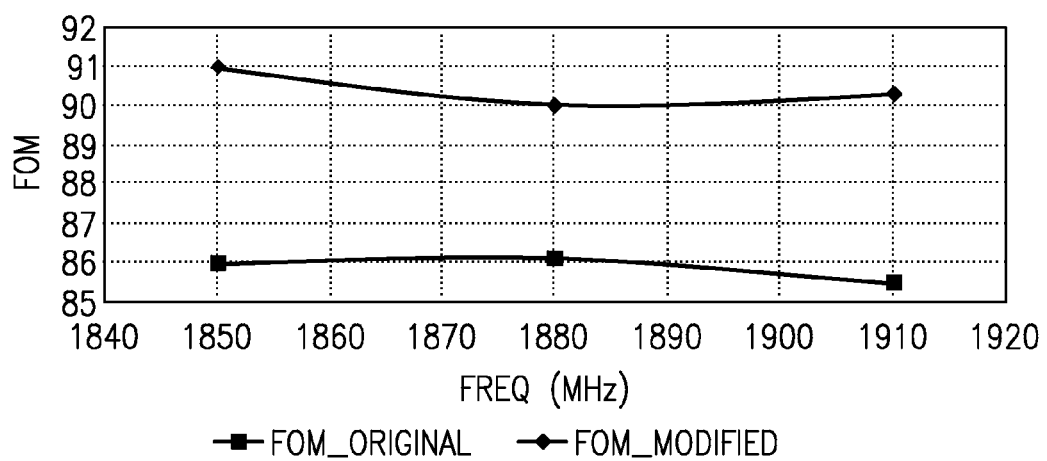
Figure 65:
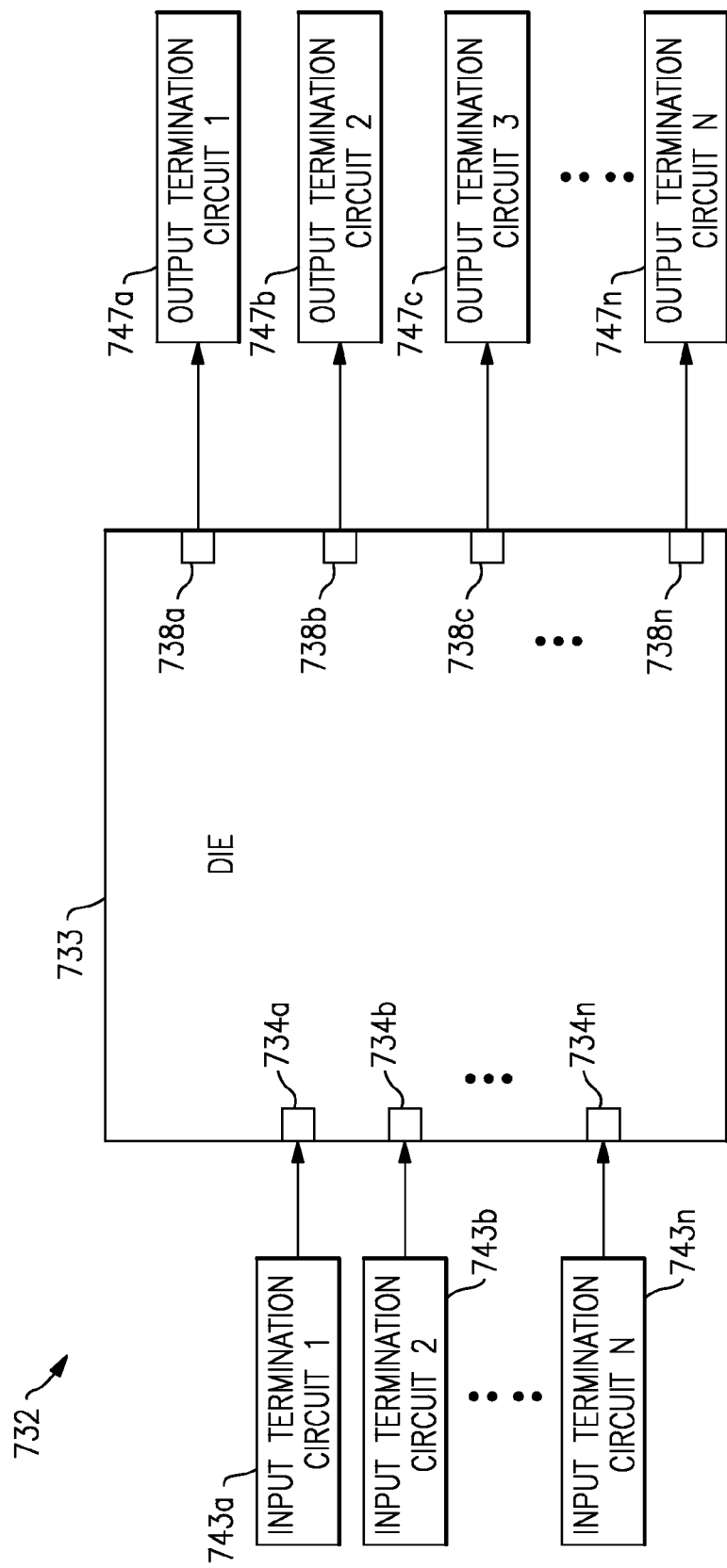
Figure 66:
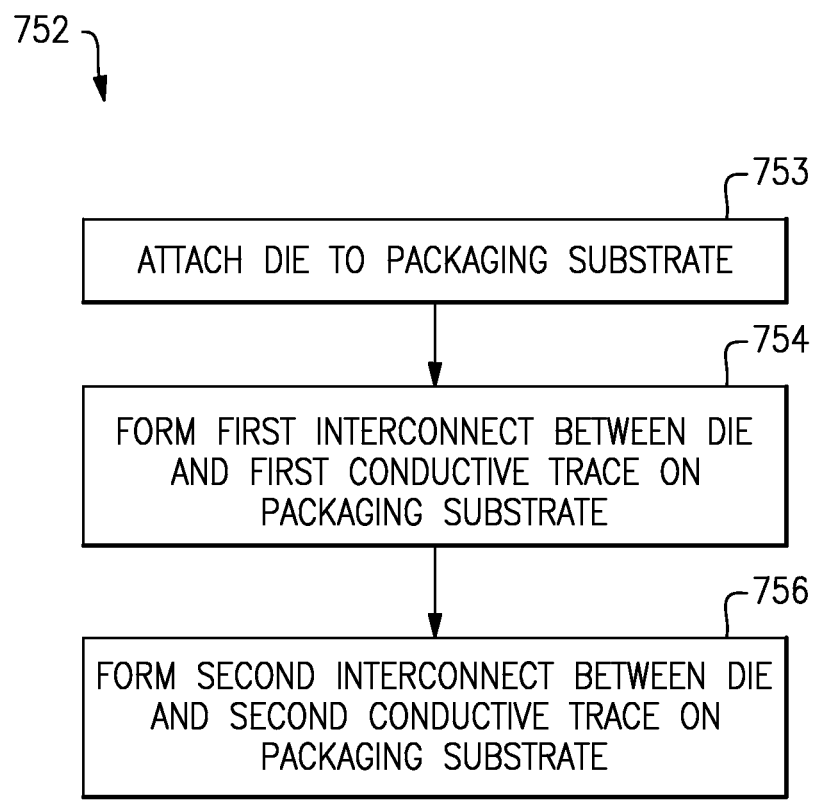
Figure 67A:
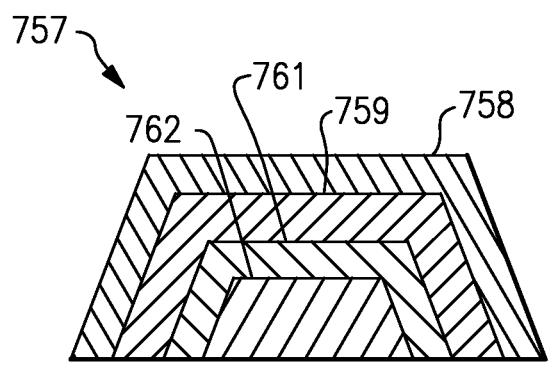
Figure 67B:
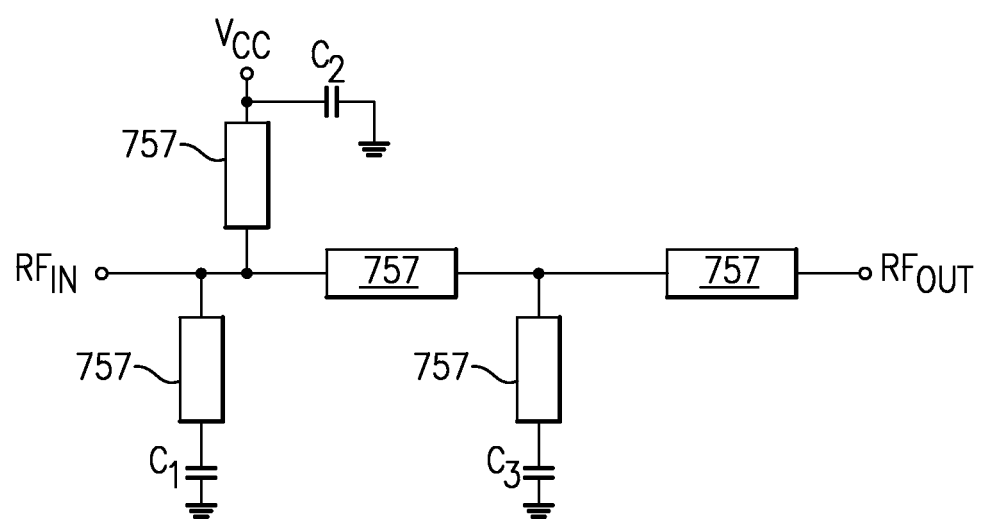
Figure 68A:
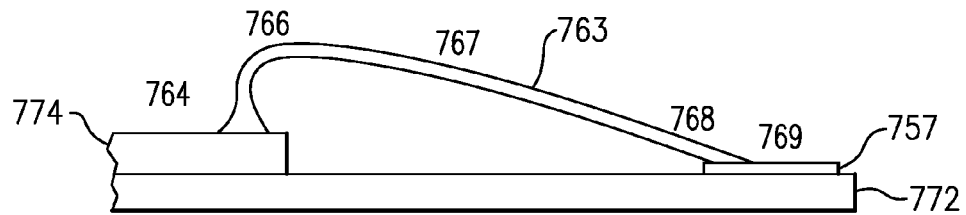
Figure 68B:
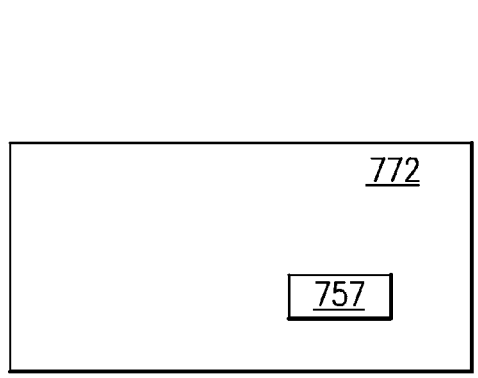
Figure 68C:
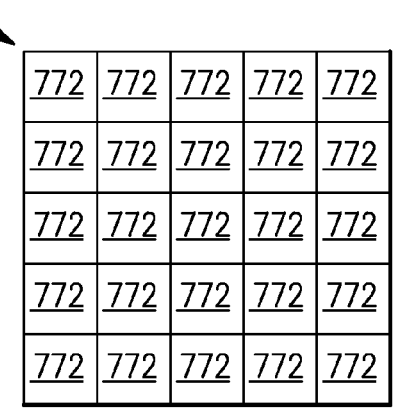
Figure 69:
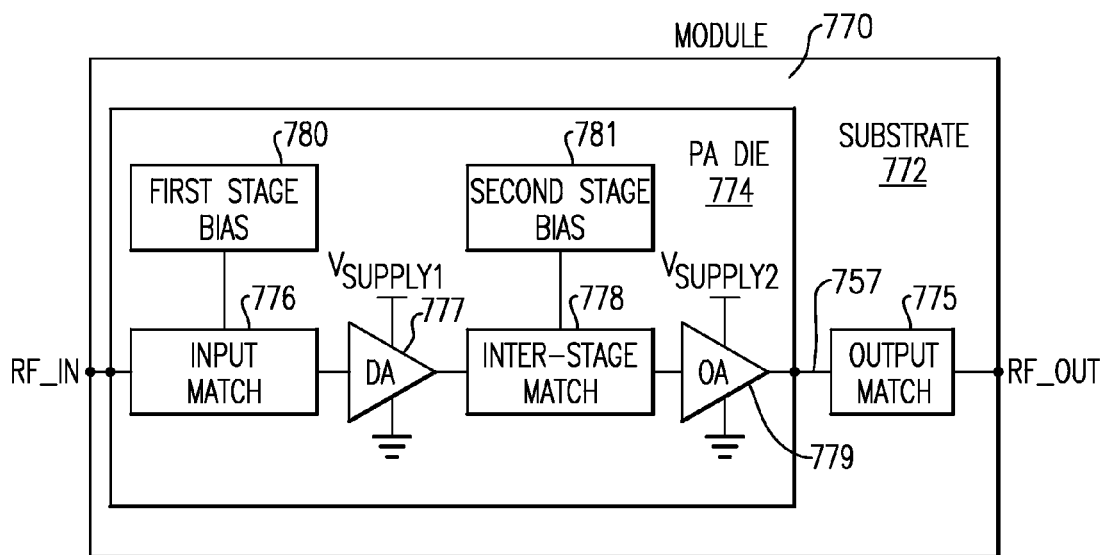
Figure 73:
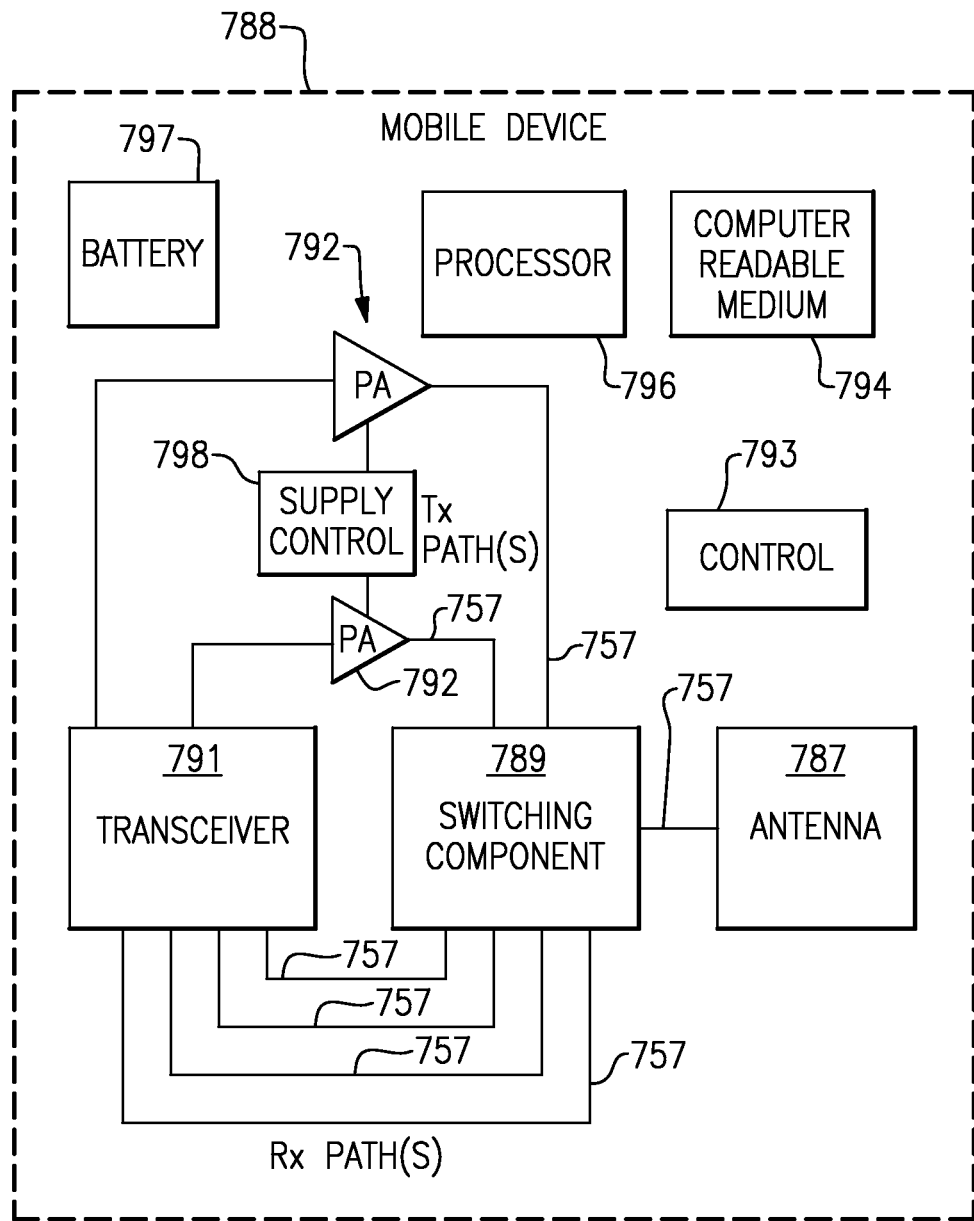
Figure 74A:
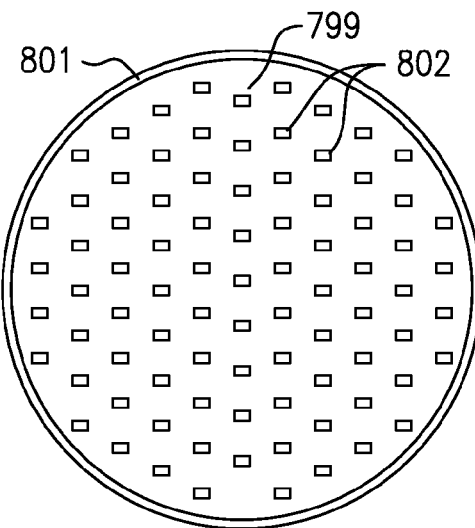
Figure 74B:
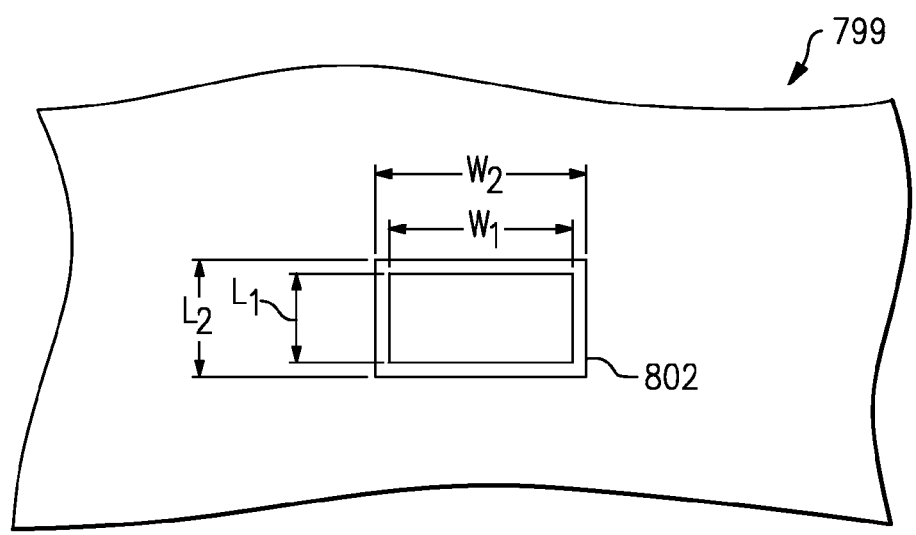
Figure 75A:
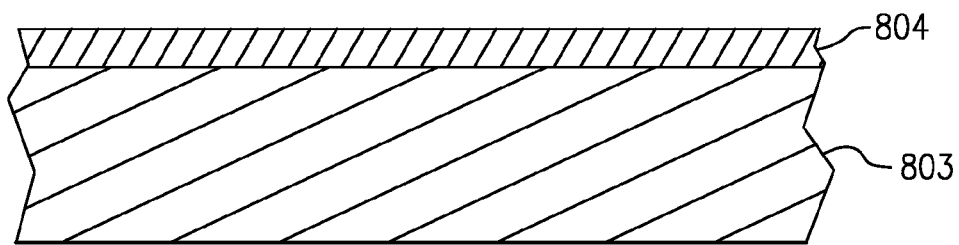
Figure 75B:
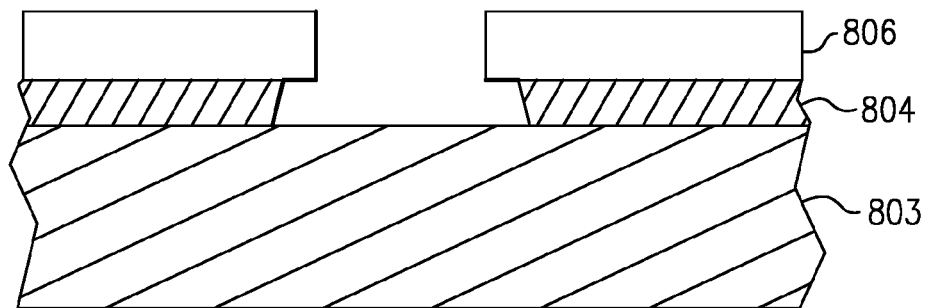
Figure 75C:
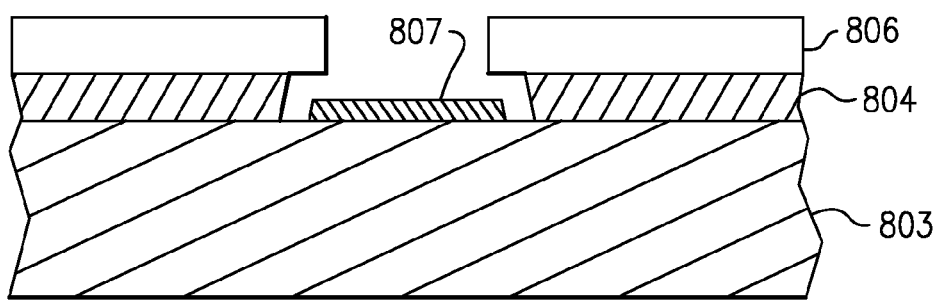
Figure 75D:
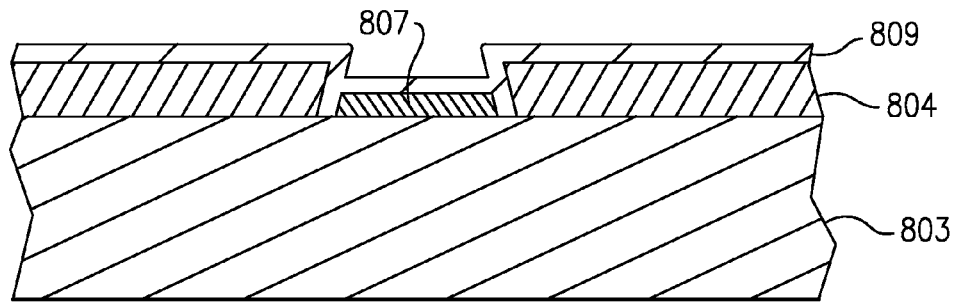
Figure 75E:
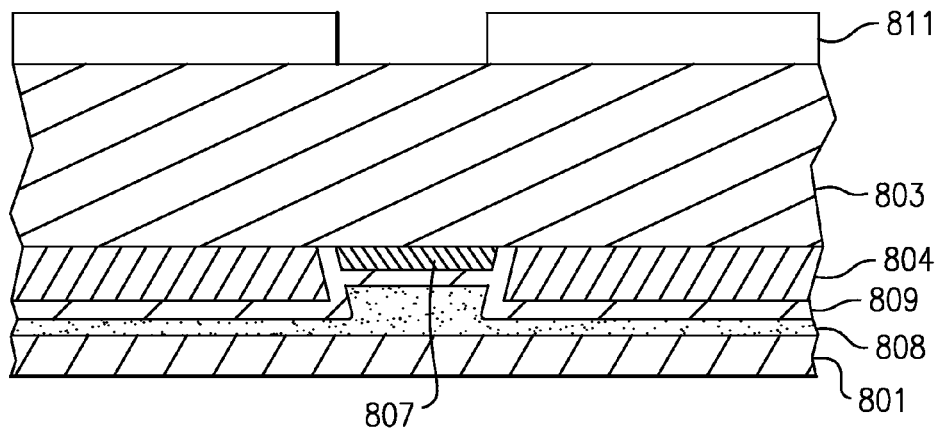
Figure 75F:
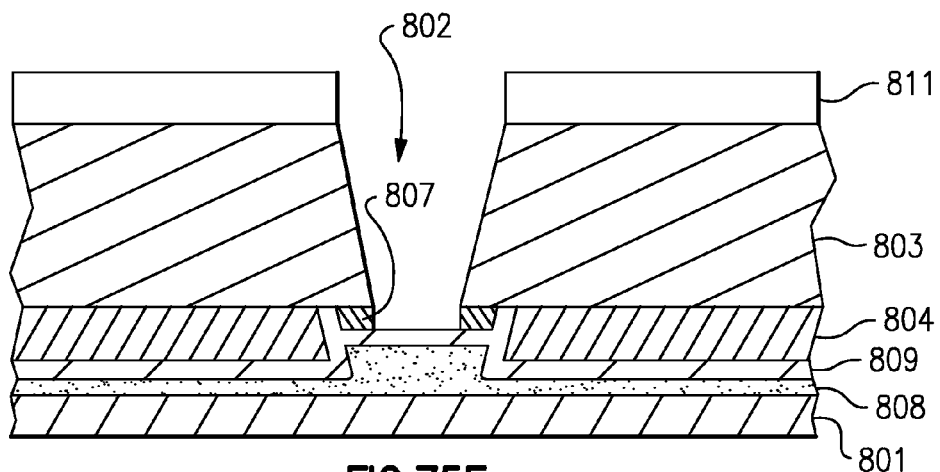
Figure 75G:
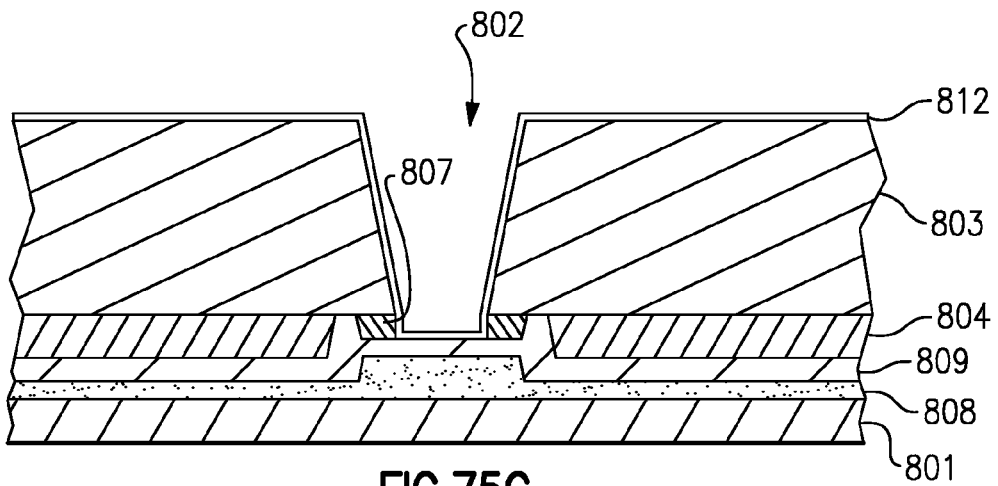
Figure 75H:
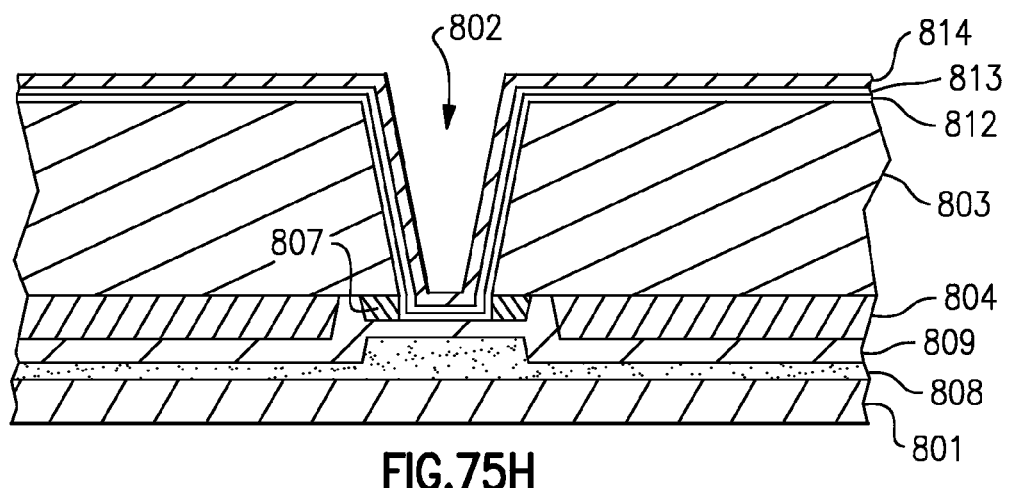
Figure 75I:
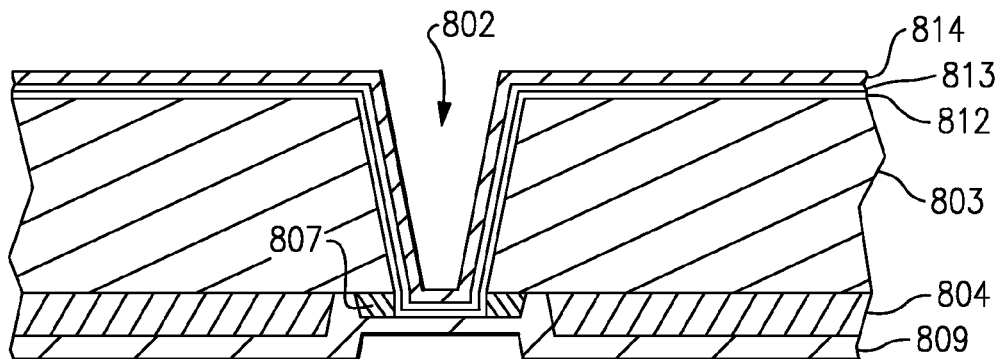
Figure 76A:
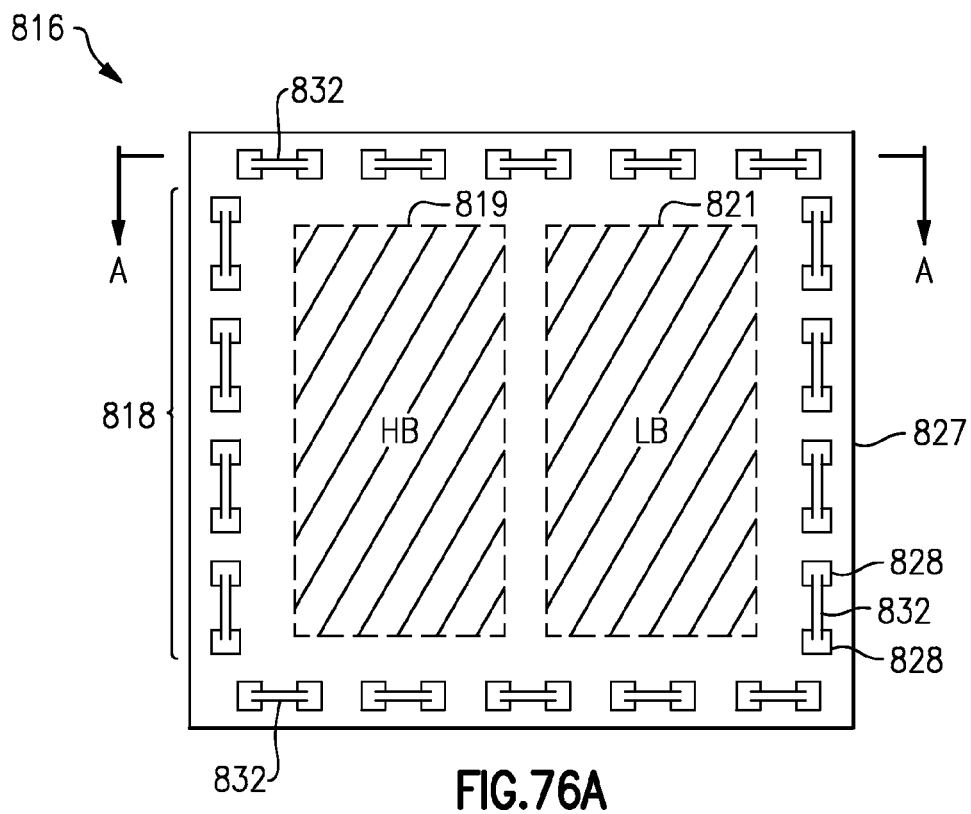
Figure 76B:
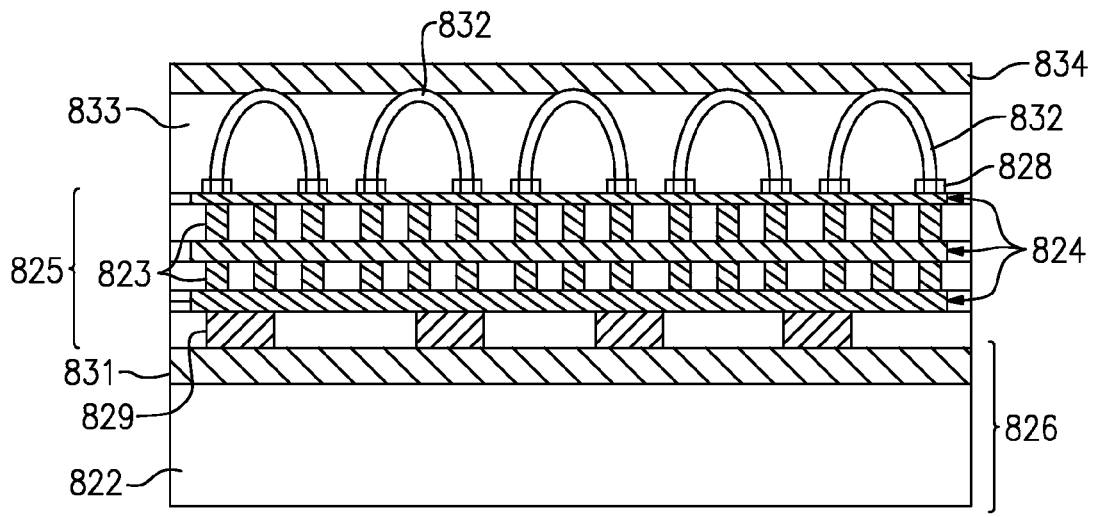
Figure 77:
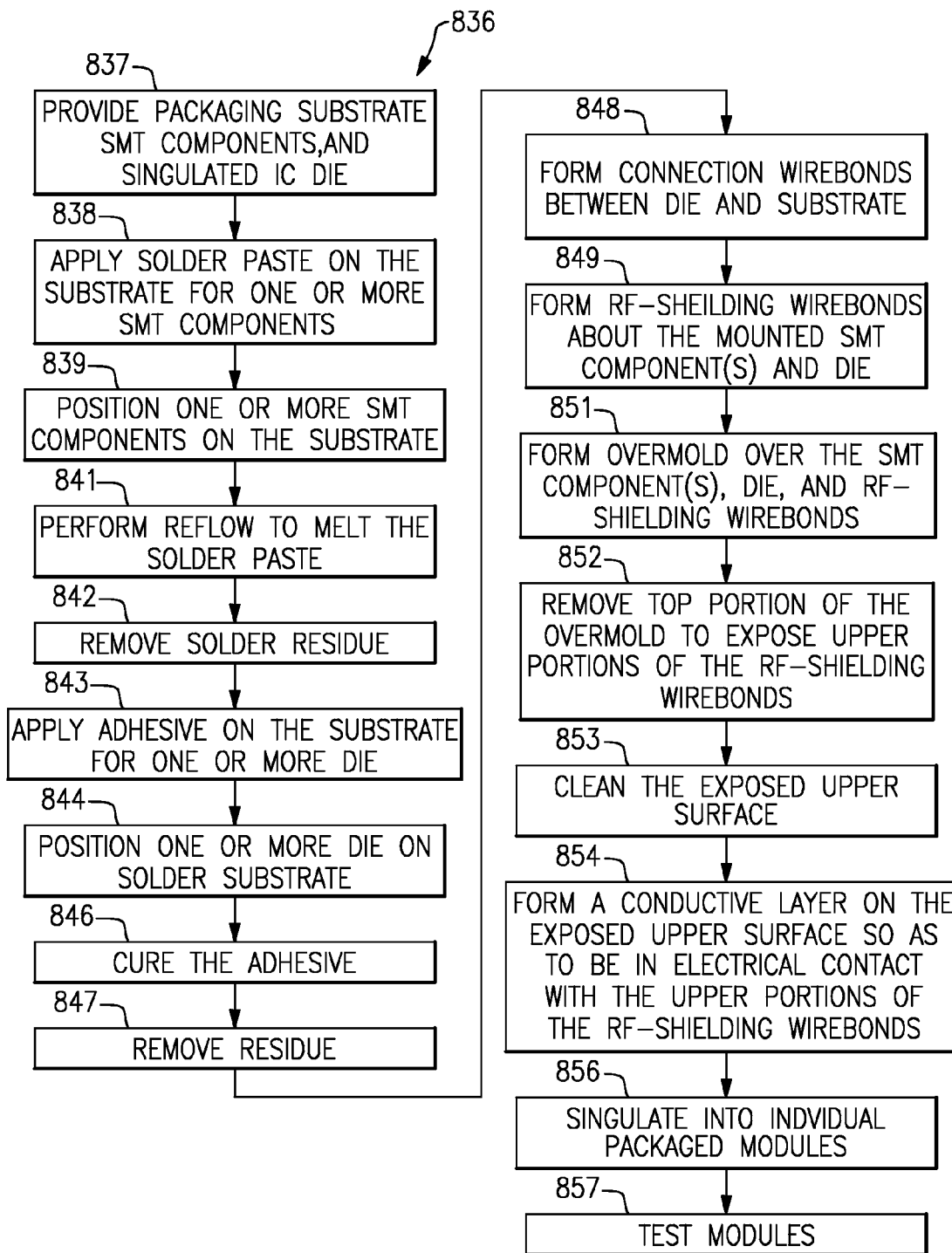
Figure 78A:
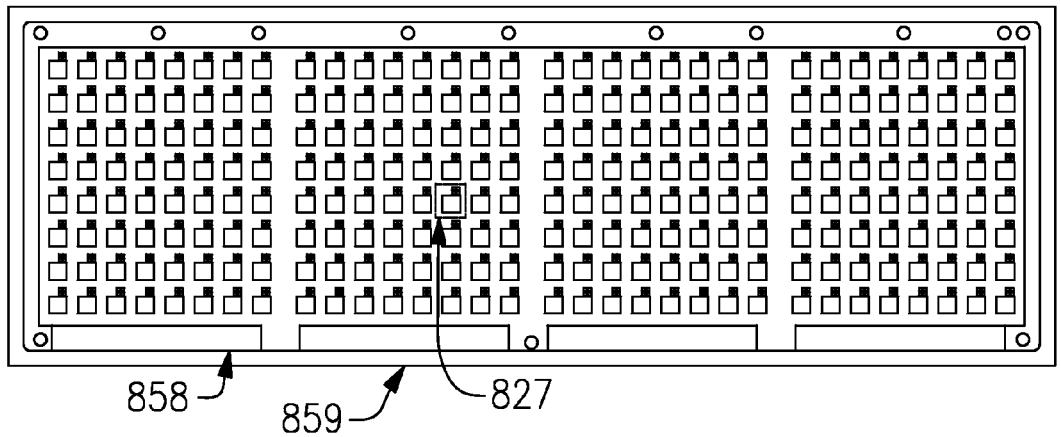
Figure 78B:
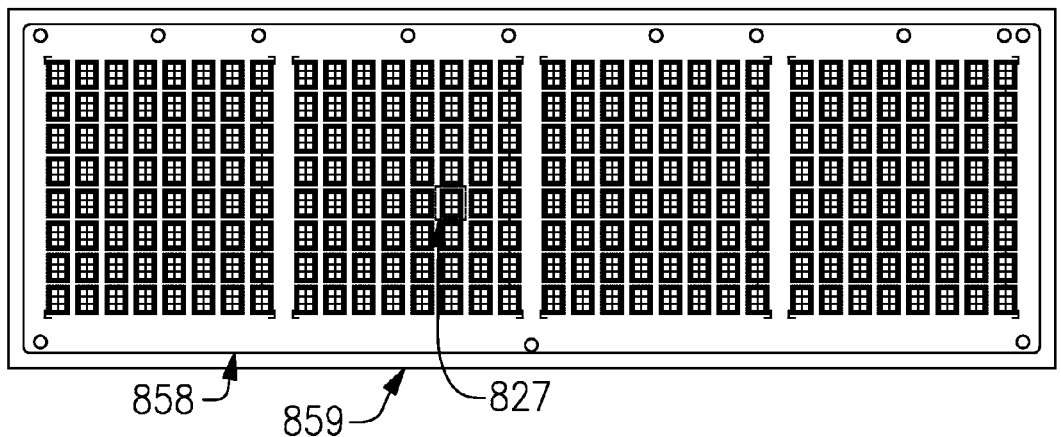
Figure 79A:
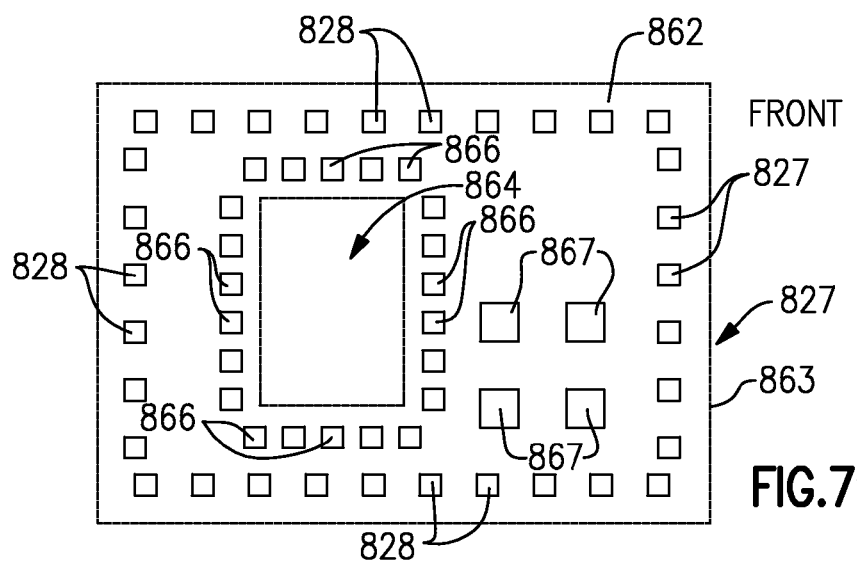
Figure 79B:
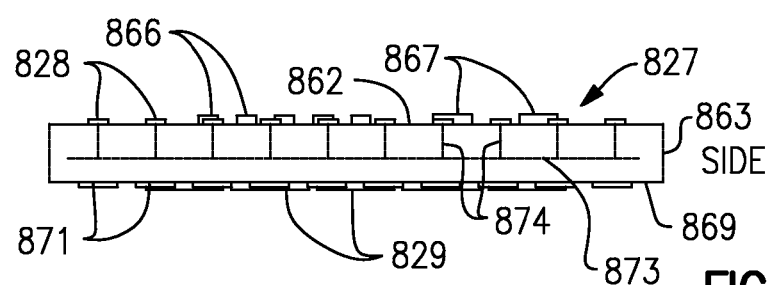
Figure 79C:
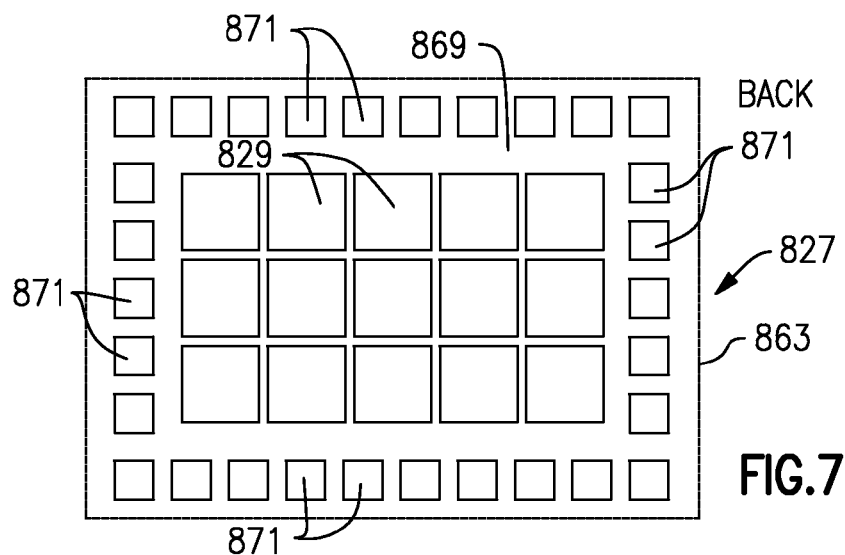
Figure 80:
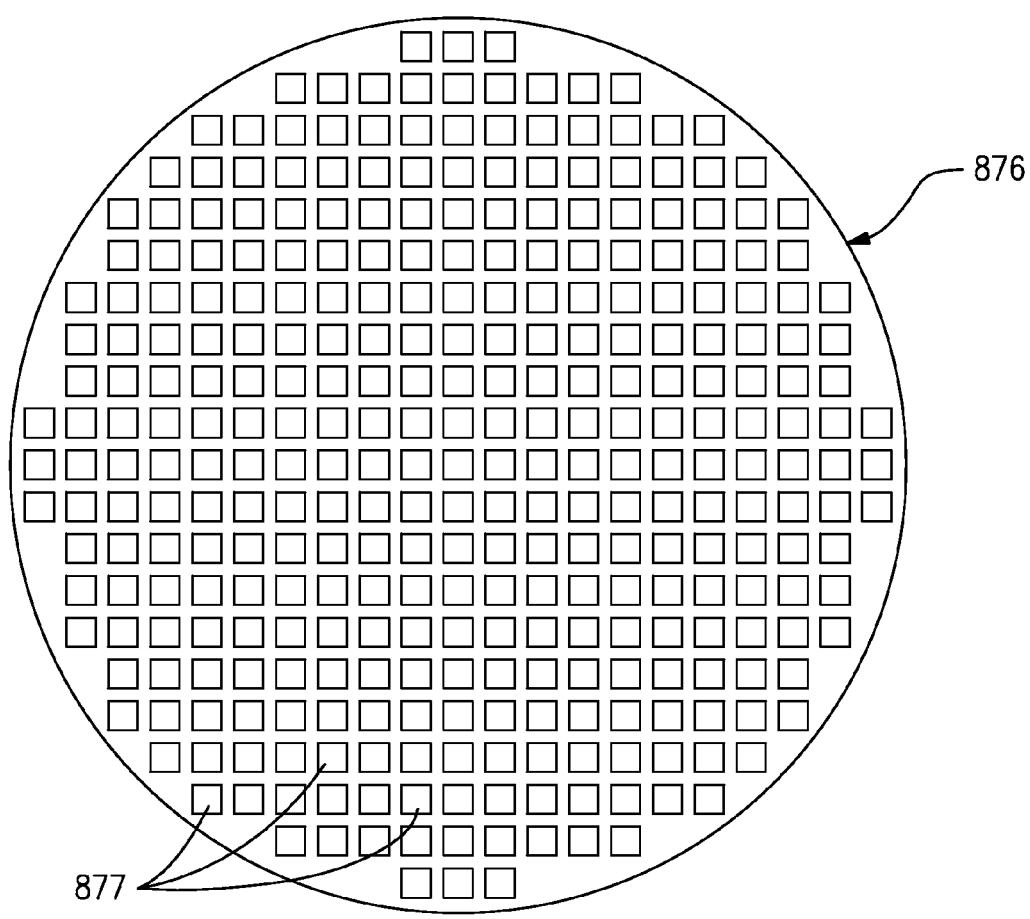
Figure 81:
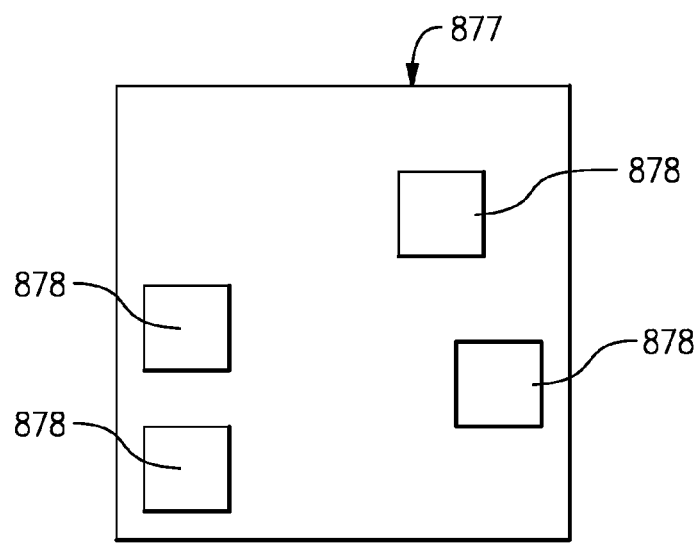
Figure 82A:
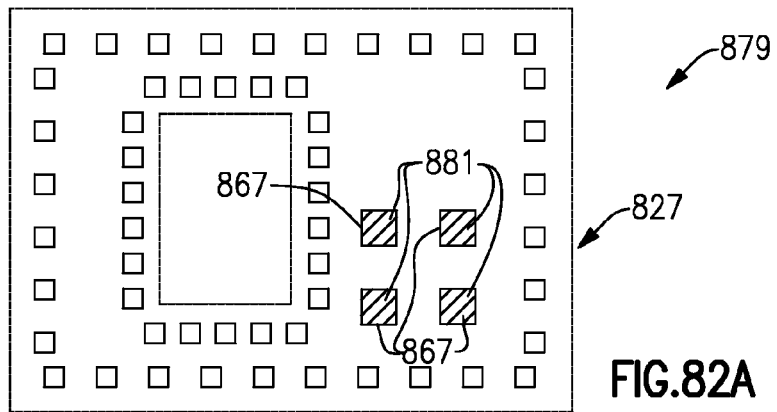
Figure 82B:
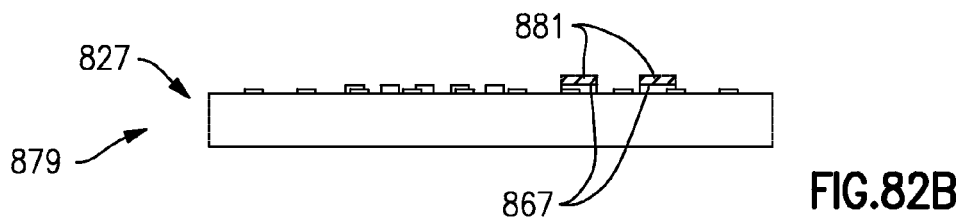
Figure 83A:
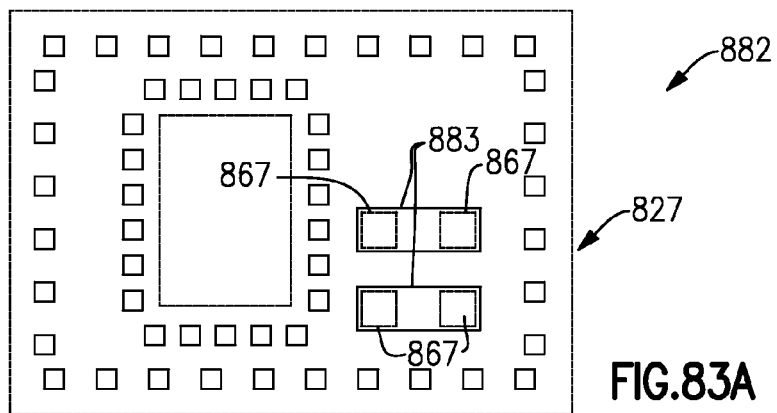
Figure 83B:
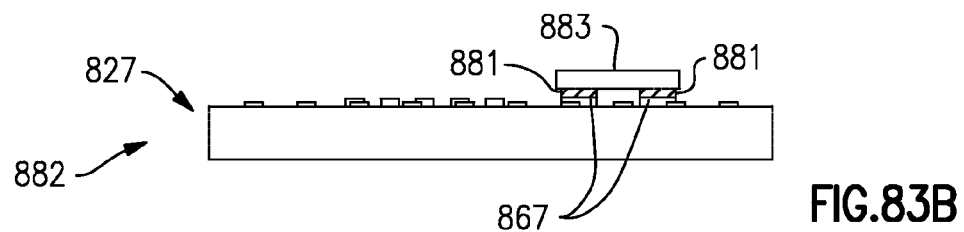
Figure 84A:
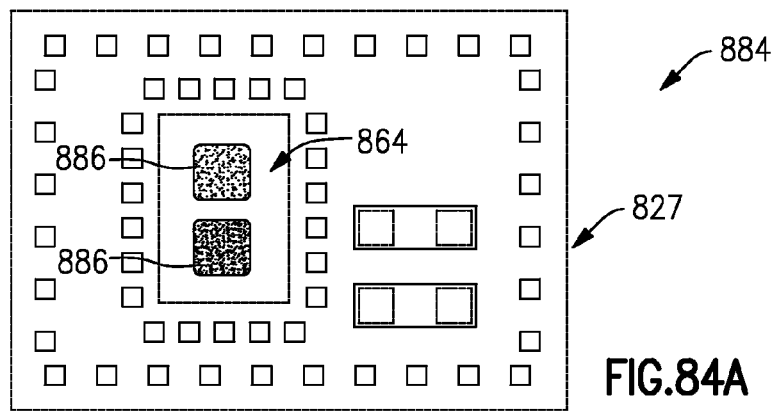
Figure 84B:
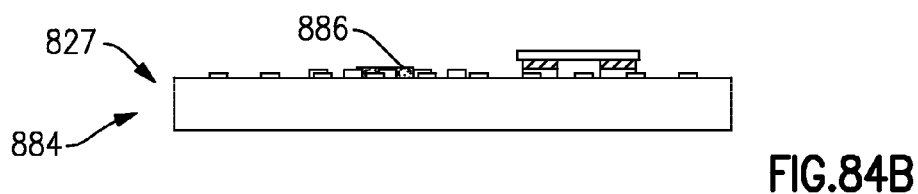
Figure 85A:
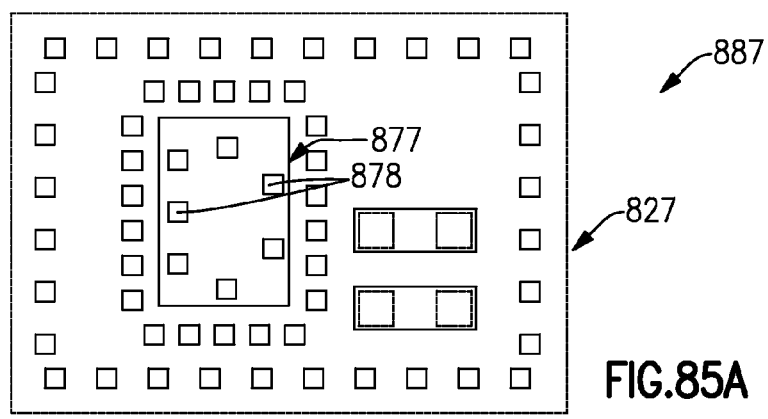
Figure 85B:
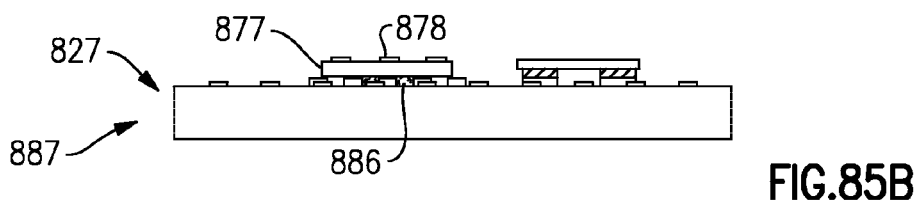
Figure 86A:
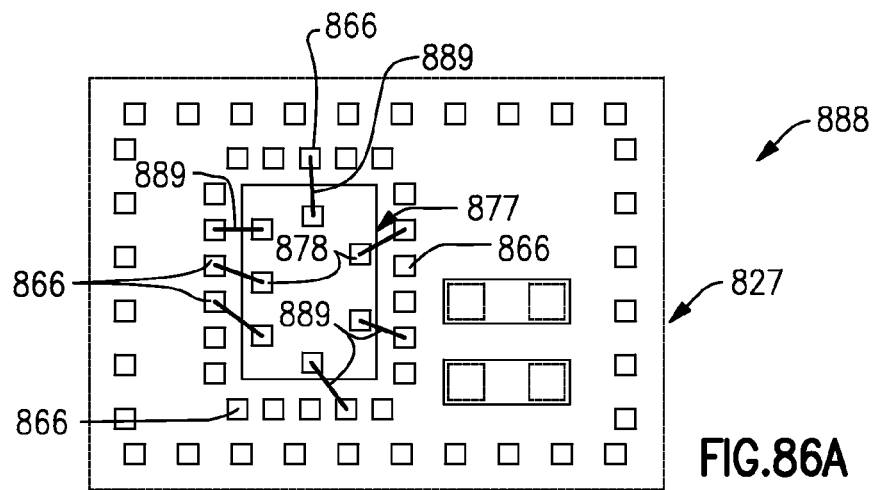
Figure 86B:
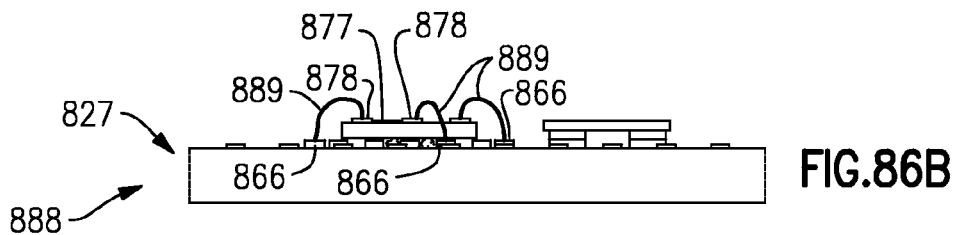
Figure 87A:
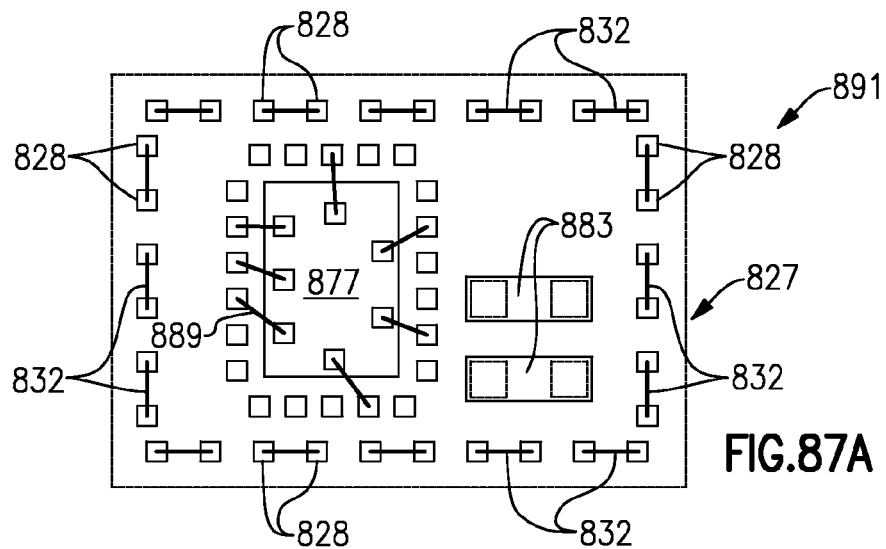
Figure 87B:
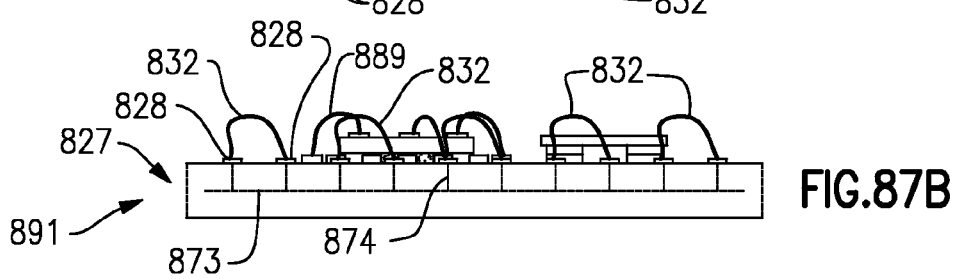
Figure 88:
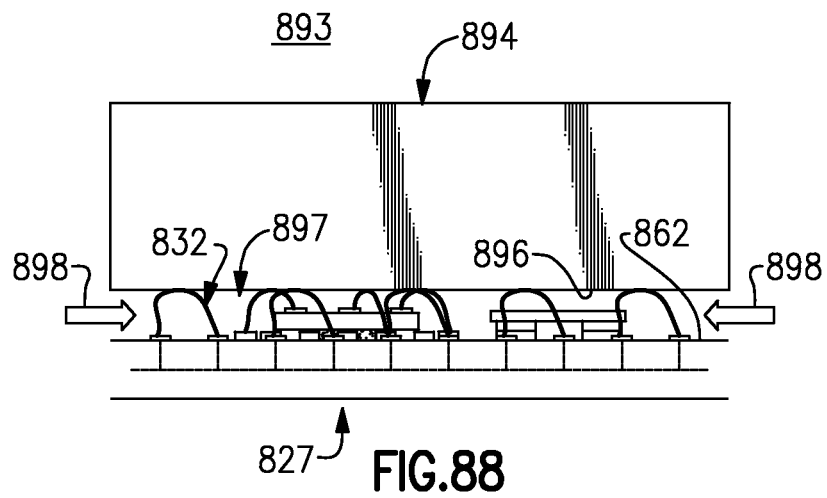
Figure 89:
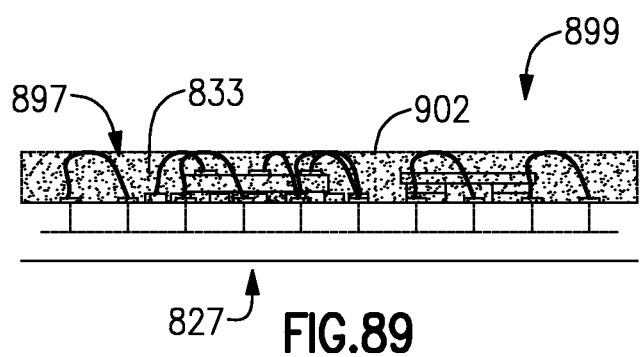
Figure 90:
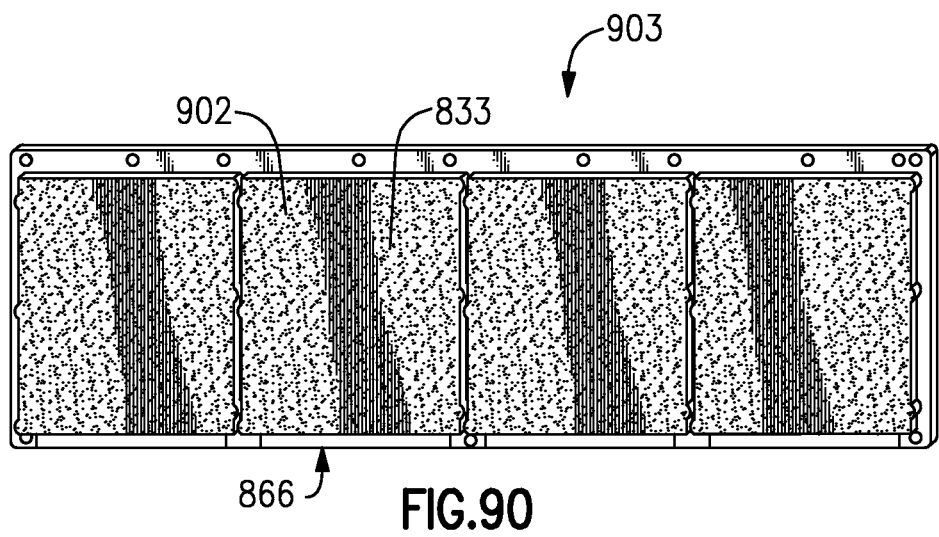
Figure 91:
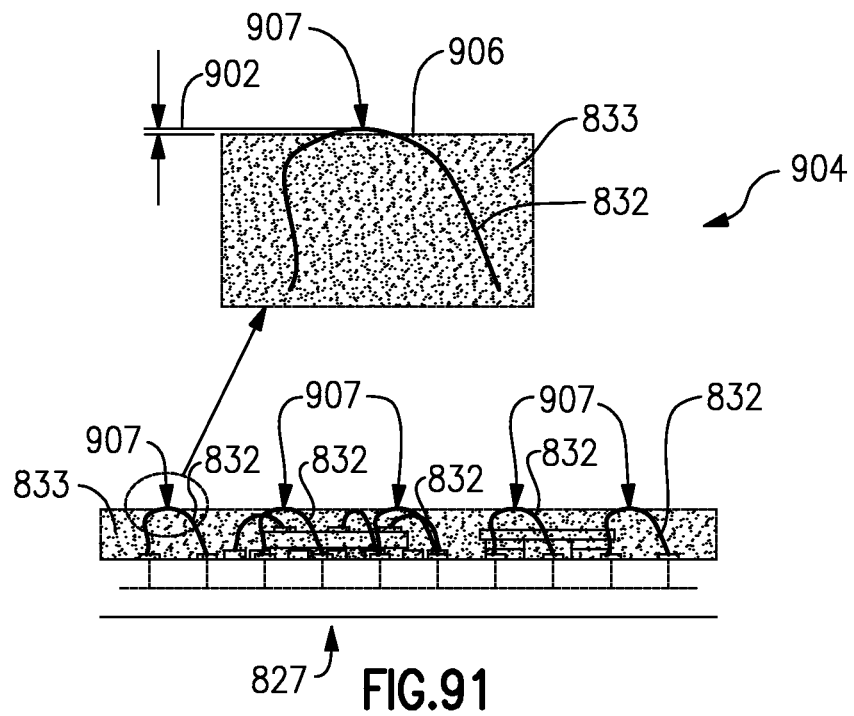
Figure 92A:
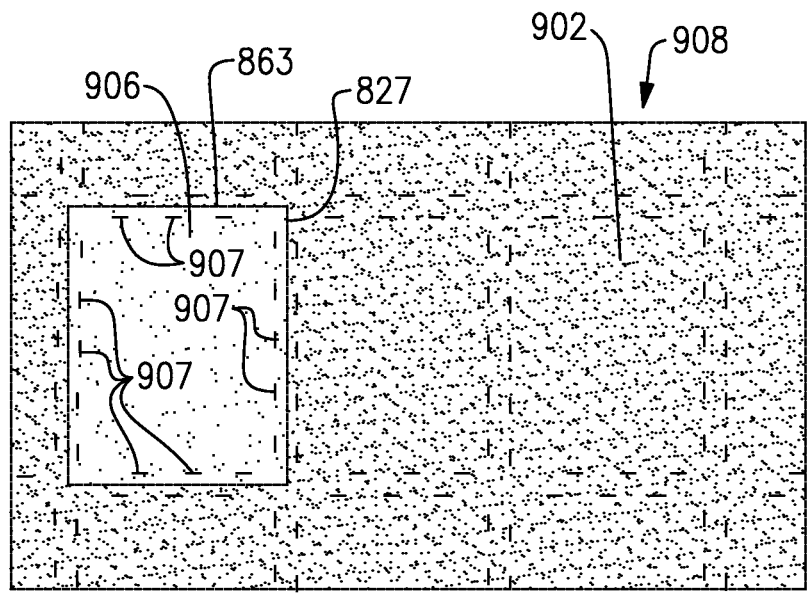
Figure 95:
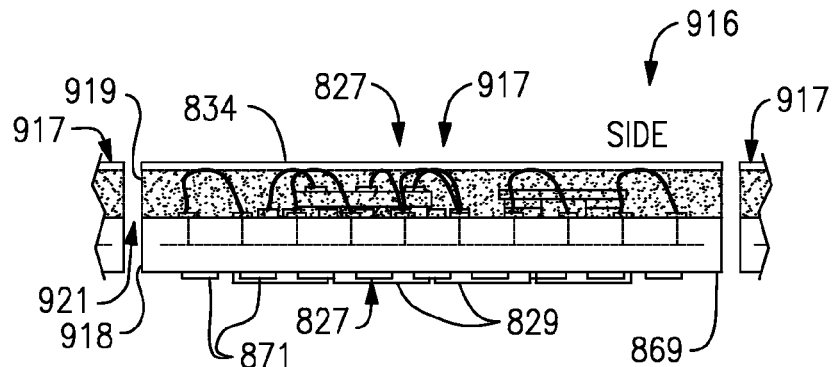
Figure 96A:
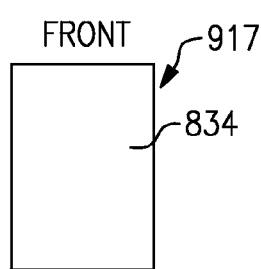
Figure 96B:
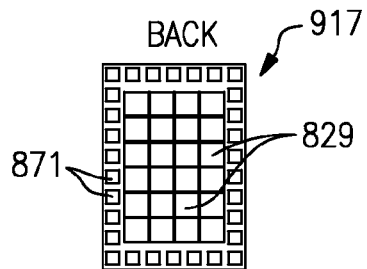
Figure 96C:
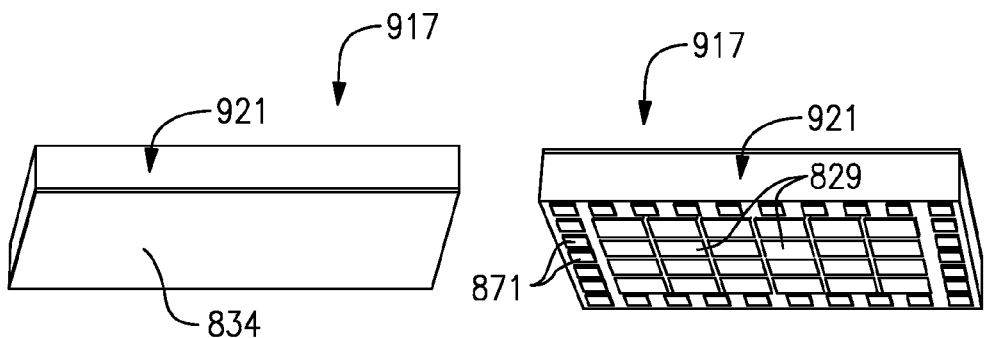
Figure 97:
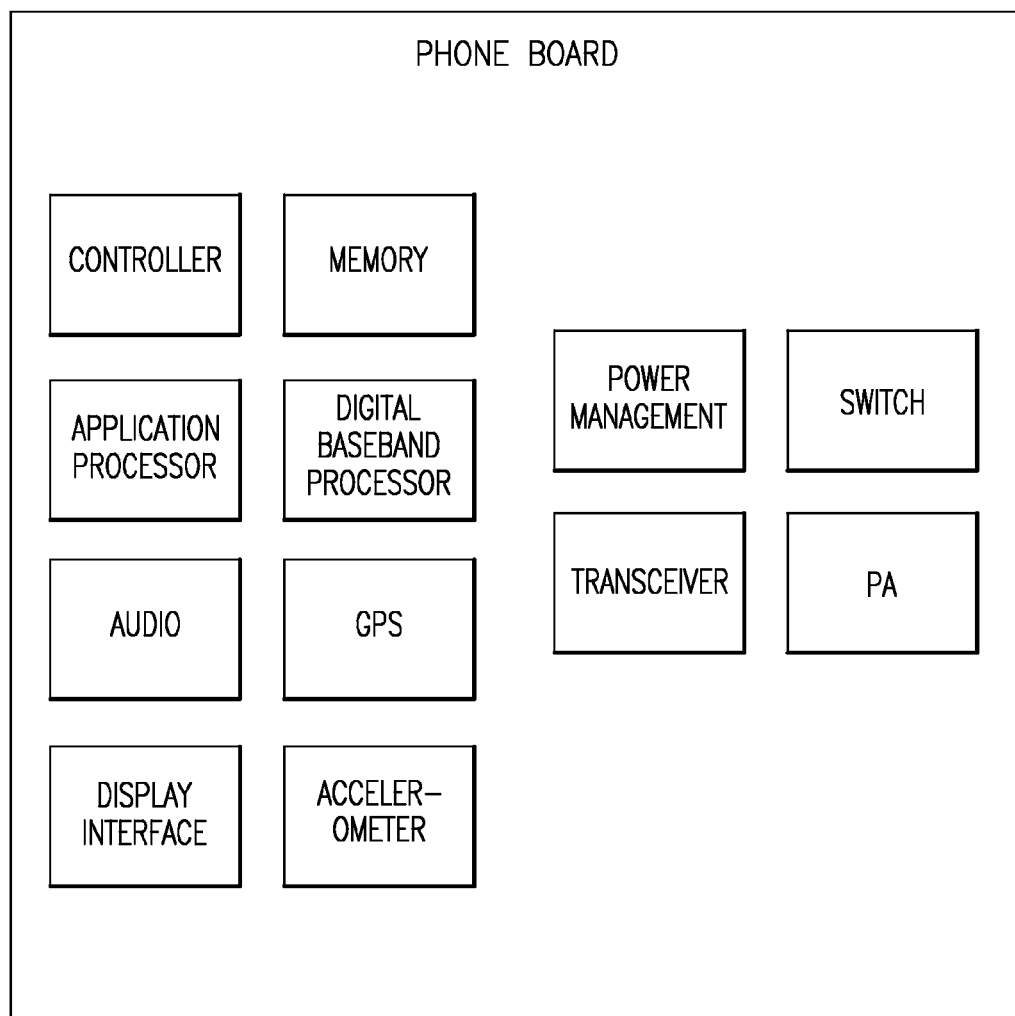
Figure 98D:
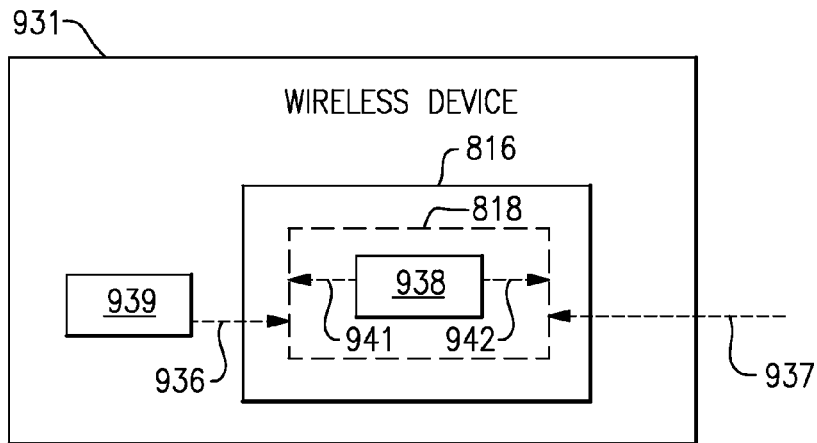
Figure 99A:
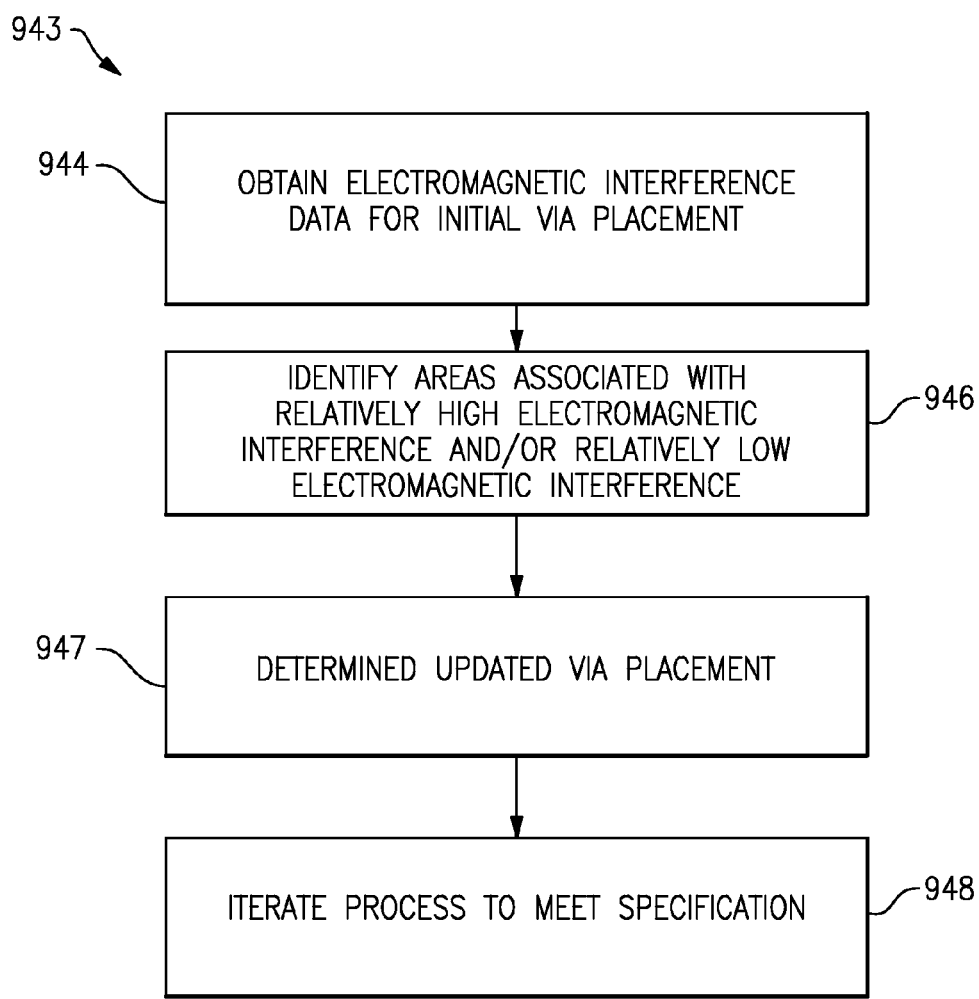
Figure 99B:
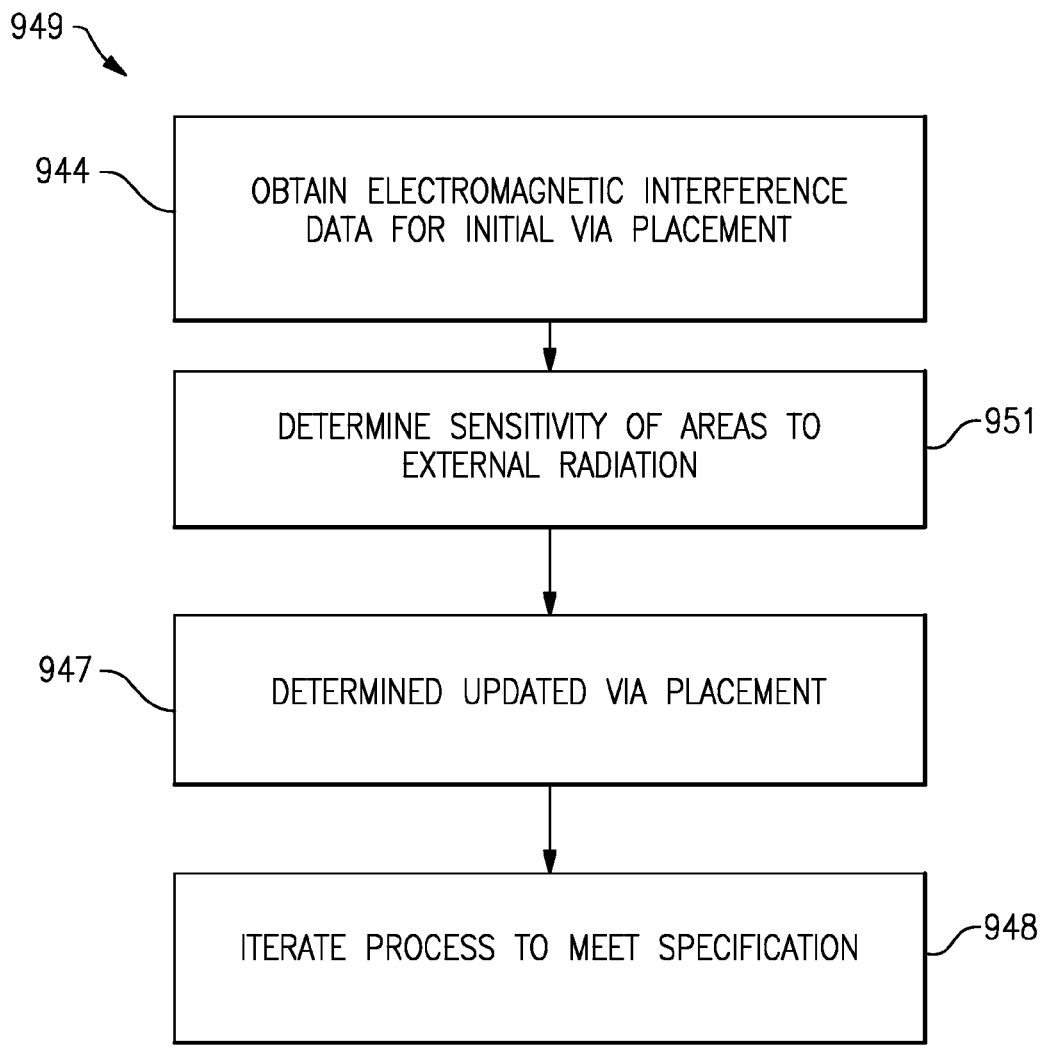
Figure 100A:
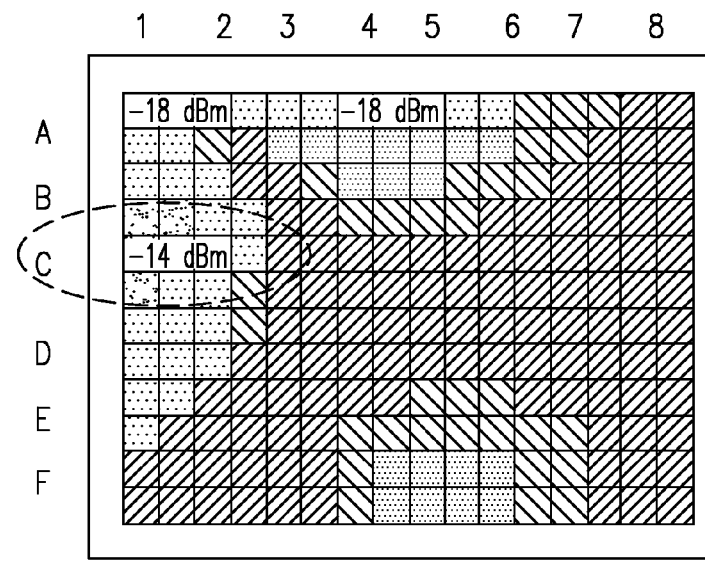
Figure 100B:
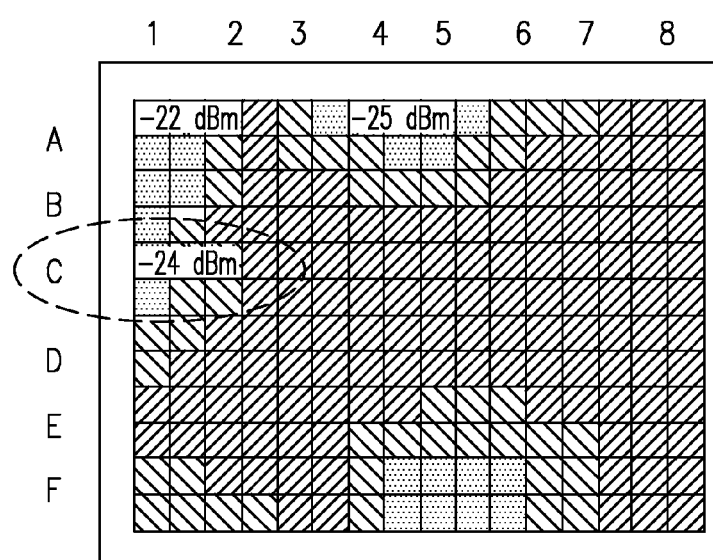
Figure 100C:
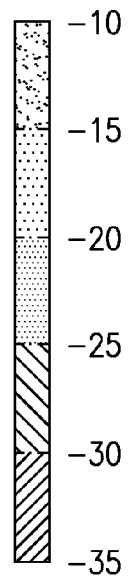
Figure 101:
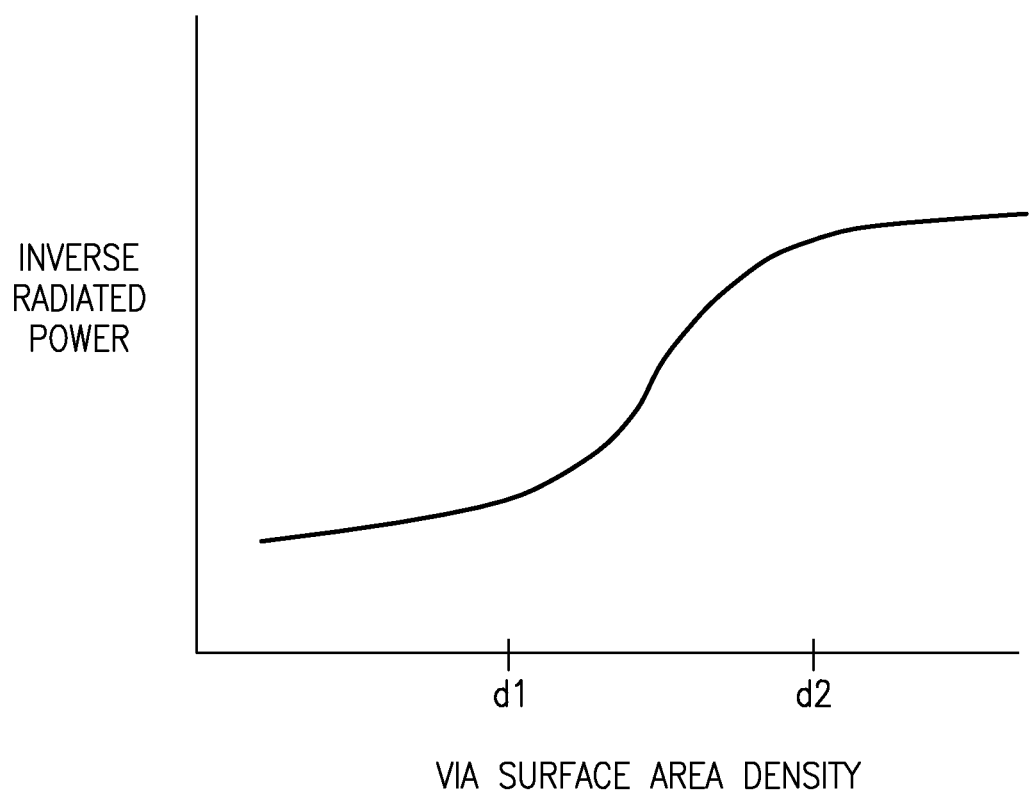
Figure 102A:
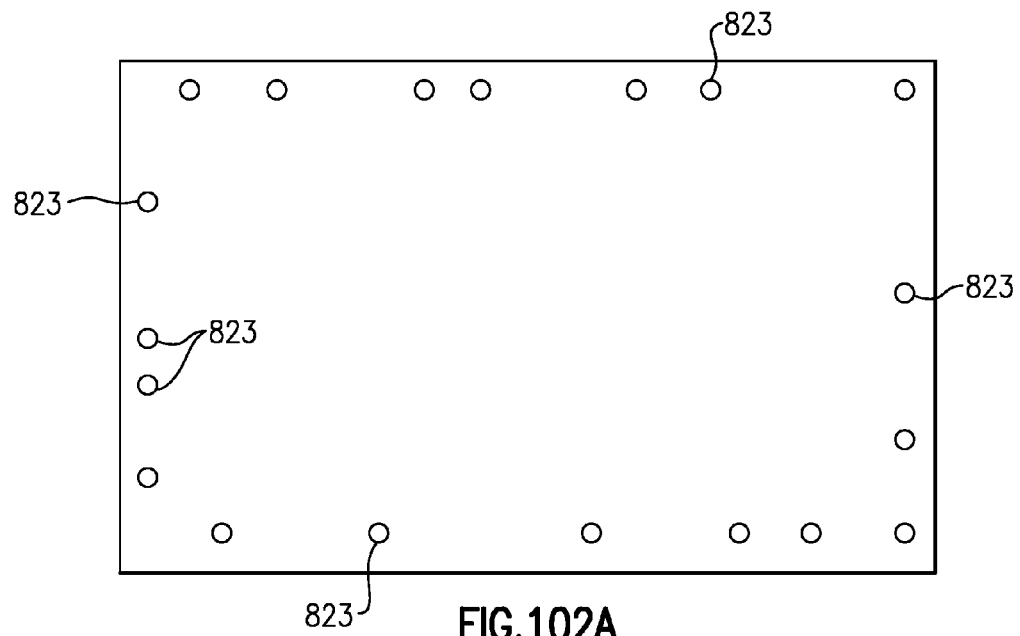
Figure 102B:
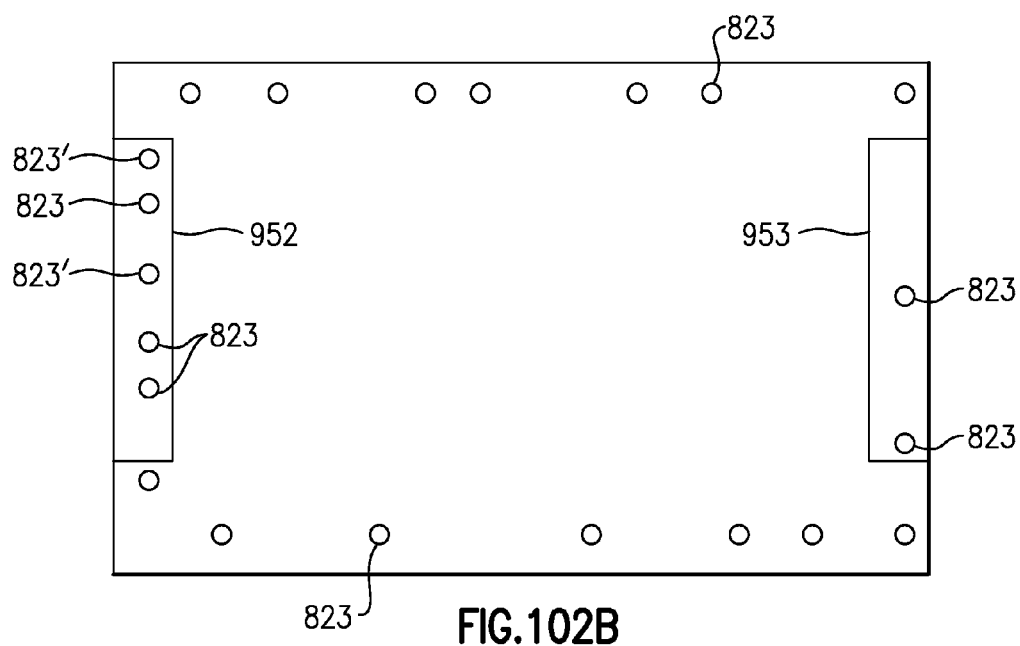
Figure 103:
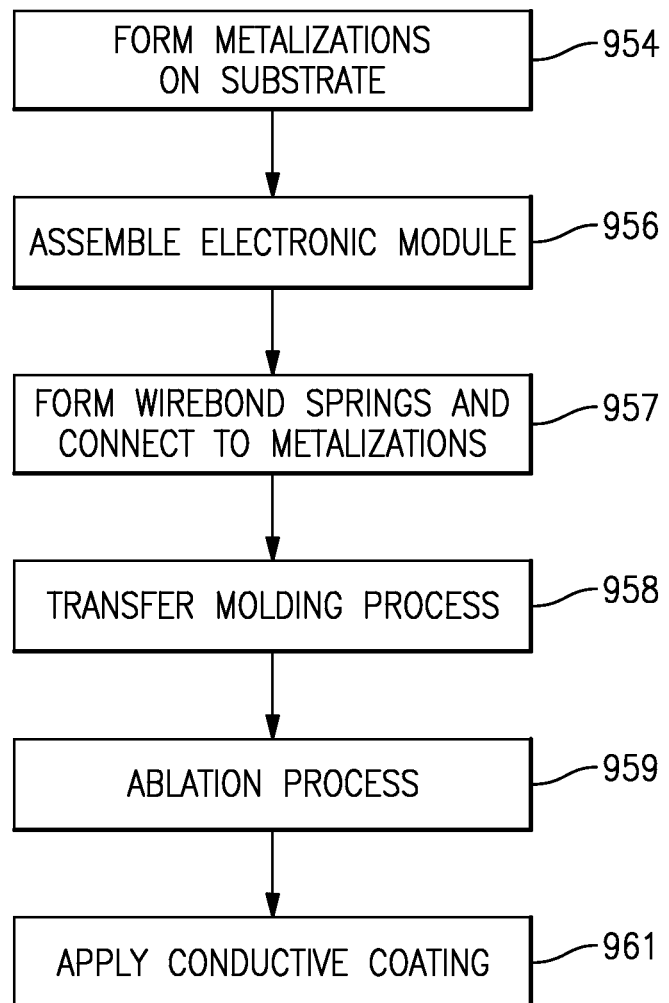
Figure 104:
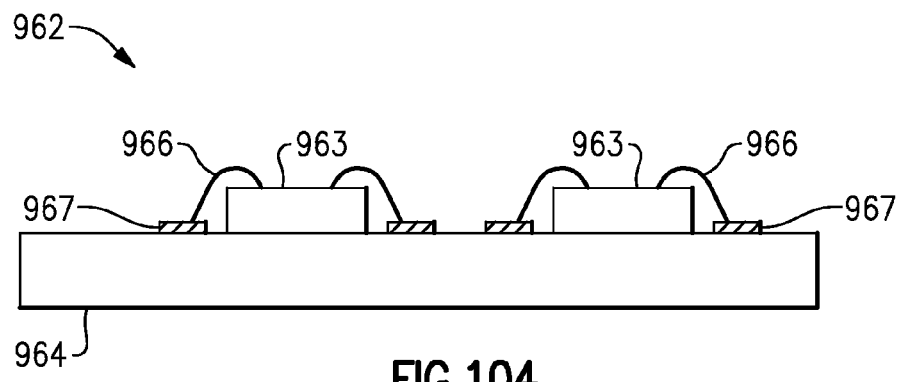
Figure 105:
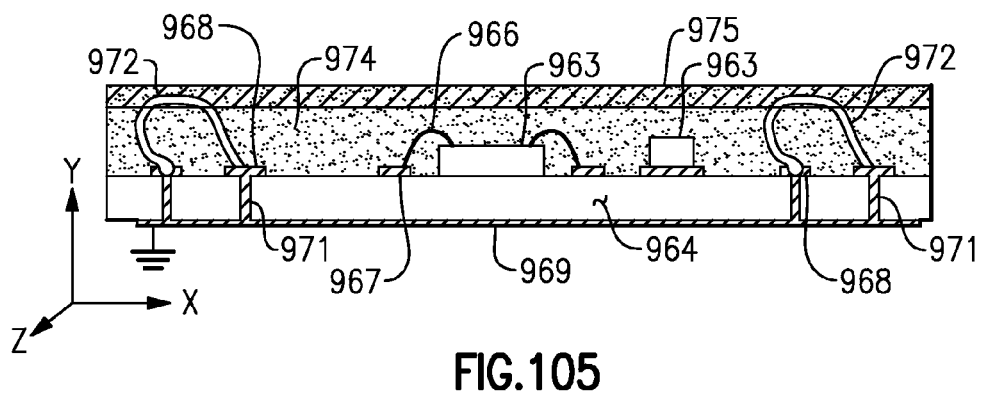
Figure 106A:
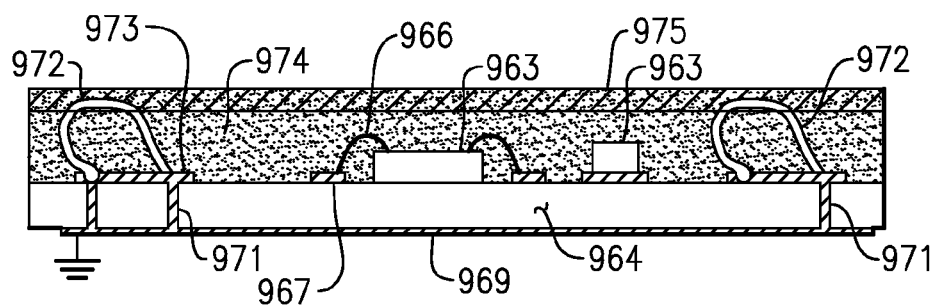
Figure 106B:
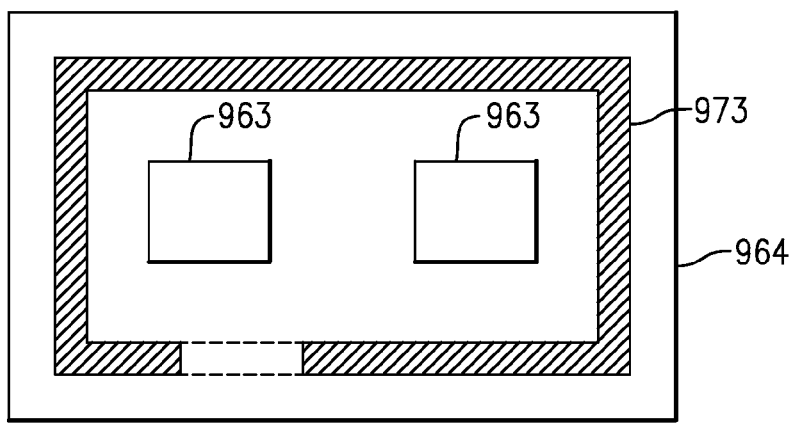
Figure 107:
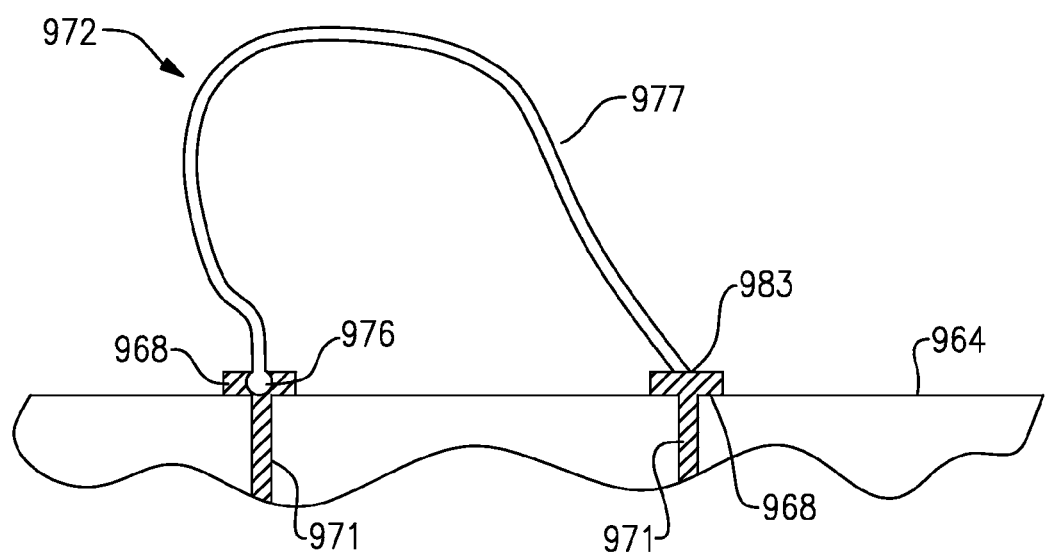
Figure 108:
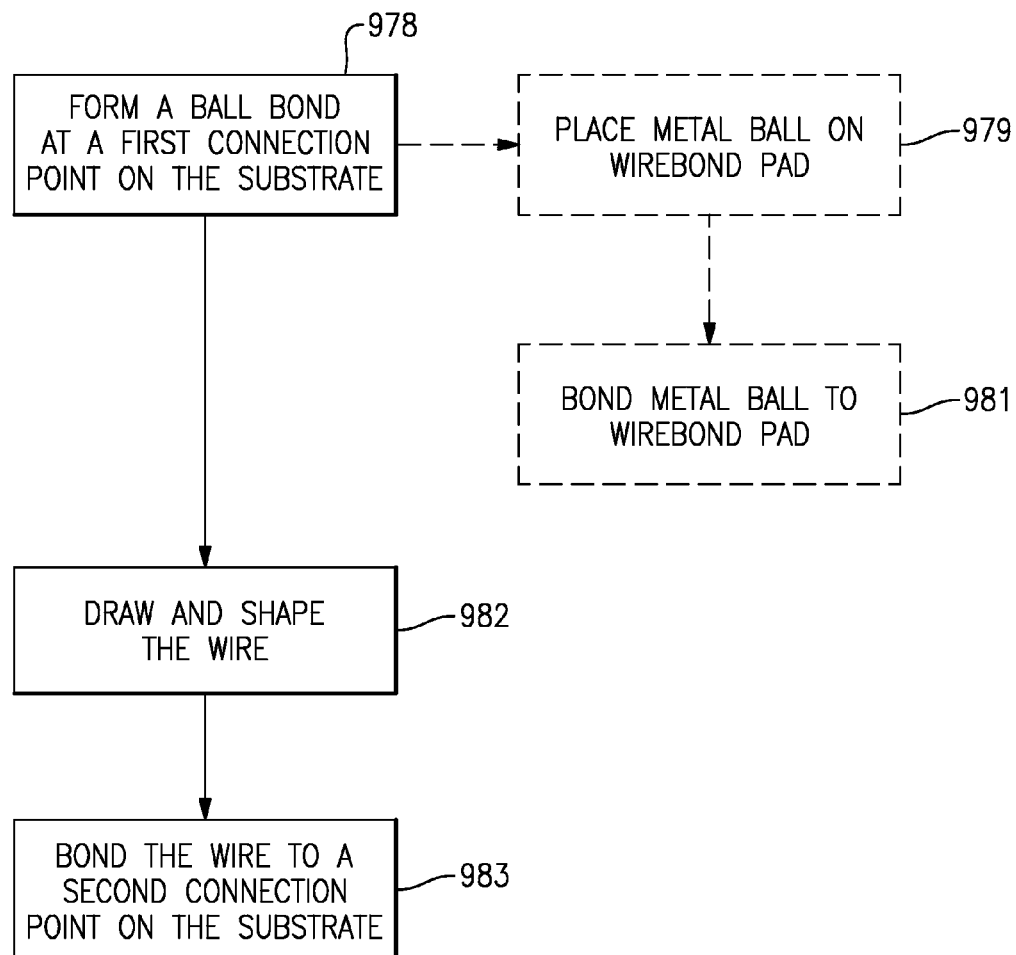
Figure 109:
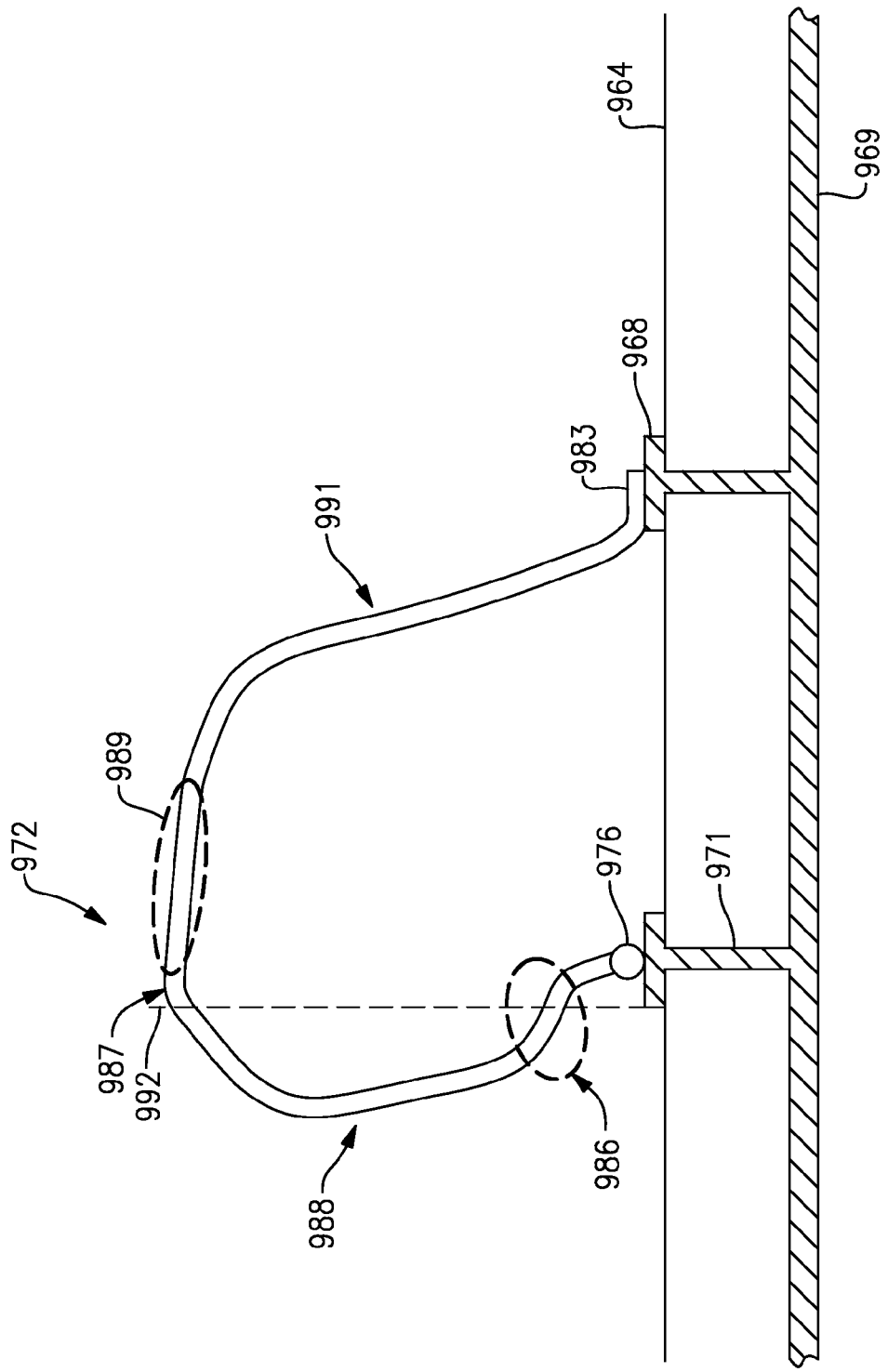
Figure 110:
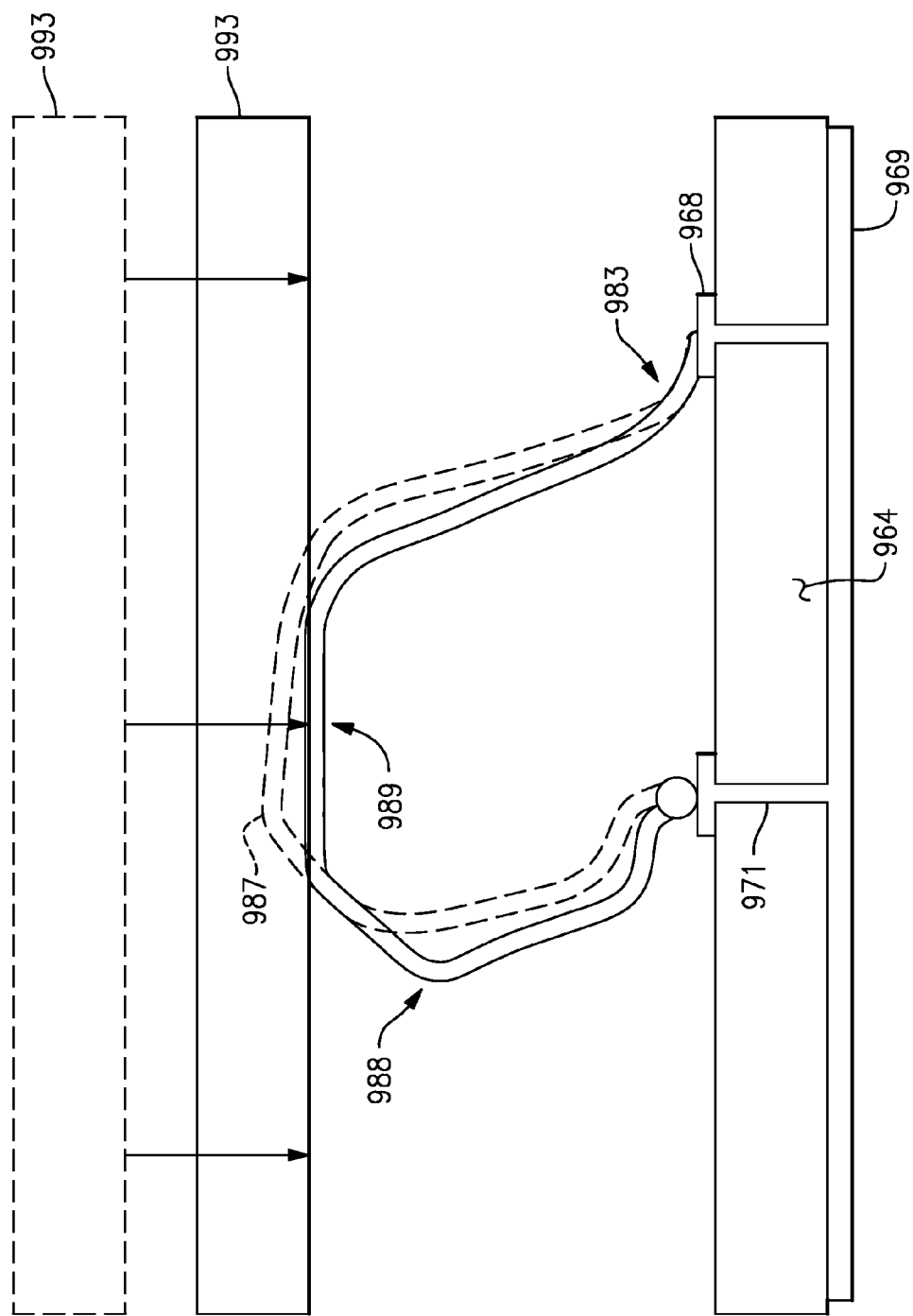
Figure 111:
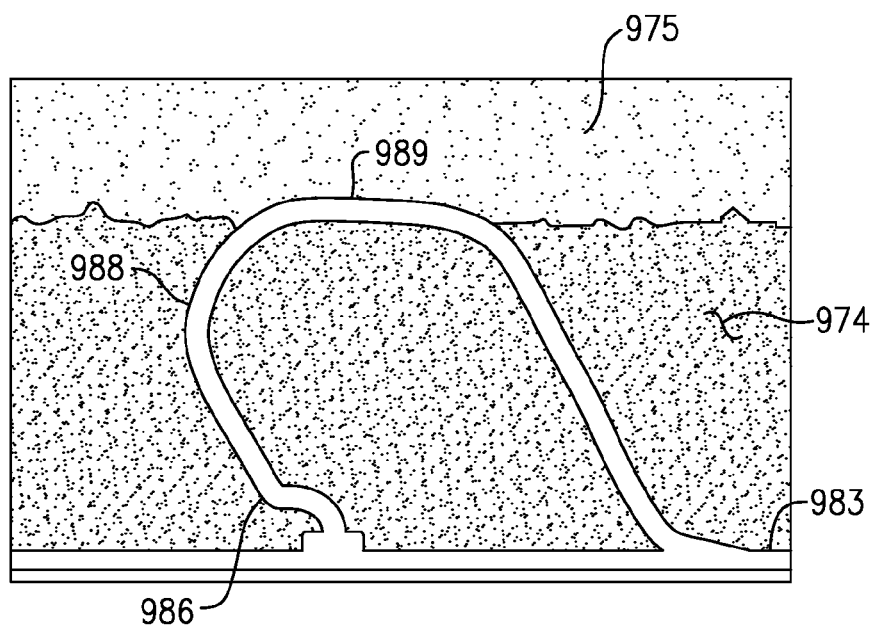
Figure 112:
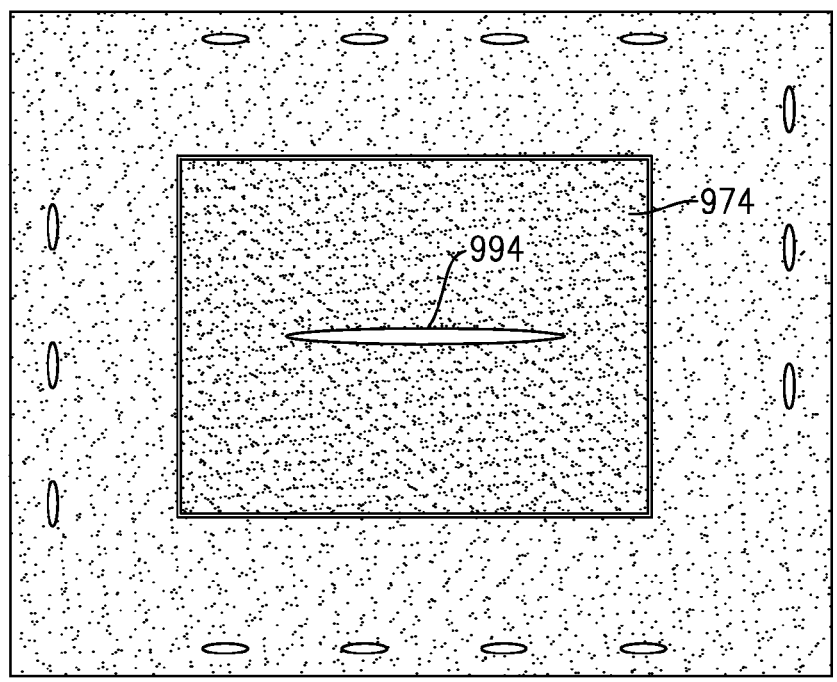

FIG. 6 presents a flow chart for an exemplary process for forming Ni/Pd/Au wire bond pads in accordance with certain embodiments hereof;

FIG. 7 illustrates a cross-section of a Ni/Pd/Au wire bond pad on the RFIC module of FIG. 5 according to an embodiment hereof;

FIG. 8 is a graph comparing the RF losses for traces with edge/sidewall exposed surfaces and edge/sidewall plated surfaces;

FIGS. 9A, 9B, 9C, 9D, 9E, and 9F illustrate exemplary layouts for wire-bonding areas having minimized edges and sidewalls exposed to plating;

FIG. 10 shows an enlarged portion of an RFIC module having an RFIC with an on-die passive device according to an embodiment hereof;

FIG. 11 illustrates an enlarged portion of an RFIC module having an RFIC with an on-die passive device according to another embodiment of this invention;

FIG. 12A depicts an illustrative cross section of a bipolar transistor according to a particular embodiment of the present invention;

FIG. 12B is a graph of example doping concentrations of portions of the bipolar transistor of FIG. 12A;

FIG. 12C is a legend illustrating example materials corresponding to portions of the bipolar transistor of FIG. 12A;

FIG. 13 is a graph that illustrates relationships between breakdown voltage and current density for the bipolar transistor of FIG. 12A and a state of the art bipolar transistor;

FIG. 14A shows an illustrative cross section of a bipolar transistor according to another embodiment of this invention;

FIG. 14B is a graph of example doping concentrations of portions of the bipolar transistor of FIG. 14A;

FIG. 14C is a legend showing example materials corresponding to portions of the bipolar transistor of FIG. 14A;

FIG. 14D depicts an illustrative cross section of a bipolar transistor according to another embodiment hereof;

FIG. 14E is a graph of example doping concentrations of portions of the bipolar transistor of FIG. 14D;

FIG. 14F is a legend illustrating example materials corresponding to portions of the bipolar transistor of FIG. 14D;

FIG. 15 is an illustrative process flow diagram for making a bipolar transistor according to an embodiment of a method of this invention;

FIG. 16 is a block diagram of one embodiment of a power amplifier module that includes a bipolar transistor with one or more features described herein;

FIG. 17 is an illustrative block diagram of one particular wireless device according to this invention that includes the power amplifier module of FIG. 16;

FIG. 18 is a block diagram of another embodiment of a wireless device in accordance with certain aspects of the present invention;

FIG. 19 illustrates an embodiment of a digital control interface implemented according to certain aspects of this invention;

FIG. 20 is a schematic diagram of an embodiment of a level shifter implemented in accordance with the present invention;

FIG. 21 is a flowchart of a process for operation of a digital control interface in accordance with aspects of this invention;

FIG. 22 is a block diagram of a further embodiment of a wireless device according to certain aspects hereof;

FIG. 23 illustrates another embodiment of the present digital control interface in accordance with certain other aspects of this invention;

FIG. 24 is a schematic diagram of an embodiment of a combinational logic block according to the present invention as implemented in the digital control interface for FIG. 23;

FIG. 25 presents yet another embodiment of the digital control interface hereof implemented in accordance with an additional level shift function;

FIG. 26 is another embodiment of the present combinational logic block implemented in the digital control interface of FIG. 25;

FIG. 27 is a diagrammatic representation of a semiconductor die including an integrated circuit, die dependent components, and a bias circuit according to one embodiment of this invention;

FIG. 28 represents a two-die configuration of the assembly of FIG. 27;

FIG. 29 shows a two-die configuration utilizing an HBT die and an Si die;

FIG. 30 is a schematic representation of a power amplifier circuit according to the present invention;

FIG. 31 is a schematic and block diagram of one specific configuration of a power amplifier circuit including a resistance for generating bias signals in accordance with the present invention;

FIGS. 32, 33, and 34 are graphs showing how the resistance of FIG. 31 correlates with a beta parameter and temperature;

FIG. 35 shows an example of a V-I circuit that is employed to generate a compensated control signal according to the present invention;

FIG. 36 is a graph illustrating different plots of output voltage versus temperature for different Vbatt settings for the V-I circuit of FIG. 35;

FIGS. 37A and 37B show plots of quiescent currents for first and second stages of an uncompensated power amplifier example versus temperature;

FIGS. 38A and 38B are plots of quiescent currents for first and second stages of the compensated power amplifier hereof versus temperature;

FIG. 39 shows plots of calculated gain versus power output at different example temperatures;

FIG. 40 presents plots of gain versus power output for the different combinations of varied parameters described in reference to FIGS. 38A and 38B;

FIG. 41A is a plan view of a power amplifier module implemented according to another specific embodiment of this invention;

FIG. 41B is a side view of power amplifier module of FIG. 41A;

FIG. 42 schematically depicts an example of a particular embodiment of a wireless device implemented according to certain aspects of the present invention;

FIG. 43 is a diagram illustrating a cross-sectional view of a structure including an BiFET exemplified by the present invention;

FIG. 44 is a diagram showing a cross-sectional view of an alternative embodiment of the structure of FIG. 43;

FIG. 45 shows steps of a process according to the present invention that can be implemented to fabricate the structure of FIG. 43;

FIG. 46 presents process steps hereof that can be implemented to fabricate the structure of FIG. 44;

FIG. 47 shows process steps of one embodiment of this invention that can be implemented to fabricate the HBTs of FIGS. 43 and 44;

FIG. 48 shows steps of a process hereof that can be implemented to fabricate the FET of FIG. 43 and the first FET of FIG. 44;

FIG. 49 shows process steps according to aspects of this invention that can be implemented to fabricate the second FET of FIG. 44;

FIG. 50 is a block diagram showing that for some embodiments hereof, a semiconductor die having a circuit such as a power amplifier (PA) circuit can include a BiFET device having one or more features as described herein;

FIG. 51 is a block diagram that shows that in some embodiments, a semiconductor die having a PA controller and/or a switch controller circuit can include a BiFET device having one or more features as described herein;

FIG. 52 is a block diagram that shows that in some embodiments, a packaged module can include a die having one or more features as described herein;

FIG. 53 is a block diagram that shows that in some embodiments, a wireless device can include a module, such as the packaged module FIG. 52, having one or more features as described herein;

FIG. 54 schematically shows a semiconductor die having an integrated circuit;

FIG. 55 shows an example of an HBT having a stack of layers formed on a semiconductor substrate according to the present invention;

FIGS. 56A, 56B, 56C, 56D, 56E, 56F, and 56G present embodiments of semiconductor resistors that can be formed using the various layers associated with the HBT of FIG. 55;

FIGS. 56A-1, 56B-1, 56C-1, 56D-1, 56E-1, 56F-1, and 56G-1 are electrical schematic diagrams of the semiconductor resistors of FIGS. 56A, 56B, 56C, 56D, 56E, 56F, and 56G, respectively;

FIG. 57A is a side view of a semiconductor structure including a resistive region according to the present invention;

FIG. 57B is a top plan view of the structure of FIG. 57A showing the terminals of the resistive region provided therein;

FIG. 57C is a schematic representation of a resistor formed by the resistive region of FIG. 57A;

FIG. 58 shows the resistor of FIG. 57C connected to a transistor;

FIGS. 59A, 59B, and 59C are schematic representations of different embodiments of the circuit elements of FIG. 58;

FIG. 60 is a schematic and block diagram representation of a semiconductor resistor formed on a die according to the present invention;

FIG. 61A is a schematic block diagram of an illustrative wireless device;

FIG. 61B is a schematic block diagram of another illustrative wireless device;

FIG. 61C is a block diagram of an illustrative power amplifier module that may be employed in the wireless devices of FIGS. 61A and 61B;

FIG. 62 is a schematic and circuit block diagram showing a power amplifier system with termination circuits according to an embodiment of the present invention;

FIG. 63A is a block diagram illustrating an example power amplifier module with termination circuits according to another embodiment hereof;

FIG. 63B illustrates an example substrate in accordance with a particular embodiment of this invention;

FIGS. 64A, 64B, and 64C show simulation results comparing performance of the embodiment of FIG. 63A to a conventional implementation;

FIG. 65 is a block diagram illustrating a die and example termination circuits according to another embodiment of this invention;

FIG. 66 is a process flow diagram of an illustrative method of manufacturing a module according to yet another embodiment of the present invention;

FIG. 67A is a cross section of an embodiment of a transmission line according to certain aspects of the present invention;

FIG. 67B schematically represents the example transmission line of FIG. 67A;

FIG. 68A is a side view of a wire bond attached to the transmission line of FIG. 67A;

FIG. 68B illustrates an example of a substrate that includes the transmission line of FIG. 67A;

FIG. 68C represents an example of an array that includes multiple substrates of FIG. 68B;

FIG. 69 is a schematic block diagram of an example module that includes the transmission line of FIG. 67A;

FIGS. 70A, 70B, 70C, and 70D are graphs illustrating relationships among the transmission line of FIG. 67A and other transmission lines implemented in the module of FIG. 69;

FIG. 71 is a block diagram of two radio frequency (RF) components coupled to each other via the transmission line of FIG. 67A;

FIGS. 72A, 72B, 72C, 72D, 72E, and 72F are schematic block diagrams of various example RF components that can be electrically coupled to each other via the transmission line of FIG. 67A;

FIG. 73 is a schematic block diagram of another example mobile device implemented according to this invention to include the transmission line of FIG. 67A;

FIG. 74A is a plan view of a wafer in accordance with one embodiment of this invention;

FIG. 74B is a partial magnified plan view of a portion of the wafer of FIG. 74A;

FIG. 75A illustrates forming a passivation layer over a first or front side of a substrate according to the present invention;

FIG. 75B shows forming and patterning a photoresist layer over the passivation layer and using the photoresist layer to pattern the passivation layer in accordance with the invention hereof;

FIG. 75C depicts forming a tantalum nitride (TaN) termination layer using the photoresist layer as a mask according to this invention;

FIG. 75D portrays removing the photoresist layer and forming a conductive layer over the TaN termination layer in accordance with the present invention;

FIG. 75E shows attaching a carrier plate to the front side of the substrate and forming and patterning a photoresist layer on a back side of the substrate as taught herein;

FIG. 75F depicts forming a through-wafer via from the back-side into the substrate according to this aspect of the present invention;

FIG. 75G illustrates removing the photoresist layer and forming a barrier layer over the through-wafer via as part of one embodiment of the back-side process hereof;

FIG. 75H shows forming a seed layer over the barrier layer and forming a copper layer over the seed layer;

FIG. 75I portrays removing the carrier plate from the front side of the wafer;

FIG. 76A is top plan view of an illustrative packaged module according to the present invention;

FIG. 76B shows a cross section of the packaged module of FIG. 76A taken along the line A-A of FIG. 76A;

FIG. 77 shows process steps hereof that can be implemented to fabricate a packaged module including a die having an integrated circuit (IC);

FIGS. 78A and 78B show front and back sides of an example laminate panel configured to receive a plurality of die for formation of packaged modules;

FIGS. 79A, 79B, and 79C show various views of a laminate substrate of the panel configured to yield an individual module according to this invention;

FIG. 80 shows an example of a fabricated semiconductor wafer having a plurality of die to be singulated for mounting on the laminate substrate;

FIG. 81 depicts an individual die showing example electrical contact pads for facilitating connectivity when mounted on the laminate substrate;

FIGS. 82A and 82B show top and side views of the laminate substrate being prepared for mounting of example surface-mount technology (SMT) devices;

FIGS. 83A and 83B show top and side views of the example SMT devices mounted on the laminate substrate;

FIGS. 84A and 84B show top and side views of the laminate substrate being prepared for mounting of a die according to the present invention;

FIGS. 85A and 85B show top and side views of the die mounted on the laminate substrate;

FIGS. 86A and 86B show top and side views of the die electrically connected to the laminate substrate by wirebonds according to this invention;

FIGS. 87A and 87B show top and side views of wirebonds formed on the laminate substrate and configured to facilitate electromagnetic (EM) isolation between an area defined by the wirebonds and areas outside of the wirebonds;

FIG. 88 shows a side view of molding configuration for introducing molding compound to a region above the laminate substrate according to the present invention;

FIG. 89 shows a side view of an overmold formed via the molding configuration of FIG. 88;

FIG. 90 shows the front side of a panel with the overmold;

FIG. 91 shows a side view of how an upper portion of the overmold can be removed to expose upper portions of the EM isolation wirebonds;

FIG. 92A shows an image of a portion of a panel where a portion of the overmold has its upper portion removed to better expose the upper portions of the EM isolation wirebonds;

FIG. 92B is a view similar to FIG. 92A showing the application of metal paint sprayed on the top of the panel to form a conductive surface with the exposed upper portions of the EM isolation wirebonds;

FIG. 93 shows a side view of a conductive layer formed over the overmold such that the conductive layer is in electrical contact with the exposed upper portions of the EM isolation wirebonds;

FIG. 94 shows an image of a panel where the conductive layer can be a spray-on metallic paint according to the teachings hereof;

FIG. 95 shows individual packaged modules being cut from the panel;

FIGS. 96A, 96B, and 96C show views of an individual packaged module;

FIG. 97 is a block diagram showing that one or more of the modules that are mounted on a wireless phone board can include one or more features as described herein;

FIG. 98A is a flow diagram of a process that can be implemented to install a packaged module having one or more features as described herein on a circuit board such as the phone board of FIG. 97;

FIG. 98B is a block diagram depicting the circuit board with the packaged module installed thereon;

FIG. 98C is a block diagram showing a wireless device having the circuit board with the packaged module installed thereon;

FIG. 98D depicts an electronic device having a radio frequency (RF) isolation structure;

FIG. 99A is a flow diagram of an illustrative process of determining via placement according to a particular embodiment hereof;

FIG. 99B is a flow diagram of an illustrative process of determining via placement according to another embodiment hereof;

FIGS. 100A and 100B are illustrative electromagnetic interference (EMI) profiles corresponding to different via placements;

FIG. 100C is a legend for EMI data in FIGS. 100A and 100B;

FIG. 101 is a graph illustrating a relationship between via density and inverse radiated power;

FIGS. 102A and 102B are top plan views of a substrate having via placements that correspond to the EMI profiles shown in FIGS. 100A and 100B, respectively;

FIG. 103 is a flow diagram with process steps illustrating one example of a method of providing an integrated EMI shield as part of a packaging process according to aspects of the present invention;

FIG. 104 is a side view of one example of an electronic module including a substrate and one or more die mounted thereto;

FIG. 105 is a sectional side view of one example of a device package incorporating an integrated EMI shield according to aspects of this invention;

FIG. 106A is a sectional side view of another example of a device package incorporating an integrated EMI shield according to aspects of the present invention;

FIG. 106B is a plan view of a portion of a device package illustrating a continuous wirebond track according to aspects of the invention;

FIG. 107 is an illustration of one example of a wirebond spring according to aspects of this invention;

FIG. 108 is a flow diagram illustrating one example of a method of forming a wirebond spring according to aspects of the invention;

FIG. 109 is a detailed enlarged view of one example of a wirebond spring according to aspects of the present invention;

FIG. 110 is a view similar to FIG. 109 illustrating deformation of a wirebond spring during the transfer molding process according to aspects of the invention;

FIG. 111 is a sectional side view image of one example of a wirebond spring incorporated in a device package according to aspects of the invention; and FIG. 112 is a plan view image of one example of a wirebond spring according to aspects of the invention.

DETAILED DESCRIPTION OF THE PREFERRED EMBODIMENTS

I. Introduction

Figure 1:
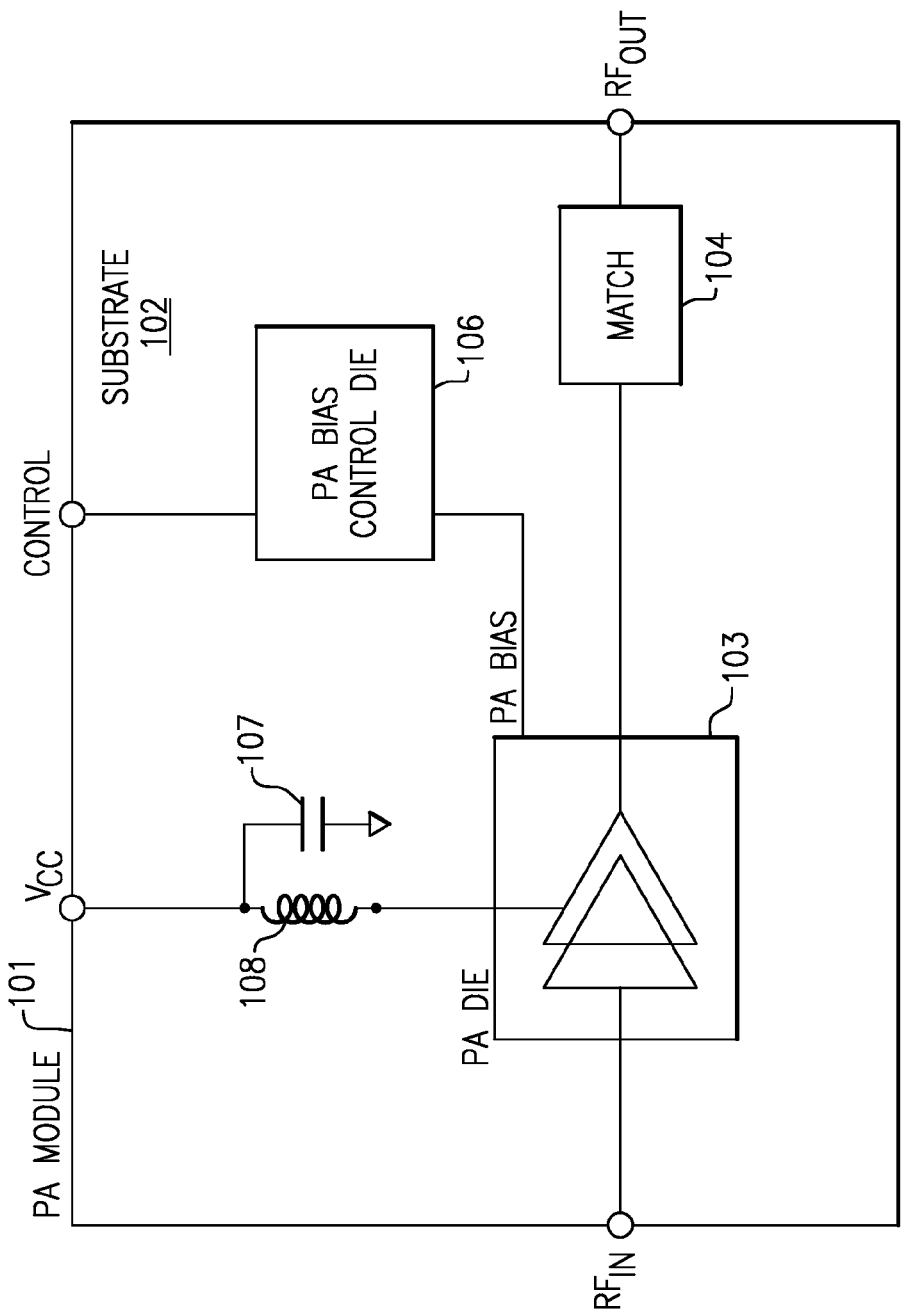
FIG. 1 is a block diagram of a power amplifier module.

Referring now to FIG. 1, there is shown a schematic block diagram of an illustrative module 101 in accordance with the present invention. The module 101 can achieve desirable levels and/or ranges of linearity and desirable PAE. The module 101 can include some or all of a power amplifier system. The module 101 can be referred to as multi chip module and/or a power amplifier module. The module 101 can include a substrate 102, one or more die including a power amplifier die 103, one or more circuit elements, a matching network 104, the like, or any combination thereof. As illustrated in FIG. 1, the one or more die can include a power amplifier die 103 and a controller die, such as a power amplifier bias control die 106.

The module 101 can include a plurality of dies and/or other components attached to and/or coupled to the substrate 102. The other components can include, for example, surface mount components (SMCs) and/or components formed from the substrate 102, such as inductors formed from substrate trace. In some implementations, the substrate 102 can be a multi-layer substrate configured to support die and/or components and to provide electrical connectivity to external circuitry when the module 101 is mounted on a circuit board, such as a phone board. Thus, the substrate 102 can be configured to receive a plurality of components, such as die and/or separate passive components. As illustrated in FIG. 1, the power amplifier die 103, the power amplifier bias control die 106, a capacitor 107, and an inductor 108 are attached to the substrate 102. The substrate 102 can be a laminate substrate with a finish plating.

The power amplifier die 103 can be any suitable die for implementing a power amplifier. According to some embodiments hereof, the power amplifier die can be coupled to the substrate 102 by way of one or more wirebonds. Such wirebonding can include, for example, any combination of features described in Section II below. In certain implementations, these wirebonds can electrically connect the power amplifier die 103 to an RF transmission line that includes any combination of features described below in Section X. Such a transmission line can be implemented on the substrate 102. Alternatively or additionally, the one or more wirebonds can be included in one or more of the termination circuits described in Section IX.

The power amplifier die 103 is a gallium arsenide (GaAs) die in a number of implementations. In some of these implementations, the GaAs die includes transistors formed using a heterojunction bipolar transistor (HBT) process, including, for example, a bipolar field effect transistor (BiFET) process. One or more of such transistors can include any combination of features of the transistors described below in Section IV in accordance with various embodiments hereof. Alternatively or additionally, a power amplifier die 103 that includes GaAs transistors formed by an HBT process can also include resistors formed by an HBT process, such as resistors including any combination of features as described below in Section VIII.

The power amplifier die 103 can receive a RF signal via an input pin RF_IN of the module 101. The power amplifier die 103 can include one or more power amplifiers, including, for example, multi-stage power amplifiers configured to amplify the RF signal. The power amplifier die 103 may advantageously include an input matching network, a first power amplifier stage (which can be referred to as a driver amplifier), an inter-stage matching network, a second power amplifier stage (which can be referred to as an output amplifier), a bias circuit, or any combination thereof. It should be understood by those of skill in the art that a power amplifier die can include one or more power amplifier stages. Moreover, in certain implementations hereof, the input matching network and/or the inter-stage matching network can be external to the power amplifier die 103. Although FIG. 1 illustrates one power amplifier die 103 in the module 101, it should be further understood that two or more power amplifier dies may be included in the module 101 in other implementations of the present invention.

According to certain implementations of this invention, a power amplifier may include the first power amplifier stage and the second power amplifier stage. The first stage and/or the second stage can include one or more bipolar transistors. In certain embodiments of this invention, the one or more of these bipolar transistors can include any combination of features described herein-below in Section IV. The RF input signal can be provided to the first power amplifier stage by way of an input matching network. The input matching network can receive a first bias signal. The first bias signal can be generated on the power amplifier bias control die 106 as illustrated in FIG. 1. In some other implementations (not illustrated), the first bias signal can be generated on the power amplifier die 103 or external to the module 101. The first power amplifier stage can amplify the RF input and provide the amplified RF input to the second power amplifier stage via the inter stage matching circuit. The inter stage matching circuit can include separate termination circuits to match a fundamental frequency of an RF signal and to terminate at a phase of a harmonic of the RF signal in accordance with any combination of features described in Appendix G. The inter-stage matching circuit can receive a second stage bias signal. The second bias signal can be generated on the power amplifier bias control die 106 as illustrated in FIG. 1. In some other implementations (not illustrated in FIG. 1), the second bias signal can be generated on the power amplifier die 103 or external to the module 101. The second power amplifier stage can generate the amplified RF output signal.

The amplified RF output signal can be provided to an output pin RF_OUT of the power amplifier die 103 via an output matching network 104. The amplified RF output signal can be provided to and/or from the output matching network 104 via an RF transmission line having any combination of features described below in further detail in Section X according to certain embodiments hereof. The matching network 104 can be provided on the module 101 to aid in reducing signal reflections and/or other signal distortions. For instance, the output matching network 104 can include separate termination circuits to match a fundamental frequency of an RF signal and to terminate at a phase of a harmonic of the RF signal in accordance with any combination of features described herein-below in Section IX.

The power amplifier die 103 can include one or more on die passive circuit elements, such as a capacitor, a resistor, or an inductor. For instance, the power amplifier die 103 can include one or more resistors. In some embodiments, the power amplifier die 103 can include one or more semiconductor resistors that include any combination of features described below in Section VIII.

Alternatively or additionally, the power amplifier die 103 can include features related to reducing impact of high RF loss plating, for example, including any combination of features described below in Section III. As one example, the power amplifier die 103 can include a first lead electrically connected to an on die passive circuit element and a second lead electrically connected to an output signal to direct current away from a bonding pad electrically connected to the first lead.

The power amplifier die 103 can include a dual mode power amplifier. According to some embodiments hereof, the one or more die can include any combination of features of a dual mode power amplifier control interface described below in Section V. The dual mode power amplifier control interface can be implemented on the power amplifier die 103 and/or another die, such as the power amplifier bias control die 106.

As further illustrated in FIG. 1, the module 101 can include a power amplifier bias control die 106 mounted to the substrate 102. In certain embodiments hereof, the power amplifier bias control die 106 can generate a power amplifier bias control signal based on an indicator of a property of the power amplifier die 103, such as an indicator of process variations of the power amplifier die 103, by implementing any combination of features described herein-below in Section VI. The power amplifier bias control die 106 can also generate power amplifier bias control signals based on control data received on a control pin CONTROL of the module 101, such as control data indicating a power mode of a power amplifier disposed on the power amplifier die 103.

As also illustrated in FIG. 1, the one or more circuit elements of the power amplifier module 101 can include a capacitor 107 and/or an inductor 108. The one or more circuit elements can be mounted to the substrate 102 and/or implemented on the substrate 102. For instance, the inductor 108 can be implemented on the substrate 102 as a trace on the substrate 102 or as a surface mount component (SMC) mounted to the substrate 102. The inductor 108 can operate as a choke inductor, and can be disposed between a supply voltage received on a supply voltage pin VCC and the power amplifier die 103. The inductor 108 can to provide a power amplifier on the power amplifier die 103 with a supply voltage received on the supply voltage pin VCC while choking and/or blocking high frequency RF signal components. The inductor 108 can include a first end electrically connected to the supply voltage pin VCC, and a second end electrically connected to a collector of a bipolar transistor associated with the power amplifier die 103. The capacitor 107 can function as a decoupling capacitor. As illustrated in FIG. 1, the capacitor 107 includes a first end electrically connected to the first end of the inductor 108 and a second end electrically coupled to ground, which in certain implementations is provided using a ground pin of the module 101 (not illustrated in FIG. 1). The capacitor 107 can provide a low impedance path to high frequency signals, thereby reducing the noise of the power amplifier supply voltage, improving power amplifier stability, and/or improving the performance of the inductor 108 as a RF choke. In some implementations, the capacitor 107 can include a SMC.

The module 101 can also include one or more power supply pins and/or one or more reference voltage pins, which may be electrically connected to, for example, the power amplifier die 103. The power amplifier die 103 can include one or more through wafer vias. A through wafer via can be electrically coupled to a supply pin configured at a ground potential. The through wafer via can include any combination of features of the through wafer vias described below in Section XI. For instance, the through wafer via can be a tantalum nitride terminated through wafer via. The one or more power supply pins can provide supply voltages to the power amplifiers, such as a power high or VCC supply voltage.

In accordance with certain embodiments, the module 101 may advantageously include RF shielding and/or RF isolation structures. For instance, the module can include any combination of features described herein-below in Section XII and Section XIII to provide such RF shielding or RF isolation structures.

The module 101 can be modified to include more or fewer components, including, for example, additional power amplifier dies, capacitors and/or inductors. For instance, the module 101 can include one or more additional matching networks. As another example, the module 101 can include an additional power amplifier die, as well as an additional capacitor and inductor configured to operate as a decoupling capacitor and a choke inductor. The module 101 can be configured to have additional pins, such as in implementations in which a separate power supply is provided to an input stage disposed on the power amplifier die 101 and/or implementations in which the module 101 operates over a plurality of bands.

II. Wire Bond Pad Systems and Related Methods

To reduce the RF losses associated with high RF loss plating, such as, for example, Ni/Pd/Au plating, the solder mask is reconfigured to prevent the edges and sidewalls of the wire-bond areas from being plated in some embodiments. Leaving the edges and sidewalls of the wire-bond areas free from high RF loss plating, such as Ni/Pd/Au plating, provides a path for the RF current to flow around the high resistivity material, which reduces the RF signal loss associated with the high resistivity plating material. As indicated above, these aspects of the present invention may be combined with other aspects hereof to still further improve the performance of power amplifier modules and the devices in which they are employed.

Wire bonding is a technique for connecting electrical circuit devices, for example, integrated circuit (IC) die, to the next level of packaging. These circuit devices generally include a plurality of small conductive leads/pads that are electrically connected, for example, by ball bonding, wedge bonding, or the like, to wire bond pads on conductors embedded in the device package or substrate. The wire bond pads on the substrate provide the electrical connections between the IC and the substrate, permitting the IC to interface with the outside world. In either type of wire bonding, the wire is attached at both ends using some combination of heat, pressure, and ultrasonic energy to make a weld.

A plurality of copper patterns is formed on a substrate which is electrically connected to the circuit patterns, and a filler, such as a dielectric, is filled between the copper patterns such that an upper surface of the copper pattern is exposed. However, bare copper is not readily solderable or bondable and requires plating with a material that facilitates soldering or bonding. Areas that should not be solderable/bondable are covered with a material to resist plating. In general, solder resist refers to a polymer coating that acts as a mask and prevents the plating material from adhering to the masked copper traces. A surface plating material is plated onto the top layer of exposed copper traces to provide the wire bond pads. In some applications, wire bond pads are suited for wire bonding directly over active circuits to avoid damaging fragile devices and to lower metal resistance for power integrated circuits.

Figure 2:
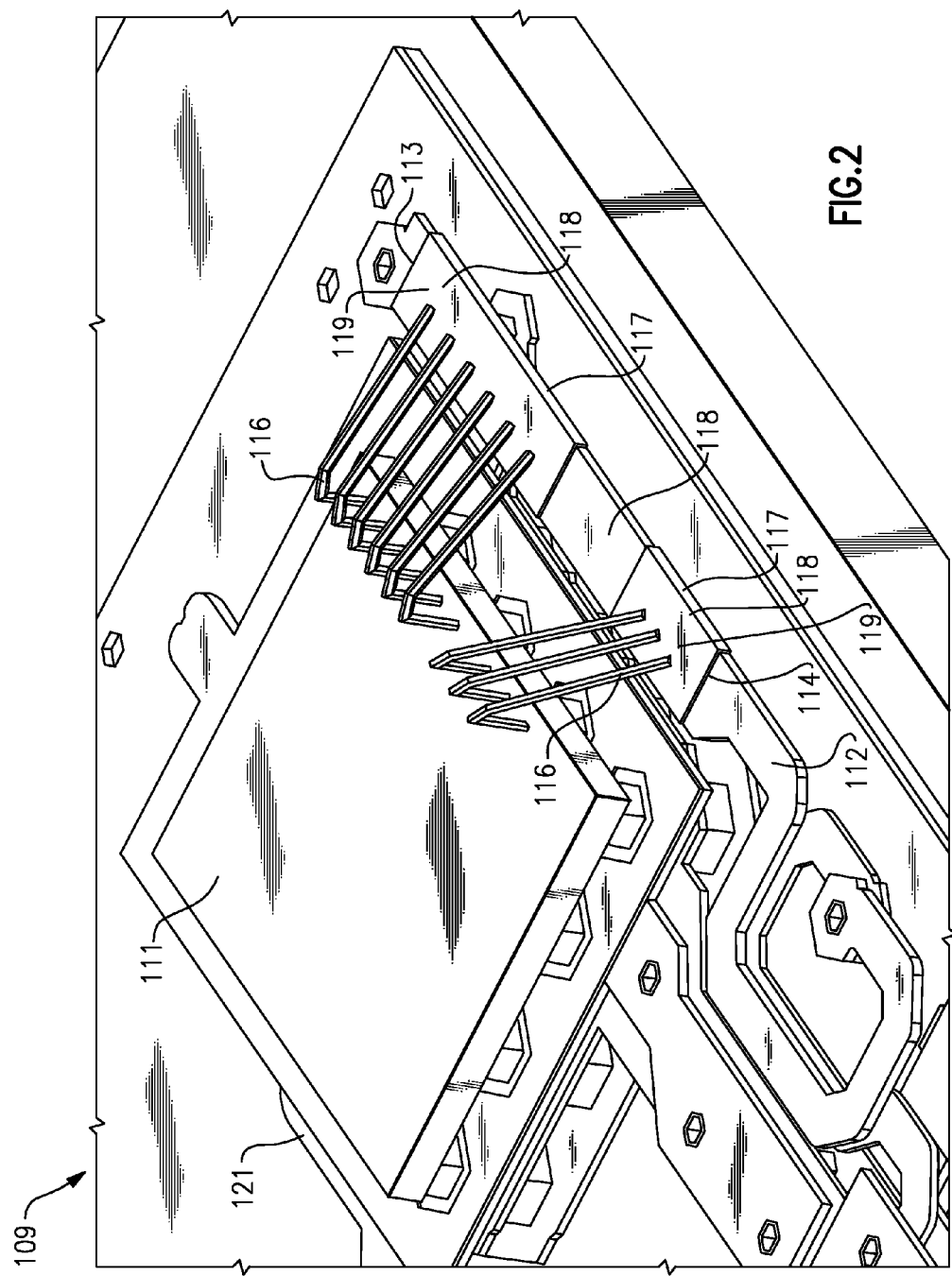
FIG. 2 illustrates an enlarged portion of an exemplary IC module including a wire bond pad according to certain embodiments.

Now with reference to FIG. 2, there is illustrated a portion of an IC module 109 including an IC 111, a substrate 121, a copper trace 112, wire bond pads 113, 114, and bonding wires 116, according to one particular embodiment hereof. The IC is wire bonded to wire bond pads 113 and 114 through wires 116. In the illustrated embodiment, wire bond pad 113 is a 6-wire wire bond pad and wire bond pad 114 is a 3-wire wire bond pad. In other embodiments, different numbers of wires 116 can be attached to the wire-bond pads 113 and 114. Wire bond pads 113 and 114 include a bond area 119, sidewalls 117, and edges 118.

Figure 3:
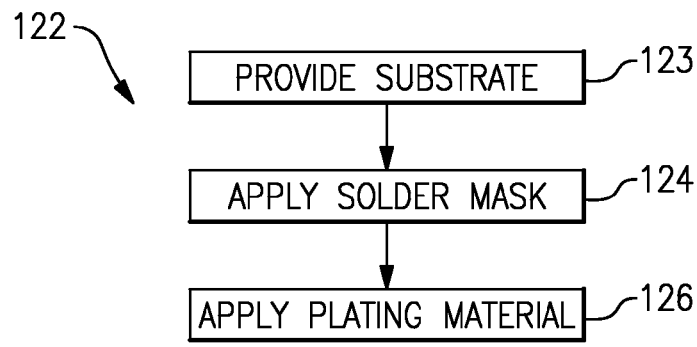
FIG. 3 shows a flow chart for an exemplary process for forming wire bond pads.

FIG. 3 illustrates a flow chart for an exemplary process 122 for forming wire bond pads. The process 122 is described with respect to the embodiment illustrated in FIG. 2. State 123 begins with a substrate 121 formed with layers of dielectrics and conductors 112, including a trace 112 on an upper surface of the substrate 121, to form circuit paths as is known to one of ordinary skill in the art of semiconductor fabrication.

At State 124, the process 122 applies solder mask to those areas of the IC module 109 that are to be kept free of plating material, as may be known to one of ordinary skill in the art of semiconductor fabrication. A solder mask opening defines the areas to which the plating material will adhere. In some embodiments, the solder mask opening exposes the wire bond area 119, the sidewalls 117, and the edges 118 of the wire bond pads 113 and 114 to the plating material. In other embodiments hereof, the trace 112 and the wire bond area 119, the sidewalls 117, and the edges 118 of the wire bond pads 113 and 114 are open to the plating process.

At State 126, the exposed areas (free of solder mask) of the copper trace 112 are plated with the plating material to form the wire bond pads 113 and 114 as may be known to one of ordinary skill in the art of semiconductor fabrication.

In an embodiment hereof, the plating material is nickel/gold (Ni/Au). At State 126, the nickel layer is plated over the copper trace 112 and the gold layer is plated over the nickel layer. Examples of plating techniques include, for example, immersion plating deposition, electrolytic plating, electroless plating, and the like.

In a particular embodiment hereof, the copper trace is between about 5 microns and about 50 microns thick, and preferably approximately 20 microns. The nickel layer in the Ni/Au plating is between about 2.5 microns to about 7.6 microns thick, and more preferably, between about 5 microns to about 7 microns. The gold layer is approximately 0.70+/−0.2 microns thick, and more preferably approximately 0.5+/−0.1 microns.

Traditionally, Ni/Au has been a standard surface plating material for radio frequency integrated circuit (RFIC) products. Radio frequency (RF) is a rate of oscillation in the range of about 30 kHz to about 300 GHz. In an embodiment, the RFIC 111 is wire-bonded to Ni/Au wire-bond pads 113 and 114 plated on the surface of the substrate 121 to form the electrical connections of the RFIC 111 with its package. However, increases in gold prices have increased packaging costs associated with the Ni/Au surface plating.

To reduce packaging costs, a nickel/palladium/gold (Ni/Pd/Au) plating material is used to form wire bond pads for RFICs. In an embodiment, the RFIC 111 is wire-bonded to Ni/Pd/Au wire-bond pads 113 and 114 plated on the surface of the substrate 121 to form the electrical connections of the RFIC 111 with its package. The Ni/Pd/Au plating uses less gold than the Ni/Au plating material, and, as gold prices increase, the Ni/Pd/Au plating is advantageously less costly than the Ni/Au plating material.

Figure 4:
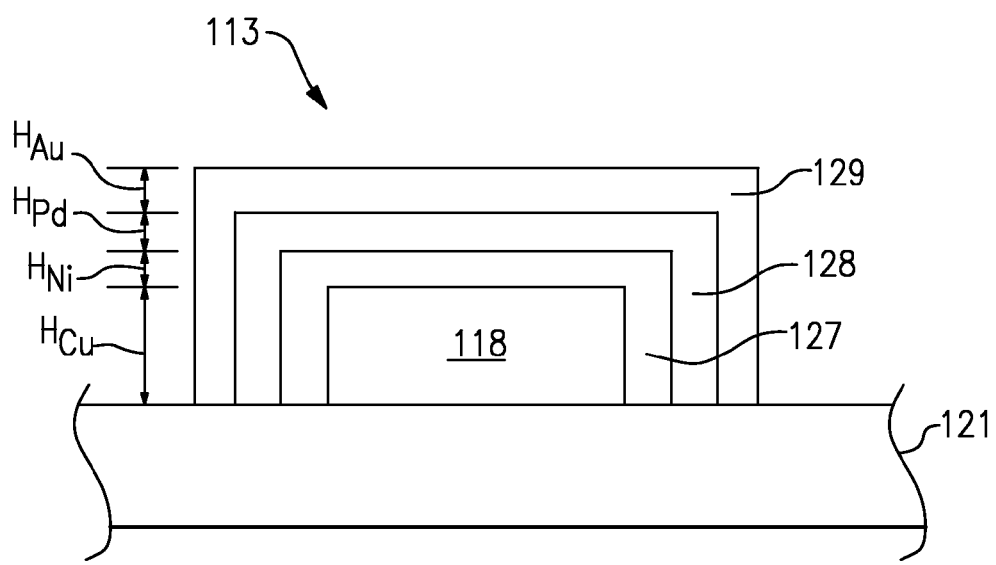
FIG. 4 illustrates a cross-section of a Ni/Pd/Au wire bond pad on the IC module of FIG. 2 in accordance with a particular embodiment of this invention.

As shown in FIG. 4, there is illustrated a cross-section of the Ni/Pd/Au the wire bond pad 113, for example, on the surface of the substrate 121, according to an embodiment hereof. The Ni/Pd/Au wire bond pad 113 as shown in FIG. 4, which may apply to any other bond pads in the module such as 114 of FIG. 2, includes a nickel layer 127, a palladium layer 128, and a gold layer 129.

Referring now to FIGS. 3 and 4, at State 126, the nickel layer 127 is plated over the copper trace 112; the palladium layer 128 is plated over the nickel layer 127, and the gold layer 129 is plated over the palladium layer 128. Examples of plating techniques include, for example, immersion plating deposition, electrolytic plating, electroless plating, and the like.

In the embodiment hereof illustrated in FIG. 4, a height $H_{Cu}$ of the copper trace 112 is between about 5 microns and about 50 microns, and preferably 20 microns. A height $H_{Ni}$ of the nickel layer 127 is between about 2.5 microns to about 7.6 microns, and more preferably between about 5 microns to about 7 microns. A height $H_{Pd}$ of the palladium layer 128 is approximately 0.09+/−0.06 microns, and more preferably approximately 0.1+/−0.01 microns. A Height $H_{Au}$ of the gold layer 129 is approximately 0.10+/−0.05 microns, and more preferably approximately 0.1+/−0.01 microns.

However, the Ni/Pd/Au plated surface, due to the thin palladium and gold layers 128 and 129, and the ferromagnetic nature of the nickel layer 127, has a higher sheet resistance at radio frequencies than the Ni/Au plated surface. Sheet resistance is applicable to two-dimensional systems where the thin film, such as surface finish plating for semiconductors, for example, is considered to be a two-dimensional entity. It is analogous to resistivity in three-dimensional systems. When the term sheet resistance is used, the current must be flowing along the plane of the sheet, not perpendicular to the plane of the sheet.

In the Ni/Au wire bond pad embodiment described above, the sheet resistance of the Ni/Au is approximately 30 mΩ/square at 2 GHz whereas the sheet resistance of the Ni/Pd/Au in the Ni/Pd/Au wire bond pad embodiment described above and illustrated in FIG. 4 is approximately 150 mΩ/square at 2 GHz. Consequently, plating the wire bond pads 113 and 114 with the Ni/Pd/Au plating material instead the Ni/Au plating material can, lead to extra RF losses. In turn, this can impact product performance and yield. In some embodiments, a Ni/Pd/Au plated surface may potentially increase RF loss by approximately 0.1 dB to approximately 0.4 dB, or equivalently impact power efficiency by approximately 1% to approximately 4%.

Further, oscillating signals are subject to skin effect. Skin effect is the tendency of an alternating electrical current to distribute itself within a conductor so that the current density near the surface of the conductor is greater than that at its core. That is, the electric current tends to flow at the skin of the conductor at an average depth called the skin depth. The skin effect causes the effective resistance of the conductor to increase with the frequency of the current because much of the conductor carries little current. Skin effect is due to eddy currents induced by the alternating current. As the frequency of the signal increases, to RF frequencies, for example, the skin depth decreases. In addition, the eddy currents also cause crowding of the alternating RF current at the edges of the conductor. Thus, a major portion of the RF current travels on the edge and sidewalls of the conductor 112.

FIG. 5 illustrates an enlarged portion of an RFIC module 131 including an RFIC 132, a substrate 141, a copper trace 133, wire bond pads 134 and 136, and the bonding wires 116, according to another embodiment hereof. The RFIC 132 is wire bonded to the wire bond pads 134 and 136 through the bonding wires 116. In the illustrated embodiment, the wire bond pad 134 is a 6-wire wire bond pad and the wire bond pad 136 is a 3-wire wire bond pad. In other embodiments, other numbers of wires 116, such as for example, 1, 2, 3, 4, 5 or more than 6, can be attached to the wire-bond pads 134 and 136. The wire bond pad 136 includes a bond area 139, sidewalls 137, and edges 138.

To reduce RF signal losses, the fabrication process can limit the Ni/Pd/Au wire bond pad 134, for example, to the bond area 139, leaving the sidewalls 137 and edges 138 free from the Ni/Pd/Au plating material. The majority of the RF current travels through the unplated edges and side walls surrounding the plated wire bond area 139, instead of traveling through the plated edge 138 and sidewalls 137 as illustrated in FIGS. 2 and 4. Thus, the RF losses are reduced.

In FIG. 6, there is shown a flow chart for an exemplary process 142 for forming Ni/Pd/Au wire bond pads 134 and 136, according to another embodiment hereof. The process 142 is described with respect to the embodiment illustrated in FIG. 5. State 143 begins with the substrate 141 formed with layers of dielectrics and conductors 133, including trace 133 on an upper surface of the substrate 141, FIG. 7, to form circuit paths as may be known to one of ordinary skill in the art of semiconductor fabrication.

At State 144, in an embodiment, the solder mask is reconfigured to cover the edges 138 and sidewalls 137 of the exemplarily wire bond pad 134. In another embodiment, the solder mask is reconfigured to cover the trace 133, and the edges 138 and the sidewalls 137 of the wire bond pad. The solder mask opening covers the wire bond area 139, such that the wire bond area 139 is open to the plating process, while the edges 138 and the sidewalls 137 are not. In an embodiment hereof, the width of the edge 138 covered by the solder mask should be at least wider than the solder mask opening registration tolerance. In another embodiment, the width of the edge 138 covered by the solder mask is approximately 10 microns to 200 microns, and preferably 50 microns to 100 microns.

At State 146, the process 142 applies the reconfigured solder mask to the RFIC module 131, as may be known to one of ordinary skill in the art of semiconductor fabrication.

At State 147, the process 142 plates the RFIC module 131 with the Ni/Pd/Au plating material to form the wire bond pads as may be known to one of ordinary skill in the art of semiconductor fabrication. Examples of plating techniques include, for example, immersion plating deposition, electrolytic plating, electroless plating, and the like.

As an example of further detail relating hereto, FIG. 7 illustrates a cross-section of the exemplary Ni/Pd/Au wire bond pad 134 on the surface of the substrate 141, according to an embodiment hereof. The Ni/Pd/Au wire bond pad 134 as shown includes a nickel layer 148, a palladium layer 149, and a gold layer 151. As illustrated in FIG. 7, the edges 138 and sidewalls 137 of the Ni/Pd/Au wire bond pad 134 are free from the Ni/Pd/Au plating.

Referring now to FIGS. 6 and 7 taken together, the nickel layer 148 is plated over the copper trace 133; the palladium layer 149 is plated over the nickel layer 148, and the gold layer 151 is plated over the palladium layer 149. Examples of plating techniques include, for example, immersion plating deposition, electrolytic plating, electroless plating, and the like.

In the embodiment illustrated in FIG. 7, a height $H_{Cu}$ of the copper trace 133 is between about 5 microns and about 50 microns, and preferably approximately 20 microns. A height $H_{Ni}$ of the nickel layer 148 is between about 2.5 microns to about 7.6 microns, and more preferably between about 5 microns to about 7 microns. A height $H_{Pd}$ of the palladium layer 149 is approximately 0.09+/−0.06 microns, and more preferably approximately 0.1+/−0.01 microns. A height $H_{Au}$ of the gold layer 151 is approximately 0.10+/−0.05 microns, and more preferably approximately 0.1+/−0.01 microns.

FIG. 8 is a graph 152 comparing the RF losses for traces with edge/sidewall exposed surfaces and edge/sidewall plated surfaces, according to an embodiment hereof. The graph 152 shows power loss expressed in decibels (dBs) along the y or vertical axis and frequency expressed in gigahertz (GHz) along the x or horizontal axis. The power loss of the RF signals is calculated as $10 \log_{10}[\text{RFpowerout}/\text{RFpower in}]$ at frequencies ranging from about 1.40 GHz to about 2.25 GHz.

The graph 152 includes lines 153, 156, 158, 161, and 163, representing the power loss of an RF signal through various traces on an RFIC substrate. Line 153 indicates an RF power loss of the RF signal through a bare copper trace (no surface finish). At approximately 1.9 GHz, as indicated by point 154, the power loss is approximately 0.614 dB.

Line 156 indicates the power loss of the RF signal through a copper trace including a Ni/Au bonding pad having its edges and sidewalls free from plating, while line 158 indicates the power loss through a copper trace including a Ni/Au bonding pad with its edges and sidewalls plated with the Ni/Au plating material. Point 157 on line 156 indicates the power loss to be approximately 0.729 dB at approximately 1.9 GHz and point 159 on line 158 indicates the power loss to be approximately 0.795 dB at approximately 1.9 GHz.

Line 161 indicates the power loss of the RF signal through a copper trace including a Ni/Pd/Au bonding pad having its edges and sidewalls free from plating, while line 163 indicates the power loss through a copper trace including a Ni/Pd/Au bonding pad with its edges and sidewalls plated with the Ni/Pd/Au plating material. Point 162 on line 161 indicates the power loss to be approximately 0.923 dB at approximately 1.9 GHz and point 164 on line 163 indicates the power loss to be approximately 1.191 dB at approximately 1.9 GHz.

Referring to the embodiments illustrated in FIG. 8, the bare copper trace (line 153) provides the least power loss and the trace including the Ni/Pd/Au bonding pad having plated edges and sidewalls (line 163) provides the greatest RF power loss. Traces with Ni/Au bonding pads (lines 156, 158) create less power loss to the RF signal than traces with Ni/Pd/Au bonding pads (lines 161, 163). Comparing the traces for the Ni/Au bonding pad, the trace with exposed edge and sidewalls (line 156) creates less power loss than the trace with the plated edge and sidewalls (line 158). Similarly, the trace with the Ni/Pd/Au bonding pad with exposed edge and sidewalls (line 161) creates less power loss to the RF signal than the trace for the Ni/Pd/Au bonding pad with plated edges and sidewalls (line 163). As indicated by arrow 166, in an embodiment, the RF power loss for the RF signal passing through the Ni/Pd/Au bonding pad that does not have its edges and sidewalls plated with the Ni/Pd/Au plating material is approximately 0.26 dB less than the RF power loss of the RF signal passing through the Ni/Pd/Au bonding pad with Ni/Pd/Au plated edges and sidewalls.

In a specific embodiment hereof, there is a minimum width for the plated wire bond area 139 that is exposed to the process 142 to achieve successful and reliable wire bond connections. FIGS. 5 and 7, described above, illustrate embodiments of the wire bonding pads 134 and 136 that fit within the uniform width of the copper trace 133. In other words, the width of the plated wire bond area 139 and the width of the unplated edges 138 and sidewalls 137 do not exceed the uniform width of the trace 133 in the area of the wire bond pad 134 and similarly for wire bond pad 136 and the areas of the trace 133 adjacent to the respective wire bond pad.

Next with regard to FIGS. 9A-9F, there are illustrate exemplary layouts for wire bonding pads where the minimum width of the plated bond area 139 and the width of at least one unplated edge 138 exceed the uniform width of the trace 133 in the area of the respective wire bond pad and the areas of the trace 133 adjacent to the wire bond pad. If, in an embodiment, after the edge 138 of the wire bond pad is covered with solder mask such that it remains free of plating, the minimum size requirements for the wire bond area 139 are not met, the width of the trace 133 can be proportionally increased with minimal edge exposure to meet the size requirements.

More specifically, FIGS. 9A-9D illustrate exemplary layouts of wire bond pads having exposed edges 138 and sidewalls 137 surrounding the wire bond pads. In an embodiment hereof for certain desired application, if, after the edge 138 of the wire bond pad is covered with solder mask such that it remains free of plating, the minimum size requirements for the wire bond area 139 are not met, the width of the trace 133 can be deformed with minimal edge exposure to meet the wire bonding area 139 size requirements. In other words, a layout of the wire-bonding area meets or is larger than the minimal dimensions set by the design rule of a substrate technology, and at the same time, minimizes plated edges and side walls of the copper trace including the bonding area. Thus, the RF current flows through a minimal distance on the high resistive plated edges and side walls. In FIGS. 9A-9D, the trace 133 expands in width in the area of the wire bond pad to accommodate the wire bond area 139. Further, the expanded trace 133 permits the wire bond pad to maintain covered edges 138 and side walls 137 (not illustrated) during the solder mask process, which in turn permits the completed wire bond pad to maintain exposed edges 138 and side walls 137 along all of the perimeter of a respective wire bond pad.

Figure 9A:
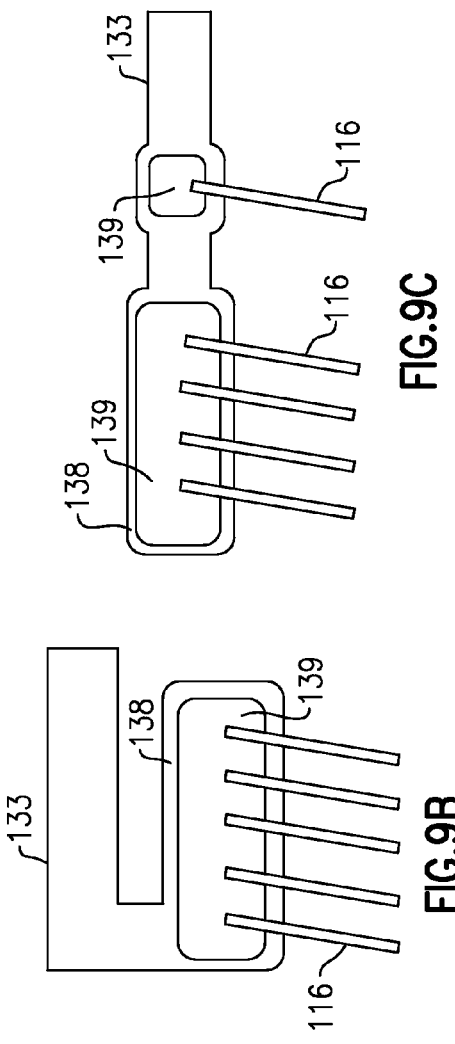
Figure 9B:
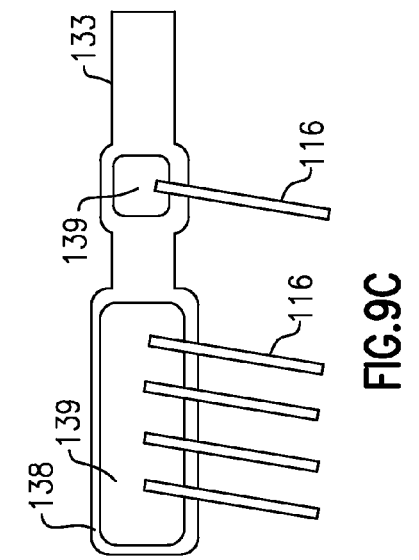
Figure 9C:
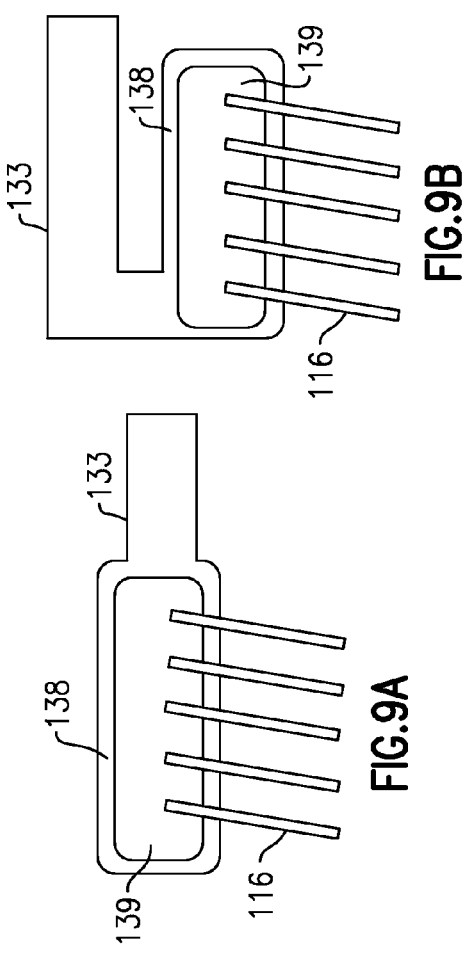
Figure 9D:
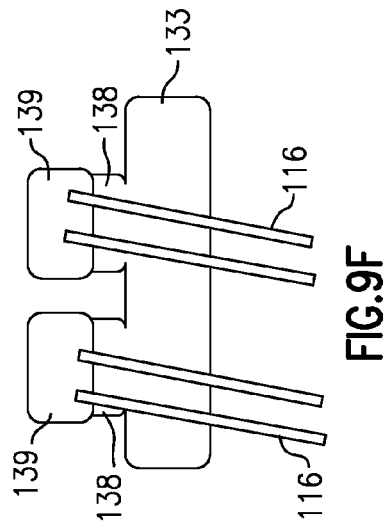
Figure 9E:
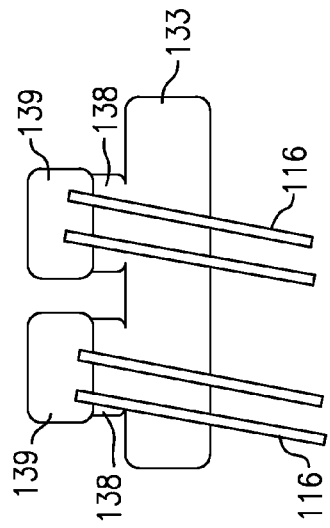
Figure 9F:
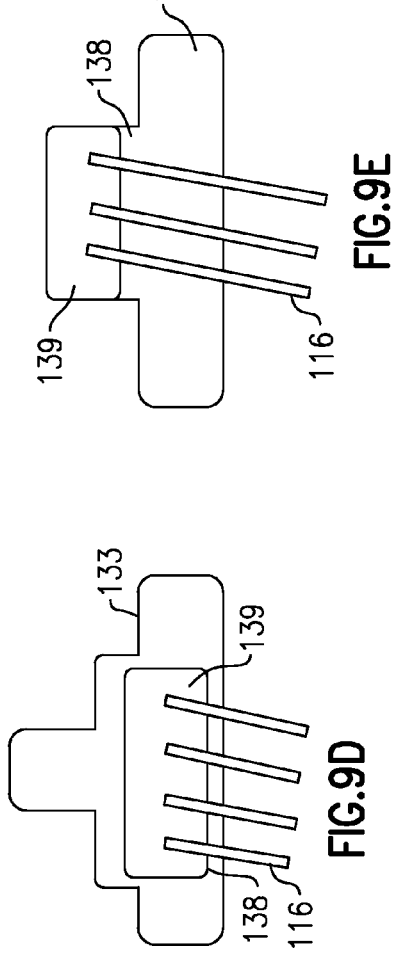

FIGS. 9E and 9F illustrate exemplary layouts where the trace 133 includes the wire bond pad, but circuit layout considerations limit the pad size and prevent the edge 138 from being covered with solder mask during the masking process. In one embodiment, the trace 133 deforms with a wire bond pad to accommodate the wire bond area 139. In another embodiment, the trace 133 deform in the area of the wire bond pad to accommodate the wire bond area 139. In FIG. 9E, the trace 133 is deformed with one wire bond pad to accommodate a 3-wire wire bonding area 139. In FIG. 9F, the trace 133 is deformed with two wire bond pads each with a bond pad area 139 to accommodate two 2-wire bonding areas 139 as shown. Thus, the deformed trace 133 permits a minimal length of edges and sidewalls being plated, or in other words, maximizes the length of unplated edges and side walls to reduce RF losses and maintains the required bondable area of the wire bond pad.

To reduce costs as an advantage hereof, in some embodiments, Ni/Pd/Au instead of Ni/Au is plated onto the surface traces of substrates for RFIC modules to form wire-bond areas. However, Ni/Pd/Au has a higher RF sheet resistance than Ni/Au and this leads to higher RF losses for signals traveling through Ni/Pd/Au wire-bond areas than for signals traveling through Ni/Au wire-bond areas. To reduce the RF losses associated with high RF loss plating, such as, for example, Ni/Pd/Au plating, the solder mask is reconfigured to prevent the edges and sidewalls of the wire-bond areas from being plated in some embodiments. Leaving the edges and sidewalls of the wire-bond areas free from high RF loss plating, such as Ni/Pd/Au plating, provides a path for the RF current to flow through low resistivity material, which reduces the RF signal loss associated with the high resistivity plating material.

While embodiments have been described with respect to Ni/Pd/Au surface plating, the disclosed systems and methods apply to any high RF loss surface plating, such as, for example, Sn, Pb, other surfaces of ferromagnetic materials, and the like.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those with ordinary skill in the relevant art may recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes, blocks, or steps may be implemented in a variety of different ways. Also, while processes, blocks, or steps are at times shown as being performed in series, these processes, blocks, or steps may instead be performed in parallel, or may be performed at different times.

It should be understood by those of skill in the relevant arts, that the teachings of these aspects of the present invention as provided herein can be applied to other systems, not necessarily only to the systems described herein above or below. Thus the elements and acts of the various embodiments described above may be combined in a wide and ranging manner to provide a variety of further embodiments.

III. Apparatus and Methods for Reducing Impact of High RF Loss Plating

To reduce the radio frequency (RF) losses associated with high RF loss plating, such as, for example, Nickel/Palladium/Gold (Ni/Pd/Au) plating, an on-die passive device such as a capacitor, resistor, or inductor, associated with a radio frequency integrated circuit (RFIC) is placed in an RF upper signal path with respect to the RF signal output of the RFIC. By placing the on-die passive device in the RF upper signal path, the RF current does not directly pass through the high RF loss plating material of the passive device bonding pad. As indicated above, these aspects of the present invention may be combined with other aspects hereof to improve further the performance of power amplifier modules and the devices in which they are employed.

Wafer fabrication generally refers to the process of building integrated circuits on silicon or semiconductor wafers. Many processes exist, known to one of ordinary skill in the art of wafer fabrication, such as, for example, epitaxy, masking and etching, diffusion, ion implant, deposition of polysilicon, dielectric fabrication, lithography and etching, deposition of thin films, metallization, glassivation, probing and trimming of each die on the wafer, and the like, to create integrated circuits that conform to any given design specifications.

In certain embodiments, it is desirable to locate an on-die passive device, such as a resistor, capacitor, inductor, or the like, on a RFIC, which further includes an RF output signal. The on-die passive device can function as a filter, a shunt filter, a trapper for harmonic frequencies, or the like, in the RF circuit.

Now with reference to FIG. 10, there is illustrated an enlarged portion of an RFIC module 167 including a substrate 168 and an RFIC 174. Additional circuitry is omitted for simplicity. The substrate 168 includes an RFIC circuit trace 169, and wire-bonding pads 171 and 172. In an embodiment hereof, the wire-bonding pads 171 and 172 include Ni/Pd/Au. In another embodiment, the wire-bonding pads 171 and 172 include a high RF loss plating material. In a further embodiment, the wire bonding pads 171 and 172 include Ni/Au. In an embodiment, the wire bonding pads 171 and 172 are formed with plated edges and sidewalls, as illustrated in FIG. 10. In another embodiment, the wire bonding pads 171 and 172 are formed with edges and sidewalls free from the surface plating material.

The RFIC 174 includes an RF output 176 and an on-die passive device 177 such as a capacitor 177. The RF output 176 is positioned at the location on the RFIC 174 from which the RF output signal from the RFIC's internal circuitry exits the RFIC 174 and inputs into the RF circuitry of the module 167. In an embodiment, the layout of the RFIC 174 is configured such that the capacitor 177 is placed in the RF circuit 169 of the RF module 167 after the RF output 176. In this layout, when the RF output 176 is wire bonded to wire bonding pad 171 and the on-die capacitor 177 is wire bonded to wire bonding pad 172, the on-die capacitor 177 is between the RF output 176 of the RFIC 174 and the RF output of the module 167.

An arrow 173 indicates the direction of RF current flow of the RF signal. As shown, the RF current flows from the RF output signal 176 to the RF output of the module 167. Portions of the RF trace 169 that are between the RF output signal 176 and the RF output of the module 167 are in the RF signal down path and portions of the trace 169 that are located above the RF output 176 that do not receive the RF current flow are in the RF signal upper path. In FIG. 10, the capacitor bonding pad 172 is located in the RF down path. In other words, the RF current passes through the capacitor wire-bond pad 172 when traveling from the RF output 176 to the rest of the circuitry on the substrate 168. In an embodiment hereof, passing the RF signal through the high RF loss plating material, such as the Ni/Pd/Au capacitor bonding pad 172, creates additional RF signal losses.

FIG. 11 illustrates the enlarged portion of an RFIC module 178 including a substrate 179 and an RFIC 186. Additional circuitry is omitted for simplicity. The substrate 179 includes an RFIC circuit trace 181 and wire-bonding pads 182 and 183. In a particular embodiment hereof, the wire-bonding pads 182 and 183 include Ni/Pd/Au. In another embodiment, the wire-bonding pads 182 and 183 include a high RF loss plating material. In a further embodiment, the wire bonding pads 182 and 183 include Ni/Au. In a specific embodiment hereof, the wire bonding pads 182 and 183 are formed with plated edges and sidewalls as illustrated in FIG. 11. In another embodiment, the wire bonding pads 182 and 183 are formed with edges and sidewalls free from the surface plating material.

The layout of the RFIC 186 of FIG. 11 has been reconfigured to reduce the RF losses associated with the RF current flowing through the high RF loss bonding pad of the on-die passive device. The RFIC 186 includes an RF output 187 and an on-die passive device such as a capacitor 188. The RF output 187 is the location on the RFIC 186 from which the RF output signal from the RFIC's internal circuitry exits the RFIC 186 and inputs into the RF circuitry of the module 178. In an embodiment hereof, the layout of the RFIC 186 is configured such that the capacitor 188 is placed in the RF circuit 181 of the RF module 178 before the RF output 187. In this layout, when the RF output 187 is wire bonded to wire bonding pad 183 and the on-die capacitor 188 is wire bonded to wire bonding pad 182, the on-die capacitor 188 is not between the RF output 187 of the RFIC 186 and the RF output of the module 178.

The arrow 173 again indicates the direction of RF current flow of the RF signal. As shown, the RF current flows from the RF output signal 187 to the RF output of the module 178. In FIG. 11, the passive device bonding pad 182 is located in the RF upper path. In other words, the RF current does not pass through the passive device wire-bond pad 182 when traveling from the RF output 187 to the rest of the circuitry on the substrate 179. Thus, in an embodiment hereof, placing the on-die passive device in the layout of the RFIC 186 such that bonding pad 182 on the substrate 179 for the on-die passive device is in the RF upper signal path reduces the RF signal loss that is associated with placing the on-die passive device bonding pad 182 in the RF signal down path.

To reduce costs, in some embodiments, Ni/Pd/Au instead of Ni/Au is plated onto the surface traces of substrates for RFIC modules to form wire-bond areas. However, Ni/Pd/Au has a higher RF sheet resistance than Ni/Au and this leads to higher RF losses for signals traveling through Ni/Pd/Au wire-bond areas than for signals traveling through Ni/Au wire-bond areas. To reduce the RF losses associated with high RF loss plating such as for example Ni/Pd/Au plating, an on-die passive device such as a capacitor, resistor, inductor, or the like, associated with an RFIC is placed in an RF upper path with respect to the RFIC output signal. By laying out the IC with the passive device in the RF signal upper path, the RF signal current does not pass through the high RF loss bonding pad of the passive device when module is assembled.

While certain embodiments presented herein have been described with respect to Ni/Pd/Au surface plating, the disclosed systems and methods apply to any high RF loss surface plating such as, for example Sn, Pb, other surfaces of ferromagnetic materials, and the like. This detailed description of certain embodiments is not intended to be exhaustive or to limit the invention to the precise form disclosed here in this section of the present disclosure. While specific embodiments of, and examples for, the invention are described above for illustrative purposes, various equivalent modifications are possible within the scope of the invention, as those ordinary skilled in the relevant art may recognize given the disclosure provided herein.

IV. Bipolar Transistors Having Collector with Grading

This section of the present disclosure relates to bipolar transistors, such as hetero-junction bipolar transistors, having at least one grading in the collector. One aspect of this disclosure is a bipolar transistor that includes a collector having a high doping concentration at a junction with the base and at least one grading in which doping concentration increases away from the base. In some embodiments hereof, the high doping concentration can be at least about $3 \times 10^{16}$ $cm^3$. According to certain embodiments, the collector includes two gradings. Such bipolar transistors can be implemented, for example, in power amplifiers. As indicated above, these aspects of the present invention may be combined with other aspects hereof to better improve the performance of power amplifier modules and the devices in which they are employed.

Further as generally described, aspects of this section of the present disclosure relate to a bipolar transistor having a high doping concentration (for example, at least about $3 \times 10^{16}$ $cm^{-3}$) in a first collector region abutting a base and at least one grading in another collector region adjacent the first collector region. A high doping concentration in a first collector region abutting a base of the bipolar transistor can improve second channel linearity measures, such as ACPR2 and/or ACLR2, in power amplifier systems. However, the high doping concentration in the first collector region can also decrease a gain of the bipolar transistor, such as the RF gain. To offset the decrease in the gain resulting from the high doping concentration in the first collector region, one or more gradings may be included in the other collector region to transition from the high doping concentration in the first collector region to a sub-collector. In some embodiments hereof, the other collector region includes two different gradings in which doping concentration varies (for example, increases) at different rates away from the base. Properly selecting the grading, or multiple gradings when more than one is desired, and the doping concentration in the first collector region can result in desirable RF gain and ruggedness characteristics of the bipolar transistor, especially compared to if the bipolar transistor included a flat doped or step doped collector structure.

Experimental data indicate that power amplifier systems that include such bipolar transistors can meet demanding second channel linearity specifications and also meet RF gain specifications. For instance, a power amplifier system including such a bipolar transistor can have an ACPR2 of no greater than about −65 dBc and a gain of at least about 29 dBm when operating at a frequency within a frequency band centered around approximately 833 MHz. In contrast, purely circuit design techniques that have been attempted to achieve desired levels of ACPR2 or ACLR2 have had limited success. Moreover, other bipolar transistors with enhanced ACPR2 and/or ACLR2 had degraded RF gain.

With reference now to FIG. 12A, there is shown an illustrative cross section of a bipolar transistor 189 according to one particular embodiment hereof. As illustrated, the bipolar transistor 189 is a heterojunction bipolar transistor (HBT). The bipolar transistor 189 can be formed on a substrate 191. The substrate 191 can be a semiconductor substrate, such as a GaAs substrate. The bipolar transistor 189 can be disposed between isolation regions 193 and 195. Isolation regions 193 and 195 are non-conductive regions that can provide electrical isolation between the bipolar transistor 189 and an adjacent transistor or other circuit element. Isolations regions 193 and 195 can each include, for example, a trench filled with nitride, polyimide, or other material suitable for electrical isolation. Although not shown, it will be understood that one or more buffer layers can be included between the substrate 191 and a sub-collector 192. The one or more buffer layers can include implant damaged material that renders such material semi-insulating.

The bipolar transistor 189 can include a collector 194, a base 196, and an emitter 203. The collector 194 can include a plurality of collection regions having different doping profiles. For instance, the collector 194 can include a first collector region 197 abutting the base 196 and another collector region 201 that includes at least one grading in which doping concentration increases away from the first collector region 197. As illustrated in FIG. 12A, the other collector region 201 can include a second collector region 198 under the first collector region 197 and a third collector region 199 under the second collector region 198.

The first collector region 197 can abut the base 196 to form a collector-base junction. The collector-base junction can be a p-n junction. The first collector region 197 can include N+ doped GaAs. The first collector region 197 can be a flat doped region. Thus, within the first collector region 197, the doping concentration can be substantially constant. The doping concentration in the first collector region 197 at the collector-base interface of the bipolar transistor 189 can influence linearity of a system that includes the bipolar transistor 189. For instance, the doping concentration of the first collector region 197 together with the thickness of the first collector region 197 can influence ACPR2 and/or ACLR2 of a power amplifier system. Lower doping concentrations of the first collector region 197 together with smaller thickness of the first collector region 197 may not achieve a desired level of ACPR2 and/or ACLR2. On the other hand, higher doping concentrations of the first collector region 197 together with larger thickness of the first collector region 197 may degrade a gain of the bipolar transistor 189 such that a system including the bipolar transistor 189 does not meet gain specifications, such as RF gain specifications. In view of this trade-off, particular values of the doping concentration of the first collector region 197 and the thickness of the first collector region 197 may need to be selected to achieve both a desired gain and a desired linearity. As one example, for a GaAs bipolar transistor 189, FIG. 12B indicates that the first collector region 197 has a doping concentration of $6 \times 10^{16}$ cm$^{-3}$ and a thickness of 2000 Å.

The first collector region 197 can have a doping concentration that is selected to meet ACPR2 and/or ACLR2 specifications of a power amplifier system that includes the bipolar transistor 189. As one example, the first collector region 197 can have a doping concentration selected such that the a system that includes the bipolar transistor 189 has an ACPR2 of no greater than about −65 dBc and a gain of at least about 29 dBm when operating at a frequency within a frequency band centered around approximately 833 MHz. In some embodiments, the first collector region 197 can have a doping concentration selected such that the a system that includes the bipolar transistor 189 has an ACPR2 of no greater than about −55 dBc, no greater than about −57 dBc, no greater than about −60 dBc, no greater than about −62 dBc, no greater than about −65 dBc, no greater than about −67 dBc, no greater than about −70 dBc, no greater than about −72 dBc, or no greater than about −75 dBc. These values of ACPR2 can hold for an entire range of output power of the system and/or for one or more frequency bands of operation within the RF frequency range. As one example, to meet some ACPR2 and/or ACLR2 specifications, the first collector region 197 can have a doping concentration of at least about $3 \times 10^{16}$ cm$^{-3}$.

In some specific embodiments hereof, the first collector region 197 can have a doping concentration of at least about $3 \times 10^{16}$ cm$^{-3}$, at least about $3.5 \times 10^{16}$ cm$^{-3}$, at least about $4 \times 10^{16}$ cm$^{-3}$, at least about $4.5 \times 10^{16}$ cm$^{-3}$, at least about $5 \times 10^{16}$ cm$^{-3}$, at least about $5.5 \times 10^{16}$ cm$^{-3}$, at least about $6 \times 10^{16}$ cm$^{-3}$, at least about $6.5 \times 10^{16}$ cm$^{-3}$, at least about $7 \times 10^{16}$ cm$^{-3}$, at least about $7.5 \times 10^{16}$ cm$^{-3}$, at least about $8 \times 10^{16}$ cm$^{-3}$, at least about $8.5 \times 10^{16}$ cm$^{-3}$, or at least about $9 \times 10^{16}$ cm$^{-3}$. According to certain embodiments, the first collector region 197 can have a doping concentration selected within one of the following ranges: about $3 \times 10^{16}$ cm$^{-3}$ to $9 \times 10^{16}$ cm$^3$, about $3 \times 10^{16}$ cm$^{-3}$ to $8 \times 10^{16}$ cm$^{-3}$, about $3 \times 10^{16}$ cm$^{-3}$ to $7 \times 10^{16}$ cm$^{-3}$, about $3 \times 10^{16}$ cm$^{-3}$ to $6 \times 10^{16}$ cm$^{-3}$, about $3 \times 10^{16}$ cm$^{-3}$ to $5 \times 10^{16}$ cm$^{-3}$, about $4 \times 10^{16}$ cm$^{-3}$ to $9 \times 10^{16}$ cm$^{-3}$ about $4 \times 10^{16}$ cm$^{-3}$ to $8 \times 10^{16}$ cm$^{-3}$, about $4 \times 10^{16}$ cm$^{-3}$ to $7 \times 10^{16}$ cm$^{-3}$, about $4 \times 10^{16}$ cm$^{-3}$ to $6 \times 10^{16}$ cm$^{-3}$, about $4 \times 10^{16}$ cm$^{-3}$ to $5 \times 10^{16}$ cm$^3$, about $5 \times 10^{16}$ cm$^{-3}$ to $9 \times 10^{16}$ cm$^{-3}$, about $5 \times 10^{16}$ cm$^{-3}$ to $8 \times 10^{16}$ cm$^{-3}$, about $5 \times 10^{16}$ cm$^{-3}$ to $7 \times 10^{16}$ cm$^{-3}$, about $5 \times 10^{16}$ cm$^{-3}$ to $6 \times 10^{16}$ cm$^{-3}$, about $6 \times 10^{16}$ cm$^{-3}$ to $9 \times 10^{16}$ cm$^{-3}$, about $6 \times 10^{16}$ cm$^{-3}$ to $8 \times 10^{16}$ cm$^{-3}$, about $6 \times 10^{16}$ cm$^{-3}$ to $7 \times 10^{16}$ cm$^{-3}$, about $7 \times 10^{16}$ cm$^{-3}$ to $9 \times 10^{16}$ cm$^{-3}$, about $7 \times 10^{16}$ cm$^{-3}$ to $8 \times 10^{16}$ cm$^{-3}$, or about $8 \times 10^{16}$ cm$^{-3}$ to $9 \times 10^{16}$ cm$^{-3}$.

The thickness of the first collector region 197 can be selected in the range from about 500 Å to 4000 Å in accordance with certain embodiments. In some of these embodiments, the thickness of the first collector region 197 can be selected within one of the following ranges: about 500 Å to 1000 Å, about 1000 Å to 2000 Å, about 1000 Å to 3000 Å, about 1500 Å to 2000 Å, about 2000 Å to 3000 Å, about 2000 Å to 4000 Å, about 2500 Å to 4000 Å, or about 3000 Å to 4000 Å. Any of these thickness ranges can be implemented in combination with any of the doping concentrations discussed earlier. In the bipolar transistor 189 of FIG. 12A, the thickness of the first collector region 197 can be measured as a shortest distance between the base 196 and the other collector region 201.

Higher doping concentrations in the first collector region 197 can reduce the RF gain of the bipolar transistor 189. In order to meet RF gain specifications of a system that includes the bipolar transistor 189, such as a power amplifier system, other changes to features of the bipolar transistor 189 may need to counteract such a decrease in RF gain. One or more gradings in the other collector region 201 of the bipolar transistor 189 can compensate for some or all of the losses in RF gain associated with a higher doping concentration in the first collector region 197. At the same time, ACPR2 and/or ACLR2 specifications of a power amplifier system that includes the bipolar transistor 189 can still be met.

The other collector region 201 can include multiple gradings in which doping varies at different rates. As illustrated in FIGS. 12A and 12B, the other collector region 201 can include a second collector region 198 having the first grading and a third collector region 199 having the second grading. In the first grading, the doping concentration can increase in a direction away from the base 196. The doping concentration can also increase in a direction away from the base 196 in the second grading. The doping concentration can increase at a different rate in the second grading than in the first grading. For instance, as illustrated in FIG. 12B, the doping concentration can increase at a greater rate in the second grading than in the first grading. In some other implementations hereof, the first grading and the second grading can have respective doping concentrations that increase at substantially the same rate. For instance, there can be a discontinuity in doping concentration where the collector transitions from the first grading to the second grading and/or there can be a collector region with a flat doping between the first grading and the second grading. The first grading and/or the second grading can vary linearly or non-linearly (for example, parabolically). In the example illustrated in FIG. 12B, the first grading and the second grading can both have doping concentrations that vary linearly.

The second collector region 198 can include N− doped GaAs. The first grading can span the second collector region 198. The doping concentration in the second collector region 198 can increase away from the base 196 and the first collector region 197. In some embodiments, the doping concentration of the second collector region 198 adjacent the first collector region 197 can begin at a doping concentration that is about one order of magnitude lower than the doping concentration of the first collector region 196. For example, as shown in FIG. 12B, the doping concentration of the first collector region 196 can be about $6 \times 10^{16}$ cm$^{-3}$ and the lowest doping concentration of the second collector region can be about $7.5 \times 10^{15}$ cm$^{-3}$. As also shown in FIG. 12B, the second collector region 198 can have a thickness of about 5000 Å and the doping concentration can grade from about $7.5 \times 10^{15}$ cm$^{-3}$ at an interface with the first collector region 196 to $3 \times 10^{16}$ cm$^{-3}$ at an interface with the third collector region 199. In some embodiments, the doping concentration at the interface with the third collector region 199 can be substantially the same where the first grading meets the second grading. This can reduce discontinuities in capacitance associated with the collector 194. The first grading can reduce base to collector capacitance and consequently increase a gain, such as an RF gain, of the bipolar transistor 189.

The third collector region 199 can include N− doped GaAs. The second grading can span the third collector region 199. The doping concentration in the third collector region 199 can increase away from the second collector region 198. The doping concentration of the third collector region 199 adjacent the second collector region 198 can have a doping concentration that is approximately equal to the maximum doping concentration of the second collector region 198. As also shown in FIG. 12B, the third collector region 199 can have a thickness of about 3000 Å and the doping concentration can grade from about $3 \times 10^{16}$ cm$^{-3}$ at an interface with the second collector region 198 to $6 \times 10^{16}$ cm$^{-3}$ at an interface with the sub-collector 192. In some embodiments, the maximum doping concentration of the third collector region 199 can be about two orders of magnitude lower than the doping concentration of the sub-collector 192. For example, as shown in FIG. 12B, the maximum doping concentration of the third collector region 199 can be about $6 \times 10^{16}$ cm$^{-3}$ and the doping concentration of the sub-collector 192 can be about $5 \times 10^{18}$ cm$^{-3}$.

The doping concentration of the third collector region 199 at an interface with the sub-collector 192 can determine a breakdown voltage from collector to emitter with the base having a resistor coupled to a potential. Such a breakdown voltage can be referred to as "$BV_{CEX}$." A higher $BV_{CEX}$ can increase a safe operating region (SOA). Higher doping in the third collector region 199 at the interface with the sub-collector 192 can reduce the SOA. Doping the third collector region 199 at the interface with the sub-collector 192 too low can result in a breakdown current that is too steep, thereby reducing robustness of the bipolar transistor 189. In certain embodiments, the doping concentration in the third collector region 199 at the interface with the sub-collector 192 can be selected in the range from about $5 \times 10^{16}$ cm$^{-3}$ to $9 \times 10^{16}$ cm$^{-3}$. Such doping concentrations can result in desirable $BV_{CEX}$ values for the bipolar transistor 189 and/or a desirable SOA. More detail regarding $BV_{CEX}$ values associated with the bipolar transistor 189 will be provided with reference to FIG. 13.

The base 196 can include P+ doped GaAs. The base 196 can be thinner and/or have a higher doping concentration than bases in other bipolar transistors used in power amplifier systems. Reducing the thickness of the base 196 and increasing the doping concentration of the base 196 can increase the RF gain and keep the DC gain substantially the same. For example, in certain implementations, the doping concentration of the base 196 can be selected in a range from about $2 \times 10^{19}$ cm$^{-3}$ to $7 \times 10^{19}$ cm$^{-3}$. The thickness of the base 196 can be selected in the range from about 350 Å to 1400 Å according to certain implementations. In some implementations, the thickness of the base 196 can be selected in the range from about 500 Å to 900 Å. Any base thicknesses selected from the ranges disclosed herein can be implemented in combination with any of the base doping concentrations selected from the ranges disclosed herein. As one example, the base 196 can have a doping concentration of $5.5 \times 10^{19}$ cm$^{-3}$ and a thickness of 500 Å. In the bipolar transistor 189 of FIG. 12A, thickness can be the shortest distance between the emitter 203 and the first collector region 196.

The product of the doping and the thickness of the base 196 can be referred to as a "Gummel number." In some embodiments, the Gummel number can be approximately constant such that the bipolar transistor 189 can have an approximately constant beta value. For example, increasing the thickness of the base 196 within a selected range can be accompanied by a corresponding decrease in doping concentration of the base 196 to hold the Gummel number approximately constant. As another example, decreasing the thickness of the base 196 within a selected range can be accompanied by a corresponding increase in doping concentration of the base 196 to hold the Gummel number approximately constant. Reducing the thickness of the base 196 and increasing the doing of the base 196 can result in insignificant changes in resistance associated with the base 196. For instance, changing the thickness of the base 196 from 900 Å to 500 Å and changing the doping concentration of the base 196 from $4 \times 10^{19}$ cm$^{-3}$ to $5.5 \times 10^{19}$ cm$^{-3}$ may not have a significant effect on resistance of the base 196.

The bipolar transistor 189 can include a collector contact 208 to the collector, base contact(s) 209 to the base 196, and an emitter contact 212 to the emitter 202. These contacts can provide an electrical connection to and/or from the bipolar transistor 189. The contacts 208, 209, and 212 can be formed of any suitable conductive material. As illustrated in FIG. 12A, the emitter contact 212 can be disposed over a top contact 207, a bottom contact 206, and an emitter cap 202.

The bipolar transistor 189 can include the sub-collector 192 over the substrate 191. The sub-collector 192 can be under the other collector region 201. For example, as illustrated in FIG. 12A, the sub-collector 192 can be disposed between the third collector region 199 and the substrate 191. The sub-collector 192 can abut the third collector region 199. The sub-collector 192 can be a flat doped region. In some embodiments, the doping concentration of the sub-collector 192 can be at least one or two orders of magnitude higher than the highest doping concentration of the third collector region 199. As shown in FIG. 12B, the sub-collector 192 can have a doping concentration on the order of $5 \times 10^{18}$ cm$^{-3}$ and have a thickness of at least about 8000 Å in certain embodiments. The collector contact 208 physically contacting the sub-collector 192 can provide an electrical connection to the collector 194.

FIG. 12C is a legend 200 illustrating example materials corresponding to portions of the bipolar transistor 189 of FIG. 12A. Dashed lines between FIG. 12A and FIG. 12C are included to indicate that materials in the legend 200 correspond to particular portions of the bipolar transistor 189. The legend 200 indicates that, in certain embodiments, the substrate 191 can be semi-insulating GaAs, the sub-collector 192 can be N+ GaAs, the third collector region 199 can be N− GaAs, the second collector region 198 can be N− GaAs, the first collector region 197 can be N+ GaAs, the base 196 can be P+ GaAs, the emitter 203 can be N− InGaP, the emitter cap 202 can be N− GaAs, the bottom contact 206 can be N+ GaAs, and the top contact 207 can be InGaAs. It should be understood that in some embodiments, one or more of the regions of the bipolar transistor 189 can include a suitable alternative material instead of the example materials provided in the legend 200. Moreover, in any of the bipolar transistors described herein n-type doping and p-type doping can be interchanged throughout some or all of the transistor. Thus, any combination of features described herein can be applied to NPN transistors and/or PNP transistors.

Experimental data indicate that a power amplifier system including the bipolar transistor 189 of FIG. 12A has met currently linearity specifications, including ACPR2 and ACLR2, and RF gain specifications that have been particularly challenging to meet. Moreover, experimental data indicate that the bipolar transistor 189 of FIG. 12A has desirable ruggedness qualities, for example, as indicated by $BV_{CEX}$ values and the safe operating region (SOA).

FIG. 13 is a graph that illustrates relationships between $BV_{CEX}$ and current density for the bipolar transistor 100 of FIG. 12A and a conventional bipolar transistor. In FIG. 13, "+" symbols represent data corresponding to the bipolar transistor 189 and "○" symbols represent data corresponding to a current, state of the art bipolar transistor. As mentioned earlier, $BV_{CEX}$ can represent a breakdown voltage from collector to emitter in a bipolar transistor with the base having a resistor coupled to a potential.

In FIG. 13, the SOA is represented by the area below the illustrated $BV_{CEX}$ curves. When a bipolar transistor operates at a voltage and current density corresponding to its $BV_{CEX}$ curve, the bipolar transistor reaches a point at which it breaks down. Moreover, when a bipolar transistor operates at a voltage and current density that are above its corresponding $BV_{CEX}$ curve, the bipolar transistor breaks down.

The data in FIG. 13 indicate that the bipolar transistor 189 operates within the SOA when operating at voltages below a $BV_{CEX}$ value on the corresponding $BV_{CEX}$ curve at a particular current density. The data in FIG. 13 also indicate that the bipolar transistor 189 operates within the SOA when operating at current densities below the current density on the corresponding $BV_{CEX}$ at particular voltage level. Further, so long as a voltage and current density combination is below the $BV_{CEX}$ curve, the bipolar transistor should operate within the SOA. As shown in FIG. 13, the bipolar transistor 189 has a larger SOA than the conventional bipolar transistor. The bipolar transistor 189 has increased ruggedness compared to the conventional bipolar transistor because it has a larger SOA and can operate at higher current densities and voltages without breaking down. Thus, the bipolar transistor 189 has desirable ruggedness characteristics.

FIG. 14A depicts an illustrative cross section of a bipolar transistor 213 according to another embodiment. The bipolar transistor 213 of FIG. 14A is substantially the same as the bipolar transistor 189 of FIG. 12A except the collector region 217 of FIG. 14A is different from the other collector region 201 of FIG. 12A. More specifically, the collector region 217 herein shown in FIG. 14A has a different doping profile than the other collector region 201 of FIG. 12A. FIG. 14B is a graph that shows illustrative doping concentrations of portions of the bipolar transistor 213 of FIG. 14A.

The bipolar transistor 213 may similarly include a collector 194 having a first collector region 197 and another collector region 217. The first collector region 197 can include any combination of features described with reference to the first collector region 197 of FIG. 12A. The other collector region 217 can include a single grading in which doping concentration varies (for example, increases) away from the base 196.

In order to meet RF gain specifications of a system, such as a power amplifier system that includes the bipolar transistor 213, the single grading in the other collector region 217 of the bipolar transistor 213 can compensate for some or all of the losses in RF gain associated with a higher doping concentration in the first collector region 197. At the same time, ACPR2 and/or ACLR2 specifications of a power amplifier system that includes the bipolar transistor 213 can still be met. The other collector region 217 can include a second collector region 214 and a third collector region 216 as illustrated in FIGS. 14A and 14B. In other embodiments, for example, as shown in FIGS. 14D-14F, the flat doped portion can be omitted from the collector region 217.

As illustrated in FIGS. 14A and 14B, the collector region 217 can include a second collector region 214 having a flat doping. The second collector region 214 can include N-doped GaAs. In some embodiments, the doping concentration of the second collector region 214 has at a doping concentration that is about one order of magnitude lower than the doping concentration of the first collector region 197. According to certain embodiments, the doping concentration of the second collector region can be selected from the range of about $7.5 \times 10^{15}$ cm$^{-3}$ to $1.5 \times 10^{16}$ cm$^{-3}$. The second collector region 214 can have a thickness selected from the range from about 2000 Å to 4000 Å. In some embodiments, the doping concentration of the second collector region 214 can be approximately equal to the doping concentration at which the third collector region 216 begins to grade. This can reduce discontinuities in capacitance associated with the collector 194.

The third collector region 216 can include N− doped GaAs. The single grading can span the third collector region 216. In other embodiments, for example, as shown in FIGS. 14D-14F, the single grading can span a respective collector region 219. The doping concentration in the third collector region 216 of FIG. 14A, can increase away from the base 196, the first collector region 197, and/or the second collector region 214. The doping concentration of the third collector region 216 adjacent the second collector region 214 can have a doping concentration that is approximately equal to the doping concentration of the second collector region 214. The third collector region 216 can have a thickness selected from the range from about 4000 Å to 7000 Å. The doping concentration in the third collector region 216 can grade from about $7.5 \times 10^{15}$ cm$^{-3}$ at an interface with the second collector region 214 to at least about $5 \times 10^{16}$ cm$^{-3}$ at an interface with the sub-collector 192. In some embodiments, the maximum doping concentration of the third collector region 216 can be about two orders of magnitude lower than the doping concentration of the sub-collector 192.

With continuing reference to FIG. 14A, the doping concentration of the third collector region 216 at an interface with the sub-collector 192 can determine $BV_{CEX}$. Higher doping in the third collector region 216 at the interface with the sub-collector 192 can reduce the SOA. Doping the third collector region 216 at the interface with the sub-collector 192 too low can result in a breakdown current that is too steep, thereby reducing robustness of the bipolar transistor 213. In certain embodiments, the doping concentration in the third collector region 216 at the interface with the sub-collector 192 can be selected in the range from about $5 \times 10^{16}$ cm$^{-3}$ to $9 \times 10^{16}$ cm$^{-3}$. Such doping concentrations can result in desirable $BV_{CEX}$ values for the bipolar transistor 213 and/or a desirable SOA.

As shown in the legend 200 of FIG. 14C, the bipolar transistor 213 can be formed of substantially the same materials as the bipolar transistor 189, with a different doping profile in the collector 194.

FIG. 14D depicts an illustrative cross section of a bipolar transistor 218 according to another embodiment hereof. The bipolar transistor 218 of FIG. 14D is substantially the same as the bipolar transistor 213 of FIG. 14A except the collector region 219 of FIG. 14D is different from the collector region 217 of FIG. 14A. More specifically, a grading spans the collector region 219 in FIG. 14D. The collector 194 of the bipolar transistor 218 can consist of the first collector region 197 and the other collector region 219. As illustrated in FIG. 14D, the collector 194 of the bipolar transistor 218 only includes the first collector region 197 and the second other collector region 219. FIG. 14E is a graph that shows illustrative doping concentrations of portions of the bipolar transistor 218 of FIG. 14D. As shown in the legend 200 of FIG. 14F, the bipolar transistor 218 can be formed of substantially the same materials as the bipolar transistor 189 and/or the bipolar transistor 213, with a different doping profile in the collector 194.

The bipolar transistor 218 can include the collector 194 having a first collector region 197 and another collector region 219. The first collector region 197 can include any combination of features described with reference to the first collector region 197 of FIG. 12A. The collector region 219 can include a single grading in which doping concentration varies (for example, increases) away from the base 196 and spans the entire collector region 219.

In order to meet RF gain specifications of a system, such as a power amplifier system, that includes the bipolar transistor 218, the single grading in the collector region 219 of the bipolar transistor 218 can compensate for some or all of the losses in RF gain associated with a higher doping concentration in the first collector region 197. At the same time, ACPR2 and/or ACLR2 specifications of a power amplifier system that includes the bipolar transistor 218 can still be met. The grading in the other collector region 219 can increase $BV_{CEX}$ and/or SOA of the bipolar transistor 218. For instance, in certain embodiments, the doping concentration in the collector region 219 can have a doping concentration at the interface with the sub-collector 192 which can be selected in the range from about $5 \times 10^{16}$ cm$^{-3}$ to $9 \times 10^{16}$ cm$^{-3}$. The collector region 219 can have any suitable thickness or grading described herein to achieve one or more features described herein. In some embodiments, the collector region can have a thickness selected from the range from about 4000 Å to 7000 Å. According to certain embodiments, the grading in the collector 219 can grade from about $7.5 \times 10^{15}$ cm$^{-3}$ at an interface with the first collector region 197 to at least about $5 \times 10^{16}$ cm$^{-3}$ at an interface near or at the sub-collector 192.

FIG. 15 is an illustrative flow diagram of a process 221 of forming a bipolar transistor according to an embodiment of methods relating hereof. It will be understood that any of the processes discussed herein may include greater or fewer operations and the operations may be performed in any order, as appropriate. Further, one or more acts of the process can be performed either serially or in parallel. The process 221 can be performed while forming the bipolar transistor 189 of FIG. 12A, the bipolar transistor 213 of FIG. 14A, the bipolar transistor 218 of FIG. 14D, or any combination thereof. At block 222, a sub-collector of a bipolar transistor is formed. The sub-collector can include any combination of features of the sub-collectors described herein, for example, the sub-collector 192. A collector region can be formed that includes at least one grading at block 223. The at least one grading can be formed by any suitable doping method known in the art. The collector region can be adjacent the sub-collector, for example, directly over the sub-collector in the orientation of FIGS. 12A, 14A, and 14D. The collector region can include any combination of features described herein with reference to the other collector regions 201, 217, and/or 219. For instance, the collector region can have two gradings in some embodiments. The at least one grading of the collector region can increase the RF gain of the bipolar transistor and/or increase the ruggedness of the bipolar transistor. For example, the at least one grading can compensate for some or all of the decrease in gain of the bipolar transistor that results from the high doping concentration in the first collector region. A different collector region having a high doping concentration can be formed abutting the base at block 224. The high doping concentration can be any of the doping concentrations of the first collector region 197 described herein, for example, at least about $3.0 \times 10^{16}$ cm$^{-3}$. Moreover, the high doping concentration and the thickness of the first collector region can together improve one or more second channel linearity measures.

FIG. 16 is a schematic block diagram of a module 226 that can include one or more bipolar transistors 189 of FIG. 12A, one or more bipolar transistors 213 of FIG. 14A, one or more bipolar transistors 218 of FIG. 14D, or any combination thereof. The module 226 can be some or all of a power amplifier system. The module 226 can be referred to as multi-chip module and/or a power amplifier module in some implementations. The module 226 can include a substrate 227 (for example, a packaging substrate), a die 228 (for example, a power amplifier die), a matching network 229, the like, or any combination thereof. Although not illustrated, the module 226 can include one or more other die and/or one or more circuit elements that coupled to the substrate 227 in some implementations. The one or more other die can include, for example, a controller die, which can include a power amplifier bias circuit and/or a direct current-to-direct current (DC-DC) converter. Example circuit elements mounted on the packaging substrate can include, for example, any desired number of inductors, capacitors, impedance matching networks, and the like, or any combination thereof.

The module 226 can include a plurality of die and/or other components mounted on and/or coupled to the substrate 227 of the module 226. In some implementations, the substrate 227 can be a multi-layer substrate configured to support the die and/or components and to provide electrical connectivity to external circuitry when the module 226 is mounted on a circuit board, such as a phone board.

The power amplifier die 228 can receive a RF signal at an input pin RF_IN of the module 226. The power amplifier die 228 can include one or more power amplifiers, including, for example, multi-stage power amplifiers configured to amplify the RF signal. The power amplifier die 228 can include an input matching network 231, a first stage power amplifier 232 (which can be referred to as a driver amplifier (DA)), an inter-stage matching network 233, a second stage power amplifier 234 (which can be referred to as an output amplifier (OA)), or any combination thereof.

A power amplifier can include the first stage power amplifier 232 and the second stage power amplifier 234. The first stage power amplifier 232 and/or the second stage power amplifier 234 can include one or more bipolar transistors 189 of FIG. 12A, one or more bipolar transistors 213 of FIG. 14A, one or more bipolar transistors 218 of FIG. 14D, or any combination thereof. Moreover, the bipolar transistor 189 of FIG. 12A, the bipolar transistor 213 of FIG. 14A and/or the bipolar transistor 218 of FIG. 14D can help meet the power module 226 and/or the power amplifier die 228 to meet any of the linearity and/or RF gain specifications described herein.

The RF input signal can be provided to the first stage power amplifier 232 via the input matching network 231. The matching network 231 can receive a first stage bias signal. The first bias signal can be generated on the PA die 228, outside of the PA die 228 in the module 226, or external to the module 226. The first stage power amplifier 232 can amplify the RF input and provide the amplified RF input to the second stage power amplifier 234 via the inter-stage matching circuit 233. The inter-stage matching circuit 233 can receive a second stage bias signal. The second stage bias signal can be generated on the PA die 228, outside of the PA die 228 in the module 226, or external to the module 226. The second stage power amplifier 234 can generate the amplified RF output signal.

The amplified RF output signal can be provided to an output pin RF_OUT of the power amplifier die 228 via an output matching network 229. The matching network 229 can be provided on the module 226 to aid in reducing signal reflections and/or other signal distortions. The power amplifier die 228 can be any suitable die. In some implementations, the power amplifier 228 die is a gallium arsenide (GaAs) die. In some of these implementations, the GaAs die has transistors formed using a heterojunction bipolar transistor (HBT) process.

The module 226 can also include a one or more power supply pins, which can be electrically connected to, for example, the power amplifier die 228. The one or more power supply pins can provide supply voltages to the power amplifiers, such as $V_{SUPPLY1}$ and $V_{SUPPLY2}$, which can have different voltage levels in some implementations. The module 226 can include circuit elements, such as inductors, which can be formed, for example, by a trace on the multi-chip module. The inductors can operate as a choke inductor, and can be disposed between the supply voltage and the power amplifier die 228. In some implementations, the inductors are surface mounted. Additionally, the circuit elements can include capacitors electrically connected in parallel with the inductors and configured to resonate at a frequency near the frequency of a signal received on the pin RF_IN. In some implementations, the capacitors can include a surface mounted capacitor.

The module 226 can be modified to include more or fewer components, including, for example, additional power amplifier dies, capacitors and/or inductors. For instance, the module 226 can include one or more additional matching networks 229. As another example, the module 226 can include an additional power amplifier die, as well as an additional capacitor and inductor configured to operate as a parallel LC circuit disposed between the additional power amplifier die and the power supply pin of the module 226. The module 226 can be configured to have additional pins, such as in implementations in which a separate power supply is provided to an input stage disposed on the power amplifier die 228 and/or implementations in which the module 226 operates over a plurality of bands.

The module 226 can have a low voltage positive bias supply of about 3.2 V to 4.2 V, good linearity (for example, meeting any of the second channel linearity specification described herein), high efficiency (for example, PAE of approximately 40% at 28.25 dBm), large dynamic range, a small and low profile package (for example, 3 mm×3 mm×0.9 mm with a 10-pad configuration), power down control, support low collector voltage operation, digital enable, not require a reference voltage, CMOS compatible control signals, an integrated directional coupler, or any combination thereof.

In some implementations hereof, the module 226 is a power amplifier module that is a fully matched 10-pad surface mount module developed for Wideband Code Division Multiple Access (WCDMA) applications. This small and efficient module can pack full 1920-1980 MHz bandwidth coverage into a single compact package. Because of high efficiencies attained throughout the entire power range, the module 226 can deliver desirable talk-time advantages for mobile phones. The module 226 can meet the stringent spectral linearity requirements of High Speed Downlink Packet Access (HSDPA), High Speed Uplink Packet Access (HSUPA), and Long Term Evolution (LTE) data transmission with high power added efficiency. A directional coupler can be integrated into the module 226 and can thus eliminate the need for an external coupler.

The die 228 can be a power amplifier die embodied in a single gallium arsenide (GaAs) Microwave Monolithic Integrated Circuit (MIMIC) that includes all active circuitry of the module 226, such as one or more the bipolar transistors 189 of FIG. 12A, one or more bipolar transistors 213 of FIG. 14A, one or more bipolar transistors 218 of FIG. 14D, or any combination thereof. The MIMIC can include on-board bias circuitry, as well as input matching network 231 and inter-stage matching network 233. An output matching network 229 can have a 50 ohm load that is embodied separate from the die 228 within the package of the module 226 to increase and/or optimize efficiency and power performance.

The module 226 can be manufactured with a GaAs heterojunction bipolar transistor (HBT) BiFET process that provides for all positive voltage DC supply operation while maintaining high efficiency and good linearity (for example, meeting any of the second channel linearity specification described herein). Primary bias to the module 226 can be supplied directly or via an intermediate component from any three-cell Ni—Cd battery, a single-cell Li-Ion battery, or other suitable battery with an output in the range selected from about 3.2 to 4.2 V. No reference voltage is needed in some implementations. Power down can be accomplished by setting an enable voltage to zero volts. No external supply side switch is needed as typical "off" leakage is a few microamperes with full primary voltage supplied from the battery, according to some implementations.

Any of the devices, systems, methods, and apparatus described herein can be implemented in a variety of electronic devices, such as a mobile device, which can also be referred to as a wireless device. FIG. 17 is a schematic block diagram of an example mobile device 236 that can include one or more bipolar transistors 189 of FIG. 12A, one or more bipolar transistors 213 of FIG. 14A, one or more bipolar transistors 218 of FIG. 14D, or any combination thereof.

Examples of the mobile device 236 can include, but are not limited to, a cellular phone (for example, a smart phone), a laptop, a tablet computer, a personal digital assistant (PDA), an electronic book reader, and a portable digital media player. For instance, the mobile device 236 can be a multi-band and/or multi-mode device such as a multi-band/multi-mode mobile phone configured to communicate using, for example, Global System for Mobile (GSM), code division multiple access (CDMA), 3G, 4G, and/or long term evolution (LTE).

In certain embodiments, the mobile device 236 can include one or more of a switching component 237, a transceiver component 238, an antenna 239, power amplifiers 241 that can include one or more bipolar transistors 189 of FIG. 1A, one or more bipolar transistors 213 of FIG. 14A, one or more bipolar transistors 218 of FIG. 14D, a control component 242, a computer readable medium 243, a processor 244, a battery 246, and supply control block 247.

The transceiver component 238 can generate RF signals for transmission via the antenna 239. Furthermore, the transceiver component 238 can receive incoming RF signals from the antenna 239.

It should be understood that various functionalities associated with the transmission and receiving of RF signals can be achieved by one or more components that are collectively represented in FIG. 17 as the transceiver 238. For example, a single component can be configured to provide both transmitting and receiving functionalities. In another example, transmitting and receiving functionalities can be provided by separate components.

Similarly, it should be further understood that various antenna functionalities associated with the transmission and receiving of RF signals can be achieved by one or more components that are collectively represented in FIG. 17 as the antenna 239. For example, a single antenna can be configured to provide both transmitting and receiving functionalities. In another example, transmitting and receiving functionalities can be provided by separate antennas. In yet another example, different bands associated with the mobile device 236 can be provided with different antennas.

In FIG. 17, one or more output signals from the transceiver 238 are depicted as being provided to the antenna 239 via one or more transmission paths. In the example shown, different transmission paths can represent output paths associated with different bands and/or different power outputs. For instance, the two example power amplifiers 241 shown can represent amplifications associated with different power output configurations (e.g., low power output and high power output), and/or amplifications associated with different bands.

In FIG. 17, one or more detected signals from the antenna 239 are depicted as being provided to the transceiver 238 via one or more receiving paths. In the example shown, different receiving paths can represent paths associated with different bands. For example, the four example paths shown can represent quad-band capability that some mobile devices 236 are provided with.

To facilitate switching between receive and transmit paths, the switching component 237 can be configured to electrically connect the antenna 239 to a selected transmit or receive path. Thus, the switching component 237 can provide a number of switching functionalities associated with an operation of the mobile device 236. In certain embodiments, the switching component 237 can include a number of switches configured to provide functionalities associated with, for example, switching between different bands, switching between different power modes, switching between transmission and receiving modes, or some combination thereof. The switching component 237 can also be configured to provide additional functionality, including filtering of signals. For example, the switching component 237 can include one or more duplexers.

The mobile device 236 can include one or more power amplifiers 241. RF power amplifiers can be used to boost the power of a RF signal having a relatively low power. Thereafter, the boosted RF signal can be used for a variety of purposes, including driving the antenna of a transmitter. Power amplifiers 241 can be included in electronic devices, such as mobile phones, to amplify a RF signal for transmission. For example, in mobile phones having a an architecture for communicating under the 3G and/or 4G communications standards, a power amplifier can be used to amplify a RF signal. It can be desirable to manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot. A power amplifier module can include one or more power amplifiers.

FIG. 17 shows that in certain embodiments, a control component 242 can be provided, and such a component can include circuitry configured to provide various control functionalities associated with operations of the switching component 237, the power amplifiers 241, the supply control 247, and/or other operating components.

In certain embodiments hereof, the processor 244 can be configured to facilitate implementation of various functionalities described herein. Computer program instructions associated with the operation of any of the components described herein may be stored in the computer-readable memory 243 that can direct the processor 244, such that the instructions stored in the computer-readable memory produce an article of manufacture including instructions which implement the various operating features of the mobile devices, modules, etc. described herein.

The illustrated mobile device 236 also includes the supply control block 247, which can be used to provide a power supply to one or more power amplifiers 241. For example, the supply control block 247 can include a DC-to-DC converter. However, in certain embodiments the supply control block 247 can include other blocks, such as, for example, an envelope tracker configured to vary the supply voltage provided to the power amplifiers 241 based upon an envelope of the RF signal to be amplified.

The supply control block 247 can be electrically connected to the battery 246, and the supply control block 247 can be configured to vary the voltage provided to the power amplifiers 241 based on an output voltage of a DC-DC converter. The battery 246 can be any suitable battery for use in the mobile device 236, including, for example, a lithium-ion battery. With at least one power amplifier 241 that includes one or more bipolar transistors 189 of FIG. 1A, one or more bipolar transistors 213 of FIG. 14A, one or more bipolar transistors 218 of FIG. 14D, or any combination thereof, the power consumption of the battery 246 can be reduced and/or the reliability of the power amplifier 241 can be improved, thereby improving performance of the mobile device 236.

Some of the embodiments described above have provided examples in connection with modules and/or electronic devices that include power amplifiers, such as mobile phones. However, the principles and advantages of the embodiments can be used for any other systems or apparatus that have needs for a bipolar transistor with a high level of second channel linearity without sacrificing RF gain.

Systems implementing one or more aspects of the present disclosure can be implemented in various electronic devices. Examples of electronic devices can include, but are not limited to, consumer electronic products, parts of the consumer electronic products, electronic test equipment, etc. More specifically, electronic devices configured to implement one or more aspects of the present disclosure can include, but are not limited to, an RF transmitting device, any portable device having a power amplifier, a mobile phone (for example, a smart phone), a telephone, a base station, a femto-cell, a radar, a device configured to communication according to the WiFi and/or Bluetooth standards, a television, a computer monitor, a computer, a hand-held computer, a tablet computer, a laptop computer, a personal digital assistant (PDA), a microwave, a refrigerator, an automobile, a stereo system, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Part of the consumer electronic products can include a multi-chip module including an RF transmission line, a power amplifier module, an integrated circuit including an RF transmission line, a substrate including an RF transmission line, the like, or any combination thereof. Moreover, other examples of the electronic devices can also include, but are not limited to, memory chips, memory modules, circuits of optical networks or other communication networks, and disk driver circuits. Further, the electronic devices can include unfinished products.

V. Dual Mode Power Amplifier Control with Three-Mode Input/Output Interface

In accordance with some embodiments hereof, this section of the present disclosure relates to a dual mode control interface that can be used to provide both a radio frequency front end (RFFE) serial interface and a three-mode general purpose input/output (GPIO) interface within a single digital control interface die. In certain embodiments, the dual mode control interface, or digital control interface, can communicate with a power amplifier. Further, the dual mode control interface can be used to set the mode of the power amplifier. As indicated above, these aspects of the present invention may be combined with other aspects hereof to further improve the performance of power amplifier modules and the devices in which they are employed.

When a new standard is introduced, or an existing standard is modified, it is often necessary to introduce new components or modify existing components to take advantage of the new or updated standards. For example, the adoption of the MIPI® RF Front End (RFFE) standard serial interface for supporting multiple configuration modes within a module, such as a power amplifier module, may mean that device manufacturers who wish to support the new standard may need to use a new front end component that supports the RFFE standard. Manufacturers of the front end components who have customers using the RFFE standard and customers using a different standard, such as the General Purpose Input/Output (GPIO) interface must manufacture two separate components. This can be costly because, for example, more time and human resources must be expended to produce both types of front end devices.

Further, device manufacturers who wish to support both standards may often be required to redesign their products to fit two or more components to support the standards. Not only may this require more physical space, but it may also result in greater power consumption because, for example, the multiple interface components may each consume power.

Advantageously, embodiments of this section of the present disclosure provide a system and method for implementing multiple standards in a single die without increasing the size of the die, or the number of pins required to support the front end interfaces. Further, in some embodiments, power consumption is not increased compared to devices that use components that implement a single interface standard. Moreover, embodiments of the present disclosure provide a single interface component, or die, to support the RFFE serial interface, the GPIO interface, or both interfaces without any modifications to existing devices. In certain implementations, the size and the pin count of single component may be kept the same as a die that implements only one of the RFFE interface and the GPIO interface.

In certain embodiments hereof, the interface component, or digital control interface, includes a RFFE core that implements the functionality of the MIPI® RFFE serial interface. This RFFE core can be configured to receive power from a Voltage Input/Output (VIO) pin. In a number of implementations, the RFFE core can cease receiving power when not in use. When the RFFE core is not powered, the digital control interface can be configured to use the pins that provide signals to the RFFE core as a GPIO interface. By using combinational logic, the digital control interface can control whether signals associated with the use of the RFFE serial interface or the GPIO interface are provided to, for example, a power amplifier. Advantageously, in certain embodiments, by merging the RFFE serial interface and the GPIO interface on a single die, it is possible for seamless adoption of the RFFE serial standard without alienating any manufacturers that are still using the GPIO interface. More details regarding combining the RFFE serial standard and the GPIO interface are described herein.

A. Electronic Device

FIG. 18 illustrates an embodiment of a wireless device 248 in accordance with aspects of the present invention. Applications of the present disclosure are not limited to wireless devices and can be applied to any type of electronic device, with or without a power amplifier. For example, embodiments can be applied to wired devices, weather sensing devices, RADAR, SONAR, microwave ovens, and any other device that might include a power amplifier. Further, embodiments of the present invention can be applied to devices that may include one or more components controlled via a front end interface. For example, embodiments of the present disclosure can be applied to Switch Mode Power Supply (SMPS) devices, which can be used for power amplifier supply regulation, Antenna Switch Modules (ASM), and antenna load tuning modules, to name a few. Although the present disclosure is not limited to wireless devices or to controlling power amplifiers, to simplify discussion, a number of embodiments will be described with respect to the wireless device 248 and a power amplifier module 249.

The wireless device 248 can include the power amplifier module 249. The power amplifier module 249 can generally include any component or device that includes a power amplifier 251 and a power amplifier controller 252 for controlling the power amplifier 251. Although not limited as such, controlling the power amplifier 251 generally refers to setting, modifying, or adjusting the amount of power amplification provided by the power amplifier 251. In some implementations, the power amplifier 251 may include the power amplifier controller 252. Further, the power amplifier module 249 may be a single component that includes the functionality of the power amplifier controller 252 and the power amplifier 251. In other implementations, the wireless device 248 may include the power amplifier 251 and the power amplifier controller 252 as separate and distinct components.

Further, the wireless device 248 can include a digital control interface 253. In some embodiments, the power amplifier module 249 includes the digital control interface 253. Generally, the digital control interface 253 can include any type of control interface that can support multiple types of front end interfaces. For example, the illustrated digital control interface 253 can support both a MIPI® Radio Frequency (RF) Front End (RFFE) serial interface 254 and a General Purpose Input/Output (GPIO) interface 256. In a number of embodiments, the digital control interface 253 can support multiple types of front end interfaces such that the interfaces can coexist on the same component die without requiring circuit design changes or bonding changes. Further, in some embodiments, the digital control interface 253 can support multiple front end interfaces without increasing the number of interface pins or connecting points exposed for use by the wireless device 248. Advantageously, in a number of embodiments, the digital control interface 253 can be used with devices that support different interface standards without modifying the digital control interface 253. For example, the illustrated digital control interface 253 of FIG. 18 can be used with devices that support MIPI® RFFE, GPIO, or a combination of the two without modifying the digital control interface 253.

In certain implementations, the digital control interface 253 can serve as an intermediary or a manager between the power amplifier module 249 and a signal source that determines or sets the mode of operation of the power amplifier module 249, the power amplifier controller 252, the power amplifier 251, or any other component that can be controlled by the digital control interface 253. The signal source can include any component that is configured to provide signals to the digital control interface 253 that can cause the digital control interface 253 to determine or set the mode of operation of, for example, the power amplifier module 249. For instance, as illustrated in FIG. 18, the signal source can be a transceiver 257. Alternatively, or in addition, the signal source can include a baseband chip 258, a digital signal processor (DSP) 259, or any other component that can provide one or more signals to the digital control interface 253 to cause the digital control interface 253 to set the mode of operation of the power amplifier module 249 or the power amplifier 251.

In one example of a scenario of setting the mode of the power amplifier 251, the transceiver receives a signal from, for example, an antenna 261 or the DSP 259. In response to receiving the signal, the transceiver 257 can provide one or more signals to the digital control interface 253 associated with setting the mode of operation of the power amplifier 251. The digital control interface 253 can determine, based on the received signals from the transceiver 257, whether the received signals are associated with a RFFE serial interface 254 or a GPIO interface 256. The digital control interface 253 can then process the received signals using the identified interface (e.g. the RFFE serial interface 254, the GPIO interface 256, or any other interface the digital control interface 253 can include). Then, based on the outcome of processing the received signals, the digital control interface 253 can provide mode setting signals to the power amplifier control 252, which can set the mode of the power amplifier 251 based on the mode setting signals.

Generally, the mode settings of the power amplifier 251 correspond to the rate or quantity of power amplification of a signal, which is then provided to components of a device (e.g. the wireless device 248). This signal can be provided to power the components or for processing by the components of the wireless device 248. The power amplifier module can receive power from a power supply 262. The power amplifier module 249 can then distribute the power to a number of components included in the wireless device 248 as illustrated by a power distribution bus 263.

The wireless device 248 can include a number of additional components. At least some of these additional components may receive power via the power distribution bus 263. Further, at least some of the additional components may communicate with the digital control interface 253 and may cause the digital control interface 253 to modify the settings of the power amplifier module 249. For example, the wireless device 248 can include a digital to analog convertor (DAC) 264, a display processor 266, a central processor 267, a user interface processor 268, an analog to digital convertor 269, and memory 271.

Further, the components of the wireless device 248 illustrated in FIG. 18 are provided as examples. The wireless device 248 may include other components. For example, the wireless device 248 may include an audio processor, a gyroscope, or an accelerometer. Moreover, the various illustrated components may be combined into fewer components, or separated into additional components. For example, the DAC 264 and the ADC 269 can be combined into a single component, and the based band chip 258 can be combined with the transceiver 257. As another example, the transceiver 257 can be split into a separate receiver and transmitter.

B. Digital Control Interface

FIG. 19 illustrates a particular embodiment of a digital control interface identified as digital control interface 272 in accordance with aspects of the present disclosure. The digital control interface 272 includes both a RFFE serial interface and a GPIO interface. Advantageously, in certain embodiments, the digital control interface 272 can be implemented in the same size package with the same number of pins as a control interface that includes one of a RFFE serial interface and a GPIO interface. The ability to combine multiple interface types within a single chip without expanding the size of the chip is particularly advantageous for applications that use or require small packages, such as applications that may require 3 mm×3 mm modules.

The digital control interface 272 includes an RFFE core 273 that is configured to provide the functionality of a MIPI® RFFE serial interface. Further, the digital control interface 272 includes a number of input pins: a VIO pin 274, a clock/mode pin 276, and a data/enable pin 277.

The VIO pin 274 is configured to receive a signal indicating whether the digital control interface 272 should operate as a RFFE serial interface, or a GPIO interface. In the illustrated embodiment, the digital control interface 272 operates as a RFFE serial interface when the VIO pin 274 receives a logic high signal and operates as a GPIO interface when the VIO pin 274 receives a logic low signal. However, in some implementations, the digital control interface 272 can be configured to operate as a RFFE serial interface when the VIO pin 274 receives a logic low signal and as a GPIO interface when the VIO pin 274 receives a logic high signal. The logic low signal can be associated with any value defined to be low, such as 0 volts, −5 volts, or otherwise. Similarly, the logic high signal can be associated with any value defined to be high, such as 0 volts, +5 volts, or otherwise. In some implementations, the logic low signal may be associated with connecting the VIO pin 274 to ground. Similarly, in some cases, the logic high signal may be associated with connecting the VIO pin 274 to a voltage source.

In addition to setting the mode of operation for the digital control interface 272, the VIO pin 274 can also provide power from a power source, such as the power supply 262 (FIG. 18), to the RFFE core 273. Thus, in some embodiments, when the VIO pin 274 is set to logic low, or is grounded, the RFFE core 273 is not powered and the digital control interface 272 is configured to function as a GPIO interface. On the other hand, in some embodiments, when the VIO pin 274 is set to logic high, or is connected, directly or indirectly, to a power source, the RFFE core 273 is provided with power and the digital control interface 272 is configured to function as a RFFE serial interface.

Further, the digital control interface 272 includes a power on reset 278, which may be implemented in hardware, software, or a combination of the two. The power on reset 278 is configured to facilitate resetting the RFFE core 273. In some embodiments, the power on reset 278 can serve as an inverted delay function. The inverted delay function is configured to provide sufficient time for one or more logic blocks and/or one or more registers associated with the RFFE core 273 to be set to a known condition or value when configuring the digital control interface 272 as a RFFE serial interface. Although in some cases the length of time may be application specific, in other cases the length of time may be based on characteristics of the hardware design and/or implementation. For example, the amount of time required may depend on the clock frequency, the size of the logic components, the type of components connected, directly or indirectly, to the digital control interface 272, etc. Further, setting the logic blocks and/or registers to known values may occur when initializing the RFFE core 273 or taking the RFFE core 273 out of a reset state.

In some implementations, the power on reset 278 may be configured to provide a select signal to the combinational logic block 279. For example, assume that the digital control interface 272 is configured to operate as a GPIO interface when the VIO pin 274 receives a logic low signal and as a RFFE serial interface when the VIO pin 274 receives a logic high signal. Continuing this example, when the VIO pin 274 receives a logic low signal, the select signal provided by the power on reset 278 may cause the combinational logic block 279 to output to the enable level shifter 282 and the mode level shifter 283 the signals input to the data/enable pin 277 and the clock/mode pin 276 respectively. Alternatively, if the VIO pin 274 receives a logic high signal, the select signal provided by the power on reset 278 may cause the combinational logic block 279 to output signals provided by the RFFE core 273 to the enable level shifter 282 and the mode level shifter 283. In certain embodiments, the combinational logic block 279 may delay or otherwise modify the signals received from data/enable pin 277 and the clock/mode pin 276 or the RFFE core 273 before outputting the signals to the level shifters.

Moreover, in some cases, the power on reset 278 may be configured to place one or more of the level shifters 281 into a default state. For example, the level shifters 281 may be placed into a default or reset state when the RFFE core 273 is in a reset state. In some designs, the power on reset 278 may be connected to a default high pin associated with each level shifter configured to be high during GPIO interface mode and to a default low pin associated with each level shifter configured to be low during GPIO interface mode. In some implementations, setting a level shifter 281 into a default state may cause the level shifter 281 to output a value based on a default input signal provided by the default pin 284. Although the default pin 284 is illustrated as receiving a default input signal, in a number of embodiments, the default pin 284 is tied to one of a default high and a default low input. Thus, in some cases, the default value may be pre-configured, while in other cases, the default value may be variable based on configuration or operation. It is possible in some designs that each level shifter 281 may be associated with a different default value or signal. Alternatively, each level shifter 281 may be associated with the same default value or signal.

Each of the level shifters 281 may be powered through a Vcc pin 287. In some implementations, each level shifter 281 may be separately connected to a power source. Alternatively, a single level shifter 281 may be connected, directly or indirectly, to a power source, and the remaining level shifters 281 may obtain power by a connection to the level shifter 281, or other component, that is connected to the power source. Further, the level shifters 282 and 283 may similarly each be connected to a power source, or may be connected to a level shifter or other component that can provide power to the level shifters 282 and 283. In certain embodiments, the level shifters 281, 282, and 283 are configured to adjust the voltage level of received signals and to output the modified signals. Although not limited as such, the level shifters 281, 282, and 283 may adjust the voltage level of the received signals to substantially match the voltage applied at the Vcc pin 287.

Although FIG. 19 illustrates two level shifters 281, the disclosure is not limited as such. The RFFE core 273 may communicate, directly or indirectly, with one, two, three, or any desired number of additional level shifters 281. Further, in some cases, the digital control interface 272 includes as many level shifters 281 as the number of registers (not shown) that the RFFE core 273 includes. Each register can provide a signal associated with the value of the register to a corresponding level shifter 281. In some cases, there may exist more or less level shifters 281 than registers. For example, each level shifter 281 may be associated with two registers. In this example, logic internal to the RFFE core 273 may determine which register's value is provided to the corresponding level shifter 281. As a second example, the RFFE core 273 may include additional registers that are included for internal use by the RFFE core 273. In this example, not all the registers of the RFFE core 273 may be associated with a level shifter 281. The level shifters 281, 282, and 283 are described in more detail below with regard to FIG. 20.

As previously indicated, the RFFE core 273 may include a set of registers (not shown). In certain situations, the set of registers may be set to unknown values. For example, when the wireless device 248 is first powered the set of registers may be set to unknown values. As a second example, in implementations where the VIO pin 274 serves as both the power source for the RFFE core 273 and the mode selector between RFFE and GPIO mode, the set of registers may be set to unknown values when the digital control interface 272 is first transitioned from a GPIO interface to a RFFE serial interface. To ensure that the registers are set to known values when the RFFE core 273 is initially powered or taken out of a reset state, the RFFE core 273 can be configured to set the value of each of the set of registers to values provided by a set of strapped defaults 286. In certain implementations, the strapped defaults 286 may be equivalent to the values provided to the default pins 284.

The RFFE core 273 may be configured to receive a clock signal from the clock/mode pin 276. This clock signal may be set to any frequency or signal shape based on the implementation of the RFFE core 273. In some implementations, the clock signal may be a square wave with a frequency of 26 MHz or less. Further, the data interface of the RFFE core 273 may be bidirectional. Thus, the RFFE core 273 may receive data from the data/enable pin 277 at the Data In of the RFFE core 273. Similarly, the RFFE core 273 may provide data from the Data Out of the RFFE core 273 to the data/enable pin 277. As illustrated in FIG. 19 by the buffers 288 and 289, both the data input and the data output may be buffered. In some embodiments, the buffers may be tri-state buffers. In some implementations, the Output Enable of the RFFE core 273 is configured to control the buffers 288 and 289 to enable both the Data Out and the Data In to share the same line to and from the data/enable pin 277. Thus, in some examples, when reading data from the RFFE core 273, the buffer 288 enables data flow, while the buffer 289 prevents data flow, or is set to high impedance. Similarly, in some examples, when writing data to the RFFE core 273, the buffer 289 enables data flow, while the buffer 288 prevents data flow, or is set to high impedance.

The following are non-limiting examples of use cases for the digital control interface 272. Other operations and uses are possible in accordance with the various embodiments described here. In one example use case, a logic low signal is received at the VIO pin 274. This signal may be received from the transceiver 257 (FIG. 18), for example. Receiving the logic low signal causes the digital control interface 272 to operate as a GPIO interface. Thus, in this example, the RFFE core 273 is inactive. Further, the combinational logic block 279 passes the signals received at the clock/mode pin 276 and the data/enable pin 277 to the mode level shifter 283 and the enable level shifter 282 respectively. The level shifters 282 and 283, upon modifying the voltage level of the signals, provide the signals to the power amplifier controller 252. The power amplifier controller 252 (FIG. 18), based on the signals received from the level shifters 282 and 283, controls the power amplifier 251 to set the level of amplification of a signal received by the power amplifier 251, such as a signal provided by the power supply 262 or the transceiver 257. The power amplifier controller 252 may also receive signals associated with a default from the level shifters 281. If so, the power amplifier controller 252 may ignore the signals from the level shifters 281 or may control the power amplifier 251 based in part on the signals received from the level shifters 281.

As a second example use case with continuing reference to FIGS. 18 and 19, a logic high signal is received at the VIO pin 274. This signal may be received from a baseband chip 258 of FIG. 18, for example. Receiving the logic low signal causes the digital control interface 272 to operate as a RFFE serial interface. Thus, in this example, the RFFE core 273 is active and the combinational logic block 279 passes mode and enable signals received from the RFFE core 273 to the mode level shifter 283 and the enable level shifter 282 respectively. The level shifters 282 and 283, upon modifying the voltage level of the signals, provide the signals to the power amplifier controller 252. The power amplifier controller 252 may control the power amplifier 251 based in part on the signals received from the level shifters 282 and 283. In certain embodiments, the power amplifier controller 252 may ignore the signals of the level shifters 282 and 283 when the digital control interface 272 is operating as an RFFE serial interface.

Continuing the second example use case, the RFFE core 273 may receive a clock signal from the clock/mode pin 276 and an address signal from the data/enable pin 277. Alternatively, or in addition, the RFFE core 273 may receive a data signal from the data/enable pin 277. In some cases, the data signal is received after the address signal. Alternatively, the data signal may be received before the address signal. Further, in embodiments where the digital control interface 272 includes a separate address pin (not shown), the RFFE core 273 may receive the address signal and the data signal at least partially in parallel.

The RFFE core 273 can use the clock signal to synchronize operation of one or more components associated with the RFFE core 273. Further, the clock signal can be used to facilitate identifying register addresses and data associated with a signal received from the data/enable pin 277. The RFFE core 273 may use the address signal to identify a register associated with the RFFE core 273. The RFFE core 273 may then store at the register data associated with the data signal. In some embodiments, the RFFE core 273 may modify existing data at the register based on the data signal. Further, in some cases the signal received at the data/enable pin 277 may control the RFFE core 273 or cause the RFFE core 273 to modify its operation.

In certain embodiments, the RFFE core 273 may provide one or more signals to the level shifters 281. The signals provided by the RFFE core 273 may be associated with the values and/or signals stored at the registers associated with the RFFE core 273. Further, the level shifters 281 may then provide the signals and/or modified versions of the signals to the power amplifier controller 252. The power amplifier controller 252 sets the configuration of the power amplifier 251 based at least in part on the signals from the level shifters 281, and in some cases, based at least in part on the signals from the mode level shifter 283 and/or the enable level shifter 282.

Generally, the signals received at the VIO pin 274, the clock/mode pin 276, and the data/enable pin 277 are digital signals. However, in some embodiments, one or more of the received signals may be analog signals. For instance, the signal received at the VIO pin 274 may be an analog signal. Further, each of the components illustrated in FIG. 19 can be included in a single chip or die, such as the digital control interface 253. Advantageously, in certain embodiments, including each of the components of the digital control interface 272 in a single die enables a wireless device, such as the wireless device 248, to have the capability to use the RFFE serial interface, the GPIO interface, or both types of interfaces without requiring multiple chips. By using a single chip instead of multiple chips, certain embodiments can reduce power consumption and reduce the footprint required by the control interface for the power amplifier 251, or any other module that may use a control interface.

C. Level Shifter

FIG. 20 illustrates an embodiment of a level shifter 291 in accordance with aspects of the present invention. Embodiments of the level shifters 281, 282, and 283 may be equivalent to or substantially equivalent to the level shifter 291. In some implementations, the level shifters 281, 282, and 283 may differ in design from the level shifter 291. However, each of the level shifters is capable of modifying the voltage of an input signal. In some cases, the voltage of the input signal is shifted or modified to match the voltage provided at the Vcc pin 287, FIG. 19. In other cases, the voltage of the input signal is shifted or modified within a range between the input voltage and the voltage provided at the Vcc pin 287.

During operation, the level shifter 291 is capable of receiving an input signal at an input 292. This input signal can generally include any signal that is to have its voltage level modified. Thus, for instance, the input signal can include one or more of the signals described previously with respect to FIG. 19. For example, the input signal can be a signal provided from the RFFE core 273, including from one of the registers associated with the RFFE core 273. As a second example, the input signal can be a signal provided by the combinational logic block 279.

The input signal received at the input 292 is provided to a latch 293. The latch 293 can include any type of flip-flop. For example, as illustrated in FIG. 20, the latch 293 can be a NAND based RS flip-flop. However, other types of flip-flops are possible. For example, the latch 293 can be a NOR based RS flip-flop. In certain embodiments, the latch 293 ensures a non-overlapping output from the latch 293. Ensuring a non-overlapping output ensures that each pair of NFET transistors 294 are not activated at the same time. In some embodiments, two parallel signal paths with delay elements can be used to ensure that each pair of NFET transistors 294 are not activated at the same time.

With some implementations, the latch 293 provides two signals, one signal from each of the NAND gates (e.g. a set signal and a reset signal). Each of the signals can be provided to the pair of NFET transistors 294. The NFET transistors 294 can be activated by the signals from the latch 293. When activated, the NFET transistors set the state a cross-coupled pair of PFET transistors 296. The cross-coupled pair of PFET transistors 296 causes the voltage level of the input signal to be level shifted. This level shifted signal is then provided at the output 297 to, for example, the power amplifier controller 252 or the power amplifier 251 shown in FIG. 18. In some embodiments, such as when a negative output voltage operation may be desired, the NFET transistors 294 can be PFET transistors and the PFET transistors 296 can be NFET transistors.

In some embodiments hereof, it is possible that a signal is not provided at the input 292, or that the signal is substantially zero. In such embodiments, the NFET transistors 294 may be set or activated by a default signal provided by a default low input 298 and/or a default high input 299. Although FIG. 20 illustrates two defaults, the default high input 299 and the default low input 298, in a number of embodiments, only a single default signal is provided to the level shifter 291. If it is desired that the output 297 be high during reset, the default high input 299 would be configured to provide a signal during reset. If instead it is desired that the level shifter 291 provide a low output during reset, the default low input 298 would be configured to provide a signal during reset. The default input that is not configured to set the NFET transistors 294 during reset may be tied to ground, or in certain implementations, may not exist. In some implementations, the default low input 298 and/or the default high input 299 is pre-configured or connected to a signal generator that provides a pre-determined signal. Alternatively, the default low input 298 and/or the default high input 299 may be connected to the power on reset 278 shown in FIG. 19. In some embodiments, one or both of the default inputs 298 and 299 may be optional. For example, in some cases, the enable level shifter 282 and the mode level shifter 283 receive a signal at their input.

D. Process for Operation of a Digital Control Interface

FIG. 21 presents a flowchart of a process 301 for operation of a digital control interface in accordance with aspects of the present disclosure. The process 301 may be implemented by any type of digital control interface that is configured to operate as an RFFE serial interface and as a GPIO interface. For example, the process 301 can be implemented by the digital control interface 253, FIG. 18, and the digital control interface 272, FIG. 19. Further, the process 301, in some embodiments, can be implemented by any type of digital control interface that is configured to operate in different interface modes. Although implementation of the process 301 is not limited as such, to simplify discussion, the process 301 will be described as being implemented by the digital control interface 272 of FIG. 19.

The process 301 begins when, for example, the digital control interface 272 receives signals at the VIO pin 274, the clock/mode pin 276, and the data/enable pin 277 at block 302. In some embodiments, the signals received at one or more of the clock/mode pin 276 and the data/enable pin 277 may be delayed, may be noise, or may be some known or unknown signals that are ignored until the digital control interface 272 completes an initialization process.

The signal received at the VIO pin 274 is provided to the RFFE core 273 at block 303. In some implementations, the signal from the VIO pin 274 powers the RFFE core 273. Further, the signal, or lack thereof, from the VIO pin 274 may result in the RFFE core 273 not receiving power. In addition to providing the VIO signal to the RFFE core 273, block 303 may include providing the VIO signal to the power on reset 278. In some embodiments, the power on reset 278, FIG. 19, may provide the signal from the VIO pin 274 to the combinational logic block 279. Further, the power on reset 278 may delay or otherwise modify the signal from the VIO pin 274 before providing the delayed or modified signal to the combinational logic block 279. Similarly, in certain embodiments, the power on reset 278 may provide the VIO signal, a delayed version of the VIO signal, or a modified version of the VIO signal to a reset input associated with the RFFE core 273.

At block 304 shown in FIG. 21, the signal received at the clock/mode pin 276 is provided to the combinational logic block 279. Similarly, at block 306, the signal received at the data/enable pin 277 is provided to the combinational logic block 279. Further, at block 307, a mode signal from an RFFE mode register associated with the RFFE core 273 is provided to the combinational logic block 279. Similarly, at block 308, an enable signal from an RFFE enable register associated with the RFFE core 273 is provided to the combinational logic block 279. During certain operating states, the signals provided at blocks 307 and 308 may be noise or may be some known or unknown signal that does not affect the operation of the digital control interface 272. Further, in some operating states, is it possible for no signal to be provided at blocks 307 and 308. For example, in implementations where the RFFE core 273 is not powered, such as when the digital control interface 272 is operating as a GPIO interface, it is possible for no signal to be provided at the blocks 307 and 308. In some implementations, the blocks 307 and 308 may be optional.

At decision block 309, the digital control interface 272 determines whether the VIO signal is logic high. In certain implementations, determining whether the VIO signal is logic high includes configuring the digital control interface 272 based on the VIO signal. Configuring the digital control interface 272 includes adjusting the operation of portions of the digital control interface 272 as well as adjusting the flow of signals within the digital control interface 272 as is described further with respect to the remaining blocks of FIG. 21.

If at decision block 309 the VIO signal is not logic high, the digital control interface 272 operates as a GPIO interface and the process 301 proceeds to block 311 where the RFFE core 273 is placed into a reset mode. This reset mode may be an active reset where the RFFE core 273 maintains known, or unknown, values in its registers and outputs values from its output ports. Alternatively, if, for example, the logic low VIO signal is provided by grounding the VIO pin 274 or by disconnecting the VIO pin 274 from a power source, the RFFE core 273 ceases to be powered while in the reset mode.

At block 312 of FIG. 21, the signal from the clock/mode pin 276, provided at the block 304, is provided to the mode level shifter 283. Similarly, at block 313, the signal from the data/enable pin 277, provided at the block 306, is provided to the enable level shifter 282. In certain implementations, the signals provided to the level shifters at blocks 312 and 313 may be based on, or selected based on the signal provided by the power on reset 278 to the combinational logic block 279. Moreover, in some cases, the signals provided to the level shifters 283 and 282 at the blocks 312 and 313 respectively may be delayed or modified by the combinational logic block 279 before the signals are provided to the level shifters 283 and 282.

At block 314, the digital control interface 272 maintains default values at the RFFE register level shifts 281. These default values are provided via the default pin 284. In a number of implementations, the default values may be application-specific. Further, the default values may be preconfigured and/or hard-coded. Alternatively, the default values may be generated or determined based on the operation of the digital control interface 272 and/or one of more of the components associated with the wireless device 248. In certain embodiments, the block 314 may be optional.

If at decision block 309 the VIO signal is logic high, the digital control interface 272 operates as an RFFE serial interface and the process 301 proceeds to block 316 where the RFFE core 273 is taken out of a reset mode. In some cases, the process 301 is performed when the wireless device 248 is first powered or initialized after a time period of not being powered. In such cases, the block 316 may be performed as part of the initialization of the digital control interface 272. Further, the block 316 may include initializing the RFFE core 273 instead of, or in addition to, taking the RFFE core 273 out of a reset mode. Removing the RFFE core 273 from reset mode may be a delayed process to provide sufficient time for one or more registers, signals, and/or components associated with the RFFE core 273 to stabilize and/or be initialized. This delay process may be controlled and/or implemented by the power on reset 278. In some embodiments, the block 316 may be optional.

At block 317, the process 301 includes configuring internal registers (not shown) associated with the RFFE core 273 to a set of default values. These default values may be provided by the strapped defaults 286. Alternatively, the default values may be determined based on internal logic associated with the RFFE core 273 and set in response to signals received from one or more of the VIO pin 274, the clock/mode pin 276, and the data/enable pin 277.

At block 318, a mode signal from the RFFE core 273 is provided to the mode level shifter 283. This mode signal may be associated or obtained from a mode register of the RFFE core 273. Alternatively, or in addition, the mode signal may be based, at least in part, on one or more of the following which include a signal received from the clock/mode pin 276, a signal received from the data/enable pin 277, a value based on the strapped defaults 286, and logic internal to the RFFE core 273.

Further, at block 319, an enable signal from the RFFE core 273 is provided to the enable level shifter 282. This enable signal may be associated or obtained from an enable register of the RFFE core 273. Alternatively, or in addition, the enable signal may be based, at least in part, on one or more of a signal received from the clock/mode pin 276, a signal received from the data/enable pin 277, a value based on the strapped defaults 286, and logic internal to the RFFE core 273.

In certain implementations hereof, the signals provided to the level shifters at blocks 318 and 319 may be based on, or selected based on the signal provided by the power on reset 278 to the combinational logic block 279. Moreover, in some cases, the signals provided to the level shifters 283 and 282 at the blocks 318 and 319 respectively may be delayed or modified by the combinational logic block 279 before the signals are provided to the level shifters 283 and 282.

At block 321, the process 301 includes providing RFFE register values, or signals associated with RFFE registers, to the RFFE level shifters 281. The RFFE register values are from registers associated with the RFFE core 273. Although in some cases these registers may include the registers described above with respect to the blocks 318 and 319, generally the registers of block 321 are different registers. Further, the values provided by the registers are used to set or to specify the mode of the power amplifier 251. While in GPIO interface mode, the digital control interface 272 may be limited to specifying two modes, such as high and low, associated with two voltage values and/or two levels of power amplification. In embodiments where the digital control interface includes additional pins, the digital control interface 272 may be capable of specifying additional modes while in GPIO mode. While in RFFE serial interface mode, the digital control interface 272 may set or specify different modes for the power amplifier 251 based on values clocked in to the RFFE core 273, values stored in registers associated with the RFFE core 273, or a combination of the two.

Regardless of whether the VIO signal is logic high or logic low, the output of the mode level shifter 283 is provided to the power amplifier 251 at block 322. Similarly, regardless of whether the VIO signal is logic high or logic low, the output of the enable level shifter 282 is provided to the power amplifier 251 at block 322. In certain embodiments, the outputs of the mode level shifter 283 and the enable level shifter 282 are provided to the power amplifier controller 252. The power amplifier controller 252 may then configure the power amplifier 251 based, at least in part, on the received signals from the mode level shifter 283 and the enable level shifter 282.

At block 324, the outputs of the RFFE level shifters 281 are provided to the power amplifier 251. Alternatively, the outputs of the RFFE level shifters 281 may be provided to the power amplifier controller 252, which may then configure the power amplifier 251 based, at least in part, on the received signals from the RFFE level shifters 281. When the digital control interface 272 is operating as a GPIO interface, the output of the RFFE level shifters 281 may be based, at least in part, on the default values or signals received at the default pins 284. In contrast, when the digital control interface 272 is operating as a RFFE serial interface, the output of the RFFE level shifters 281 may be based, at least in part, on values or signals received from the RFFE core 273, including values stored in registers associated with the RFFE core 273. In some embodiments, one or more of the blocks 322, 323, and 324 may be optional. For example, when the digital control interface 272 is operating as a GPIO interface, the level shifters 281 may not provide values to the power amplifier 251, or the power amplifier controller 252.

E. Second Electronic Device

FIG. 22 illustrates an alternate embodiment of a wireless device therein referred to as the wireless device 326 which is implemented in accordance with aspects of the present invention. In some implementations hereof, some or all of the embodiments described above with respect to the wireless device 248 may apply to the wireless device 326.

The wireless device 326 can include a power amplifier module 327. The power amplifier module 327 can generally include any component or device that includes a power amplifier 328, a power amplifier controller 329 for controlling the power amplifier 328, a mode selector 330, and a digital control interface 331. Although not limited as such, controlling the power amplifier 328 generally refers to setting, modifying, or adjusting the amount of power amplification provided by the power amplifier 328.

As with the digital control interface 253 of FIG. 18, the digital control interface 331 herein shown can include any type of control interface that can support multiple types of interfaces for controlling the power amplifier 328 and/or for configuring the power amplifier controller 329 to control the power amplifier 328. For example, the digital control interface 331 can include a serial interface 332 and a GPIO interface 333. The serial interface 332 can include any type of serial interface. For example, the serial interface can be a RFFE serial interface (e.g., the MIPI® RFFE serial interface), a Serial Peripheral Interface (SPI) Bus, a 3-wire serial bus, or an I²C bus, to name a few. In some implementations, some or all of the embodiments described above with respect to the digital control interface 253 may apply to the digital control interface 331.

In a number of embodiments, the digital control interface 331 can include multiple interface types on the same component die without requiring circuit design changes or bonding changes to existing component die configurations (e.g., existing power amplifiers, existing power amplifier modules, existing transceivers, or other components that may provide control signals to a digital control interface or that may receive control signals from a digital control interface). Further, in some embodiments, the digital control interface 331 can support multiple interfaces without increasing the number of interface connections (e.g., pins, leads, wires, Ball Grid Arrays, etc.) exposed for use by the wireless device 326 or the power amplifier module 327. Advantageously, in a number of embodiments, the digital control interface 331 can be used with devices that support different interface standards without modifying the digital control interface 331. For example, the illustrated digital control interface 331 of FIG. 22, can be used with devices that support a serial interface, a GPIO interface, or a combination of the two without modifying the digital control interface. In some cases, the digital control interface 331 can switch between different interface types during operation.

The mode selector 330 can include any device or component configured to select the mode of operation of the digital control interface 331. Selecting the mode of operation of the digital control interface 331 can include selecting the type of interface the digital control interface 331 uses to communicate with the power amplifier controller 329. For example, the mode selector 330 can select or configure the digital control interface 331 to act as a serial interface or a GPIO interface. This selection may be based on a signal received from the antenna 338, the transceiver 334, a baseband chip 336, or any other signal source that may provide a signal that can be used to select the interface type or to determine the interface type to select from the available interface types of the digital control interface 331.

Further, in certain implementations, the digital control interface 331 can set the mode of operation of the power amplifier 328, either directly or via the power amplifier controller 329, based on one or more signals received from the signal source. In certain embodiments, the digital control interface 331 receives the one or more signals that cause the digital controller interface 331 to set the mode of operation of the power amplifier 328 from, for example, the antenna 338, the transceiver 334, the baseband 336, or the DSP 337 while receiving the signal that selects the operative interface type of the digital control interface 331 from the mode selector 330. Alternatively, the digital control interface 331 may receive the one or more signals that cause the digital control interface 331 to set the mode of operation of the power amplifier 328 and the signal that selects the operative interface type of the digital control interface 331 from the mode selector 330. The mode selector 330 may receive some or all of the signals from, for example, the antenna 338, the transceiver 334, the baseband 336, or the DSP 337. Alternatively, or in addition, the mode selector 330 may generate some or all of the signals provided to the digital control interface 331 based on one or more signals received from, for example, the antenna 338, the transceiver 334, the baseband 336, or the DSP 337.

In one example of a scenario for setting the mode of the power amplifier 328, the transceiver 334 receives a signal from, for example, the antenna 338 or the DSP 337. In response to receiving the signal, the transceiver 334 can provide one or more signals to the mode selector 330. Based on the one or more signals received from the transceiver 334, the mode selector 330 can configure the digital control interface 331 to operate as either a serial interface or a GPIO interface. Further, the transceiver 334 can provide one or more signals to the digital control interface 331, which processes the signals in serial mode or GPIO mode based on the mode specified by the mode selector 330. Based on the outcome of processing the signals, the digital control interface 331 can provide one or more mode setting signals to the power amplifier controller 329, which can set the mode of the power amplifier 328 based on the mode setting signals. Alternatively, the digital control interface 331 may set the mode of the power amplifier 328.

In some implementations, the power amplifier 328 may include one or more of the power amplifier controller 329, the digital control interface 331, and the mode selector 330. For some implementations, the power amplifier controller 329 may include one or more of the digital control interface 331 and the mode selector 330. Moreover, in some cases, the digital control interface may include the mode selector 330. Further, the power amplifier module 327 may be a single component that includes the functionality of the mode selector 330, the digital control interface 331, the power amplifier controller 329, and the power amplifier 328. Alternatively, the power amplifier module 327 may include multiple components that include the functionality of the mode selector 330, the digital control interface 331, the power amplifier controller 329, and the power amplifier 328. In yet other implementations, the wireless device 326 may include one or more components that include the functionality of the mode selector 330, the digital control interface 331, the power amplifier controller 329, and the power amplifier 328.

Similar to the power amplifier module 249 of FIG. 18, the power amplifier module 327 shown in FIG. 22 can receive power from a power supply 339. The power amplifier module 327 can then distribute the power to a number of components included in the wireless device 326 via, for example, the power distribution bus 341.

In certain embodiments, the power supply 339 includes combinational logic and/or one or more processors that enable the power supply 339, in some cases, to configure one or more elements of the power amplifier module 327. For example, in some cases, the power supply 339 may provide one or more signals to the digital control interface 331 to enable the digital control interface 331 to configure the power amplifier 328. Further, the power supply 339 may provide the signals to, for example, the digital control interface 331 based on the output of the power amplifier 328 thereby creating a feedback loop between the power amplifier module 327 and the power supply 339.

The wireless device 326 can include a number of additional components. At least some of these additional components may receive power via the power distribution bus 341. For example, the wireless device 326 can include a digital to analog convertor (DAC) 342, a display processor 343, a central processor 344, a user interface processor 346, an analog to digital convertor (ADC) 347, and memory 348. At least some of the additional components may communicate with the digital control interface 331 and may cause the digital control interface 331 to modify the settings of the power amplifier module 327, the power amplifier 328, and/or the power amplifier controller 329. In addition, at least some of the additional components may communicate with the mode selector 330 and cause the mode selector 330 to select the operational mode of the digital control interface 331.

F. Second Digital Control Interface

FIG. 23 illustrates an embodiment of the digital control interface 331 of FIG. 22 as implemented in accordance with certain aspects of the present invention. In some implementations, some or all of the embodiments described above with respect to the digital control interface 253 and the digital control interface 272 may apply to the digital control interface 331.

The digital control interface 331 includes a serial interface 332, a GPIO interface 333, and a number of input pins. These input pins can include a VIO pin 351, a clock/mode pin 352, and a data/enable pin 353.

The VIO pin 351 may be configured to receive a signal setting the digital control interface 331 to operate as either a serial interface or a GPIO interface. In the illustrated embodiment, the digital control interface 331 operates as a serial interface when the VIO pin 351 receives a logic high signal and operates as a GPIO interface when the VIO pin 351 receives a logic low signal. However, in some implementations, the digital control interface 331 can be configured to operate as a serial interface when the VIO pin 351 receives a logic low signal and as a GPIO interface when the VIO pin 351 receives a logic high signal. The logic low signal can be associated with any value defined to be low, such as 0 volts, −5 volts, or otherwise. Similarly, the logic high signal can be associated with any value defined to be high, such as 0 volts, +5 volts, or otherwise. In some implementations, the logic low signal may be associated with connecting the VIO pin 351 to ground. Similarly, in some cases, the logic high signal may be associated with connecting the VIO pin 351 to a voltage source.

Further, the VIO pin 351 may be configured to provide power from a power source such as the power supply 339, FIG. 22, to the serial interface core 349. Thus, in some embodiments, when the VIO pin 351 is set to logic low, or is grounded, the serial interface core 349 is not powered and the digital control interface 331 is configured to function as a GPIO interface. On the other hand, in some embodiments, when the VIO pin 351 is set to logic high, or is connected, directly or indirectly, to a power source, the serial interface core 349 is provided with power and the digital control interface 331 is configured to function as a serial interface. In some implementations, some or all of the embodiments described above with respect to the VIO pin 274 may apply to the VIO pin 351.

The serial interface 332 may include a front end core, or a serial interface core 349. Further, the serial interface 332 may include a power on reset 354, a pair of buffers 368 and 369, and a number of level shifters 357. The GPIO interface 333 may include combinational logic block 356, and a pair of level shifters 358 and 359. When the digital control interface 331 functions as a serial interface, the components of the serial interface 332 are active or operate to provide a serial interface and one or more components of the GPIO interface 333 may not be active. Similarly, when the digital control interface 331 functions as a GPIO interface, the components of the GPIO interface 333 are active or operate to provide a GPIO interface and one or more components of the serial interface 332 may not be active.

However, in certain embodiments, when the digital control interface 331 functions as a serial interface, the digital control interface 331 may use one or more components of the GPIO interface 333 to facilitate providing a serial interface, and thus, one or more components of the GPIO interface 333 may be active or operate to provide the serial interface. Similarly, in certain embodiments, when the digital control interface 331 functions as a GPIO interface, the digital control interface 331 may use one or more components of the serial interface 332 to facilitate providing a GPIO interface, and thus, one or more components of the serial interface 332 may be active or operate to provide the GPIO interface. For example, in some implementations, the combinational logic block 356 may include a multiplexor that is controlled by the power on reset 354. Further, in this example, the combinational logic block 356, based on the mode of operation of the digital control interface 331, and therefore the value output by the power on reset 354, may provide different signals to the level shifters 358 and 359. Thus, in this example, although the power on reset 354 is generally part of the serial interface 332, the power on reset 354 may function as part of the GPIO interface when the digital control interface is in GPIO interface mode. Similarly, in this example, although the combinational logic block 356 and the level shifters 358 and 359 are generally part of the GPIO interface 333, one or more of the combinational logic block 356 and the level shifters 358 and 359 may operate to help provide a serial interface when the digital control interface 331 is in serial interface mode.

The power on reset 354 may be implemented in hardware, software, or a combination of the two. Further, the power on reset 354 may be configured to facilitate resetting a serial interface core 349. In some embodiments, the power on reset 354 can serve as an inverted delay function. The inverted delay function is configured to provide sufficient time for one or more logic blocks and/or one or more registers associated with the serial interface core 349 to be set to a known condition or value when configuring the digital control interface 331 as a serial interface. Although, in some cases, the length of time may be application specific, in other cases the length of time may be based on characteristics of the hardware design and/or implementation. For example, the amount of time required may depend on the clock frequency, the size of the logic components, the type of components connected, directly or indirectly, to the digital control interface, etc. Further, setting the logic blocks and/or registers to known values may occur when initializing the serial interface core 349 or taking the serial interface core 349 out of a reset state.

In some implementations, the power on reset 354 may be configured to provide a select signal to the combinational logic block 356. For example, assume that the digital control interface 331 is configured to operate as a GPIO interface when the VIO pin 351 receives a logic low signal and as a serial interface when the VIO pin 351 receives a logic high signal. Continuing this example, when the VIO pin 351 receives a logic low signal, the select signal provided by the power on reset 354 may cause the combinational logic block 356 to output to the enable level shifter 358 and the mode level shifter 359 signals based on the input to the data/enable pin 353 and the clock/mode pin 352 respectively. For instance, the combinational logic block 356 may decode the signals received from the clock/mode pin 352 and the data/enable pin 353 and provide the decoded signals to the enable level shifter 358 and the mode level shifter 359.

If, in this example, the VIO pin 351 receives a logic high signal instead of the logic low signal, the select signal provided by the power on reset 354 may cause the combinational logic block 356 to output signals based on signals received from the serial interface core 349 to the enable level shifter 358 and the mode level shifter 359. In certain embodiments, the combinational logic block 356 may delay or otherwise modify the signals received from data/enable pin 353 and the clock/mode pin 352 or the serial interface core 349 before outputting the signals to the level shifters 358 and 359.

In some cases, the power on reset 354 may be configured to place one or more of the level shifters 357 into a default or reset state. This may occur, for example, when the serial interface core 349 is in a reset state. In some designs, the power on reset 354 may be connected to a default high pin associated with each level shifter configured to be high during GPIO interface mode and to a default low pin associated with each level shifter configured to be low during GPIO interface mode. In some implementations, setting a level shifter 357 into a default state may cause the level shifter 357 to output a value based on a default input signal provided by the default pin 361. Although the default pin 361 is illustrated as receiving a default input signal, in a number of embodiments, the default pin 361 is tied to one of a default high and a default low input. Thus, in some cases, the default value may be pre-configured, while in other cases, the default value may be application specific and may vary based on the configuration or operation of the digital control interface 331 or the power amplifier module. It is possible in some designs that each level shifter 357 may be associated with a different default value or signal. Alternatively, each level shifter 357 may be associated with the same default value or signal.

Each of the level shifters 357 may be powered through a Vcc pin 363. In some implementations, each level shifter 357 may be separately connected to a power source. Alternatively, a single level shifter 357 may be connected, directly or indirectly, to a power source, and the remaining level shifters 357 may obtain power by a connection to the level shifter 357, or other component, that is connected to the power source. Further, the level shifters 358 and 359 may similarly each be connected to a power source, or may be connected to a level shifter or other component that can provide power to the level shifters 358 and 359. In certain embodiments, the level shifters 357, 358, and 359 are configured to adjust the voltage level of received signals and to output the modified signals. Although not limited as such, the level shifters 357, 358, and 359 may adjust the voltage level of the received signals to substantially match the voltage applied at the Vcc pin 363.

In some implementations, some or all of the embodiments described above with respect to the power on reset 278 may apply to the power on reset 354. Similarly, in some implementations, some or all of the embodiments described above with respect to the level shifters 284 may apply to the level shifters 357. Further, in some implementations, some or all of the embodiments described above with respect to the level shifters 282 and 283 may apply to the level shifters 358 and 359 respectively. In addition, some or all of the embodiments described above with respect to the level shifter 291 with reference to above FIG. 20 may apply to the level shifters 357, 358, and 359 shown here in FIG. 23.

The serial interface core 349 may generally include circuitry or logic that enables the serial interface core to provide a serial interface. In some embodiments, the serial interface core 349 can include a RFFE core (e.g. the RFFE core 273). Further, in some instances, the serial interface core 349 can include some or all of the embodiments described above with respect to the RFFE core 273.

As with the RFFE core 273, the serial interface core 349 may include a set of registers (not shown). In certain situations, the set of registers may be set to unknown values. For example, when the wireless device 326 is first powered, the set of registers may be set to unknown values. As a second example, in implementations where the VIO pin 351 serves as both the power source for the serial interface core 349 and the mode selector between serial interface mode and GPIO interface mode, the set of registers may be set to unknown values when the digital control interface 331 is first transitioned from a GPIO interface to a serial interface. To ensure that the registers are set to known values when the serial interface core 349 is initially powered or taken out of a reset state, the serial interface core 349 can be configured to set the value of each of the set of registers to values provided by a set of strapped defaults 362. In certain implementations, the strapped defaults 286, FIG. 19, may be equivalent to the values provided to the default pins 361.

In certain embodiments, the serial interface core 349 may be configured to receive a clock signal from the clock/mode pin 352. This clock signal may be set to any frequency or signal shape based on the implementation of the serial interface core 349. In some implementations, the clock signal may be a square wave with a frequency of 26 MHz or less. Further, the data interface of the serial interface core 349 may be bidirectional. Thus, the serial interface core 349 may receive data from the data/enable pin 388 at the Data In of the serial interface core 349. Similarly, the serial interface core 349 may provide data from the Data Out of the serial interface core 349 to the data/enable pin 353. As illustrated in FIG. 23 by the buffers 368 and 369, both the data input and the data output may be buffered. In some embodiments, the buffers may be tri-state buffers. Further, the Output Enable of the serial interface core 349 may be configured to control the buffers 368 and 369 to enable both the Data Out and the Data In to share the same line to and from the data/enable pin 353. Thus, in some examples, when reading data from the serial interface core 349, the buffer 368 enables data flow, while the buffer 369 prevents data flow, or is set to high impedance. Similarly, in some examples, when writing data to the serial interface core 349, the buffer 369 enables data flow, while the buffer 368 prevents data flow, or is set to high impedance.

The combinational logic block 356 generally includes any logic that causes the digital control interface 331 to provide an enable signal and a mode signal to the enable level shifter 358 and the mode level shifter 359 respectively. In some embodiments, the combinational logic block 356 includes logic that enables the decoding of a signal. The combinational logic block 356 can then provide a decoded signal to one or both of the level shifters 358 and 359. In some instances, the combinational logic block 356 of this embodiment may include some or all of the embodiments described above with respect to the combinational logic block 279 shown above in FIG. 19.

In some implementations, the digital control interface 331 can perform the process 301 described above with respect to FIG. 21. In such implementations, operations associated with the RFFE core may instead be performed by the serial interface core 349. For example, block 311 may include placing the serial interface core 349 into a reset mode. As a second example, block 321 may include providing serial interface register values, or signals associated with registers of the serial interface core 349, to the serial interface level shifters 357.

G. Combinational Logic Block

FIG. 24 illustrates further details of an embodiment of the combinational logic block 356 shown in FIG. 23 and implemented in accordance with aspects of the present invention. As described above, the combinational logic block 356 may be configured to output an enable signal and a mode signal to the level shifters 358 and 359 respectively. Further, the combinational logic block 356 includes logic that determines whether the enable and mode signals are based on inputs received from the serial interface core 349 or inputs received from the clock/mode pin 352 and data/enable pin 353. In some cases, when the digital control interface 331 is operating as a GPIO interface, the enable signal and mode signal may be based on inputs received via additional logic or devices (not shown) that receive the input signals from the clock/mode pin 352 and data/enable pin 353. Similarly, in some cases, when the digital control interface 331 is operating as a serial interface, the enable signal and mode signal may be based on inputs received via additional logic or devices (not shown) that receive the signals from the serial interface core 349. In some cases, the additional logic or devices may process the signals before providing the signals to the combinational logic block 356.

As illustrated in FIG. 24, the combinational logic block 356 includes multiplexor 378 and multiplexor 379. The multiplexor 378 can provide the enable signal to the enable level shifter 358 and the multiplexor 379 can provide the mode signal to the mode level shifter 359. Each of the multiplexors may be controlled by a reset signal received from the reset input 377 to the combinational logic block 356. As described above, the reset signal may be received from the power on reset 354 and, in some cases, may be an inverted version of a signal received from the VIO pin 351.

As previously described, in some embodiments, when the reset signal received at the reset input 377 to the combinational logic block 356 is logic high, or a '1', the digital control interface 331 operates as a GPIO interface. In such cases, the multiplexor 378 outputs the signal received at the data/enable input 376, and the multiplexor 379 outputs the signal received at the clock/mode input 374. As illustrated by the small squares, the inputs to the data/enable input 376 and the clock/mode input 374 may, in some cases, be received from the data/enable pin 353 and the clock/mode pin 352 respectively, without any intervening logic or components. In other embodiments, there may be additional logic between the pins 352 and 353, FIG. 23, and the inputs 374 and 376 respectively.

In some embodiments, the combinational logic block 356 may include an AND gate 381 between the data/enable input 376 and the multiplexor 378, and/or an AND gate 382 between the clock/mode input 374 and the multiplexor 379. Although some embodiments include the AND gates, since the reset input 377 is logic high when selecting the input of the data/enable input 376 and the clock/mode input 374, the output of the multiplexors does not change. In certain embodiments, the AND gates are included to reduce or eliminate digital noise caused by the frequency of the signals and/or the proximity of the signal paths to each other. The data and clock signals, in some cases, may be high speed digital signals, which in some implementations can be as fast as 26 MHz. In other cases, the signals may be faster or slower than 26 MHZ and may be application dependent. The AND gates can be used to limit the number of nodes that toggle at the rate of the signals thereby limiting the amount of clock energy that can degrade the RF performance aspects of one or more devices in communication with the combinational logic block 356 (e.g., the power amplifier controller 329, the power amplifier 328, etc.). In some cases, the AND gates may introduce a delay enabling synchronization of one or more signals. In certain embodiments, the AND gates may be optional.

Although the combinational logic block 356 of FIG. 24 includes AND gates, it is possible for the combinational logic block 356 to include other types of logic in addition to, or in place of the AND gates 381 and 382. For example, the combinational logic block 356 may include one or more AND gates, NAND gates, inverters, OR gates, NOR gates, or XOR gates between the inputs 376 and 374 and the multiplexors 378 and 379 respectively.

When the reset signal received at the reset input 377 to the combinational logic block 356 is logic low, or a '0', the digital control interface 331 operates as a serial interface. In such cases, the multiplexor 378 outputs the signal received at the serial enable input 372, and the multiplexor 379 outputs the signal received at the serial mode input 373.

Although FIG. 24 does not illustrate any additional logic than has previously been described, in some implementations, the combinational logic block 356 may include additional logic components. For example, additional gates may be included to reduce noise, delay the timing of signals, or to store prior signals.

H. Third Digital Control Interface

With reference next to FIG. 25, there is shown another embodiment of a digital control interface here referenced digital control interface 383 as implemented in accordance with further aspects of the present invention. In some cases, the digital control interface 383 may substitute for the digital control interface 331 (illustrated in FIG. 23) of the wireless device 326 (illustrated in FIG. 22). In some implementations, some or all of the embodiments described above with respect to the digital control interface 253, the digital control interface 272, and the digital control interface 331 may apply to the present digital control interface 383. To simplify discussion, elements in common between the digital control interface 331 and the digital control interface 383 are not repeated below.

Advantageously, in certain embodiments, the digital control interface 383 can support three modes when configured as a GPIO interface. In some cases, by enabling the digital control interface 383 to support three modes when configured as a GPIO interface, the digital control interface 383 is able to support more power amplifier modes than a signal control interface that uses separate mode and enable pins. Further, in some cases, the additional modes can be supported without adding additional pin inputs and without expanding the package size of the digital control interface. In some implementations, these advantages can be achieved by replacing the data/enable pin 353 of the digital control interface 331 with a pin that provides a second mode input and by modifying the combinational logic block 356 to interpret the fourth available mode as a not enabled signal.

As illustrated in FIG. 25, the digital control interface 383 can include a clock/mode 0 pin 384 and a data/mode 1 pin 386. The pins 384 and 386 can be configured similarly to the pins 352 and 353 of the digital control interface 331 respectively. However, when the digital control interface 383 is configured as a GPIO interface, the clock/mode 0 pin 384 can provide a first mode signal to the combinational logic block 388 and the clock/mode 1 pin 386 can provide a second mode signal to the combinational logic block 388.

The GPIO interface 387 can include two mode level shifters, the mode 0 level shifter 389 and the mode 1 level shifter 391. When the signal output by enable level shifter 358 indicates that the power amplifier 328, FIG. 22, should be enabled, the signals output by the two mode level shifters can be used by the power amplifier controller 329 to set the level of amplification of a signal received by the power amplifier 328. In some embodiments, the power amplifier 328 is enabled regardless of the output of the enable level shifter 358. In some such cases, the output of the enable level shifter 358 may be used by the power amplifier controller 329 to determine whether to adjust the mode of the power amplifier 328 based on the outputs of the two mode level shifters 389 and 391.

As will be described in more detail below with respect to FIG. 26, the signal supplied to the enable level shifter 358 may be based on the signals received at the mode pins 384 and 386. Further, in some cases, the serial interface core 349 may provide three signal connections to the combinational logic block 388, as illustrated in FIG. 25. In other cases, the serial interface core 349 may provide more or less signal lines to the combinational logic block 388. In such cases, the signal lines may be combined or split using one or more logic blocks and based, at least in part, on the number of level shifters receiving output signals from the combinational logic block 388.

I. Second Combinational Logic Block

FIG. 26 illustrates an alternative embodiment of the present combinational logic block here designated combinational logic block 388 which may be implemented in accordance with still further aspects of the present invention. In some embodiments, the combinational logic block 388 may include some or all of the characteristics or features as previously described with respect to the combinational logic block 356.

Similar to the combinational logic block 356, the combinational logic block 388 includes logic that determines whether the enable and mode signals are based on inputs received from the serial interface core 349 or inputs received from the clock/mode 0 pin 384 and data/mode 1 pin 386. In some cases, when the digital control interface 383 is operating as a GPIO interface, the enable signal and the mode 0 and mode 1 signals may be based on inputs received via additional logic or devices (not shown) that receive the input signals from the clock/mode 0 pin 384 and data/mode 1 pin 386. Similarly, in some cases, when the digital control interface 383 is operating as a serial interface, the enable signal and the mode 0 and mode 1 signals may be based on inputs received via additional logic or devices (not shown) that receive the signals from the serial interface core 349. In some cases, the additional logic or devices may process the signals before providing the signals to the combinational logic block 388.

As illustrated in FIG. 26, the combinational logic block 388 includes three multiplexors. The multiplexor 401 can provide the enable signal to the enable level shifter 358. When the digital control interface 383 is configured as a serial interface, the multiplexor 401 outputs an enable signal received from the serial interface core 349 via the serial enable input 396. When the digital control interface 383 is configured as a GPIO interface, the multiplexor 401 outputs an enable signal that is based on the logical OR of the signals received from the clock/mode 0 input 393 and the data/mode 1 input 394. The logical OR may be obtained via the OR gate 407 illustrated in FIG. 26. However, other logical equivalents are possible, such as by using a NOR gate and an inverter.

The multiplexor 402 can provide a first mode signal, or the mode 0 signal, to the mode 0 level shifter 389. Similarly, the multiplexor 403 can provide a second mode signal, or the mode 1 signal, to the mode 1 level shifter 391. When the digital control interface 383 is configured as a serial interface, the multiplexor 402 outputs a mode 0 signal received from the serial interface core 349 via the serial mode 0 input 397. Likewise, when the digital control interface 383 is configured as a serial interface, the multiplexor 403 outputs a mode 1 signal received from the serial interface core 349 via the serial mode 1 input 398.

When the digital control interface 383 is configured as a GPIO interface, the multiplexor 402 outputs the logical AND of the signal received at the clock/mode 0 input 393 and the reset signal received at the reset input 399. Similarly, when the digital control interface 383 is configured as a GPIO interface, the multiplexor 403 outputs the logical AND of the signal received at the data/mode 1 input 394 and the reset signal received at the reset input 399. The logical ANDs may be obtained by the AND gates 404 and 406. However, other logical equivalents are possible, such as by using a NAND gate and an inverter. As previously described with respect to FIG. 24, the use of the AND gates 404 and 406 may reduce or eliminate digital noise.

Each of the multiplexors may be controlled by the reset signal received from the reset input 399. In other words, the select signal provided to the multiplexors may be the reset signal. As described above, the reset signal may be received from the power on reset 354 and, in some cases, may be an inverted version of a signal received from the VIO pin 351. When the reset signal is a logic '1', the digital control interface 383 is configured as a GPIO interface, and the multiplexor outputs the signals as described above for GPIO interface mode. When the reset signal is a logic '0', the digital control interface 383 is configured as a serial interface, and the multiplexor outputs the GPIO signals as described above for serial interface mode.

As previously described, the digital control interface 383, using the combinational logic 388 can provide three different modes to the power amplifier controller 329 and/or the power amplifier 328 by using the values of the mode 0 pin 384 and the mode 1 pin 386 to determine whether to output an enable signal instead or dedicating a separate pin to an enable control signal. When one of the three configured modes is selected, the combinational logic block 388 is configured to output an enable signal. When the fourth mode is selected, the combinational logic block 388 is configured to output a not enabled signal. Table 1 presented below illustrates one non-limiting example for the outputs of the combinational logic block 388 to the level shifters based on the value of the mode pins when the digital control interface 383 is configured as a GPIO interface. The mode setting of Table 1 corresponds to the setting of the power amplifier controller 329 based on the output of the mode 0 and mode 1 signals to the mode 0 and mode 1 level shifters 389 and 391 respectively.

TABLE 1

| MODE 0 | MODE 1 | ENABLE | MODE SETTING |
|--------|--------|--------|--------------|
| 0 | 0 | NO | — |
| 0 | 1 | YES | 1 |
| 1 | 0 | YES | 2 |
| 1 | 1 | YES | 3 |

In some embodiments, the digital control interface 383 can perform a modified version of the process 301 shown in FIG. 21. For example, in some cases, the block 318 can include providing a first and second mode signal from a serial interface core to the first mode level shifter 389 and the second mode level shifter 391, respectively. Further, the block 312, in some cases, includes providing a first mode signal from the clock/mode pin 384 to the first mode level shifter 389 and a second mode signal from the data/mode pin 386 to the second mode level shifter 391. In certain embodiments, by providing two mode signals, the digital control interface 383 can provide three modes when operating as a GPIO interface instead of two.

In some embodiments, the operation of the block 313 may be modified to provide the first mode signal and the second mode signal from the clock/mode pin 384 and the data/mode pin 386, respectively, to the combinational logic block 388. The combinational logic block 388 can then determine whether to provide an enable signal to the enable level shifter 358 based on the first and second mode signal thereby enabling the digital control interface 383 to output an enable signal to the power amplifier controller 329 without having a dedicated enable pin. Advantageously, in certain cases, by eliminating the need for an enable pin, the digital control interface can support more modes for configuring a power amplifier by repurposing the enable pin as a second mode pin.

J. Additional Embodiments

In some embodiments, a digital control interface includes a voltage input/output (VIO) pin configured to receive a VIO signal. Further, the digital control interface can include a front end core configured to provide a serial interface. The front end core may be in an active state when the VIO signal satisfies a first logic level and in an inactive state when the VIO signal satisfies a second logic level. Further, the digital control interface may be configured to provide a general purpose input/output (GPIO) interface when the front end core is set to the inactive state. In addition, the digital control interface can include a combinational logic block configured to provide an enable signal to an enable level shifter and a mode signal to a mode level shifter. Moreover, the digital control interface can include a clock/mode pin and a data/ enable pin. The clock/mode pin may be configured to provide a clock signal to the front end core when the front end core is set to an active state and a mode signal to the combinational logic block when the front end core is set to an inactive state. The data/enable pin may be configured to provide a data signal to the front end core when the front end core is set to an active state and an enable signal to the combinational logic block when the front end core is set to an inactive state. Further, the digital control interface may include a power on reset configured to select, based on the VIO signal, a source of the enable signal and the mode signal provided to the enable level shifter and the mode level shifter respectively. With some implementations, the front end core includes a radio frequency front end (RFFE) core.

In some cases, the data/enable pin is further configured to provide an address signal to the front end core when the front end core is set to an active state, the address signal associated with a register of the front end core.

The digital control interface, in some implementations, may include a plurality of register level shifters. Each register level shifter of the plurality of register level shifters may be configured to receive a register signal from the front end core and to output the register signal thereby enabling a power amplifier to be configured based on the register signal, the register signal associated with a value stored in one of a plurality of registers associated with the front end core. In some cases, at least one register level shifter is further configured to receive a default signal during a reset state. Further, the power on reset block may be further configured to place the at least one register level shifter into the reset state. In some cases, the power on reset block can be further configured to provide a delayed reset signal to the front end core.

In certain embodiments, the digital control interface includes a first buffer and a second buffer. The first buffer may be connected between the data/enable pin and an output port of the front end core and the second buffer may be connected between the data/enable pin and an input port of the front end core. Further, the first buffer may be configured to enable data to be read from the front end core and the second buffer may be configured to enable data to be provided to the front end core. Both the first buffer and the second buffer may be tri-state buffers. In some designs, the connection between the first buffer and the data/enable pin, and the connection between the second buffer and the data/enable pin is a shared path. The first buffer and the second buffer may be further configured to prevent simultaneous data flow through the first buffer and the second buffer.

Some embodiments of the present invention may be configured to implement a method for providing multiple control interfaces in a digital control interface that includes a front end core and a combinational logic block. The method can include receiving a VIO signal at a VIO input to the digital control interface and determining whether the VIO signal is logic high. In response to determining that the VIO signal is logic high, the method can include configuring the digital control interface to function as a serial interface by providing a clock signal from a clock input to the front end core, providing a data signal from a data input to the front end core, and selecting, at the combinational logic block, a first enable signal and a first mode signal to output to an enable level shifter and a mode level shifter. Both the first enable signal and the first mode signal may be received from the front end core. In response to determining that the VIO signal is logic low, the method may include configuring the digital control interface to function as a general purpose input/output (GPIO) interface by providing a second enable signal from an enable input to the combinational logic block, providing a second mode signal from a mode input to the combinational logic block, and selecting, at the combinational logic block, the second enable signal and the second mode signal to output to the enable level shifter and the mode level shifter.

In some implementations, the method may include reconfiguring the front end core from a reset state to an active state in response to determining that the VIO signal is logic high. Reconfiguring the front end core from the reset state to the active state can include configuring a set of internal registers of the front end core to a default value. With some implementations of the method, at least one register from the set of internal registers is configured to a different default value than at least one other register from the set of internal registers.

Further, the method can include providing an output of the enable level shifter and an output of the mode level shifter to a power amplifier controller thereby enabling the power amplifier controller to configure a power amplifier based on the output of the enable level shifter and the output of the mode level shifter. In addition, the method may include placing the front end core into a reset mode in response to determining that the VIO signal is logic low. Placing the front end core into the reset mode may include maintaining a default value at a set of register level shifters.

Certain aspects of the present invention disclosure in this section can be included as part of a power amplifier, and power amplifier module, and thus advantageously employed in a wireless mobile device as described in detail herein above. The power amplifier can include a digital control interface and a mode selector configured to provide a VIO signal to the digital control interface. The VIO signal may be configured to set a mode of the digital control interface. In certain implementations, the digital control interface includes a voltage input/output (VIO) pin configured to receive the VIO signal and a front end core configured to provide a serial interface. The front end core may be in an active state when the VIO signal satisfies a first logic level and in an inactive state when the VIO signal satisfies a second logic level. The digital control interface can be configured to provide a general purpose input/output (GPIO) interface when the front end core is set to the inactive state. Further, the digital control interface can include a combinational logic block configured to provide an enable signal to an enable level shifter and a mode signal to a mode level shifter and a clock/mode pin configured to provide a clock signal to the front end core when the front end core is set to an active state and a mode signal to the combinational logic block when the front end core is set to an inactive state. Moreover, the digital control interface may include a data/enable pin configured to provide a data signal to the front end core when the front end core is set to an active state and an enable signal to the combinational logic block when the front end core is set to an inactive state. In some cases, the digital control interface includes a power on reset block configured to select, based on the VIO signal, a source of the enable signal and the mode signal provided to the enable level shifter and the mode level shifter respectively. In some implementations, the power amplifier control module also includes a power amplifier and a power amplifier controller configured to receive the enable signal from the enable level shifter and the mode signal from the mode level shifter, and to provide a control signal to the power amplifier based on the mode signal. The control signal may specify a mode of operation of the power amplifier.

In some implementations of the present power amplifier module, the data/enable pin is further configured to provide an address signal to the front end core when the front end core is set to an active state. The address signal can be associated with a register of the front end core. Further, in some cases, the digital control interface includes a plurality of register level shifters. Each register level shifter of the plurality of register level shifters may be configured to receive a register signal from the front end core and to output the register signal thereby enabling a power amplifier to be configured based on the register signal. The register signal may be associated with a value stored in one of a plurality of registers associated with the front end core. Further, in some cases, at least one register level shifter is further configured to receive a default signal during a reset state. The power on reset block may be configured to place the at least one register level shifter into the reset state.

In some embodiments, a digital control interface includes a voltage input/output (VIO) pin configured to receive a VIO signal. The VIO signal may correspond to one of a first logic level and a second logic level. Further, the digital control interface may include a clock/mode pin configured to receive a first signal corresponding to one of the first logic level and the second logic level, and a data/mode pin configured to receive a second signal corresponding to one of the first logic level and the second logic level. In addition, the digital control interface may include a general purpose input/output (GPIO) interface module and a serial interface module. In some cases, the GPIO interface module includes an enable level shifter, a first mode level shifter, a second mode level shifter, and a combinational logic block. The combinational logic block can be configured to provide an enable signal to the enable level shifter for output to a power amplifier controller. Further, the combinational logic block can be configured to provide a first mode signal to the first mode level shifter for output to the power amplifier controller and a second mode signal to the second mode level shifter for output to the power amplifier controller. The enable signal may correspond to an enable logic value when one or more of the first signal and the second signal correspond to the first logic level and the VIO signal corresponds to the second logic level. Moreover, the first mode signal may correspond to the first signal and the second mode signal may correspond to the second signal when the VIO signal corresponds to the second logic level. In some cases, the power amplifier controller is configured to control a power amplifier based, at least in part, on the first mode signal and the second mode signal. Some implementations of the serial interface module include a serial interface core and a reset logic block. The serial interface core can be configured to provide a serial interface when the VIO signal corresponds to the first logic level and the reset logic block can be configured to place the serial interface core into a reset mode when the VIO signal corresponds to the second logic level.

In some embodiments, the enable signal corresponds to a non-enabled logic value when the first signal and the second signal each correspond to the second logic level and the VIO signal corresponds to the second logic level. Further, the enable signal may correspond to a serial enable value received from the serial interface core when the VIO signal corresponds to the first logic value. In addition, the first mode signal may correspond to a first serial mode signal received from the serial interface core when the VIO signal corresponds to the first logic value and the second mode signal may correspond to a second serial mode signal received from the serial interface core when the VIO signal corresponds to the first logic value.

With some implementations hereof, the data/mode pin is further configured to provide an address signal to the serial interface core when the VIO signal corresponds to the first logic level. The address signal may be associated with a register of the serial interface core. In addition, the clock/mode pin may be further configured to provide a clock signal to the serial interface core when the VIO signal corresponds to the first logic level.

The digital control interface, in some embodiments, includes a plurality of register level shifters. Each register level shifter of the plurality of register level shifters may be configured to receive a register signal from the serial interface core and to output the register signal to the power amplifier controller. This enables, in some cases, the power amplifier controller to configure the power amplifier based on the register signal. The register signal can be associated with a value stored in one of a plurality of registers associated with the serial interface core.

In some embodiments, the serial interface module further includes a first buffer and a second buffer. The first buffer can be configured to enable data to be read from the serial interface core and the second buffer configured to prevent data from being written to the serial interface core when a buffer control signal is set to a first value. Further, the first buffer can be configured to prevent data from being read from the serial interface core and the second buffer configured to enable data to be written to the serial interface core when the buffer control signal is set to a second value. In some cases, the buffer control signal is generated by the serial interface core.

Some embodiments of the present disclosure may be configured to implement a method for providing multiple control interfaces in a digital control interface that includes a GPIO interface module and a serial interface module, which may include a serial interface core. The method can include receiving a VIO signal at a VIO input to the digital control interface and determining whether the VIO signal corresponds to a logic high value. In response to determining that the VIO signal corresponds to the logic high value, the method can include configuring the digital control interface to function as a serial interface by providing a clock signal from a clock input to the serial interface core, providing a data signal from a data input to the serial interface core, and selecting, at a combinational logic block, a first enable signal to output to an enable level shifter, a first mode signal to output to a first mode level shifter, and a second mode signal to output to a second mode level shifter. The first enable signal, the first mode signal, and the second mode signal may each be received from a serial interface core. In response to determining that the VIO signal corresponds to a logic low value, the method may include configuring the digital control interface to function as a general purpose input/output (GPIO) interface by providing a first input signal and a second input signal to the combinational logic block, and selecting, at the combinational logic block, a second enable signal to output to the enable level shifter, a third mode signal to output to the first mode level shifter, and a fourth mode signal to output to the second mode level shifter. The second enable signal may be based on a logical operation of the first input signal and the second input signal. Further, the third mode signal may be based, at least in part, on the first input signal, and the fourth mode signal may be based, at least in part, on the second input signal.

The indicated method, in some cases, includes reconfiguring the serial interface core from a reset state to an active state in response to determining that the VIO signal corresponds to the logic high value. Reconfiguring the serial interface core from the reset state to the active state can include configuring a set of internal registers of the serial interface core to a default value.

Further, the method can include providing an output of the enable level shifter, an output of the first mode level shifter, and an output of the second mode level shifter to a power amplifier controller thereby enabling the power amplifier controller to configure a power amplifier based on the output of the first model level shifter and the output of the second mode level shifter when the output of the enable level shifter corresponds to an enabled value. Moreover, the method may include placing the serial interface core into a reset mode in response to determining that the VIO signal corresponds to the logic low value. Placing the serial interface core into the reset mode may include loading a set of default values into a set of registers of the serial interface core.

Certain aspects of the present disclosure can be included as part of a power amplifier. The power amplifier can include a digital control interface, a power amplifier, a power amplifier controller, and a mode selector configured to provide a VIO signal to the digital control interface. In some cases, the VIO signal is configured to set the mode of a digital control interface and may corresponding to one of a first logic level and a second logic level. The digital control interface may include a voltage input/output (VIO) pin configured to receive the VIO signal, a clock/mode pin configured to receive a first signal corresponding to one of the first logic level and the second logic level, and a data/mode pin configured to receive a second signal corresponding to one of the first logic level and the second logic level. Further, the digital control interface may include a general purpose input/output (GPIO) interface module, which may include an enable level shifter, a first mode level shifter, a second mode level shifter, and a combinational logic block. In some cases, the combinational logic block is configured to provide an enable signal to the enable level shifter for output to the power amplifier controller. The combinational logic block may be further configured to provide a first mode signal to the first mode level shifter for output to the power amplifier controller and a second mode signal to the second mode level shifter for output to the power amplifier controller. The enable signal can correspond to an enable logic value when one or more of the first signal and the second signal correspond to a first logic level and the VIO signal corresponds to the second logic level. In some cases, the first mode signal corresponds to the first signal and the second mode signal corresponds to the second signal when the VIO signal corresponds to the second logic level. In addition, the digital control interface can include a serial interface module, which may include a serial interface core and a reset logic block. The serial interface core can be configured to provide a serial interface when the VIO signal corresponds to the first logic level and the reset logic block can be configured to place the serial interface core into a reset mode when the VIO signal corresponds to the second logic level. Further, the power amplifier controller can be configured to receive the enable signal from the enable level shifter, the first mode signal from the first mode level shifter, and the second mode signal from the second mode level shifter. In addition, the power amplifier controller can control the power amplifier by providing a control signal to the power amplifier based, at least in part, on the first mode signal and the second mode signal. This control signal may specify a mode of operation of the power amplifier.

In some embodiments, a wireless device may include a power amplifier module. The power amplifier module may include one or more of the previously described embodiments. Further, the wireless device can include a power supply configured to power the power amplifier module and a transceiver configured to provide a control signal to a mode selector of the power amplifier module.

In some embodiments, a digital control interface includes a voltage input/output (VIO) pin configured to receive a VIO signal. Further, the digital control interface may include a general purpose input/output (GPIO) interface module and a serial interface module. The GPIO interface module can include an enable level shifter, a first mode level shifter, a second mode level shifter, and a combinational logic block. The combinational logic block may be configured to provide an enable signal to the enable level shifter for output to a power amplifier controller. The combinational logic block may further be configured to provide a first mode signal to the first mode level shifter for output to the power amplifier controller and a second mode signal to the second mode level shifter for output to the power amplifier controller. The serial interface module can include a serial interface core and a reset logic block. The serial interface core can be configured to provide a serial interface when the VIO signal corresponds to a first logic level. Further, the reset logic block can be configured to place the serial interface core into a reset mode when the VIO signal corresponds to a second logic level. Moreover, the GPIO interface module can be configured to provide a GPIO interface when the VIO signal corresponds to the second logic level.

In certain implementations, the digital control interface may also include a clock/mode pin configured to receive a first signal corresponding to one of the first logic level and the second logic level. Further, the digital control interface may include a data/mode pin configured to receive a second signal corresponding to one of the first logic level and the second logic level. In some cases, the enable signal may correspond to an enable logic value when one or more of the first signal and the second signal correspond to the first logic level and the VIO signal corresponds to the second logic level. In addition, the first mode signal may correspond to the first signal and the second mode signal may correspond to the second signal when the VIO signal corresponds to the second logic level. In some embodiments, the power amplifier controller is configured to control a power amplifier based, at least in part, on the first mode signal and the second mode signal.

While certain embodiments of the inventions in this section have been described, these embodiments have been presented by way of example only, and are not intended to limit the scope of the disclosure or any claims. Indeed, the novel methods and systems described herein may be embodied in a variety of other forms. Furthermore, various omissions, substitutions, and changes in the form of the methods and systems described herein may be made without departing from the spirit of the disclosure, and these aspects of the present invention as disclosed in this section may be combined with other aspects hereof to further improve the performance of power amplifiers, power amplifier modules, and the mobile devices in which they are employed.

VI. Process-Compensated HBT Power Amplifier Bias Circuits and Methods

This section of the present disclosure is directed to a system for biasing a power amplifier that includes a first die including a power amplifier circuit and a passive component having an electrical property that depends on one or more conditions of the first die, and a second die including a bias signal generating circuit that is configured to generate a bias signal based at least in part on measurement of the electrical property of the passive component of the first die. As indicated above, these aspects of the present invention may be combined with other aspects hereof to further improve the performance of power amplifier modules and the devices in which they are employed.

Now with reference to FIG. 27, there is shown a radio-frequency (RF) configuration 408 that includes semiconductor die 409 having an integrated circuit (IC) 411 formed thereon. In some implementations as described herein, the die 409 can include a die-dependent component 412 having one or more operating parameters that depends on one or more conditions associated with the die 409. Operation of at least a portion of the IC 411 can be facilitated by a bias circuit 413 that is located outside of the die 409. Non-limiting examples of such a die-dependent component are described in greater detail herein-below.

As further shown in FIG. 27, the die-dependent component 412 can be coupled to the bias circuit 413 so that the bias circuit 413 can be operated based at least in part based on a condition of the die-dependent component 412. Because such a condition of the die-dependent component 412 is representative of a condition of the die 409, operating the bias circuit in the foregoing manner can allow the IC 411 to operate in an improved manner. Various examples of such die-dependent operation are described herein later in greater detail.

FIG. 28 shows that in some implementations, the IC 411 and the die-dependent component 412 of FIG. 27 can be formed on a first semiconductor die 409, and the bias circuit 413 (of FIG. 27) can be formed on a second semiconductor die 414. Examples of the types of the first and second die 409 and 414 are discussed below in greater detail.

With reference next to FIG. 29, there is shown an example of the two separate die 409 and 414 of FIG. 28. The first die 409 can be a die 416 based on heterojunction bipolar transistor (HBT) process technology. As further shown in FIG. 29, the IC formed on such a die can include a power amplifier (PA) circuit 415 implemented in the IC 411. As further shown in FIG. 29, the process-dependent component 412 can include a process-dependent resistance 412 having a die-to-die connection with the bias circuit 413 while the PA IC has a similar connection with the bias circuit 413.

FIG. 29 further shows that the second die 414 can be a die 417 based on silicon process technology. The bias circuit 413 is shown to be formed on such a die. Although various examples are described herein in the context of HBT and silicon dies, it should be understood that one or more features of the present disclosure can also be applied in other combinations of types of die. It should also be understood that, although described in the context of PA operation and biasing of such a PA, one or more features of the present disclosure can also be applied to other types of ICs and control of such ICs.

In the context of an HBT-based PA die and a bias circuit on a separate silicon die, a standard "diode stack" bias configuration used in many linear HBT power amplifier designs typically exhibits sensitivity to the device beta resulting in significant quiescent current variation of the amplifier. Variation of quiescent current can impact performance parameters such as gain, linearity and current drain. Product yield can also be degraded due to variation of these parameters.

Inability or reduction in capability in handling such beta sensitivity can result in operating configuration that requires increased biasing of the reference circuitry, which typically increases current drain for the product. In some situations, more complex circuit designs can be applied to the diode-stack biasing approach, which typically increase circuit area and current drain. Alternate bias approaches can be used other than the diode-stack topology, however, these approaches can often compromise bandwidth, degrade noise, and/or require external passive components.

FIG. 30 shows an example linear HBT PA die 418 having the foregoing standard "diode stack" bias configuration. For the purpose of description, the example PA die 418 is shown to include two stages 419 and 421. It should be understood that the number of stages can be more or less than two. The first stage 419 is shown to receive an RF signal to be amplified from an RFIN node 422 through an input match circuit 423. An output of the first stage 419 is shown to be passed to the second stage 421 via an interstage circuit 424 that provides matching and harmonic termination. An output of the second stage 421 is shown to be passed to an RFOUT node 427 via an output match and harmonic-termination circuit 426.

In the example shown in FIG. 30, each PA stage 419 and 421 is shown to receive DC bias current from a CMOS bias circuit (not shown) through respective inputs 428 and 429. The bias current is shown to be provided to a 2×Vbe diode mirror having a diode stack to yield a bias signal. Such a design topology demonstrates sensitivity to process beta which can result in increased part-to-part variation of quiescent current impacting gain, efficiency and linearity.

In some implementations, the present invention relates to a PA configuration that takes advantage of a passive device on the amplifier die to effectively sense die-dependent parameter such as beta and compensate for the associated effects such as quiescent-current variation to improve performance and/or reduce the part-to-part variation of the product. In some embodiments, such a PA configuration can include a silicon bias die and an HBT amplifier die. Traditionally, the silicon die would generate a reference current for the PA die which is substantially constant with respect to temperature of the PA die and essentially only varies by the tolerance of a discrete resistor.

In some implementations of the present invention, such a discrete reference resistor can be replaced by an integrated resistor on the HBT die. In some embodiments, this integrated resistor can be formed with the HBT device base material, and can exhibit a sheet resistance characteristic which tracks with the process beta. Based on such resistance, a reference current can be configured to track with beta and cancel or reduce the "diode-stack" sensitivity to beta.

In some embodiments, the foregoing base resistor (Rb) type can be configured to yield a high temperature coefficient which can be compensated by the bias generation circuitry within the silicon control die such that the voltage applied across the reference resistor increases with the ambient temperature. The resulting reference current sourced to the amplifier can be substantially constant over a selected range of ambient temperature and substantially track the HBT process beta.

FIG. 31 shows an example configuration 408 where an HBT PA die 416 includes a resistor 412 whose resistance Rb is process-dependent. Such a resistor can be used as a reference resistance for generating bias signals for the two example PA stages 415a and 415b. In view of the present disclosure, it should be readily understood that one or more features associated with the reference resistance and generation of bias signals based on such a reference resistance can be applied to PA configurations having more or less number of stages.

In the example configuration 408 of FIG. 31, one end of the reference resistor 412 is shown to be connected to a V-I circuit 432 and the other end is shown to be connected to a ground. The V-I circuit 432 is depicted as being on a silicon die 417 and is shown to facilitate current sources 433 and 434 providing bias signals for the first and second PA stages 415a and 415b. As described herein, such bias signals can be compensated for variations in one or more conditions of the HBT PA die 416. An example of how the V-I circuit 432 can be configured and operated in conjunction with a proportional-to-absolute-temperature (PTAT) voltage reference 431 and the reference resistor 412 is described herein below in greater detail.

FIGS. 32, 33, and 34 show how measurements of resistance (Rref, and also referred to as Rb) associated with the reference resistor 412 can detect variations in beta parameter and temperature. FIG. 32 shows a plot of 1/Rb values for HBT dies formed on different wafers (W2 to W10). FIG. 33 shows a plot of beta values for the same HBT dies formed on the example wafers W2-W10. A number of observations can be made. For instance, it may be seen in FIG. 33 that there can be die-to-die variations in the beta parameter within a given wafer. Between different wafers, there can also be significant variations in the beta parameter. Similarly, one can observe in FIG. 32 that there can be significant die-to-die and wafer-to-wafer variations in 1/Rb.

Empirically, one can also see in FIGS. 32 and 33 that the wafer-to-wafer values of 1/Rb are correlated to beta values. For example, a dip in average beta value for wafers W2 to W5 corresponds to a hump in average 1/Rb value for the same wafers. Such shows a trend of increase/decrease in 1/Rb when beta decreases/increases continues through the example sample of wafers.

While it is not desired or intended to be bound by any particular theory, some theories associated with base resistance Rb and beta parameter can be considered. Base resistance Rb can be expressed as sheet resistance $R_{bsh}$ which in turn can be expressed as $$R_{bsh} = 1/(q\mu_p N_A w_b) \quad (1)$$

where q is the carrier charge, $\mu_n$ is the n-type carrier mobility, $N_A$ is the net impurity concentration, and $w_b$ is the base layer thickness. The beta parameter can be expressed as DC current gain for a $\beta_{max}$ where $$\beta_{max} = (N_E/N_B)(v_{nB}/v_{pE})e_v^{[\Delta E/(kT)]} = (N_E/N_B)(D_n/D_p)(w_E/w_B)e_v^{[\Delta E/(kT)]} \quad (2A)$$

for AlGaAs and Si, where $N_E$ and $N_B$ are the emitter and base doping concentrations, $w_E$ and $w_B$ are the emitter and base thicknesses, and $\Delta E_v$ is the effective valence-band barrier height. In some situations, the DC current gain for InGaP can be expressed as $$\beta = (v_{nB}/w_b)\tau(N_b), \quad (2B)$$

which can be manipulated to show that $$(\beta/R_{bsh}) = qN_E w_E \mu_n e_v^{[\Delta E/(kT)]}. \quad (2C)$$

In Equation 2C, the parameters on the right side are related to the emitter, and thus may not vary significantly over the base process. Thus, for variations in the base (which is where most of the variation of Rb and β arise for an HBT), the beta parameter β and the base resistance Rb can respond substantially identically or in a similar manner, so that ratio of the two parameters can be generally constant. Accordingly, measurement of variation in Rb can provide information about the variation in β for changes that occur in the base.

FIG. 34 shows plots of reference resistances (Rref) versus operating temperature for different power output settings (in dBM) of an HBT PA. When consideration is given to these plots, it can be observed that the relationship between Rref and temperature is approximately linear.

As described in reference to FIGS. 31-34, base resistance of a PA die (e.g., an HBT PA die) varies with temperature and/or base layer parameters. In some implementations, such resistance can be utilized as a reference resistance to generate a control signal (e.g., a bias signal) that compensates for the variations associated with temperature and/or base layer parameters. FIG. 35 shows an example V-I circuit 432 that can generate such compensated control signals.

With continuing reference now to FIG. 35, the example V-I circuit 432 is shown to be formed on a silicon die 417, and can be configured to receive a proportional to absolute temperature (PTAT) signal (e.g., approximately 0.6V) from a PTAT source 431. Such a signal, generally independent of temperature and process parameters of the HBT PA die, can be provided to the base resistor (412 in FIG. 31). For example, current provided to the base resistor 412 can vary depending on the value of base resistance (Rb). In the example shown, the 0.6 PTAT voltage provided to an example Rb value of 6 kΩ results in approximately 408 µA current being drawn. This current can be used to generate an output voltage from the V-I circuit, to yield a reference current Iref to be provided to the PA circuit form on the HBT die. Such a reference current (Iref) provided to the HBT die is compensated for HBT die related effects sensed by the base resistor 412.

FIG. 36 shows plots of measured output voltages from the V-I circuit versus temperatures for different Vbatt settings (2.9V, 3.4V, 3.9V, 4.4V). Similar to the generally linear relationship between reference resistance and temperature, the V-I output voltages are also generally proportional to the base temperature of the HBT PA die.

Examples of benefits that can be realized from one or more features of the present disclosure are described in reference to FIGS. 37A to 40. To simulate performance of a power amplifier under different conditions, following parameters were varied between nominal values, high values, and low values: beta parameter, turn-on voltage Vbe, Ft parameter, resistance, and capacitance. The "uncompensated" design of FIGS. 37A and 37B corresponds to the example configuration of FIG. 30, and the "compensated" design of FIGS. 38A and 38B corresponds to the example configuration of FIG. 31.

FIGS. 37A and 37B show plots of quiescent currents for first and second stages of the uncompensated PA example described herein versus temperature. The different plots correspond to different combinations of the varied parameters. In each of the first and second stage simulations, the quiescent current varies by about +/−50%.

FIGS. 38A and 38B show plots of quiescent currents for first and second stages of the compensated PA example described herein versus temperature. The different plots correspond to different combinations of the varied parameters. For the first stage, the quiescent current varies by about +/−10%. For the second stage, the quiescent current varies by about +/−7%. After considered review, it can be observed that for both stages, the relative amount of variation in quiescent current in the compensated configuration is drastically less than that of the uncompensated configuration.

FIGS. 39 and 40 show examples of improvements in gain characteristics that can be provided by the reduced variation of quiescent current. FIG. 39 shows plots of calculated gain (dB) versus power output (dBm) at three example temperatures (−20° C., 25° C., 85° C.). For each temperature, the middle curve corresponds to a nominal configuration; the upper curve corresponds to quiescent current being at plus 10%, and the lower curve corresponds to quiescent current being at minus 10%. It is noted that 10% is the worst-case variation for the compensated configuration described in reference to FIG. 38. One can see that the +/−10% variation in quiescent current is generally constant over temperature; and thus can yield a good compression performance characteristic.

FIG. 40 shows plots of gains versus power output for the different combinations of the varied parameters described in reference to FIGS. 38A and 38B. Here it can be seen that all of the compensated gain curves desirably fit within a window of 28 dB+/−3 dB.

In some implementations according to these aspects of the present invention, a base resistor having one or more features as described herein can be a semiconductor resistor formed on a III-V semiconductor die (e.g., HBT die). Additional details concerning such resistors are described below in Section VIII hereof.

In some embodiments of the present invention, PA and bias die having one or more features described herein can be implemented in a packaged module. An example of such a module is shown in FIGS. 41A (plan view) and 41B (side view). A module 436 is shown to include a packaging substrate 437. Such a packaging substrate can be configured to receive a plurality of components, and can include, for example, a laminate substrate. The components mounted on the packaging substrate 437 can include one or more die. In the example shown, a PA die (e.g., an HBT PA die 416) and a bias die (e.g., a silicon bias die 417) are shown to be mounted on the packaging substrate 437. The PA die 416 can include a PA circuit 415 and a base resistor 412 as described herein; and the bias die 417 can include a V-I circuit 432 also described herein. The die 416 and 417 can be electrically connected to other parts of the module and with each other through connections such as connection-wirebonds 443. Such connection-wirebonds can be formed between contact pads 441 formed on the die and contact pads 438 formed on the packaging substrate 437. In some embodiments, one or more surface mounted devices (SMDs) 442 can be mounted on the packaging substrate 437 to facilitate various functionalities of the module 436.

In accordance with embodiments, RF-shielding features such as shielding wirebonds 444 can be provided to facilitate RF-shielding of one or more components (e.g., die 416, die 417, and/or SMD 442). Such RF-shielding can inhibit passage of RF signals or noise between such components and areas outside of the module 436. In the context of the shielding-wirebonds 444, such wirebonds can be formed on contact pads 439 so that the shielding-wirebonds 444 generally form a perimeter around a desired area (e.g. near the perimeter of the module 436). Dimensions and spacing of such shielding-wirebonds can be selected to provide desired RF-shielding properties.

In some embodiments, a three-dimensional RF-shield structure can be provided as follows. As shown in FIG. 41B, the shielding-wirebonds 444 can be electrically connected to a ground plane 440 that is below the surface of the packaging substrate 437. Such connections between the shielding-wirebonds 444 and the ground plane 440 can be facilitated by the contact pads 439 and connection features 450 (e.g., vias). Above the shielding-wirebonds 444, a conductive layer (e.g., conductive paint layer) 445 can be provided so that the conductive layer 445 is electrically connected with upper portions of the shielding-wirebonds 444. Accordingly, the conductive layer 445, the shielding-wirebonds 444, and the ground plane 440 can form a three-dimensional RF-shield structure.

According to some embodiments hereof, the space between the packaging substrate 437 and the conductive layer 445 can be filled with an overmold structure 446. Such an overmold structure can provide a number of desirable functionalities, including protection for the components and wirebonds from external elements, and easier handling of the packaged module 436.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, and other similar devices providing corresponding functionality.

With reference next to FIG. 42, there is schematically depicted an example wireless device 447 having one or more advantageous features described herein. In the context of biasing of PAs as described herein, a PA die 416 having one or more PAs can be part of a module 436. Here in die 416 four PAs are illustrated for exemplary purposes. Such a module can also include a bias die 417 having one or more features as described herein. In some embodiments hereof, such a PA module can facilitate, for example, multi-band operation of the wireless device 447.

The PAs in the module 436 can receive their respective RF signals from a transceiver 454 that can be configured and operated in known manners to generate RF signals to be amplified and transmitted, and to process received signals. The transceiver 454 is shown to interact with a baseband sub-system 453 that is configured to provide conversion between data and/or voice signals suitable for a user and RF signals suitable for the transceiver 454. The transceiver 454 is also shown to be connected to a power management component 451 that is configured to manage power for the operation of the wireless device. Such power management can also control operations of the baseband sub-system 453 and the PA module 436.

The baseband sub-system 453 is shown to be connected to a user interface 448 to facilitate various input and output of voice and/or data provided to and received from the user. The baseband sub-system 453 can also be connected to a memory 449 that is configured to store data and/or instructions to facilitate the operation of the wireless device, and/or to provide storage of information for the user.

In the example wireless device 447, outputs of the PAs of the module 436 can be matched by a matching network and routed to an antenna 458 via their respective duplexers 456 and a band-selection switch 457. In some embodiments, each duplexer can allow transmit and receive operations to be performed simultaneously using a common antenna (e.g., 458). In FIG. 42, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

The above detailed description of embodiments of the invention provided in this section is not intended to be exhaustive or to limit the invention to the precise form disclosed herein. While specific embodiments of, and examples for, the invention are described above for illustrative purposes, various equivalent modifications are possible within the scope of the invention, as those skilled in the relevant art may recognize. The teachings of the inventions provided herein can be applied to other systems, and are thus not intended to be necessarily limited to the system described above. The elements and acts of the various embodiments described above can be combined to provide further embodiments.

VII Devices and Methods for Structures Having HBTs and FETs

This section of the present disclosure is directed to a semiconductor structure includes a heterojunction bipolar transistor (HBT) including a collector layer located over a substrate, the collector layer including a semiconductor material, and a field effect transistor (FET) located over the substrate, the FET having a channel formed in the semiconductor material that forms the collector layer of the HBT. In some implementations, a second FET can be provided so as to be located over the substrate and configured to include a channel formed in a semiconductor material that forms an emitter of the HBT. One or more of the foregoing features can be implemented in devices such as a die, a packaged module, and a wireless device. It should be readily understood by those skilled in the arts hereof that these aspects of the present invention may be combined with other aspects hereof to further improve the performance of power amplifier modules and the devices in which they are employed.

Although described with particular reference to a device fabricated in the gallium arsenide (GaAs) material system, the structures described in this section can be fabricated using other III-V semiconductor materials, such as indium phosphide (InP) and gallium nitride (GaN). Further, any of a variety of semiconductor growth, formation and processing technologies can be used to form the layers and fabricate the structure or structures described herein. For example, the semiconductor layers can be formed using molecular beam epitaxy (MBE), metal organic chemical vapor deposition (MOCVD), which is also sometimes referred to as organic metallic vapor phase epitaxy (OMVPE), or any other technique. Moreover, the thicknesses of the various semiconductor layers described below are approximate, and may range to thinner or thicker than that described. Similarly, the doping levels of the doped semiconductor layers described herein-below are relative.

Aspects of the present invention presented in this section are directed to a semiconductor structure that includes a bipolar device, such as a heterojunction bipolar transistor (HBT), and a p-type field effect transistor (pFET) integrated on a common substrate, referred to generally as a BiFET, and formed in a GaAs material system. Embodiments also include a complementary BiFET (BiCFET) including a p-type FET (pFET) and an n-type FET (nFET) integrated with an HBT in a GaAs material system. The following description contains specific information pertaining to the implementation of the present invention. One skilled in the art will recognize that the present invention may be implemented in a manner different from that specifically discussed in the present application.

The drawing figures discussed herein and their accompanying detailed description are directed to merely exemplary embodiments of the invention. Although structure 459 discussed further herein-below, illustrates an exemplary BiFET comprising an NPN HBT and a pFET, which are situated over a substrate in a semiconductor die, the present invention may also apply to a BiFET comprising a PNP HBT and an NFET; an NPN HBT and both an nFET and a pFET; and a PNP HBT and both an nFET and a pFET.

Now with reference to FIG. 43, there is shown a schematic diagram illustrating a cross-sectional view of an exemplary structure including an exemplary BiFET in accordance with one embodiment of the present invention. The structure 459 includes BiFET 461, isolation regions 466, 467, and 469, and substrate 464 which can be a semi-insulating GaAs substrate. The BiFET 461 includes an HBT 462 which is located over substrate 464 between isolation regions 466 and 467, and pFET 463 which is located over substrate 464 between isolation regions 467 and 469. Isolation regions 466, 467, and 469 provide electrical isolation from other devices on substrate 464 and can be formed in a manner known in the art.

The HBT 462 includes sub-collector layer 471, a first collector layer segment 472, a second collector layer segment 473, an optional etch-stop layer segment 474, a base layer segment 476, an emitter layer segment 477, an emitter cap layer segment 478, a bottom contact layer segment 479, a top contact layer segment 481, collector contact 482, base contacts 484, and emitter contact 486.

For the purpose of description herein, an emitter can include one or more parts associated with an emitter stack. In the example HBT configuration 462 of FIG. 43, such an emitter stack can include the emitter layer 477, the emitter cap layer 478, the bottom contact layer 479, and the top contact layer 481. Accordingly, an emitter as described herein can include the emitter layer 477 and/or the emitter cap layer 478.

Also for the purpose of description herein, the example HBT topology is described in the context of GaAs/InGaP. It should be understood, however, that one or more features of the present disclosure can also be applied to other material systems used for HBTs, including, for example, indium phosphide (InP), antimonides, or nitride based materials.

The pFET 463 includes a back gate contact 468, a lightly doped N type GaAs segment 488, a lightly doped P type GaAs segment 489, an optional etch stop layer segment 491, typically comprising lightly doped N type or P type InGaP, source contact layer 492 and drain contact layer 493, typically comprising heavily doped P type GaAs, gate contact 494, source contact 497, and drain contact 498. Alternatively, the optional etch stop layer segment 491 can be undoped. In the present embodiment, the HBT 462 can be an NPN HBT integrated in a complementary arrangement with the pFET 463. In another embodiment, the HBT 462 can be a PNP HBT integrated with an nFET, or can be a PNP HBT or an NPN HBT integrated with the pFET 463 and with an nFET. In the present embodiment, the pFET 463 can be a depletion mode FET or an enhancement mode FET.

The sub-collector layer 471 is situated on substrate 464 and can comprise heavily doped N type GaAs. The sub-collector layer 471 can be formed by using a metal organic chemical vapor deposition (MOCVD) process or other processes. The first collector layer segment 472 and the collector contact 482 are located on the sub-collector layer 471. The first collector layer segment 472 can comprise lightly doped N type GaAs. The second collector layer segment 473 can comprise lightly doped P type GaAs. The first collector layer segment 472 and the second collector layer segment 473 can be formed by using a MOCVD process or other processes. The collector contact 482 can be formed from an appropriate metal or combination of metals, which can be deposited and patterned over the sub-collector layer 471.

The optional etch stop layer segment 474 can be located on the second collector layer segment 473 and can comprise lightly doped N type or P type InGaP. Alternatively, the optional etch stop layer segment 474 can be undoped. The etch stop layer segment 474 can be formed by using a MOCVD process or other processes.

The base layer segment 476 is located on the etch stop layer segment 474 and can comprise heavily doped P type GaAs. The base layer segment 476 can be formed by using a MOCVD process or other processes.

The emitter layer segment 477 and base contacts 484 are located on base layer segment 476. The emitter layer segment 477 can comprise lightly doped N type indium gallium phosphide (InGaP) and can be formed on the base layer segment 476 by using a MOCVD process or other processes. The base contacts 484 can comprise an appropriate metal or combination of metals, which can be deposited and patterned over base layer segment 476. The emitter cap layer segment 478 is located on the emitter layer segment 477 and can comprise lightly doped N type GaAs. The emitter cap layer segment 478 can be formed by using a MOCVD process or other processes.

The bottom contact layer segment 479 is located on the emitter cap layer segment 478 and can comprise heavily doped N type GaAs. The bottom contact layer segment 479 can be formed by using an MOCVD process or other processes.

The top contact layer segment 481 is situated on the bottom contact layer segment 479 and can comprise heavily doped N type indium gallium arsenide (InGaAs). The top contact layer segment 481 can be formed by using a MOCVD process or other processes. The emitter contact 486 is located on the top contact layer segment 481 and can comprise an appropriate metal or combination of metals, which can be deposited and patterned over top contact layer segment 481.

During operation of the HBT 462, current flows from the emitter contact 486, through the top contact layer segment 481, bottom contact layer segment 479, emitter cap layer segment 478, emitter layer segment 477, and into the base layer segment 476 and is indicated by arrow 483.

To form the pFET 463 in the collector of the HBT 462, a lightly doped P type GaAs layer segment 489 is located over a lightly doped N type GaAs layer segment 488, which is located over a heavily doped N type GaAs layer segment 487. A back gate contact 468 is formed on the heavily doped N type GaAs layer segment 487 to create a back gate for the pFET 463. The back gate contact 468 can comprise an appropriate metal or combination of metals, which can be deposited and patterned over the heavily doped N type GaAs layer segment 487.

The lightly doped N type GaAs layer segment 488 is substantially similar in composition and formation to the first collector layer segment 472 discussed above. The lightly doped P type GaAs layer segment 489 is substantially similar in composition and formation to the second collector layer segment 473 discussed above.

The lightly doped P type GaAs layer segment 489 forms the channel of the pFET 463. The etch stop layer segment 491 is situated on the lightly doped P type GaAs layer segment 489 and can comprise lightly doped N type or P type InGaP. Alternatively, the etch stop layer segment 491 can be undoped. The etch stop layer segment 491 can be formed on the lightly doped P type GaAs layer segment 489 by using a MOCVD process or other appropriate processes. When implemented, the etch stop layer segment 491 can have a thickness between approximately 10 nanometers (nm) and approximately 15 nm. In one embodiment, the pFET 463 can be an enhancement mode FET and the etch stop layer segment 491 can have a thickness less than 10 nm.

The source contact layer 492 and the drain contact layer 493 are located on the etch stop layer segment 491 and can comprise heavily doped P type GaAs to form source and drain regions, respectively. The source and drain contact layers 492 and 493 can be formed by using a MOCVD process or other processes. A source contact 497 and drain contact 498 are located on the etch stop layer segment 491. Source contact 497 and drain contact 498 can comprise platinum gold ("PtAu") or other appropriate metals and can be formed in a manner known in the art. A gate contact 494 is located on the etch stop layer segment 491 in gap 496, which is formed between source and drain contact layers 492 and 493, and can comprise an appropriate metal or combination of metals. The gap 496 can be formed by utilizing an appropriate etch chemistry to selectively etch through a layer of InGaAs and a layer of GaAs and stop on etch stop layer segment 491. After the gap 496 has been formed, gate contact 494 can be formed on etch stop layer segment 491 in a manner known in the art. In one embodiment, the FET 463 can be an enhancement mode FET and gate contact 494 can be formed directly on the lightly doped P type GaAs layer segment 489. In that embodiment, an appropriate etch chemistry can be utilized to selectively etch through etch stop layer segment 491 and stop on lightly doped P type GaAs layer segment 489.

Thus, by forming the pFET 463 in the layers that comprise the collector of the HBT 462, a pFET can be integrated with an NPN HBT, yielding a complementary BiFET.

With reference next to FIG. 44, there is shown a schematic diagram illustrating a cross-sectional view of an alternative embodiment of the structure of FIG. 43. The structure 499 shown in FIG. 44 includes a BiCFET structure that includes an HBT 502, a pFET 503 and an nFET 504. Elements and structures in FIG. 44 that are similar to corresponding elements and structures in FIG. 43 will not be described again in detail.

The BiCFET 501 includes the HBT 502 located between isolation region 506 and isolation region 507, the pFET 503 is located between isolation region 507 and 509, and the nFET 504 is located between isolation region 509 and isolation region 510.

The HBT 502 includes sub-collector layer 511, a first collector layer segment 512, a second collector layer segment 513, an optional etch-stop layer segment 514, a base layer segment 516, an emitter layer segment 517, an emitter cap layer segment 518, a second optional etch stop layer 519, a bottom contact layer segment 521, a top contact layer segment 522, collector contact 523, base contacts 524, and an emitter contact 525.

As description herein, an emitter can include one or more parts associated with an emitter stack. In the example HBT configuration 502 of FIG. 44, such an emitter stack can include the emitter layer 517, the emitter cap layer 518, second etch stop layer 519, the bottom contact layer 521, and the top contact layer 522. Accordingly, an emitter as described herein can include the emitter layer 517 and/or the emitter cap layer 518.

As also described herein, the example HBT topology is described in the context of GaAs/InGaP. It will be understood, however, that one or more features of the present disclosure can also be applied to other material systems used for HBTs, including, for example, indium phosphide (InP), antimonides, or nitride based materials.

The pFET 503 includes a lightly doped P type GaAs layer segment 529 located over a lightly doped N type GaAs layer segment 527, which is located over a heavily doped N type GaAs layer segment 526. A back gate contact 508 is formed on the heavily doped N type GaAs layer segment 526 to create a back gate for the pFET 503. The back gate contact 508 can be formed from an appropriate metal or combination of metals, which can be deposited and patterned over the heavily doped N type GaAs layer segment 526.

The lightly doped P type GaAs layer segment 529 forms the channel of the pFET 503. The etch stop layer segment 531 is situated on the lightly doped P type GaAs layer segment 529 and can comprise lightly doped N type or P type InGaP. Alternatively, the optional etch stop layer segment 531 can be undoped. The etch stop layer segment 531 can be formed on the lightly doped P type GaAs layer segment 529 by using a MOCVD process or other appropriate processes. When implemented, the etch stop layer segment 531 can have a thickness between approximately 10 nanometers (nm) and approximately 15 nm. The source contact layer 533 and the drain contact layer 538 are located on the etch stop layer segment 531 and can comprise heavily doped P type GaAs to form source and drain regions, respectively. A source contact 542 and drain contact 544 are located on the etch stop layer segment 531 above their respective contact layers 533 and 538. A gate contact 541 is located on the etch stop layer segment 531 in gap 540, which is formed between source and drain regions 533 and 538, and can comprise an appropriate metal or combination of metals.

To form the nFET 504 in the layers that comprise the emitter of the HBT 462, a lightly doped P type GaAs layer segment 530 is located over a lightly doped N type GaAs layer segment 528, which is located over the heavily doped N type GaAs layer segment 526. The lightly doped N type GaAs layer segment 528 is substantially similar in composition and formation to the first collector layer segment 472 discussed above in regard to FIG. 43. The lightly doped P type GaAs layer segment 530 is substantially similar in composition and formation to the second collector layer segment 473 discussed above in FIG. 43.

An etch stop layer segment 532 is located on the lightly doped P type GaAs layer segment 530 and is similar to the etch stop layer segment 531.

A heavily doped P type GaAs layer segment 534 is located on the etch stop layer segment 532 and is substantially similar in composition and formation to base layer segment 476 discussed above. A back gate contact 536 is formed on the heavily doped P type GaAs layer segment 534 to create a back gate for the nFET 504. The back gate contact 536 can comprise an appropriate metal or combination of metals, which can be deposited and patterned over the heavily doped P type GaAs layer segment 534. A lightly doped N type InGaP segment 537 is located on the heavily doped P type GaAs segment 534 and is substantially similar in composition and formation to the emitter layer segment 477 discussed above.

A lightly doped N type GaAs layer segment 539 is located on the lightly doped N type InGaP layer segment 537 and is substantially similar in composition and formation to the emitter cap layer segment 478 discussed above. The lightly doped N type GaAs layer segment 539 forms a channel for the nFET 504. The second optional etch stop layer segment 543 is located on the lightly doped N type GaAs layer segment 539 and can comprise lightly doped N type or P type InGaP. Alternatively, the second optional etch stop layer segment 543 can be undoped. The second optional etch stop layer segment 543 can be formed on the lightly doped N type GaAs layer segment 539 by using a MOCVD process or other appropriate processes. In an embodiment hereof, the second optional etch stop layer segment 543 can have a thickness between approximately 10 nm and approximately 15 nm. In an embodiment, the nFET 504 can be an enhancement mode FET and the etch stop layer segment 543 can have a thickness less than 10 nm.

A source region 546 and drain region 547 are located on the second optional etch stop layer segment 543 and can comprise heavily doped N type GaAs. The source region 546 and the drain region 547 can be formed by using a MOCVD process or other processes. Contact layer segments 548 and 549 are located on source and drain regions 546 and 547, respectively, and can comprise heavily doped N type InGaAs. Contact layer segments 548 and 549 can be formed by using a MOCVD process or other processes.

A source contact 551 and a drain contact 552 are located on top contact layer segments 547 and 548, respectively. A gate contact 553 is located on the second optional etch stop layer segment 543 in gap 554. Gap 554 can be formed by utilizing an appropriate etch chemistry to selectively etch through a layer of InGaAs and a layer of GaAs and stop on second optional etch stop layer segment 543. After gap 554 has been formed, gate contact 553 can be formed on the second optional etch stop layer segment 543 in a manner known in the art. In an embodiment hereof, the nFET 504 can be an enhancement mode FET and gate contact 553 can be formed directly on lightly doped N type GaAs layer segment 539. In that embodiment, an appropriate etch chemistry can be utilized to selectively etch through the second optional etch stop layer segment 543 and stop on lightly doped N type GaAs layer segment 539.

Accordingly, a BiCFET can be fabricated that includes complementary pFET 503 and nFET 504, formed on a GaAs substrate along with either an NPN or a PNP HBT.

In some embodiments as described herein, some or all of the etch stop layers (e.g., 474, 491, 514, 519, 531, 532 and 543) can include indium gallium phosphide (InGaP) or indium gallium arsenide (InGaAs). Such an etch stop layer can have a thickness range between 10 nanometers (nm) and 15 nm. Other thickness ranges can also be implemented. In some embodiments, some or all of the foregoing etch stop layers can include any material with etch selectivity to, for example, a channel of an FET. Such a material can be implemented in an appropriate thickness or within an appropriate range of thicknesses so as to achieve similar results as the foregoing example materials InGaP or InGaAs.

FIG. 45 shows a process 555 that can be implemented to fabricate the example BiFET 461 of FIG. 43 or a portion of the example BiCFET 501 of FIG. 44. In block 556, a semiconductor substrate can be provided. In some embodiments, such a semiconductor layer can include one or more layers disclosed herein, including a semi-insulating GaAs layer such as the example layers 464 and 505 of FIGS. 43 and 44. In block 557, a heterojunction bipolar transistor (HBT) can be formed so as to include a collector layer disposed over the substrate. In some embodiments, such a collector layer can include one or more layers disclosed herein, including a p– GaAs layer (473 in FIGS. 43 and 513 in FIG. 44). In block 558, a field effect transistor (FET) can be formed so as to include a channel region disposed over the substrate and formed from the same material as the collector layer of the HBT. In some embodiments, such a channel region can include one or more layers disclosed herein, including the p– GaAs layer (489 in FIGS. 43 and 529 in FIG. 44). In some implementations, other structures associated with the HBT (e.g., base, emitter and contacts) and the FET (e.g., source, drain and contacts) can be formed.

FIG. 46 shows a process 559 that can be implemented to fabricate the example BiCFET 501 of FIG. 44. In block 561, a semiconductor substrate can be provided. In some embodiments, such a semiconductor layer can include one or more layers disclosed herein, including a semi-insulating GaAs layer such as the example layer 505 of FIG. 44. In block 562, a sub-collector layer can be formed over the substrate layer. In some embodiments, such a sub-collector layer can include one or more layers disclosed herein, including the n+ GaAs layer (511 and/or 526 in FIG. 44). In block 563, an HBT can be formed over the sub-collector layer. In some embodiments, such an HBT can be formed so as to include the example layers described herein in reference to FIG. 44, including a collector 513, 512 (e.g., p– GaAs), a base 516 (e.g., p+ GaAs), an emitter 517 (e.g., n– InGaP), and an emitter cap 518 (e.g., n– GaAs). In block 564, a first FET can be formed over the sub-collector layer, so that its channel region is formed from same material as the HBT's collector region. In some embodiments, such a first FET can be formed so as to include the example layers described herein in reference to FIG. 44, including a channel layer 529 (e.g., p– GaAs), a source contact layer 533 (e.g., p+ GaAs), and a drain contact layer 538 (e.g., p+ GaAs). In block 566, a second FET can be formed over the sub-collector layer, so that its channel region is formed from same material as the HBT's emitter cap region. In some embodiments, such a second FET can be formed so as to include the example layers described herein in reference to FIG. 44, including a channel layer 539 (e.g., n– GaAs), a source contact layer 546 (e.g., n+ GaAs), and a drain contact layer 547 (e.g., n+ GaAs).

FIGS. 47, 48, and 49 show processes that can be more specific examples of the processes described in reference to FIGS. 45 and 46, in the context of the example configurations of FIGS. 43 and 44. FIG. 47 shows a process 567 that can be implemented to fabricate an HBT such as those of FIGS. 43 and 44. FIG. 48 shows a process 581 that can be implemented to fabricate an FET such as those of FIGS. 43 and 44. FIG. 49 shows a process 588 that can be implemented to fabricate a second FET such as that of FIG. 44. For the purpose of description of FIGS. 47, 48, and 49, it will be assumed that a semiconductor substrate (such as semi-insulating GaAs) and a sub-collector layer (such as n+ GaAs) are provided.

The example processes 567, 581 and 588 can be performed in sequence, in parallel where applicable, or in any combination thereof. Examples of such schemes of integrating an HBT with one or more FETs are described herein in greater detail.

In the example process 567 of FIG. 47 where an HBT is being fabricated, a first collector layer (e.g., n– GaAs) can be formed on the sub-collector layer in block 568. In block 569, a second collector layer (e.g., p– GaAs) can be formed on the first collector layer. In block 571, a first etch stop layer (e.g., n– or p– InGaP) can be formed on the second collector layer. In block 572, a base layer (e.g., p+ GaAs) can be formed on the first etch stop layer. In block 573, an emitter layer (e.g., n– InGaP) can be formed on the base layer. In block 574, an emitter cap layer (e.g., n– GaAs) can be formed on the emitter layer. In block 576, a second etch stop layer (e.g., n– or p– InGaP) can be formed on the emitter cap layer. In block 577, a bottom contact layer (e.g., n+ GaAs) for the emitter can be formed on the second etch stop layer. In block 578, a top contact layer (e.g., InGaAs) for the emitter can be formed on the bottom contact layer. In block 579, contacts for the emitter, base and collector can be formed so as to yield HBT configurations such as those (462, 502) of FIGS. 43 and 44.

In the example process 581 of FIG. 48 where a first FET (e.g., a pFET) is being fabricated, a doped layer (e.g., n– GaAs) can be formed on the sub-collector layer in block 582. In block 583, a channel layer (e.g., p– GaAs) can be formed on the doped layer. In block 584, a first etch stop layer (e.g., n– or p– InGaP) can be formed on the channel layer. In block 586, source and drain contact layers (e.g., p+ GaAs) can be formed on the first etch stop layer. In block 587, contacts for the source, drain, gate and back gate can be formed so as to yield FET configurations such as the example pFETs 463 and 503 of FIGS. 43 and 44.

In the example process 588 of FIG. 49 where a second FET (e.g., an nFET) is being fabricated, a first doped layer (e.g., n– GaAs) can be formed on the sub-collector layer in block 589. In block 591, a second doped layer (e.g., p– GaAs) can be formed on the first doped layer. In block 592, a first etch stop layer (e.g., n– or p– InGaP) can be formed on the second doped layer. In block 593, a third doped layer (e.g., p+ GaAs) can be formed on the first etch stop layer. In block 594, a fourth doped layer (e.g., n– InGaP) can be formed on the third doped layer. In block 596, a channel layer (e.g., n– GaAs) can be formed on the fourth doped layer. In block 597, a second etch stop layer (e.g., n– or p– InGaP) can be formed on the channel layer. In block 598, source and drain regions (e.g., n+ GaAs) can be formed on the second etch stop layer. In block 599, source and drain contact layer (e.g., InGaAs) can be formed on the source and drain regions. In block 601, contacts for the source, drain, gate and back gate can be formed so as to yield an FET configuration such as the example nFET (504) of FIG. 44.

In some implementations, the foregoing integration of an HBT with one or more FETs can be achieved in a number of ways, including a re-growth methodology, a two-step methodology, and/or a co-integration methodology. In the re-growth methodology, re-growth can involve a selective area, multilayer, and/or pre-patterned multilayer techniques. The selected area technique can include growing one device, etching in one or more selected areas, and then growing the other device in those selected area(s). The multilayer technique can include a single growth run, with the device layers stacked, not merged or shared. The pre-patterned multi-layer technique can include selective etching of a substrate prior to depositing layers for two or more devices.

In the two-step growth methodology, one device can be formed first, followed by formation of the other device adjacent to the first device. In the context of integration of three devices (such as the example of FIG. 44), such a two-step growth can be extended to include a third step growth of the third device.

In the co-integration methodology, a single growth can yield layers that are shared by two or more devices. In some implementations, the co-integration methodology can include single growth generated layers that constitute a majority of the layers of the two or more devices.

FIG. 50 shows that in some embodiments, one or more features associated with the BiFET and/or BiCFET configurations described herein can be implemented as part of a semiconductor die 602. For example, such a die can include a power amplifier (PA) circuit 603 having one or more BiFET and/or BiCFET devices 604 as formed according to the structures and methods provided herein.

Such a PA circuit 603 can be configured so as to amplify an input RF signal (RF_IN) to generate as an amplified output RF signal (RF_OUT).

FIG. 51 shows another example die 606 that includes a PA circuit 607 controlled by a PA/Switch controller 608. The controller 608 can be configured to include one or more BiFET and/or BiCFET devices 604 as formed according to the structures and methods hereof.

FIG. 52 shows that in some embodiments hereof, a die (such as the example die 606 of FIG. 51) can be implemented in a packaged module 609. The die 606 can include a PA 607 and a controller 608 having a BiFET (and/or BiCFET) 604 having one or more of the advantageous features as described herein. Such a module can further include one or more connections 611 configured to facilitate passage of signals and/or power to and from the die 606. Such a module can further include one or more packaging structures 612 that provide functionalities such as protection (e.g., physical, electromagnetic shielding, etc.) for the die 606. The connections 611 and packaging structures 612 may be implemented in accordance with other advantageous aspects hereof to further improve the performance of power amplifiers, power amplifier modules, and the wireless devices in which they may be employed.

FIG. 53 shows that in some embodiments, a component such as the die 606 of FIG. 51 or the module 609 of FIG. 52 can be included in a wireless device 613 such as a cellular phone, a smart phone, or other such wireless device that may benefit from the advantageous aspects hereof. In FIG. 53, the packaged RF module 609 is depicted as being part of the wireless device 613; and such a module is shown to include a BiFET and/or BiCFET 604 having one or more features as described herein. In some embodiments, an unpackaged die having similar functionality can also be utilized to achieve similar functionalities. The wireless device 613 is depicted as including other common components such an RFIC 616 and an antenna 617. The wireless device 613 can also be configured to receive a power source such as a battery 614.

While various embodiments of the present inventions have been described in this section, it will be apparent to those of ordinary skill in the art that many more embodiments and implementations are possible that would be within the scope of the invention. For example, the inventions herein are not limited to the gallium arsenide material system and may be combined in combination with any other number of relevant, desired, or suitable aspects of the present inventions as described throughout the entirety of this disclosure to even further improve the performance of integrated circuits, power amplifiers, power amplifier modules, and the devices in which they are employed.

VIII. RF Power Amplifiers Having Semiconductor Resistors

In many situations, it is desirable to reduce the cost of radio-frequency (RF) devices such as power amplifiers (PAs). Removing process steps and/or using "free" devices that do not involve extra processing steps are examples of how such cost-reduction can be achieved. As described herein and throughout this disclosure as related to other aspects hereof, semiconductor resistors can provide such advantageous cost reductions. As also described herein other advantages can also be realized with semiconductor resistors. For example, depending on resistance values available, smaller resistor footprints can be provided, which in turn can help shrink die sizes. Such a reduction in die size can further reduce cost. In another example, some semiconductor resistors can be sensitive to conditions of the same semiconductor materials that also form the resistors. As indicated above, these aspects of the present invention may be combined with other aspects hereof to further improve the performance of power amplifier modules and the devices in which they are employed.

Now continuing with reference next to FIG. 54, there is diagrammatically shown a semiconductor die 618 having an integrated circuit (IC) 619 according to further aspects of this invention. In some embodiments hereof, such an IC can include one or more semiconductor resistors 621. Examples of such a semiconductor resistors are described herein below in greater detail.

FIG. 55 shows an example of an HBT 622 having a stack of layers formed on a semiconductor substrate 630 (e.g., semi-insulating GaAs). As described herein by way of examples, different layers of such a stack can be utilized as a semiconductor resistor. It should be understood that, although such examples are described in the context of an HBT structure, semiconductor resistors can also be formed based on layers associated with other types of stack devices. Further, although various examples of layer materials are described in the context of those shown in FIG. 55, it should further be understood that other materials can also be utilized.

As shown in FIG. 55, a sub-collector layer 623 (e.g., n+ GaAs) can be formed over the substrate 630. A collector layer 624 (e.g., n–GaAs) can be formed over the sub-collector layer 623. A base layer 625 (e.g., p+ GaAs) can be formed over the collector layer 624. An emitter layer 626 (e.g., n– InGaP) can be formed over the base layer 625. An emitter cap layer 627 (e.g., n– GaAs) can be formed over the emitter layer 626. A bottom contact layer 628 (e.g., n+ GaAs) can be formed over the emitter cap layer 627. A top contact layer 629 (e.g., InGaAs) can be formed over the bottom contact layer 628.

As further shown in FIG. 55, a collector contact 631 can be formed on the sub-collector layer 623. A base contact 632 can be formed on the base layer 625. An emitter contact 633 can be formed on the top contact layer 629.

Figure 56G:
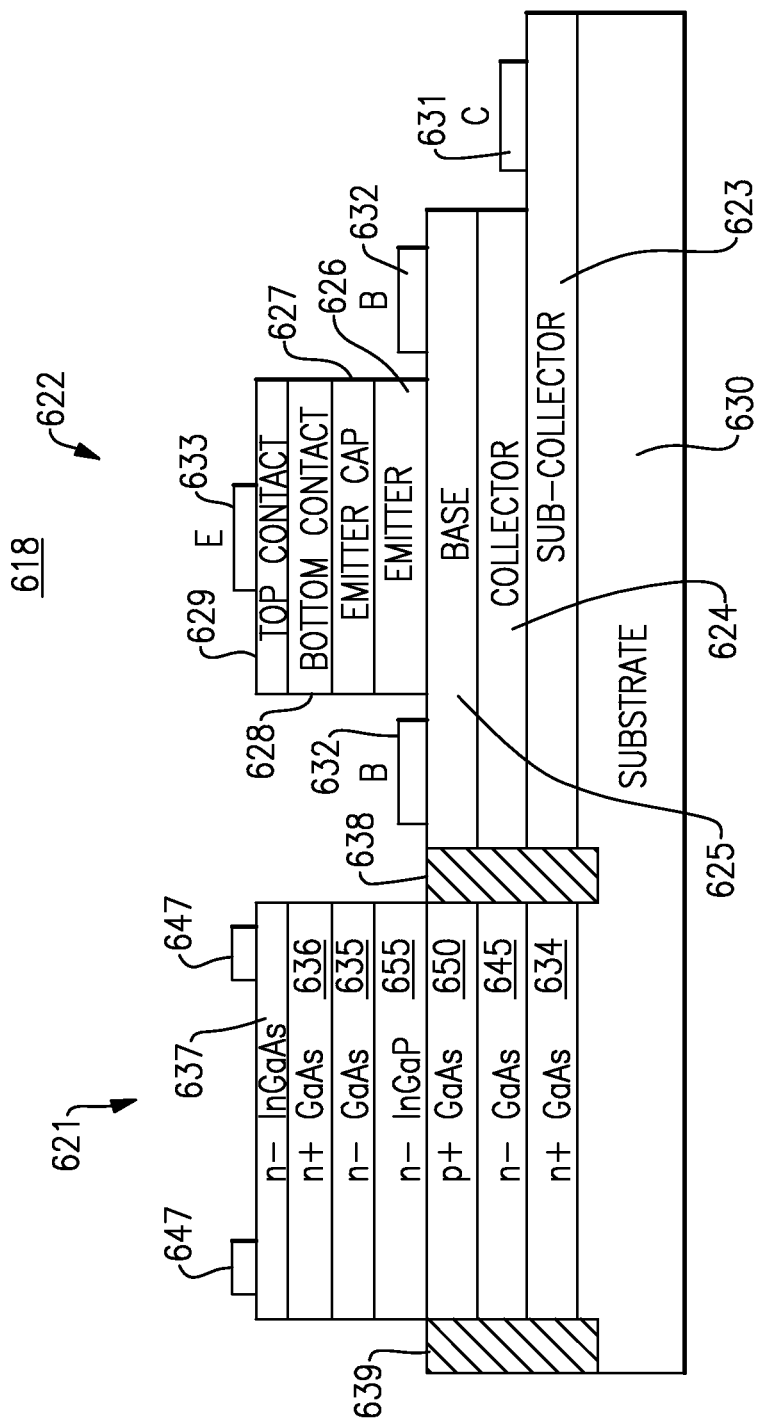
Figures 1, 56A:
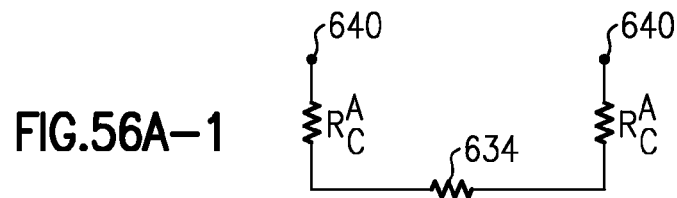

FIGS. 56A to 56G show examples of semiconductor resistors that can be formed using the various layers associated with the example HBT 622 of FIG. 55. FIGS. 56A-1 to 56G-1 are electrical schematic diagrams of the semiconductor resistors of FIGS. 56A to 56G, respectively. The resistance of the semiconductor resistors of FIGS. 56A to 56G can be based on a contact resistance of a metal-semiconductor interface and the resistance of one or more semiconductor regions. In some implementations, the resistance of the semiconductor resistor can be based on a contact resistance of a metal-semiconductor interface and the resistance of two or more semiconductor regions.

In an example shown in FIG. 56A, a semiconductor resistor 621 formed on a die 618 can include an isolated resistive region 634 formed during a step that forms a sub-collector 623 of an HBT 622. Such a resistive region can be formed from, for example, n+GaAs, and be isolated from the HBT 622 and other portions of the die 618 by isolation features 638 and 639. Electrical contacts 640 can be formed on the resistive region 634 so that the semiconductor resistor 621 can be utilized in a circuit.

In some implementations hereof, the resistive region 634 can be masked during the formation of other upper layers of the HBT 622. Upon completion of the HBT 622, the mask over the resistive region 634 can be removed. Then, electrical contacts 640 for the resistive region 634 can be formed during the formation of other contacts (e.g., 631, 632, and 633).

FIG. 56A-1 is an electrical schematic diagram of the semiconductor resistor 106 of FIG. 56A. As shown in FIG. 56A-1, the resistance between two electrical contacts 640 can be modeled by a contact resistance of a metal-semiconductor interface $R_C^A$ in series with a resistance of the resistive region 634 and another contact resistance of the metal-semiconductor interface $R_C^A$. Contact resistance of a metal-semiconductor interface Rc can be proportional to $\exp(\phi Bn/\sqrt{Nd})$, in which $\phi Bn$ is the barrier height (which depends on the work-function of the contact metal) and Nd is the doping concentration of the semiconductor material abutting the contact metal. The contact resistances in FIGS. 56A-1 to 56G-1 are different from each other when the semiconductor layers abutting the electrical contacts have different doping concentrations. The different contact resistances in FIGS. 56A-1 to 56G-1 can contribute to a semiconductor resistor 621 having a selected resistance value.

Figures 1, 56B:
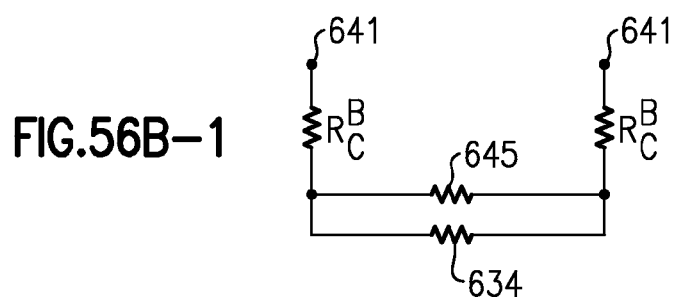

In an example shown in FIG. 56B, a semiconductor resistor 621 formed on a die 618 can include an isolated resistive region 645 formed during a step that forms a collector 624 of an HBT 622. The isolated resistive region 645 may be formed over the resistive region 634 as illustrated. Such a resistive region 645 can be formed from, for example, n– GaAs, and be isolated from the HBT 622 and other portions of the die 618 by isolation features 638 and 639. Electrical contacts 641 can be formed on the resistive region 645 so that the semiconductor resistor 621 can be utilized in a circuit.

In some implementations, the resistive regions 645 can be masked during the formation of other upper layers of the HBT 622. Upon completion of the HBT 622, the mask over the resistive region 645 can be removed. Then, electrical contacts 641 for the resistive region 645 can be formed during the formation of other contacts (e.g., 631, 632, 633).

FIG. 56B-1 is an electrical schematic diagram of the semiconductor resistor 621 of FIG. 56B. The schematic diagram of FIG. 56B-1 has a different contact resistance value that the schematic diagram of FIG. 56A-1. In addition, the schematic diagram of FIG. 56B-1 also includes the resistance of the resistive region 645 in parallel with the resistance of the resistive region 634. As shown in FIG. 56B-2, the resistance between two electrical contacts 641 can be modeled by a contact resistance of a metal-semiconductor interface $R_C^B$ in series with a parallel resistance of the resistive region 612 and the resistive region 614, and further in series with another contact resistance of the metal-semiconductor interface $R_C^B$.

Figures 1, 56C:
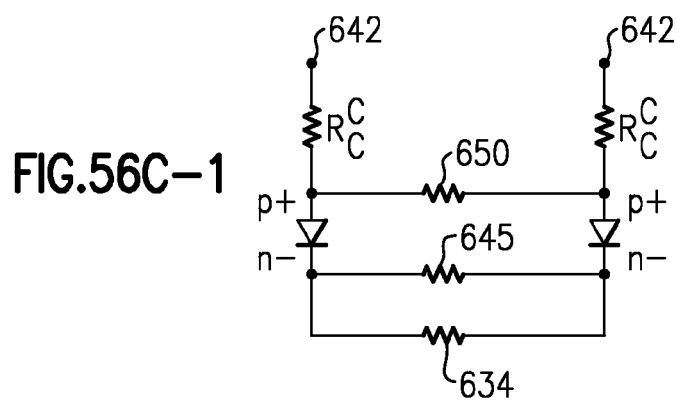

In an example shown in FIG. 56C, a semiconductor resistor 621 formed on a die 618 can include an additional isolated resistive region 650 formed during a step that forms a base 625 of an HBT 622. Such a resistive region can be formed from, for example, p+ GaAs, and be isolated from the HBT 622 and other portions of the die 618 by isolation features 638 and 639. Electrical contacts 642 can be formed on the resistive region 650 so that the semiconductor resistor 621 can be utilized in a circuit.

In some implementations, the resistive region 650 can be masked during the formation of other upper layers of the HBT 622. Upon completion of the HBT 622, the mask over the resistive region 650 can be removed. Then, electrical contacts 642 for the resistive region 650 can be formed during the formation of other contacts (e.g., 631, 632, and 633).

FIG. 56C-1 is an electrical schematic diagram of the semiconductor resistor 621 of FIG. 56C. The schematic diagram of FIG. 56C-1 has a different contact resistance value that the schematic diagrams of FIGS. 56A-1 and 56B-1. The schematic diagram of FIG. 56C-1 includes diodes at the PN junctions between the resistive region 645 and the resistive region 650. One of these diodes should be reverse biased. Accordingly, the resistances of the resistive regions 634 and 645 should not significantly contribute to the resistance between the electrical contacts 642. Thus, the resistance between electrical contacts 642 can be approximated by a contact resistance of a metal-semiconductor interface $R_C^C$ in series with a resistance of the resistive region 650, and further in series with another contact resistance of the metal-semiconductor interface $R_C^C$.

Figures 1, 56D:
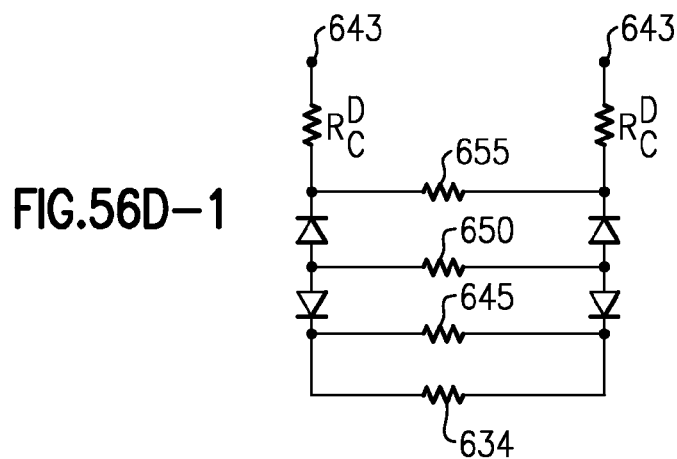

In an example shown in FIG. 56D, a semiconductor resistor 621 formed on a die 618 can include an isolated resistive region 655 formed during a step that forms an emitter 626 of an HBT 622. Such a resistive region can be formed from, for example, n-InGaP, and be isolated from the HBT 622 and other portions of the die 618 as illustrated. Electrical contacts 643 can be formed on the resistive region 655 so that the semiconductor resistor 621 can be utilized in a circuit.

In some implementations, the resistive region 655 can be masked during the formation of other upper layers of the HBT 622. Upon completion of the HBT 622, the mask over the resistive region 655 can be removed. Then, electrical contacts 643 for the resistive region 655 can be formed during the formation of other contacts (e.g., 631, 632, and 633).

FIG. 56D-1 is an electrical schematic diagram of the semiconductor resistor 621 of FIG. 56D. The schematic diagram of FIG. 56D-1 includes the diodes at the PN junctions between the resistive region 650 and the resistive region 655. One of these diodes should be reverse biased. Accordingly, the resistances of the resistive regions 634, 645, and 650 should not significantly contribute to the resistance between the electrical contacts 643. Thus, the resistance between electrical contacts 643 can be approximated by a contact resistance of a metal-semiconductor interface 10 in series with a resistance of the resistive region 655 and another contact resistance of the metal-semiconductor interface Re.

Figures 1, 56E:
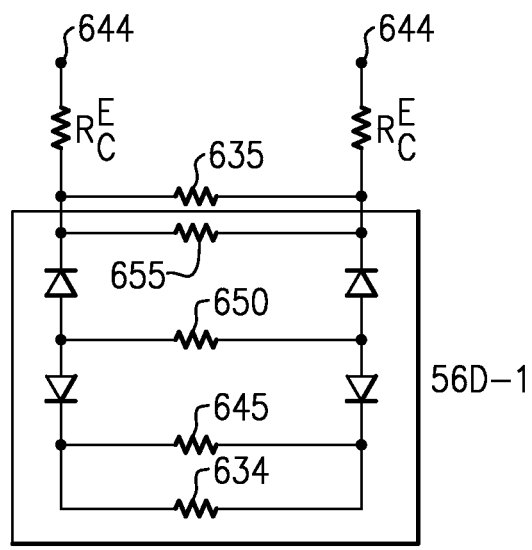

In an example shown in FIG. 56E, a semiconductor resistor 621 formed on a die 618 can include an additional isolated resistive region 635 formed during a step that forms an emitter cap 627 of an HBT 622. Such a resistive region can be formed from, for example, n– GaAs, and be isolated from the HBT 622 and other portions of the die 618 as illustrated. Electrical contacts 644 can be formed on the resistive region 635 so that the semiconductor resistor 621 can be utilized in a circuit.

In some implementations, the resistive region 635 can be masked during the formation of other upper layers of the HBT 622. Upon completion of the HBT 622, the mask over the resistive region 635 can be removed. Then, electrical contacts 644 for the resistive region 635 can be formed during the formation of other contacts such as, for example, contacts 631, 632, and 633.

FIG. 56E-1 is an electrical schematic diagram of the semiconductor resistor 621 of FIG. 56E. The schematic diagram of FIG. 56E-1 is similar to the schematic diagram of FIG. 56D-1, except that a resistance of the resistive region 635 is included in parallel with the resistance of resistive region 655 and the contact resistance of a metal-semiconductor interface is different. The resistance between electrical contacts 644 can be approximated by a contact resistance of a metal-semiconductor interface $R_C^E$ in series with a parallel resistance of the resistive regions 655 and 635, and further in series with another contact resistance of the metal-semiconductor interface $R_C^E$.

Figures 1, 56F:
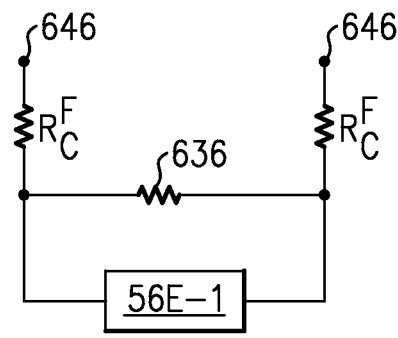
Figures 1, 56G:
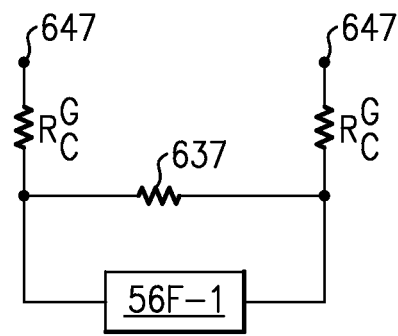

In an example hereof as next shown in FIG. 56F, a semiconductor resistor 621 formed on a die 618 can include an isolated resistive region 636 formed during a step that forms a bottom contact layer 628 of an HBT 622. Such a resistive region can be formed from, for example, n+ GaAs, and be isolated from the HBT 622 and other portions of the die 618 as illustrated. Electrical contacts 646 can be formed on the resistive region 636 so that the semiconductor resistor 621 can be utilized in a circuit.

In some implementations hereof, the resistive region 636 can be masked during the formation of other upper layer(s) of the HBT 622. Upon completion of the HBT 622, the mask over the resistive region 636 can be removed. Then, electrical contacts 646 for the resistive region 636 can be formed during the formation of other contacts such as contacts 631, 632, and 633.

FIG. 56F-1 is an electrical schematic diagram of the semiconductor resistor 621 of FIG. 56F. The schematic diagram of FIG. 56F-1 is similar to the schematic diagram of FIG. 56E-1, except that a resistance of the resistive region 636 is included in parallel with the resistance of resistive regions 655 and 635 and the contact resistance of a metal-semiconductor interface is different. The resistance between contacts 646 can be approximated by a contact resistance of a metal-semiconductor interface $R_C^F$ in series with a parallel resistance of the resistive regions 655, 635, and 636, and further in series with another contact resistance of the metal-semiconductor interface $R_C^F$.

In an example shown in FIG. 56G, a semiconductor resistor 621 formed on a die 618 can include an isolated resistive region 637 formed during a step that forms a top contact layer 629 of an HBT 622. Such a resistive region can be formed from, for example, n− InGaAs, and be isolated from the HBT 622 and other portions of the die 618 as illustrated. Electrical contacts 647 can be formed on the resistive region 637 so that the semiconductor resistor 621 can be utilized in a circuit.

In some implementations, the resistive region 637 can be masked during the formation of any other upper layer(s) of the HBT 622. Upon completion of the HBT 622, the mask over the resistive region 637 can be removed. Then, electrical contacts 647 for the resistive region 637 can then be formed during the formation of other contacts such as contacts 631, 632, and 633.

FIG. 56G-1 is an electrical schematic diagram of the semiconductor resistor 621 of FIG. 56G. The schematic diagram of FIG. 56G-1 is similar to the schematic diagram of FIG. 56F-1, except that the contact resistance of a metal-semiconductor interface is different and a resistance of the resistive region 637 is included in parallel with the resistance of resistive regions 655, 635, and 636. The resistance between electrical contacts 647 can be approximated by a contact resistance of a metal-semiconductor interface $R_C^G$ in series with a parallel resistance of the resistive regions 655, 635, 636, and 637, and further in series with another contact resistance of the metal-semiconductor interface $R_C^G$.

In the example configurations of FIGS. 56A-56G, the resistive region of the top layer of the resistor 621 may be representative of the corresponding layer in the HBT 622 stack. Thus, for example, the resistive region 645 corresponds to the collector 624. Similarly, the resistive region 650 corresponds to the base 625. The resistance of one or more resistive regions in the resistor 621 may contribute to the total resistance of the resistor 621. In some cases, the resistance of two or more resistive regions in the resistor 621 may contribute to the total resistance of the resistor 621. As discussed above, in some implementations, lower layers can have a relatively minor contribution to the resistance of the semiconductor resistor 621 compared to the contribution from the one or more upper layers that include electrical contacts. In some cases, the resistance of the top layer of the resistor 621 may correlate to a measurement of a characteristic of the corresponding layer of the HBT 622.

The example configurations of FIGS. 56A-56G show that a selected one of some or all of the layers in a stack device can be utilized to form a semiconductor resistor. Such a concept is schematically depicted in FIG. 57A, where a die 618 shown to include a stack device having a plurality of layers. Among such a plurality of layers is a selected layer 651; and there may be additional layers above (collectively depicted as 652) and/or below collectively depicted as 649. To form a resistive region 654 corresponding to the selected layer 651, a layer 653 or layers collectively depicted as 653 can be formed during the formation of the corresponding lower portion or portions 649, respectively. Then, the desired resistive region 654 can be formed during the formation of the selected layer 651. If the upper portion 652 of the stack 648 needs to be formed, then the resistive region 654 can be masked during such formation steps. Upon completion of such steps, the mask can be removed to allow formation of electrical contacts 656. The resulting resistive region 654 with the contacts 656 then forms a semiconductor resistor 621.

In some embodiments, the resistive region 654 can have a thickness "t" that is substantially the same as that of the selected layer 651 of the stack 648, and lateral dimensions "d1" and "d2" as shown in FIGS. 57A and 57B. Such dimensions can be selected to yield features such as desired resistance and footprint size of the resistor 621.

FIG. 57C shows that the semiconductor resistor 621 described in reference to FIGS. 57A and 57B can be schematically represented as a resistor having resistance "R." Examples of how such a resistor can be utilized in different applications are described herein in greater detail.

FIG. 58 shows that in some embodiments, a semiconductor resistor 621 formed on a die and having one or more features described herein can be coupled with a stack device such as a transistor 648 (e.g., an HBT) that is on the same die. FIGS. 59A, 59B, and 59C show different example embodiments of the configuration of FIG. 58. In the illustrated examples, the semiconductor resistor 621 is shown to provide ballast resistance for the base of the HBT 648 (FIG. 59A), for the emitter of the HBT 648 (in the context of the example NPN configuration, FIG. 59B), and for the collector of the HBT 648 (FIG. 59C). Additional details concerning semiconductor ballasting can be found in U.S. Pat. No. 5,378,922, titled "HBT WITH SEMICONDUCTOR BALLASTING," which is expressly incorporated herein by reference in its entirety and is to be considered part of the specification of the present application.

In some embodiments, a resistor 621 having one or more features as described herein can be coupled to a transistor 648 for purposes other than ballasting. In some embodiments, such a resistor may be utilized in a circuit having a transistor; but not necessarily be coupled directly with the transistor.

In some embodiments, a resistor having one or more features as described herein can be implemented on a die and be connected to another circuit located outside of the die. For example, FIG. 60 shows an example where a semiconductor resistor 621 is formed on a die 618. One terminal, referenced 657, of the resistor 621 is shown to be configured for electrical connection to a location outside of the die 618, and the other terminal 658 is shown to be within the die 618. The die 618 can include an integrated circuit (e.g., power amplifier circuit) having one or more transistors 648; and such a circuit can be controlled from an external circuit, as for example, through terminal 659. A bias circuit located outside of the die 618 can be such an external circuit. Such a bias circuit can be connected to the resistor 621 and the transistor 648 to allow operation of the transistor based on a parameter obtained from the resistor 621. Because the resistor 621 can be formed from substantially the same material as a layer of the transistor 648, such a parameter associated with the resistor 621 can track a condition that is common to both the transistor 648 and the resistor. Examples of such condition-tracking and applications thereof are above in Section VI.

As indicated above, fabrication of a semiconductor resistor having one or more features as described herein can be achieved with no additional processing steps or very little modifications of process steps, when compared to fabrication of stack structures on a given die. Although the various examples are described herein in the context of HBTs, it should be understood that similar resistor structures and fabrication methods can apply to other configurations. For example, additional layers can be formed for fabricating devices that include an HBT and one or more other transistor structures. Examples of such devices include, but are not limited to, U.S. Pat. No. 6,906,359 and PCT Publication No. WO 2012/061632 as cited above in the summary section hereof.

As discussed above, one or more features of the present disclosure can be implemented in III-V semiconductor die. In some embodiments, such III-V semiconductor die can include GaAs-based dies. Transistors and/or other stack structures formed on such GaAs-based dies may or may not include an HBT.

As previously indicated above, a number of advantageous features can be provided by semiconductor resistors. Other advantages can include, for example, a desirable feature where different temperature coefficient of resistance (TCR) values is provided by selecting a material associated with the resistor layer. In another example, size of the resistor can be optimized or configured in a desirable manner because of such a range of possible resistance values (e.g., sheet resistance of about 8 ohms/sq (e.g., sub-collector) to about 1,000 Ohms/sq (e.g., implanted base layer)). In yet another example, RF roll-off of resistor can be selected and/or tuned, depending on which resistor is selected (e.g., by modifying how the 3rd terminal on the device is biased).

In some embodiments, a die having one or more features described in this section can be implemented in a packaged module, such as the packaged module 436 discussed above in Section VI with regard to FIGS. 41A and 41B hereof. As discussed above, the module 436 of FIGS. 41A and 41B is shown to include a packaging substrate 437. Such a packaging substrate can be configured to receive a plurality of components, and can include, for example, a laminate substrate. The components mounted on the packaging substrate 437 can include one or more semiconductor die. In the example shown, the PA die 416 may be implemented as the HBT PA die 618 discussed in this section and the module 436 may similarly include the silicon bias die 417 as shown to be mounted on the packaging substrate 437. The PA die 618 as implemented in the exemplary module 436 of FIGS. 41A and 41B can include a transistor 648 and a semiconductor resistor 621 as described in this section; and the bias die 417 can include a circuit configured to provide control signals for the PA die 618. In this embodiment, the dies 618 and 417 can be electrically connected to other parts of the module and with each other through connections such as connection-wirebonds 443. Such connection-wirebonds can be formed between contact pads 441 formed on the die and contact pads 438 formed on the packaging substrate 437. In some embodiments, one or more surface mounted devices (SMDs) 442 can be mounted on the packaging substrate 437 to facilitate various functionalities of the module 436 as implemented with these aspects and features of the present invention.

In some embodiments, RF-shielding features such as shielding wirebonds 444 can be provided to facilitate RF-shielding of one or more components such as the current die HBT 618, die 417, and/or SMD 442). Such RF-shielding as discussed in the context of this disclosure, can inhibit passage of RF signals or noise between such components and areas outside of the module 436. In the implementation of the shielding-wirebonds 444, such wirebonds can be formed on contact pads 439 so that the shielding-wirebonds 444 generally form a perimeter around a desired area (e.g. near the perimeter of the module 436). Dimensions and spacing of such shielding-wirebonds can be selected to provide desired RF-shielding properties.

In some embodiments, a three-dimensional RF-shield structure can be provided as follows. As shown in FIG. 41B, the shielding-wirebonds 444 can be electrically connected to a ground plane 440 that is below the surface of the packaging substrate 437. Such connections between the shielding-wirebonds 444 and the ground plane 440 can be facilitated by the contact pads 439 and connection features 450, e.g., the vias formed in the substrate 437. Above the shielding-wirebonds 444, along with the conductive layer (e.g., conductive paint layer) 445 can be provided so that the conductive layer 445 is electrically connected with upper portions of the shielding-wirebonds 444. Accordingly, the conductive layer 445, the shielding-wirebonds 444, and the ground plane 440 can form a three-dimensional RF-shield structure.

In some embodiments hereof, the space between the packaging substrate 437 and the conductive layer 445 can be filled with the overmold structure 446 discussed above. Such an overmold structure can provide a number of desirable functionalities, including protection for the components and wirebonds from external elements, and easier handling of the packaged module 436.

Additional aspects of these RF-shielding and overmold structures according to aspects of the present are present in further detail herein-below in Sections XII and XIII.

In some implementations hereof, a device and/or a circuit having one or more of the resistor features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, and such similar devices now know or achieved hereafter.

With reference now back again to FIG. 42, the PA module 436 described therein may be advantageously implemented with the PA die 618 discussed in this section. Such a module can also include the bias die 417 as previously described herein. In some embodiments, such a PA module can better facilitate, for example, multi-band operation of the wireless device 447.

As described above, the PAs in the module 436 can receive their respective RF signals from the transceiver 454 that can be configured and operated in known manners to generate RF signals to be amplified and transmitted, and to process received signals. The transceiver 454 is shown to interact with the baseband sub-system 453 that is configured to provide conversion between data and/or voice signals suitable for a user and RF signals suitable for the transceiver 454. The transceiver 454 is also shown to be connected to the power management component 451 that is configured to manage power for the operation of the wireless device. Such power management can also control operations of the baseband sub-system 453 and the module 436.

The baseband sub-system 453 is shown to be connected to the user interface 448 to facilitate various input and output of voice and/or data provided to and received from the user. The baseband sub-system 453 can also be connected to the memory 649 that is configured to store data and/or instructions to facilitate the operation of the wireless device, and/or to provide storage of information for the user.

In the example wireless device 447, outputs of the PAs of the module 436 can be matched by a matching network and routed to the antenna 458 via their respective duplexers 456 and the band-selection switch 457. In some embodiments, each duplexer can allow transmit and receive operations to be performed simultaneously using a common antenna (e.g., 458). In FIG. 42, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS. Any such wireless devices may advantageously incorporate any of the resistor assemblies disclosed in this section so that any PA, PA module, or wireless device employing same may thereby enjoy the benefits, advantages, and improved performance associated therewith.

While various embodiments and related features, aspects, and characteristics of the present inventions have been described in this section, it will be apparent to those of ordinary skill in the art that many more embodiments and implementations are possible such that would be within the scope of the invention. For example, the inventions herein are not limited to the materials or systems described and further may individually or otherwise be combined, integrated, assembled, or joined together in combination with any other number of relevant, desired, or suitable aspects of the present inventions as described throughout the entirety of this disclosure to even further improve the performance of integrated circuits, power amplifiers, power amplifier modules, and the devices in which they are employed.

IX. Signal Path Termination

This section of the present disclosure relates to harmonic termination circuits that are separate from a load line. In one embodiment, the load line is configured to match an impedance at the power amplifier output at a fundamental frequency of the power amplifier output and the harmonic termination circuit is configured to terminate at a phase corresponding to a harmonic frequency of the power amplifier output. According to certain embodiments, the load line and the harmonic termination circuit can be electrically coupled to the power amplifier output external to a power amplifier die via different output pins of the power amplifier die. And further hereto, it should be readily understood by those skilled in the arts hereof that these aspects of the present invention may be combined with other aspects hereof to better improve the performance of power amplifier modules and the devices in which they are employed.

As generally described, aspects of the present disclosure relate to circuits configured to prevent a reflection or reflections of a signal, such as termination circuits. More specifically, aspects of the present disclosure herein relate to separate termination circuits configured to prevent portions of the power of different frequency components of a signal from being reflected. Using the systems, apparatus, and methods described herein, electronic systems, such as systems that include a power amplifier and/or systems configured to transmit radio frequency (RF) signals, can operate more efficiently and/or consume less power. For instance, less energy can be converted to harmonic frequencies of an RF signal and/or energy from harmonic frequency components of an RF signal can be converted into energy at a fundamental frequency of the RF signal. In accordance with one or more features described herein, direct current (DC) energy can be more efficiently converted into RF energy.

As discussed above, customers, such as original equipment manufacturers (OEMs), often desired high PAE and high linearity. A load line at an output of a power amplifier can impact PAE and linearity. The load line at the output power amplifier can be configured to increase and/or optimize linearity and/or PAE. This can include matching fundamental frequency components and/or terminating one or more harmonic frequency components of the power amplifier output. Such a load line can be implemented by termination circuits.

A power amplifier output can include a fundamental frequency component and one or more harmonic frequency components. Similarly, an input to a power amplifier or a power amplifier stage can include a fundamental frequency component and one or more harmonic frequency components. Some conventional power amplifier systems have included a single termination circuit (e.g., a load line) to match an impedance of a fundamental frequency of the signal at the node and terminate at a phase corresponding to a harmonic frequency of the signal at the node. However, it can be difficult to tune the single termination circuit to both match an impedance of the fundamental frequency of an amplified power amplifier output signal and terminate at a phase of a harmonic frequency of the amplified power amplifier output signal in a way that optimizes both PAE and linearity. As a result, PAE can decrease due to optimizing either matching an impedance of the fundamental frequency of amplified power amplifier output or terminating the amplified power amplifier output at a phase of the harmonic frequency.

As described in this section, an electronic system can include two or more separate termination circuits each coupled to a node in a signal path, such as a power amplifier output or an input to a power amplifier stage. A first termination circuit can be configured to match an impedance of a fundamental frequency of a signal at a node. In some implementations, the first termination circuit can be included in a fundamental load line. A second termination circuit, separate from the first termination circuit, can be configured to terminate at a phase corresponding to a harmonic frequency of the signal at the node. Circuit elements of the first termination circuit and the second termination circuit can be selected so as to improve PAE and linearity in a power amplifier system.

In some implementations hereof, at least a portion of the first termination circuit and/or the second termination circuit can be embodied external to a die that includes the circuit element or elements driving an output node of the die, such as a power amplifier output of a power amplifier die. For example, the first termination circuit can include one or more interconnects, such as wire bonds, electrically connected to one or more pins of a power amplifier die coupled to a packaging substrate and one or more capacitors separate from the power amplifier die and coupled to the packaging substrate. Alternatively or additionally, the second termination circuit can include one or more interconnects, such as wire bonds, electrically connected to one or more pins of the power amplifier die and one or more other capacitors coupled to a packaging substrate. When a plurality of interconnects are included in a termination circuit, the interconnects can be coupled in parallel with each other. In at least one of the first and second termination circuits, one or more wire bonds can function as an inductive circuit element and be coupled in series with the one or more capacitors coupled to the packaging substrate.

External to the die, the first termination circuit and the second termination circuit can have different electrical connections to the output node of the die. In certain implementations, a first output pin of the die can be coupled to the first termination circuit by a first wirebond and a second output pin of the die can be coupled to the second termination circuit by a second wirebond. In some of these implementations, a first number of wirebonds can couple the first termination circuit to pins of the die and a second number of wirebonds can couple the second termination circuit to pins of the die, in which the first number is different than the second number. According to a number of other implementations, a first output pin of the die can be coupled to the first termination circuit by a first bump and a second output pin of the die can be coupled to the second termination circuit by a second bump. In some of these implementations, a first number of bumps can couple the first termination circuit to pins of the die and a second number of bumps can couple the second termination circuit to pins of the die, in which the first number is different than the second number.

The first termination circuit and the second termination circuit can include different signal paths external to the die. For instance, the first termination circuit termination circuit can include a first trace implemented on the packaging substrate and the second termination circuit can include a second trace on the substrate. The first trace and the second trace can be part of separate signal paths on the substrate. For instance, in some implementations, the first trace can be part of an RF signal path and the second trace can be part of a DC signal path. The first trace and the second trace can be electrically separate from each other outside of the die.

Alternatively or additionally, within the die, the output node can be electrically coupled to branching conductive features such that the output is provided to separate signal paths on the die. The separate signal paths can include a first path included in the first termination circuit and a second path included in the second termination circuit. In this way, the first termination circuit and the second termination circuit can be separately tunable within the die during design of the die. For instance, the first signal path in the die can lead to a first output pin of the die and the second signal path can include a capacitor implemented on the die before leading to a second output pin. In one embodiment, a collector of an output stage of a power amplifier can be directly electrically coupled to both the first termination circuit and the second termination circuit by conductive features of the die.

By using two or more separate termination circuits, each termination circuit can be tuned to prevent reflection of the signal at a desired frequency. For instance, the inductance and/or capacitance of each termination circuit can be selected such that each termination circuit prevents reflect of a desired frequency component of a signal.

The methods, systems, and apparatus for signal path termination described in this section may be able to achieve one or more of the following advantageous features, among others. Advantageously, the separate termination circuits configured to prevent reflection of two or more distinct frequency components of a signal can increase one or more of PAE, linearity of a power amplifier, and baseband performance (for example, a broader frequency response and/or greater bandwidth). In some implementations, both PAE and linearity of the power amplifier can be increased. Furthermore, the Fig. of merit (FOM) of a power amplifier can also be increased. Moreover, battery life can be extended, an amount of heat dissipated can be reduced, signal quality of the signal upon which the separate termination circuits are preventing reflection can be increased, or any combination thereof. When the methods, systems, and apparatus for signal path termination described in this section are combined with other aspects of this invention as disclosed throughout the entirety of this disclosure, even further advantages and improvements may be achieved.

A. Wireless Devices

With reference now to FIG. 61A, there is shown in a schematic block diagram a wireless device 661 which may be implemented to advantageously include features of the present invention. Any of the systems, methods, and apparatus for preventing reflection of two or more frequency components of a signal described herein can be implemented in a variety of electronic devices, such as a wireless device or a mobile device. Examples of the wireless device 661 include, but are not limited to, a cellular phone (e.g., a smart phone), a laptop, a tablet computer, a personal digital assistant (PDA), an electronic book reader, a portable digital media player, and other such devices currently known or achieved hereafter. For instance, the wireless device 661 can be a multi-band and/or multi-mode device such as a multi-band/multi-mode mobile phone configured to communicate using, for example, Global System for Mobile (GSM), code division multiple access (CDMA), 3G, 4G, long term evolution (LTE), the like, or any combination thereof.

In certain embodiments, the wireless device 661 can include an RF front end 662, a transceiver component 663, an antenna 664, power amplifiers 665, a control component 666, a computer readable medium 667, a processor 668, a battery 669, and a supply control block 670, or any combination thereof.

The transceiver component 663 can generate RF signals for transmission via the antenna 664. Furthermore, the transceiver component 663 can receive incoming RF signals from the antenna 664.

It should be understood that various functionalities associated with the transmission and receiving of RF signals can be achieved by one or more components that are collectively represented in FIG. 61A as the transceiver 663. For example, a single component can be configured to provide both transmitting and receiving functionalities. In another example, transmitting and receiving functionalities can be provided by separate components.

Similarly, it should also be understood that various antenna functionalities associated with the transmission and receiving of RF signals can be achieved by one or more components that are collectively represented in FIG. 61A as the antenna 664. For example, a single antenna can be configured to provide both transmitting and receiving functionalities. In another example, transmitting and receiving functionalities can be provided by separate antennas. In yet another example, different bands associated with the wireless device 661 can be provided with different antennas.

As represented in FIG. 61A, one or more output signals from the transceiver 663 are depicted as being provided to the antenna 664 via the RF front end 662 via one or more transmission paths. In the example shown, different transmission paths can represent output paths associated with different bands and/or different power outputs. For instance, the two example power amplifiers 665 shown can represent amplifications associated with different power output configurations (e.g., low power output and high power output), and/or amplifications associated with different bands. In some implementations, one or more termination circuits can be included in one or more of the transmission paths.

In FIG. 61A, one or more detected signals from the antenna 664 are depicted as being provided to the transceiver 663 via one or more receiving paths. In the example shown, different receiving paths can represent paths associated with different bands. For example, the four example paths shown can represent quad-band capability that some wireless devices are provided with.

To facilitate switching between receive and transmit paths, the RF front end 662 can be configured to electrically connect the antenna 664 to a selected transmit or receive path. Thus, the RF front end 662 can provide a number of switching functionalities associated with an operation of the wireless device 661. In certain embodiments, the RF front end 662 can include a number of switches configured to provide functionalities associated with, for example, switching between different bands, switching between different power modes, switching between transmission and receiving modes, or some combination thereof. The RF front end 662 can also be configured to provide additional functionality, including filtering of signals. For example, the RF front end 662 can include one or more duplexers. Moreover, in some implementations, the RF front end 662 can include one or more termination circuits configured to prevent reflection of a frequency component of a signal.

The wireless device 661 can include one or more power amplifiers 665. RF power amplifiers can be used to boost the power of a RF signal having a relatively low power. Thereafter, the boosted RF signal can be used for a variety of purposes, including driving the antenna of a transmitter. Power amplifiers 665 can be included in electronic devices, such as mobile phones, to amplify a RF signal for transmission. For example, in mobile phones having an architecture for communicating under the 3G and/or 4G communications standards, a power amplifier can be used to amplify a RF signal. It can be desirable to manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot. A power amplifier module can include one or more power amplifiers.

FIG. 61A illustrates that in certain embodiments, a control component 666 can be provided, and such a component can be configured to provide various control functionalities associated with operations of the RF front end 662, the power amplifiers 665, the supply control 670, and/or other operating components.

In certain embodiments, a processor 668 can be configured to facilitate implementation of various processes described herein. For the purpose of description, embodiments of the present disclosure may also be described with reference to flowchart illustrations and/or block diagrams of methods, apparatus (systems) and computer program products. It should be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 667 that can direct a computer or other programmable data processing apparatus to operate in a particular manner, such that the instructions stored in the computer-readable memory produce an article of manufacture including instructions which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide operations for implementing the acts specified in a flowchart and/or block diagram block or blocks.

The illustrated wireless device 661 also includes a supply control 670, which can be used to provide a power supply to one or more of the power amplifiers 665. For example, the supply control 670 can be a DC-to-DC converter. However, in certain embodiments the supply control 670 can include other functions, such as, for example, an envelope tracker configured to vary the supply voltage provided to the power amplifiers 665 based upon an envelope of the RF signal to be amplified.

The supply control 670 can be electrically connected to a battery 669, and the supply block 670 can be configured to vary the voltage provided to the power amplifiers 665 based on an output voltage of a DC-DC converter. The battery 669 can be any suitable battery for use in the wireless device 661, including, for example, a lithium-ion battery. By reducing reflection of an output signal of the power amplifiers 665, the power consumption of the battery 669 can be reduced, thereby improving performance of the wireless device 661.

For instance, the termination circuits described herein can extend an amount of time that it takes the battery 669 to discharge.

FIG. 61B is a schematic block diagram of another illustrative wireless device 672, which can implement one or more aspects of this disclosure. In some implementations, the illustrative wireless device 672 of FIG. 61B can be a mobile phone. Any combination of features of the termination circuits described herein can be implemented in connection with power amplifiers, for example, in the 2.5G module and/or the 3G/4G front end modules (FEMs) of the wireless device 672.

The illustrated wireless device 672 includes a main antenna 673, a switch module 674, a 2.5 G module 676, a 3G/4G front end module 677, an LNA module 678, a diversity antenna 679, a diversity front end module 681, a transceiver 682, a global positioning system (GPS) antenna 683, a power management controller 684, a base band application processor 686, a memory 687, a user interface 688, an accelerometer 689, a camera 691, a WLAN/FM Bluetooth System on a Chip (SOC) 692, a WLAN Bluetooth antenna 693, and an FM antenna 694. It should be understood that the wireless device 672 can include more or fewer components than illustrated in FIG. 61B.

The transceiver 682 can be a multi-mode transceiver. The transceiver 682 can be used to generate and process RF signals using a variety of communication standards, including, for example, Global System for Mobile Communications (GSM), Code Division Multiple Access (CDMA), wideband CDMA (W-CDMA), Enhanced Data Rates for GSM Evolution (EDGE), other proprietary and non-proprietary communications standards, or any combination thereof. As illustrated, the transceiver 682 is electrically coupled to the 2.5G Module 676 and the 3G/4G front end module 677. A power amplifier in the 2.5G Module 676 and the 3G/4G front end module 677 can boost the power of an RF signal having a relatively low power. Thereafter, the boosted RF signal can be used to drive the main antenna 673. Such power amplifiers can include any of the termination circuits described herein to reduce reflection and/or noise at an input and/or an output. The switch module 674 can selectively electrically coupled power amplifiers in the 2.5G Module 676 and the 3G/4G front end module 677 to the main antenna 673. The switch module 674 can electrically connect the main antenna 673 to a desired transmit path.

In certain implementations, the diversity front-end module 681 and the diversity antenna 679 can help improve the quality and/or reliability of a wireless link by reducing line-of-sight losses and/or mitigating the impacts of phase shifts, time delays and/or distortions associated with signal interference of the main antenna 673. In some embodiments, a plurality of diversity front-end modules and diversity antennas can be provided to further improve diversity.

The wireless device 672 can include the WLAN/FM Bluetooth SOC module 692, which can generate and process received WLAN Bluetooth and/or FM signals. For example, the WLAN/FM Bluetooth SOC module 692 can be used to connect to a Bluetooth device, such as a wireless headset, and/or to communicate over the Internet using a wireless access point or hotspot via the WLAN Bluetooth antenna 693 and/or the FM antenna 694.

The wireless device 672 can also include a baseband application processor 686 to process base band signals. The camera 691, the accelerometer 689, the user interface 688, and the like, or any combination thereof can communicate with the baseband application processor 686. Data processed by the baseband application processor can be stored in the memory 687.

Although termination circuits have been illustrated and described in the context of two examples of wireless devices, the termination circuits described in this section can be used in other wireless devices and electronics.

B. Modules

FIG. 61C is a schematic block diagram of a power amplifier module 696. Although a power amplifier module having a power amplifier die will be discussed for illustrative purposes, it should be understood that the principles and advantages described herein can be applied to any suitable die and/or any suitable electronic module. The power amplifier module 696 can include some or all of a power amplifier system. The power amplifier module 696 can be referred to as multi-chip module in certain implementations. The power amplifier module 696 can include a packaging substrate 697, one or more power amplifier die 698, a matching network 699, one or more other die 700, and one or more circuit elements 701 coupled to the packaging substrate 697, the like, or any combination thereof.

The one or more other die 700 can include, for example, a controller die, which can include a power amplifier bias circuit and/or a direct current-to-direct current (DC-DC) converter. Example circuit elements 701 mounted on the packaging substrate can include, for example, inductors, capacitor(s), and the like, or any combination thereof. The power amplifier module 696 can include a plurality of die and/or other components attached to and/or coupled to the packaging substrate 697 of the power amplifier module 696. In some implementations, the substrate 697 can be a multi-layer substrate configured to support the die and/or other components and to provide electrical connectivity to external circuitry when the power amplifier module 696 is mounted on a circuit board, such as a phone board. Thus, the substrate 697 can be configured to receive a plurality of components, such as die and/or separate passive components. The substrate 697 can be a laminate substrate with a finish plating.

The power amplifier die 698 can receive a RF signal at one or more input pins of the power amplifier module 696. The power amplifier die 698 can include one or more power amplifiers, including, for example, multi-stage power amplifiers configured to amplify the RF signal. The amplified RF signal can be provided to one or more output pins of the power amplifier die 698. The one or more output pins can be, for example, bond pad configured for wirebonding. The matching network 699 can be provided on the power amplifier module 696 to aid in reducing signal reflections and/or other signal distortions. The matching network 699 can include one or more termination circuits that implement any combination of features described herein. While the matching network is shown as external to the power amplifier die 698, it will be understood that at least a portion of the matching network 699 can be implemented on the power amplifier die 698. The power amplifier die 698 can be any suitable die. In some implementations, the power amplifier die is a gallium arsenide (GaAs) die. In some of these implementations, the GaAs die has transistors formed using a heterojunction bipolar transistor (HBT) process.

The one or more circuit elements 701 of the power amplifier module 696 can include a capacitor and an inductor. An inductor 701 can be implemented on the substrate 697 as a trace on the substrate 697 or as a surface mount component (SMC) mounted to the substrate 697. The inductor can operate as a choke inductor, and can be disposed between a supply voltage received on a supply voltage pin $V_{CC}$ and the power amplifier die 698. The inductor can provide a power amplifier on the power amplifier die 698 with a supply voltage received on the supply voltage pin $V_{CC}$ while choking and/or blocking high frequency RF signal components. The inductor can include a first end electrically connected to the supply voltage pin $V_{CC}$, and a second end electrically connected to a collector of a bipolar transistor associated with the power amplifier die 698. The capacitor can function as a decoupling capacitor. The capacitor can include a first end electrically connected to the first end of the inductor and a second end electrically coupled to ground, which in certain implementations is provided using a ground pin of the power amplifier module 696 (not illustrated). The capacitor can provide a low impedance path to high frequency signals, thereby reducing the noise of the power amplifier supply voltage, improving power amplifier stability, and/or improving the performance of the inductor as a RF choke. In some implementations, the capacitor can include a SMC.

The matching network 699 can include two or more termination circuits. In some implementations, the matching network 699 can include wire bonds to electrically connect input and/or output pins of the power amplifier die 698 to the packaging substrate 697. The wire bonds can function as inductive circuit elements. The inductance can be increased by adding additional wire bonds in parallel. The wirebonds in parallel can each be coupled to a different pin of the power amplifier die 698. The inductance can be decreased by removing parallel wire bonds and/or adding wire bonds in series. The matching network 699 can also include one or more conductive traces on the substrate 697 and one or more capacitors mounted on the substrate 697. Each termination circuit can include conductive trace(s) and/or capacitor(s) in series with one or more wire bonds electrically connected to one or more pins of the power amplifier die 698. The capacitance and/or inductance values can be selected so as to prevent certain frequency components from being reflected (for example, from an antenna) due to impedance mismatches. This can advantageously increase PAE, power amplifier linearity, bandwidth over which the power amplifier operates within a specification, FOM, the like, or any combination thereof. Termination circuits that can be included in the matching network 699 will be described in more detail herein-below.

The power amplifier module 696 can be modified to include more or fewer components, including, for example, additional power amplifier dies, capacitors and/or inductors. For instance, the power amplifier module 696 can include one or more additional matching networks 699. In particular there can be another matching network between RF_IN and an input to the power amplifier die 698 and/or an additional matching network between power amplifier stages. As another example, the power amplifier module 696 can include an additional power amplifier die, as well as an additional capacitor and inductor configured to operate as an LC circuit disposed between the additional power amplifier die and the $V_{CC}$ pin of the module. The power amplifier module 696 can be configured to have additional pins, such as in implementations in which a separate power supply is provided to an input stage disposed on the power amplifier die and/or implementations in which the multi-chip module operates over a plurality of bands.

C. Termination Circuits

As used herein, a termination circuit can refer to a circuit configured to prevent a portion of the power of a signal, such as an RF signal, from being reflected. A termination circuit can be configured to reduce and/or minimize reflections of the signal by matching impedance. This can increase PAE and/or power amplifier gain. Termination circuits can include, for example, a load line configured to match an impedance of a fundamental frequency at a node and one or more harmonic termination circuits.

With reference to FIG. 62, a circuit diagram of a power amplifier system with example termination circuits will be described. Some or all of the power amplifier system can be implemented on the power amplifier module 696 of FIG. 61C. As shown in FIG. 62, the power amplifier module 696 can include power amplifier stages 713 and/or 714 such as GaAs bipolar transistors, power supply pins such as a $V_{SUP1}$ and $V_{SUP2}$, inductors 716 and/or 717, matching networks 705 and 708, and input matching circuit 712, or any combination thereof. An RF input signal RF_IN can be provided to a first stage power amplifier 713 via an input matching circuit 712. A first stage amplified RF signal can be generated by the first stage power amplifier 713. The first stage amplified RF signal can be provided to the second stage power amplifier 714 via an inter stage power amplifier matching network 706. A second stage amplified RF signal can be generated by the second stage power amplifier 714. The second stage amplified RF signal can be provided to an output load via an output matching network 709. The RF signal RF_OUT provided to the output load can be provided to an output of a power amplifier module in some implementations.

The first stage power amplifier 713 can be coupled to a power supply, for example, a battery or other source that would supply $V_{SUP1}$, via the choke inductor 716. Similarly, the second stage amplifier 714 can be coupled to the power supply, for example, a battery to provide $V_{SUP2}$, via the choke inductor 717. The first power amplifier stage 713 can consume less power from the power supply when corresponding termination circuits are tuned to prevent reflections of a fundamental frequency component of the first stage amplified RF signal and one or more harmonic components of the first stage amplified RF signal. Similarly, the second power amplifier stage 714 can consume less power from the power supply when corresponding termination circuits are tuned to prevent reflections of a fundamental frequency component of the second stage amplified RF signal and one or more harmonic components of the second stage amplified RF signal.

As illustrated in FIG. 62, the power amplifier module 696 can include the first matching network 705 and the second matching network 708. The first matching network 705 can include the inter stage fundamental termination circuit 706 and an inter stage harmonic termination circuit 707. The second matching network 708 can include the output fundamental termination circuit 709 and an output harmonic termination circuit 711. Any combination of features of second matching network 708 can be applied to the first matching network 705, as appropriate.

For illustrative purposes, the second matching network 708 will be described in more detail. The output fundamental termination circuit 709 can be a fundamental load line. The output fundamental termination circuit 709 can be configured to prevent a portion of the power of a fundamental frequency component of the second stage amplified RF signal from being reflected from the load. The load can include, for example, an RF switch in a switch module 674 and an antenna 673. The output harmonic termination circuit 711 can be configured to prevent a portion of the power of one or more harmonic frequency components of the second stage amplified RF signal from being leaked toward a load.

More specifically, the output harmonic termination circuit 711 can include a termination circuit configured to prevent a portion of the power a second order harmonic frequency component of the second stage amplified RF signal from being leaked toward the load. In some implementations, the output harmonic termination circuit 711 can alternatively or additionally include a termination circuit configured to prevent a portion of the power a third order harmonic frequency component of the second stage amplified RF signal from being leaked toward the load. The principles and advantages of separate termination circuits configured to prevent reflection of a portion of the power a harmonic frequency component of the second stage amplified RF can be applied to any desired harmonic frequency component and/or any suitable number of harmonic frequency components. Although some embodiments are described with reference to harmonic frequencies, one or more features described herein can be applied to any desired frequency.

A termination circuit corresponding to a desired frequency component of the second stage amplified RF signal can include one or more inductive circuit elements in series with one or more capacitive circuit elements. The series circuit elements of the termination circuit can couple an input node of a fundamental load line, such as the output fundamental termination circuit 709, to a ground reference voltage. The series circuit elements can include, for example, a wirebond, a trace on the substrate, and a surface mounted capacitor. In certain implementations, the series circuit elements can include a wirebond having a first end coupled to an output pin of a die and a second end coupled to a conductive trace on a packaging substrate. According to some of these implementations, the series circuit elements can also include a capacitor mounted on the packaging substrate. Such a capacitor can have a first end coupled to the conductive trace and a second end coupled to a reference voltage, such as a ground potential. An effective inductance of the inductive circuit element(s) and/or an effective capacitance of the capacitive circuit element(s) can be selected so as to tune the termination circuit to prevent reflections of the desired frequency component of the second stage amplified RF signal.

At node n1, the power amplifier output can include a fundamental frequency component and one or more harmonic frequency components. The RF output signal RF_OUT provided to the output load can be the sum of each of these frequency components. A power amplifier output having a waveform that is efficient for transmitting a signal can result in a desirable linearity of the power amplifier. For instance, it can be desirable to have the frequency components of the power amplifier output at node n1 to combine to form a perfect sine wave. Alternatively or additionally, it can be desirable to prevent the output at the collector of the bipolar transistor of the power amplifier output stage 714 from clipping.

The impedance at node n1 can be represented by Equations 3 and 4:

$$Z = jx - \frac{1}{jwC} \quad (3)$$

$$x = wL - \frac{1}{wC} \quad (4)$$

In Equation 3, Z can represent the impedance at node n1, jx can represent the impedance of a transmission line between node n1 and a termination capacitor, and 1/jwC can represent the impedance of the termination capacitor. In Equation 4, wL can represent an inductive component of the impedance of the transmission line and 1/wC can represent a capacitive component of the transmission line at a fundamental frequency w. Thus, the transmission line can function as a capacitive and/or an inductive circuit element. The transmission line can include, for example, one or more interconnects from one or more pins of the power amplifier die to a conductive trace on a packaging substrate. The transmission line can also include the conductive trace on the packaging substrate.

The phase of the power amplifier output at node n1 can be shifted by adjusting the impedance of the transmission line. As one example, adding an additional wirebond coupling the node n1 to a conductive trace on a packing substrate in parallel with one or more wirebonds can decrease the inductive impedance component of the transmission line. This can shift the phase of the impedance of a particular frequency along a circuit for the particular frequency on a Smith chart. Shifting the phase of the impedance can in turn adjust the capacitive and inductive components of the impedance, for example as represented by Equations 3 and 4. As another example, adjusting a length of a conductive trace on the packaging substrate can adjust the impedance of the transmission line. By adjusting the impedance of the transmission line and/or a capacitance of a termination capacitor in a harmonic termination circuit, the harmonic termination circuit can be configured to terminate at a phase of a harmonic frequency of the power amplifier output at node n1.

In certain implementations hereof, the impedance at node n1 can be approximately 0 (short circuit) at a second harmonic and the impedance at node n1 can appear very large or infinite (open circuit) at a third harmonic. For instance, a short circuit impedance can be realized by making the impedance equal to 0 in Equations 3 and 4. As another example, when the capacitance of the transmission line approaches zero, then the impedance will appear as an open circuit according to Equations 3 and 4. In some other implementations, the impedance at node n1 can be an open circuit at a second harmonic and a short circuit at a third harmonic. Thus, the harmonic termination circuits can be configured to meet the needs of a desired application.

Referring to FIG. 63A, a block diagram of another power amplifier system including illustrative termination circuits according to another embodiment will be described. Some or all of the power amplifier system illustrated in FIG. 63A can be implemented on a power amplifier module 696. The power amplifier module 696 can include a power amplifier die 698 mounted on a packaging substrate 697. The power amplifier die 698 can include pins, such as output pins 721 and 722. Although the output pins 721 and 722, respectively, are illustrated as single pins, these pins can each represent a group of two or more pins in certain embodiments. An output of a power amplifier can be provided to the output pins 721 and 722. The output pins 721 and 722 can both be coupled to the node n1 of FIG. 62. As illustrated in FIG. 62, the node n1 is coupled to a collector of a GaAs bipolar transistor, an input to the output matching network 709, and an input of the output harmonic termination circuit 711.

The power amplifier module 696 of FIG. 63A includes an output fundamental termination circuit 709 that is separate from an output harmonic termination circuit 711. The fundamental termination circuit 709 and the harmonic termination circuit 711 can have different electrical connections to an output node of a power amplifier, such as node n1 in FIG. 62, external to the power amplifier module 698. For instance, different interconnects can electrically couple the fundamental termination circuit 709 and the harmonic termination circuit 711 to different pins of the power amplifier module 698. The fundamental termination circuit 709 and the harmonic termination circuit 711 can be included in separate signal paths on the substrate 697. These separate signal paths may not be electrically connected to each other on the substrate 697 or via circuit elements external to the power amplifier module 698. The fundamental termination circuit 709 and the harmonic termination circuit 711 can be included in separate signal paths. For instance, the output of a power amplifier can be provided to two or more separate signal paths with one path going to the fundamental termination circuit 709 and a different path going to the harmonic termination circuit 711. The two or more separate paths can include a DC path that is separate from an RF path, for example, as illustrated.

The fundamental termination circuit 709 can include one or more interconnects 719, such as wire bonds and/or bumps, coupling one or more output pins 722 to a conductive trace of the packaging substrate 697. In implementations with more than one output pin 722, the interconnects 719 electrically connecting the pin(s) 722 to the conductive trace can be in parallel with each other. The number of interconnects 719 (for example, wire bonds) can be adjusted to change the inductance of the output fundamental termination circuit 709 so as to prevent reflection of a desired frequency component of a signal on the signal path at the output pins 722. Including more interconnects 719 in parallel can reduce an effective inductance. The conductive trace can couple the interconnect(s) 719 in series with a capacitor. The conductive trace can also add an inductance and/or a capacitance to the termination circuit, for example, as discussed above. A capacitance of the capacitor can be selected so as to prevent reflection of a desired frequency component of a signal on the signal path at the output pin(s) 722. Alternatively or additionally, an effective capacitance of the termination circuit can be adjusted by including additional capacitor(s) in series and/or parallel with the capacitor and/or by including other capacitive circuit elements. The effective inductance the effective capacitance of the termination circuit can be configured in combination with each other so as to increase linearity and/or PAE of the power amplifier module 696. The effective inductance and the effective capacitance can be determined, for example, based on the number of interconnects coupled to an output pin of the power amplifier die 698, the dimensions (such as length) of a conductive trace on the substrate, and the capacitance of a capacitor mounted on the substrate.

The output harmonic termination circuit 711 includes one or more interconnects 718, such as wire bonds and/or bumps, coupling one or more output pin(s) 721 to a conductive trace of the packaging substrate 697. In implementations with more than one output pin 721, the interconnects 718 electrically connecting the pins 721 to the wire trace can be coupled in parallel. The number of interconnects 718 (for example, wire bonds) included in the output harmonic termination circuit 711 can be configured separately from the number of interconnects 719 of the output fundamental termination circuit 709. In this way, inductance of different termination circuits can be tuned to increase linearity and/or PAE of the power amplifier module 696. This can include matching an impedance of a fundamental frequency of a signal at the node in the output fundamental termination circuit 709 and terminating at a phase corresponding to a harmonic frequency of the signal at the node in the output harmonic termination circuit 711. Effective capacitances of the different termination circuits can also be configured separately and independent of each other. Because the different termination circuits can be included in different signal paths, changes to either termination circuit may not affect another termination circuit.

A conductive trace can couple interconnects, such as wire bonds, in series with one or more capacitive circuit elements, such as capacitors, in the output matching network illustrated in FIG. 63A. An effective capacitance of the termination circuit can be selected so as to prevent reflection of another desired frequency component of a signal on the signal path at the output pin(s) 721 that is different from the desired frequency component of the signal that the output fundamental termination circuit 709 is configured to prevent from reflecting. In certain implementations, the different termination circuits can include different conductive traces on the substrate 697 that can add inductance and/or capacitance to respective termination circuits. The different conductive traces can be configured separately and independent of each other so that each conductive trace can provide desired termination at a selected frequency. The effective inductance and the effective capacitance of the termination circuit can be configured in combination with each other so as to increase linearity and/or PAE of the power amplifier module 696.

FIG. 63B illustrates an example substrate 697 in accordance with a particular embodiment hereof. The substrate 697 can be a packaging substrate, such as a laminate substrate. The substrate 697 can be included in any of the modules discussed herein, such as the power amplifier modules 696. The substrate 697 is configured to receive a plurality of components and includes conductive traces. The dashed lines in FIG. 63B illustrate areas where the substrate 697 is configured to receive components. For instance, as illustrated the substrate 697 is configured to receive a power amplifier module 698 and a plurality of surface mounted capacitors 726, 727, and 728. The illustrated substrate 697 also includes a first conductive trace 723 and a second conductive trace 724. As illustrated in FIG. 63B, a separation 720 separates the first conductive trace 723 from the second conductive trace 724. The separation 720 can physically separate the first conductive trace 723 from the second conductive trace 724 at any suitable point for a desired application. Thus, the first conductive trace 723 and the second conductive trace 724 are part of different signal paths on the substrate 697.

The substrate 697 can be configured to implement at least a portion of the termination circuits discussed herein. For instance, the first conductive trace 723 can be included in a load line configured to match an impedance at output node of the power amplifier die 698 at a fundamental frequency of the power amplifier output signal. As illustrated, the substrate 697 is also configured to receive a surface mounted capacitor 726 that is part of the load line. The second conductive trace 724 can be included in a harmonic termination circuit separate from the load line. The harmonic termination circuit can be configured to terminate at a phase corresponding to a harmonic frequency of the power amplifier output. As illustrated, the second conductive trace 724 is configured to receive one or more surface mounted capacitors 727 and 728 that are part of the harmonic termination circuit.

FIGS. 64A, 64B, and 64C show simulation results comparing performance of the power amplifier module 696 of FIG. 63A to a conventional power amplifier with a single termination circuit. As shown in FIG. 64A, the PAE is increased by about 2-3% in one embodiment of the power amplifier module 696 of FIG. 63A over the frequency range of 1850 MHz to 1910 MHz compared to a conventional design. Moreover, in some simulations, PAE has increased 5% or more according to the principles and advantages described herein. Increases in PAE of a system can, for example, increase an amount of time for a battery powering the system to discharge.

FIG. 64B shows an improvement in linearity, as measured by an adjacent channel power ratio (ACPR), in one embodiment of the power amplifier module 696 of FIG. 63A compared to a conventional design. As illustrated in FIG. 64B, ACPR improves by about 2 to 3 dB over the frequency range of 1850 MHz to 1910 MHz. Together FIG. 64A and FIG. 64B show that the power amplifier system of FIG. 63A can improve both PAE and ACPR at the same time.

Figure of merit (FOM) is one way to characterize overall quality of a power amplifier. FIG. 64C shows that the FOM increases from about 86 to about 90 in one embodiment of the power amplifier module 696 of FIG. 63A over the frequency range of 1850 MHz to 1910 MHz compared to a conventional design. Moreover, in some implementations, FOM has increased from about 82 to about 90 in accordance with one or more of the principles and advantages described herein.

Furthermore, the increase in PAE, ACPR, FOM, or any combination thereof, has been demonstrated at a number of other frequency bands, for example, 1710 MHz to 1780 MHz. Simulation data indicates that separate termination circuits for a fundamental frequency component of a signal and harmonic frequency component can increase PAE, ACPR, FOM, or any combination thereof over a variety of frequencies in the RF spectrum and other frequency spectra. In addition, improvement in PAE, ACPR, FOM, or any combination thereof has been shown over different power levels.

Referring to FIG. 65 a block diagram illustrating a die and example termination circuits according to another embodiment will be described. FIG. 65 illustrates that any suitable number of separate termination circuits can be implemented based on a desired application. Moreover, FIG. 65 illustrates that a plurality of separate termination circuits can be implemented at a variety of nodes within an electronic system, such as an input pin(s) of a die and/or output pin(s) of a die. Although FIG. 65 illustrates a plurality of separate termination circuits at input pins of a die and output pins of a die, any combination of features of separate termination circuits described herein can be applied to a signal at other nodes of an electronic system, for example, within a die such as a power amplifier die. Moreover, according to certain implementations, at least a portion of one or more of the separate termination circuits coupled to a node can be embodied within a die. In some of these implementations, one or more of the separate termination circuits coupled to the node can be embodied outside the die.

As shown in FIG. 65, an electronic system 732 can include a die 733 and a plurality of termination circuits 743 and 747. The electronic system 732 can be included, for example, in a wireless device of FIG. 61A or FIG. 61B, a power amplifier module of FIG. 61C, the like, or any combination thereof. In some implementations, a die 733 can be a power amplifier die 698. In other implementations, the die 733 can include, for example, a frequency multiplier, a mixer, or the like.

The die 733 can include a plurality of input pins 734*a* to 734*n* and/or output pins 738*a* to 738*n*. Separate termination circuits that include any combination of features described herein can be coupled to different pins and/or a different group of two or more pins. For instance, input termination circuits 743*a* to 743*n* can each be configured to prevent reflection of a different frequency component of a signal at a node coupled to one or more input pins of the die 733. Input termination circuits can be coupled to input pins 734*a* to 734*n*, respectively, of the die 733 as shown. In some implementations, an input termination circuit can be coupled to two or more input pins 734 of the die 733. Alternatively or additionally, two or more input termination circuits can be coupled to a single pin of the die 733. Similarly, output termination circuits 747*a* to 747*n* can each be configured to prevent reflection of a different frequency component of a signal at a node that includes one or more output pin. Output termination circuits can be coupled to output pins 738*a* to 738*n*, respectively, of the die 733. In some implementations, an output termination circuit can be coupled to two or more output pins 738 of the die 733. Alternatively or additionally, two or more output termination circuits can be coupled to a single pin of the die 733.

Any suitable number of input pins 734*a* to 734*n* and/or output pins 738*a* to 738*n* can be included on the die 733. Moreover, any suitable number of input termination circuits 743*a* to 743*n* and/or output termination circuits 747*a* to 747*n* can be included in the electronic system 732. In some implementations, the number of separate input termination circuits 743*a* to 743*n* and/or separate output termination circuits 747*a* to 747*n* can be selected based on a desired number of harmonic frequency components to terminate.

FIG. 66 is a flow diagram of an illustrative method 752 of manufacturing a module according to yet another embodiment. It will be understood that any of the methods discussed herein may include greater or fewer operations and the operations may be performed in any order, as appropriate. Further, one or more acts of the methods can be performed either serially or in parallel. For instance, the acts at blocks 754 and 756 of the method 752 can be performed either serially or in parallel. The method 752 can be performed as part of manufacturing any of the modules discussed herein, such as the power amplifier module 696.

At block or step 753, a die can be attached to a substrate. For instance, a power amplifier die 698 can be attached to a packaging substrate 697.

A first interconnect between the die and a first conductive trace on the substrate can be formed at block or step 754. The first interconnect can be coupled to one or more output pins of the die. The first interconnect can include, for example, one or more wirebonds and/or one or more bumps. In certain implementations, the first interconnect can include a wirebond that is bonded to a pad of the die. According to some of these implementations, the wirebond can also be bonded to a finish plating of the substrate. The first interconnect can be included in a first termination circuit configured to match an impedance of a fundamental frequency of an output signal of the die.

A second interconnect between the die and a second conductive trace on the substrate can be formed at block 756. The second interconnect can be coupled to one or more output pins of the die. The second interconnect can include, for example, one or more wirebonds and/or one or more bumps. In certain implementations, the second interconnect can include a wirebond that is bonded to a pad of the die. According to some of these implementations, the wirebond can also be bonded to a finish plating of the substrate. The second interconnect can be included in a second termination circuit configured to terminate at a phase corresponding to a harmonic of the amplified output signal.

D. Applications

Some of the embodiments described above in this section have provided examples in connection with wireless devices that include power amplifiers. However, the principles and advantages of the embodiments can be used for any other systems or apparatus that have needs for two or more separate termination circuits configured to prevent reflection of two or more different frequency components of a signal. For example, separate termination circuits can be implemented in connection with multipliers, such as frequency multipliers, and/or mixers instead of power amplifiers. As another example, separate termination circuits can be implemented at any point on a signal path at which it is desirable to separate termination circuits for two or more different frequency components, such as a fundamental frequency component and a harmonic frequency component.

Systems implementing one or more aspects of the present disclosure can be implemented in various electronic devices. Examples of electronic devices can include, but are not limited to, consumer electronic products, parts of the consumer electronic products, electronic test equipment, any such similar products and equipment. More specifically, electronic devices configured to implement one or more aspects of the present disclosure can include, but are not limited to, an RF transmitting device, any portable device having a power amplifier, a mobile phone (for example, a smart phone), a telephone, a base station, a femtocell, a radar, a device configured to communication according to the WiFi standard, a television, a computer monitor, a computer, a hand-held computer, a tablet computer, a laptop computer, a personal digital assistant (PDA), a microwave, a refrigerator, an automobile, a stereo system, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, and a clock to name some specific such thereof. Part of the consumer electronic products can include a multi-chip module, a power amplifier module, an integrated circuit including two or more termination circuits, a packaging substrate including one or more circuit elements, and the like. Moreover, other examples of the electronic devices can also include, but are not limited to, memory chips, memory modules, circuits of optical networks or other communication networks, and disk driver circuits. Further, the electronic devices can include unfinished products.

X. Transmission Line for High Performance Radio Frequency Applications

This section of the present disclosure relates to a transmission line for high performance radio frequency (RF) applications. One such transmission line can include a bonding layer configured to receive an RF signal, a barrier layer, a diffusion barrier layer, and a conductive layer proximate to the diffusion barrier layer. The diffusion barrier layer can have a thickness that allows a received RF signal to penetrate the diffusion barrier layer to the conductive layer. In certain implementations hereof, the diffusion barrier layer can be nickel. In some of these implementations, the transmission line can include a gold bonding layer, a palladium barrier layer, and a nickel diffusion barrier layer. As indicated above, these aspects of the present invention may be combined with other aspects hereof to further improve the performance of power amplifier modules and the devices in which they are employed.

As generally described, aspects of the present disclosure relate to a radio frequency (RF) transmission line that includes a diffusion barrier layer. The diffusion barrier layer can include a material and have a thickness such that contaminants are prevented from diffusing and passing through the diffusion barrier layer. The thickness of the diffusion barrier layer can be sufficiently small such that an RF signal penetrates the diffusion barrier layer and propagates in a conductive layer. For example, the thickness of the diffusion barrier layer can be less than the skin depth of the material at a frequency in an RF range (for example, at a frequency selected in the range from about 0.45 GHz to 20 GHz). In some implementations, the diffusion barrier layer can be nickel. According to some of these implementations, the nickel diffusion barrier layer can have a thickness selected from a range of about 0.04 um to 0.5 um. The RF transmission line can also include a bonding layer, a barrier layer for preventing a contaminant from entering the bonding layer, and the conductive layer in which the RF signal propagates.

Particular implementations of the subject matter described in this section of the present disclosure can be implemented to realize one or more of the following potential advantages, among others. Using one or more features of the systems, apparatus, and methods described herein, electronic systems, such as systems that include a power amplifier and/or systems configured to transmit and/or receive radio frequency (RF) signals, can operate more efficiently and/or consume less power. Alternatively or additionally, the signal quality of RF signals in such systems can be improved. In some implementations, an amount of gold used to implement a transmission line can be decreased without significantly degrading electrical performance. In fact, according to certain implementations, simulation data and experimental data indicate that the amount of gold used on the transmission line can be decreased and electrical performance can be improved.

A transmission line can be embodied on a packaging substrate or printed circuit board (PCB), which can include a multi-layer laminate. Multi-layer laminate PCBs or package substrates are extensively used in the RF industry. Most RF blocks, such as low noise amplifiers (LNAs), mixers, voltage controlled oscillators (VCOs), filters, switches and whole transceivers may be implemented using semiconductor technologies.

However, in RF modules (for example, an RF front-end module including power amplifiers, switches, filters, the like, or any combination thereof), single chip integration may not be practical due to different blocks being implemented in different semiconductor technologies. For instance, a power amplifier may be formed by a GaAs process, while related control and/or bias circuitry may be formed by a CMOS process. Electromagnetic interaction can degrade electrical performance of blocks, which can cause a system to fail electrical performance specifications. One reason for implementing an RF module in more than one chip is that on-chip passives, such as long transmission lines, inductors, baluns, transformers, the like, or any combination thereof, can have low Q-factor and/or may consume large chip area. Therefore, multi-chip module (MCM) and/or system in package (SiP) assembly technology can be used to achieve low cost, small size and/or high performance in RF module applications.

For cost effectiveness and/or conductor performance considerations, laminate technology can be used for MCM assembly. The laminate technology can include copper for use in a transmission line. Using copper for propagating electrical signals can be desirable due to the physical properties of copper. High Q transmission lines, inductors, transformers, the like, or any combination thereof can be implemented on a laminate substrate. For example, power amplifier modules, output matching networks, harmonic filters, couplers, the like, or any combination thereof can be coupled to a laminate substrate. Conductor loss can have a significant impact on the performance of any of these elements. Accordingly, laminate plating technology can impact RF loss significantly.

Copper traces on outer layers of a laminate can be covered with a solder mask, oxide or other suitable materials in areas where interconnects to external components are not desired. These interconnects can include solder joints for components and/or wire bond connections to die. In areas where solderability and/or wire bondability are preserved, the copper trace can be covered with an organic solderability preservative (OSP) or finish plating. The metallurgy and/or metal layer thicknesses of the finish plating can depend on the function of the exposed area, such as a soldering surface and/or a wire bonding surface. An inert, oxide free surface can maintain solderability and/or wire bondability.

Such metallurgies for finish plating typically include a diffusion barrier to prevent copper diffusion to the plated surface and subsequent oxidation due to exposure to air and/or elevated temperatures during assembly. The diffusion barrier can be, for example, electroplated nickel (Ni) or electroless Ni(P), depending on the chemistry being used. Conventionally, nickel having a thickness of about 2.5 um to about 8 um has been established as a sufficiently thick diffusion barrier layer for the laminate substrate to maintain solderability during thermal excursions encountered during MCM and/or SiP assembly. For gold (Au) wire bonding, electrolytic or electroless Au can be used to form a gold bonding layer with a thickness selected in a range from about 0.4 um to 0.9 um. However, thinner immersion Au layers over Ni have not generally provided reliable Au wire bonding surfaces in high volume assembly operations. Electroless Ni/electroless palladium (Pd)/immersion Au has become available for soldering and wire bonding, including Au wire bonding. This can be a cost effective finish due to a reduction in Au thickness. Electroless Ni/electroless Pd/immersion Au can increase conductor loss in the exposed (finish plated) areas, especially at higher frequencies.

Electrolytic or electroless NiAu or NiPdAu plating technologies are currently used with laminate substrates. Electroless NiPdAu has been successfully implemented despite more lossy electrical characteristics. Some RF modules still use electrolytic or electroless NiAu, which has lower loss, especially at higher frequencies (for example, at frequencies of about 1.9 GHz or greater) for module performance despite the higher costs due to thicker gold.

A. Transmission Line

Now with reference to FIG. 67A, there is illustrated a cross section of a transmission line 757 according to some embodiments hereof. The cross section shown in FIG. 67A can represent the cross section of some or all of the transmission line 757. The transmission line 757 can include a bonding layer 758, a barrier layer 759, a diffusion barrier layer 761, and a conductive layer 762. The transmission line 757 can be implemented in an RF circuit and configured for transmitting RF signals. The transmission line 757 can be embodied on a laminate substrate. According to some implementations, the bonding layer 758, the barrier layer 759, and the diffusion barrier layer 761 can be considered finish plating and the conductive layer 762 can be considered a wire. In some implementations, the transmission line 757 can be at least about 5 um, 10 um, 15 um, 20 um, 25 um, 50 um, 75 um, 100 um, 250 um or 500 um long.

In certain implementations, the transmission line 757 can include a gold bonding layer, a palladium barrier layer, a nickel diffusion barrier layer, and a copper conductive layer. For example, in some of these implementations, the transmission line 757 can include a gold bonding layer having a thickness of about 0.1 um, a palladium barrier layer having a thickness of about 0.1 um, a nickel diffusion barrier layer having a thickness selected from a range from about 0.04 um to 0.5 um, and a copper conductive layer having a thickness of about 20 um. The finish plating of the transmission line 757 can be formed by electrolessly plating nickel over the copper conductive layer, electrolessly plating palladium over the nickel, and immersion plating of gold over the palladium. Other suitable processes and/or sub processes of forming the finish plating of such a transmission line can alternatively be implemented. For instance, a nickel diffusion barrier layer can be electroplated over a copper conductive layer.

Although the transmission line 757 includes a gold bonding layer, a palladium barrier layer, a nickel diffusion barrier layer, and a copper conductive layer in certain implementations, it should be understood that other materials can alternatively be used to implement one or more layers of the transmission line 757.

The bonding layer 758 of the transmission line 757 can have a bonding surface configured for soldering and/or wire bonding. The bonding layer 758 can be configured to receive an RF signal at the bonding surface. According to some implementations, a pin of a die can be bonded to the bonding surface of the bonding layer 758. For instance, an output of a power amplifier die can be bonded to the bonding surface of the bonding layer 758 and transmitted to one or more RF components, such as a filter and/or an RF switch, via the transmission line 757. The bonding layer 758 can include gold. In some implementations a thickness of a gold bonding layer can be selected from a range from about 0.05 um to 0.15 um. According to certain implementations, the thickness of a gold bonding layer can be about 0.1 um.

The barrier layer 759 of the transmission line 757 can prevent a contaminant from entering the bonding layer 758. The barrier layer 759 can be proximate the bonding layer 758. In the orientation of FIG. 67A, the bonding layer 758 is disposed over the barrier layer 759. In some implementations, a major surface of the barrier layer 759 can directly contact a major surface of the bonding layer 758, for example, as shown in FIG. 67A. As illustrated in FIG. 67A, the barrier layer 759 can be between the bonding layer 758 and the diffusion barrier layer 761. The barrier layer 759 can include palladium. In some implementations a thickness of a palladium barrier layer can be selected from a range from about 0.03 um to 0.15 um. According to certain implementations, the thickness of a palladium barrier layer can be about 0.1 um.

The diffusion barrier layer 761 of the transmission line 757 can be configured to prevent a contaminant from entering the bonding layer 758 and/or the barrier layer 759. For instance, in some implementations, the diffusion barrier layer 761 can prevent copper from a copper conductive layer from diffusing to a gold bonding layer. The diffusion barrier layer 761 can provide an adhesion surface for the conductive layer 762. According to certain implementations, the adhesion surface of the diffusion barrier layer 761 can adhere to a copper conductive layer.

The diffusion barrier layer 761 can have a thickness sufficiently small such that an RF signal is allowed to propagate in the conductive layer 762. For instance, the thickness of the diffusion barrier layer 761 can be less than the skin depth of the diffusion barrier layer 761 at a frequency in the RF range (for example, at a frequency selected in the range from about 0.9 GHz to 20 GHz). This can allow an RF signal to penetrate the diffusion barrier layer 761. With a diffusion barrier layer 761 of a material and having a thickness that is less than the skin depth of the material at a desired frequency in the RF range, substantially all of the RF signal should travel in the conductive layer 762 of the transmission line 757, assuming that the RF signal also penetrates the bonding layer 758 and the barrier layer 759. For the RF signal to penetrate the bonding layer 758, the thickness of the bonding layer 758 can be less than the skin depth of material forming the bonding layer 758 at the desired frequency in the RF range. Similarly, for the RF signal to penetrate the barrier layer 759, the thickness of the barrier layer 759 can be less than the skin depth of material forming the barrier layer 759 at the desired frequency in the RF range.

The diffusion barrier layer 761 can be between the bonding layer 758 and the conductive layer 762. In the orientation of FIG. 67A, the barrier layer 759 is disposed over the diffusion barrier layer 761 and the diffusion barrier layer 761 is disposed over the conductive layer 762. In some implementations, a major surface of the diffusion barrier layer 761 can directly contact a major surface of the barrier layer 759 and/or the conductive layer 762, for example, as shown in FIG. 67A.

The diffusion barrier layer 761 can include nickel. In some implementations, the diffusion barrier layer 761 can be nickel. The nickel diffusion barrier layer can also prevent copper from the conductive layer from diffusing to a gold bonding layer. A thickness of the nickel barrier layer can be less than the skin depth of nickel at a frequency in the RF range. For instance, the thickness of nickel can be less than the skin depth of nickel at a frequency selected from a range of about 0.45 GHz to 20 GHz. This can allow an RF signal to penetrate through the diffusion barrier layer 761 to the conductive layer 762. According to some implementations, the thickness of a nickel diffusion layer can be less than the skin depth of nickel at about 0.3 GHz, 0.35 GHz, 0.4 GHz, 0.45 GHz, 0.5 GHz, 0.6 GHz, 0.7 GHz, 0.8 GHz, 0.9 GHz, 1 GHz, 2 GHz, 5 GHz, 6 GHz, 10 GHz, 12 GHz, 15 GHz, or 20 GHz. When an alternative material is used in place of nickel for the diffusion barrier layer, the thickness of such a diffusion barrier layer can be less than the skin depth of the alternative material at about 0.3 GHz, 0.35 GHz, 0.4 GHz, 0.45 GHz, 0.5 GHz, 0.6 GHz, 0.7 GHz, 0.8 GHz, 0.9 GHz, 1 GHz, 2 GHz, 5 GHz, 6 GHz, 10 GHz, 12 GHz, 15 GHz, or 20 GHz.

In some implementations, the thickness of a nickel diffusion barrier layer can be less than about 2 um, 1.75 um, 1.5 um, 1.25 um, 1 um, 0.95 um, 0.9 um, 0.85 um, 0.8 um, 0.75 um, 0.7 um, 0.65 um, 0.6 um, 0.55 um, 0.5 um, 0.45 um, 0.4 um, 0.35 um, 0.3 um, 0.25 um, 0.2 um, 0.15 um, 0.1 um, 0.09 um, 0.05 um, or 0.04 um. In certain implementations, the thickness of a nickel diffusion barrier layer can be selected from one of the following ranges: about 0.04 um to 0.7 um, about 0.05 um to 0.7 um, about 0.1 um to 0.7 um, about 0.2 um to 0.7 um, about 0.04 um to 0.5 um, about 0.05 um to 0.5 um, about 0.09 um to 0.5 um, about 0.04 um to 0.16 um, about 0.05 um to 0.15 um, about 0.1 um to 0.75 um, about 0.2 um to 0.5 um, about 0.14 um to 0.23 um, about 0.09 um to 0.21 um, about 0.04 um to 0.2 um, about 0.05 um to 0.5 um, about 0.15 um to 0.5 um; or about 0.1 um to 0.2 um. As one example, the thickness of a nickel diffusion barrier layer can be about 0.1 um. In all of these illustrative implementations, the nickel diffusion barrier layer has a non-zero thickness.

An RF signal can propagate in the conductive layer 762 of the transmission line 757. For instance, the RF signal can penetrate the bonding layer 758, the barrier layer 759, and the diffusion barrier layer 761 to propagate in the conductive layer 762. Substantially all of the RF signal can propagate in the conductive layer 762 of the transmission line 757. The conductive layer 762 can be adhered to the adhesion surface of the diffusion barrier layer 761. The conductive layer 762 can include any suitable material for propagating an RF signal along the transmission line 757. For example, the conductive layer can include copper, aluminum, silver, the like, or any combination thereof. In certain implementations, the conductive layer 762 can be copper. According to certain implementations, the thickness of the conductive layer 762 can be selected from a range from about 10 um to 50 um. In some of these implementations, the thickness of the conductive layer can be selected from a range from about 15 um to 30 um.

FIG. 67B schematically illustrates example transmission lines of FIG. 67A. A transmission line 757 can include more than one transmission lines 757 to transmit an RF signal from one node to another node, according to certain implementations. For example, the transmission lines 757 illustrated in FIG. 67B can together implement the transmission line 757 of FIG. 69. The transmission lines 757 in FIG. 67B serve as a medium to transmit an RF signal from a first node $RF_{IN}$ to a second node $RF_{OUT}$. One or more transmission lines 757 can have one end coupled to a power rail, such as power (for example, Vcc) or ground. As illustrated, a respective transmission line 757 can be coupled to ground via a capacitor $C_1$, $C_2$, or $C_3$.

B. Skin Depth Calculations

As mentioned earlier, the diffusion barrier layer 761 of the transmission line 757 can include a material and have a thickness that is sufficiently small such that an RF signal is allowed to propagate in a conductive layer. Accordingly, the diffusion barrier layer 761 can have a thickness that is less than a skin depth of the material at a desired frequency. Skin depth can be represented by Equation 5.

$$\delta = \sqrt{\frac{2\rho}{(2\pi f)(\mu_0 \mu_r)}} \quad (5)$$

In Equation 5, $\delta$ can represent skin depth in meters, $\mu_o$ can represent the permeability of free space (also referred to as vacuum permeability or magnetic constant) having a value of $4\pi \times 10^{-7}$ Henries/meter (about $1.2566370614 \times 10^{-6}$ Henries/meter), $\mu_r$ can represent a relative permeability of the medium, p can represent the resistivity of the medium in $\Omega \cdot m$ (which can equal to the reciprocal conductivity of the medium), and f can represent frequency of a current propagating through the medium in Hz.

Table 2 below includes plating thicknesses of various layers of three transmission lines. The data in Table 2 correspond to a transmission line with NiAu finish plating and two different transmission lines with NiPdAu finish plating having different nickel layer thicknesses. One of the transmission lines with NiPdAu finish plating has a nickel thickness of 5 um and the other transmission line with NiPdAu finish plating has a nickel thickness of 0.1 um. A nickel thickness of 5 um is within a range of acceptable nickel thicknesses (for example, from 2.5 um to 8 um) that have conventionally been used. In all three of the transmission lines corresponding to the data in Table 2, the conductive layer is copper. The transmission lines with NiPdAu finish plating can have a cross section as shown in FIG. 67A. The transmission line with NiAu finish plating can have a cross section similar to FIG. 67A without the barrier layer 759, in which a gold layer bonding layer is directly over a nickel diffusion barrier layer and the nickel layer is directly over a copper conductive layer.

TABLE 2

Plating Thickness

|    | NiPdAu (um) | Thin "Ni"— NiPdAu (um) | NiAu (um) |
|----|-------------|------------------------|-----------|
| Cu | 21          | 21                     | 21        |
| Ni | 5           | 0.1                    | 5         |
| Pd | 0.09        | 0.09                   | —         |
| Au | 0.1         | 0.1                    | 0.4       |

Skin depths of these three transmission lines can be computed using Equation 5 and the material properties included in Table 3 below. The relative permeability of nickel can vary depending on a process used to form the nickel layer. For example, phosphorus content in an electroless nickel process can impact the relative permeability of nickel. The range of nickel permeability listed in Table 3 can capture typical ranges of nickel permeabilities.

TABLE 3

Material Properties

|    | Resistivity, $\rho$ ($\mu\Omega$-cm) | $\mu_r$   |
|----|--------------------------------------|-----------|
| Cu | 1.673                                | 1         |
| Ni | 8.707                                | 100-600   |
| Pd | 10.62                                | 1         |
| Au | 2.44                                 | 1         |

The computed skin depths for copper, nickel, palladium, and gold at six different frequencies in the RF range are shown in Table 4 below.

TABLE 4

Computed Skin Depths

|    | Skin Depth (um) at 0.45 GHz | Skin Depth (um) at 0.9 GHz | Skin Depth (um) at 1.9 GHz | Skin Depth (um) at 5 GHz | Skin Depth (um) at 12 GHz | Skin Depth (um) at 20 GHz |
|----|-----------------------------|----------------------------|----------------------------|--------------------------|---------------------------|---------------------------|
| Cu | 3.07                        | 2.17                       | 1.49                       | 0.92                     | 0.59                      | 0.46                      |
| Ni | 0.29-0.7                    | 0.2-0.5                    | 0.14-0.34                  | 0.09-0.2                 | 0.06-0.14                 | 0.04-0.11                 |
| Pd | 7.73                        | 5.47                       | 3.76                       | 2.32                     | 1.50                      | 1.16                      |
| Au | 3.70                        | 2.62                       | 1.8                        | 1.11                     | 0.72                      | 0.56                      |

The data shown in Table 4 indicate that a majority of a signal having a frequency of 0.45 GHz, 0.9 GHz, 1.9 GHz, 5 GHz, 12 GHz, or 20 GHz should travel in nickel in the transmission line with NiAu finish plating. Because the thickness of gold (i.e., 0.4 um) is less than the skin depth for gold (i.e., 3.70 um at 0.45 GHz, 2.62 um at 0.9 GHz, 1.8 um at 1.9 GHz, 1.11 um at 5 GHz, 0.72 um at 12 GHz, and 0.56 um at 20 GHz) and the thickness of nickel (i.e., 5 um) is greater than the skin depth of nickel (i.e., 0.29-0.7 um at 0.45 GHz, 0.2-0.5 um at 0.9 GHz, 0.14-0.34 um at 1.9 GHz, 0.09-0.21 um at 5 GHz, 0.06-0.14 um at 12 GHz, and 0.04-0.11 um at 20 GHz), the signal at 0.45 GHz 0.9 GHz, 1.9 GHz, 5 GHz, 12 GHz, and 20 GHz should travel in both the gold and nickel layers. Since the thickness of nickel is greater than the skin depth in the frequency range from about 0.45 GHz to 20 GHz, signals in this frequency range should not penetrate the nickel layer. Because the skin depth should be less at higher frequencies, signals at frequencies of greater than 20 GHz should also not penetrate the nickel layer. Since the gold is thicker in the transmission line with NiAu finish plating (i.e., 0.4 um) compared to the transmission line with NiPdAu finish plating having a nickel thickness of 5 um (i.e., 0.1 um) relatively more signal conducts in the gold versus nickel in the NiAu transmission line compared to the NiPdAu transmission line with 5 um nickel, making the NiAu transmission line comparatively less lossy.

The data shown in Table 4 also indicate that a majority of a signal having a frequency of 0.45 GHz, 0.9 GHz, 1.9 GHz, 5 GHz, 12 GHz, or 20 GHz should travel in nickel in the transmission line with NiPdAu finish plating with a nickel thickness of 5 um. Because the thickness of gold (i.e., 0.1 um) and the thickness of palladium (0.09 um) are both less than their respective skin depths (i.e., 3.70 um at 0.45 GHz, 2.62 um at 0.9 GHz, 1.8 um at 1.9 GHz, 1.11 um at 5 GHz, 0.72 um at 12 GHz, and 0.56 um at 20 GHz for gold; 7.73 um at 0.45 GHz, 5.47 um at 0.9 GHz, 3.76 um at 1.9 GHz, 2.32 um at 5 GHz, 1.50 um at 12 GHz, and 1.16 um at 20 GHz for palladium) and the thickness of nickel (i.e., 5 um) is greater than the skin depth of nickel (i.e., 0.29-0.7 um at 0.45 GHz, 0.2-0.5 um at 0.9 GHz, 0.14-0.34 um at 1.9 GHz, 0.09-0.21 um at 5 GHz, 0.06-0.14 um at 12 GHz, and 0.04-0.11 um at 20 GHz), the majority of the signal at 0.45 GHz, 0.9 GHz, 1.9 GHz, 5 GHz, 12 GHz, or 20 GHz should travel in nickel. Since the thickness of nickel is greater than the skin depth in at the frequency range from about 0.45 GHz to 20 GHz, signals in this frequency range should not penetrate the nickel layer. Since the skin depth should be less at higher frequencies, signals at frequencies of greater than 20 GHz should also not penetrate the nickel layer. Thus, a majority of an RF signal electrically coupled to the NiPdAu transmission line with a nickel thickness of 5 um via a bonding surface of gold should propagate in nickel.

In contrast, the data shown in Table 4 indicate that a majority of a signal having a frequency of 0.45 GHz, 0.9 GHz, 1.9 GHz, 5 GHz, 12 GHz, or 20 GHz should travel in copper in the transmission line with NiPdAu finish plating having a nickel thickness of 0.1 um. Because the thicknesses of gold, palladium, and nickel are each less than their respective skin depths, the majority of the signal at 0.45 GHz, 0.9 GHz, 1.9 GHz, 5 GHz, 12 GHz, or 20 GHz should penetrate to copper. Since the skin depth is less at higher frequencies, signals at frequencies of greater than 20 GHz should also penetrate to copper. Thus, a majority of an RF signal electrically coupled to the NiPdAu transmission line with a 0.1 um nickel thickness via a bonding surface of gold should propagate in copper.

As shown in Table 3, copper has a resistivity that is about one fifth of the resistivity of nickel. Accordingly, the transmission line with NiPdAu finish plating having a nickel thickness of 0.1 um should have the least resistive loss of the three transmission lines corresponding to the data in Tables 1 and 3 when transmitting signals at a frequency of 0.45 GHz or greater. The data in Table 4 also indicate that a signal with a frequency of 20 GHz can penetrate nickel having a thickness of less than 0.11 um, a signal with a frequency of 12 GHz can penetrate nickel having a thickness of less than 0.14 um, a signal with a frequency of 5 GHz can penetrate nickel having a thickness of less than 0.2 um, a signal with a frequency of 1.9 GHz can penetrate nickel having a thickness of less than 0.34 um, a signal with a frequency of 0.9 GHz can penetrate nickel having a thickness of less than 0.5 um, and a signal with a frequency of 0.45 GHz can penetrate nickel having a thickness of less than 0.7 um. Thus, these signals should propagate in copper in the transmission line with NiPdAu finish plating having a nickel thickness of 0.1 um, provided that the gold and palladium thicknesses are less than the skin depths at the respective frequencies of the signals. Based on Equation 5 and the data in Tables 2 and 3, a signal having a frequency of up to about 22 GHz should be able to penetrate to nickel having a thickness of about 0.1 um.

C. Wire Bonding

The transmission line 757 can be electrically coupled to a pin of a die via a wire bond in some implementations. A conductor, such as a wire, can provide an RF signal to the transmission line 757. FIG. 68A illustrates an example of a wire bonded to the transmission line 757 of FIG. 67A. As illustrated in FIG. 68A, the transmission line 757 can be included on a substrate 772. A die 774 can also be coupled to the substrate 772. A wire 763 can electrically connect a bonding surface of the bonding layer 758 of the transmission line 757 to the die 774. In this way, the transmission line 757 can receive an RF signal at the bonding surface of the bonding layer 758. The wire 763 can include a ball bond 764, a neck 766, a span 767, a heel 768, a stitch bond 769 (or alternatively a wedge bond), or any combination thereof.

Some wire bond specifications specify that the wire 763 should have a minimum pull strength without experiencing a particular failure or failures. For instance, in some applications, a wire bond specification specifies that the wire should have a pull strength of at least 3 g after thermal exposure (for example, reflow or bake @ 175° C. for 12 hours) and no stitch lift failure modes.

Experimental data were collected for 20 um thick Au and 20 um thick Cu wires. The Au wires were tested in three different transmission lines which included a transmission line with NiAu finish plating and two different transmission lines with NiPdAu finish plating having different nickel layer thicknesses (5 um and 0.1 um). The Cu wires were also tested in three different transmission lines including a transmission line with NiAu finish plating and two different transmission lines with NiPdAu finish plating having different nickel layer thicknesses (5 um and 0.1 um). The finish platings correspond to the values shown in Table 2 for NiAu and NiPdAu. Sample conditions of the experiments included standard assembly process before wire bond (surface mount attach and plasma) and extreme thermal exposure to test for Cu diffusion through the Ni diffusion barrier layer affecting wire bondability (surface mount attach and bake and plasma). The experimental data for the standard assembly process indicate that all of Au wires should exceed a 3-4 g pull strength specification after thermal exposure, depending on the wire diameter. The experimental data for the standard assembly process also indicate that most of the Cu wires should exceed the 3-4 g pull strength specification, although process parameters were not optimized. All wire pulls tested under for the extreme thermal exposure met or exceeded the 3 g pull strength specification and no stitch lift failure mode criteria. Accordingly, the experimental data confirms feasibility of wire bondability of NiPdAu finish plating with 0.1 um Ni thickness for MCMs.

D. Substrates and Arrays

FIG. 68B illustrates an example of a substrate 772 that includes the transmission line 757 of FIG. 67A. The substrate 772 can include one or more transmission lines 757. The substrate 772 can include any combination of features of the substrates described herein. For example, the substrate 772 can be a laminate substrate including NiPdAu finish plating.

Multiple substrates 772 can be manufactured with at the same time with the same processing equipment. FIG. 68C illustrates an example of an array 773 that includes multiple substrates 772 of FIG. 68B. In some implementations, the array 773 can be a laminate panel that includes a substrate 772 having a transmission line 757 configured for transmitting a RF signal. Although the array 773 shown in FIG. 68C includes twenty-five substrates 772, the array 773 can include any suitable number of substrates 772 in other implementations. Transmission lines 757 can be formed on multiple substrates 772, for example, in processes that include any combination of features of the finish plating technology described herein. Then individual substrates 772 can be separated from each other after forming the transmission lines 757, for example, by laser dicing, diamond saws, or any other suitable method.

E. Plating Technology

NiPdAu plating technology with 0.1 um nickel thickness can reduce costs. This plating technology can also improve RF performance or have minimal RF performance impact. As indicated by the data and calculations discussed earlier, in NiPdAu plating with 0.1 um nickel thickness, an amount of RF signal traveling in gold, palladium, and nickel layers can be reduced and RF energy can be increased and/or maximized in a conductive layer, such as a copper layer, on laminate while maintaining solderability and/or wirebondability. Other experimental data indicate that no finish plating (with all of the signal travelling in the copper layer) provides the lowest insertion loss.

One example of NiPdAu plating technology is electroless NiPdAu. For electroless NiPdAu, the RF signal may not penetrate through the nickel layer if the nickel layer is thicker than skin depth at a frequency of the signal, for example, as indicated by the calculations and data discussed earlier. If nickel thickness is reduced to less than the skin depth of nickel (for example, to about 0.1 um), an RF signal can penetrate through the nickel, palladium, and gold plating layers. Consequently, a major portion of the RF signal energy should be in the copper layer. Copper has significantly lower RF loss as compared with gold, palladium and nickel. The RF in a transmission line with NiPdAu finish plating with 0.1 um thick nickel can be less than RF loss in a comparable transmission with electrolytic NiAu and/or electroless NiAu finish plating. Therefore, the overall electrical performance can be improved by using NiPdAu finish plating with 0.1 um thick nickel. The output match network loss can be reduced from about 0.8 dB to 0.5 dB at 1.9 GHz in some implementations, which can improve the PA power added efficiency by about 3%. This can translate into significant yield improvement and/or enhancement of competitiveness of products that include NiPdAu finish plating with 0.1 um thick nickel.

Experimental data were gathered with two different impedances (6 ohms and 4 ohms) in an output matching network for RF loss characterization. For the 6 ohm output matching network, the experimental data indicate that loss improved by about 0.2 dB. For the 4 ohm output matching network, the experimental data indicate that loss improved by about 0.3 dB. The transmission line that includes electroless NiPdAu finish plating with 0.1 um thick Ni had lower loss than comparable transmission lines with the standard electroless NiPdAu with 5 um thick Ni or electroless NiAu transmission lines.

F. Modules

FIG. 69 is a schematic block diagram of a module 770 that can include the transmission line 757 of FIG. 67A. The module 770 can be referred to as multi-chip module and/or a power amplifier module in some implementations. The module 770 can include a substrate 772 (for example, a packaging substrate), a die 774 (for example, a power amplifier die), a matching network 775, the like, or any combination thereof. Although not illustrated, the module 770 can include one or more other dies and/or one or more circuit elements that coupled to the substrate 772 in some implementations. The one or more other die can include, for example, a controller die, which can include a power amplifier bias circuit and/or a direct current-to-direct current (DC-DC) converter. Example circuit element(s) mounted on the packaging substrate can include, for example, inductor(s), capacitor(s), impedance matching network(s), the like, or any combination thereof.

The module 770 can include a plurality of die and/or other components mounted on and/or coupled to the substrate 772 of the module 770. In some implementations, the substrate 772 can be a multi-layer substrate configured to support the die and/or components and to provide electrical connectivity to external circuitry when the module 770 is mounted on a circuit board, such as a phone board. The substrate 772 can include a laminate with finish plating, for example, including any combination of features of laminates and/or finish platings described herein. The substrate 772 can provide electrical connectivity between components via a transmission line 757 including any combination of features of the transmission lines described herein. For example, as illustrated, the transmission line 757 can electrically connect the power amplifier die 774 to the output matching network 775.

The power amplifier die 774 can receive a RF signal at an input pin RF_IN of the module 770. The power amplifier die 774 can include one or more power amplifiers, including, for example, multi-stage power amplifiers configured to amplify the RF signal. The power amplifier die 774 can include an input matching network 776, a first stage power amplifier 777 (which can be referred to as a driver amplifier (DA)), an inter-stage matching network 778, a second stage power amplifier 779 (which can be referred to as an output amplifier (OA)), a first stage bias circuit 780 configured to bias the first stage power amplifier 777, a second stage bias circuit 781 configured to bias the second stage power amplifier 779, or any combination thereof. A power amplifier can include the first stage power amplifier 777 and the second stage power amplifier 779. The RF input signal can be provided to the first stage power amplifier 777 via the input matching network 776. The first stage power amplifier 777 can amplify the RF input and provide the amplified RF input to the second stage power amplifier 779 via the inter-stage matching circuit 778. The second stage power amplifier 779 can generate the amplified RF output signal.

The amplified RF output signal can be provided to an output pin RF_OUT of the power amplifier die 774 via the output matching network 775. Any of the transmission lines 757 described herein can be implemented to couple an output of a power amplifier (for example, the amplified RF output signal generated by the second stage power amplifier 779) and/or an output of the power amplifier die 774 to another component. Accordingly, any combination of features of the diffusion barrier layer 761 described herein can also be implemented at an output of a power amplifier and/or an output of the power amplifier die 774. The matching network 775 can be provided on the module 770 to aid in reducing signal reflections and/or other signal distortions.

The power amplifier die 774 can be any suitable die. In some implementations, the power amplifier 774 die is a gallium arsenide (GaAs) die. In some of these implementations, the GaAs die has transistors formed using a heterojunction bipolar transistor (HBT) process.

The module 770 can also include one or more power supply pins, which can be electrically connected to, for example, the power amplifier die 774. The one or more power supply pins can provide supply voltages to the power amplifiers, such as $V_{SUPPLY1}$ and $V_{SUPPLY2}$, which can have different voltage levels in some implementations. The module 770 can include circuit element(s), such as inductor(s), which can be formed, for example, by a trace on the multi-chip module. The inductor(s) can operate as a choke inductor, and can be disposed between the supply voltage and the power amplifier die 774. In some implementations, the inductor(s) are surface mounted. Additionally, the circuit element(s) can include capacitor(s) electrically connected in parallel with the inductor(s) and configured to resonate at a frequency near the frequency of a signal received on the pin RF_IN. In some implementations, the capacitor(s) can include a surface mounted capacitor.

The module 770 can be modified to include more or fewer components, including, for example, additional power amplifier dies, capacitors and/or inductors. For instance, the module 770 can include one or more additional matching networks 775. As another example, the module 770 can include an additional power amplifier die, as well as an additional capacitor and inductor configured to operate as a parallel LC circuit disposed between the additional power amplifier die and the power supply pin of the module 770. The module 770 can be configured to have additional pins, such as in implementations in which a separate power supply is provided to an input stage disposed on the power amplifier die 774 and/or implementations in which the module 770 operates over a plurality of bands.

The module 770 can have a low voltage positive bias supply of about 3.2 V to 4.2 V, good linearity, high efficiency (for example, PAE of approximately 40% at 28.25 dBm), large dynamic range, a small and low profile package (for example, 3 mm×3 mm×0.9 mm with a 10-pad configuration), power down control, support low collector voltage operation, digital enable, not require a reference voltage, CMOS compatible control signals, an integrated directional coupler, or any combination thereof.

In some implementations, the module 770 is a power amplifier module that is a fully matched 10-pad surface mount module developed for Wideband Code Division Multiple Access (WCDMA) applications. This small and efficient module can pack full 1920-1980 MHz bandwidth coverage into a single compact package. Because of high efficiencies attained throughout the entire power range, the module 770 can deliver desirable talk-time advantages for mobile phones. The module 770 can meet the stringent spectral linearity requirements of High Speed Downlink Packet Access (HSDPA), High Speed Uplink Packet Access (HSUPA), and Long Term Evolution (LTE) data transmission with high power added efficiency. A directional coupler can be integrated into the module 770 and can thus eliminate the need for an external coupler.

The die 774 can be a power amplifier die embodied in a single Gallium Arsenide (GaAs) Microwave Monolithic Integrated Circuit (MMIC) that includes all active circuitry of the module 770. The MMIC can include on-board bias circuitry, as well as input matching network 776 and inter-stage matching network 778. An output matching network 775 can have a 50 ohm load that is embodied separate from the die 774 within the package of the module 770 to increase and/or optimize efficiency and power performance.

The module 770 can be manufactured with a GaAs Heterojunction Bipolar Transistor (HBT) BiFET process that provides for all positive voltage DC supply operation while maintaining high efficiency and good linearity. Primary bias to the module 770 can be supplied directly or via an intermediate component from any three-cell Ni—Cd battery, a single-cell Li-Ion battery, or other suitable battery with an output in the range selected from about 3.2 to 4.2 V. No reference voltage is needed in some implementations. Power down can be accomplished by setting an enable voltage to zero volts. No external supply side switch is needed as typical "off" leakage is a few microamperes with full primary voltage supplied from the battery, according to some implementations.

G. Module Data

FIGS. 70A to 70D are graphs illustrating relationships among the transmission line of FIG. 67A and other transmission lines implemented in the module of FIG. 69. A module functionally similar to the module 770 illustrated in and described with reference to FIG. 69 was tested with three transmission lines described with reference to Tables 2-4 above. The NiAu transmission line had a nickel thickness of 5.5 um. The two NiPdAu transmission line finish platings have different nickel thicknesses of 6 um and 0.1 um, respectively. The transmission lines tested include a copper conductive layer with a thickness of about 25 um. Otherwise, the tested transmission lines have the layer thicknesses and other properties described with reference to Tables 2-4 above.

As shown in graphs of FIGS. 70A-70D, the transmission lines with NiPdAu finish plating and a nickel thickness of 0.1 um have the best performance of the three types of transmission lines test, as measured by Figure of merit (FOM). In addition, the data included in Table 5 below indicate that yield is comparable for transmission lines with NiPdAu finish plating with a nickel thickness of 0.1 um and transmission lines with NiPdAu finish plating with a nickel thickness of 6 um.

TABLE 5

Yield with Different Finish Plating

| Finish Plating | Yield |
|---|---|
| NiAu (5.5 um Ni) | 99.36% |
| NiPdAu (6 um Ni) | 96.86% |
| Ni NiPdAu (0.1 um Ni) | 98.90% |

Power amplifiers can be rated based on a number of metrics, such as adjacent channel power ratio (ACPR), power added efficiency (PAE), Figure of merit (FOM), the like, or any combination thereof. ACPR is one metric to assess linearity of a power amplifier. PAE is one metric to assess the power efficiency of a power amplifier. For instance, a lower PAE can reduce the battery life of an electronic device, such as a mobile phone, that includes a power amplifier. FOM is one way to characterize overall quality of a power amplifier.

Figure 70B:
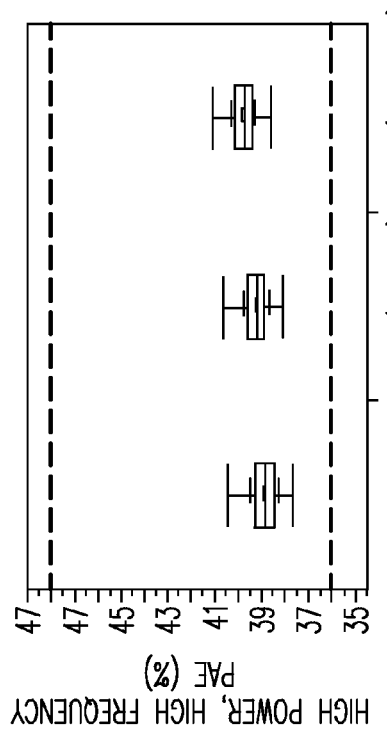
Figure 70D:
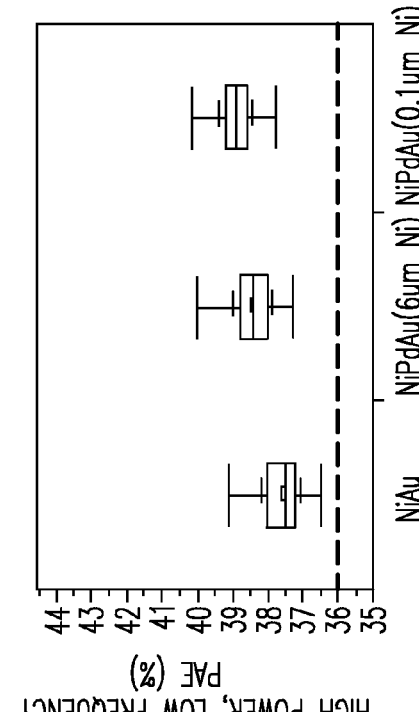
Figure 70A:
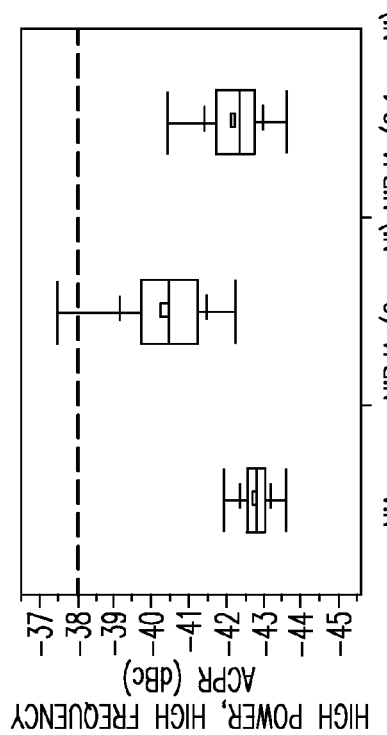

FIGS. 70A and 70B are graphs of ACPR and PAE, respectively, for power amplifiers of the module 770 for high power, high frequency operation corresponding to the three types of transmission lines. Table 6 summarizes some of the data from FIGS. 70A and 70B.

TABLE 6

FOM High Power, High Frequency

| Finish Plating | n= | ACPR Mean | ACPR Std Dev | PAE Mean | PAE Std Dev | FOM (Mean) |
|---|---|---|---|---|---|---|
| NiAu (5.5 um Ni) | 469 | −42.75 | 0.40 | 38.90 | 0.57 | 81.65 |
| Ni NiPdAu (6 um Ni) | 492 | −40.28 | 1.16 | 39.30 | 0.51 | 79.58 |
| Ni NiPdAu (0.1 um Ni) | 451 | −42.12 | 0.79 | 39.88 | 0.50 | 82.00 |

Figure 70C:
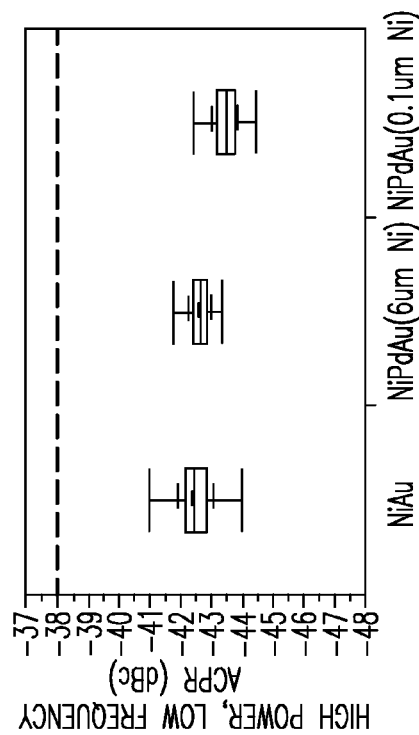

FIGS. 70C and 70D are graphs of ACPR and PAE, respectively, for power amplifiers of the module 770 for high power, low frequency operation corresponding to the three types of transmission lines. Table 7 summarizes some of the data from FIGS. 70C and 70D.

TABLE 7

FOM High Power, Low Frequency

| Finish Plating | n= | ACPR Mean | ACPR Std Dev | PAE Mean | PAE Std Dev | FOM (Mean) |
|---|---|---|---|---|---|---|
| NiAu (5.5 um Ni) | 469 | −42.48 | 0.57 | 37.63 | 0.56 | 80.11 |
| Ni NiPdAu (6 um Ni) | 492 | −42.56 | 0.32 | 38.48 | 0.55 | 81.04 |
| Ni NiPdAu (0.1 um Ni) | 451 | −43.40 | 0.40 | 38.98 | 0.47 | 82.38 |

The data in Tables 6 and 7 indicate that the transmission lines with NiPdAu finish plating with 0.1 um thick nickel have the best FOM of the tested transmission lines. The data of Table 6 indicate that the mean FOM for the transmission lines with NiPdAu finish plating with 0.1 um thick nickel is 0.35 better than the mean FOM for comparable transmission lines with NiAu plating and 2.42 better than the mean FOM for comparable transmission lines with NiPdAu plating with 6 um nickel thickness. The data in Table 7 indicate that the mean FOM for the transmission lines with NiPdAu finish plating with 0.1 um thick nickel is 2.27 better than the mean FOM for comparable transmission lines with NiAu plating and 1.34 better than the mean FOM for comparable transmission lines with NiPdAu plating with 6 um nickel thickness.

Table 8 summarizes data for high power quiescent collector current $I_{QCC}$ of the module 770 with the three types of transmission lines tested. The data indicate that modules including each type of transmission line have similar DC performance.

TABLE 8

DC Performance

| Finish Plating | n = | Mean IQCC (mA) | Std Dev (mA) |
|---|---|---|---|
| NiAu (5.5 um Ni) | 469 | 95.60 | 5.46 |
| NiPdAu (6 um Ni) | 492 | 94.84 | 5.21 |
| NiPdAu (0.1 um) | 451 | 96.15 | 5.26 |

Table 9 summarizes data for high power, high frequency gains of the power amplifier in the module 770 corresponding to the three types of transmission lines tested. The data in Table 9 indicate that power amplifiers in modules with transmission lines with NiPdAu finish plating with 0.1 um thick nickel have a lowest insertion loss because these power amplifiers have the highest average gains.

TABLE 9

| | Gain/Insertion Loss | | |
|---|---|---|---|
| Finish Plating | n = | Mean Gain | Delta Gain |
| NiAu (5.5 um Ni) | 469 | 28.65 | — |
| NiPdAu (6 um Ni) | 492 | 28.47 | −0.18 |
| NiPdAu (0.1 um) | 451 | 28.77 | 0.12 |

H. Example Components Coupled by RF Transmission Lines

FIG. 71 is a schematic block diagram of two radio frequency (RF) components coupled to each other via the transmission line 757 of FIG. 67A. FIGS. 72A-72F are schematic block diagrams of various components that can be electrically coupled to each other via the transmission line 757 of FIG. 67A. The illustrated components can be coupled to a substrate 772 that includes any combination of features of the substrates described herein, for example, as described in connection with FIG. 69. As one example, the substrate 772 can have finish plating. Alternatively or additionally, the various components can be included in a mobile device, such as the mobile device 788 described with reference to FIG. 73.

As shown in FIG. 71, the transmission line 757 can electrically couple a first RF component 782 to a second RF component 783. The first RF component 782 can include any suitable circuit element configured to transmit an RF signal, receive an RF signal, process an RF signal, adjust an RF signal, the like, or any combination thereof. Similarly, the second RF component 783 can include any suitable circuit element configured to transmit an RF signal, receive an RF signal, process an RF signal, adjust an RF signal, the like, or any combination thereof. Non-limiting examples of RF components include power amplifiers, RF switches, filters, and antennas.

As illustrated in FIGS. 72A and 72B, a power amplifier 779 can have an output electrically coupled to the transmission line 757 included on the substrate 772. For example, the output of the power amplifier 779 can be wire bonded to the transmission line 757. In the implementation shown in FIG. 72A, the transmission line 757 is configured to transmit the output of the power amplifier 779 to an RF switch 784. The RF switch 784 can be any suitable switch configured to pass an RF signal when on and to block the RF signal when off. In the implementation shown in FIG. 72B, the transmission line 757 is configured to transmit the output of the power amplifier 779 to a filter 786. The filter 786 can be any suitable filter configured to filter an RF signal. For instance, the filter 786 can be a low-pass filter, a band-pass filter, or a high-pass filter.

As illustrated in FIGS. 72C and 72D, an RF switch 784 can have an output electrically coupled to the transmission line 757 included on the substrate 772. For example, the output of the RF switch 784 can be wire bonded to the transmission line 757. In the implementation shown in FIG. 72C, the transmission line 757 is configured to transmit the output of the RF switch 784 to an antenna 787. In the implementation shown in FIG. 72D, the transmission line 757 is configured to transmit the output of the RF switch 784 to a filter 786.

As illustrated in FIGS. 72E and 72F, a filter 786 can have an output electrically coupled to the transmission line 757 included on the substrate 772. For example, the output of the filter 786 can be wire bonded to the transmission line 757. In the implementation shown in FIG. 72E, the transmission line 757 is configured to transmit the output of the filter 786 to an RF switch 784. In the implementation shown in FIG. 72F, the transmission line 757 is configured to transmit the output of the filter 786 to an antenna 787.

I. Mobile Devices

Any of the systems, methods, and apparatus described herein can be implemented in a variety of electronic devices, such as a mobile device, which can also be referred to as a wireless device. FIG. 73 is a schematic block diagram of an example mobile device 788 that includes the transmission line of FIG. 67A. Examples of the mobile device 788 include, but are not limited to, a cellular phone (for example, a smart phone), a laptop, a tablet computer, a personal digital assistant (PDA), an electronic book reader, and a portable digital media player. For instance, the mobile device 788 can be a multi-band and/or multi-mode device such as a multi-band/multi-mode mobile phone configured to communicate using, for example, Global System for Mobile (GSM), code division multiple access (CDMA), 3G, 4G, and/or long term evolution (LTE).

In certain embodiments, the mobile device 788 can include one or more of a switching component 789, a transceiver component 791, an antenna 787, power amplifiers 792, a control component 793, a computer readable medium 794, a processor 796, a battery 797, and supply control 798. Any of the transmission lines 757 described herein can be implemented in a variety of locations in the mobile device 788. For instance, as illustrated in FIG. 73, a transmission line 757 can electrically connect an output of a power amplifier 792 to the switching component 789 and/or electrically connect the switching component 789 to the antenna 787.

The transceiver component 791 can generate RF signals for transmission via the antenna 787. Furthermore, the transceiver component 791 can receive incoming RF signals from the antenna 787.

It should be understood that various functionalities associated with the transmission and receiving of RF signals can be achieved by one or more components that are collectively represented in FIG. 73 as the transceiver 791. For example, a single component can be configured to provide both transmitting and receiving functionalities. In another example, transmitting and receiving functionalities can be provided by separate components.

Similarly, it should be understood that various antenna functionalities associated with the transmission and receiving of RF signals can be achieved by one or more components that are collectively represented in FIG. 73 as the antenna 787. For example, a single antenna can be configured to provide both transmitting and receiving functionalities. In another example, transmitting and receiving functionalities can be provided by separate antennas. In yet another example, different bands associated with the mobile device 788 can be provided with different antennas.

In FIG. 73, one or more output signals from the transceiver 791 are depicted as being provided to the antenna 787 via one or more transmission paths. In the example shown, different transmission paths can represent output paths associated with different bands and/or different power outputs. For instance, the two example power amplifiers 792 shown can represent amplifications associated with different power output configurations (e.g., low power output and high power output), and/or amplifications associated with different bands.

In FIG. 73, one or more detected signals from the antenna 787 are depicted as being provided to the transceiver 791 via one or more receiving paths, each of which may benefit from a transmission line 757 of the present invention as shown and described herein. In the example shown, different receiving paths can represent paths associated with different bands. For example, the four example paths shown can represent quad-band capability that some mobile devices 788 are provided with.

To facilitate switching between receive and transmit paths, the switching component 789 can be configured to electrically connect the antenna 787 to a selected transmit or receive path. Thus, the switching component 789 can provide a number of switching functionalities associated with an operation of the mobile device 788. In certain embodiments, the switching component 789 can include a number of switches configured to provide functionalities associated with, for example, switching between different bands, switching between different power modes, switching between transmission and receiving modes, or some combination thereof. The switching component 789 can also be configured to provide additional functionality, including filtering of signals. For example, the switching component 789 can include one or more duplexers.

The mobile device 788 can include one or more power amplifiers 792. RF power amplifiers can be used to boost the power of a RF signal having a relatively low power. Thereafter, the boosted RF signal can be used for a variety of purposes, including driving the antenna of a transmitter. Power amplifiers 792 can be included in electronic devices, such as mobile phones, to amplify a RF signal for transmission. For example, in mobile phones having a an architecture for communicating under the 3G and/or 4G communications standards, a power amplifier can be used to amplify a RF signal. It can be desirable to manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot. A power amplifier module can include one or more power amplifiers.

FIG. 73 shows that in certain embodiments, a control component 793 can be provided, and such a component can include circuitry configured to provide various control functionalities associated with operations of the switching component 789, the power amplifiers 792, the supply control 798, and/or other operating component(s).

In certain embodiments, a processor 796 can be configured to facilitate implementation of various functionalities described herein. Computer program instructions associated with the operation of any of the components described herein may be stored in a computer-readable memory 794 that can direct the processor 796, such that the instructions stored in the computer-readable memory produce an article of manufacture including instructions which implement the various operating features of the mobile devices, modules, etc. described herein.

The illustrated mobile device 788 also includes the supply control block 798, which can be used to provide a power supply to one or more power amplifiers 792. For example, the supply control block 798 can include a DC-to-DC converter. However, in certain embodiments the supply control block 798 can include other blocks, such as, for example, an envelope tracker configured to vary the supply voltage provided to the power amplifiers 792 based upon an envelope of the RF signal to be amplified.

The supply control block 798 can be electrically connected to the battery 797, and the supply control block 798 can be configured to vary the voltage provided to the power amplifiers 792 based on an output voltage of a DC-DC converter. The battery 797 can be any suitable battery for use in the mobile device 788, including, for example, a lithium-ion battery. With a transmission line 757 for transmission paths that includes a diffusion barrier layer made of a material, such as nickel, and having a thickness less than the skin depth of the material at a frequency in the RF range, the power consumption of the battery 797 can be reduced and/or signal quality can be improved, thereby improving performance of the mobile device 788.

J. Applications

Some of the embodiments described above in this section have provided examples in connection with modules and/or electronic devices that include power amplifiers, such as mobile phones. However, the principles and advantages of the embodiments can be used for any other systems or apparatus that have needs for a high performance RF transmission line.

Systems implementing one or more aspects of the present disclosure can be implemented in various electronic devices. Examples of electronic devices can include, but are not limited to, consumer electronic products, parts of the consumer electronic products, electronic test equipment, and the like. More specifically, electronic devices configured to implement one or more aspects of the present disclosure can include, but are not limited to, an RF transmitting device, any portable device having a power amplifier, a mobile phone (for example, a smart phone), a telephone, a base station, a femtocell, a radar, a device configured to communication according to the WiFi and/or Bluetooth standards, a television, a computer monitor, a computer, a hand-held computer, a tablet computer, a laptop computer, a personal digital assistant (PDA), a microwave, a refrigerator, an automobile, a stereo system, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Part of the consumer electronic products can include a multi-chip module including an RF transmission line, a power amplifier module, an integrated circuit including an RF transmission line, a substrate including an RF transmission line, the like, or any combination thereof. Moreover, other examples of the electronic devices can also include, but are not limited to, memory chips, memory modules, circuits of optical networks or other communication networks, and disk driver circuits. Further, the electronic devices can include unfinished products.

While various embodiments and related features, aspects, and characteristics of the present inventions have been described in this section, it will be apparent to those of ordinary skill in the art that many more embodiments and implementations are possible such that would be within the scope of the invention. For example, the inventions herein are not limited to the materials or systems described and further may individually or otherwise be combined, integrated, assembled, or joined together in combination with any other number of relevant, desired, or suitable aspects of the present inventions as described throughout the entirety of this disclosure to even further improve the performance of integrated circuits, power amplifiers, power amplifier modules, and the devices in which they are employed.

XI. Tantalum Nitride Terminated Through-Wafer Vias

Apparatus and methods for tantalum nitride terminated through-wafer vias are described herein. In certain implementations, a tantalum nitride (TaN) termination layer is formed on a first or front side of a gallium arsenide (GaAs) wafer, and a gold conductive layer is formed over the TaN termination layer. Thereafter, a through-wafer via is etched into a second or back side of the GaAs wafer so as to extend through the GaAs wafer and a first or inner portion of the TaN termination layer to reach the gold conductive layer. In certain implementations, the through wafer via is plated with a nickel vanadium (NiV) barrier layer, a gold seed layer, and a copper layer. During through-wafer via formation, a second or outer portion of the TaN termination layer is maintained and configured to surround an interface between the gold conductive layer and the copper layer so as to inhibit diffusion of copper into the GaAs wafer.

TaN terminated through-wafer vias can provide improved metal adhesion and reduced copper migration relative to schemes employing silicon nitride termination and a sputtered barrier layer. Furthermore, in certain implementations using a TaN termination layer to terminate a through-wafer via can permit the location or position of the through wafer via to be moved without changing fabrication or lithographical masks associated with transistor structures formed on the front side of the GaAs wafer. Configuring the through-wafer vias to be movable without changing lithographical mask associated with transistors can increase design flexibility and/or reduce time and cost associated with incremental fixes or tape-outs of integrated circuits designs that include the through-wafer vias. In view hereof, it should be readily understood by those skilled in the relevant arts that these aspects of the present invention may be combined with other aspects disclosed herein to further improve the performance of power amplifier modules and the devices in which they are employed.

Now proceeding with reference next to FIG. 74A, there is shown a schematic plan view of a wafer 799 in accordance with one embodiment of certain aspects of the present invention. The wafer 799 includes a plurality of through-wafer vias 802, and has been mounted to a carrier substrate or plate 801.

The wafer 799 can be a gallium arsenide (GaAs) wafer, which can include electronic circuitry formed thereon, such as transistors, resistors, and/or diode structures. In certain implementations, the electronic circuitry is configured to operate as a power amplifier circuit.

The wafer 799 further includes the through-wafer vias 802, which can be used to provide electrical connections between opposing sides of the wafer 799. In certain implementations, the through-wafer vias 802 are used to electrically power electronic circuitry formed on a first or front side of the wafer 799 with a ground or power low supply voltage provided using conductors disposed on a second or back side of the wafer 799.

To aid in the formation of the through-wafer vias 802, the wafer 799 can be configured to have a relatively small thickness, such as a thickness that is less than about 200 µm. The carrier plate 801 can be used to aid in forming the through-wafer vias 802 on the wafer 799 by preventing breakage or other damage to the wafer 799 during processing.

Although FIG. 74A shows the wafer 799 as including less than 100 through-wafer vias for clarity, the wafer 799 typically includes more through-wafer vias, such as 100,000 or more through-wafer vias.

FIG. 74B is a partial magnified plan view of a portion of the wafer 799 of FIG. 74A. The illustrated through-wafer via 802 defines a cavity in the wafer 799, and the cavity includes a first end and a second end. In certain implementations, an anisotropic etching process is used to etch the wafer 799, which can result in the first and second ends of the through-wafer via's cavity having different sizes.

In one embodiment, a first end of the cavity has a width $W_1$ and a length $L_1$ and the second end of the cavity has a width $W_2$ and a length $L_2$, and $W_1$ ranges between about 15 µm to about 60 µm, $L_1$ ranges between about 15 µm to about 60 µm, $W_2$ ranges between about 50 µm to about 70 µm, and $L_2$ ranges between about 60 µm to about 90 µm.

Although FIGS. 74A and 74B are illustrated for the case of through-wafer vias 802 that are substantially rectangular in shape when viewed from above the wafer 799, the through-wafer vias 802 can be shaped in other ways, including, for example, circular shapes, elliptical shapes, trapezoidal shapes, and/or square shapes.

FIGS. 75A to 75I are schematic cross-sections illustrating a manufacturing process for a wafer according to one embodiment hereof for forming through-wafer vias.

FIG. 75A illustrates forming a passivation layer 804 over a first or front side of a substrate 803, which can be a gallium arsenide (GaAs) substrate in certain embodiments. The front side of the substrate 803 can include electronic circuitry such as a power amplifier circuit formed thereon. The passivation layer 804 can be formed over the front side of the substrate 803 to aid in passivating the substrate 803 and/or encapsulating the electronic circuitry. In one embodiment, the passivation layer 804 is a silicon nitride (SiN) layer. The passivation layer 804 can have any suitable thickness, such as a thickness of about 190 nm.

FIG. 75B illustrates forming and patterning a photoresist layer 806 over the passivation layer 804, and using the photoresist layer 806 to pattern the passivation layer 804. The photoresist layer 806 can be formed using any suitable technique, including depositing photoresist using spin coating and subsequently patterning the photoresist using lithography.

The passivation layer 804 can be etched using any suitable process, including, for example, a chemical vapor (CV) etch. As shown in FIG. 75B, the etch of the passivation layer 804 can extend beneath the edges of the photoresist layer 806, which can aid in subsequent removal or lift off of the photoresist layer 806. In one embodiment, the process used to etch the passivation layer 804 is configured to under-etch the photoresist layer 806 by at least about 3 µm.

FIG. 75C illustrates forming a tantalum nitride (TaN) termination layer 807 using the photoresist layer 806 as a mask. The TaN termination layer 807 can be formed using any suitable process, such as a sputter process. As will be described further below, the TaN termination layer 807 can be used to terminate a through-wafer via formed through the substrate 803. In one embodiment the TaN termination layer 807 has a thickness in the range of about 50 nm to about 100 nm.

Certain semiconductor processes utilize TaN to form thin-film resistors in electronic circuitry disposed on the front side of a substrate 803. In such processes, the TaN termination layer 807 can be formed by using the TaN thin-film resistor layer, thereby reducing a number of steps and/or cost of the wafer's manufacturing process.

FIG. 75D illustrates removing the photoresist layer 806, and forming a conductive layer 809 over the TaN termination layer 807. The photoresist layer 806 can be removed using any suitable process, such as a plasma ashing process employing a reactive species, such as oxygen (O) and/or fluorine (Fl).

In certain implementations, the conductive layer 809 is a gold layer configured to operate as a metallization layer for electronic circuitry formed on the front side of the substrate 803. As shown in FIG. 75D, a portion of the conductive layer 809 has been formed over the TaN termination layer 807. The conductive layer 809 can have improved adhesion to the TaN termination layer 807 relative to schemes employing a silicon nitride termination layer.

As will be described in detail further below, a through-wafer via can be formed in the substrate 803 to electrically connect the portion of the conductive layer 809 formed over the TaN termination layer 807 to a backside conductive structure formed on a second or back side of the substrate 803. The backside conductive structure can include a copper layer, and the TaN termination layer 807 can reduce or inhibit copper migration into the substrate 803.

Although the conductive layer 809 is illustrated as continuous over the portion of the substrate 803 shown in FIG. 75D, the conductive layer 809 is typically patterned over the substrate 803. The conductive layer 809 can be patterned using any suitable patterning process, such as a photoresist process.

FIG. 75E illustrates attaching or bonding a carrier plate 801 to the front side of the substrate 803 using an adhesive 808, and forming and patterning a photoresist layer 811 on a back side of the substrate 803. The adhesive 808 can be used to bond the substrate 803 to the carrier plate 801. The adhesive can be, for example, any suitable polymer or wax.

In certain implementations, the carrier plate 801 is a sapphire substrate having a diameter larger than that of the substrate 803. The carrier plate 801 can prevent breakage of the substrate 803 during processing, and can later be removed. Additionally, the carrier plate 801 can be resistant to chemicals and/or environments associated with processing the substrate 803.

FIG. 75F illustrates forming a through-wafer via 802 into the substrate 803 from the back side of the substrate 803. The through-wafer via 802 can be formed by using, for example, a plasma etching process. The through-wafer via 802 can extend through the substrate 803 and through an inner portion of the TaN termination layer 807 to reach the conductive layer 809. In one embodiment, the height of the through-wafer via 802 is in the range of about 80 μm to about 200 μm.

FIG. 75G illustrates removing the photoresist layer 811 and forming a barrier layer 812 over the through-wafer via 802. The photoresist layer 811 can be removed using any suitable process, such as those described earlier with respect to FIG. 75D. The barrier layer 812 can be used to reduce copper diffusion of a subsequently deposited copper layer into the substrate 803. In certain implementations, the barrier layer 812 is a nickel vanadium (NiV) layer. The barrier layer 812 can be formed using any suitable process, such as a sputter process. Although the barrier layer 812 can reduce copper diffusion of a subsequently deposited copper layer, some copper can nevertheless migrate through the barrier layer 812 for a variety of reasons, such as imperfect step-coverage of the barrier layer 812.

FIG. 75H illustrates forming a seed layer 813 over the barrier layer 812, and forming a copper layer 814 over the seed layer 813. The seed layer 813 can be formed using a variety of processes, such as by exposing the substrate 803 to a solution containing metal ions. The seed layer 813 can include any suitable metal, such as gold. The copper layer 814 has been formed over the seed layer 813. The copper layer 814 can be formed over the seed layer 813 using any suitable process, including, for example, electrochemical plating.

As illustrated in FIG. 75H, an outer portion of the termination layer 807 has been retained during processing and configured to surround an interface between the conductive layer 809 and the copper layer 814 so as to terminate the through-wafer via 802. The TaN termination layer 807 can reduce copper migration by passivating portions of the substrate 803 near the through-wafer via 802 and inhibiting copper that migrates past the barrier layer 812 from reaching the substrate 803. In one embodiment, the portion of TaN termination layer 807 that surrounds the interface between the conductive layer 809 and the copper layer 814 has a width of at least about 10 μm.

The copper layer 814 and the conductive layer 809 are electrically connected to one another using the through-wafer via 802. In certain implementations, the front side of the substrate 803 includes transistors formed thereon, and the through-wafer via 802 is used to electrically connect the transistors to a conductive ground plane formed from the copper layer 814 and/or to dissipate heat generated by the transistors. For example, the front side of the substrate 803 can include a power amplifier circuit formed thereon, and an emitter of a bipolar transistor associated with the power amplifier circuit can be electrically connected to a conductive ground plane formed from copper layer 814 using the through-wafer via 802.

FIG. 75I illustrates removing or debonding the carrier plate 801 from the substrate 803. The carrier plate 801 can be removed from the substrate 803 in a variety of ways, including, for example, heating the adhesive 808 to reduce bonding strength and using mechanical force. The substrate 803 can be cleaned after removal of the carrier plate 801 by, for example, using a plasma etch and/or using a cleaning solution such as acetone so that the adhesive 808 is removed as desired.

Although the manufacturing process shown in FIGS. 75A to 75I is illustrated as ending with a debonding process, the illustrated wafer can undergo further processing. For example, the wafer can undergo singulation to form dies from the wafer. In one embodiment, the wafer is configured to include power amplifier circuits, and is singulated to form power amplifier dies.

The above detailed description of embodiments is not intended to be exhaustive or to limit the invention to the precise form disclosed above. While a specific manufacturing process has been described above for illustrative purposes, various modifications are possible within the scope of the invention, as those skilled in the relevant art will recognize. For example, various omissions, substitutions and/or changes to the manufacturing process described herein may be made without departing from the scope of these aspects of the present disclosure.

Thus while various embodiments and related features, aspects, and characteristics of the present inventions have been described in this section, it will be apparent to those of ordinary skill in the art that many more embodiments and implementations are possible such that would be within the scope of the invention. For example, the inventions herein are not limited to the materials or systems described and further may individually or otherwise be combined, integrated, assembled, or joined together in combination with any other number of relevant, desired, or suitable aspects of the present inventions as described throughout the entirety of this disclosure to even further improve the performance of integrated circuits, power amplifiers, power amplifier modules, and the devices in which they are employed.

XII. Via Density and Placement in Radio Frequency Shielding Applications

Aspects of the present disclosure discussed in this section relate to determining the location and/or density of vias that form part of an RF isolation structure of a packaged module and the resulting RF isolation structures. From electromagnetic interference (EMI) data, locations of where via density can be increased and/or decreased without significantly degrading the EMI performance of the RF isolation structure can be identified. In certain embodiments, one or more vias can be added and/or removed from a selected area of the packaged module based on the EMI data. As indicated above, these aspects of the present invention may be combined with other aspects hereof to improve further the performance of power amplifier modules and the devices in which they are employed.

Vias can form part of an electrical connection between the top conductive layer and the bottom conductive layer of an RF isolation structure. It can be desirable to have a strong ground connection to the RF isolation structure, for example from one of the conductive layers. The strength of the RF isolation structure can be based on strength of the ground connection. More vias can provide a stronger ground connection. In previous designs, as many vias as possible were included in order to provide a strong ground connection to certain RF isolation structures. However, those vias consumed significant die area and increased costs of the packaged module.

In this section of the present disclosure, it is recognized that via placements can be determined based on electromagnetic interference (EMI) data, such as EMI probing data and/or near field scan data. Particular features related to isolation associated with RF signals are also recognized in this disclosure. One or more features described herein relate to selectively placing vias such that an RF isolation structure provides desired RF isolation without consuming excess die area. For instance, EMI data from a particular environment can be obtained and via placement can be determined based on such data.

As generally described, aspects of this disclosure in this section relate to determining the location and/or density of vias that form part of an RF isolation structure. From simulation and/or EMI data, locations of "hot spots" and/or "non-radiating areas" of a packaged module can be determined. A "hot spot" can be an area of the packaged module that emits a relatively high amount of electromagnetic radiation and/or an area of the packaged module that receives a relatively high amount of external electromagnetic radiation. A "non-radiating area" can be an area of the packaged module that emits a relatively low amount of electromagnetic radiation and/or an area of the packaged module that receives a relatively low amount of external electromagnetic radiation. Based on the locations of the hot spots and/or non-radiating areas, a density of vias that form part of the RF isolation structure can be adjusted in a selected area of the packaged module without significantly degrading the EMI performance of the RF isolation structure. In certain embodiments, one or more vias can be added and/or removed from a selected area of the packaged module. For instance, vias can be removed around non-radiating areas. As another example, vias can be added around hot spots. Alternatively or additionally, the sensitivity of locations of the packaged module to external radiation can be determined. Based on the sensitivity data, the location and/or density of vias can be adjusted.

By adjusting the location and/or density of the vias, the RF isolation structure can consume less area on a substrate. As a result, the packaged module can be smaller, less expensive, consume less power, or any combination thereof. Tailoring via location and/or density to particular RF isolation needs can reduce the total number of vias without significantly degrading EMI performance. This can result in fewer vias being used, which can reduce the total cost of a substrate that includes the vias. In production, these cost savings can be significant when a large number of packaged modules are manufactured.

Described here in this section are various examples of systems, apparatus, devices structures, materials and/or methods related to fabrication of packaged modules having a radio-frequency (RF) circuit and wirebond-based electromagnetic (EM) isolation structures. Although described in the context of RF circuits, one or more features described herein can also be utilized in packaging applications involving non-RF components. Similarly, one or more features described herein can also be utilized in packaging applications without the EM isolation functionality. It should also be understood that one or more features described herein can be applied to isolation structures that do not include wirebonds.

Now with reference next to FIG. 76A, there is shown a top plan view of an illustrative packaged module 816. The packaged module 816 can include one or more circuit elements. In a number of embodiments, the one or more circuit elements include an RF circuit element. The packaged module 816 can include an RF isolation structure that includes a plurality of vias. The packaged module 816 can be a packaged integrated circuit. The illustrated packaged module 816 includes a radio frequency (RF) isolation structure 818 and an RF component that includes a high band portion 819 and a low band portion 821. Although not illustrated in FIG. 76A for clarity, the packaged module 816 can include numerous other structures.

The RF isolation structure 818 can function as a Faraday cage. The RF isolation structure 818 can include conductive features around at least one RF component. In certain implementations, the conductive features can include a plurality of wirebonds 832 that in combination with vias are configured to provide RF isolation. More details of the plurality of wirebonds 832 will be provided later, for example, with reference to FIGS. 87A and 87B. In some other implementations, the conductive features can include other structures, such as a solid metal can.

The illustrated packaged module 816 is a packaged power amplifier integrated circuit (IC) in which the high band portion 819 includes a high band power amplifier circuit and the low band portion 821 includes a low band power amplifier circuit. Power amplifiers can be used to boost the amplitude of a relatively weak RF signal. Thereafter, the boosted RF signal can be used for a variety of purposes, including, for example, driving an antenna, a switch, a mixer, a filter, or the like, or any combination thereof in an RF system. In certain electronic systems, such as multi-band systems, different power amplifier structures can be used to amplify RF signals of different frequencies. In the illustrated configuration, the packaged module 816 includes the high band power amplifier circuit for amplifying relatively high frequency RF signals and the low band power amplifier circuit for amplifying relatively low frequency RF signals.

Although the packaged module 816 illustrates one example of a packaged IC that can be used herein, the methods and apparatus described herein can be implemented in connection with a variety of other isolation structures.

FIG. 76B shows a cross section of the packaged module 816 along the line A-A of FIG. 76A. The illustrated cross section shows a side view of the RF isolation structure 818. As illustrated, the packaged module 816 includes a system board 826, a printed circuit board 825, wirebonds 832, overmold structure 833, and a conductive layer 834 formed over the overmold structure 833. The system board 826 can include a substrate system board substrate 822 and an electrical reference plane 831, which can be a ground plane. The printed circuit board can be a laminate substrate. The printed circuit board 825 can include input output (I/O) pads (for example, ground contact pads 829), a plurality of vias 823, and one or more racetracks 824. The plurality of vias 823 and the one or more racetracks 824 can electrically connect the ground contact pads 829 to wirebond pads 828, thereby electrically connecting the reference plane 831 to the wirebonds 832. The wirebonds 832 can be disposed above the printed circuit board 825 in the orientation shown in FIG. 76B. Overmold structure 833 can encapsulate the wirebonds 832. More detail about the overmold structure 833 will be provided later, for example, with reference to FIGS. 89 and 90. The wirebonds 832 can be electrically connected to the conductive layer 834.

As illustrated, the RF isolation structure 818 includes the ground plane 831, the ground contact pads 829, the racetrack 824, the plurality of vias 823, the wirebonds 832, and the conductive layer 834. For instance, the plurality of vias 823 can provide RF isolation from RF signals generated by RF circuits within the RF isolation structure 818 and/or outside of the RF isolation structure 818. The vias 823 can be spaced apart by distances such that most of the power of an RF signal is blocked by the vias 823. The placement the vias 823 can be determined in accordance with one or more features described herein.

Although the illustrative cross section of FIG. 76B shows two layers of vias 823, it will be understood that one or more features described herein can be applied to RF isolation structures that include any suitable number of layers of vias 823. For instance, in other implementations, there can be one layer of vias 823. As another example, in certain implementations there can be three or more layers of vias 823. In implementations with two or more layers of vias 823, the vias 823 can be disposed in the same placement or a different placement in different layers. While the plurality of vias 823 is illustrated as being the same size, it will be understood that two or more vias may have different sizes.

FIG. 77 shows a process 836 that can be implemented to fabricate a packaged module 816, such as a packaged module, having and/or by way of one or more features as described herein. FIG. 77 shows various parts and/or stages of various operations associated with the process 836 of FIG. 77.

In block 837 of FIG. 77, a packaging substrate and parts to be mounted on the packaging substrate can be provided. Such parts can include, for example, one or more surface-mount technology (SMT) components and one or more singulated dies having integrated circuits (ICs). FIGS. 78A and 78B show that in some embodiments, the packaging substrate can include a laminate panel 858. FIG. 78A shows the front side of the example laminate panel 858; and FIG. 78B shows the back side of the example laminate panel 858.

The laminate panel 858 can include a plurality of individual module substrates 827 arranged in groups that are sometimes referred to as arrays 859. Although four separate molded sections are shown in FIGS. 78A, 78B, 90, and 94, any of the features described in the application can be applied to other suitable arrangements such as a single array mold cap without breaks.

FIGS. 79A, 79B, 79C show top, side, and bottom views, respectively, of an example configuration of the individual module substrate 827. For illustrative purposes, a boundary 863 can define an area occupied by the module substrate 827 on the panel 858, FIGS. 78A and 78B. Within the boundary 863, the module substrate 827 can include a top or front surface 862 and a bottom or back surface 869. Shown on the front surface 862 is an example mounting area 864 dimensioned to receive a die (not shown). A plurality of example contact pads 866 are arranged about the die-receiving area or die pad 864 so as to allow formation of connection wirebonds between the die and bottom contact pads 871 arranged on the back surface 869. Although not shown, electrical connections between the wirebond contact pads 866 and the module's contact pads 871 can be configured in a number of ways. Also within the boundary 863 are two sets of example contact pads 867 configured to allow mounting of, for example passive SMT devices (not shown). The contact pads can be electrically connected to some of the module's contact pads and/or ground contact pads 829 disposed on the back surface 869. Also within the boundary 863 are a plurality of wirebond pads 828 configured to allow formation of a plurality of EM-isolating wirebonds (not shown). The wirebond pads 828 can be electrically connected to an electrical reference plane (such as a ground plane) 831. Such connections between the wirebond pads 828 and the ground plane 831 (depicted as dotted lines 874) can be achieved in a number of ways. For instance, as shown in FIG. 76B, a plurality of vias 823 and/or one or more racetracks 824 can form at least part of the electrical connection between the wirebond pads 828 and the ground plane 873. The vias 823 and/or racetrack(s) 824, FIG. 76B, can form a portion of an RF isolation structure 818, FIG. 76A, around an RF circuit in the module. In some embodiments, the ground plane 831, 873 may or may not be connected to the ground contact pads 829 disposed on the back surface 869.

FIG. 80 shows an example fabricated wafer 876 that includes a plurality of functional die 877 awaiting to be cut (or sometimes referred to as singulated) into individual die. Such cutting of the die 877 can be achieved in a number of ways. FIG. 81 schematically depicts an individual die 877 where a plurality of metalized contact pads 878 can be provided. Such contact pads can be configured to allow formation of connection wirebonds between the die 877 and the contact pads 866 of the module substrate (e.g., FIG. 79A).

In block 838 of FIG. 77, solder paste can be applied on the module substrate to allow mounting of one or more SMT devices. FIGS. 82A and 82B show an example configuration 879 where solder paste 881 is provided on each of the contact pads 867 on the front or top surface of the module substrate 827. In some implementations, the solder paste 881 can be applied to desired locations on the panel (e.g., 858 in FIG. 78A) in desired amount by an SMT stencil printer.

In block 839 of FIG. 77, one or more SMT devices can be positioned on the solder contacts having solder paste. FIGS. 83A and 83B show an example configuration 882 where example SMT devices 883 are positioned on the solder paste 881 provided on each of the contact pads 867. In some implementations, the SMT devices 883 can be positioned on desired locations on the panel by an automated machine that is fed with SMT devices from tape reels.

In block 841 of FIG. 77, a reflow operation can be performed to melt the solder paste to solder the one or more SMT devices on their respective contact pads. In some implementations, the solder paste 881 can be selected and the reflow operation can be performed to melt the solder paste 881 at a first temperature to thereby allow formation of desired solder contacts between the contact pads 867 and the SMT devices 883.

In block 842 of FIG. 77, solder residue from the reflow operation of block 841 can be removed.

In block 843 of FIG. 77, adhesive can be applied on one or more selected areas on the module substrate 827 to allow mounting of one or more die. FIGS. 84A and 84B show an example configuration 884 where adhesive 886 is applied in the die-mounting area 864. In some implementations, the adhesive 886 can be applied to desired locations on the panel (e.g., 858 in FIG. 78A) in desired amount by techniques such as screen printing.

In block 844 of FIG. 77, one or more die can be positioned on the selected areas with adhesive applied thereon. FIGS. 85A and 85B show an example configuration 887 where a die 877 is positioned on the die-mounting area 864 via the adhesive 886. In some implementations, the die 877 can be positioned on the die-mounting area on the panel by an automated machine that is fed with die from a tape of die wound on a reel for production volume.

In block 846 of FIG. 77, the adhesive between the die the die-mounting area can be cured. Preferably, such a curing operation can be performed at one or more temperatures that are lower than the above-described reflow operation for mounting of the one or more SMT devices on their respective contact pads. Such a configuration allows the solder connections of the SMT devices to remain intact during the curing operation.

In block 847 of FIG. 77, adhesive residue from the mounting operation of blocks 843 and 844 can be removed.

In block 848 of FIG. 77, electrical connections such as wirebonds can be formed between the mounted die and corresponding contact pads on the module substrate 827. FIGS. 86A and 86B show an example configuration 888 where a number of wirebonds 889 are formed between the contact pads 878 of the die 877 and the contact pads 866 of the module substrate 827. Such wirebonds can provide electrical connections for signals and/or power to and from one or more circuits of the die 877. In some implementations, the formation of the foregoing wirebonds can be achieved by an automated wirebonding machine.

In block 849 of FIG. 77, a plurality of RF-shielding wirebonds can be formed about a selected area on the module substrate 827. FIGS. 87A and 87B show an example configuration 891 where a plurality of RF-shielding wirebonds 832 are formed on wirebond pads 828. The wirebond pads 828 are schematically depicted as being electrically connected (dotted lines 874) with one or more reference planes such as a ground plane 873. In some embodiments, such a ground plane can be disposed within the module substrate 827. The foregoing electrical connections between the RF-shielding wirebonds 832 and the ground plane 873 can yield an interconnected RF-shielding structure at sides and underside of the area defined by the RF-shielding wirebonds 832. The electrical connections between the RF-shielding wirebonds 832 and the ground plane 873 can include vias 823 and/or one or more racetracks 824, for example, as described with reference to FIG. 76B. As described herein, a conductive layer can be formed above such an area and connected to upper portions of the RF-shielding wirebonds 832 to thereby form an RF isolation structure 818, FIG. 76A, having an RF-shielded volume.

In the example configuration 891 of FIGS. 87A and 87B, the RF-shielding wirebonds 832 are shown to form a perimeter around the area where the die 877 and the SMT devices 883 are located. Other perimeter configurations are also possible. For example, a perimeter can be formed with RF-wirebonds around the die, around one or more of the SMT devices, or any combination thereof. In some implementations, an RF-wirebond-based perimeter can be formed around any circuit, device, component or area where RF-isolation is desired. For the purpose of description, it will be understood that RF-isolation can include keeping RF signals or noise from entering or leaving a given shielded area. Thus, for the purpose of description, it should be further understood that the terms isolation and shielding can be used interchangeably as appropriate. For example, an RF component being shielded can include a situation where some or substantially all of an RF signal from another source is being blocked from reaching the RF component. As another example, an RF component being isolated can include a situation where some or substantially all of an RF signal (for example, noise or an actively generated signal) is being blocked from reaching another device. Unless the context indicates otherwise, it should be understood that each of the terms shielding and isolation can include either or both of the foregoing functionalities.

In the example configuration 891 of FIGS. 87A and 87B, the RF-shielding wirebonds 832 are shown to have an asymmetrical side profile configured to facilitate controlled deformation during a molding process as described herein. Additional details concerning such wirebonds can be found in, for example, PCT Publication No. WO 2010/014103 titled SEMICONDUCTOR PACKAGE WITH INTEGRATED INTERFERENCE SHIELDING AND METHOD OF MANUFACTURE THEREOF. In some embodiments, other shaped RF-shielding wirebonds can also be utilized. For example, generally symmetric arch-shaped wirebonds as described in U.S. Pat. No. 8,071,431 titled OVERMOLDED SEMICONDUCTOR PACKAGE WITH A WIREBOND CAGE FOR EMI SHIELDING, can be used as RF-shielding wirebonds in place of or in combination with the shown asymmetric wirebonds. In some embodiments, RF-shielding wirebonds do not necessarily need to form a loop shape and have both ends on the surface of the module substrate. For example, wire extensions with one end on the surface of the module substrate and the other end positioned above the surface (for connecting to an upper conductive layer) can also be utilized.

In the example configuration 891 of FIGS. 87A and 87B, the RF-shielding wirebonds 832 are shown to have similar heights that are generally higher than heights of the die-connecting wirebonds 889. Such a configuration allows the die-connecting wirebonds 889 to be encapsulated by molding compound as described herein, and be isolated from an upper conductive layer to be formed after the molding process.

In block 851 of FIG. 77, an overmold can be formed over the SMT components, die, and RF-shielding wirebonds. FIG. 88 shows an example configuration 893 that can facilitate formation of such an overmold. A mold cap 894 is shown to be positioned above the module substrate 827 so that the lower surface 896 of the mold cap 894 and the upper surface 862 of the module substrate 827 define a volume 897 where molding compound can be introduced.

In some implementations, the mold cap 894 can be positioned so that its lower surface 896 engages and pushes down on the upper portions of the RF-shielding wirebonds 832. Such a configuration allows whatever height variations in the RF-shielding wirebonds 832 to be removed so that the upper portions touching the lower surface 896 of the mold cap 894 are at substantially the same height. When the mold compound is introduced and an overmold structure is formed, the foregoing technique maintains the upper portions of the encapsulated RF-shielding wirebonds 832 at or close to the resulting upper surface of the overmold structure.

In the example molding configuration 893 of FIG. 88, molding compound can be introduced from one or more sides of the molding volume 897 as indicated by arrows 898. In some implementations, such an introduction of molding compound can be performed under heated and vacuum condition to facilitate easier flow of the heated molding compound into the volume 897.

FIG. 89 shows an example configuration 899 where molding compound has been introduced into the volume 897 as described in reference to FIG. 88 and the molding cap removed to yield an overmold structure 833 that encapsulates the various module elements (e.g., die, die-connecting wirebonds, and SMT devices). The RF-shielding wirebonds are also shown to be substantially encapsulated by the overmold structure 833. The upper portions of the RF-shielding wirebonds are shown to be at or close to the upper surface 902 of the overmold structure 833.

FIG. 90 shows an example panel 903 that has overmold structures 833 formed over the multiple array sections. Each array section's overmold structure can be formed as described herein in reference to FIGS. 88 and 89. The resulting overmold structure 833 is shown to define a common upper surface 902 that covers the multiple modules of a given array section.

The molding process described herein in reference to FIGS. 88, 89, and 90 can yield a configuration where upper portions of the encapsulated RF-shielding wirebonds are at or close to the upper surface of the overmold structure. Such a configuration may or may not result in the RF-shielding wirebonds forming a reliable electrical connection with an upper conductor layer to be formed thereon.

In block 852 of FIG. 77, a thin top portion or layer of the overmold structure can be removed to better expose upper portions of the RF-shielding wirebonds. FIG. 91 shows an example configuration 904 where such a removal has been performed. In the example, the upper portion of the overmold structure 833 is shown to be removed to yield a new upper surface 906 that is lower than the original upper surface 902 (from the molding process). Such a removal of material is shown to better expose the upper portions 907 of the RF-shielding wirebonds 832.

The foregoing removal of material from the upper portion of the overmold structure 833 can be achieved in a number of ways. FIG. 92A shows an example configuration 908 where such removal of material is achieved by sand-blasting. In the example, the lighter-shaded portion is where material has been removed to yield the new upper surface 906 and better exposed upper portions 907 of the RF-shielding wirebonds. The darker-shaded portion is where material has not been removed, so that the original upper surface 902 still remains.

In the example shown in FIG. 92A, a modular structure corresponding to the underlying module substrate 827 (depicted with a dotted box 863) is readily shown. Such modules will be separated after a conductive layer is formed over the newly formed upper surface 906.

In block 853 of FIG. 77, the new exposed upper surface resulting from the removal of material can be cleaned.

In block 854 of FIG. 77, an electrically conductive layer can be formed on the new exposed upper surface of the overmold structure, so that the conductive layer is in electrical contact with the upper portions of the RF-shielding wirebonds. Such a conductive layer can be formed by a number of different techniques, including methods such as spraying or printing. FIG. 92B illustrates one method for forming the conductive layer 834, FIG. 93, according aspects hereof. Here a spray nozzle 909 sprays conductive paint 910 on the top of the configuration 908 after the entire top surface thereof has been reduced down to height 906 by the sand-blasting or other ablation method. The conductive paint 910 may be a conductive metal paint formulated to achieve the intended aspects hereof. Further relating thereto is found in U.S. patent application Ser. Nos. 13/893,605; 13/893,614; and 13/904,566 as incorporated herein above.

FIG. 93 shows an example configuration 911 where an electrically conductive layer 834 has been formed over the upper surface 906 of the overmold structure 833. As described herein, the upper surface 906 better exposes the upper portions 907 of the RF-shielding wirebonds 832. Accordingly, the formed conductive layer 834 forms improved contacts with the upper portions 907 of the RF-shielding wirebonds 832.

As described in reference to FIGS. 87A and 87B, the RF-shielding wirebonds 832 and the ground plane 873 can yield an interconnected RF isolation structure at sides and underside of the area defined by the RF-shielding wirebonds 832. With the upper conductive layer 834 in electrical contact with the RF-shielding wirebonds 832, the upper side above the area is now shielded as well, thereby yielding a shielded volume.

FIG. 94 shows an example panel 913 that has been sprayed with conductive paint to yield an electrically conductive layer 834 that covers multiple array sections. As described in reference to FIG. 90, each array section includes multiple modules that are to be separated to from finished packaged modules.

In block 856 of FIG. 77, the modules in a array section having a common conductive layer (e.g., a conductive paint layer) can be singulated into individual packaged modules. Such singulation of modules can be achieved in a number of ways, including a sawing technique.

FIG. 95 shows an example configuration 916 where the modular section 827 described herein has been singulated into a separated module 917. The overmold portion is shown to include a side wall 919; and the module substrate portion is shown to include a side wall 918. Collectively, the side walls 919 and 918 are shown to define a side wall 921 of the separated module 917. The upper portion of the separated module 917 remains covered by the conductive layer 834. As described herein in reference to FIGS. 79A, 79B, and 79C, the lower surface 869 of the separated module 917 includes contact pads 871, 829 to facilitate electrical connections between the module 917 and a circuit board such as a phone board.

FIGS. 96A, 96B, and 96C show front (also referred to as top herein), back (also referred to as bottom herein) and perspective views of the singulated module 917. As described herein, such a module includes RF-shielding structures encapsulated within the overmold structure; and in some implementations, the overall dimensions of the module 917 is not necessarily any larger than a module without the RF-shielding functionality. Accordingly, modules having integrated RF-shielding functionality can advantageously yield a more compact assembled circuit board since external RF-shield structures are not needed. Further, the packaged modular form allows the modules to be handled easier during manipulation and assembly processes.

In block 857 of FIG. 77, the singulated modules can be tested for proper functionality. As discussed above, the modular form allows such testing to be performed easier. Further, the module's internal RF-shielding functionality allows such testing to be performed without external RF-shielding devices.

FIG. 97 shows that in some embodiments, one or more of modules included in a circuit board such as a wireless phone board can be configured with one or more packaging features as described herein. Non-limiting examples of modules that can benefit from such packaging features include, but are not limited to, a controller module, an application processor module, an audio module, a display interface module, a memory module, a digital baseband processor module, GPS module, an accelerometer module, a power management module, a transceiver module, a switching module, and a power amplifier (PA) module.

FIG. 98A shows a process 923 that can be implemented to assemble a packaged module having one or more features as described herein on a circuit board. In block 924, a packaged module can be provided. In some embodiments, the packaged module can represent a module described in reference to FIG. 97. In block 926, the packaged module can be mounted on a circuit board (e.g., a phone board). FIG. 98B schematically depicts a resulting circuit board 928 having module 816 mounted thereon. While one module is illustrated as being mounted on the circuit board 928, it will be understood that one or more other modules can be also be mounted thereon. The circuit board 928 can also include other features such as a plurality of connections 930 to facilitate operations of various modules mounted thereon.

In block 927 of FIG. 98A, a circuit board having modules mounted thereon can be installed in a wireless device. FIG. 98C schematically depicts a wireless device 931 (e.g., a cellular phone) having a circuit board 928 (e.g., a phone board). The circuit board 928 is shown to include a module 929 having one or more features as described herein. The wireless device is shown to further include other components, such as an antenna 932, a user interface 933, and a power supply 934.

FIG. 98D schematically depicts a wireless device 931 having a packaged module 816, such as a chip or a module. The wireless device 931 illustrated in FIG. 98D can include one or more features shown in FIG. 98C, some of which have been omitted from FIG. 98D for illustrative purposes. In some embodiments, the packaged module 816 can include any of the modules described herein. As illustrated, the packaged module 816 includes an RF component 938 and an RF isolation structure 818 formed about the RF component 938 so as to provide RF isolation properties. The RF isolation structure 818 can be disposed about the perimeter of the packaged module 816 or disposed around the RF component 938 on other suitable areas of the packaged module 816. The RF isolation structure 818 can provide one or more RF isolation functionalities such as isolating the RF component 938 from an RF influence (arrow 936) from another component 939 in the electronic wireless device 931, isolating the RF component 938 from an external RF source (arrow 937) outside of the wireless device 931, and/or preventing electromagnetic radiation (arrows 941 and 942) from RF signals and/or noise from the RF component 938 from reaching the other component 939 in the wireless device 931 and/or to an external RF source (not shown) outside of the electronic wireless device 931. The RF component 938 can include one or more circuit elements configured to transmit and/or receive an RF signal. Non-limiting examples of RF components include power amplifiers, voltage-controlled oscillators, filters, switches, and the like. For instance, in the embodiment illustrated in FIG. 76A, the RF component can include the high band portion 819 and/or the low band portion 821.

Although one RF component 938 is shown in FIG. 98D, it will be understood that two or more RF components can be included within an RF isolation volume resulting from the RF isolation structure 818. According to some embodiments, the packaged module 816 can include two or more RF components each having a dedicated RF isolation structure.

FIG. 99A is a flow diagram of an illustrative process 943 of determining via placement. Any combination of the features of the process 943 or any of the other processes described herein can be embodied in a non-transitory computer readable medium and stored in memory. When executed, the non-transitory computer readable medium can cause some or all of the process 943 or other process to be performed. It will be understood that any of the methods discussed herein may include greater or fewer operations and the operations may be performed in any order, as appropriate.

The process 943 can determine a via placement about the periphery of a packaged module. Vias can be part of an RF isolation structure that forms an RF isolation volume about one or more RF components. The vias can be formed in one layer or more layers of a substrate. In some embodiments, the vias can be formed as part of a printed circuit board, for example, as shown in FIG. 76B. Having a higher via density in a selected defined area about the perimeter of the packaged module can provide a stronger ground connection in the selected area and/or stronger RF isolation. Conversely, reducing via density in a selected area can reduce die size and overall costs of the packaged module. The process 943 can determine where vias can be removed to save die area and/or where adding vias can improve RF isolation.

The process 943 can include obtaining electromagnetic interference (EMI) data at block 944, identifying areas associated with relatively high EMI and/or relatively low EMI at block 946, and determining an updated via placement at block 947. This process can be iterated until an EMI specification is met at block 948. The process 943 will now be discussed with reference to the example EMI profiles illustrated in FIGS. 100A and 100B, the relationship between via density and inverse radiated power shown in FIG. 101, and the via placements illustrated in FIGS. 102A and 102B.

EMI data can be obtained for an initial via placement at block 944. In some embodiments, an electromagnetic scan/probe can be performed to obtain EMI data in the initial via placement. For instance, a near field scan can be performed. The EMI data can be associated with RF applications. According to certain embodiments, the EMI data can correspond to two or more modes of operation of the packaged module. For example, the EMI data can correspond to a high band mode of operation and a low band mode of operation where the packaged module operates within a lower frequency band than in the high band mode of operation. Different RF isolation considerations may apply to different frequency bands of operation. For example, at higher frequencies, RF signals can have smaller wavelengths. As a result, it can be desirable to have vias closer together near high band portions of the packaged module. As another example, the EMI data can correspond to a low power mode of operation and a high power mode of operation. The initial via placement can correspond to RF component(s) without any vias providing RF shielding according to certain implementations. Alternatively, the initial via placement can correspond to any other placement of at least one via disposed around the RF component. In certain implementations, the initial placement can correspond to a maximum number of vias that can be included in a particular size of a packaged module.

Example EMI data are reflected in the EMI profiles shown in FIGS. 100A and 100B. The EMI profiles of FIGS. 100A and 100B correspond to the via placements shown in FIGS. 102A and 102B, respectively. The EMI data reflected in FIG. 100A can correspond to an initial placement of vias or a placement of vias after one or more iterations of determining updated via placements. The EMI data reflected in FIG. 100B can correspond to an updated placement of vias determined based on EMI profile shown in FIG. 100A.

FIG. 100A shows an example of an EMI profile corresponding to a plurality of vias disposed along a perimeter of a packaged module surrounding RF components. More specifically, the EMI profile shown in FIG. 100A corresponds to the placement of vias shown in FIG. 102A. The EMI profile graphically illustrates EMI associated with portions of a surface of a packaged module. In FIG. 100A, regions correspond to a square that can be identified by a column numbered from left to right along the top side of the EMI profile in FIG. 100A and a row with a letter along the left side of the EMI profile in FIG. 100A. The shading of the EMI profile indicates an EMI value associated with a corresponding area of the packaged module. More specifically, the legend of FIG. 100C indicates corresponding EMI values in dBm, which can represent a power ratio in decibels of measured EMI referenced to one milliwatt. It is to be understood that a lower EMI value is represented number with a higher negative value. For instance, an EMI value of −14 dBm is higher than an EMI value of −24 dBm. The shading of the EMI profiles in FIGS. 100A and 100B corresponds to the EMI values in dBm in the legend of FIG. 100C.

Each region of the EMI profile can correspond to a defined surface area of a packaged module and/or a printed circuit board thereof. The defined surface area can include zero, one, two, or more vias. Each of the regions that include at least one via can have approximately the same width in a dimension substantially parallel to outer edge of the packaged module. Each region can have the approximately the same area in certain implementations. In other implementations, two or more regions can have different areas. It will be understood that regions can be smaller or larger than the illustrated regions. Any particular region can be associated with one or more EMI values. For instance, region B1 in FIG. 100A is associated with a plurality of EMI values and region F1 is associated with a single EMI value.

Referring back to FIG. 99A, areas associated with relatively high and/or relatively low EMI can be identified at block 946. For instance, an area of a packaged module associated with a highest EMI value can be identified. As another example, one or more areas of the packaged module associated with an EMI value above a predefined threshold can be identified. Alternatively or additionally, one or more areas of the packaged module associated with EMI value below a predefined threshold can be identified. In yet another example, an area having the lowest EMI value can be identified.

Areas of the packaged module associated with relatively high EMI can benefit by stronger RF isolation compared to other areas of the packaged module. In some implementations, an area of the packaged module associated with relatively high EMI can be a hot spot and/or an area for which the RF isolation structure provides less RF isolation than other areas of the packaged module. Such areas can provide less RF isolation than defined in product specifications and/or than desired EMI levels. According to some embodiments, hot spots can occur at or near areas of a packaged module that generate signals with a high power level, such as an output of a power amplifier (PA). In contrast, for a low noise amplifier (LNA), a hot spot can occur at or near an input of the LNA. Alternatively or additionally, hot spots can occur at or near areas of a packaged module with a high activity factor, such as near an oscillator (for example, a voltage-controlled oscillator) and/or an LNA.

Areas of the packaged module associated with relatively low EMI can provide a sufficient level of RF isolation with a relatively low via density. In some implementations, an area of the packaged module associated with relatively low EMI can be a non-radiating area and/or an area for which the RF isolation structure provides more RF isolation than other areas of the packaged module. Such areas can provide more RF isolation than defined in product specifications and/or than EMI desired levels. According to some embodiments, a non-radiating area can occur at or near areas of a packaged module that do not generate signals or that generated signals with a low power level. Alternatively or additionally, non-radiating areas can occur at or near areas of a packaged module with a low activity factor. As another example, for a power amplifier module, an RF input and DC paths can be less sensitive to EMI radiation compared to an output matching network (OMN).

The EMI profile of FIG. 100A indicates that regions B1 and C1 are associated with relatively high EMI and regions A8, B8, C8, D8, E8, and F8 are associated with relatively low EMI. In particular, an EMI value associated with region B1 is approximately −14 dBm. Such an EMI value can be problematic in certain applications. Thus, it can be desirable to adjust a via density of the packaged module to improve EMI. Via density can be adjusted by changing the number, location, size, or any combination thereof in an updated placement of vias compared to the initial placement of vias.

An RF isolation structure that includes a plurality of vias can be grounded by connection to a ground plane, for example, by an electrical connection to a lower conductive layer below an RF component that is configured as a ground plane. While the ground plane ideally has a parasitic inductance of zero, in reality, the ground plane has a non-zero parasitic inductance. Adding additional vias can reduce an inductance of the ground plane. Conversely, reducing the number of vias can increase the inductance of the ground plane. Higher inductance associated with the ground plane can lead to a less stable ground plane that can affect signals generated by an RF component being isolated by the RF isolation structure. For example, the RF isolation structure can function like an antenna when the ground plane is unstable. This can cause the RF isolation structure to amplify radiation, rather than provide RF isolation. Such an affect can occur at locations of a packaged module corresponding to relatively high EMI, for example, locations of the packaged module corresponding to regions B1 and C1 in the EMI profile shown in FIG. 100A.

FIG. 101 illustrates a relationship among via density and inverse radiated power. When the via surface area density is below d1, the RF isolation structure can float due to a weak ground connection. A weak ground connection can cause portions of the packaged module to be associated with relatively high EMI, for example, as shown by regions B1 and C1 of the EMI profile of FIG. 100A. Density d1 can represent a lower threshold below which the RF isolation structure functions like a weak ground place. The curve illustrated in FIG. 101 has a low inverse radiated power and thus a relatively high radiation associated with via surface area densities below the density d1. This can cause the RF isolation structure to behave like an antenna. Thus, it can be desirable to increase surface area densities that are below density d1 in order to increase inverse radiated power (decrease radiated power). Density d2 can represent an upper threshold above which increased via density may not significantly improve RF isolation. Above the density d2, the curve illustrated in FIG. 101 flattens. When the via surface area density is above the density d2, advantages of increasing via density may not provide a significant increase in inverse radiated power and consequently RF isolation of the RF isolation structure. As a result, it can be desirable for the via surface area density to be between density d1 and density d2 in FIG. 101. This can, for example, reduce die area and/or reduce manufacturing costs.

Referring back again to FIG. 99A, an updated via placement can be determined at block 947. In the updated via placement, via density in areas of associated with high EMI can be increased compared to the initial placement. Alternatively or additionally, in the updated via placement, via density in areas associated with low EMI can be decreased compared to the initial placement. According to certain embodiments, via density in the updated placement can be determined such that the via density is above a lower threshold below which the RF isolation structure behaves like a weak ground place and below an upper threshold above which increased via density may not significantly improve RF isolation. For instance, the via density in the updated placement can be between the density d1 and the density d2 in FIG. 101.

In the updated placement of vias, the number of vias, location of vias, size of vias, or any combination thereof can be adjusted compared to the initial placement of vias. For instance, vias can be moved away from an area associated with relatively low EMI toward an area of relatively high EMI. As another example, vias can be added to an area associated with relatively high EMI and/or vias can be removed from an area associated with relatively low EMI. In yet another example, the size of one or more vias can be increased in an area associated with relatively high EMI and/or the size of one or more vias can be decreased in an area associated with relatively low EMI.

For illustrative purposes, more detail will be provided with reference to adding vias to selected locations along the periphery of a substrate. FIG. 102A shows a top plan view of a substrate having a placement of vias 823 arranged around the perimeter. As shown in FIG. 102A, the vias 823 can be aligned around the perimeter of the substrate. The vias 823 illustrated in FIG. 102A can be included in the same layer of the substrate. The placement of vias 823 shown in FIG. 102A can correspond to the EMI profile shown in FIG. 100A. FIG. 102B shows another top plan view of the substrate having an updated placement of vias 823 and 823' arranged around the perimeter. The placement of vias 823 and 823' shown in FIG. 102B can correspond to the EMI profile shown in FIG. 100B. According to some embodiments, the placement of vias 823 and 823' in FIG. 102B can be a final placement of vias used in a manufactured packaged module.

In the updated placement shown in FIG. 102B, two additional vias 823' were added in areas of the substrate corresponding to regions B1 and C1 compared to the placement of vias 823 shown in FIG. 102A. The EMI profile of FIG. 100B shows that the two additional vias 823' improved the EMI associated with a corresponding region in the EMI profile. For instance, the EMI profile of FIG. 100B indicates that EMI for region C1 improved by about 10 dBm compared to the EMI profile of FIG. 100A without the two additional vias 823'. The EMI profile of FIG. 100B shows that the two additional vias 823' improved the EMI associated with other neighboring regions in the EMI profile. For instance, the EMI profile of FIG. 100B indicates that EMI for region A1 improved by about 4 dBm and the EMI for region A4 improved by about 7 dBm compared to the EMI profile of FIG. 100A without the two additional vias 823'.

Referring back to FIG. 99A, the process can be iterated any suitable number of times until an EMI specification is met at block 948. More specifically, EMI data can be obtained, areas associated with relatively high and/or relatively low EMI can be identified, and an updated placement of vias can be determined. Thus, the process 943 can be an iterative process in certain implementations. For instance, the EMI profile of FIG. 100A and the via placement shown in FIG. 102A can correspond to an iteration of the process 943 that is between an initial via placement and a final via placement that is used in production. According to certain embodiments, at block 948, the process 943 can be iterated for different modes of operation such that EMI specifications are met for the different modes of operation. The different modes of operation can be, for example, associated with different frequency bands and/or different power modes. In some embodiments, the process 943 can be iterated at block 948 for different layers of vias 823.

By executing the process 943, via placement can be improved such that EMI associated with a packaged module meets a specification without using excess vias. Accordingly, the process 943 can result in packaged modules with vias configured to provide RF isolation with efficient utilization of die area.

FIG. 99B is a flow diagram of an illustrative process 949 of determining via placement. The process 949 can be substantially the same as the process 943, except that block 946 of the process 943 is replaced with block 951 in the process 949. Thus the process 949 can include any combination of features described earlier with reference to obtaining EMI data at block 944, determining an updated via placement at block 947, and iterating the process at block 948. The process 949 can include obtaining EMI data at block 944, determining sensitivity of areas to external radiation at block 951, and determining an updated via placement at block 947. The process 949 can be iterated until an EMI specification is met at block 948. It should be understood that, according to certain embodiments, the process 943 and the process 949 can be performed together, in serial, in parallel, or any combination thereof. Thus, via placements can be based on a relative level of EMI associated with area(s) of a packaged module and/or a sensitivity of the area(s) of the packaged module to external radiation.

The principles and advantages described in connection with areas of a packaged module associated with relatively low and/or relatively high EMI can be applied to areas of the packaged module that are relatively sensitive and/or relatively insensitive to external radiation at block 951. For instance, sensitivity data can be obtained and areas that are relatively more sensitive to electromagnetic radiation and/or areas that are relatively less sensitive to electromagnetic radiation can be identified. In some embodiments, the sensitivity data can include EMI data, such as the EMI profile shown in FIG. 100A, and/or data derived from such EMI data. Areas of the packaged module that are sensitive to external radiation can be treated similarly to areas of the packaged module associated with relatively high EMI. For instance, at block 951, the via density in these areas can be increased at block 951. Alternatively or additionally, areas of the packaged module that are not sensitive to external radiation can be treated similarly to areas of the packaged module associated with relatively low EMI. Areas that are sensitive to external radiation can include, for example, an output matching network (OMN) area of a power amplifier module and/or an output of a VCO. By contrast, areas that are not sensitive to external radiation can include, for example, input areas and/or DC paths.

Packaged modules in accordance with one or more features described herein can include particular via placements. For instance, the plurality of vias can be disposed around an RF component such that there is a higher density in a first region of the packaged module than in a second region of the packaged module, in which the first region is associated with a higher electromagnetic interference than the second region. For instance, the vias 823 and 823' in FIG. 102B are included in region 952 that corresponds to regions B1 and C1 of the illustrated EMI profiles. Region 952 has a higher density than region 953 that corresponds to regions B8 and C8 of the illustrated EMI profiles. Regions 952 and 953 are provided for illustrative purposes, and it will be understood that other regions and/or region sizes can be implemented in connection with one or more features described herein.

Different via densities can be achieved in a variety of ways. For example, as illustrated in FIG. 102B, the region 952 includes more vias than the region 953. When vias of the plurality of vias are about the same size, vias that are spaced more closely together in the same layer of the substrate have a higher via density. For instance, the vias 823 and 823' are spaced more closely together in the region 952 than the vias 823 in the region 953. As another example, different via densities can be achieved by using differently sized vias.

As illustrated in FIG. 102B, the region 952 is disposed along a periphery of the packaged module and the region 953 is also disposed along the periphery of the packaged module. The regions 952 and 953 have a width that is approximately the same in a dimension substantially parallel to outer edges of the packaged module. As illustrated in FIG. 102B, the region 952 has approximately the same area as the region 953. In certain embodiments, the first region can have a via density that is at least as great as any region along the periphery of the packaged module with an area that is at least as big as the area of the first region. Alternatively or additionally, the second region can have a via density that is no greater than the density of any region along the periphery of the packaged module with an area that is at least as big as the area of the second region.

The vias 823 and 823' disposed along the periphery of the packaged module can be spaced closer together along the periphery of the packaged module in a hot spot than in a low radiating area. Such via spacing can be in one or more layers of the substrate. For instance, in a single layer of the substrate, the vias 823 and 823' disposed along the periphery of the packaged module can be spaced closer together along the periphery of the packaged module in a hot spot than in a low radiating area. As another example, vias can be spaced closer together along the periphery of the packaged module in a hot spot than in a low radiating area in each of two or more layers of the substrate. Referring to FIG. 102B, the illustrated vias 823 and 823' are spaced closer together in the region 952 than in the region 953. The vias 823 and 823' can be aligned along the periphery of the packaged module, for example, as shown in FIGS. 102A and 102B.

In the packaged module, the first region and the second region having a lower via density than the first region can each include at least one via. The first region and the second region having a lower via density than the first region can each include at least two vias.

One or more RF components being isolated by the RF isolation structure can emit more radiation to the first region than to the second region. For instance, the RF component(s) can emit more radiation to region 952 than to region 953.

The first region can correspond to a hot spot of the packaged module and the second region can correspond to a low radiating area of the packaged module. For example, the region 952 can be adjacent to a power amplifier output or an output of a different RF component that generates a high power signal. As another example, the region 952 can be adjacent to a voltage-controlled oscillator output or an output of a different RF component that has a high activity factor. By contrast, the second region can be adjacent to an area of the packaged module with a low activity factor, an area of the packaged module that does not generate signals, an area of the packaged module in which low power signal propagate, the like, or any combination thereof.

Alternatively or additionally, the first region can be exposed to more external radiation than the second region. For instance, a hot spot of an adjacent component could be adjacent to the region 952.

The via placements described herein can be included in an RF isolation structure of a packaged module that includes one or more conductive features forming at least a portion of an electrical connection between the plurality of vias and a conductive layer above the RF component. As one example, the one or more conductive features can include wirebonds, for example, the wirebonds 832 illustrated in FIG. 76B. Alternatively, the one or more conductive features can include a metal can surrounding the RF component.

In certain embodiments, the RF component within the RF isolation volume formed by the RF isolation structure includes a power amplifier. For example, the via placement illustrated in FIG. 102B can correspond to the packaged module illustrated in FIGS. 76A and 76B. The region 952 can be adjacent to a power amplifier output. More specifically, the region 952 can be adjacent to an output of a power amplifier in the high band portion 819 of the packaged module 816 of FIG. 76A.

Some of the embodiments described above have provided examples in connection with packaged modules and/or electronic devices that include RF components, such as power amplifiers. However, the principles and advantages of these embodiments can be used for any other systems or apparatus that have needs for a shielding and/or isolation.

Systems implementing one or more aspects of this disclosure can be implemented in various electronic devices. Examples of electronic devices can include, but are not limited to, consumer electronic products, parts of the consumer electronic products, electronic test equipment, etc. More specifically, electronic devices configured to implement one or more aspects of the present disclosure can include, but are not limited to, an RF transmitting device, an RF receiving device, an RF transceiver, any portable device having an RF component (for example, a power amplifier), a mobile phone (for example, a smart phone), a telephone, a base station, a femtocell, a radar, a device configured to communicate according to the WiFi and/or Bluetooth standards, a television, a computer monitor, a computer, a hand-held computer, a tablet computer, a laptop computer, a personal digital assistant (PDA), a microwave, a refrigerator, an automobile, a stereo system, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, the like, etc. Part of the consumer electronic products can include a multi-chip module including an RF isolation structure, a power amplifier module, an integrated circuit including an RF isolation structure, a substrate including vias that can be used to form part of an RF isolation structure, the like, or any combination thereof. Moreover, other examples of the electronic devices can also include, but are not limited to, memory chips, memory modules, circuits of optical networks or other communication networks, and disk driver circuits. Further, the electronic devices can include unfinished products.

The teachings of the invention provided herein can be applied to other systems, not necessarily the systems described above. The elements and acts of the various embodiments described above can be combined to provide further embodiments.

While various embodiments and related features, aspects, and characteristics of the present inventions have been described in this section, it will be apparent to those of ordinary skill in the art that many more embodiments and implementations are possible such that would be within the scope of the invention. For example, the inventions herein are not limited to the materials or systems described and further may individually or otherwise be combined, integrated, assembled, or joined together in combination with any other number of relevant, desired, or suitable aspects of the present inventions as described throughout the entirety of this disclosure to even further improve the performance of integrated circuits, power amplifiers, power amplifier modules, and the devices in which they are employed.

XIII. Semiconductor Packages with Integrated Interference Shielding

This section of the present disclosure is directed to an integrated electromagnetic interference (EMI) shield for a semiconductor module package. The integrated EMI shield includes a plurality of wirebond springs electrically connected between a ground plane in the substrate of the package and a conductive layer printed on the top of the package mold compound. The wirebond springs have a defined shape that causes a spring effect to provide contact electrical connection between the tops of the wirebond springs and the conductive layer. The wirebond springs can be positioned anywhere in the module package, around all or some of the devices included in the package, to create a complete EMI shield around those devices. And further hereto, as may bear repeating, it should be readily understood by those skilled in the relevant arts hereof that these particular aspects of the present invention as discussed in this section may be combined with any or all other aspects hereof to further improve the performance of power amplifier modules and the devices in which they are employed.

In many modern applications, including cellular phone handsets, personal digital assistants (PDAs), media players, and other portable device that use radio frequency (RF) components, the size (length, width and thickness) and weight of the finished product can often be critical design parameters. For example, particularly for cellular phone handsets, there is continuing drive toward smaller and lighter devices that offer increased functionality and features. Accordingly, the size and weight of individual components used in these devices can also be important. As discussed above, the conventional approach for providing electromagnetic interference shielding for RF devices involves placing a grounded metal can over the individual RF device to be shielded, which adds size, weight and cost to the design and therefore, may be undesirable in many applications.

Aspects and embodiments are directed to methods and apparatuses to provide an interference shield that is integrated into individual devices or modules during the packaging process with minimal increase in the size and/or weight of the device or module. As used herein, the term "EMI shield" is used to refer to both electromagnetic interference and radio frequency interference shielding. In one embodiment, an integrated EMI shield can be formed using wirebond manufacturing processes, as discussed further below, and therefore, can be manufactured using existing tools and assembled on a common processing line with conventional wirebonds used to provide electrical connections to electronic devices in the module. This approach may provide high design flexibility as well as an easier and less expensive method by which to manufacture EMI shields. In addition, an integrated "wirebond cage" shield according to aspects of the invention provides a way to achieve inter/intra module isolation and low package profile, which has not been achieved by conventional existing technologies. As discussed below, a wirebond cage may be formed using "wirebond spring" connectors having a particular and well-controlled design and shape to provide a robust and practical EMI shield for various packages and process conditions.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, and upper and lower are intended for convenience of description, not to limit the present systems and methods or their components to any one positional or spatial orientation.

Now with reference to FIG. 103, there is illustrated one example of a method of packaging an electronic device or module incorporating an integrated EMI shield, in accordance with aspects of the invention. Aspects and embodiments of the method are discussed below with continuing reference to FIG. 103.

A first step 954 includes preparing a substrate to be incorporated into an electronic module. This step 954 may include forming metallizations on the substrate that may be used to interconnect various components of the electronic module and at least some of which may become part of the integrated EMI shield, as discussed further below. In step 956, an electronic module may be assembled according to methods and techniques as may be known to those skilled in the art. This step 956 may include acts such as mounting one or more dies to the substrate, forming any necessary internal or external connections or connection points (including depositing layers of metallization and/or dielectric), etc. Therefore, it is to be appreciated that although module assembly is illustrated as a single step 956 in FIG. 103, it may comprise several steps that may be performed at the same time, at different times, and/or in different locations. Furthermore, it is to be appreciated that step 954 may be considered part of step 956.

An example of such a module is illustrated in FIG. 104. The module 962 comprises one or more die 963 mounted to a substrate 964. Some examples of the module 962 include, but are not limited to, power amplifiers, transceivers, linear devices, filters and other devices that may require or benefit from EMI shielding. As discussed above, EMI shielding is typically desirable for RF devices and therefore, at least one of the die 963 may be an RF device and the module 962 may be an RF module; however, it is to be appreciated that the invention is not so limited, and the die 963 may comprise any type of digital or analog device or component. In one example, the die 963 are mounted to the substrate 964 using wire bonds 966 connected to bond pads 967, as illustrated in FIG. 104. Alternatively, the die 963 may be mounted to the substrate 964 using flip chip bonding methods, or any other suitable technique known to those skilled in the art.

According to one embodiment, an integrated EMI shield is incorporated into the module 962 by constructing a wirebond cage around the edges of the substrate 964 during the packaging process. A wirebond process similar to the conventional process used to form wirebonds 966 and using the same equipment may be implemented to construct a wirebond spring, as discussed below. A plurality of these wirebond springs may be placed around the die 963 on the substrate 964 and connected to ground planes in the package, as discussed further below, to provide a wirebond spring cage that forms the integrated EMI shield. To form an integrated shield in a molded module, a manufacturing difficulty lies in finding a way to connect the ground plane in the substrate to the top conductive shield layer. Embodiments of the methods of forming an integrated shield using wirebond spring connectors provide a robust manufacturing process for resolving this difficulty, as discussed further below.

Referring again to FIG. 103, as discussed above, step 954 may include forming metallizations on the substrate 964 that will become part of the integrated EMI shield. Referring to FIG. 105, these metallizations may include wirebond pads 968, a ground plane 969, and vias 971 that connect the wirebond pads to the ground plane. Wirebond springs 972 may then be connected to the wirebond pads 968 (step 957), as discussed further below. It is to be appreciated that although in the example illustrated in FIG. 105, two discrete wirebond pads 968, with associated vias 971, are provided for each wirebond spring 972, the invention is not so limited and many other configurations are contemplated. For example, as illustrated in FIGS. 106A and 106B, the individual wirebond pads 968 of FIG. 105 may be replaced with a metallization track or ring 973 that may at least partially encircle the die 963. In this example, one or more vias 971, FIG. 106A, may be provided at points along the track 973 to couple the track, and therefore the wirebond springs 972, to the ground plane 969. Furthermore, in one example, the track 973 may be continuous between two or more wirebond springs 972 and therefore, each wirebond spring need not have an individually associated via 971. In addition, although in FIG. 105, the wirebond spring 972 is illustrated with both connection points (at wirebond pads 968) coupled to the ground plane 969 by vias 971, this need not be the case, and one of the ends of the wirebond springs may be left floating (i.e., not electrically coupled to the ground plane).

According to one embodiment, the method of forming an integrated EMI shield includes a transfer molding process (step 958, FIG. 103) to encapsulate the die 963 in a mold compound 974. As discussed further below, during the transfer molding process the substrate 964 is placed in a lower mold chase, an upper mold chase is lowered onto the lower mold chase to a seal a cavity around the device, and the mold compound 974 is flowed into the cavity to encapsulate the die 963 on the substrate. Transfer molding processes are well known to those skilled in the art.

Still referring to FIGS. 103 and 105, after the transfer molding process (step 958), an ablation process (step 959) may be used to expose the tops of the wirebond springs 972 through the mold compound 974. The ablation process may include, for example, a laser ablation process, grinding and/or polishing the mold compound 974 to remove a layer of mold compound and expose the tops of the wirebond springs 972. In one example, the ablation process may remove a layer of mold compound that is less than about 40 microns thick. In another example, the ablation process may remove a layer of mold compound that is about 10 microns thick. After the tops of the wirebond springs 972 have been exposed, a thin conductive coating or layer 975 may be formed on top of the mold compound 974 (step 961) to contact the exposed tops of the wirebond springs 972. The conductive layer 975 may be deposited on top of the mold compound 974 using any of various techniques, such as, by printing, depositing, sputtering, and the like. In one example, the conductive layer 975 comprises a metal-filled epoxy, such as a silver-filled epoxy, that is spray-painted on top of the mold compound 974, as discussed above with regard to FIG. 92B in Section XII. The conductive layer 975 contacts the exposed tops of the wirebond springs 972 and thus electrically connects the exposed wirebond springs.

As discussed above herein, in one embodiment, the module 962 includes a ground plane 969 disposed along a bottom surface of the substrate 964, as shown in FIG. 105, and connected to the wirebond springs 972 by vias 971. Through contact between the tops of the wirebond springs 972 and the conductive layer 975, an electrical connection is formed between the conductive layer and the ground plane 969, thus completing an EMI shield in the module 962. The wirebond springs 972 provide a flexible (because they may be located anywhere suitable on the substrate) and fully integrated connection between the ground plane 969 in the substrate 964 and the top conductive shield layer 975. In one embodiment, the wirebond springs 972 have a defined shape, as discussed further below, which is controlled to produce a spring effect that facilitates creating reliable electrical connections between the wirebond springs and the conductive layer 975. Thus, one or more of the die 963 may be substantially enclosed in a grounded EMI shield formed by the conductive layer 975, the wirebond springs 972 (and their associated metallizations, such as vias 971 and bond pads 968), and the ground plane 969. This integrated EMI shield according to embodiments of the invention may add minimal size and weight to the module 962, unlike the bulky metal cans of conventional EMI shielding solutions.

According to one embodiment hereof, the wirebond springs 972 have a particular shape and height that are well controlled and substantially different from conventional wirebonds 966. As may be known to those skilled in the art, conventional wirebonds 966 are formed, using a wirebonding machine, by connecting one end of a bond wire to the die 963 and controlling the movement of the wirebonding machine to draw the bond wire away from the die to form a loop, as illustrated in FIGS. 104 and 105, and then connecting the other end of the bond wire to a pad on the substrate. The wirebond springs 972 according to embodiments of the invention may be formed using a similar technique, but the wire loop is processed, by manipulating x-axis and y-axis motion of the wirebonding machine, to a unique shape that provides the desired spring effect and other properties of the wirebond spring discussed below.

Referring to FIG. 107, there is illustrated one embodiment of a wirebond spring 972 according to these aspects of the present invention. The wirebond spring 972 comprises a ball bond 976, which provides a first connection point between the wirebond spring and the substrate 964, and a wire loop 977 extending from the ball bond to a second connection point 983 on the substrate. Referring to FIGS. 107 and 108, the process of forming the wirebond spring 972 (step 957) may begin with a first step 978 of forming the ball bond 976. This step may include placing a metal ball on a wirebond pad 968 (see FIG. 105) on the substrate 964 (step 979) and bonding the ball to the wirebond pad (step 981) to form the ball bond 976. The wirebond spring may be formed using any of a variety of metals, including gold (as is commonly used for conventional wirebonds) and copper. In one example, in which the wirebond spring is made of gold, the wirebond pad 968 may similarly be gold, or gold-plated, and the ball bond 976 is ultrasonically bonded to the substrate 964. A similar thermosonic process may be used to form a copper ball bond 976 on gold, copper or tin-plated wirebond pads 968.

According to one embodiment, the wire loop 977 is formed by drawing the wire from the ball bond 976, shaping the wire (step 982) by manipulating the x-axis and y-axis motion of the wirebonding machine, and finally bonding the tail end of the wire loop to the wirebond pad 968 (step 983). In one embodiment, the wire loop 977 is shaped to have the shape illustrated in FIG. 107, or a shape similar thereto. As further shown in FIG. 108, step 978 which may include sub-step 979 to place the metal ball 976 on the pad 968, and sub-step 981 where the ball 976 is bonded to the pad 968.

Referring to FIG. 109, there is illustrated one embodiment of a wirebond spring 972 bonded to wirebond pads 968 (or a track 973) provided on the substrate 964, as discussed above. In one embodiment, the wirebond spring 972 comprises a zone of inflection 986 near the ball bond 976. The wire extends upwardly from the zone of inflection 986 to a crest 987 of the wirebond spring 972. A convex region 988 extends between the zone of inflection 986 and the crest 987. The wirebond spring 972 further comprises an upper region 989 proximate the crest 987 and a downward sloping tail region 991 that extends between the upper region 989 and the second connection point 983. In one example, the upper region 989 is substantially flat so as to provide a large contact area with the upper conductive layer 975 (see FIG. 106A), thereby facilitating a good electrical connection with the conductive layer. The zone of inflection 986 is used to make the wirebond spring 972 more resilient, compared to a conventional wirebond, contributing the spring effect of the wirebond spring and the ability of the wirebond spring with withstand the pressure applied by the mold chase and mold compound and to retain its shape during the transfer molding process, as discussed further below. In one example, the crest 987 of the wirebond spring is positioned substantially over the zone of inflection 986, as indicated by dotted line 992, which may further contribute to the resiliency of the wirebond spring 972, as discussed below.

As known to those skilled in the art and discussed above, during the transfer molding process, the device is placed in a lower mold chase, an upper mold chase is lowered onto the lower mold chase to a seal a cavity around the device, and the mold compound 974 is flowed into the cavity, FIGS. 105 and 106A. The height of the wirebond spring 972, measured from the wirebond pad 968 to the crest 987, may be made slightly taller than the expected or designed thickness of the mold compound 974. During the transfer molding process (step 958, FIG. 103), the wirebond spring 972 is compressed by the descending upper mold chase 993, as illustrated in FIG. 110. In one example, the upper mold chase 993 first makes contact the crest 987 of the wirebond spring 972, as the crest is the highest point of the wirebond spring. Due to the spring constant of the wirebond spring 972, provided by the zone of inflection 986 and the positioning of the crest 987 substantially over the zone of inflection, the wirebond spring remains in contact with the surface of the upper mold chase 993, as illustrated in FIG. 110. This spring effect provided by the shape of the wirebond spring 972 enables robust manufacturing of the integrated EMI shield because by causing the top of the wirebond spring to remain in contact with the surface of the mold chase, only a thin layer of mold compound may cover the top of the wirebond spring, such that the top of the wirebond spring may be easily and reliably exposed following the ablation process (step 959). In one example, the wirebond spring 972 has a large spring range in the vertical direction and is able to absorb variations in finished height resulting from variations in the mold compound thickness, the substrate thickness and warpage that may occur during the transfer molding process. The height of the wirebond spring may be selected to be sufficiently high such that the wirebond spring is compressed when the upper mold chase 993 descends, but not so high that the descending upper mold chase crushes the wirebond spring. Thus, the wirebond spring should not be so high that the amount of deformation required to accommodate the descending upper mold chase 993 exceeds the spring capability of the wirebond spring. Similarly, the if the wirebond spring is not sufficiently high, the top of the wirebond spring may not contact or be sufficiently near the upper surface of the mold compound following the transfer molding process, and thus may not be exposed by the ablation process (step 959, FIG. 103), or may not exhibit sufficient elastic deformation (spring effect) to hold the top of the wirebond spring in contact with the upper surface of the mold compound. In one example, the height of the wirebond spring 972 is about 90 microns taller than the designed thickness of the mold compound. However, it is to be appreciated that the wirebond spring may have a different height depending on factors such as, for example, the metal used to form the wirebond spring, the mold material, and other similar factors.

According to one embodiment, the shape of the wirebond spring 972 is optimized to provide a large contact area with the conductive layer 975, FIGS. 105 and 106A, thereby facilitating good electrical connection with the conductive layer 975. As discussed above, in one example, the upper region 989, FIGS. 109 and 110, of the wirebond spring 972 is substantially flat. Thus, when compressed by the upper mold chase 993, the upper region 989 may provide a large flat area (length) that is in contact with the mold chase (or surface of the mold compound). This is the area that will be exposed at the top of the package by the ablation step (step 959) and in contact with the conductive layer 975 to form an electrical connection with the conductive layer 975 and complete the EMI shield.

Referring now to FIG. 111, there is illustrated an image of one example of a wirebond spring incorporated in a device package. As illustrated in FIG. 111, the upper region 989 of the wirebond spring forms a large flat area on top of the mold compound 974 and in contact with the conductive layer 975. A plan view of the wirebond spring of FIG. 111 is illustrated in FIG. 112 before application of the conductive layer 975. Referring to FIG. 112, a long length 994 of exposed wire, predominantly, but not necessarily entirely, corresponding to the upper region 989 and crest 987 of the wirebond spring, can be seen on top of the mold compound 974. Manufactured and simulated examples of packages including wirebond springs have been created having an average exposure length 994 of about 400 microns, and a minimum exposure length of about 962 microns. These examples illustrate an improvement in the exposure length of the wire of about 10× compared to conventional wirebond loops (966 in FIG. 106A). This increased contact area provides a robust and low resistance electrical connection for the integrated EMI shield. Furthermore, if a material such as copper is used for the wirebond springs, rather than gold, for example to reduce cost, the large contact area may be particularly important as copper has a lower conductivity than does gold. In addition, as no solder is used to make the connection between the exposed region of the wirebond spring and the conductive layer 975, (the connection being made by the just contact between the two conductors), the larger the contact area, the more reliable the connection may be.

In addition to providing a spring effect and large contact area to facilitate a good and robust electrical connection with the conductive layer 975, the shape of the wirebond spring 972 also provide resiliency during the transfer molding process. Applicants have experimentally determined that it is important the wirebond springs remain upright during the transfer molding process so that the upper region is at or near the top of the mold compound and can be readily exposed with minimal ablation. Tests and simulations have demonstrated that conventionally-shaped wirebond loops fold and collapse during the transfer molding process because their shape provides little or no stability. As a result, the loops can move in any direction under pressure from the upper mold chase 993, FIG. 110, and flowing mold compound. By contrast, the shape of the wirebond springs 972 controls movement of the wirebond spring to, predominantly, compression (elastic deformation) in the vertical direction (y-direction in FIG. 105), resulting in the spring effect discussed above. In one example, the wirebond springs are stiff in the in-plane direction (i.e., the x-z-direction in FIG. 105) and have good resistance to mold flow and wire sweep defects, which may be major concern with very high loops.

In summary, an effective, low cost and robust integrated EMI shield can be provided in any transfer molded module using only the ground plane typically already present in the module substrate, a thin layer of conductive material deposited on top of the mold compound, and a plurality of the wirebond springs discussed herein to connect the conductive layer to the ground plane, thereby forming a complete shield for some or all of the devices in the module. The wirebond springs may be placed anywhere in the package, with optional redundant connections to ensure the contact to the conductive layer 975 meets all electrical requirements, allowing for a very flexible EMI shield design that can be easily modified to accommodate different module layouts and devices. Similarly, as discussed above with reference to FIGS. 106A and 106B, the vias 971 connecting the wirebond pads 968 (or track 973) to the ground plane need not be coincident with each pad, or with specific locations on the ground plane, allowing for flexible pad 968 and via 971 placement in the module. The number of wirebond springs required to provide an adequate EMI shield depends on the operating frequency of the devices to be shielded and the level of shielding required. For example, the wire density (i.e., the spacing between immediately adjacent wirebond springs 972 in any given direction) may increase with increasing signal frequency. In one example, a wire spacing of about $\lambda/20$ (where $\lambda$ is the wavelength of the signal to be shielded) may be used. It is to be appreciated that the wire spacing need not be uniform, provided only that the minimum spacing to achieve desired shielding at a given frequency is maintained. Examples of wirebond spring EMI cages were tested and found to provide approximately a 20 dB shield, which is presently sufficient for most RF handset applications. Thus, the wirebond springs discussed herein can be used to provide a completely integrated EMI shield that is highly flexible and adds minimal cost, weight and/or size to the module. The wirebond springs may be processed using traditional processing techniques which are low cost, robust and do not require the procurement of any additional or specialized assembly equipment.

Having thus described several aspects of the above embodiments in this section, it is to be appreciated that various alterations, modifications, and improvements will readily occur to those skilled in the art. Such alterations, modifications, and improvements are intended to be part of this disclosure and are intended to be within the scope of the invention. Accordingly, the foregoing is by way of example only, and the scope of the invention should be determined from proper construction of the below claims and their equivalents.

XIV. Concluding Remarks and Discussion

While various embodiments and related features, aspects, and characteristics of the present inventions have been described throughout the entirety of this disclosure, it will be apparent to those of ordinary skill in the art that many more embodiments and implementations are possible such as would be within the scope of any respective invention described herein. For example, the inventions hereof are not limited to the materials, process technologies, devices, or systems described above. And further, the inventions hereof may individually or otherwise be combined, integrated, assembled, or joined together in various desired combinations with any other number of relevant, chosen, or suitable aspects of the present inventions as described throughout the entirety of this disclosure to even further improve the performance of integrated circuits, power amplifiers, power amplifier modules, and the wireless devices in which they are employed.

The headings provided in this specification are for convenience only and do not necessarily affect the scope or meaning of the following claims.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application unless the context thereof would indicate that one particular section of the detailed description is thereby intended. Where the context permits, words in the above detailed description that use the singular or plural number may also include the plural or singular number respectively. The word "or" in reference to a list of two or more items, covers all of the following interpretations of the word which include any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes, or blocks, or the steps thereof are presented in a given order, alternative embodiments may perform routines having steps, or employ systems having blocks, in a different order, and some processes, blocks, or steps may be deleted, moved, added, subdivided, combined, and/or modified. Each of these processes, blocks, or steps may be implemented in a variety of different ways. Also, while processes, blocks, or steps are at times shown as being performed in series, these may instead be performed in parallel, or may be performed at different times.

The teachings of the invention provided herein can be applied to other systems, not necessarily the systems described above. The elements and acts of the various embodiments described above can be combined to provide further embodiments.

And further while this invention has been described in detail with reference to certain preferred embodiments, it should be appreciated that the present invention is not limited to those precise embodiments. Rather, in view of the present disclosure which describes the current best mode for practicing the invention, many modifications and variations would present themselves to those of skill in the art without departing from the scope and spirit of this invention. The scope of the invention is, therefore, indicated by the following claims rather than by the foregoing description. All changes, modifications, and variations coming within the meaning and range of equivalency of the claims are to be considered within their scope.

What is claimed is:

1. A power amplifier module comprising:
a first die including a power amplifier and a passive component having an electrical property that depends on a condition of the first die, the power amplifier including a bipolar transistor having a collector, a base, and an emitter, the collector having a doping concentration of at least about $3 \times 10^{16}$ cm$^{-3}$ at an interface with the base, the collector also having a grading in which doping concentration increases away from the base; and
a second die in communication with the first die, the second die including a bias circuit configured to generate a bias signal based at least partly on an indication of the electrical property of the passive component of the first die and to provide the bias signal to the power amplifier.

2. The power amplifier module of claim 1 wherein the passive component includes a resistor and the electrical property is a resistance.

3. The power amplifier module of claim 2 wherein the bipolar transistor is a heterojunction bipolar transistor, the first die is a III-V semiconductor die that includes a semiconductor resistor having a resistive layer formed of a material that is substantially the same as a material of a selected layer of the heterojunction bipolar transistor above a sub-collector of the heterojunction bipolar transistor, and the restive layer is disposed laterally from and is electrically isolated from the selected layer.

4. The power amplifier module of claim 3 wherein the emitter includes the selected layer.

5. The power amplifier module of claim 3 wherein the base includes the selected layer.

6. The power amplifier module of claim 1 wherein the condition is temperature of the first die.

7. The power amplifier module of claim 1 wherein the condition is a process variation associated with the first die.

8. The power amplifier module of claim 1 wherein the condition is a beta parameter associated with the first die.

9. The power amplifier module of claim 1 wherein the collector further includes second grading in which doping concentration increases away from the base at a different rate than in the grading.

10. The power amplifier module of claim 1 wherein the doping concentration of the collector at the interface with the base is in a range from about $5 \times 10^{16}$ cm$^{-3}$ to $9 \times 10^{16}$ cm$^{-3}$.

11. An apparatus comprising:
a first die including a power amplifier, the power amplifier including a heterojunction bipolar transistor having a collector, a base, and an emitter, the collector having a doping concentration of at least about $3 \times 10^{16}$ cm$^{-3}$ at an interface with the base, the collector also having a grading in which doping concentration increases away from the base, and the first die further including a semiconductor resistor having a resistive layer that is formed from substantially same material as a layer of the heterojunction bipolar transistor; and
a second die in communication with the first die, the second die including a bias circuit configured to generate a bias signal based at least partly on an indication of a resistance of the semiconductor resistor of the first die and to provide the bias signal to the power amplifier.

12. The apparatus of claim 11 wherein the layer of the heterojunction bipolar transistor includes the base.

13. The apparatus of claim 11 wherein the heterojunction bipolar transistor includes a sub-collector and the layer of the heterojunction bipolar transistor includes the sub-collector.

14. The apparatus of claim 11 wherein the heterojunction bipolar transistor is a GaAs transistor and the second die is a silicon die.

15. The apparatus of claim 11 wherein the doping concentration of the collector at the interface with the base is at least about $5 \times 10^{16}$ cm$^{-3}$.

16. The apparatus of claim 11 wherein the doping concentration of the collector at the interface with the base is in a range from about $5 \times 10^{16}$ cm$^{-3}$ to $9 \times 10^{16}$ cm$^{-3}$.

17. The apparatus of claim 11 wherein the collector further includes a second grading in which doping concentration increases away from the base at a different rate than in the grading.

18. A power amplifier module comprising:
a packaging substrate configured to receive a plurality of components;
a first die mounted on the packaging substrate, the first die including a power amplifier including a GaAs bipolar transistor having a collector, a base, and an emitter, the collector having a doping concentration of at least about $3 \times 10^{16}$ cm$^{-3}$ at an interface with the base, the collector also having a grading in which doping concentration increases away from the base, and the first die further including a passive component having an electrical property that depends on a condition of the first die; and
a second die mounted on the packaging substrate and in communication with the first die, the second die including a bias circuit configured to generate a bias signal based at least partly on an indication of the electrical property of the passive component of the first die and to provide the bias signal to the power amplifier.

19. The power amplifier module of claim 18 wherein the doping concentration of the collector at the interface with the base is in a range from about $5 \times 10^{16}$ cm$^{-3}$ to $9 \times 10^{16}$ cm$^{-3}$.

20. The power amplifier module of claim 19 wherein the passive component includes a resistor and the electrical property is a resistance.

* * * * *